US010090430B2

(12) United States Patent
Morad et al.

(10) Patent No.: US 10,090,430 B2
(45) Date of Patent: Oct. 2, 2018

(54) SYSTEM FOR MANUFACTURING A SHINGLED SOLAR CELL MODULE

(71) Applicant: SunPower Corporation, San Jose, CA (US)

(72) Inventors: Ratson Morad, Palo Alto, CA (US); Gilad Almogy, Palo Alto, CA (US); Itai Suez, Santa Cruz, CA (US); Jean Hummel, San Carlos, CA (US); Nathan Beckett, Oakland, CA (US); Yafu Lin, San Jose, CA (US); John Gannon, Oakland, CA (US); Michael J. Starkey, Santa Clara, CA (US); Robert Stuart, Arcata, CA (US); Tamir Lance, Los Gatos, CA (US); Dan Maydan, Los Altos Hills, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 15/359,326

(22) Filed: Nov. 22, 2016

(65) Prior Publication Data
US 2017/0077343 A1 Mar. 16, 2017

Related U.S. Application Data

(63) Continuation of application No. PCT/US2015/032472, filed on May 26, 2015, and a continuation-in-part of application No. 29/506,415,
(Continued)

(51) Int. Cl.
H01L 31/18 (2006.01)
H01L 31/05 (2014.01)
H01L 31/02 (2006.01)

(52) U.S. Cl.
CPC ...... *H01L 31/186* (2013.01); *H01L 31/02008* (2013.01); *H01L 31/0508* (2013.01); *Y02E 10/50* (2013.01)

(58) Field of Classification Search
None
See application file for complete search history.

(56) References Cited

U.S. PATENT DOCUMENTS 2,938,938 A 5/1960 Dickson, Jr.
3,116,171 A 12/1963 Nielsen et al.
(Continued)

FOREIGN PATENT DOCUMENTS

DE 4017933 A1 12/1991
DE 4030713 A1 4/1992
(Continued)

OTHER PUBLICATIONS

"Reducing AG Cost and Increasing Efficiency. Multicrystalline Silicon Solar Cells With Direct Plated Contacts Exceeding 17% Efficiency." 26th EU PVSEC Proceedings pp. 1199-1202.
(Continued)

Primary Examiner — Bilkis Jahan
(74) Attorney, Agent, or Firm — Innovation Counsel LLP

(57) ABSTRACT

A high efficiency configuration for a solar cell module comprises solar cells conductively bonded to each other in a shingled manner to form super cells, which may be arranged to efficiently use the area of the solar module, reduce series resistance, and increase module efficiency. The front surface metallization patterns on the solar cells may be configured to enable single step stencil printing, which is facilitated by the overlapping configuration of the solar cells in the super cells. A solar photovoltaic system may comprise two or more such high voltage solar cell modules electrically connected in parallel with each other and to an inverter.
(Continued)

Solar cell cleaving tools and solar cell cleaving methods apply a vacuum between bottom surfaces of a solar cell wafer and a curved supporting surface to flex the solar cell wafer against the curved supporting surface and thereby cleave the solar cell wafer along one or more previously prepared scribe lines to provide a plurality of solar cells. An advantage of these cleaving tools and cleaving methods is that they need not require physical contact with the upper surfaces of the solar cell wafer. Solar cells are manufactured with reduced carrier recombination losses at edges of the solar cell, e.g., without cleaved edges that promote carrier recombination. The solar cells may have narrow rectangular geometries and may be advantageously employed in shingled (overlapping) arrangements to form super cells.

20 Claims, 115 Drawing Sheets

Related U.S. Application Data filed on Oct. 15, 2014, now abandoned, and a continuation-in-part of application No. 29/506,755, filed on Oct. 20, 2014, now abandoned, and a continuation-in-part of application No. 14/530,405, filed on Oct. 31, 2014, now Pat. No. 9,780,253, and a continuation-in-part of application No. 14/532,293, filed on Nov. 4, 2014, now abandoned, and a continuation-in-part of application No. 29/508,323, filed on Nov. 5, 2014, now abandoned, and a continuation-in-part of application No. 14/536,486, filed on Nov. 7, 2014, now abandoned, and a continuation-in-part of application No. 14/539,546, filed on Nov. 12, 2014, now abandoned, and a continuation-in-part of application No. 14/543,580, filed on Nov. 17, 2014, now Pat. No. 9,882,077, and a continuation-in-part of application No. 14/548,081, filed on Nov. 19, 2014, now abandoned, and a continuation-in-part of application No. 29/509,586, filed on Nov. 19, 2014, now Pat. No. Des. 750,556, and a continuation-in-part of application No. 29/509,588, filed on Nov. 19, 2014, now Pat. No. Des. 767,484, and a continuation-in-part of application No. 14/550,676, filed on Nov. 21, 2014, now abandoned, and a continuation-in-part of application No. 14/552,761, filed on Nov. 25, 2014, now abandoned, and a continuation-in-part of application No. 14/560,577, filed on Dec. 4, 2014, now Pat. No. 9,876,132, and a continuation-in-part of application No. 14/566,278, filed on Dec. 10, 2014, and a continuation-in-part of application No. 14/565,820, filed on Dec. 10, 2014, now abandoned, and a continuation-in-part of application No. 14/572,206, filed on Dec. 16, 2014, now Pat. No. 9,401,451, and a continuation-in-part of application No. 14/577,593, filed on Dec. 19, 2014, now Pat. No. 9,356,184, and a continuation-in-part of application No. 14/586,025, filed on Dec. 30, 2014, and a continuation-in-part of application No. 14/585,917, filed on Dec. 30, 2014, now abandoned, and a continuation-in-part of application No. 14/594,439, filed on Jan. 12, 2015, now Pat. No. 9,397,252, and a continuation-in-part of application No. 14/605,695, filed on Jan. 26, 2015, now Pat. No. 9,484,484, and a continuation-in-part of application No. 14/674,983, filed on Mar. 31, 2015, now Pat. No. 9,947,820.

(60) Provisional application No. 62/003,223, filed on May 27, 2014, provisional application No. 62/035,624, filed on Aug. 11, 2014, provisional application No. 62/036,215, filed on Aug. 12, 2014, provisional application No. 62/042,615, filed on Aug. 27, 2014, provisional application No. 62/048,858, filed on Sep. 11, 2014, provisional application No. 62/064,260, filed on Oct. 15, 2014, provisional application No. 62/064,834, filed on Oct. 16, 2014, provisional application No. 62/081,200, filed on Nov. 18, 2014, provisional application No. 62/082,904, filed on Nov. 21, 2014, provisional application No. 62/103,816, filed on Jan. 15, 2015, provisional application No. 62/111,757, filed on Feb. 4, 2015, provisional application No. 62/113,250, filed on Feb. 6, 2015, provisional application No. 62/134,176, filed on Mar. 17, 2015, provisional application No. 62/150,426, filed on Apr. 21, 2015.

(56) References Cited

U.S. PATENT DOCUMENTS

| | | |
|---|---|---|
| 3,340,096 A | 9/1967 | Mann et al. |
| 3,396,452 A | 8/1968 | Sato et al. |
| 3,459,597 A | 8/1969 | Baron |
| 3,769,091 A | 10/1973 | Leinkram et al. |
| 3,811,181 A | 5/1974 | Leinkram et al. |
| 3,837,924 A | 9/1974 | Baron |
| 4,257,821 A | 3/1981 | Kelly et al. |
| 4,525,594 A | 6/1985 | Pschunder |
| 4,617,420 A | 10/1986 | Dilts et al. |
| 4,617,421 A | 10/1986 | Nath et al. |
| 4,652,693 A | 3/1987 | Bar-On |
| 4,805,006 A | 2/1989 | Yamaguchi et al. |
| 4,877,460 A | 10/1989 | Flodl |
| 5,171,717 A | 12/1992 | Broom et al. |
| 5,330,583 A | 7/1994 | Asai et al. |
| 5,590,495 A | 1/1997 | Bressler et al. |
| 5,830,779 A | 11/1998 | Bressler et al. |
| 5,979,728 A | 11/1999 | Alfaro |
| 6,018,123 A | 1/2000 | Takada et al. |
| 6,034,322 A | 3/2000 | Pollard |
| 6,180,868 B1 | 1/2001 | Yoshino et al. |
| 6,187,448 B1 | 2/2001 | Hanoka et al. |
| 6,232,545 B1 | 5/2001 | Samaras et al. |
| 6,303,853 B1 | 10/2001 | Fraas et al. |
| 6,315,575 B1 | 11/2001 | Kajimoto |
| 6,353,175 B1 | 3/2002 | Fraas |
| 6,364,751 B1 | 4/2002 | Pohl et al. |
| 6,414,235 B1 | 7/2002 | Luch |
| 6,489,553 B1 | 7/2002 | Fraas et al. |
| 6,441,297 B1 | 8/2002 | Keller et al. |
| 6,525,262 B1 | 2/2003 | Makita et al. |
| 6,538,193 B1 | 3/2003 | Fraas |
| 6,543,725 B1 | 4/2003 | Meurer et al. |
| 6,563,289 B1 | 5/2003 | Cross |
| 6,610,919 B2 | 8/2003 | Ohkubo |
| 6,653,550 B2 | 11/2003 | Hayashi et al. |
| 6,670,787 B2 | 12/2003 | Tachibana |
| 6,770,544 B2 | 8/2004 | Sawada |
| 6,803,513 B2 | 10/2004 | Beernink et al. |
| 7,238,878 B2 | 7/2007 | Gonsiorawski |
| 7,271,333 B2 | 9/2007 | Fabick et al. |
| 7,388,146 B2 | 6/2008 | Fraas et al. |
| 7,390,961 B2 | 6/2008 | Aschenbrenner et al. |
| 7,507,903 B2 | 3/2009 | Luch |
| 7,534,699 B2 | 5/2009 | Wong et al. |
| 7,635,810 B2 | 12/2009 | Luch |
| 7,772,484 B2 | 8/2010 | Li et al. |
| 7,777,128 B2 | 8/2010 | Montello et al. |
| 7,781,672 B2 | 8/2010 | Gaudiana et al. |
| 7,825,329 B2 | 11/2010 | Basol |
| 7,829,781 B2 | 11/2010 | Montello et al. |
| 7,829,785 B2 | 11/2010 | Basol |
| 7,851,700 B2 | 12/2010 | Luch |
| 7,868,249 B2 | 1/2011 | Luch |

(56) References Cited

U.S. PATENT DOCUMENTS

| | | |
|---|---|---|
| 7,872,192 B1 | 1/2011 | Fraas et al. |
| 7,910,822 B1 | 3/2011 | Funcell |
| 7,989,692 B2 | 8/2011 | Luch |
| 7,989,693 B2 | 8/2011 | Luch |
| 8,110,737 B2 | 2/2012 | Luch |
| 8,138,413 B2 | 3/2012 | Luch et al. |
| 8,207,440 B2 | 6/2012 | Basol et al. |
| 8,222,513 B2 | 7/2012 | Luch |
| 8,304,646 B2 | 11/2012 | Luch |
| 8,319,097 B2 | 11/2012 | Luch |
| 8,334,451 B2 | 12/2012 | Polce et al. |
| 8,378,209 B2 | 2/2013 | Masson et al. |
| 8,513,095 B1 | 8/2013 | Funcell et al. |
| 8,574,943 B2 | 11/2013 | Murray et al. |
| 8,586,857 B2 | 11/2013 | Morita et al. |
| 8,586,875 B2 | 11/2013 | Morita et al. |
| 8,729,385 B2 | 5/2014 | Luch |
| 8,766,090 B2 | 7/2014 | Sewell et al. |
| 9,356,184 B2 | 5/2016 | Morad et al. |
| 2001/0054262 A1 | 12/2001 | Nath et al. |
| 2003/0029494 A1 | 2/2003 | Ohkubo |
| 2003/0121228 A1 | 7/2003 | Stoehr et al. |
| 2004/0261836 A1 | 12/2004 | Kataoka et al. |
| 2005/0126619 A1 | 6/2005 | Abe et al. |
| 2005/0133079 A1 | 6/2005 | Boulanger et al. |
| 2005/0217717 A1 | 10/2005 | Faris |
| 2005/0263178 A1 | 12/2005 | Montello et al. |
| 2006/0042682 A1 | 3/2006 | Wolfe et al. |
| 2007/0045831 A1 | 3/2007 | Wong et al. |
| 2007/0056625 A1 | 3/2007 | Higuchi et al. |
| 2007/0107766 A1 | 5/2007 | Langley, II et al. |
| 2007/0283996 A1 | 12/2007 | Hachtmann et al. |
| 2007/0283997 A1 | 12/2007 | Hachtmann et al. |
| 2008/0156365 A1 | 7/2008 | Scholz et al. |
| 2008/0156372 A1 | 7/2008 | Wu et al. |
| 2008/0216887 A1 | 9/2008 | Hacke et al. |
| 2009/0014508 A1 | 1/2009 | Croft et al. |
| 2009/0038671 A1 | 2/2009 | Yamaguchi |
| 2009/0081823 A1 | 3/2009 | Meeus et al. |
| 2009/0114279 A1 | 5/2009 | Zhao et al. |
| 2009/0229596 A1 | 9/2009 | Shin et al. |
| 2010/0001587 A1 | 1/2010 | Casey et al. |
| 2010/0012172 A1 | 1/2010 | Meakin et al. |
| 2010/0043863 A1 | 2/2010 | Wudu et al. |
| 2010/0068849 A1* | 3/2010 | Lu .................. H01L 31/022466 438/80 |
| 2010/0071752 A1 | 3/2010 | Vellore et al. |
| 2010/0075151 A1 | 3/2010 | Weingord et al. |
| 2010/0078057 A1 | 4/2010 | Karg et al. |
| 2010/0078064 A1 | 4/2010 | Coakley |
| 2010/0084004 A1 | 4/2010 | Ortabasi |
| 2010/0131108 A1 | 5/2010 | Meyer |
| 2010/0136748 A1 | 6/2010 | Autry |
| 2010/0139734 A1 | 6/2010 | Hadar et al. |
| 2010/0147364 A1 | 6/2010 | Gonzalez et al. |
| 2010/0186795 A1 | 6/2010 | Gaul |
| 2010/0218799 A1 | 9/2010 | Stefani |
| 2010/0224230 A1 | 9/2010 | Luch et al. |
| 2010/0243024 A1 | 9/2010 | Hashimoto et al. |
| 2010/0243049 A1 | 9/2010 | Leidholm et al. |
| 2010/0308662 A1 | 12/2010 | Schatz et al. |
| 2011/0005572 A1 | 1/2011 | Shimizu |
| 2011/0011448 A1* | 1/2011 | Lim ..................... H01L 31/076 136/255 |
| 2011/0023932 A1* | 2/2011 | Fukui ..................... H01G 9/2081 136/244 |
| 2011/0023958 A1 | 2/2011 | Masson et al. |
| 2011/0036390 A1 | 2/2011 | Nelson et al. |
| 2011/0048501 A1 | 3/2011 | Jaus et al. |
| 2011/0079263 A1 | 4/2011 | Avrutsky |
| 2011/0114158 A1 | 4/2011 | Lenox |
| 2011/0155209 A1 | 6/2011 | Tober et al. |
| 2011/0168237 A1 | 7/2011 | Takeda et al. |
| 2011/0168238 A1 | 7/2011 | Metin et al. |
| 2011/0192448 A1 | 8/2011 | Croft et al. |
| 2011/0197947 A1 | 8/2011 | Croft |
| 2011/0214714 A1 | 9/2011 | Aberle et al. |
| 2011/0240337 A1 | 10/2011 | Montello et al. |
| 2011/0271999 A1 | 11/2011 | Almogy et al. |
| 2011/0272004 A1 | 11/2011 | Davis et al. |
| 2011/0277835 A1 | 11/2011 | Masson et al. |
| 2011/0315184 A1 | 12/2011 | Kabade |
| 2012/0031457 A1 | 2/2012 | Taira et al. |
| 2012/0031470 A1 | 2/2012 | Dimov et al. |
| 2012/0037206 A1 | 2/2012 | Norman et al. |
| 2012/0048349 A1 | 3/2012 | Metin et al. |
| 2012/0103408 A1* | 5/2012 | Moslehi .......... H01L 31/022441 136/256 |
| 2012/0118355 A1 | 5/2012 | Rudolfs |
| 2012/0125391 A1 | 5/2012 | Pinarbasi et al. |
| 2012/0152327 A1 | 6/2012 | Pinarbasi et al. |
| 2012/0152349 A1 | 6/2012 | Cao et al. |
| 2012/0234388 A1 | 9/2012 | Stancel et al. |
| 2012/0244656 A1 | 9/2012 | Kim et al. |
| 2012/0268087 A1 | 10/2012 | Kemahan |
| 2012/0279548 A1 | 11/2012 | Munch et al. |
| 2012/0318318 A1 | 12/2012 | Metin et al. |
| 2012/0318319 A1 | 12/2012 | Pinarbasi et al. |
| 2012/0325282 A1 | 12/2012 | Snow et al. |
| 2013/0000811 A1 | 1/2013 | Engeldinger et al. |
| 2013/0048046 A1 | 2/2013 | Domsic et al. |
| 2013/0056044 A1 | 3/2013 | Ravi et al. |
| 2013/0068279 A1 | 3/2013 | Buller et al. |
| 2013/0096710 A1 | 4/2013 | Pinarbasi et al. |
| 2013/0098429 A1 | 4/2013 | Funayama et al. |
| 2013/0125952 A1 | 5/2013 | Sumitomo |
| 2013/0139871 A1 | 6/2013 | Hirata et al. |
| 2013/0152996 A1 | 6/2013 | DeGroot et al. |
| 2013/0160823 A1 | 6/2013 | Khouri et al. |
| 2013/0160824 A1 | 6/2013 | Khouri et al. |
| 2013/0203285 A1 | 8/2013 | Solon |
| 2013/0206203 A1 | 8/2013 | Lommasson et al. |
| 2013/0206206 A1 | 8/2013 | Bjorneklett et al. |
| 2013/0206210 A1 | 8/2013 | Niinobe et al. |
| 2013/0206213 A1 | 8/2013 | He et al. |
| 2013/0206221 A1 | 8/2013 | Gannon et al. |
| 2013/0213469 A1 | 8/2013 | Kramer et al. |
| 2013/0263920 A1 | 10/2013 | Fidaner et al. |
| 2013/0298966 A1 | 11/2013 | Fukumochi et al. |
| 2014/0060610 A1 | 3/2014 | Moslehi et al. |
| 2014/0060638 A1 | 3/2014 | Oh et al. |
| 2014/0076392 A1* | 3/2014 | Lin .................... H01L 31/073 136/256 |
| 2014/0102519 A1 | 4/2014 | Rodrigues et al. |
| 2014/0102523 A1 | 4/2014 | Wenham et al. |
| 2014/0116495 A1 | 5/2014 | Kim et al. |
| 2014/0124014 A1 | 5/2014 | Morad et al. |
| 2014/0158201 A1 | 6/2014 | Aitken et al. |
| 2014/0166087 A1 | 6/2014 | Hieslmair et al. |
| 2014/0261657 A1* | 9/2014 | Cheng ................. H01L 31/1884 136/256 |
| 2014/0318613 A1 | 10/2014 | Von Campe et al. |
| 2014/0352751 A1* | 12/2014 | Wu ..................... H01L 31/0725 136/244 |
| 2015/0068592 A1 | 3/2015 | Kommera et al. |
| 2016/0158890 A1 | 6/2016 | Gonzalez et al. |
| 2016/0163888 A1 | 6/2016 | Reddy |
| 2016/0163903 A1 | 6/2016 | Gonzalez et al. |
| 2016/0163908 A1 | 6/2016 | Gonzalez et al. |
| 2016/0163909 A1 | 6/2016 | Gonzalez et al. |
| 2016/0163910 A1 | 6/2016 | Gonzalez et al. |
| 2016/0163912 A1 | 6/2016 | Gonzalez et al. |
| 2016/0163913 A1 | 6/2016 | Gonzalez et al. |
| 2016/0163914 A1 | 6/2016 | Gonzalez et al. |

FOREIGN PATENT DOCUMENTS

| | | |
|---|---|---|
| DE | 102009026027 A1 | 1/2011 |
| EM | 002032581-0005 | 4/2012 |
| EP | 2284908 A1 | 2/2011 |
| EP | 2362430 A1 | 8/2011 |
| ES | 2146182 A1 | 7/2000 |
| FR | 910321-001 | 1/1991 |

(56) References Cited

FOREIGN PATENT DOCUMENTS

| | | | |
|---|---|---|---|
| JP | 59003980 A | 1/1984 | |
| JP | 63229766 A | 9/1988 | |
| JP | 11-350685 A | 12/1999 | |
| JP | 2012256738 A | 12/2012 | |
| JP | 2014017447 A | 1/2014 | |
| TW | I393202 | * | 12/2009 |
| WO | 2009047815 A1 | 4/2009 | |
| WO | 2010095583 A1 | 8/2010 | |
| WO | 2011162248 A1 | 12/2011 | |
| WO | 2012033657 A2 | 3/2012 | |
| WO | 2012099705 A2 | 7/2012 | |
| WO | 2013020590 A1 | 2/2013 | |
| WO | 2013074224 A1 | 5/2013 | |
| WO | 2014074826 A2 | 5/2014 | |
| WO | 2014098771 A1 | 6/2014 | |
| WO | 2014192272 A1 | 12/2014 | |
| WO | 2015001413 A1 | 1/2015 | |

OTHER PUBLICATIONS

International Search Report corresponding to PCT/US2015/032472, dated Nov. 23, 2015, 2 pages.

Mitsubishi Electric, "A New Premium Generation", Revised Publication, effective Jul. 2011, 16 pages.

U.S. Appl. No. 62/088,509 "System, Method, and Apparatus for Automatic Manufacturing of Solar Panels" filed Dec. 5, 2014, Jiunn Benjamin Heng, et al., 28 pages.

U.S. Appl. No. 62/143,694 "Systems and Methods for Precision Automation of Manufacturing Solar Panels" filed Apr. 6, 2015, Jiunn Benjamin Heng, et al., 101 pages.

Goldberg, Lee H., "Active Bypass Diodes Improve Solar Panel Efficiency and Performance", Digi-Key Corporation, http://www.digikey.com/en/articles/techzone/2012/dec/activebypassdiodesimprovesolarpanelefficiencyandperformance, Dec. 12, 2012, 8 pages.

Herrmann, W. et al., "Operational Behaviour of Commercial Solar Cells Under Reverse Biased Conditins", TÜV Rheinland Sicherheit und Umweltschutz GmbH, 3 pages.

Creative Materials, "Product Announcement: Flexible Electrically Conductive Adhesive Family as Solder Replacements in Solar Cells", http://www.creativematerials.com/news/pr-conductive-adhesive-for-solar-cells.php, Feb. 9, 2015, 2 pages.

Creative Materials, "124-08 A/B Electrically Conductive Epoxy Adhesive", www.creativematerials.com, Apr. 22, 2010, Revision: E, 1 page.

Herrmann, W. et al. "Hot Spot Investigations on PV Modules—New Concepts for a Test Standard and Consequences for Module Design with Respect to Bypass Diodes", TÜV Rheinland Sicherheit und Umweltschutz GmbH, 4 pages.

Yang, et al., "Investigation of the Relationship between Reverse Current of Crystalline Silicon Solar Cells and Conduction of Bypass Diode", Hindawi Publishing Corporation International Journal of Photoenergy, vol. 2012, Article ID 357218, 6 pages.

Breitenstein, O. et al., "Shunts due to laser scribing of solar cells evaluated by highly sensitive lock-in thermography", 11th International Photovoltaic Science and Engineering Conference (PVSEC-11), Sep. 20-24, 1999 Sapporo, Japan, 9 pages.

KYOCERA, News Releases 2009, "KYOCERA Explains Innovations Used in Solar Panel for New Toyota Prius", http://global.kyocera.com/new/2009/0902/fpri.html, Dec. 21, 2014, 2 pages.

Herrmann, W. et al., "Hot Spot Investigations on PV Modules—New Concepts for a Test Standard and Consequences for Module Design with Respect to Bypass Diodes," TÜV Rheinland Sicherheit und Umweltschutz GmbH, http://ieeexplore.ieee.org, Dec. 20, 2014, 6 pages.

Mäki, et al., "Power Losses in Long String and Parallel-Connected Short Strings of Series-Connected Silicon-Based Photovoltaic Modules Due to Partial Shading Conditions", IEEE Transactions on Energy Conversion, vol. 27, No. 1, Mar. 2012, pp. 173-183.

Halavani, et al., "Results of Pressue-Only Cell Interconnections in High Voltage PV-Modules", 29th European Photovoltaic Solar Energy Conference and Exhibition, Vienna University of Technology, pp. 64-68.

Heimann, M., et al., "Ultrasonic Bonding of Aluminum Ribbons to Interconnect High-Efficiency Crystalline-Silicon Solar Cells", Energy Procedia 27 (2012) pp. 670-675.

Silvestre S., et al., "Study of bypass diodes configuration on PV modules", Applied Energy 86 (2009) pp. 1632-1640.

Scholten, "Silicone Encapsulation of c-Si Photovoltaic Modules", Solar Novus Today, Feb. 10, 2014, 5 pages, http://www.solarnovus.com.

3M™ "Thermally Conductive Heat Spreading Tape, 9876B-05, 9876B-08, 9876-10, 9876-15", Nov. 2012, pp. 1-4.

STMicroelectronics, "How to choose a bypass diode for a silicon panel junction box", Sep. 2011, pp. 1-24.

Kray, D., et al., "Reducing AG Cost and Increasing Efficiency. Multicrystalline Silicon Solar Cells with Direct Plated Contacts Exceeding 17% Efficiency", 26th EU PVSEC Proceedings, pp. 1199-1202.

D.W.K. Eikelboom, Conductive Adhesives for Low-Stress Interconnection of Thin Back-Contact Solar Cells, 29th IEEE Photovoltaic Specialists Conference, May 20-24, 2002, New Orleans, USA.

Geoffrey R. Walker, Cascaded DC-DC Converter Connection of Photovoltaic Modules, IEEE Transactions on Power Electronics, vol. 19, No. 4, Jul. 2004.

Epoxy Technology, EPO-TEK® H20E Technical Data Sheet, Feb. 2010.

Engineered Conductive Materials Introduces DB-1541-S3 Low Cost Ribbon Attach Conductive Adhesive, 2 pages.

Materials Data Book 2003 Edition, Cambridge University Engineering Department, 41 pages.

Matula, J. Phys. Chem. Ref. Daa, vol. 8, No. 4, 1979.

EP15799148 Supplementary European Search Report, dated May 2, 2017, 2 pages.

USPTO Office Action, U.S. Appl. No. 14/585,917, dated Aug. 4, 2017, 29 pages.

USPTO Office Action, U.S. Appl. No. 14/585,917, dated Dec. 1, 2016, 29 pages.

USPTO Office Action, U.S. Appl. No. 14/585,917, dated Jun. 17, 2016, 29 pages.

USPTO Office Action, U.S. Appl. No. 14/585,917, dated Feb. 26, 2016, 33 pages.

* cited by examiner

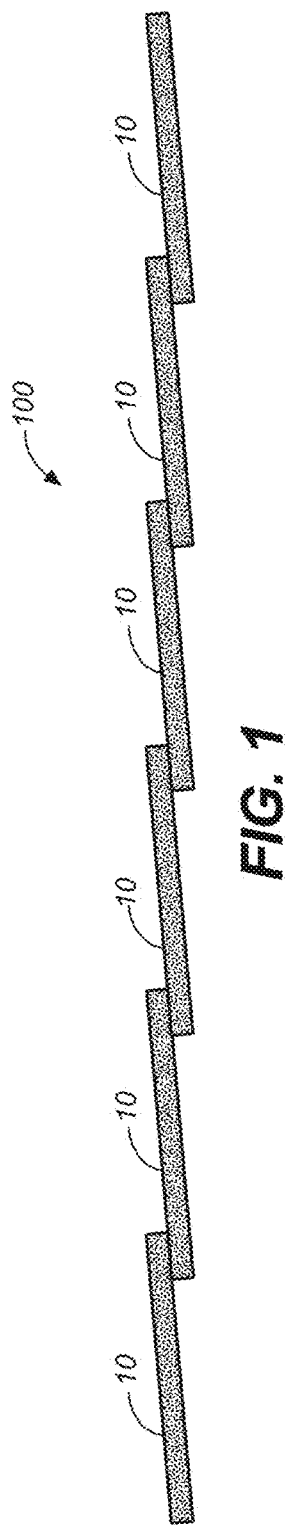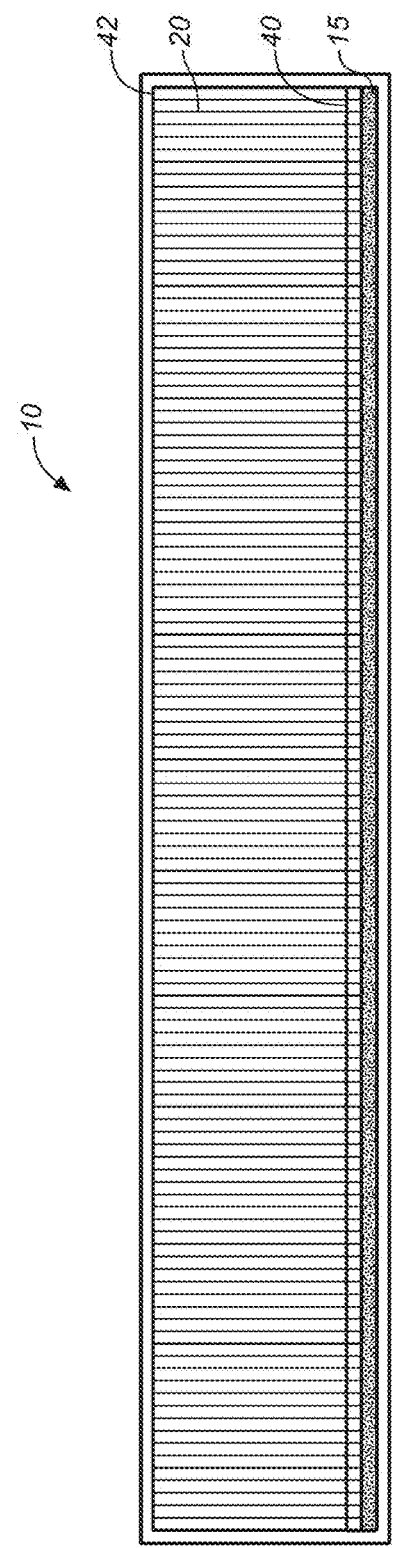

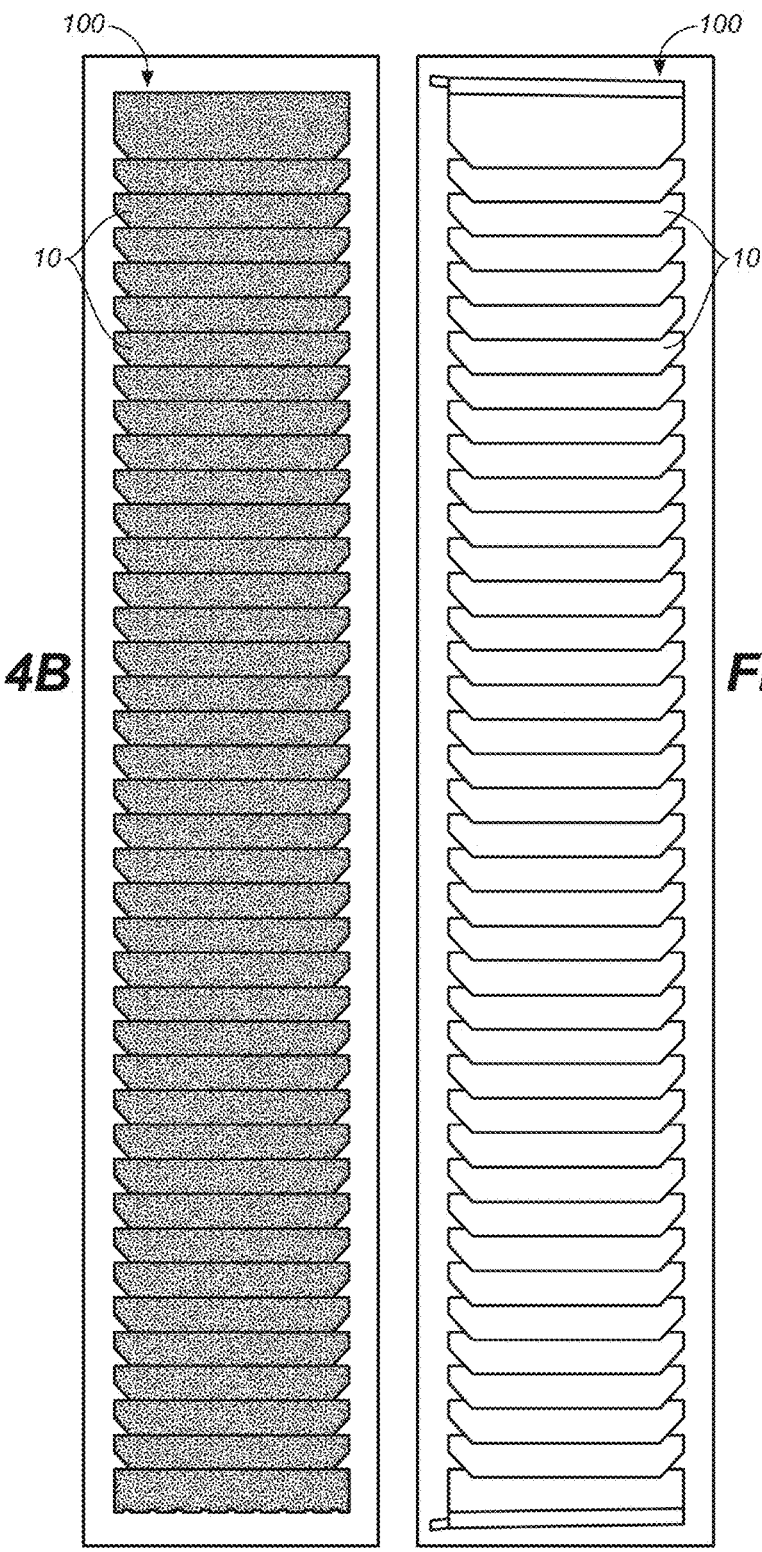

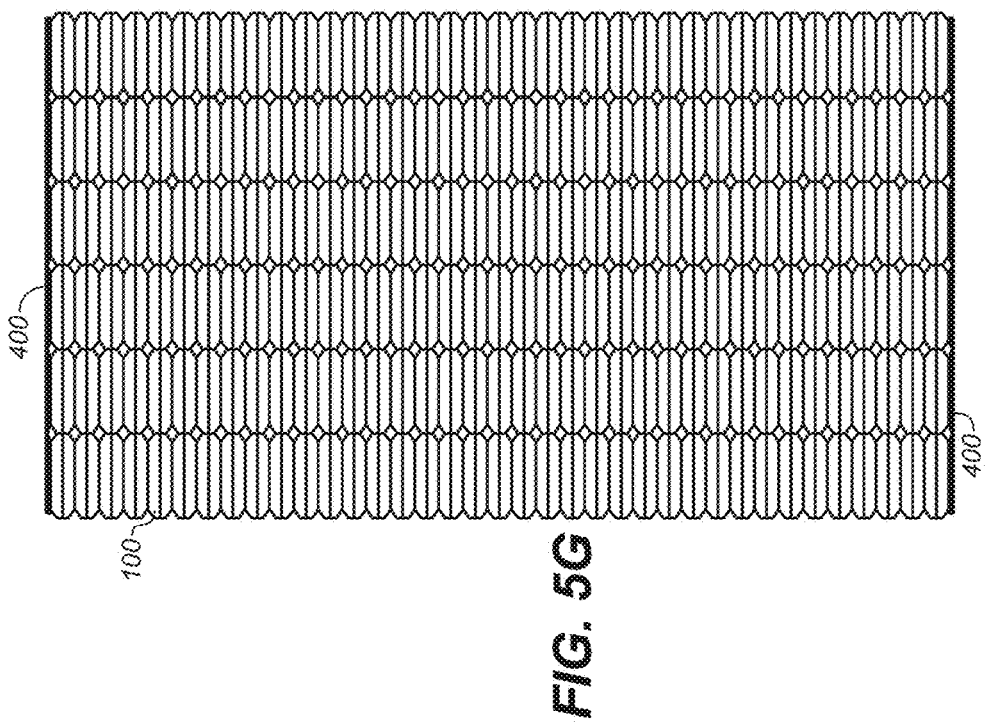

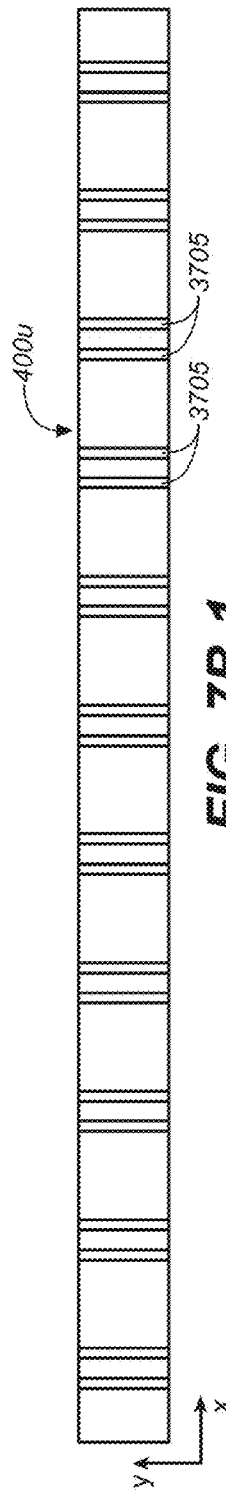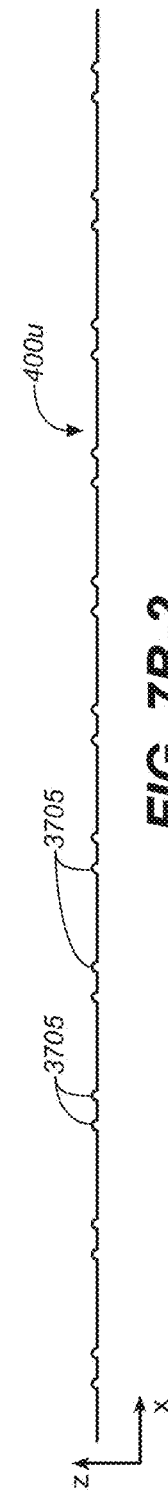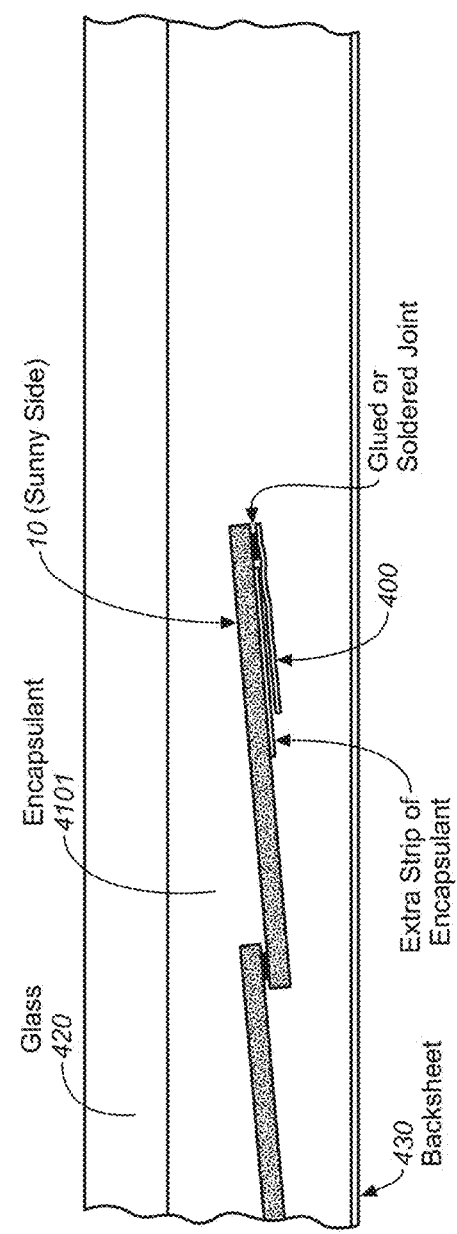

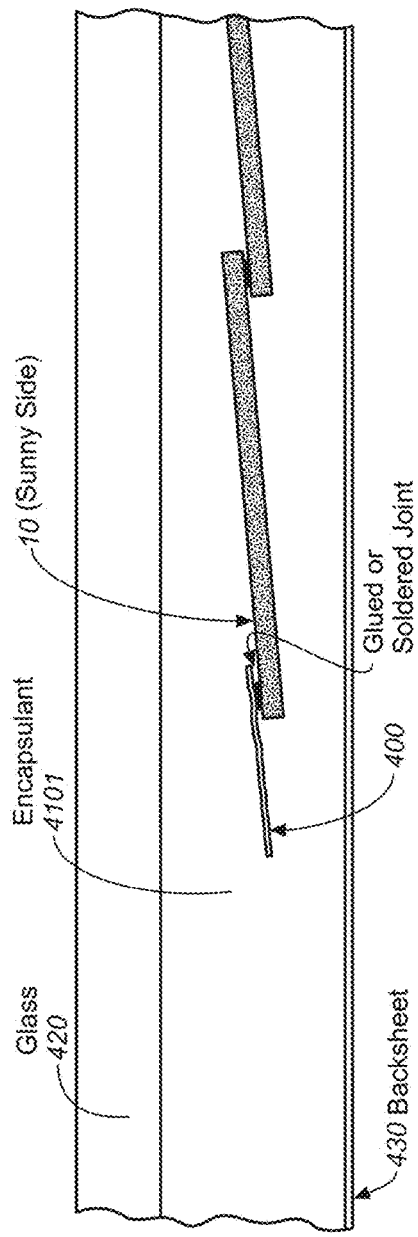
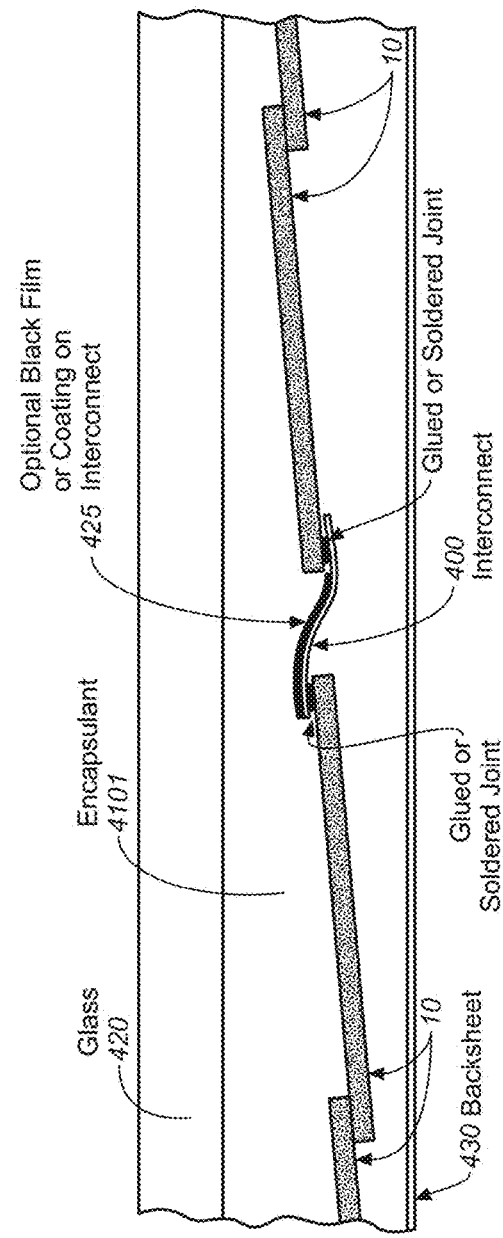
FIG. 8B
FIG. 8C

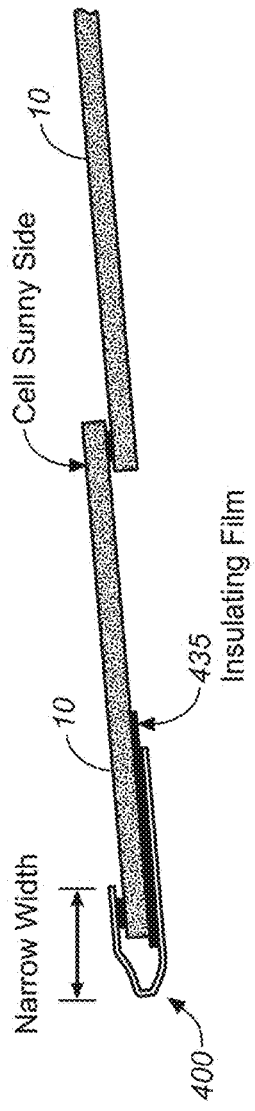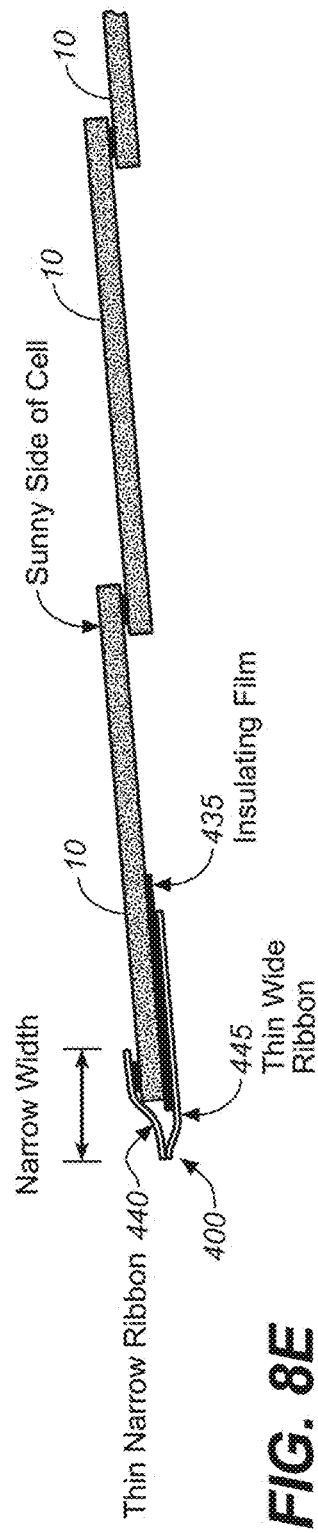
FIG. 8D
FIG. 8E

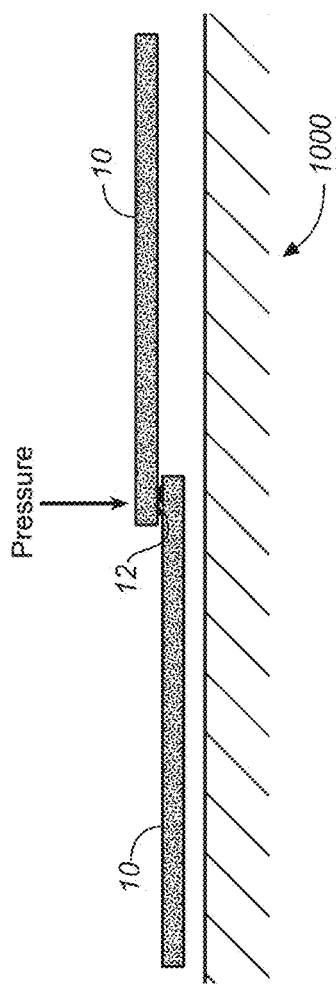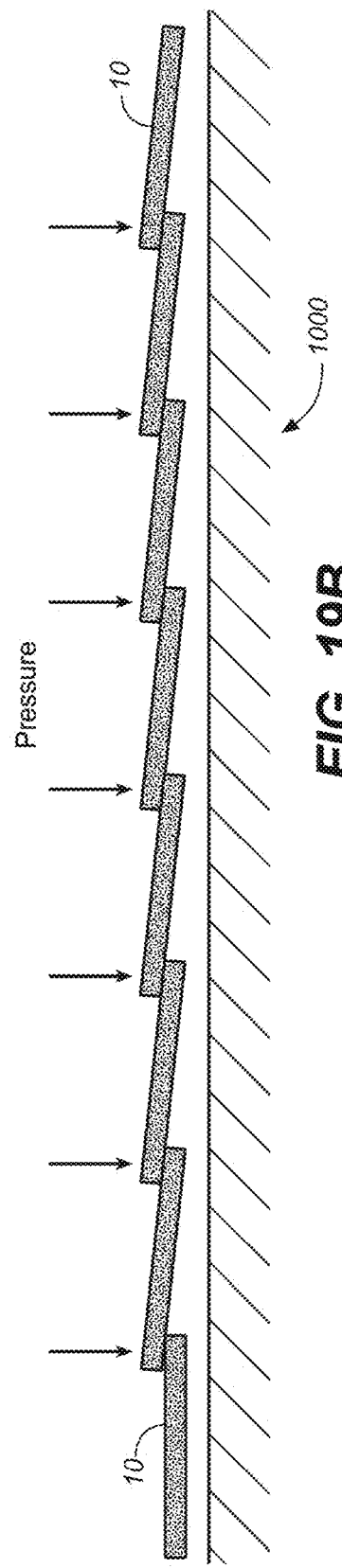

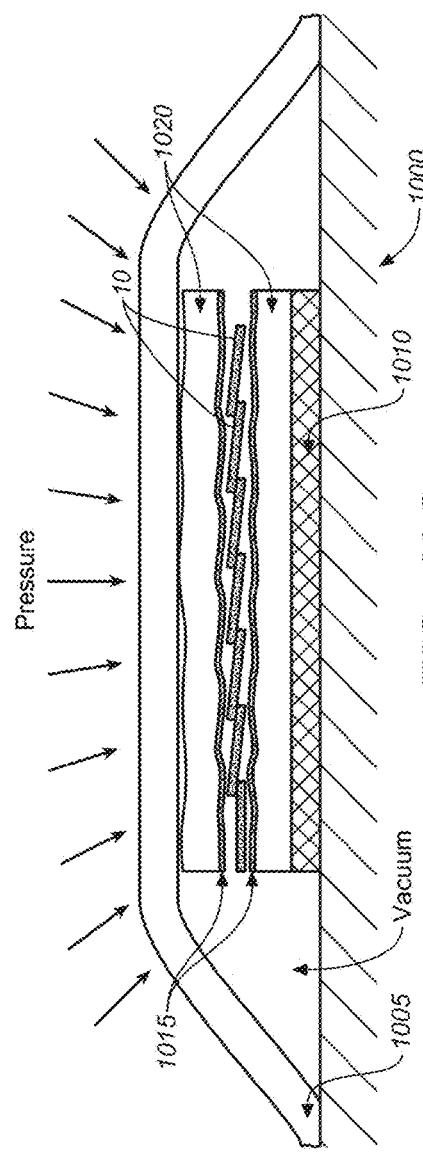
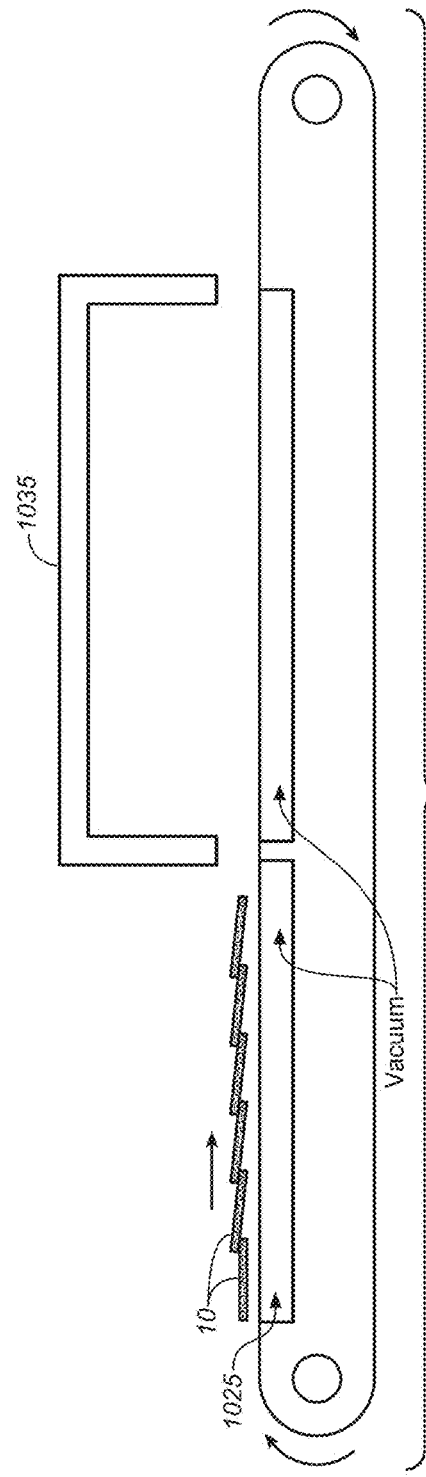
FIG. 19C
FIG. 19D

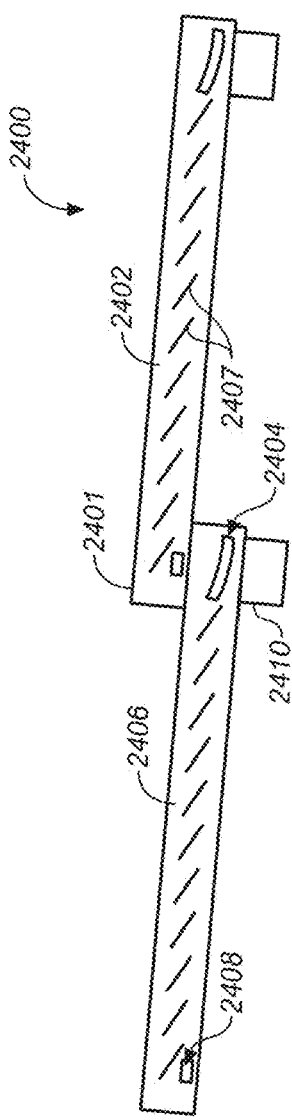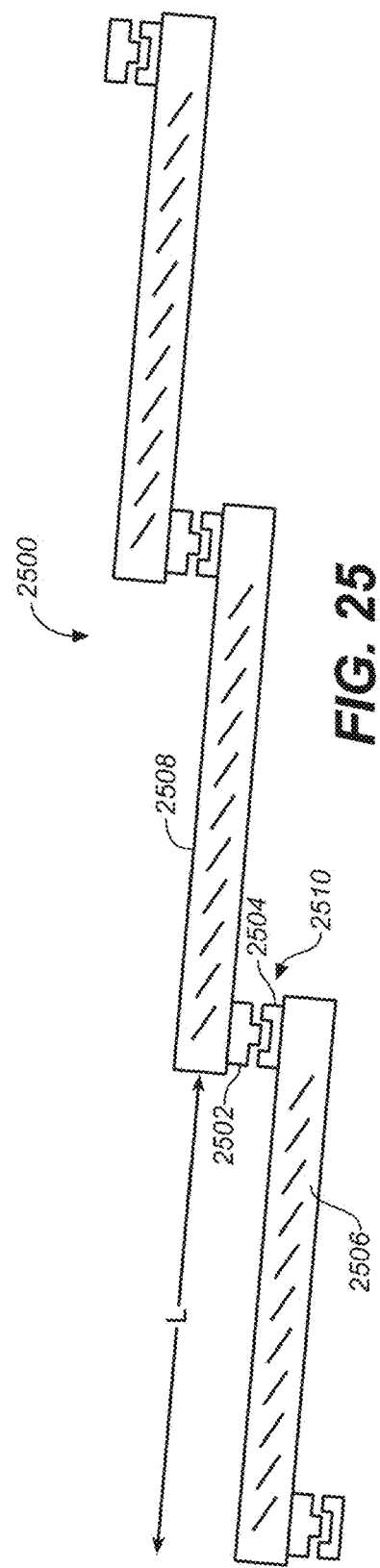

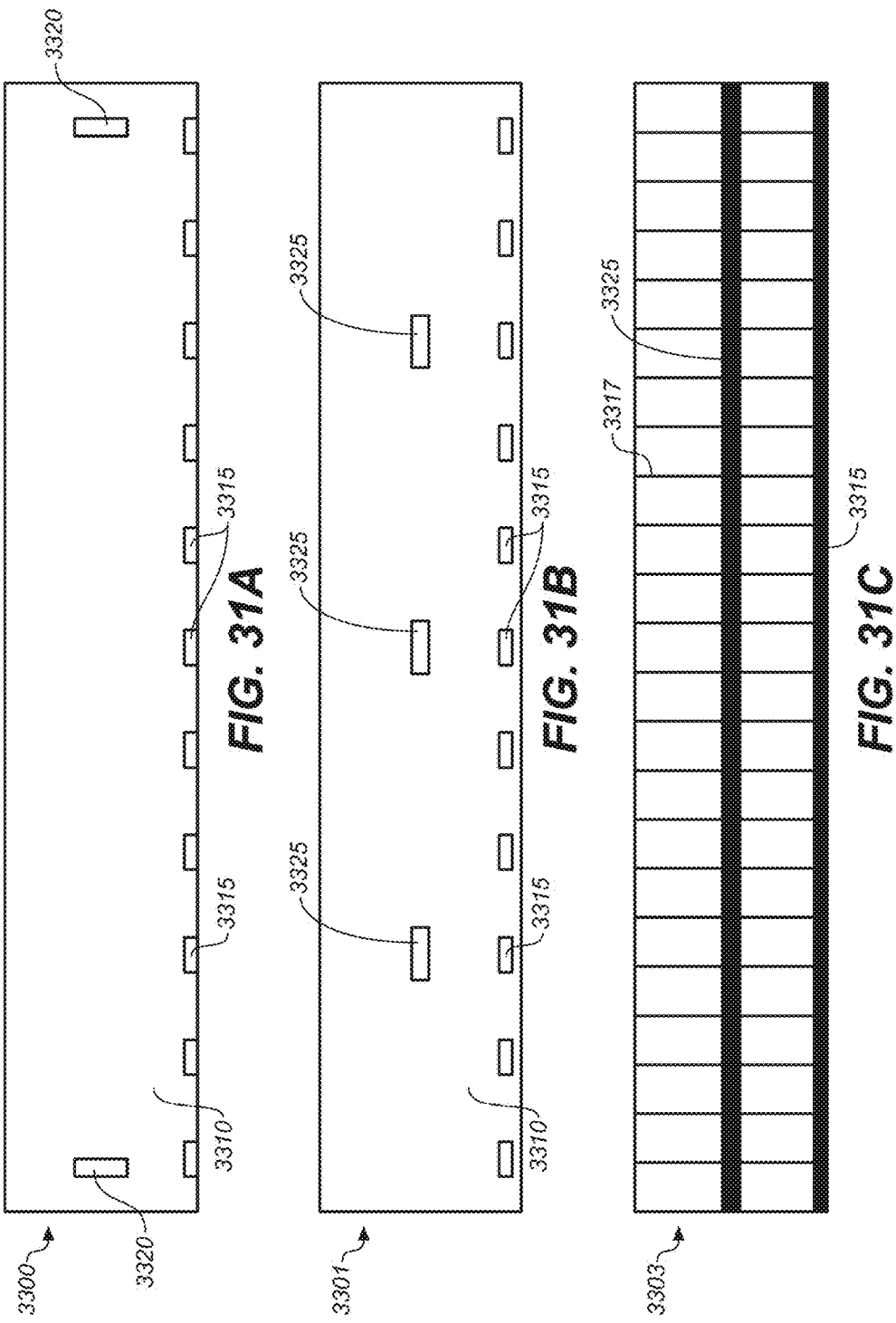

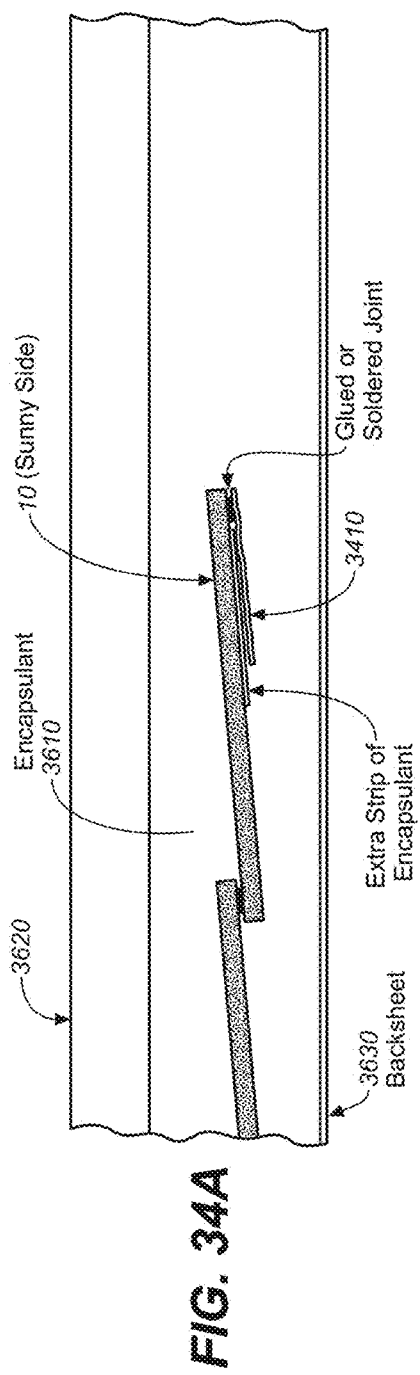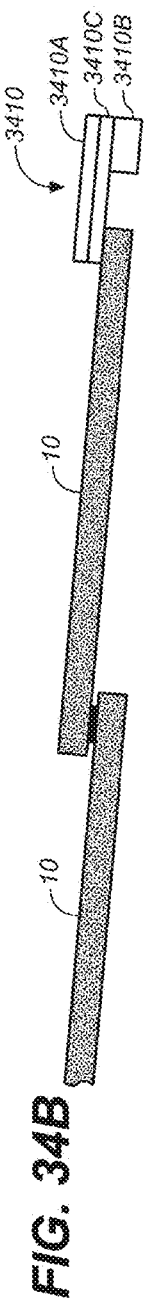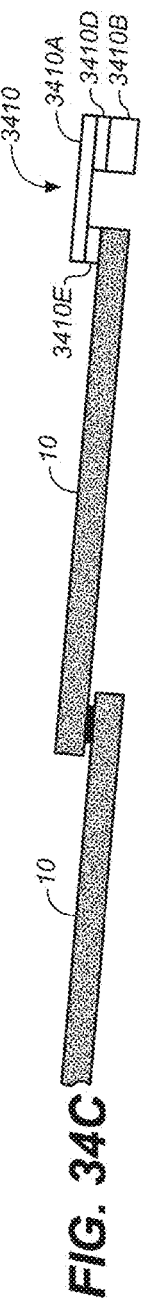
FIG. 34A
FIG. 34B
FIG. 34C

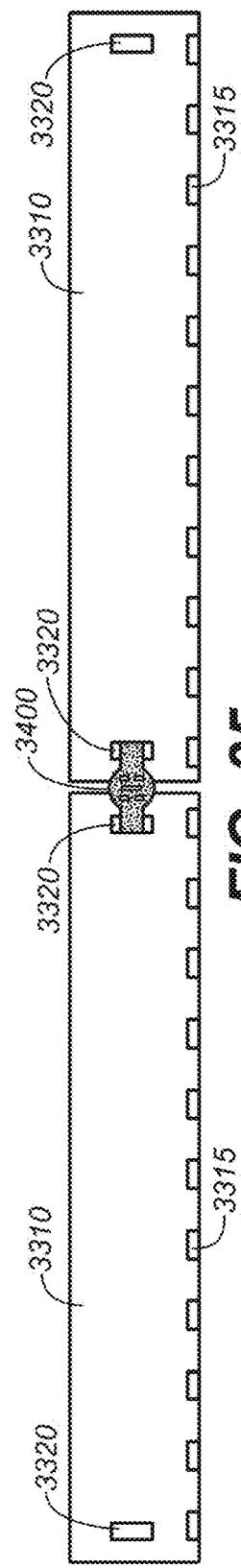
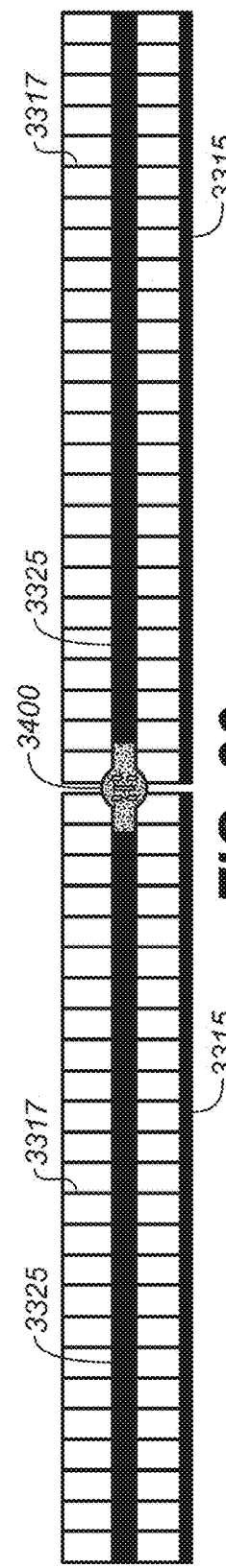

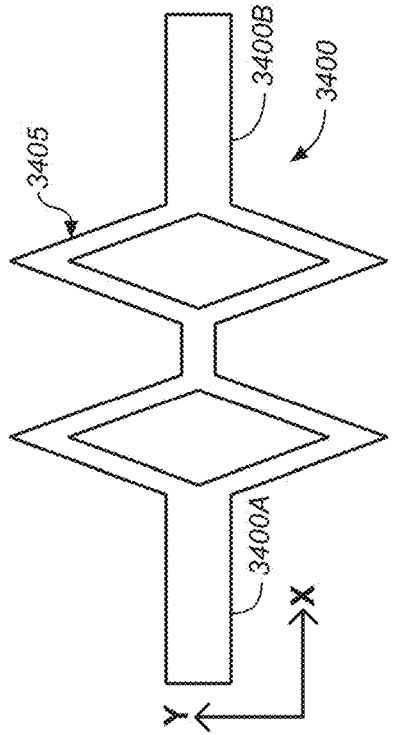 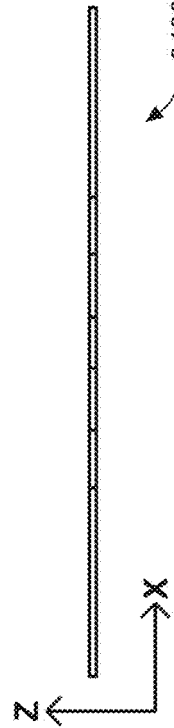
FIG. 37A-1   FIG. 37A-2
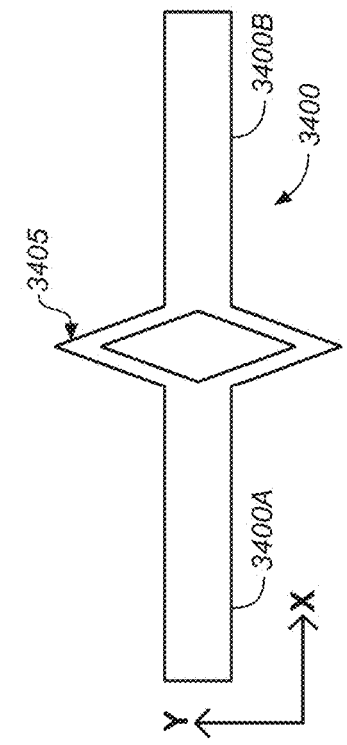 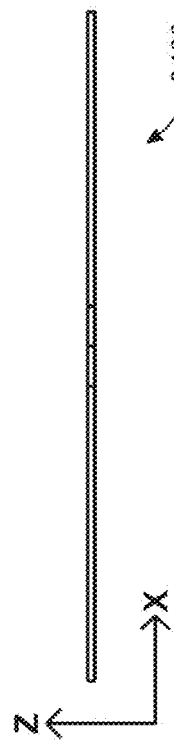
FIG. 37B-1   FIG. 37B-2

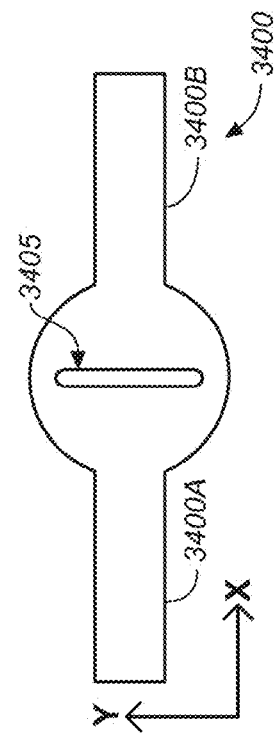
FIG. 37C-1
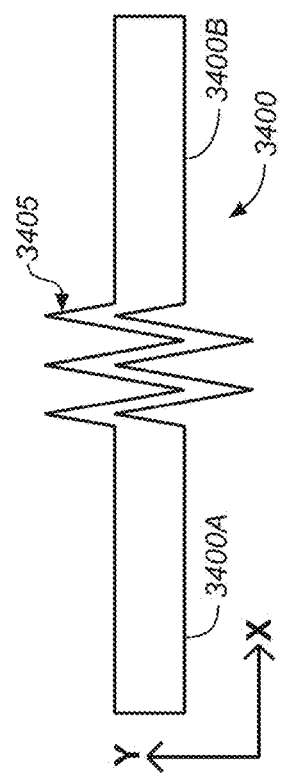
FIG. 37D-1
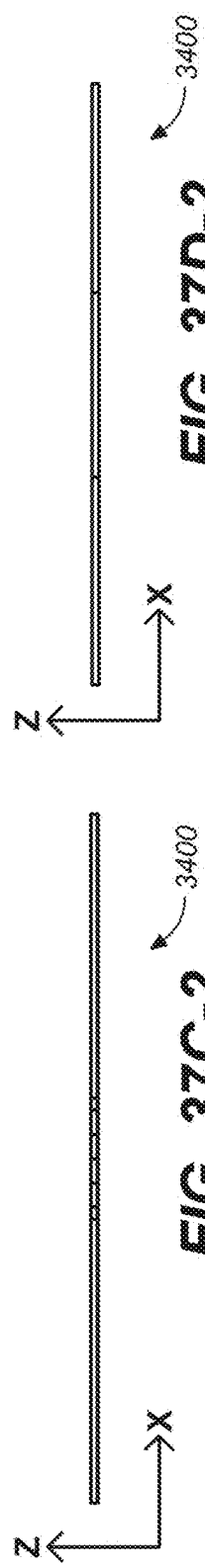
FIG. 37C-2
FIG. 37D-2

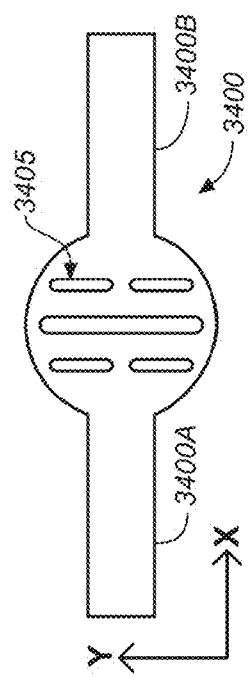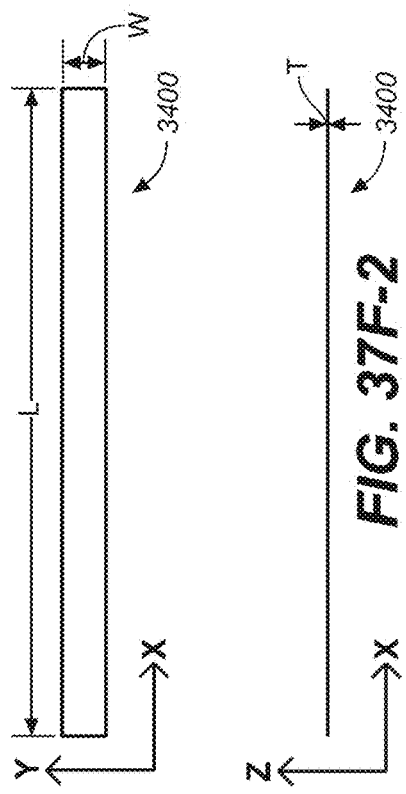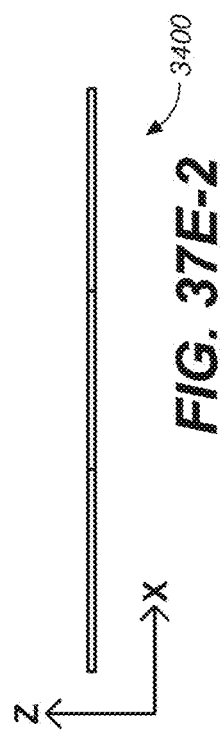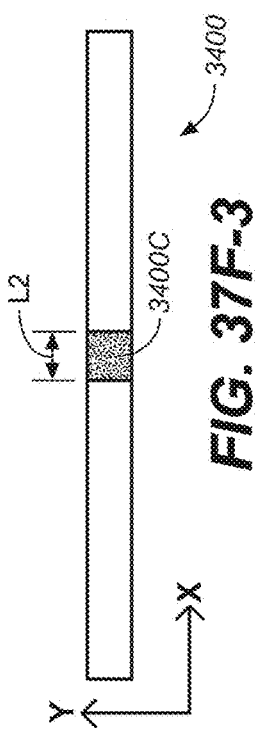

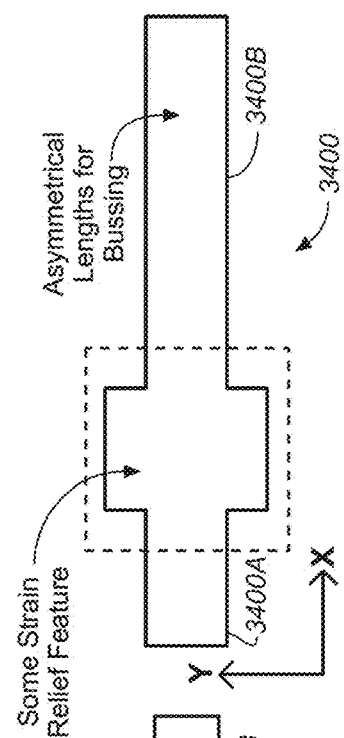
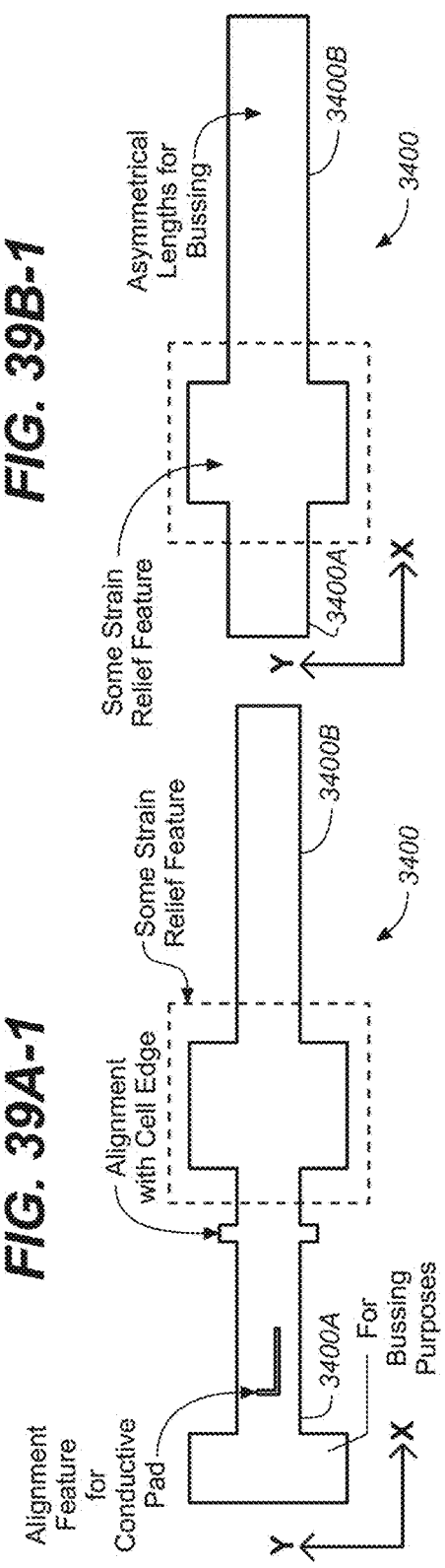
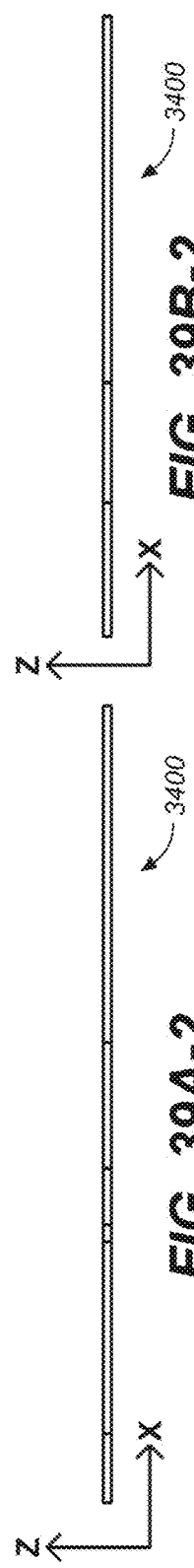

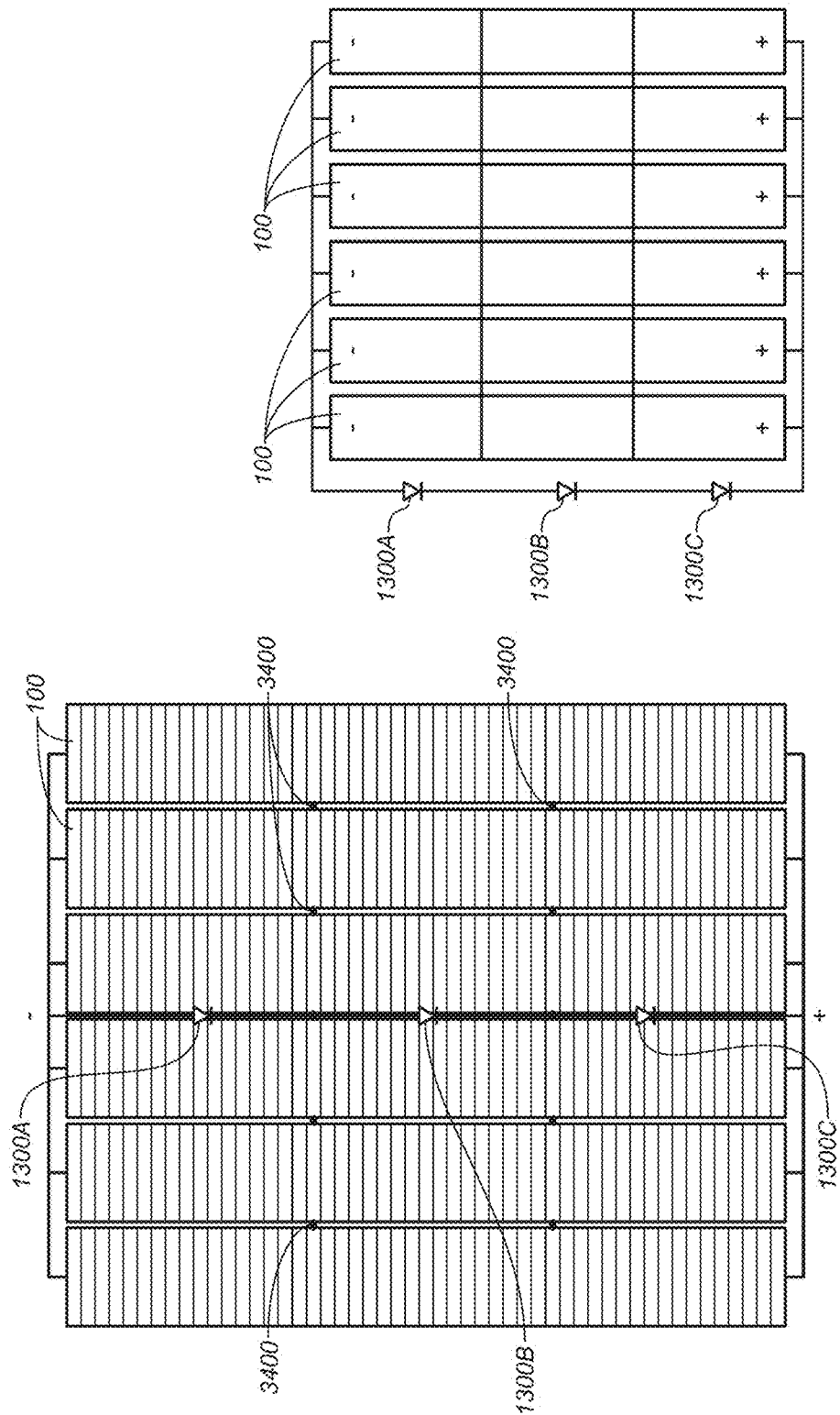

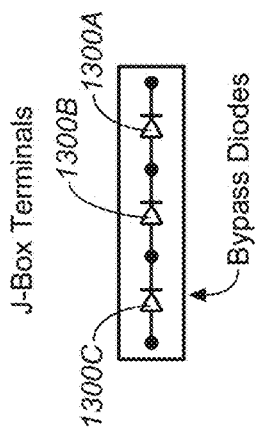
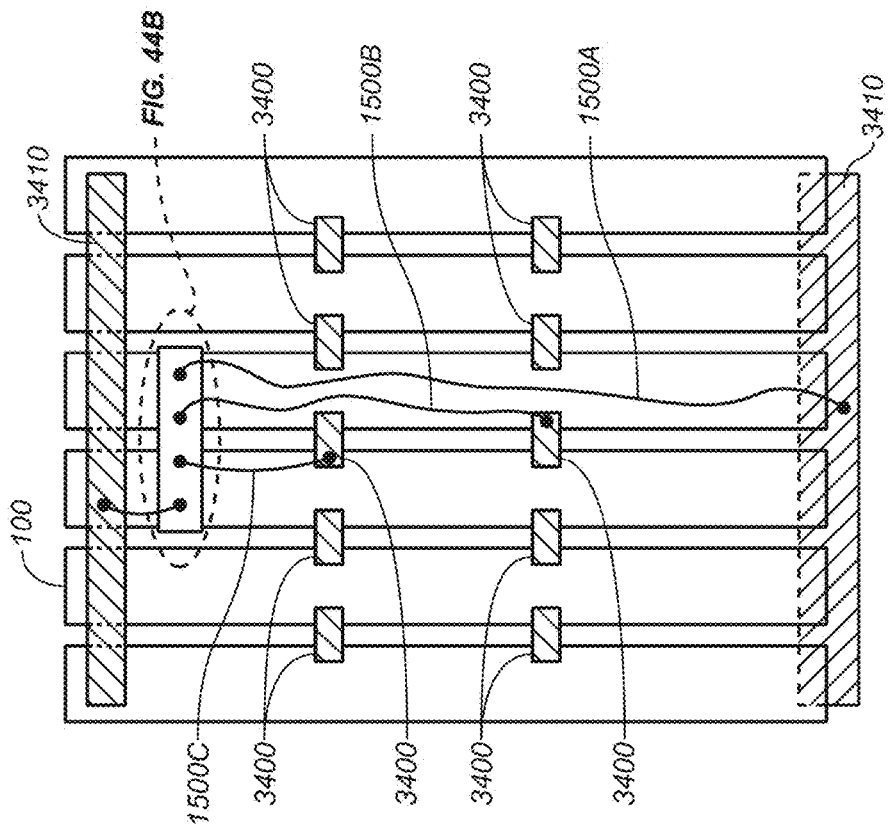

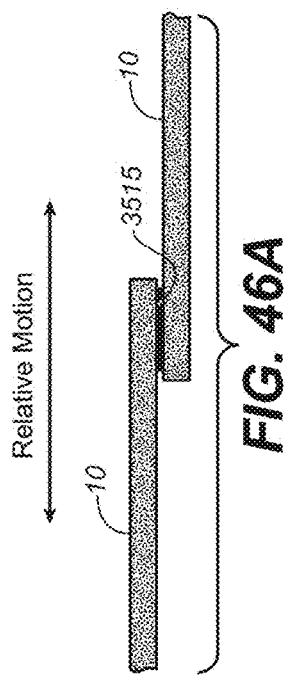
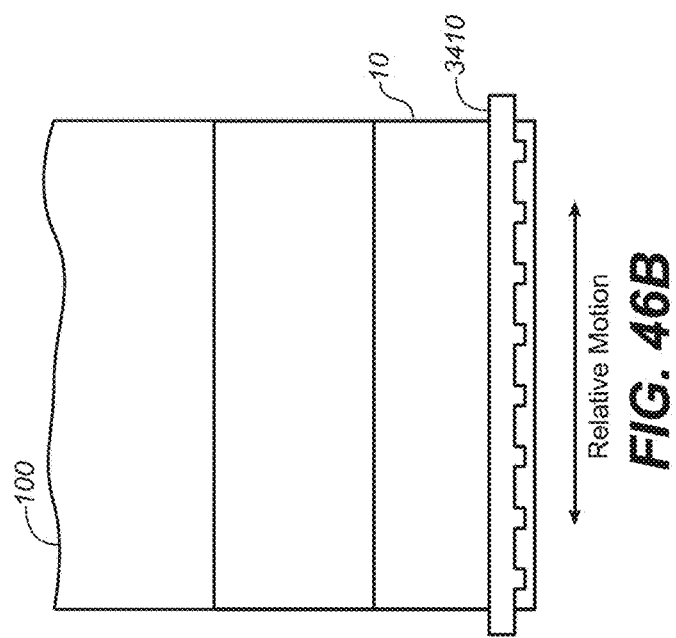
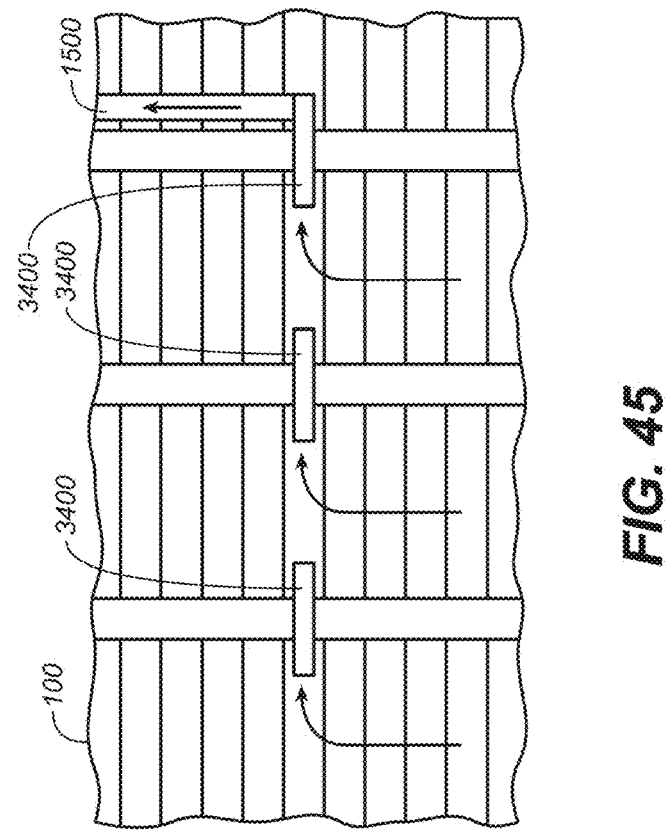
FIG. 46A
FIG. 46B
FIG. 45

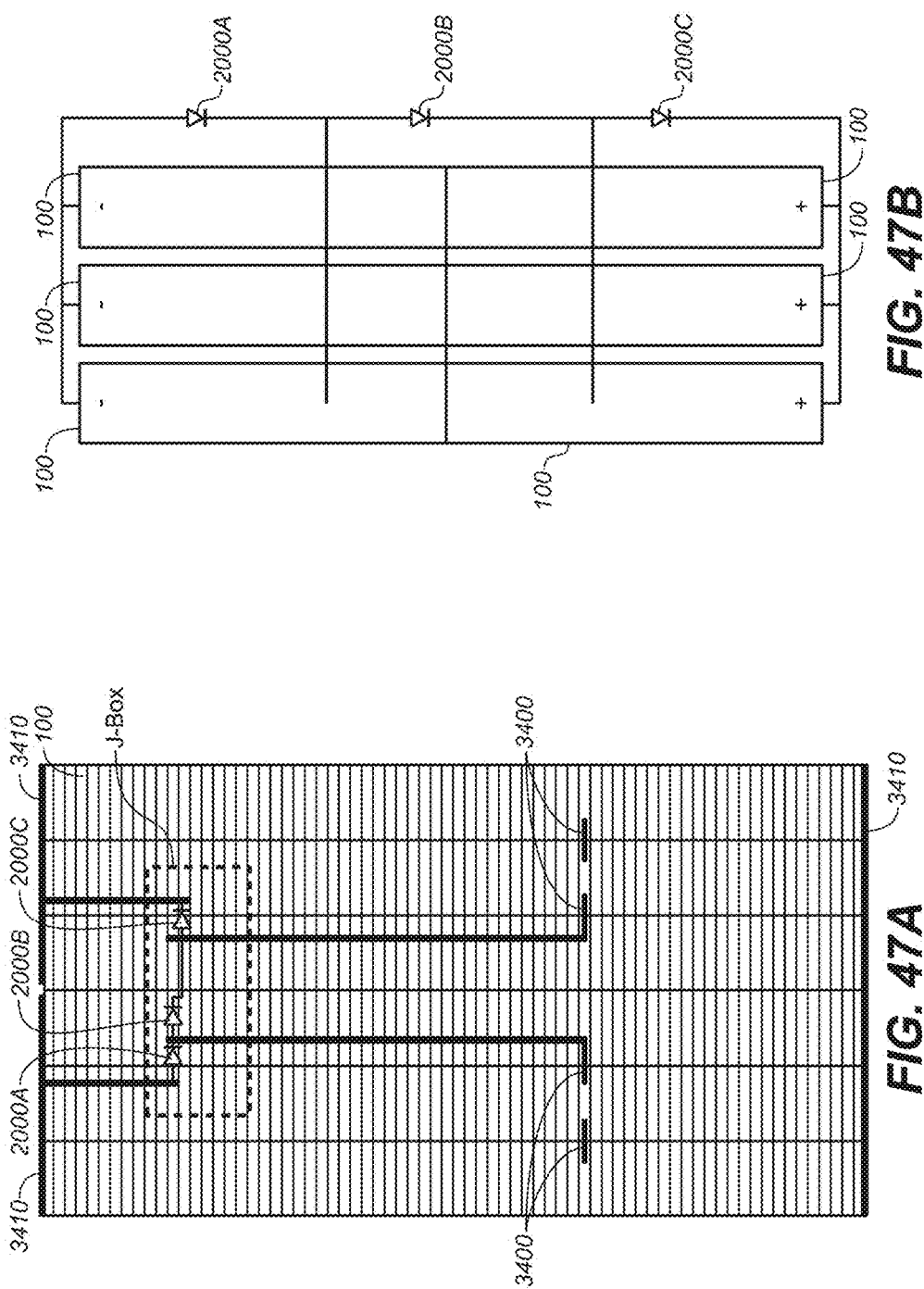

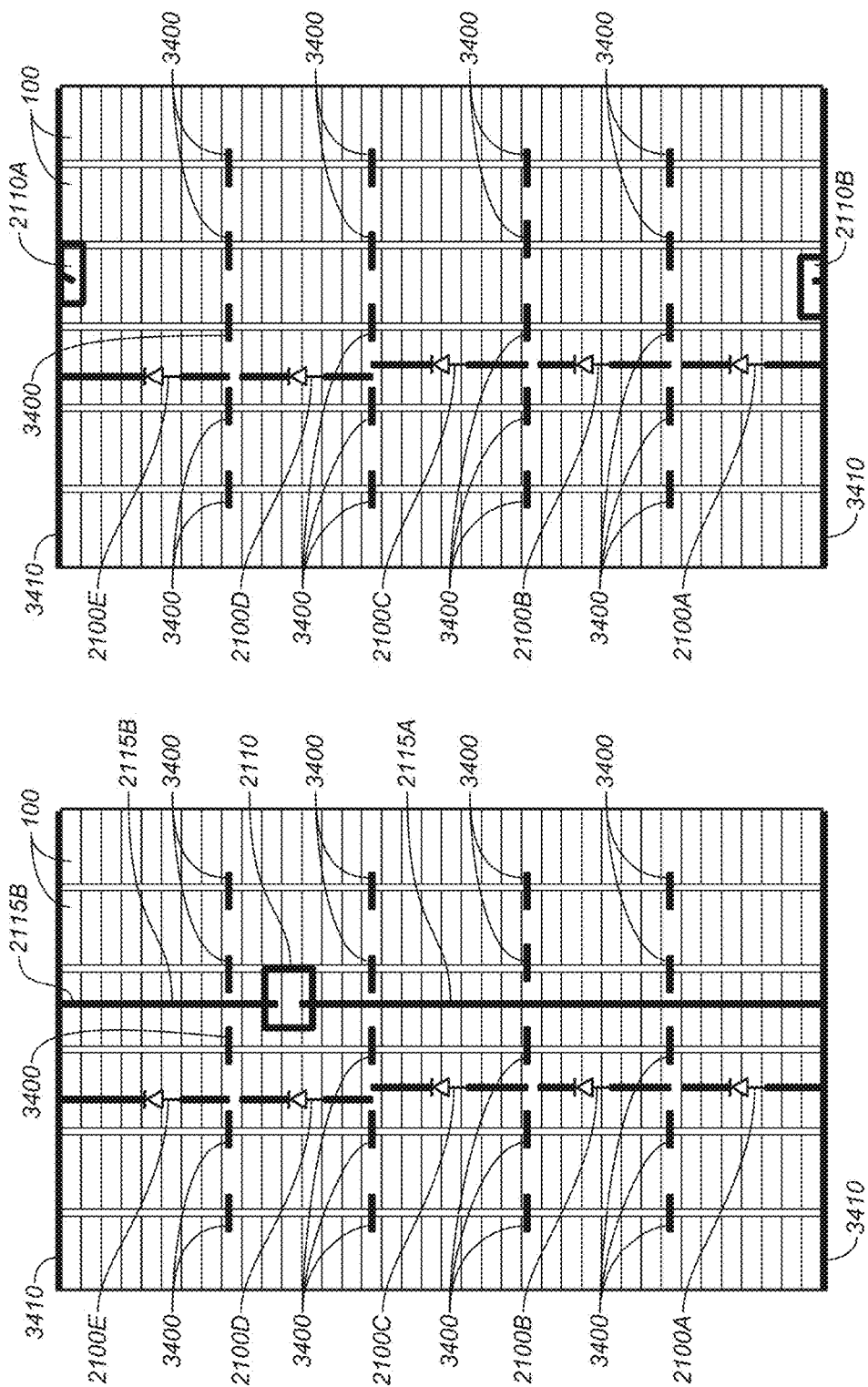

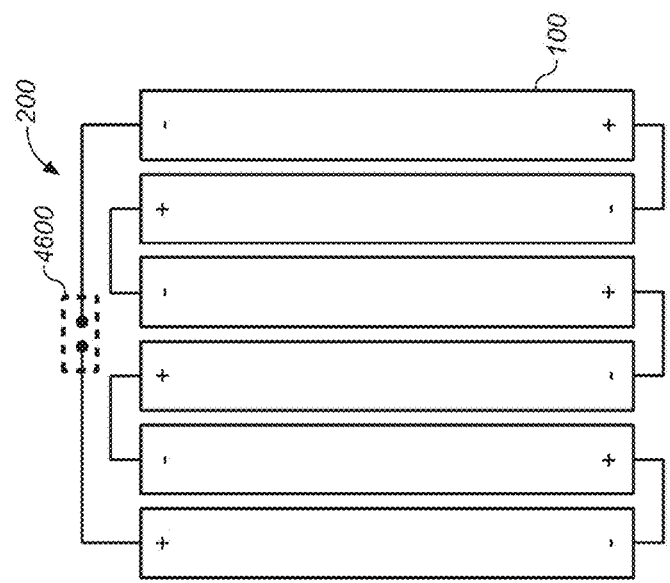
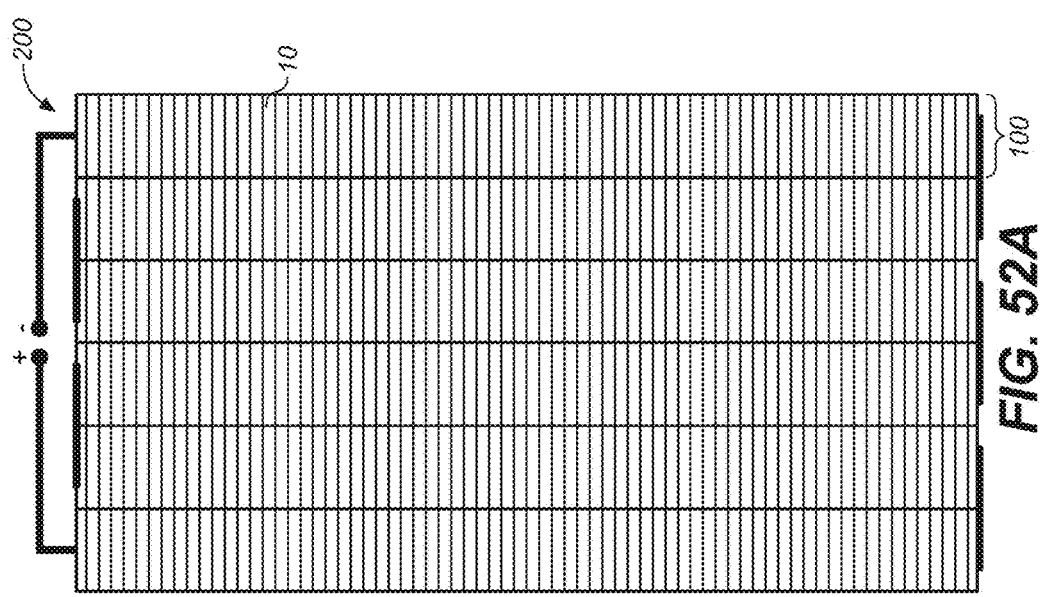

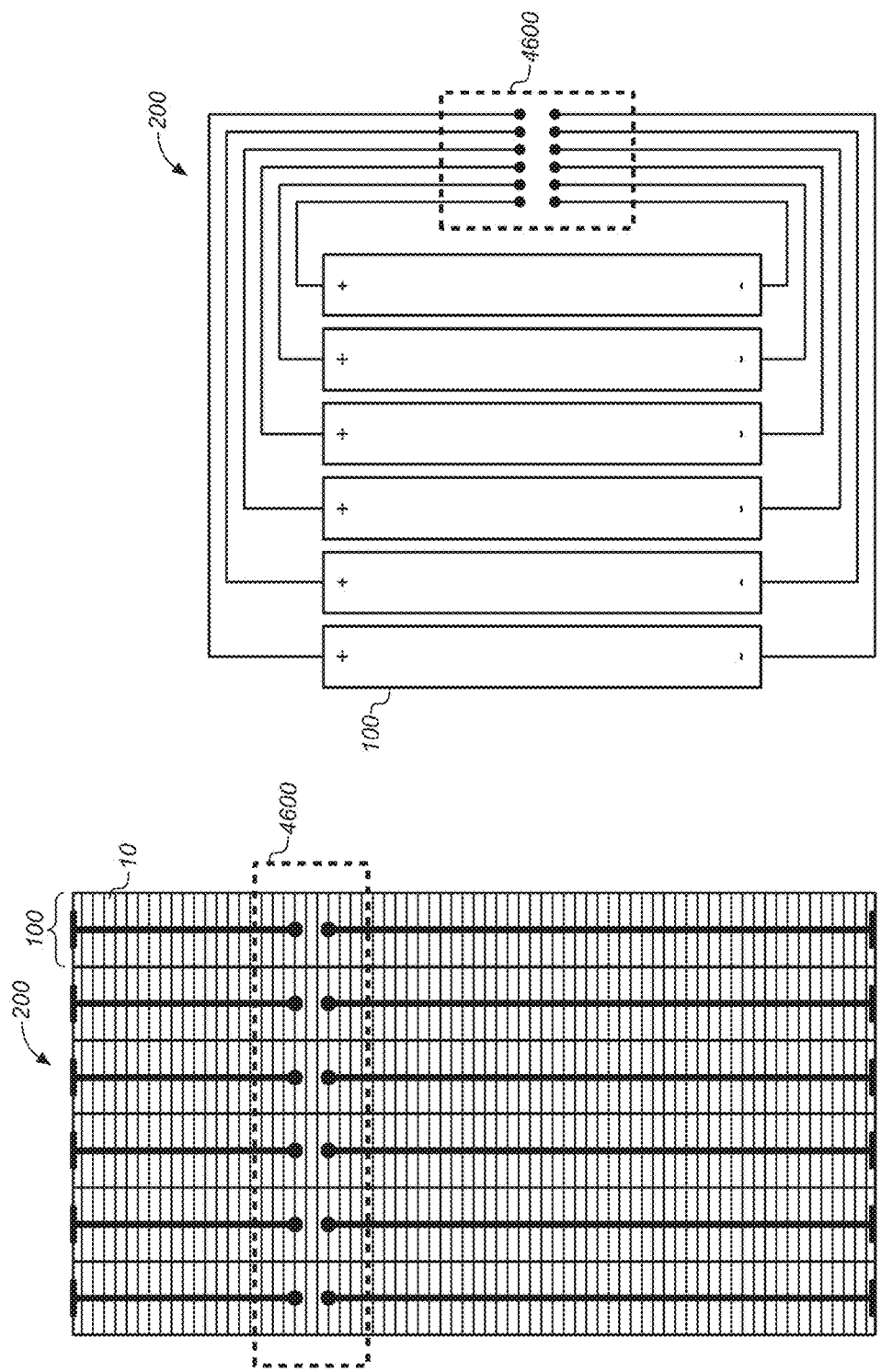

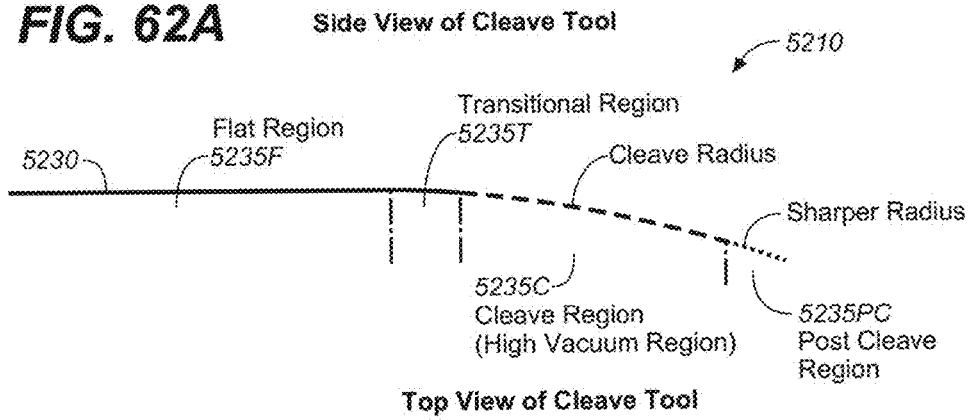
FIG. 62A Side View of Cleave Tool
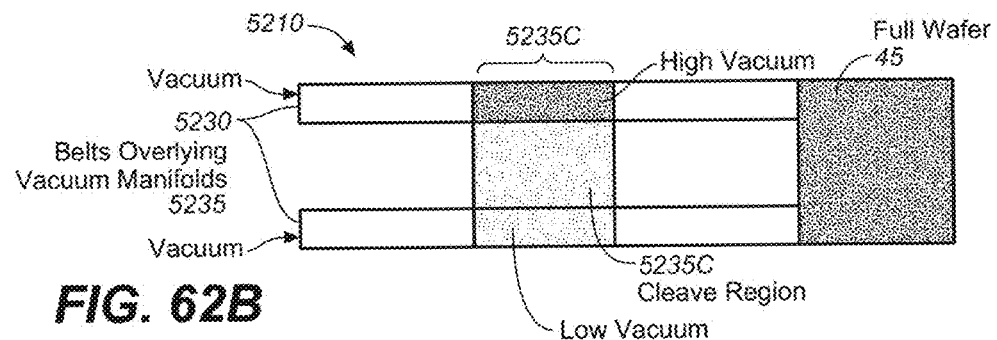
FIG. 62B
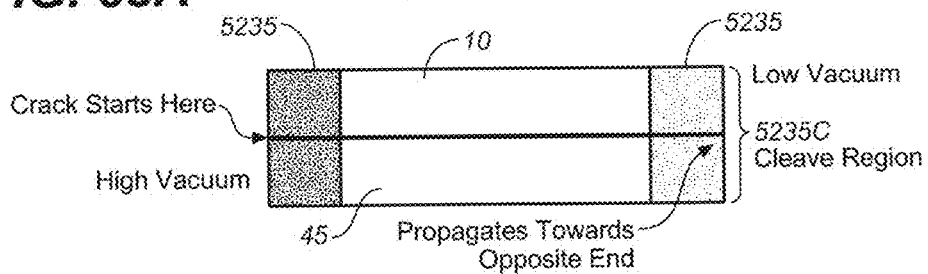
FIG. 63A Asymmetric Vacuum
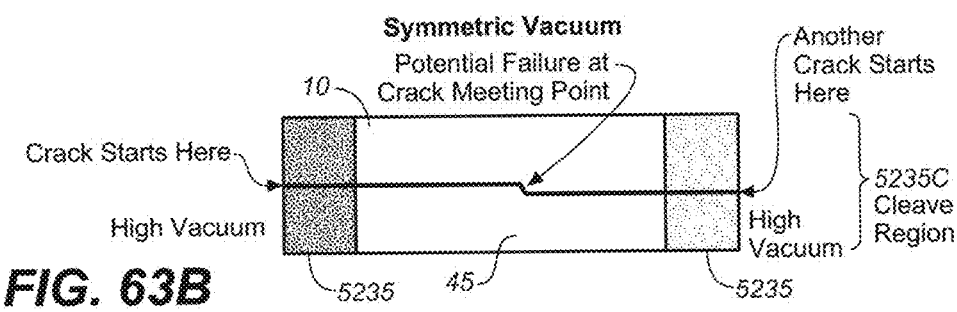
FIG. 63B Symmetric Vacuum

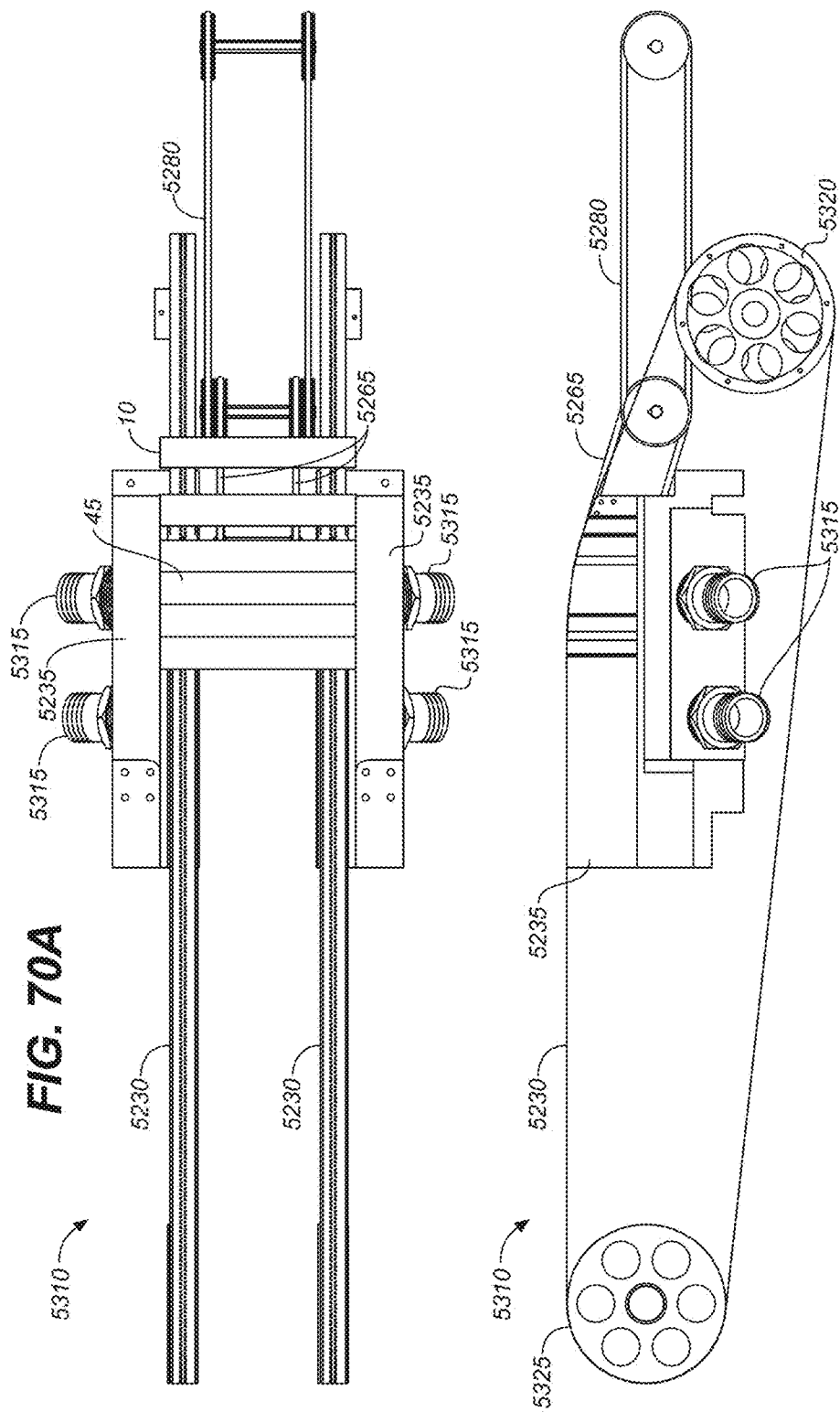

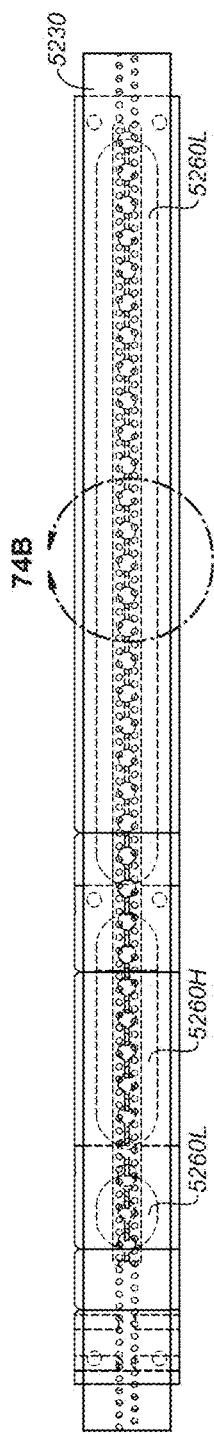
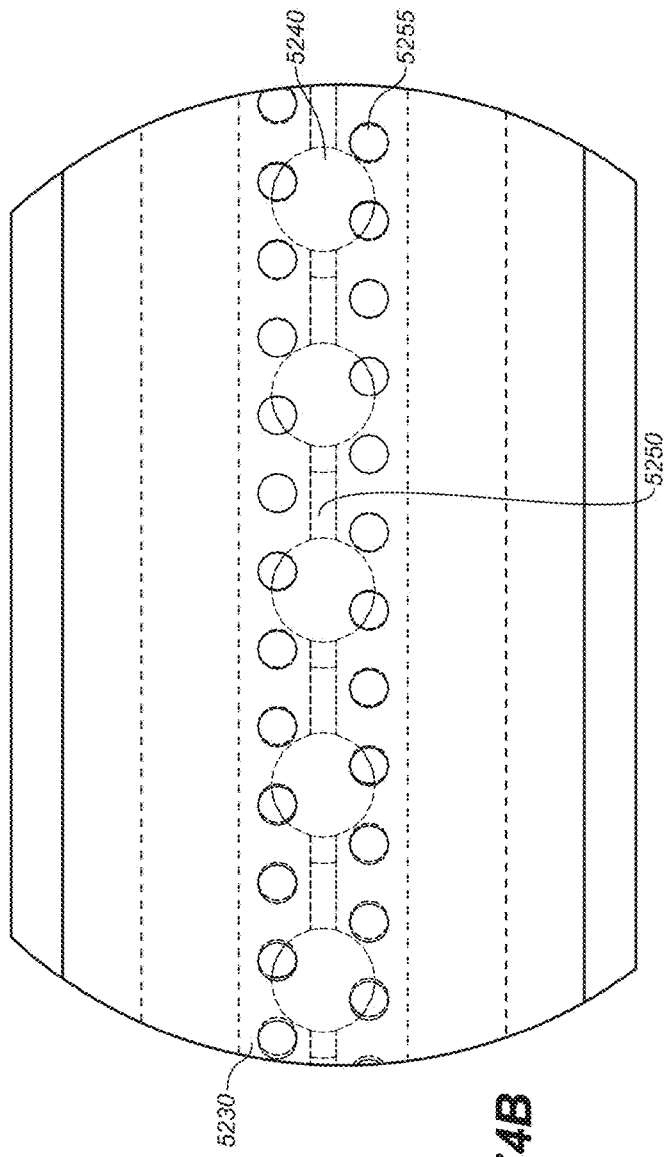
FIG. 74A
FIG. 74B

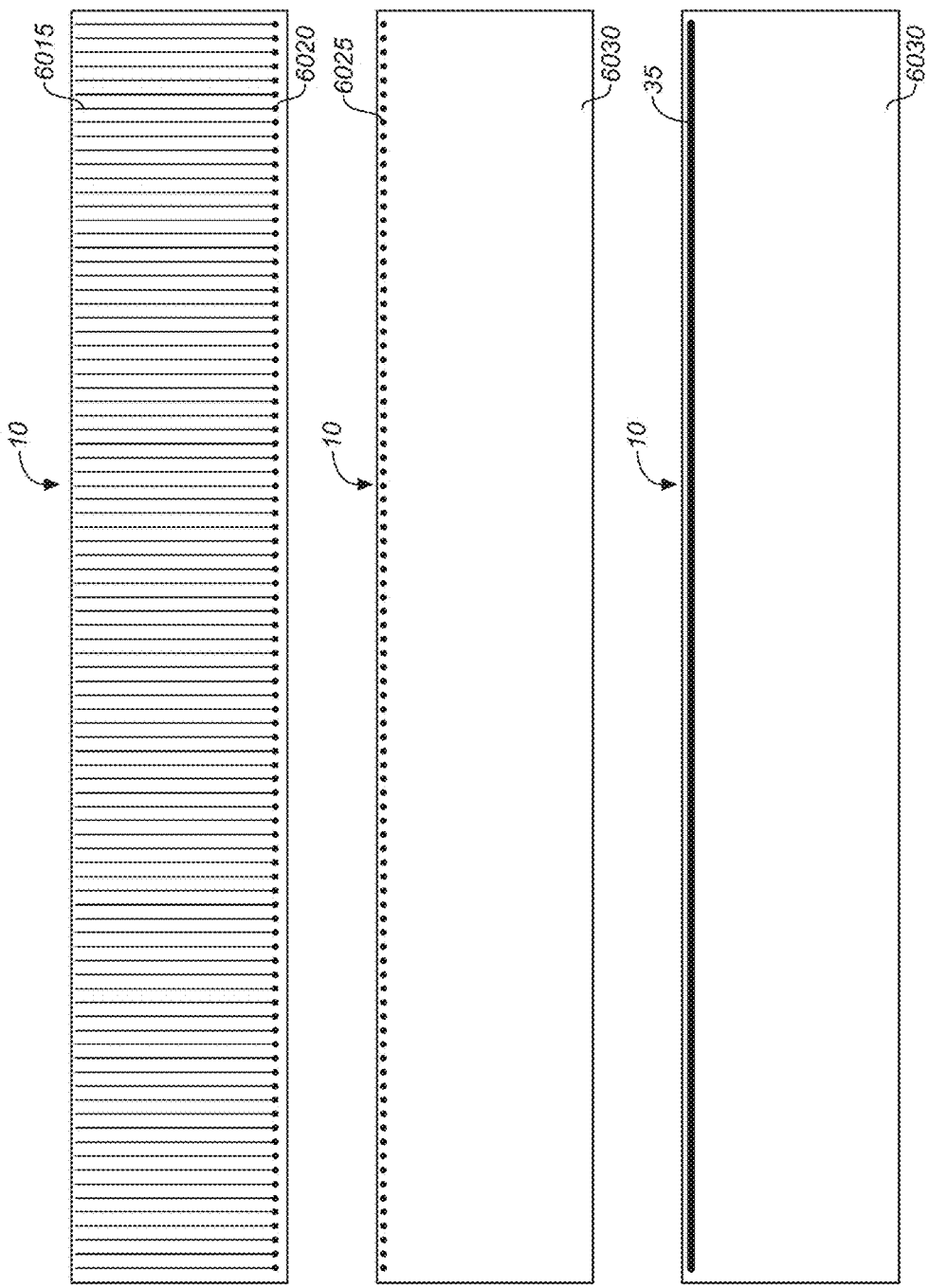

SYSTEM FOR MANUFACTURING A SHINGLED SOLAR CELL MODULE

CROSS REFERENCE TO RELATED APPLICATIONS

This application is a Continuation of International Patent Application PCT/US2015/032472 titled "Shingled Solar Cell Module" and filed May 26, 2015. International Patent Application PCT/US2015/032472 claims priority to U.S. patent application Ser. No. 14/530,405 titled "Shingled Solar Cell Module" and filed Oct. 31, 2014, U.S. patent application Ser. No. 14/532,293 titled "Shingled Solar Cell Module" and filed Nov. 4, 2014, U.S. patent application Ser. No. 14/536,486 titled "Shingled Solar Cell Module" and filed Nov. 7, 2014, U.S. patent application Ser. No. 14/539,546 titled "Shingled Solar Cell Module" and filed Nov. 12, 2014, U.S. patent application Ser. No. 14/543,580 titled "Shingled Solar Cell Module" and filed Nov. 17, 2014, U.S. patent application Ser. No. 14/548,081 titled "Shingled Solar Cell Module" and filed Nov. 19, 2014, U.S. patent application Ser. No. 14/550,676 titled "Shingled Solar Cell Module" and filed Nov. 21, 2014, U.S. patent application Ser. No. 14/552,761 titled "Shingled Solar Cell Module" and filed Nov. 25, 2014, U.S. patent application Ser. No. 14/560,577 titled "Shingled Solar Cell Module" and filed Dec. 4, 2014, U.S. patent application Ser. No. 14/566,278 titled "Shingled Solar Cell Module" and filed Dec. 10, 2014, U.S. patent application Ser. No. 14/565,820 titled "Shingled Solar Cell Module" and filed Dec. 10, 2014, U.S. patent application Ser. No. 14/572,206 titled "Shingled Solar Cell Module" and filed Dec. 16, 2014, U.S. patent application Ser. No. 14/577,593 titled "Shingled Solar Cell Module" and filed Dec. 19, 2014, U.S. patent application Ser. No. 14/586,025 titled "Shingled Solar Cell Module" and filed Dec. 30, 2014, U.S. patent application Ser. No. 14/585,917 titled "Shingled Solar Cell Module" and filed Dec. 30, 2014, U.S. patent application Ser. No. 14/594,439 titled "Shingled Solar Cell Module" and filed Jan. 12, 2015, U.S. patent application Ser. No. 14/605,695 titled "Shingled Solar Cell Module" and filed Jan. 26, 2015, U.S. Provisional Patent Application No. 62/003,223 titled "Shingled Solar Cell Module" filed May 27, 2014, to U.S. Provisional Patent Application No. 62/036,215 titled "Shingled Solar Cell Module" filed Aug. 12, 2014, to U.S. Provisional Patent Application No. 62/042,615 titled "Shingled Solar Cell Module" filed Aug. 27, 2014, to U.S. Provisional Patent Application No. 62/048,858 titled "Shingled Solar Cell Module" filed Sep. 11, 2014, to U.S. Provisional Patent Application No. 62/064,260 titled "Shingled Solar Cell Module" filed Oct. 15, 2014, to U.S. Provisional Patent Application No. 62/064,834 titled "Shingled Solar Cell Module" filed Oct. 16, 2014, U.S. patent application Ser. No. 14/674,983 titled "Shingled Solar Cell Panel Employing Hidden Taps" and filed Mar. 31, 2015, U.S. Provisional Patent Application No. 62/081,200 titled "Solar Cell Panel Employing Hidden Taps" and filed Nov. 18, 2014, U.S. Provisional Patent Application No. 62/113,250 titled "Shingled Solar Cell Panel Employing Hidden Taps" and filed Feb. 6, 2015, U.S. Provisional Patent Application No. 62/082,904 titled "High Voltage Solar Panel" and filed Nov. 21, 2014, U.S. Provisional Patent Application No. 62/103,816 titled "High Voltage Solar Panel" and filed Jan. 15, 2015, U.S. Provisional Patent Application No. 62/111,757 titled "High Voltage Solar Panel" and filed Feb. 4, 2015, U.S. Provisional Patent Application No. 62/134,176 titled "Solar Cell Cleaving Tools and Methods" and filed Mar. 17, 2015, U.S. Provisional Patent Application No. 62/150,426 titled "Shingled Solar Cell Panel Comprising Stencil-Printed Cell Metallization" and filed Apr. 21, 2015, U.S. Provisional Patent Application No. 62/035,624 titled "Solar Cells with Reduced Edge Carrier Recombination" and filed Aug. 11, 2014, U.S. Design Patent Application No. 29/506,415 filed Oct. 15, 2014, U.S. Design Patent Application No. 29/506,755 filed Oct. 20, 2014, U.S. Design Patent Application No. 29/508,323 filed Nov. 5, 2014, U.S. Design Patent Application No. 29/509,586 filed Nov. 19, 2014, and to U.S. Design Patent Application No. 29/509,588 filed Nov. 19, 2014. Each of the patent applications in the preceding list is incorporated herein by reference in its entirety for all purposes.

FIELD OF THE INVENTION

The invention relates generally to solar cell modules in which the solar cells are arranged in a shingled manner.

BACKGROUND

Alternate sources of energy are needed to satisfy ever increasing world-wide energy demands. Solar energy resources are sufficient in many geographical regions to satisfy such demands, in part, by provision of electric power generated with solar (e.g., photovoltaic) cells.

SUMMARY

High efficiency arrangements of solar cells in a solar cell module, and methods of making such solar modules, are disclosed herein.

In one aspect, a solar module comprises a series connected string of N≥25 rectangular or substantially rectangular solar cells having on average a breakdown voltage greater than about 10 volts. The solar cells are grouped into one or more super cells each of which comprises two or more of the solar cells arranged in line with long sides of adjacent solar cells overlapping and conductively bonded to each other with an electrically and thermally conductive adhesive. No single solar cell or group of <N solar cells in the string of solar cells is individually electrically connected in parallel with a bypass diode. Safe and reliable operation of the solar module is facilitated by effective heat conduction along the super cells through the bonded overlapping portions of adjacent solar cells, which prevents or reduces formation of hot spots in reverse biased solar cells. The super cells may be encapsulated in a thermoplastic olefin polymer sandwiched between glass front and back sheets, for example, further enhancing the robustness of the module with respect to thermal damage. In some variations, N is ≥30, ≥50, or ≥100.

In another aspect, a super cell comprises a plurality of silicon solar cells each comprising rectangular or substantially rectangular front (sun side) and back surfaces with shapes defined by first and second oppositely positioned parallel long sides and two oppositely positioned short sides. Each solar cell comprises an electrically conductive front surface metallization pattern comprising at least one front surface contact pad positioned adjacent to the first long side, and an electrically conductive back surface metallization pattern comprising at least one back surface contact pad positioned adjacent the second long side. The silicon solar cells are arranged in line with first and second long sides of adjacent silicon solar cells overlapping and with front surface and back surface contact pads on adjacent silicon solar cells overlapping and conductively bonded to each other with a conductive adhesive bonding material to electrically connect the silicon solar cells in series. The front surface metallization pattern of each silicon solar cell comprises a barrier configured to substantially confine the conducive adhesive bonding material to the at least one front surface contact pads prior to curing of the conductive adhesive bonding material during manufacturing of the super cell.

In another aspect, a super cell comprises a plurality of silicon solar cells each comprising rectangular or substantially rectangular front (sun side) and back surfaces with shapes defined by first and second oppositely positioned parallel long sides and two oppositely positioned short sides. Each solar cell comprises an electrically conductive front surface metallization pattern comprising at least one front surface contact pad positioned adjacent to the first long side, and an electrically conductive back surface metallization pattern comprising at least one back surface contact pad positioned adjacent the second long side. The silicon solar cells are arranged in line with first and second long sides of adjacent silicon solar cells overlapping and with front surface and back surface contact pads on adjacent silicon solar cells overlapping and conductively bonded to each other with a conductive adhesive bonding material to electrically connect the silicon solar cells in series. The back surface metallization pattern of each silicon solar cell comprises a barrier configured to substantially confine the conducive adhesive bonding material to the at least one back surface contact pads prior to curing of the conductive adhesive bonding material during manufacturing of the super cell.

In another aspect, a method of making a string of solar cells comprises dicing one or more pseudo square silicon wafers along a plurality of lines parallel to a long edge of each wafer to form a plurality of rectangular silicon solar cells each having substantially the same length along its long axis. The method also comprises arranging the rectangular silicon solar cells in line with long sides of adjacent solar cells overlapping and conductively bonded to each other to electrically connect the solar cells in series. The plurality of rectangular silicon solar cells comprises at least one rectangular solar cell having two chamfered corners corresponding to corners or to portions of corners of the pseudo square wafer, and one or more rectangular silicon solar cells each lacking chamfered corners. The spacing between parallel lines along which the pseudo square wafer is diced is selected to compensate for the chamfered corners by making the width perpendicular to the long axis of the rectangular silicon solar cells that comprise chamfered corners greater than the width perpendicular to the long axis of the rectangular silicon solar cells that lack chamfered corners, so that each of the plurality of rectangular silicon solar cells in the string of solar cells has a front surface of substantially the same area exposed to light in operation of the string of solar cells.

In another aspect, a super cell comprises a plurality of silicon solar cells arranged in line with end portions of adjacent solar cells overlapping and conductively bonded to each other to electrically connect the solar cells in series. At least one of the silicon solar cells has chamfered corners that correspond to corners or portions of corners of a pseudo square silicon wafer from which it was diced, at least one of the silicon solar cells lacks chamfered corners, and each of the silicon solar cells has a front surface of substantially the same area exposed to light during operation of the string of solar cells.

In another aspect, a method of making two or more super cells comprises dicing one or more pseudo square silicon wafers along a plurality of lines parallel to a long edge of each wafer to form a first plurality of rectangular silicon solar cells comprising chamfered corners corresponding to corners or portions of corners of the pseudo square silicon wafers and a second plurality of rectangular silicon solar cells each of a first length spanning a full width of the pseudo square silicon wafers and lacking chamfered corners. The method also comprises removing the chamfered corners from each of the first plurality of rectangular silicon solar cells to form a third plurality of rectangular silicon solar cells each of a second length shorter than the first length and lacking chamfered corners. The method further comprises arranging the second plurality of rectangular silicon solar cells in line with long sides of adjacent rectangular silicon solar cells overlapping and conductively bonded to each other to electrically connect the second plurality of rectangular silicon solar cells in series to form a solar cell string having a width equal to the first length, and arranging the third plurality of rectangular silicon solar cells in line with long sides of adjacent rectangular silicon solar cells overlapping and conductively bonded to each other to electrically connect the third plurality of rectangular silicon solar cells in series to form a solar cell string having a width equal to the second length.

In another aspect, a method of making two or more super cells comprises dicing one or more pseudo square silicon wafers along a plurality of lines parallel to a long edge of each wafer to form a first plurality of rectangular silicon solar cells comprising chamfered corners corresponding to corners or portions of corners of the pseudo square silicon wafers and a second plurality of rectangular silicon solar cells lacking chamfered corners, arranging the first plurality of rectangular silicon solar cells in line with long sides of adjacent rectangular silicon solar cells overlapping and conductively bonded to each other to electrically connect the first plurality of rectangular silicon solar cells in series, and arranging the second plurality of rectangular silicon solar cells in line with long sides of adjacent rectangular silicon solar cells overlapping and conductively bonded to each other to electrically connect the second plurality of rectangular silicon solar cells in series.

In another aspect, a super cell comprises a plurality of silicon solar cells arranged in line in a first direction with end portions of adjacent silicon solar cells overlapping and conductively bonded to each other to electrically connect the silicon solar cells in series, and an elongated flexible electrical interconnect with its long axis oriented parallel to a second direction perpendicular to the first direction, conductively bonded to a front or back surface of an end one of the silicon solar cells at a plurality of discrete locations arranged along the second direction, running at least the full width of the end solar cell in the second direction, having a conductor thickness less than or equal to about 100 microns measured perpendicularly to the front or rear surface of the end silicon solar cell, providing a resistance to current flow in the second direction of less than or equal to about 0.012 Ohms, and configured to provide flexibility accommodating differential expansion in the second direction between the end silicon solar cell and the interconnect for a temperature range of about −40° C. to about 85° C.

The flexible electrical interconnect may have a conductor thickness less than or equal to about 30 microns measured perpendicularly to the front and rear surfaces of the end silicon solar cell, for example. The flexible electrical interconnect may extend beyond the super cell in the second direction to provide for electrical interconnection to at least a second super cell positioned parallel to and adjacent the super cell in a solar module. In addition, or alternatively, the flexible electrical interconnect may extend beyond the super cell in the first direction to provide for electrical interconnection to a second super cell positioned parallel to and in line with the super cell in a solar module.

In another aspect, a solar module comprises a plurality of super cells arranged in two or more parallel rows spanning a width of the module to form a front surface of the module. Each super cell comprises a plurality of silicon solar cells arranged in line with end portions of adjacent silicon solar cells overlapping and conductively bonded to each other to electrically connect the silicon solar cells in series. At least an end of a first super cell adjacent an edge of the module in a first row is electrically connected to an end of a second super cell adjacent the same edge of the module in a second row via a flexible electrical interconnect that is bonded to the front surface of the first super cell at a plurality of discrete locations with an electrically conductive adhesive bonding material, runs parallel to the edge of the module, and at least a portion of which folds around the end of the first super cell and is hidden from view from the front of the module.

In another aspect, a method of making a super cell comprises laser scribing one or more scribe lines on each of one or more silicon solar cells to define a plurality of rectangular regions on the silicon solar cells, applying an electrically conductive adhesive bonding material to the one or more scribed silicon solar cells at one or more locations adjacent a long side of each rectangular region, separating the silicon solar cells along the scribe lines to provide a plurality of rectangular silicon solar cells each comprising a portion of the electrically conductive adhesive bonding material disposed on its front surface adjacent a long side, arranging the plurality of rectangular silicon solar cells in line with long sides of adjacent rectangular silicon solar cells overlapping in a shingled manner with a portion of the electrically conductive adhesive bonding material disposed in between, and curing the electrically conductive bonding material, thereby bonding adjacent overlapping rectangular silicon solar cells to each other and electrically connecting them in series.

In another aspect, a method of making a super cell comprises laser scribing one or more scribe lines on each of one or more silicon solar cells to define a plurality of rectangular regions on the silicon solar cells, applying an electrically conductive adhesive bonding material to portions of the top surfaces of the one or more silicon solar cells, applying a vacuum between the bottom surfaces of the one or more silicon solar cells and a curved supporting surface to flex the one or more silicon solar cells against the curved supporting surface and thereby cleave the one or more silicon solar cells along the scribe lines to provide a plurality of rectangular silicon solar cells each comprising a portion of the electrically conductive adhesive bonding material disposed on its front surface adjacent a long side, arranging the plurality of rectangular silicon solar cells in line with long sides of adjacent rectangular silicon solar cells overlapping in a shingled manner with a portion of the electrically conductive adhesive bonding material disposed in between, and curing the electrically conductive bonding material, thereby bonding adjacent overlapping rectangular silicon solar cells to each other and electrically connecting them in series.

In another aspect, a method of making a solar module comprises assembling a plurality of super cells, with each super cell comprising a plurality of rectangular silicon solar cells arranged in line with end portions on long sides of adjacent rectangular silicon solar cells overlapping in a shingled manner. The method also comprises curing an electrically conductive bonding material disposed between the overlapping end portions of adjacent rectangular silicon solar cells by applying heat and pressure to the super cells, thereby bonding adjacent overlapping rectangular silicon solar cells to each other and electrically connecting them in series. The method also comprises arranging and interconnecting the super cells in a desired solar module configuration in a stack of layers comprising an encapsulant, and applying heat and pressure to the stack of layers to form a laminated structure.

Some variations of the method comprise curing or partially curing the electrically conductive bonding material by applying heat and pressure to the super cells prior to applying heat and pressure to the stack of layers to form the laminated structure, thereby forming cured or partially cured super cells as an intermediate product before forming the laminated structure. In some variations, as each additional rectangular silicon solar cell is added to a super cell during assembly of the super cell, the electrically conductive adhesive bonding material between the newly added solar cell and its adjacent overlapping solar cell is cured or partially cured before any other rectangular silicon solar cell is added to the super cell. Alternatively, some variations comprise curing or partially curing all of the electrically conductive bonding material in a super cell in the same step.

If the super cells are formed as partially cured intermediate products, the method may comprise completing the curing of the electrically conductive bonding material while applying heat and pressure to the stack of layers to form the laminated structure.

Some variations of the method comprise curing the electrically conductive bonding material while applying heat and pressure to the stack of layers to form a laminated structure, without forming cured or partially cured super cells as an intermediate product before forming the laminated structure.

The method may comprise dicing one or more standard size silicon solar cells into rectangular shapes of smaller area to provide the rectangular silicon solar cells. The electrically conductive adhesive bonding material may be applied to the one or more silicon solar cells before dicing the one or more silicon solar cells to provide the rectangular silicon solar cells with pre-applied electrically conductive adhesive bonding material. Alternatively, the electrically conductive adhesive bonding material may be applied to the rectangular silicon solar cells after dicing the one or more silicon solar cells to provide the rectangular silicon solar cells.

In one aspect, a solar module comprises a plurality of super cells arranged in two or more parallel rows. Each super cell comprises a plurality of rectangular or substantially rectangular silicon solar cells arranged in line with long sides of adjacent silicon solar cells overlapping and conductively bonded directly to each other to electrically connect the silicon solar cells in series. The solar panel also comprises a first hidden tap contact pad located on a back surface of a first solar cell located at an intermediate position along a first one of the super cells, and a first electrical interconnect conductively bonded to the first hidden tap contact pad. The first electrical interconnect comprises a stress relieving feature accommodating differential thermal expansion between the interconnect and the silicon solar cell to which it is bonded. The term "stress relieving feature" as used herein with respect to an interconnect may refer to a geometrical feature such as a kink, loop, or slot, for example, to the thickness (e.g., very thin) of the interconnect, and/or to the ductility of the interconnect. For example, the stress relieving feature may be that the interconnect is formed from very thin copper ribbon.

The solar module may comprise a second hidden tap contact pad located on a back surface of a second solar cell located adjacent the first solar cell at an intermediate position along a second one of the super cells in an adjacent super cell row, with the first hidden tap contact pad electrically connected to the second hidden tap contact pad through the first electrical interconnect. In such cases the first electrical interconnect may extend across a gap between the first super cell and the second super cell and be conductively bonded to the second hidden tap contact pad. Alternatively the electrical connection between the first and second hidden tap contact pads may include another electrical interconnect conductively bonded to the second hidden tap contact pad and electrically connected (e.g., conductively bonded) to the first electrical interconnect. Either interconnection scheme may optionally extend across additional rows of super cells. For example, either interconnection scheme may optionally extend across the full width of the module to interconnect a solar cell in each row via the hidden tap contact pads.

The solar module may comprise a second hidden tap contact pad located on a back surface of a second solar cell located at another intermediate position along the first one of the super cells, a second electrical interconnect conductively bonded to the second hidden tap contact pad, and a bypass diode electrically connected by the first and second electrical interconnects in parallel with the solar cells located between the first hidden tap contact pad and the second hidden tap contact pad.

In any of the above variations, the first hidden tap contact pad may be one of a plurality of hidden tap contact pads arranged on the back surface of the first solar cell in a row running parallel to the long axis of the first solar cell, with the first electrical interconnect conductively bonded to each of the plurality of hidden contacts and substantially spanning the length of the first solar cell along the long axis. In addition or alternatively, the first hidden contact pad may be one of a plurality of hidden tap contact pads arranged on the back surface of the first solar cell in a row running perpendicular to the long axis of the first solar cell. In the latter case the row of hidden tap contact pads may be located adjacent a short edge of the first solar cell, for example. The first hidden contact pad may be one of a plurality of hidden tap contact pads arranged in a two dimensional array of the back surface of the first solar cell.

Alternatively, in any of the above variations the first hidden tap contact pad may be located adjacent a short side of the back surface of the first solar cell, with the first electrical interconnect not extending substantially inward from the hidden tap contact pad along the long axis of the solar cell, and the back surface metallization pattern on the first solar cell providing a conductive path to the interconnect preferably having a sheet resistance less than or equal to about 5 Ohms per square, or less than or equal to about 2.5 Ohms per square. In such cases the first interconnect may comprise, for example, two tabs positioned on opposite sides of the stress relieving feature, with one of the tabs conductively bonded to the first hidden tap contact pad. The two tabs may be of different lengths.

In any of the above variations the first electrical interconnect may comprise alignment features identifying a desired alignment with the first hidden tap contact pad, or identifying a desired alignment with an edge of the first super cell, or identifying a desired alignment with the first hidden tap contact pad and a desired alignment with an edge of the first super cell.

In another aspect a solar module comprises a glass front sheet, a back sheet, and a plurality of super cells arranged in two or more parallel rows between the glass front sheet and the back sheet. Each super cell comprises a plurality of rectangular or substantially rectangular silicon solar cells arranged in line with long sides of adjacent silicon solar cells overlapping and flexibly conductively bonded directly to each other to electrically connect the silicon solar cells in series. A first flexible electrical interconnect is rigidly conductively bonded to a first one of the super cells. The flexible conductive bonds between overlapping solar cells provide mechanical compliance to the super cells accommodating a mismatch in thermal expansion between the super cells and the glass front sheet in a direction parallel to the rows for a temperature range of about −40° C. to about 100° C. without damaging the solar module. The rigid conductive bond between the first super cell and the first flexible electrical interconnect forces the first flexible electrical interconnect to accommodate a mismatch in thermal expansion between the first super cell and the first flexible interconnect in a direction perpendicular to the rows for a temperature range of about −40° C. to about 180° C. without damaging the solar module.

The conductive bonds between overlapping adjacent solar cells within a super cell may utilize a different conductive adhesive than the conductive bonds between the super cell and the flexible electrical interconnect. The conductive bond at one side of at least one solar cell within a super cell may utilize a different conductive adhesive than the conductive bond at its other side. The conductive adhesive forming the rigid bond between the super cell and the flexible electrical interconnect may be a solder, for example. In some variations the conductive bonds between overlapping solar cells within a super cell are formed with a non-solder conductive adhesive, and the conductive bond between the super cell and the flexible electrical interconnect is formed with solder.

In some variations utilizing two different conductive adhesives as just described, both conductive adhesives can be cured in the same processing step (e.g., at the same temperature, at the same pressure, and/or in the same time interval).

The conductive bonds between overlapping adjacent solar cells may accommodate differential motion between each cell and the glass front sheet of greater than or equal to about 15 microns, for example.

The conductive bonds between overlapping adjacent solar cells may have a thickness perpendicular to the solar cells of less than or equal to about 50 microns and a thermal conductivity perpendicular to the solar cells greater than or equal to about 1.5 W/(meter-K), for example.

The first flexible electrical interconnect may withstand thermal expansion or contraction of the first flexible interconnect of greater than or equal to about 40 microns, for example.

The portion of the first flexible electrical interconnect conductively bonded to the super cell may be ribbon-like, formed from copper, and have a thickness perpendicular to the surface of the solar cell to which it is bonded of less than or equal to about 30 microns or less than or equal to about 50 microns, for example. The first flexible electrical interconnect may comprise an integral conductive copper portion not bonded to the solar cell and providing a higher conductivity than the portion of the first flexible electrical interconnect that is conductively bonded to the solar cell. The first flexible electrical interconnect may have a thickness perpendicular to the surface of the solar cell to which it is bonded of less than or equal to about 30 microns or less than or equal to about 50 microns, and a width greater than or equal to about 10 mm in the plane of the surface of the solar cell in a direction perpendicular to the flow of current though the interconnect. The first flexible electrical interconnect may be conductively bonded to a conductor proximate to the solar cell that provides higher conductivity than the first electrical interconnect.

In another aspect, a solar module comprises a plurality of super cells arranged in two or more parallel rows. Each super cell comprises a plurality of rectangular or substantially rectangular silicon solar cells arranged in line with long sides of adjacent silicon solar cells overlapping and conductively bonded directly to each other to electrically connect the silicon solar cells in series. A hidden tap contact pad which does not conduct significant current in normal operation is located on a back surface of a first solar cell, which is located at an intermediate position along a first one of the super cells in a first one of the rows of super cells. The hidden tap contact pad is electrically connected in parallel to at least a second solar cell in a second one of the rows of super cells.

The solar module may comprise an electrical interconnect bonded to the hidden tap contact pad and electrically interconnecting the hidden tap contact pad to the second solar cell. In some variations the electrical interconnect does not substantially span the length of the first solar cell and a back surface metallization pattern on the first solar cell provides a conductivity path to the hidden tap contact pad having a sheet resistance less than or equal to about 5 Ohms per square.

The plurality of super cells may be arranged in three or more parallel rows spanning the width of the solar module perpendicular to the rows, and the hidden tap contact pad electrically connected to a hidden contact pad on at least one solar cell in each of the rows of super cells to electrically connect all of the rows of super cells in parallel. In such variations the solar module may comprise at least one bus connection to at least one of the hidden tap contact pads, or to an interconnect between hidden tap contact pads, that connects to a bypass diode or other electronic device.

The solar module may comprise a flexible electrical interconnect conductively bonded to the hidden tap contact pad to electrically connect it to the second solar cell. The portion of the flexible electrical interconnect conductively bonded to the hidden tap contact pad may be for example ribbon-like, formed from copper, and have a thickness perpendicular to the surface of the solar cell to which it is bonded of less than or equal to about 50 microns. The conductive bond between the hidden tap contact pad and the flexible electrical interconnect may force the flexible electrical interconnect to withstand a mismatch in thermal expansion between the first solar cell and the flexible interconnect, and to accommodate relative motion between the first solar cell and the second solar cell resulting from thermal expansion, for a temperature range of about −40° C. to about 180° C. without damaging the solar module.

In some variations, in operation of the solar module the first hidden contact pad may conduct a current greater than the current generated in any single one of the solar cells.

Typically, the front surface of the first solar cell overlying the first hidden tap contact pad is not occupied by contact pads or any other interconnect features. Typically, any area of the front surface of the first solar cell which is not overlapped by a portion of an adjacent solar cell in the first super cell is not occupied by contact pads or any other interconnect features.

In some variations, in each super cell most of the cells do not have hidden tap contact pads. In such variations, the cells that have hidden tap contact pads may have a larger light collection area than the cells that do not have hidden tap contact pads.

In another aspect, a solar module comprises a glass front sheet, a back sheet, and a plurality of super cells arranged in two or more parallel rows between the glass front sheet and the back sheet. Each super cell comprises a plurality of rectangular or substantially rectangular silicon solar cells arranged in line with long sides of adjacent silicon solar cells overlapping and flexibly conductively bonded directly to each other to electrically connect the silicon solar cells in series. A first flexible electrical interconnect is rigidly conductively bonded to a first one of the super cells. The flexible conductive bonds between overlapping solar cells are formed from a first conductive adhesive and have a shear modulus less than or equal to about 800 megapascals. The rigid conductive bond between the first super cell and the first flexible electrical interconnect is formed from a second conductive adhesive and has a shear modulus of greater than or equal to about 2000 megapascals.

The first conductive adhesive may have a glass transition temperature of less than or equal to about 0° C., for example.

In some variations, the first conductive adhesive and the second conductive adhesive are different, and both conductive adhesives can be cured in the same processing step.

In some variations, the conductive bonds between overlapping adjacent solar cells have a thickness perpendicular to the solar cells of less than or equal to about 50 micron and a thermal conductivity perpendicular to the solar cells greater than or equal to about 1.5 W/(meter-K).

In one aspect, a solar module comprises a number N greater than or equal to about 150 of rectangular or substantially rectangular silicon solar cells arranged as a plurality of super cells in two or more parallel rows. Each super cell comprises a plurality of the silicon solar cells arranged in line with long sides of adjacent silicon solar cells overlapping and conductively bonded to each other to electrically connect the silicon solar cells in series. The super cells are electrically connected to provide a high direct current voltage of greater than or equal to about 90 volts.

In one variation the solar module comprises one or more flexible electrical interconnects arranged to electrically connect the plurality of super cells in series to provide the high direct current voltage. The solar module may comprise module level power electronics including an inverter that converts the high direct current voltage to an alternating current voltage. The module level power electronics may sense the high direct current voltage and may operate the module at an optimum current-voltage power point.

In another variation the solar module comprises module level power electronics electrically connected to individual pairs of adjacent series connected rows of super cells, electrically connecting one or more of the pairs of rows of super cells in series to provide the high direct current voltage, and comprising an inverter that converts the high direct current voltage to an alternating current voltage. Optionally, the module level power electronics may sense the voltage across each individual pair of rows of super cells and may operate each individual pair of rows of super cells at an optimum current-voltage power point. Optionally, the module level power electronics may switch an individual pair of rows of super cells out of a circuit providing the high direct current voltage if the voltage across the pair of rows is below a threshold value.

In another variation the solar module comprises module level power electronics electrically connected to each individual row of super cells, electrically connecting two or more of the rows of super cells in series to provide the high direct current voltage, and comprising an inverter that converts the high direct current voltage to an alternating current voltage. Optionally, the module level power electronics may sense the voltage across each individual row of super cells and may operate each individual row of super cells at an optimum current-voltage power point. Optionally, the module level power electronics may switch an individual row of super cells out of a circuit providing the high direct current voltage if the voltage across the row of super cells is below a threshold value.

In another variation the solar module comprises module level power electronics electrically connected to each individual super cell, electrically connecting two or more of the super cells in series to provide the high direct current voltage, and comprising an inverter that converts the high direct current voltage to an alternating current voltage. Optionally, the module level power electronics may sense the voltage across each individual super cell and may operate each individual super cell at an optimum current-voltage power point. Optionally, the module level power electronics may switch an individual super cell out of a circuit providing the high direct current voltage if the voltage across the super cell is below a threshold value.

In another variation each super cell in the module is electrically segmented into a plurality of segments by hidden taps. The solar module comprises module level power electronics electrically connected to each segment of each super cell through the hidden taps, electrically connecting two or more segments in series to provide the high direct current voltage, and comprising an inverter that converts the high direct current voltage to an alternating current voltage. Optionally, the module level power electronics may sense the voltage across each individual segment of each super cell and may operate each individual segment at an optimum current-voltage power point. Optionally, the module level power electronics may switch an individual segment out of a circuit providing the high direct current voltage if the voltage across the segment is below a threshold value.

In any of the above variations the optimum current-voltage power point may be a maximum current-voltage power point.

In any of the above variations the module level power electronics may lack a direct current to direct current boost component.

In any of the above variations N may be greater than or equal to about 200, greater than or equal to about 250, greater than or equal to about 300, greater than or equal to about 350, greater than or equal to about 400, greater than or equal to about 450, greater than or equal to about 500, greater than or equal to about 550, greater than or equal to about 600, greater than or equal to about 650, or greater than or equal to about 700.

In any of the above variations the high direct current voltage may be greater than or equal to about 120 volts, greater than or equal to about 180 volts, greater than or equal to about 240 volts, greater than or equal to about 300 volts, greater than or equal to about 360 volts, greater than or equal to about 420 volts, greater than or equal to about 480 volts, greater than or equal to about 540 volts, or greater than or equal to about 600 volts.

In another aspect, a solar photovoltaic system comprises two or more solar modules electrically connected in parallel, and an inverter. Each solar module comprises a number N greater than or equal to about 150 rectangular or substantially rectangular silicon solar cells arranged as a plurality of super cells in two or more parallel rows. Each super cell in each module comprises two or more of the silicon solar cells in that module arranged in line with long sides of adjacent silicon solar cells overlapping and conductively bonded to each other to electrically connect the silicon solar cells in series. In each module the super cells are electrically connected to provide a high voltage direct current module output of greater than or equal to about 90 volts. The inverter is electrically connected to the two or more solar modules to convert their high voltage direct current output to an alternating current.

Each solar module may comprise one or more flexible electrical interconnects arranged to electrically connect the super cells in the solar module in series to provide the solar module's high voltage direct current output.

The solar photovoltaic system may comprise at least a third solar module electrically connected in series with a first one of the two or more solar modules that are electrically connected in parallel. In such cases the third solar module may comprise a number N' greater than or equal to about 150 rectangular or substantially rectangular silicon solar cells arranged as a plurality of super cells in two or more parallel rows. Each super cell in the third solar module comprises two or more of the silicon solar cells in that module arranged in line with long sides of adjacent silicon solar cells overlapping and conductively bonded to each other to electrically connect the silicon solar cells in series. In the third solar module the super cells are electrically connected to provide a high voltage direct current module output of greater than or equal to about 90 volts.

Variations comprising a third solar module electrically connected in series with a first one of the two or more solar modules, as just described, may also comprise at least a fourth solar module electrically connected in series with a second one of the two or more solar modules that are electrically connected in parallel. The fourth solar module may comprises a number N" greater than or equal to about 150 rectangular or substantially rectangular silicon solar cells arranged as a plurality of super cells in two or more parallel rows. Each super cell in the fourth solar module comprises two or more of the silicon solar cells in that module arranged in line with long sides of adjacent silicon solar cells overlapping and conductively bonded to each other to electrically connect the silicon solar cells in series. In the fourth solar module the super cells are electrically connected to provide a high voltage direct current module output of greater than or equal to about 90 volts.

The solar photovoltaic system may comprise fuses and/or blocking diodes arranged to prevent a short circuit occurring in any one of the solar modules from dissipating power generated in the other solar modules.

The solar photovoltaic system may comprise positive and negative buses to which the two or more solar modules are electrically connected in parallel and to which the inverter is electrically connected. Alternatively, the solar photovoltaic system may comprise a combiner box to which the two or more solar modules are electrically connected by a separate conductor. The combiner box electrically connects the solar modules in parallel, and may optionally comprise fuses and/or blocking diodes arranged to prevent a short circuit occurring in any one of the solar modules from dissipating power generated in the other solar modules.

The inverter may be configured to operate the solar modules at a direct current voltage above a minimum value set to avoid reverse biasing a solar module.

The inverter may be configured to recognize a reverse bias condition occurring in one or more of the solar modules and operate the solar modules at a voltage that avoids the reverse bias condition.

The solar photovoltaic system may be positioned on a roof top.

In any of the above variations N, N', and N" may be greater than or equal to about 200, greater than or equal to about 250, greater than or equal to about 300, greater than or equal to about 350, greater than or equal to about 400, greater than or equal to about 450, greater than or equal to about 500, greater than or equal to about 550, greater than or equal to about 600, greater than or equal to about 650, or greater than or equal to about 700. N, N', and N" may have the same or different values.

In any of the above variations the high direct current voltage provided by a solar module may be greater than or equal to about 120 volts, greater than or equal to about 180 volts, greater than or equal to about 240 volts, greater than or equal to about 300 volts, greater than or equal to about 360 volts, greater than or equal to about 420 volts, greater than or equal to about 480 volts, greater than or equal to about 540 volts, or greater than or equal to about 600 volts.

In another aspect a solar photovoltaic system comprises a first solar module comprising a number N greater than or equal to about 150 rectangular or substantially rectangular silicon solar cells arranged as a plurality of super cells in two or more parallel rows. Each super cell comprises a plurality of the silicon solar cells arranged in line with long sides of adjacent silicon solar cells overlapping and conductively bonded to each other to electrically connect the silicon solar cells in series. The system also comprises an inverter. The inverter may be for example a microinverter integrated with the first solar module. The super cells in the first solar module are electrically connected to provide a high direct current voltage of greater than or equal to about 90 volts to the inverter, which converts the direct current to an alternating current.

The first solar module may comprise one or more flexible electrical interconnects arranged to electrically connect the super cells in the solar module in series to provide the solar module's high voltage direct current output.

The solar photovoltaic system may comprise at least a second solar module electrically connected in series with the first solar module. The second solar module may comprise a number N' greater than or equal to about 150 rectangular or substantially rectangular silicon solar cells arranged as a plurality of super cells in two or more parallel rows. Each super cell in the second solar module comprises two or more of the silicon solar cells in that module arranged in line with long sides of adjacent silicon solar cells overlapping and conductively bonded to each other to electrically connect the silicon solar cells in series. In the second solar module the super cells are electrically connected to provide a high voltage direct current module output of greater than or equal to about 90 volts.

The inverter (e.g., microinverter) may lack a direct current to direct current boost component.

In any of the above variations N and N' may be greater than or equal to about 200, greater than or equal to about 250, greater than or equal to about 300, greater than or equal to about 350, greater than or equal to about 400, greater than or equal to about 450, greater than or equal to about 500, greater than or equal to about 550, greater than or equal to about 600 greater than or equal to about 650, or greater than or equal to about 700. N and N' may have the same or different values.

In any of the above variations, the high direct current voltage provided by a solar module may be greater than or equal to about 120 volts, greater than or equal to about 180 volts, greater than or equal to about 240 volts, greater than or equal to about 300 volts, greater than or equal to about 360 volts, greater than or equal to about 420 volts, greater than or equal to about 480 volts, greater than or equal to about 540 volts, or greater than or equal to about 600 volts.

In another aspect, a solar module comprises a number N greater than or equal to about 250 rectangular or substantially rectangular silicon solar cells arranged as a plurality of series-connected super cells in two or more parallel rows. Each super cell comprises a plurality of the silicon solar cells arranged in line with long sides of adjacent silicon solar cells overlapping and conductively bonded directly to each other with an electrically and thermally conductive adhesive to electrically connect the silicon solar cells in the super cell in series. The solar module comprises less than one bypass diode per 25 solar cells. The electrically and thermally conductive adhesive forms bonds between adjacent solar cells having a thickness perpendicular to the solar cells of less than or equal to about 50 micron and a thermal conductivity perpendicular to the solar cells greater than or equal to about 1.5 W/(meter-K).

The super cells may be encapsulated in a thermoplastic olefin layer between front and back sheets. The super cells and their encapsulant may be sandwiched between glass front and back sheets.

The solar module may comprise, for example, less than one bypass diode per 30 solar cells, or less than one bypass diode per 50 solar cells, or less than one bypass diode per 100 solar cells. The solar module may comprise, for example, no bypass diodes, or only a single bypass diode, or not more than three bypass diodes, or not more than six bypass diodes, or not more than ten bypass diodes.

The conductive bonds between overlapping solar cells may optionally provide mechanical compliance to the super cells accommodating a mismatch in thermal expansion between the super cells and the glass front sheet in a direction parallel to the rows for a temperature range of about −40° C. to about 100° C. without damaging the solar module.

In any of the above variations, N may be greater than or equal to about 300, greater than or equal to about 350, greater than or equal to about 400, greater than or equal to about 450, greater than or equal to about 500, greater than or equal to about 550, greater than or equal to about 600 greater than or equal to about 650, or greater than or equal to about 700.

In any of the above variations, the super cells may be electrically connected to provide a high direct current voltage of greater than or equal to about 120 volts, greater than or equal to about 180 volts, greater than or equal to about 240 volts, greater than or equal to about 300 volts, greater than or equal to about 360 volts, greater than or equal to about 420 volts, greater than or equal to about 480 volts, greater than or equal to about 540 volts, or greater than or equal to about 600 volts.

A solar energy system may comprise the solar module of any of the above variations and an inverter (e.g., a microinverter) electrically connected to the solar module and configured to convert a DC output from the solar module to provide an AC output. The inverter may lack a DC to DC boost component. The inverter may be configured to operate the solar module at a direct current voltage above a minimum value set to avoid reverse biasing a solar cell. The minimum voltage value may be temperature dependent. The inverter may be configured to recognize a reverse bias condition and operate the solar module at a voltage that avoids the reverse bias condition. For example, the inverter may be configured to operate the solar module in a local maximum region of the solar module's voltage-current power curve to avoid the reverse bias condition.

This specification discloses solar cell cleaving tools and solar cell cleaving methods.

In one aspect, a method of manufacturing solar cells comprises advancing a solar cell wafer along a curved surface, and applying a vacuum between the curved surface and a bottom surface of the solar cell wafer to flex the solar cell wafer against the curved surface and thereby cleave the solar cell wafer along one or more previously prepared scribe lines to separate a plurality of solar cells from the solar cell wafer. The solar cell wafer may be advanced continuously along the curved surface, for example. Alternatively, the solar cell may be advanced along the curved surface in discrete movements.

The curved surface may be for example a curved portion of an upper surface of a vacuum manifold that applies the vacuum to the bottom surface of the solar cell wafer. The vacuum applied to the bottom surface of the solar cell wafer by the vacuum manifold may vary along the direction of travel of the solar cell wafer and may be, for example, strongest in a region of the vacuum manifold in which the solar cell wafer is sequentially cleaved.

The method may comprise transporting the solar cell wafer along the curved upper surface of the vacuum manifold with a perforated belt, with the vacuum applied to the bottom surface of the solar cell wafer through the perforations in the perforated belt. The perforations may optionally be arranged in the belt so that leading and trailing edges of the solar cell wafer along the direction of travel of the solar cell wafer must overlie at least one perforation in the belt and therefore be pulled toward the curved surface by the vacuum, but this is not required.

The method may comprise advancing the solar cell wafer along a flat region of the upper surface of the vacuum manifold to reach a transitional curved region of the upper surface of the vacuum manifold having a first curvature, and then advancing the solar cell wafer into a cleave region of the upper surface of the vacuum manifold where the solar cell wafer is sequentially cleaved, with the cleave region of the vacuum manifold having a second curvature tighter than the first curvature. The method may further comprise advancing the cleaved solar cells into a post-cleave region of the vacuum manifold having a third curvature tighter than the second curvature.

In any of the above variations, the method may comprise applying a stronger vacuum between the solar cell wafer and the curved surface at one end of each scribe line then at the opposite end of each scribe line to provide an asymmetric stress distribution along each scribe line that promotes nucleation and propagation of a single cleaving crack along each scribe line. Alternatively, or in addition, in any of the above variations the method may comprise orienting the scribe lines on the solar cell wafer at an angle to the vacuum manifold so that for each scribe line one end reaches a curved cleaving region of the vacuum manifold before the other end.

In any of the above variations, the method may comprise removing the cleaved solar cells from the curved surface before edges of the cleaved solar cells touch. For example, the method may comprise removing the cells in a direction tangential or approximately tangential to the curved surface of the manifold at a speed greater than the cells' speed of travel along the manifold. This may be accomplished with a tangentially arranged moving belt, for example, or with any other suitable mechanism.

In any of the above variations, the method may comprise scribing the scribe lines onto the solar cell wafer and applying an electrically conductive adhesive bonding material to portions of the top or bottom surface of the solar cell wafer prior to cleaving the solar cell wafer along the scribe lines. Each of the resulting cleaved solar cells may then comprise a portion of the electrically conductive adhesive bonding material disposed along a cleaved edge of its top or bottom surface. The scribe lines may be formed before or after the electrically conductive adhesive bonding material is applied using any suitable scribing method. The scribe lines may be formed by laser scribing, for example.

In any of the above variations, the solar cell wafer may be a square or pseudo square silicon solar cell wafer.

In another aspect, a method of making a string of solar cells comprises arranging a plurality of rectangular solar cells in line with long sides of adjacent rectangular solar cells overlapping in a shingled manner with electrically conductive adhesive bonding material disposed in between, and curing the electrically conductive bonding material to thereby bond adjacent overlapping rectangular solar cells to each other and electrically connect them in series. The solar cells may be manufactured, for example, by any of the variations of the method for manufacturing solar cells described above.

In one aspect, a method of making a string of solar cells comprises forming a rear surface metallization pattern on each of one or more square solar cells, and stencil printing a complete front surface metallization pattern on each of the one or more square solar cells using a single stencil in a single stencil printing step. These steps may be performed in either order, or concurrently if suitable. By "complete front surface metallization pattern" it is meant that after the stencil printing step no additional metallization material need be deposited on the front surface of the square solar cell to complete the formation of the front surface metallization. The method also comprises separating each square solar cell into two or more rectangular solar cells to form from the one or more square solar cells a plurality of rectangular solar cells each comprising a complete front surface metallization pattern and a rear surface metallization pattern, arranging the plurality of rectangular solar cells in line with long sides of adjacent rectangular solar cells overlapping in a shingled manner, and conductively bonding the rectangular solar cells in each pair of adjacent overlapping rectangular solar cells to each other with an electrically conductive bonding material disposed between them to electrically connect the front surface metallization pattern of one of the rectangular solar cells in the pair to the rear surface metallization pattern of the other of the rectangular solar cells in the pair, thereby electrically connecting the plurality of rectangular solar cells in series.

The stencil may be configured so that all portions of the stencil that define one or more features of the front surface metallization pattern on the one or more square solar cells are constrained by physical connections to other portions of the stencil to lie in a plane of the stencil during stencil printing.

The front surface metallization pattern on each rectangular solar cell may for example comprise a plurality of fingers oriented perpendicularly to the long sides of the rectangular solar cell, with none of the fingers in the front surface metallization pattern physically connected to each other by the front surface metallization pattern.

This specification discloses solar cells with reduced carrier recombination losses at edges of the solar cell, e.g., without cleaved edges that promote carrier recombination, methods for manufacturing such solar cells, and the use of such solar cells in a shingled (overlapping) arrangements to form super cells.

In one aspect, a method of manufacturing a plurality of solar cells comprises depositing one or more front surface amorphous silicon layers on a front surface of a crystalline silicon wafer, depositing one or more rear surface amorphous silicon layers on a rear surface of the crystalline silicon wafer on the opposite side of the crystalline silicon wafer from the front surface, patterning the one or more front surface amorphous silicon layers to form one or more front surface trenches in the one or more front surface amorphous silicon layers, depositing a front surface passivating layer over the one or more front surface amorphous silicon layers and in the front surface trenches, patterning the one or more rear surface amorphous silicon layers to form one or more rear surface trenches in the one or more rear surface amorphous silicon layers, and depositing a rear surface passivating layer over the one or more rear surface amorphous silicon layers and in the rear surface trenches. Each of the one or more rear surface trenches is formed in line with a corresponding one of the front surface trenches. The method further comprises cleaving the crystalline silicon wafer at one or more cleavage planes, with each cleavage plane centered or substantially centered on a different pair of corresponding front and rear surface trenches. In operation of the resulting solar cells the front surface amorphous silicon layers are to be illuminated by light.

In some variations only the front surface trenches are formed, not the rear surface trenches. In other variations only the rear surface trenches are formed, not the front surface trenches.

The method may comprise forming the one or more front surface trenches to penetrate the front surface amorphous silicon layers to reach the front surface of the crystalline silicon wafer, and/or forming the one or more rear surface trenches to penetrate the one or more rear surface amorphous silicon layers to reach the rear surface of the crystalline silicon wafer.

The method may comprise forming the front surface passivating layer and/or the rear surface passivating layer from a transparent conductive oxide.

A pulsed laser or diamond tip may be used to initiate a cleaving point (e.g., of the order of 100 micron long). A CW laser and a cooling nozzle may be used sequentially to induce high compressive and tensile thermal stress and guide the complete cleaving propagation in the crystalline silicon wafer to separate the crystalline silicon wafer at the one or more cleavage planes. Alternatively, the crystalline silicon wafer may be mechanically cleaved at the one or more cleavage planes. Any suitable cleaving method may be used.

The one or more front surface amorphous crystalline silicon layers may form an n-p junction with the crystalline silicon wafer, in which case it may be preferable to cleave the crystalline silicon wafer from its rear surface side. Alternatively, the one or more rear surface amorphous crystalline silicon layers may form an n-p junction with the crystalline silicon wafer, in which case it may be preferable to cleave the crystalline silicon wafer from its front surface side.

In another aspect a method of manufacturing a plurality of solar cells comprises forming one or more trenches in a first surface of a crystalline silicon wafer, depositing one or more amorphous silicon layers on the first surface of the crystalline silicon wafer, depositing a passivating layer in the trenches and on the one or more amorphous silicon layers on the first surface of the crystalline silicon wafer, depositing one or more amorphous silicon layers on a second surface of the crystalline silicon wafer on the opposite side of the crystalline silicon wafer from the first surface, and cleaving the crystalline silicon wafer at one or more cleavage planes, with each cleavage plane centered or substantially centered on a different one of the one or more trenches.

The method may comprise forming the passivating layer from a transparent conductive oxide.

A laser may be used to induce thermal stress in the crystalline silicon wafer to cleave the crystalline silicon wafer at the one or more cleavage planes. Alternatively, the crystalline silicon wafer may be mechanically cleaved at the one or more cleavage planes. Any suitable cleaving method may be used.

The one or more front surface amorphous crystalline silicon layers may form an n-p junction with the crystalline silicon wafer. Alternatively, the one or more rear surface amorphous crystalline silicon layers may form an n-p junction with the crystalline silicon wafer.

In another aspect, a solar panel comprises a plurality of super cells, with each super cell comprising a plurality of solar cells arranged in line with end portions of adjacent solar cells overlapping in a shingled manner and conductively bonded to each other to electrically connect the solar cells in series. Each solar cell comprises a crystalline silicon base, one or more first surface amorphous silicon layers disposed on a first surface of the crystalline silicon base to form an n-p junction, one or more second surface amorphous silicon layers disposed on a second surface of the crystalline silicon base on the opposite side of the crystalline silicon base from the first surface, and passivating layers preventing carrier recombination at edges of the first surface amorphous silicon layers, at edges of the second surface amorphous silicon layers, or at edges of the first surface amorphous silicon layers and edges of the second surface amorphous silicon layers. The passivating layers may comprise a transparent conductive oxide.

The solar cells may be formed for example by any of the methods summarized above or otherwise disclosed in this specification.

These and other embodiments, features and advantages of the present invention will become more apparent to those skilled in the art when taken with reference to the following more detailed description of the invention in conjunction with the accompanying drawings that are first briefly described.

BRIEF DESCRIPTION OF THE DRAWINGS

FIG. 1 shows a cross-sectional diagram of a string of series-connected solar cells arranged in a shingled manner with the ends of adjacent solar cells overlapping to form a shingled super cell.

FIG. 2A shows a diagram of the front (sun side) surface and front surface metallization pattern of an example rectangular solar cell that may be used to form shingled super cells.

FIG. 3B shows the front surface of the wafer and an example front surface metallization pattern. FIG. 3C shows the rear surface of the wafer and an example rear surface metallization pattern.

FIG. 3D shows the front surface of the wafer and an example front surface metallization pattern. FIG. 3E shows the rear surface of the wafer and an example rear surface metallization pattern.

FIGS. 4B and 4C show front and rear views, respectively, of an example rectangular super cell comprising "chevron" rectangular solar cells having chamfered corners, as shown for example in FIG. 2B, arranged in a shingled manner as shown in FIG. 1.

FIG. 5G shows a diagram of another example rectangular solar module similar in configuration to that of FIG. 5E, except that adjacent chevron solar cells in a super cell are arranged as mirror images of each other so that their overlapping edges are of the same length.

FIG. 7A shows example stress-relieving long interconnect configurations that may be used in hidden taps to super cells as described herein or as interconnects to front or rear surface super cell terminal contacts. FIGS. 7B-1 and 7B-2 illustrate examples of out of-plane-stress relieving features. FIGS. 7B-1 and 7B-2 show an example long interconnect configuration that comprises out-of plane stress relieving features and that may be used in hidden taps to super cells or as interconnects to front or rear surface super cell terminal contacts.

FIG. 8A shows Detail A from FIG. 5D: a cross-sectional view of the example solar module of FIG. 5D showing cross-sectional details of flexible electrical interconnects bonded to the rear surface terminal contacts of the rows of super cells.

FIG. 8B shows Detail C from FIG. 5D: a cross-sectional view of the example solar module of FIG. 5D showing cross-sectional details of flexible electrical interconnects bonded to the front (sunny side) surface terminal contacts of the rows of super cells.

FIG. 8C shows Detail B from FIG. 5D: a cross-sectional view of the example solar module of FIG. 5D showing cross-sectional details of flexible interconnects arranged to interconnect two super cells in a row in series.

FIG. 8D-8G show additional examples of electrical interconnects bonded to a front terminal contact of a super cell at an end of a row of super cells, adjacent an edge of a solar module. The example interconnects are configured to have a small foot print on the front surface of the module.

FIGS. 10B-1 and 10B-2 show an example physical layout for various electrical interconnections for a solar module as illustrated in FIG. 5B having the schematic circuit diagram of FIG. 10A.

FIGS. 11B-1 and 11B-2 show an example physical layout for various electrical interconnections for a solar module as illustrated in FIG. 5A having the schematic electrical circuit diagram of FIG. 11A.

FIGS. 11C-1 and 11C-2 show another example physical layout for various electrical interconnections for a solar module as illustrated in FIG. 5A having the schematic electrical circuit diagram of FIG. 11A.

FIGS. 12B-1 and 12B-2 show an example physical layout for various electrical interconnections for a solar module as illustrated in FIG. 5A having the schematic circuit diagram of FIG. 12A.

FIGS. 12C-1, 12C-2, and 12C-3 show another example physical layout for various electrical interconnections for a solar module as illustrated in FIG. 5A having the schematic circuit diagram of FIG. 12A.

FIGS. 13C-1 and 13C-2 show an example physical layout for various electrical interconnections for a solar module as illustrated in FIG. 5A having the schematic circuit diagram of FIG. 13A. Slightly modified, the physical layout of FIGS. 13C-1 and 13C-2 is suitable for a solar module as illustrated in FIG. 5B having the schematic circuit diagram of FIG. 13B.

FIGS. 14C-1 and 14C-2 show an example physical layout for various electrical interconnections for a solar module as illustrated in FIG. 14A having the schematic circuit diagram of FIG. 14B.

FIGS. 19A-19D show example arrangements by which super cells may be cured with heat and pressure.

FIGS. 24-25 show simplified cross-sectional views of arrays comprising a plurality of modules assembled in shingled configurations.

FIGS. 31A-31C show diagrams of example back surface metallization patterns that may be employed to create hidden taps to super cells as described herein.

FIGS. 34A-34C show examples of interconnects bonded to super cell rear surface (FIG. 34A) and front surface (FIGS. 34B-34C) terminal contacts.

FIGS. 35-36 show examples of the use of hidden taps with short interconnects that span the gap between adjacent super cells but do not extend substantially inward along the long axis of the rectangular solar cells.

FIGS. 37A-1 to 37F-3 show example configurations for short hidden tap interconnects comprising in-plane stress relieving features.

FIGS. 38A-1 to 38B-2 show example configurations for short hidden tap interconnects comprising out-of-plane stress relieving features.

FIGS. 39A-1 and 39A-2 show example configurations for short hidden tap interconnects comprising alignment features. FIGS. 39B-1 and 39B-2 show an example configuration for short hidden tap interconnects that comprises asymmetric tab lengths.

FIGS. 40 and 42A-44B show example solar module layouts employing hidden taps.

FIG. 41 shows an example electrical schematic for the solar module layouts of FIGS. 40 and 42A-44B.

FIG. 45 shows current flow in an example solar module with a bypass diode in conduction.

FIGS. 46A-46B show relative motion between solar module components resulting from thermal cycling in, respectively, a direction parallel to the rows of super cells and a direction perpendicular to the rows of super cells in the solar module.

FIGS. 47A-47B show, respectively, another example solar module layout employing hidden taps and the corresponding electrical schematic.

FIGS. 48A-48B show additional solar cell module layouts employing hidden taps in combination with embedded bypass diodes.

FIGS. 51A-55B show example architectures for module level power management of high voltage solar modules comprising shingled super cells.

FIGS. 62A-62B schematically illustrate, respectively, side and top views of another example cleaving tool.

FIG. 63A schematically illustrates use of an example asymmetric vacuum arrangement to control nucleation and propagation of cracks along scribe lines when cleaving a wafer. FIG. 63B schematically illustrates use of an example symmetric vacuum arrangement that provides less control of cleaving than the arrangement of FIG. 63A.

FIGS. 70A-70C provide orthogonal views of another variation of the example cleaving tool of FIGS. 62A-62B.

FIGS. 72A-74B illustrate details of the perforated belts and vacuum manifolds of the example cleaving tool of FIGS. 70A-70C.

FIG. 76 shows an example front surface metallization pattern on a rectangular solar cell.

FIGS. 77A-77B show example rear surface metallization patterns on rectangular solar cells.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention.

As used in this specification and the appended claims, the singular forms "a," "an," and "the" include plural referents unless the context clearly indicates otherwise. Also, the term "parallel" is intended to mean "parallel or substantially parallel" and to encompass minor deviations from parallel geometries rather than to require that any parallel arrangements described herein be exactly parallel. The term "perpendicular" is intended to mean "perpendicular or substantially perpendicular" and to encompass minor deviations from perpendicular geometries rather than to require that any perpendicular arrangement described herein be exactly perpendicular. The term "square" is intended to mean "square or substantially square" and to encompass minor deviations from square shapes, for example substantially square shapes having chamfered (e.g., rounded or otherwise truncated) corners. The term "rectangular" is intended to mean "rectangular or substantially rectangular" and to encompass minor deviations from rectangular shapes, for example substantially rectangular shapes having chamfered (e.g., rounded or otherwise truncated) corners.

This specification discloses high-efficiency shingled arrangements of silicon solar cells in solar cell modules, as well as front and rear surface metallization patterns and interconnects for solar cells that may be used in such arrangements. This specification also discloses methods for manufacturing such solar modules. The solar cell modules may be advantageously employed under "one sun" (non-concentrating) illumination, and may have physical dimensions and electrical specifications allowing them to be substituted for conventional silicon solar cell modules.

Figure 10A:
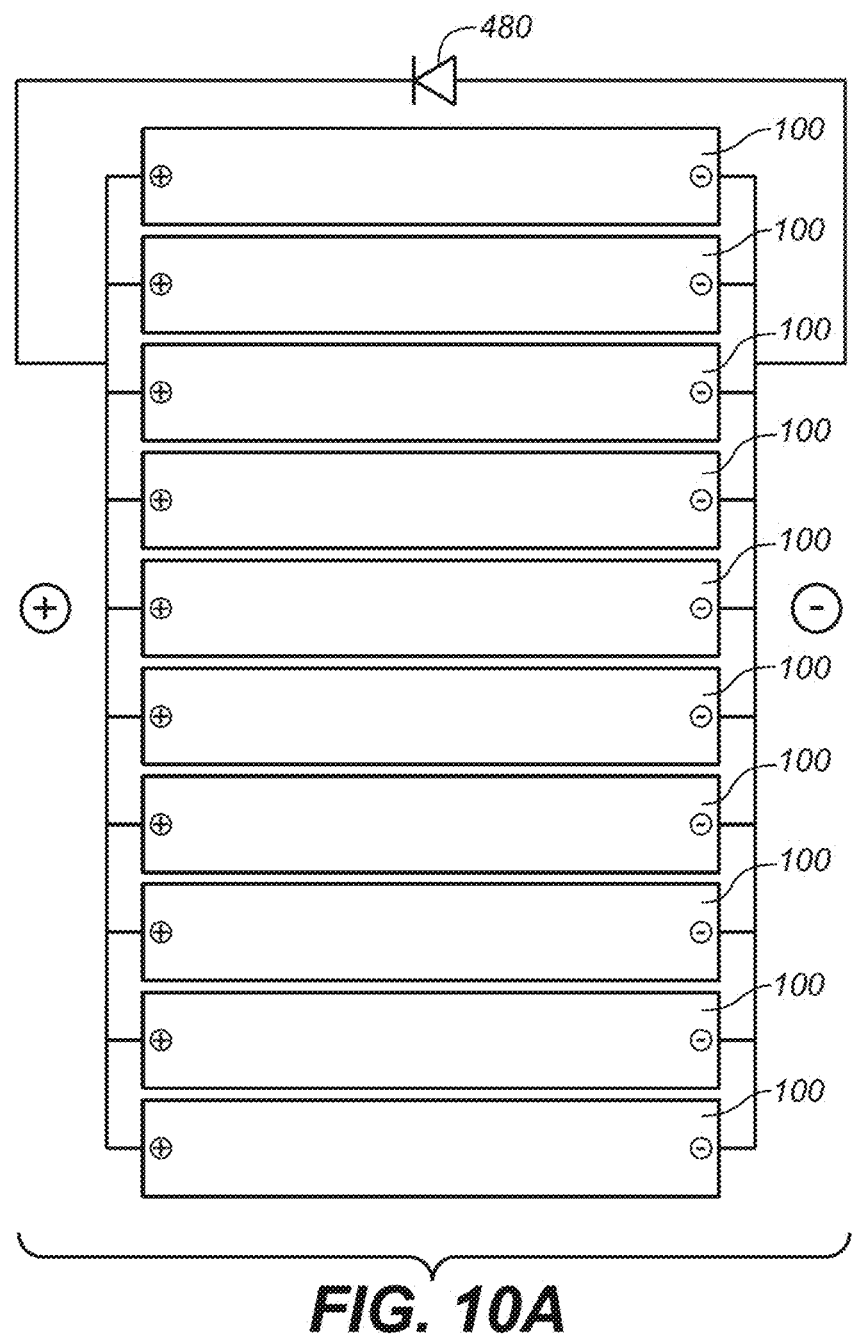
FIG. 10A shows an example schematic electrical circuit diagram for a solar module as illustrated in FIG. 5B.
Figures 1, 10B:
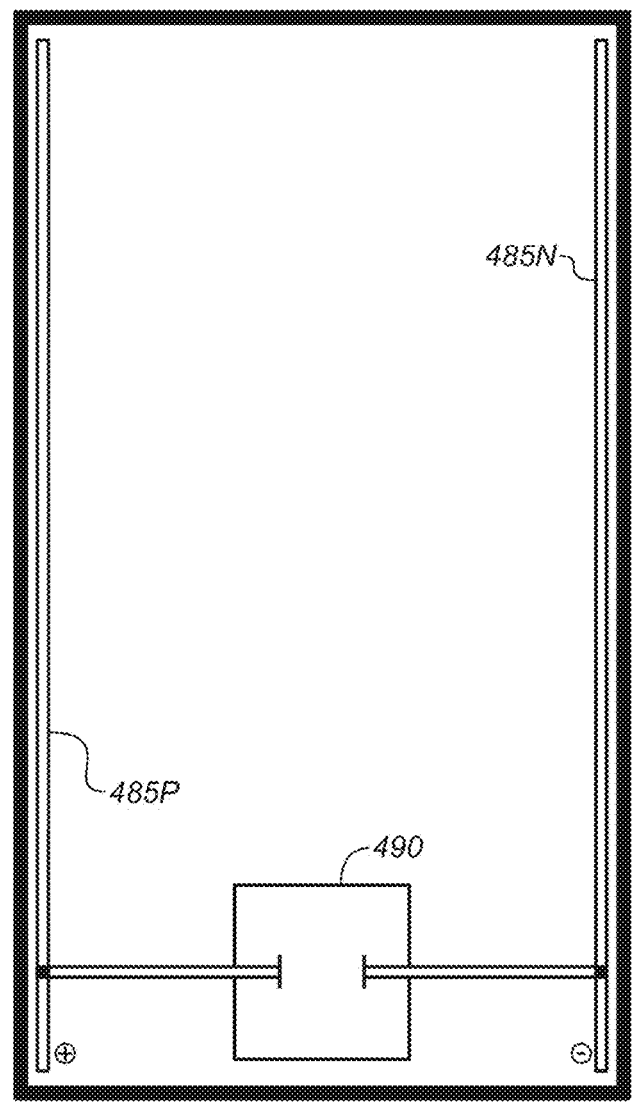

FIG. 1 shows a cross-sectional view of a string of series-connected solar cells 10 arranged in a shingled manner with the ends of adjacent solar cells overlapping and electrically connected to form a super cell 100. Each solar cell 10 comprises a semiconductor diode structure and electrical contacts to the semiconductor diode structure by which electric current generated in solar cell 10 when it is illuminated by light may be provided to an external load.

In the examples described in this specification, each solar cell 10 is a crystalline silicon solar cell having front (sun side) surface and rear (shaded side) surface metallization patterns providing electrical contact to opposite sides of an n-p junction, the front surface metallization pattern is disposed on a semiconductor layer of n-type conductivity, and the rear surface metallization pattern is disposed on a semiconductor layer of p-type conductivity. However, any other suitable solar cells employing any other suitable material system, diode structure, physical dimensions, or electrical contact arrangement may be used instead of or in addition to solar cells 10 in the solar modules described in this specification. For example, the front (sun side) surface metallization pattern may be disposed on a semiconductor layer of p-type conductivity, and the rear (shaded side) surface metallization pattern disposed on a semiconductor layer of n-type conductivity.

Referring again to FIG. 1, in super cell 100 adjacent solar cells 10 are conductively bonded to each other in the region in which they overlap by an electrically conducting bonding material that electrically connects the front surface metallization pattern of one solar cell to the rear surface metallization pattern of the adjacent solar cell. Suitable electrically conducting bonding materials may include, for example, electrically conducting adhesives and electrically conducting adhesive films and adhesive tapes, and conventional solders. Preferably, the electrically conducting bonding material provides mechanical compliance in the bond between the adjacent solar cells that accommodates stress arising from mismatch between the coefficient of thermal expansion (CTE) of the electrically conducting bonding material and that of the solar cells (e.g., the CTE of silicon). To provide such mechanical compliance, in some variations the electrically conducting bonding material is selected to have a glass transition temperature of less than or equal to about 0° C. To further reduce and accommodate stress parallel to the overlapping edges of the solar cells arising from CTE mismatch, the electrically conducting bonding material may optionally be applied only at discrete locations along the overlapping regions of the solar cells rather than in a continuous line extending substantially the length of the edges of the solar cells The thickness of the electrically conductive bond between adjacent overlapping solar cells formed by the electrically conductive bonding material, measured perpendicularly to the front and rear surfaces of the solar cells, may be for example less than about 0.1 mm. Such a thin bond reduces resistive loss at the interconnection between cells, and also promotes flow of heat along the super cell from any hot spot in the super cell that might develop during operation. The thermal conductivity of the bond between solar cells may be, for example, ≥about 1.5 Watts/(meter K).

FIG. 2A shows the front surface of an example rectangular solar cell 10 that may be used in a super cell 100. Other shapes for solar cell 10 may also be used, as suitable. In the illustrated example the front surface metallization pattern of solar cell 10 includes a bus bar 15 positioned adjacent to the edge of one of the long sides of solar cell 10 and running parallel to the long sides for substantially the length of the long sides, and fingers 20 attached perpendicularly to the bus bar and running parallel to each other and to the short sides of solar cell 10 for substantially the length of the short sides.

In the example of FIG. 2A solar cell 10 has a length of about 156 mm, a width of about 26 mm, and thus an aspect ratio (length of short side/length of long side) of about 1:6. Six such solar cells may be prepared on a standard 156 mm×156 mm dimension silicon wafer, then separated (diced) to provide solar cells as illustrated. In other variations, eight solar cells 10 having dimensions of about 19.5 mm×156 mm, and thus an aspect ratio of about 1:8, may be prepared from a standard silicon wafer. More generally, solar cells 10 may have aspect ratios of, for example, about 1:2 to about 1:20 and may be prepared from standard size wafers or from wafers of any other suitable dimensions.

Figure 3A:
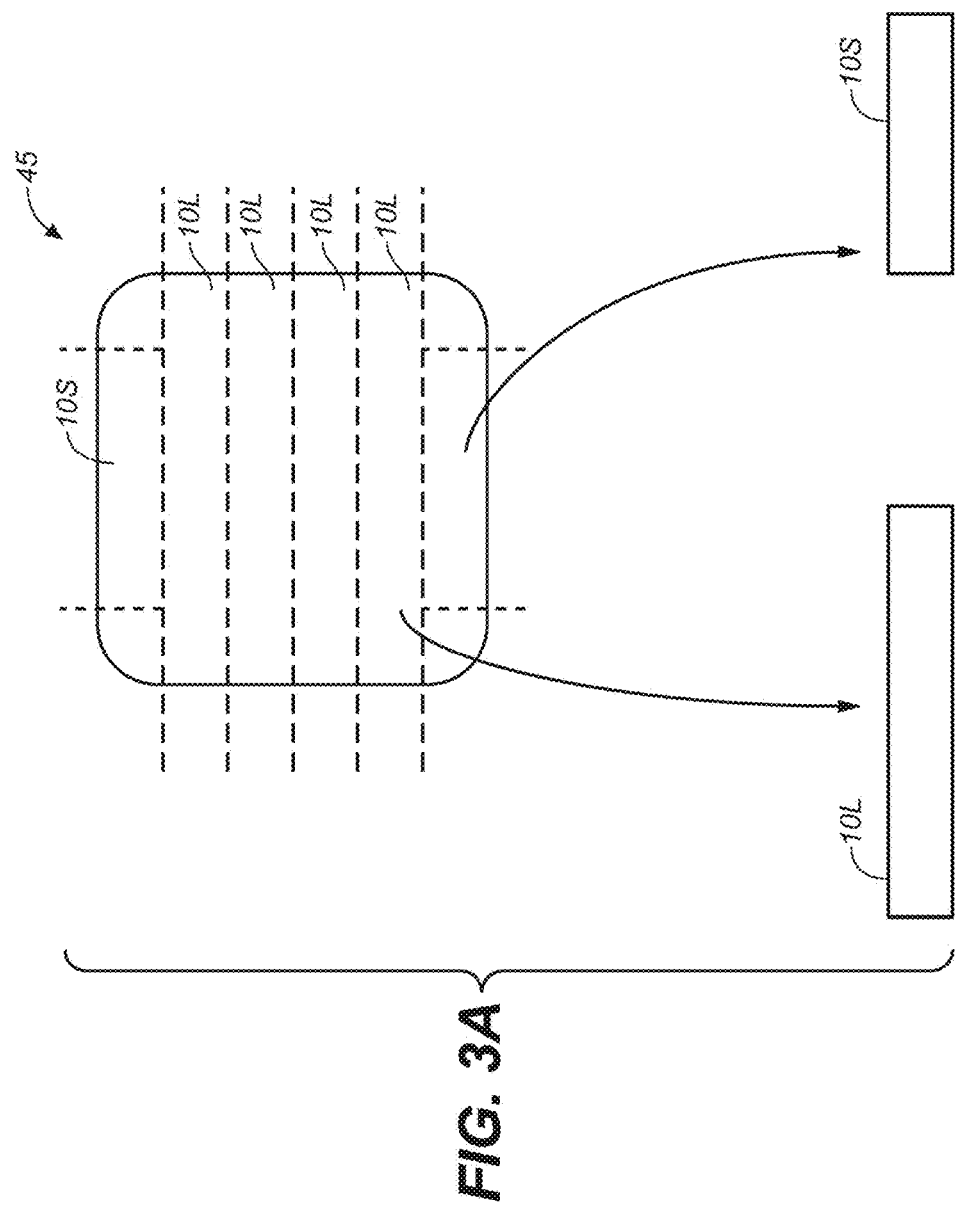
FIG. 3A shows a diagram illustrating an example method by which a standard size and shape pseudo square silicon solar cell may be separated (e.g., cut, or broken) into rectangular solar cells of two different lengths that may be used to form shingled super cells.

FIG. 3A shows an example method by which a standard size and shape pseudo square silicon solar cell wafer 45 may be cut, broken, or otherwise divided to form rectangular solar cells as just described. In this example several full width rectangular solar cells 10L are cut from the central portion of the wafer, and in addition several shorter rectangular solar cells 10S are cut from end portions of the wafer and the chamfered or rounded corners of the wafer are discarded. Solar cells 10L may be used to form shingled super cells of one width, and solar cells 10S may be used to form shingled super cells of a narrower width.

Figure 2B:
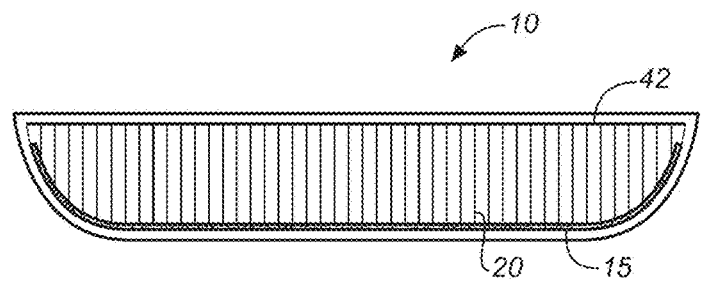
FIGS. 2B and 2C show diagrams of the front (sun side) surface and front surface metallization patterns of two example rectangular solar cells having rounded corners that may be used to form shingled super cells
Figure 2C:
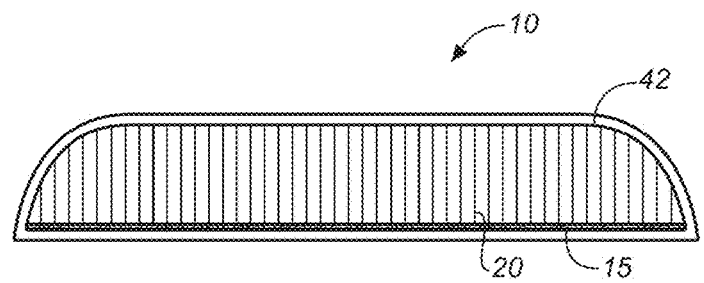
Figure 2F:
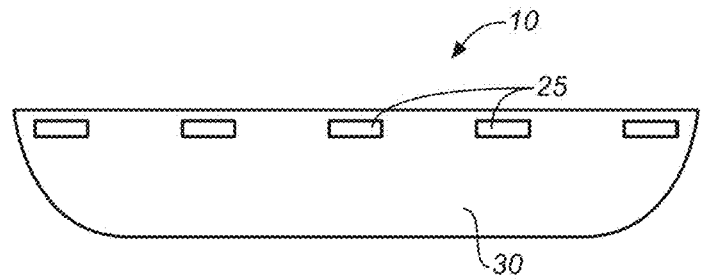
FIGS. 2F and 2G show diagrams of the rear surfaces and example rear surface metallization patterns for the solar cells shown in FIGS. 2B and 2C, respectively.
Figure 2G:
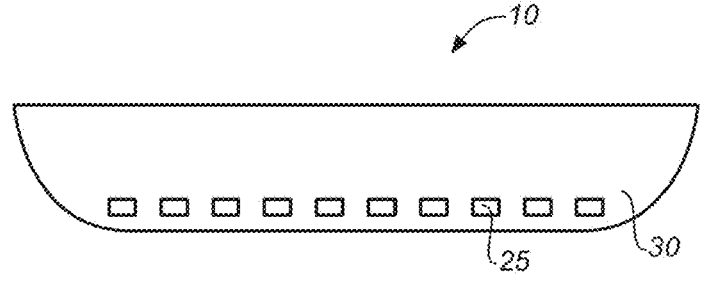
Figure 2D:
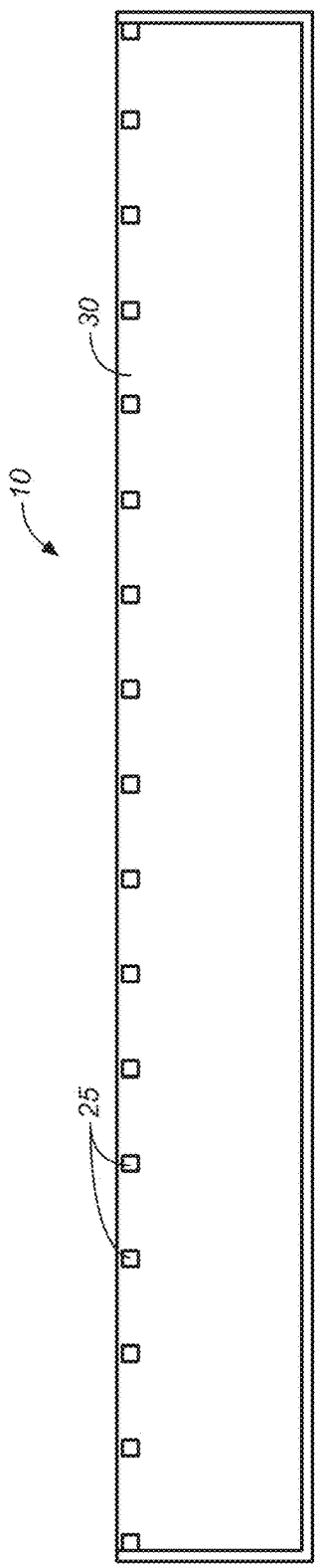
FIGS. 2D and 2E show diagrams of the rear surfaces and example rear surface metallization patterns for the solar cell shown in FIG. 2A.
Figure 2E:
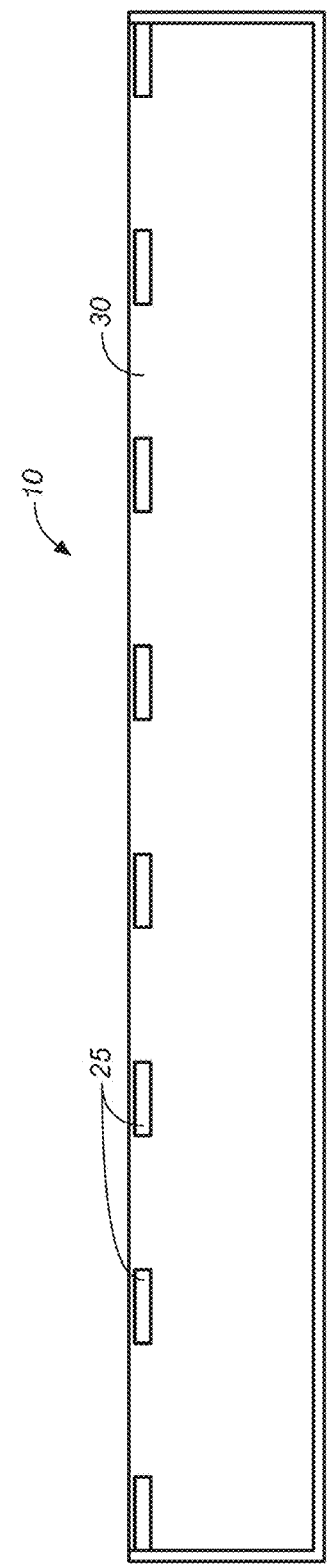
Figure 3B:
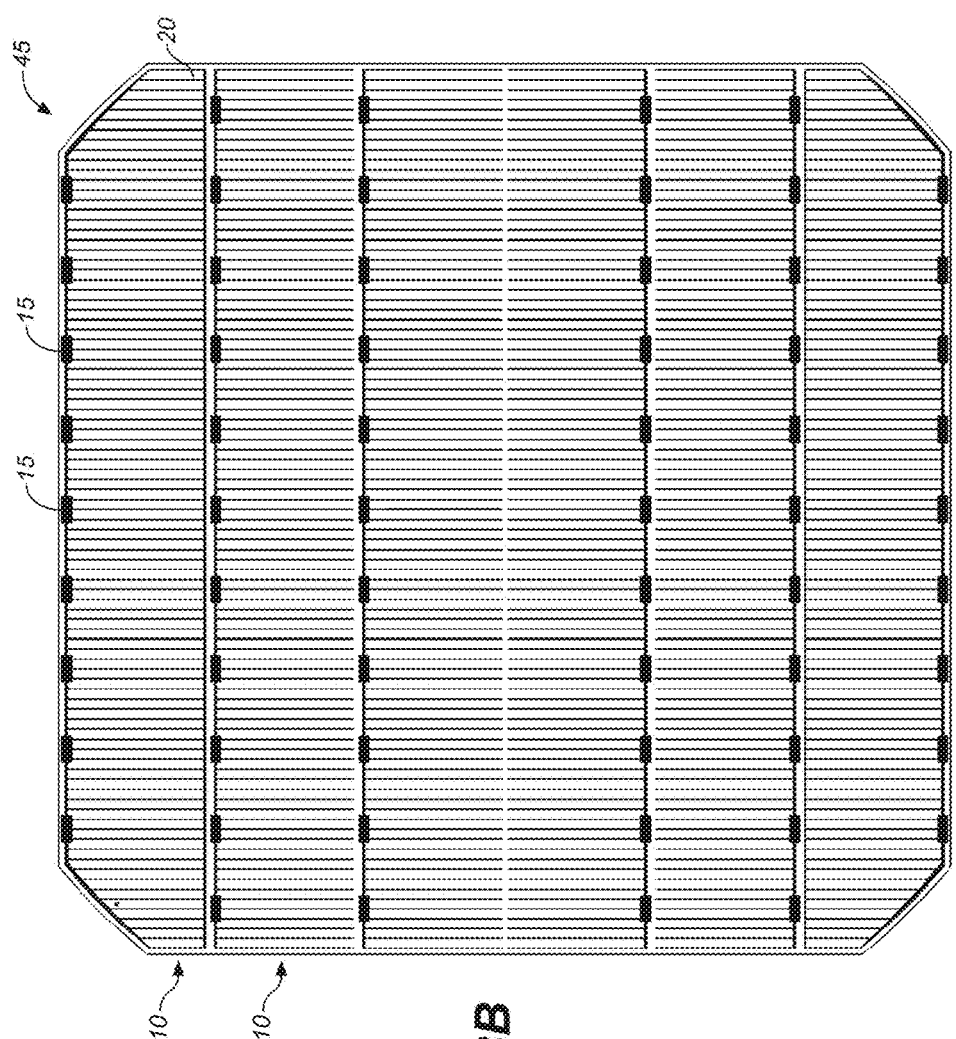
FIGS. 3B and 3C show diagrams illustrating another example method by which a pseudo square silicon solar cell may be separated into rectangular solar cells.
Figure 3C:
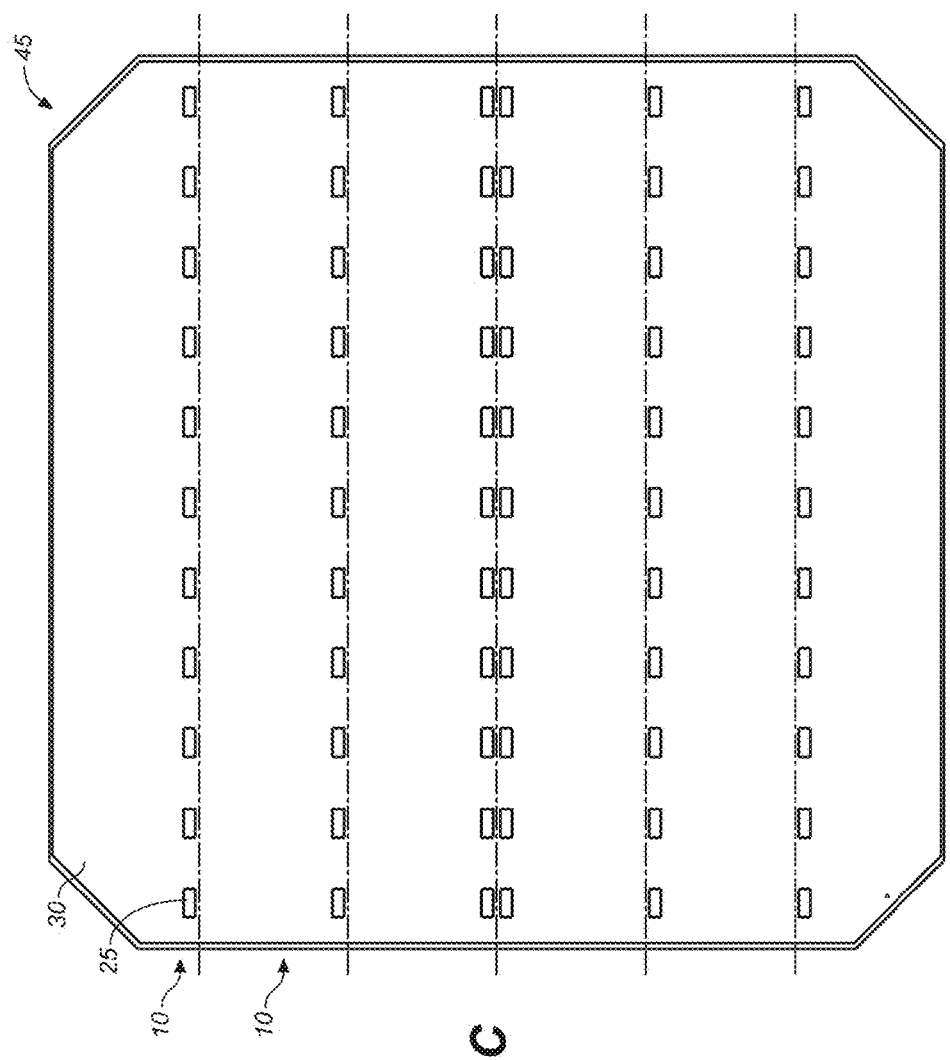

Alternatively, the chamfered (e.g., rounded) corners may be retained on the solar cells cut from end portions of the wafer. FIGS. 2B-2C show the front surfaces of example "chevron" rectangular solar cells 10 substantially similar to that of FIG. 2A, but having chamfered corners retained from the wafer from which the solar cells were cut. In FIG. 2B, bus bar 15 is positioned adjacent to and runs parallel to the shorter of the two long sides for substantially the length of that side, and further extends at both ends at least partially around the chamfered corners of the solar cell. In FIG. 2C, bus bar 15 is positioned adjacent to and runs parallel to the longer of the two long sides for substantially the length of that side. FIGS. 3B-3C show front and rear views of a pseudo square wafer 45 that may be diced along the dashed lines shown in FIG. 3C to provide a plurality of solar cells 10 having front surface metallization patterns similar to that shown in FIG. 2A, and two chamfered solar cells 10 having front surface metallization patterns similar to that shown in FIG. 2B.

In the example front surface metallization pattern shown in FIG. 2B, the two end portions of bus bar 15 that extend around the chamfered corners of the cell may each have a width that tapers (gradually narrows) with increasing distance from the portion of the bus bar located adjacent the long side of the cell. Similarly, in the example front surface metallization pattern shown in FIG. 3B, the two end portions of the thin conductor that interconnects discrete contact pads 15 extend around the chambered corners of the solar cell and taper with increasing distance from the long side of the solar cell along which the discrete contact pads are arranged. Such tapering is optional, but may advantageously reduce metal use and shading of the active region of the solar cell without significantly increasing resistive loss.

Figure 3D:
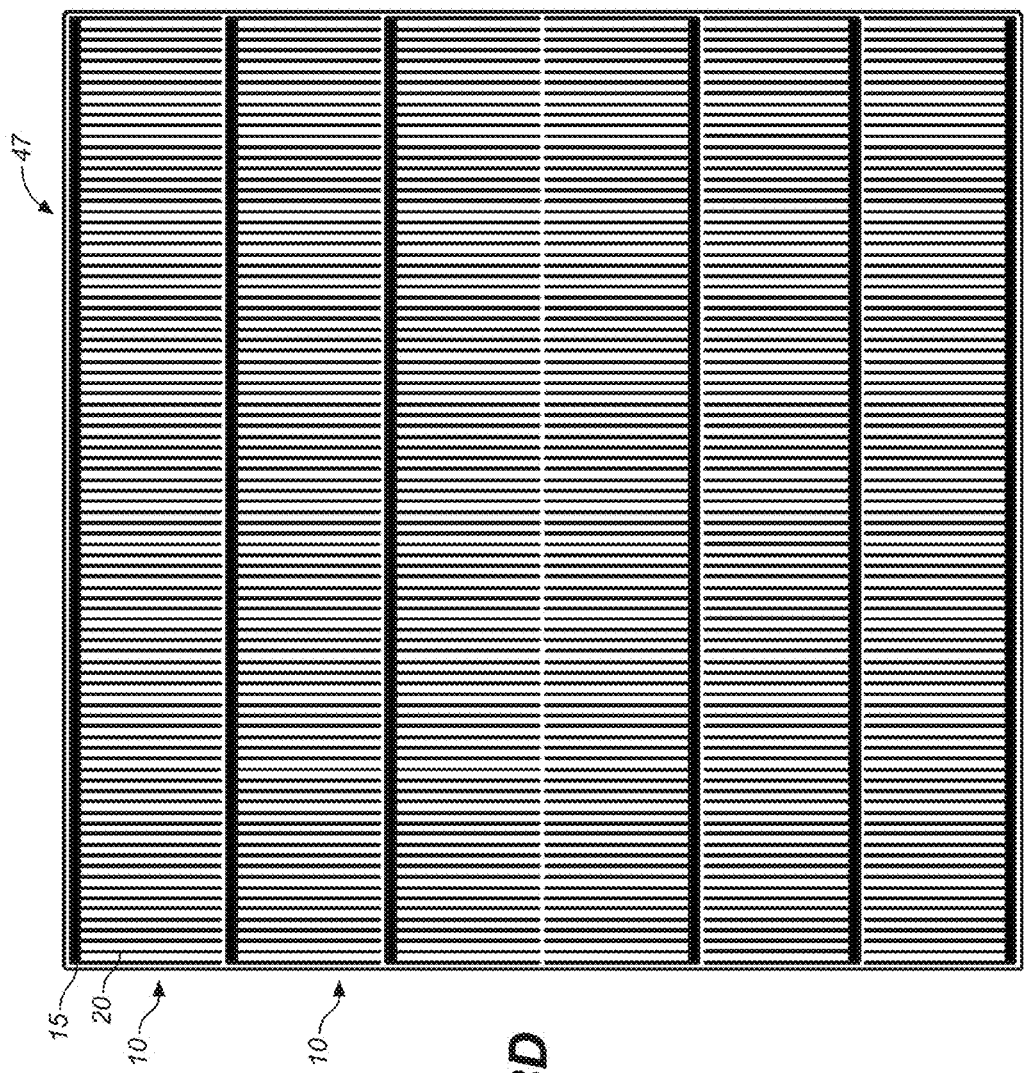
FIGS. 3D and 3E show diagrams illustrating an example method by which a square silicon solar cell may be separated into rectangular solar cells.
Figure 3E:
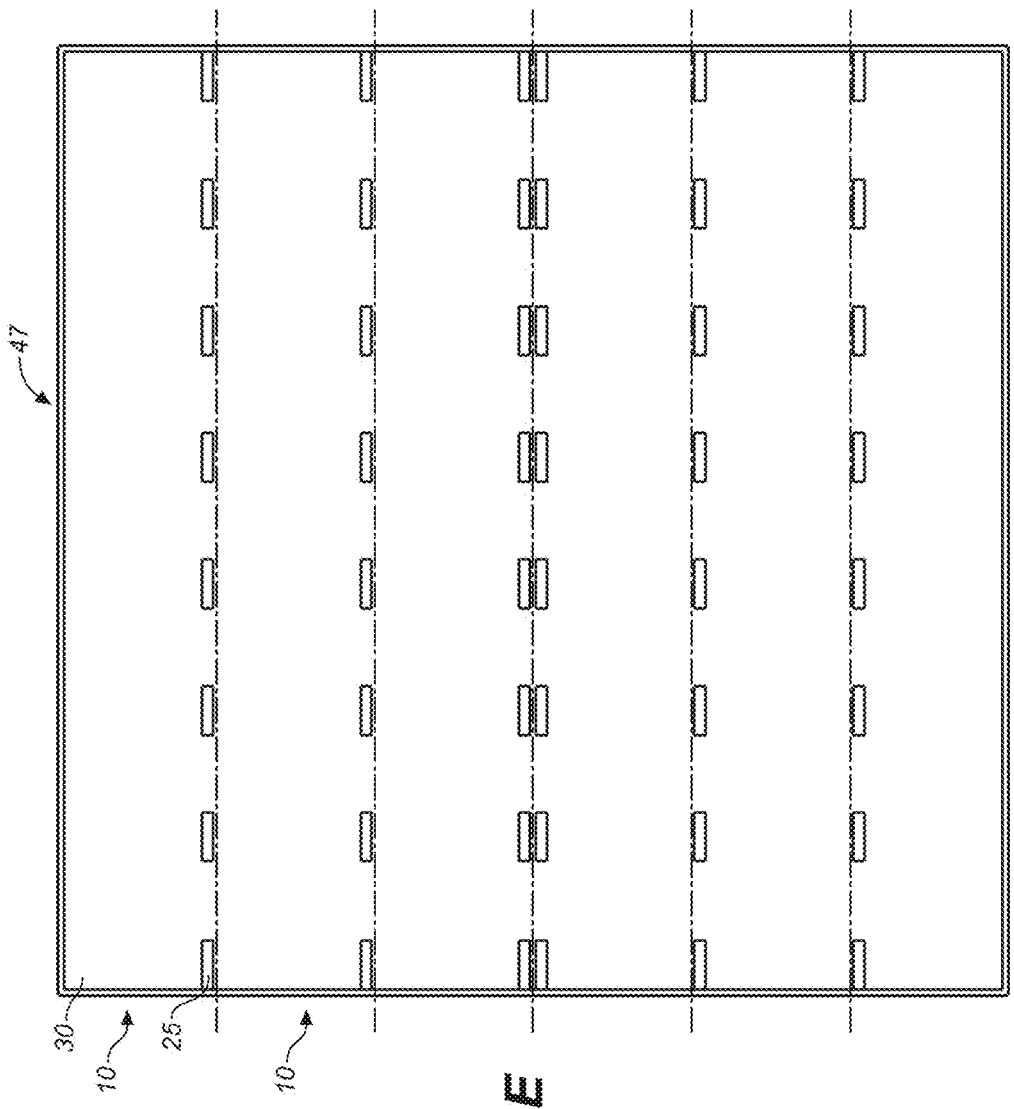

FIGS. 3D-3E show front and rear views of a perfect square wafer 47 that may be diced along the dashed lines shown in FIG. 3E to provide a plurality of solar cells 10 having front surface metallization patterns similar to that shown in FIG. 2A.

Chamfered rectangular solar cells may be used to form super cells comprising only chamfered solar cells. Additionally or alternatively, one or more such chamfered rectangular solar cells may be used in combination with one or more unchamfered rectangular solar cells (e.g., FIG. 2A) to form a super cell. For example, the end solar cells of a super cell may be chamfered solar cells, and the middle solar cells unchamfered solar cells. If chamfered solar cells are used in combination with unchamfered solar cells in a super cell, or more generally in a solar module, it may be desirable to use dimensions for the solar cells that result in the chamfered and unchamfered solar cells having the same front surface area exposed to light during operation of the solar cells. Matching the solar cell areas in this manner matches the current produced in the chamfered and unchamfered solar cells, which improves the performance of a series connected string that includes both chamfered and unchamfered solar cells. The areas of chamfered and unchamfered solar cells cut from the same pseudo square wafer may be matched, for example, by adjusting locations of the lines along which the wafer is diced to make the chamfered solar cells slightly wider than the unchamfered solar cells in the direction perpendicular to their long axes, to compensate for the missing corners on the chamfered solar cells.

A solar module may comprise only super cells formed exclusively from unchamfered rectangular solar cells, or only super cells formed from chamfered rectangular solar cells, or only super cells that include chamfered and unchamfered solar cells, or any combination of these three variations of super cell.

In some instances portions of a standard size square or pseudo square solar cell wafer (e.g., wafer 45 or wafer 47) near the edges of the wafer may convert light to electricity with lower efficiency than portions of the wafer located away from the edges. To improve the efficiency of the resulting rectangular solar cells, in some variations one or more edges of the wafer are trimmed to remove the lower efficiency portions before the wafer is diced. The portions trimmed from the edges of the wafer may have widths of about 1 mm to about 5 mm, for example. Further, as shown in FIGS. 3B and 3D, the two end solar cells 10 to be diced from a wafer may be oriented with their front surface bus bars (or discrete contact pads) 15 along their outside edges and thus along two of the edges of the wafer. Because in the super cells disclosed in this specification bus bars (or discrete contact pads) 15 are typically overlapped by an adjacent solar cell, low light conversion efficiency along those two edges of the wafer typically does not affect performance of the solar cells. Consequently, in some variations edges of a square or pseudo square wafer oriented parallel to the short sides of the rectangular solar cells are trimmed as just described, but edges of the wafer oriented parallel to the long sides of rectangular solar cells are not. In other variations, one, two, three, or four edges of a square wafer (e.g., wafer 47 in FIG. 3D) are trimmed as just described. In other variations, one, two, three, or four of the long edges of a pseudo-square wafer are trimmed as just described.

Solar cells having long and narrow aspect ratios and areas less than that of a standard 156 mm×156 mm solar cell, as illustrated, may be advantageously employed to reduce $I^2R$ resistive power losses in the solar cell modules disclosed in this specification. In particular, the reduced area of solar cells 10 compared to standard size silicon solar cells decreases the current produced in the solar cell, directly reducing resistive power loss in the solar cell and in a series connected string of such solar cells. In addition, arranging such rectangular solar cells in a super cell 100 so that current flows through the super cell parallel to the short sides of the solar cells may reduce the distance that the current must flow through the semiconductor material to reach fingers 20 in the front surface metallization pattern and reduce the required length of the fingers, which may also reduce resistive power loss.

As noted above, bonding overlapped solar cells 10 to each other in their overlapping region to electrically connect the solar cells in series reduces the length of the electrical connection between adjacent solar cells, compared to conventionally tabbed series-connected strings of solar cells. This also reduces resistive power loss.

Figure 2H:
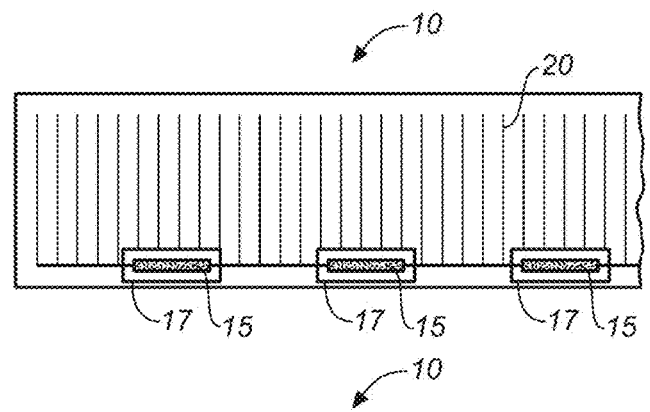
FIG. 2H shows a diagram of the front (sun side) surface and front surface metallization pattern of another example rectangular solar cell that may be used to form shingled super cells. The front surface metallization pattern comprises discrete contact pads each of which is surrounded by a barrier configured to prevent uncured conductive adhesive bonding material deposited on its contact pad from flowing away from the contact pad.
Figure 2I:
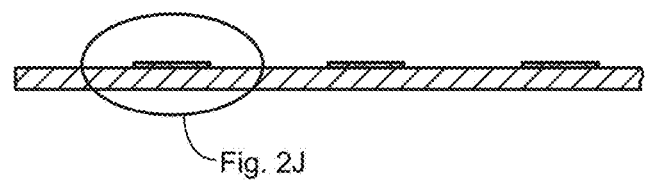
FIG. 2I shows a cross-sectional view of the solar cell of FIG. 2H and identifies detail of the front surface metallization pattern shown in expanded view in FIGS. 2J and 2K that includes a contact pad and portions of a barrier surrounding the contact pad.
Figure 2J:
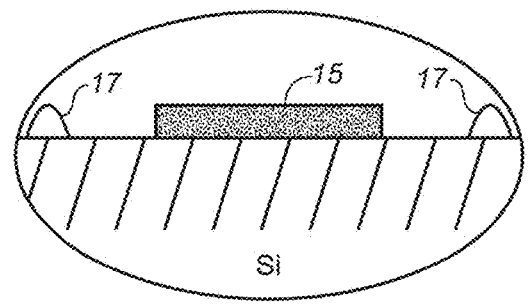
FIG. 2J shows an expanded view of detail from FIG. 2I.
Figure 2K:
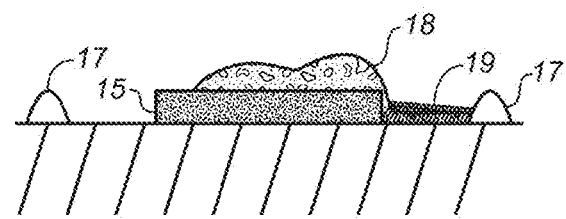
FIG. 2K shows an expanded view of detail from FIG. 2I with uncured conductive adhesive bonding material substantially confined to the location of the discrete contact pad by the barrier.

Referring again to FIG. 2A, in the illustrated example the front surface metallization pattern on solar cell 10 comprises an optional bypass conductor 40 running parallel to and spaced apart from bus bar 15. (Such a bypass conductor may also optionally be used in the metallization patterns shown in FIGS. 2B-2C, 3B, and 3D, and is also shown in FIG. 2Q in combination with discrete contact pads 15 rather than a continuous bus bar). Bypass conductor 40 interconnects fingers 20 to electrically bypass cracks that may form between bus bar 15 and bypass conductor 40. Such cracks, which may sever fingers 20 at locations near to bus bar 15, may otherwise isolate regions of solar cell 10 from bus bar 15. The bypass conductor provides an alternative electrical path between such severed fingers and the bus bar. The illustrated example shows a bypass conductor 40 positioned parallel to bus bar 15, extending about the full length of the bus bar, and interconnecting every finger 20. This arrangement may be preferred but is not required. If present, the bypass conductor need not run parallel to the bus bar and need not extend the full length of the bus bar. Further, a bypass conductor interconnects at least two fingers, but need not interconnect all fingers. Two or more short bypass conductors may be used in place of a longer bypass conductor, for example. Any suitable arrangement of bypass conductors may be used. The use of such bypass conductors is described in greater detail in U.S. patent application Ser. No. 13/371,790, titled "Solar Cell With Metallization Compensating For Or Preventing Cracking," and filed Feb. 13, 2012, which is incorporated herein by reference in its entirety.

The example front surface metallization pattern of FIG. 2A also includes an optional end conductor 42 that interconnects fingers 20 at their far ends, opposite from bus bar 15. (Such an end conductor may also optionally be used in the metallization patterns shown in FIGS. 2B-2C, 3B, and 3D, and 2Q). The width of conductor 42 may be about the same as that of a finger 20, for example. Conductor 42 interconnects fingers 20 to electrically bypass cracks that may form between bypass conductor 40 and conductor 42, and thereby provides a current path to bus bar 15 for regions of solar cell 10 that might otherwise be electrically isolated by such cracks.

Although some of the illustrated examples show a front bus bar 15 extending substantially the length of the long sides of solar cell 10 with uniform width, this is not required. For example, as alluded to above front bus bar 15 may be replaced by two or more front surface discrete contact pads 15 which may be arranged, for example, in line with each other along a side of solar cell 10 as shown in FIGS. 2H, 2Q, and 3B for example. Such discrete contact pads may optionally be interconnected by thinner conductors running between them, as shown for example in the figures just mentioned. In such variations, the width of the contact pads measured perpendicularly to the long side of the solar cell may be for example about 2 to about 20 times that of the thin conductors interconnecting the contact pads. There may be a separate (e.g., small) contact pad for each finger in the front surface metallization pattern, or each contact pad may be connected to two or more fingers. Front surface contact pads 15 may be square or have a rectangular shape elongated parallel to the edge of the solar cell, for example. Front surface contact pads 15 may have widths perpendicular to the long side of the solar cell of about 1 mm to about 1.5 mm, for example, and lengths parallel to the long side of the solar cell of about 1 mm to about 10 mm for example. The spacing between contact pads 15 measured parallel to the long side of the solar cell may be about 3 mm to about 30 mm, for example.

Alternatively, solar cell 10 may lack both a front bus bar 15 and discrete front contact pads 15 and include only fingers 20 in the front surface metallization pattern. In such variations, the current-collecting functions that would otherwise be performed by a front bus bar 15 or contact pads 15 may instead be performed, or partially performed, by the conductive material used to bond two solar cells 10 to each other in the overlapping configuration described above.

Solar cells lacking both a bus bar 15 and contact pads 15 may either include bypass conductor 40, or not include bypass conductor 40. If bus bar 15 and contact pads 15 are absent, bypass conductor 40 may be arranged to bypass cracks that form between the bypass conductor and the portion of the front surface metallization pattern that is conductively bonded to the overlapping solar cell.

The front surface metallization patterns, including bus bar or discrete contact pads 15, fingers 20, bypass conductor 40 (if present), and end conductor 42 (if present) may be formed, for example, from silver paste conventionally used for such purposes and deposited, for example, by conventional screen printing methods. Alternatively, the front surface metallization patterns may be formed from electroplated copper. Any other suitable materials and processes may be also used. In variations in which the front surface metallization pattern is formed from silver, the use of discrete front surface contact pads 15 rather than a continuous bus bar 15 along the edge of the cell reduces the amount of silver on the solar cell, which may advantageously reduce cost. In variations in which the front surface metallization pattern is formed from copper or from another conductor less expensive than silver, a continuous bus 15 may be employed without a cost disadvantage.

FIGS. 2D-2G, 3C, and 3E show example rear surface metallization patterns for a solar cell. In these examples the rear surface metallization patterns include discrete rear surface contact pads 25 arranged along one of the long edges of the rear surface of the solar cell and a metal contact 30 covering substantially all of the remaining rear surface of the solar cell. In a shingled super cell, contact pads 25 are bonded for example to a bus bar or to discrete contact pads arranged along the edge of the upper surface of an adjacent overlapping solar cell to electrically connect the two solar cells in series. For example, each discrete rear surface contact pad 25 may be aligned with and bonded to a corresponding discrete front surface contact pad 15 on the front surface of the overlapping solar cell by electrically conductive bonding material applied only to the discrete contact pads. Discrete contact pads 25 may be square (FIG. 2D) or have a rectangular shape elongated parallel to the edge of the solar cell (FIGS. 2E-2G, 3C, 3E), for example. Contact pads 25 may have widths perpendicular to the long side of the solar cell of about 1 mm to about 5 mm, for example, and lengths parallel to the long side of the solar cell of about 1 mm to about 10 mm for example. The spacing between contact pads 25 measured parallel to the long side of the solar cell may be about 3 mm to about 30 mm, for example.

Contact 30 may be formed, for example, from aluminum and/or electroplated copper. Formation of an aluminum back contact 30 typically provides a back surface field that reduces back surface recombination in the solar cell and thereby improves solar cell efficiency. If contact 30 is formed from copper rather than aluminum, contact 30 may be used in combination with another passivation scheme (e.g., aluminum oxide) to similarly reduce back surface recombination. Discrete contact pads 25 may be formed, for example, from silver paste. The use of discrete silver contact pads 25 rather than a continuous silver contact pad along the edge of the cell reduces the amount of silver in the rear surface metallization pattern, which may advantageously reduce cost.

Further, if the solar cells rely on a back surface field provided by formation of an aluminum contact to reduce back surface recombination, the use of discrete silver contacts rather than a continuous silver contact may improve solar cell efficiency. This is because the silver rear surface contacts do not provide a back surface field and therefore tend to promote carrier recombination and produce dead (inactive) volumes in the solar cells above the silver contacts. In conventionally ribbon-tabbed solar cell strings those dead volumes are typically shaded by ribbons and/or bus bars on the front surface of the solar cell, and thus do not result in any extra loss of efficiency. In the solar cells and super cells disclosed herein, however, the volume of the solar cell above rear surface silver contact pads 25 is typically unshaded by any front surface metallization, and any dead volumes resulting from use of silver rear surface metallization reduce the efficiency of the cell. The use of discrete silver contact pads 25 rather than a continuous silver contact pad along the edge of the rear surface of the solar cell thus reduces the volume of any corresponding dead zones and increases the efficiency of the solar cell.

In variations not relying on a back surface field to reduce back surface recombination, the rear surface metallization pattern may employ a continuous bus bar 25 extending the length of the solar cell rather than discrete contact pads 25, as shown for example in FIG. 2Q. Such a bus bar 25 may be formed for example, from tin or silver.

Other variations of the rear surface metallization patterns may employ discrete tin contact pads 25. Variations of the rear surface metallization patterns may employ finger contacts similar to those shown in the front surface metallization patterns of FIGS. 2A-2C and may lack contact pads and a bus bar.

Although the particular example solar cells shown in the figures are described as having particular combinations of front and rear surface metallization patterns, more generally any suitable combination of front and rear surface metallization patterns may be used. For example, one suitable combination may employ a silver front surface metallization pattern comprising discrete contact pads 15, fingers 20, and an optional bypass conductor 40, and a rear surface metallization pattern comprising an aluminum contact 30 and discrete silver contact pads 25. Another suitable combination may employ a copper front surface metallization pattern comprising a continuous bus bar 15, fingers 20, and an optional bypass conductor 40, and a rear surface metallization pattern comprising a continuous bus bar 25 and a copper contact 30.

In the super cell manufacturing process (described in more detail below) the electrically conductive bonding material used to bond adjacent overlapping solar cells in a super cell may be dispensed only onto (discrete or continuous) contact pads at the edge of the front or rear surface of the solar cell, and not onto the surrounding portions of the solar cell. This reduces use of material and, as described above, may reduce or accommodate stress arising from CTE mismatch between the electrically conductive bonding material and the solar cell. However, during or after deposition and prior to curing, portions of the electrically conductive bonding material may tend to spread beyond the contact pads and onto surrounding portions of the solar cell. For example, a binding resin portion of the electrically conductive bonding material may be drawn off of a contact pad onto textured or porous adjacent portions of the solar cell surface by capillary forces. In addition, during the deposition process some of the conductive bonding material may miss the contact pad and instead be deposited on adjacent portions of the solar cell surface, and possibly spread from there. This spreading and/or inaccurate deposition of the conductive bonding material may weaken the bond between the overlapping solar cells and may damage the portions of the solar cell onto which the conductive bonding material has spread or been mistakenly deposited. Such spreading of the electrically conductive bonding material may be reduced or prevented, for example, with a metallization pattern that forms a dam or barrier near or around each contact pad to retain the electrically conductive bonding material substantially in place.

As shown in FIGS. 2H-2K, for example, the front surface metallization pattern may comprise discrete contact pads 15, fingers 20, and barriers 17, with each barrier 17 surrounding a corresponding contact pad 15 and acting as a dam to form a moat between the contact pad and the barrier. Portions 19 of uncured conductive adhesive bonding material 18 that flow off of the contact pads, or that miss the contact pads when dispensed onto the solar cell, may be confined by barriers 17 to the moats. This prevents the conductive adhesive bonding material from spreading further from the contact pads onto surrounding portions of the cell. Barriers 17 may be formed from the same material as fingers 20 and contact pads 15 (e.g., silver), for example, may have heights of about 10 microns to about 40 microns, for example, and may have widths of about 30 microns to about 100 microns, for example. The moat formed between a barrier 17 and a contact pad 15 may have a width of about 100 microns to about 2 mm, for example. Although the illustrated examples comprise only a single barrier 17 around each front contact pad 15, in other variations two or more such barriers may be positioned concentrically, for example, around each contact pad. A front surface contact pad and its one or more surrounding barriers may form a shape similar to a "bulls-eye" target, for example. As shown in FIG. 2H, for example, barriers 17 may interconnect with fingers 20 and with the thin conductors interconnecting contact pads 15.

Figure 2L:
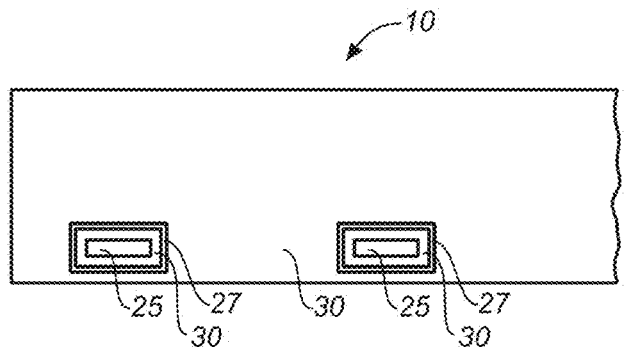
FIG. 2L shows a diagram of the rear surface and an example rear surface metallization pattern for the solar cell of FIG. 2H. The rear surface metallization pattern comprises discrete contact pads each of which is surrounded by a barrier configured to prevent uncured conductive adhesive bonding material deposited on its contact pad from flowing away from the contact pad.
Figure 2M:
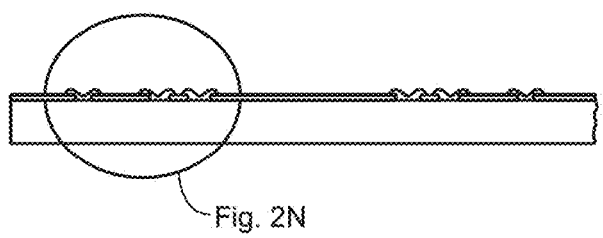
FIG. 2M shows a cross-sectional view of the solar cell of FIG. 2L and identifies detail of the rear surface metallization pattern shown in expanded view in FIG. 2N that includes a contact pad and portions of a barrier surrounding the contact pad.
Figure 2N:
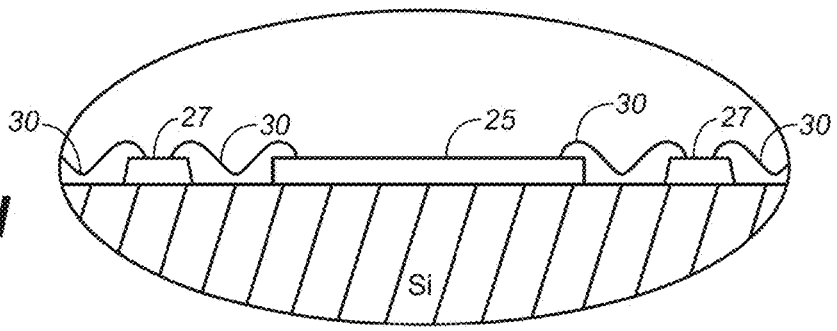
FIG. 2N shows an expanded view of detail from FIG. 2M.

Similarly, as shown in FIGS. 2L-2N, for example, the rear surface metallization pattern may comprise (e.g., silver) discrete rear contact pads 25, (e.g., aluminum) contact 30 covering substantially all of the remaining rear surface of the solar cell, and (e.g., silver) barriers 27, with each barrier 27 surrounding a corresponding rear contact pad 25 and acting as a dam to form a moat between the contact pad and the barrier. A portion of contact 30 may fill the moat, as illustrated. Portions of uncured conductive adhesive bonding material that flow off of contact pads 25, or that miss the contact pads when dispensed onto the solar cell, may be confined by barriers 27 to the moats. This prevents the conductive adhesive bonding material from spreading further from the contact pads onto surrounding portions of the cell. Barriers 27 may have heights of about 10 microns to about 40 microns, for example, and may have widths of about 50 microns to about 500 microns, for example. The moat formed between a barrier 27 and a contact pad 25 may have a width of about 100 microns to about 2 mm, for example. Although the illustrated examples comprise only a single barrier 27 around each rear surface contact pad 25, in other variations two or more such barriers may be positioned concentrically, for example, around each contact pad. A rear surface contact pad and its one or more surrounding barriers may form a shape similar to a "bulls-eye" target, for example.

A continuous bus bar or contact pad running substantially the length of the edge of a solar cell may also be surrounded by a barrier that prevents spreading of the conductive adhesive bonding material. For example, FIG. 2Q shows such a barrier 27 surrounding a rear surface bus bar 25. A front surface bus bar (e.g., bus bar 15 in FIG. 2A) may be similarly surrounded by a barrier. Similarly, a row of front or rear surface contact pads may be surrounded as a group by such a barrier, rather than individually surrounded by separate barriers.

Rather than surrounding a bus bar or one or more contact pads as just described, a feature of the front or rear surface metallization pattern may form a barrier running substantially the length of the solar cell parallel to the overlapped edge of the solar cell, with the bus bar or contact pads positioned between the barrier and the edge of the solar cell. Such a barrier may do double duty as a bypass conductor (described above). For example, in FIG. 2R bypass conductor 40 provides a barrier that tends to prevent uncured conductive adhesive bonding material on contact pads 15 from spreading onto the active area of the front surface of the solar cell. A similar arrangement may be used for rear surface metallization patterns.

Figure 2O:
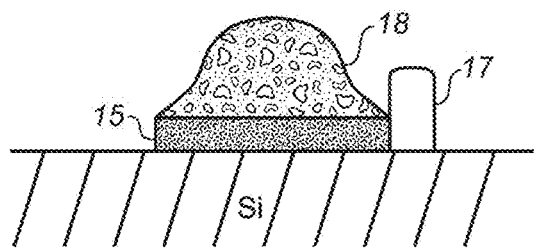
FIG. 2O shows another variation of a metallization pattern comprising a barrier configured to prevent uncured conductive adhesive bonding material from flowing away from a contact pad. The barrier abuts one side of the contact pad and is taller than the contact pad.
Figure 2P:
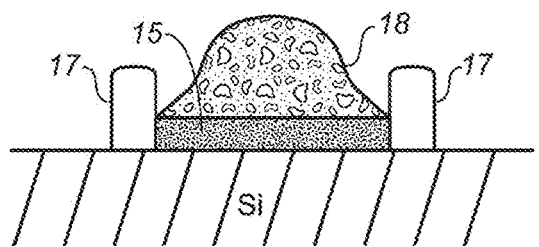
FIG. 2P shows another variation of the metallization pattern of FIG. 2O, with the barrier abutting at least two sides of the contact pad
Figure 2Q:
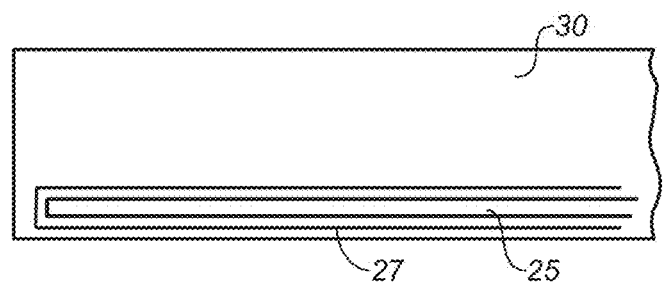
FIG. 2Q shows a diagram of the rear surface and an example rear surface metallization pattern for another example rectangular solar cell. The rear surface metallization pattern comprises a continuous contact pad running substantially the length of a long side of the solar cell along an edge of the solar cell. The contact pad is surrounded by a barrier configured to prevent uncured conductive adhesive bonding material deposited on the contact pad from flowing away from the contact pad.
Figure 2R:
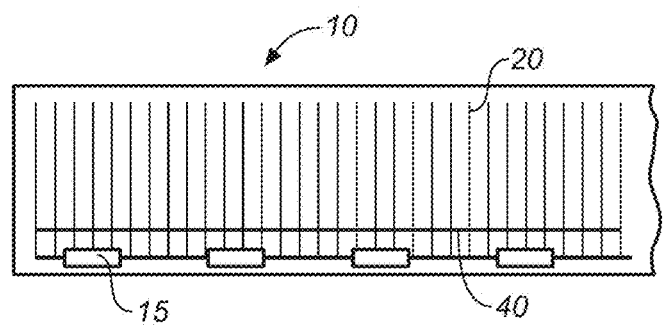
FIG. 2R shows a diagram of the front (sun side) surface and front surface metallization pattern of another example rectangular solar cell that may be used to form shingled super cells. The front surface metallization pattern comprises discrete contact pads arranged in a row along an edge of the solar cell and a long thin conductor running parallel to and inboard from the row of contact pads. The long thin conductor forms a barrier configured to prevent uncured conductive adhesive bonding material deposited on its contact pads from flowing away from the contact pads and onto active areas of the solar cell.

Barriers to the spread of conductive adhesive bonding material may be spaced apart from contact pads or bus bars to form a moat as just described, but this is not required. Such barriers may instead abut a contact pad or bus bar, as shown in FIG. 2O or 2P for example. In such variations the barrier is preferably taller than the contact pad or bus bar, to retain the uncured conductive adhesive bonding material on the contact pad or bus bar. Although FIGS. 2O and 2P show portions of a front surface metallization pattern, similar arrangements may be used for rear surface metallization patterns.

Barriers to the spread of conductive adhesive bonding material and/or moats between such barriers and contact pads or bus bars, and any conductive adhesive bonding material that has spread into such moats, may optionally lie within the region of the solar cell surface overlapped by the adjacent solar cell in the super cell, and thus be hidden from view and shielded from exposure to solar radiation.

Alternatively or in addition to the use of barriers as just described, the electrically conductive bonding material may be deposited using a mask or by any other suitable method (e.g., screen printing) allowing accurate deposition and thus requiring reduced amounts of electrically conductive bonding material that are less likely to spread beyond the contact pads or miss the contact pads during deposition.

More generally, solar cells 10 may employ any suitable front and rear surface metallization patterns.

Figure 4A:
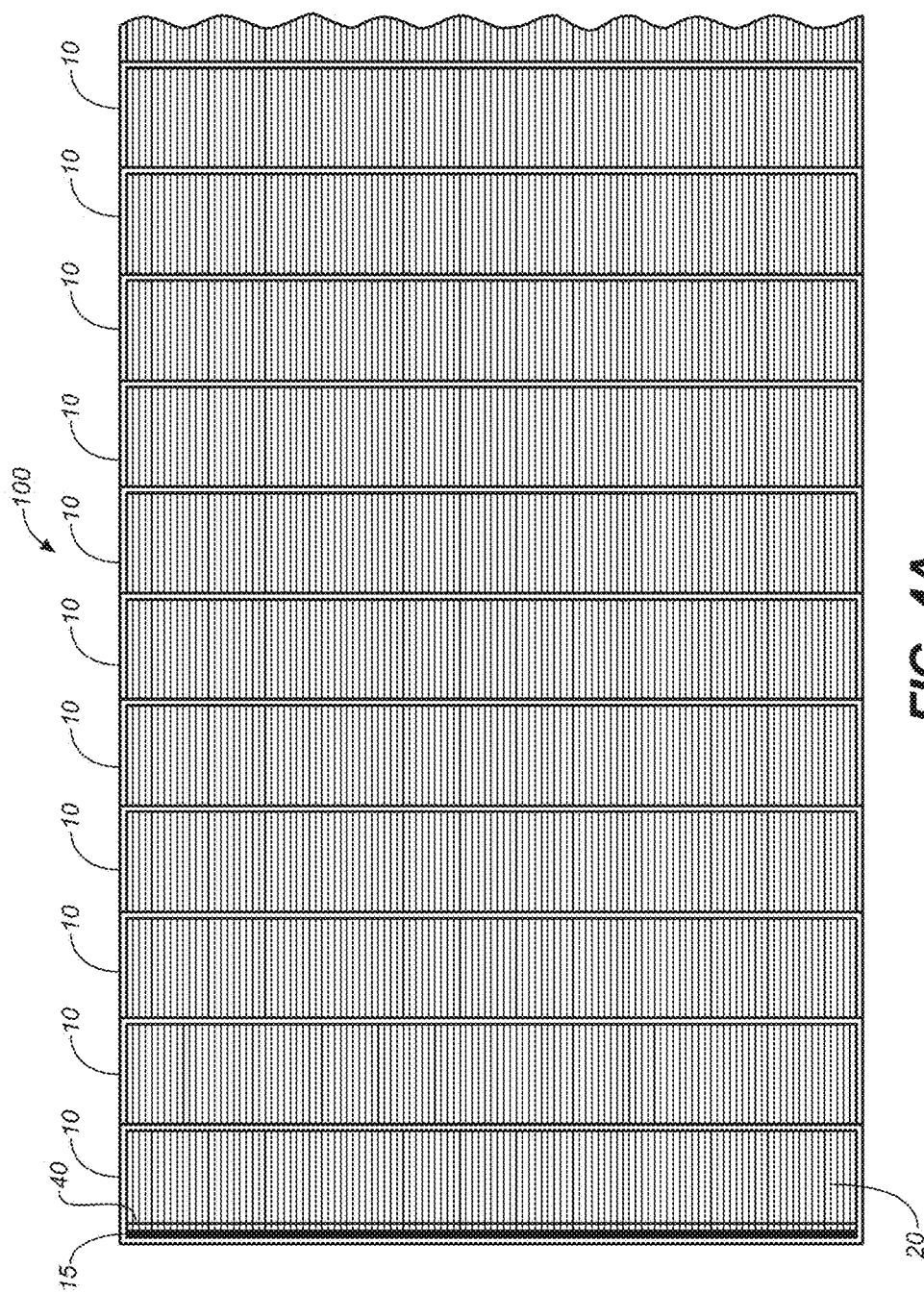
FIG. 4A shows a fragmentary view of the front surface of an example rectangular super cell comprising rectangular solar cells as shown for example in FIG. 2A arranged in a shingled manner as shown in FIG. 1.

FIG. 4A shows a portion of the front surface of an example rectangular super cell 100 comprising solar cells 10 as shown in FIG. 2A arranged in a shingled manner as shown in FIG. 1. As a result of the shingling geometry, there is no physical gap between pairs of solar cells 10. In addition, although bus bar 15 of the solar cell 10 at one end of super cell 100 is visible, the bus bars (or front surface contact pads) of the other solar cells are hidden beneath overlapping portions of adjacent solar cells. As a consequence, super cell 100 efficiently uses the area it takes up in a solar module. In particular, a larger portion of that area is available to produce electricity than is the case for conventionally tabbed solar cell arrangements and solar cell arrangements including numerous visible bus bars on the illuminated surface of the solar cells. FIGS. 4B-4C show front and rear views, respectively, of another example super cell 100 comprising primarily chamfered chevron rectangular silicon solar cells but otherwise similar to that of FIG. 4A.

In the example illustrated in FIG. 4A, bypass conductors 40 are hidden by overlapping portions of adjacent cells. Alternatively, solar cells comprising bypass conductors 40 may be overlapped similarly to as shown in FIG. 4A without covering the bypass conductors.

The exposed front surface bus bar 15 at one end of super cell 100 and the rear surface metallization of the solar cell at the other end of super cell 100 provide negative and positive (terminal) end contacts for the super cell that may be used to electrically connect super cell 100 to other super cells and/or to other electrical components as desired.

Adjacent solar cells in super cell 100 may overlap by any suitable amount, for example by about 1 millimeter (mm) to about 5 mm.

As shown in FIGS. 5A-5G, for example, shingled super cells as just described may efficiently fill the area of a solar module. Such solar modules may be square or rectangular, for example. Rectangular solar modules as illustrated in FIGS. 5A-5G may have shorts sides having a length, for example, of about 1 meter and long sides having a length, for example, of about 1.5 to about 2.0 meters. Any other suitable shapes and dimensions for the solar modules may also be used. Any suitable arrangement of super cells in a solar module may be used.

In a square or rectangular solar module, the super cells are typically arranged in rows parallel to the short or long sides of the solar module. Each row may include one, two, or more super cells arranged end-to-end. A super cell 100 forming part of such a solar module may include any suitable number of solar cells 10 and be of any suitable length. In some variations super cells 100 each have a length approximately equal to the length of the short sides of a rectangular solar module of which they are a part. In other variations super cells 100 each have a length approximately equal to one half the length of the short sides of a rectangular solar module of which they are a part. In other variations super cells 100 each have a length approximately equal to the length of the long sides of a rectangular solar module of which they are a part. In other variations super cells 100 each have a length approximately equal to one half the length of the long sides of a rectangular solar module of which they are a part. The number of solar cells required to make super cells of these lengths depends of course on the dimensions of the solar module, the dimensions of the solar cells, and the amount by which adjacent solar cells overlap. Any other suitable lengths for super cells may also be used.

In variations in which a super cell 100 has a length approximately equal to the length of the short sides of a rectangular solar module, the super cell may include, for example, 56 rectangular solar cells having dimensions of about 19.5 millimeters (mm) by about 156 mm, with adjacent solar cells overlapped by about 3 mm. Eight such rectangular solar cells may be separated from a conventional square or pseudo square 156 mm wafer. Alternatively such a super cell may include, for example, 38 rectangular solar cells having dimensions of about 26 mm by about 156 mm, with adjacent solar cells overlapped by about 2 mm. Six such rectangular solar cells may be separated from a conventional square or pseudo square 156 mm wafer. In variations in which a super cell 100 has a length approximately equal to half the length of the short sides of a rectangular solar module, the super cell may include, for example, 28 rectangular solar cells having dimensions of about 19.5 millimeters (mm) by about 156 mm, with adjacent solar cells overlapped by about 3 mm. Alternatively, such a super cell may include, for example, 19 rectangular solar cells having dimensions of about 26 mm by about 156 mm, with adjacent solar cells overlapped by about 2 mm.

In variations in which a super cell 100 has a length approximately equal to the length of the long sides of a rectangular solar module, the super cell may include, for example, 72 rectangular solar cells having dimensions of about 26 mm by about 156 mm, with adjacent solar cells overlapped by about 2 mm. In variations in which a super cell 100 has a length approximately equal to one half the length of the long sides of a rectangular solar module, the super cell may include, for example, 36 rectangular solar cells having dimensions of about 26 mm by about 156 mm, with adjacent solar cells overlapped by about 2 mm.

Figure 5B:
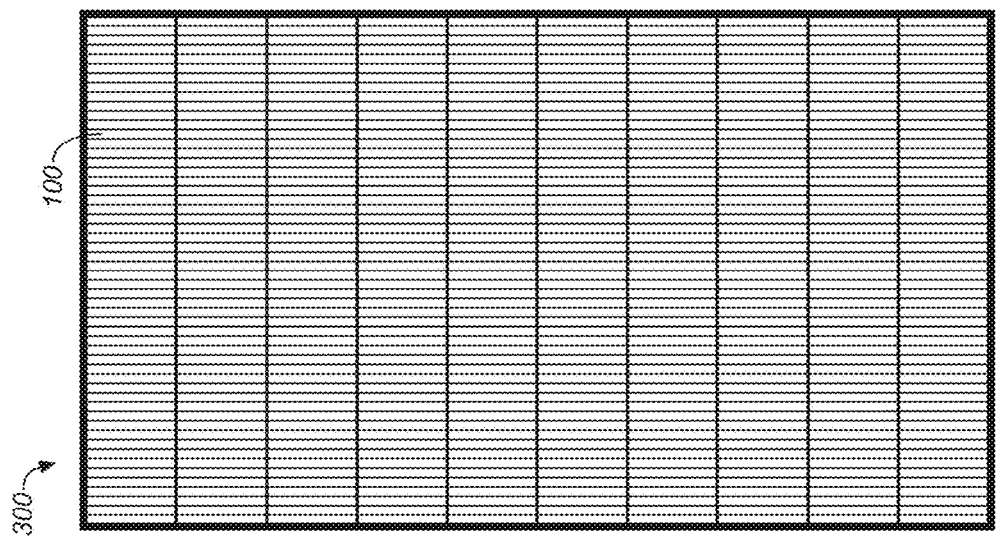
FIG. 5B shows a diagram of another example rectangular solar module comprising a plurality of rectangular shingled super cells, with the long side of each super cell having a length of approximately the length of the short sides of the module. The super cells are arranged with their long sides parallel to the short sides of the module.
Figure 5A:
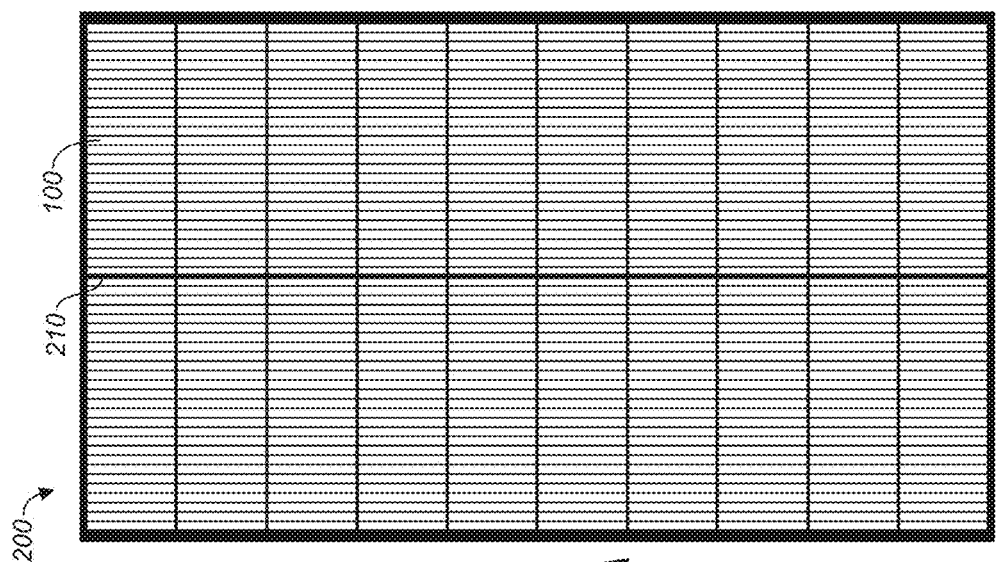
FIG. 5A shows a diagram of an example rectangular solar module comprising a plurality of rectangular shingled super cells, with the long side of each super cell having a length of approximately half the length of the short sides of the module. Pairs of the super cells are arranged end-to-end to form rows with the long sides of the super cells parallel to the short sides of the module.

FIG. 5A shows an example rectangular solar module 200 comprising twenty rectangular super cells 100, each of which has a length approximately equal to one half the length of the short sides of the solar module. The super cells are arranged end-to-end in pairs to form ten rows of super cells, with the rows and the long sides of the super cells oriented parallel to the short sides of the solar module. In other variations, each row of super cells may include three or more super cells. Also, a similarly configured solar module may include more or fewer rows of super cells than shown in this example. (FIG. 14A for example shows a solar module comprising twenty-four rectangular super cells arranged in twelve rows of two super cells each).

Gap 210 shown in FIG. 5A facilitates making electrical contact to front surface end contacts (e.g., exposed bus bars or discrete contacts 15) of super cells 100 along the center line of the solar module, in variations in which the super cells in each row are arranged so that at least one of them has a front surface end contact on the end of the super cell adjacent to the other super cell in the row. For example, the two super cells in a row may be arranged with one super cell having its front surface terminal contact along the center line of the solar module and the other super cell having its rear surface terminal contact along the center line of the solar module. In such an arrangement the two super cells in a row may be electrically connected in series by an interconnect arranged along the center line of the solar module and bonded to the front surface terminal contact of one super cell and to the rear surface terminal contact of the other super cell. (See e.g. FIG. 8C discussed below). In variations in which each row of super cells includes three or more super cells, additional gaps between super cells may be present and may similarly facilitate making electrical contact to front surface end contacts that are located away from the sides of the solar module.

FIG. 5B shows an example rectangular solar module 300 comprising ten rectangular super cells 100, each of which has a length approximately equal to the length of the short sides of the solar module. The super cells are arranged as ten parallel rows with their long sides oriented parallel to the short sides of the module. A similarly configured solar module may include more or fewer rows of such side-length super cells than shown in this example.

FIG. 5B also shows what solar module 200 of FIG. 5A looks like when there are no gaps between adjacent super cells in the rows of super cells in solar module 200. Gap 210 of FIG. 5A can be eliminated, for example, by arranging the super cells so that both super cells in each row have their back surface end contacts along the center line of the module. In this case the super cells may be arranged nearly abutting each other with little or no extra gap between them because no access to the front surface of the super cell is required along the center of the module. Alternatively, two super cells 100 in a row may be arranged with one having its front surface end contact along a side of the module and its rear surface end contact along the center line of the module, the other having its front surface end contact along the center line of the module and its rear surface end contact along the opposite side of the module, and the adjacent ends of the super cells overlapping. A flexible interconnect may be sandwiched between the overlapping ends of the super cells, without shading any portion of the front surface of the solar module, to provide an electrical connection to the front surface end contact of one of the super cells and the rear surface end contact of the other super cell. For rows containing three or more super cells these two approaches may be used in combination.

The super cells and rows of super cells shown in FIGS. 5A-5B may be interconnected by any suitable combination of series and parallel electrical connections, for example as described further below with respect to FIGS. 10A-15. The interconnections between super cells may be made, for example, using flexible interconnects similarly to as described below with respect to FIGS. 5C-5G and subsequent figures. As demonstrated by many of the examples described in this specification, the super cells in the solar modules described herein may be interconnected by a combination of series and parallel connections to provide an output voltage for the module substantially the same as that of a conventional solar module. In such cases the output current from the solar module may also be substantially the same as that for a conventional solar module. Alternatively, as further described below the super cells in a solar module may be interconnected to provide a significantly higher output voltage from the solar module than that provided by conventional solar modules.

Figure 5D:
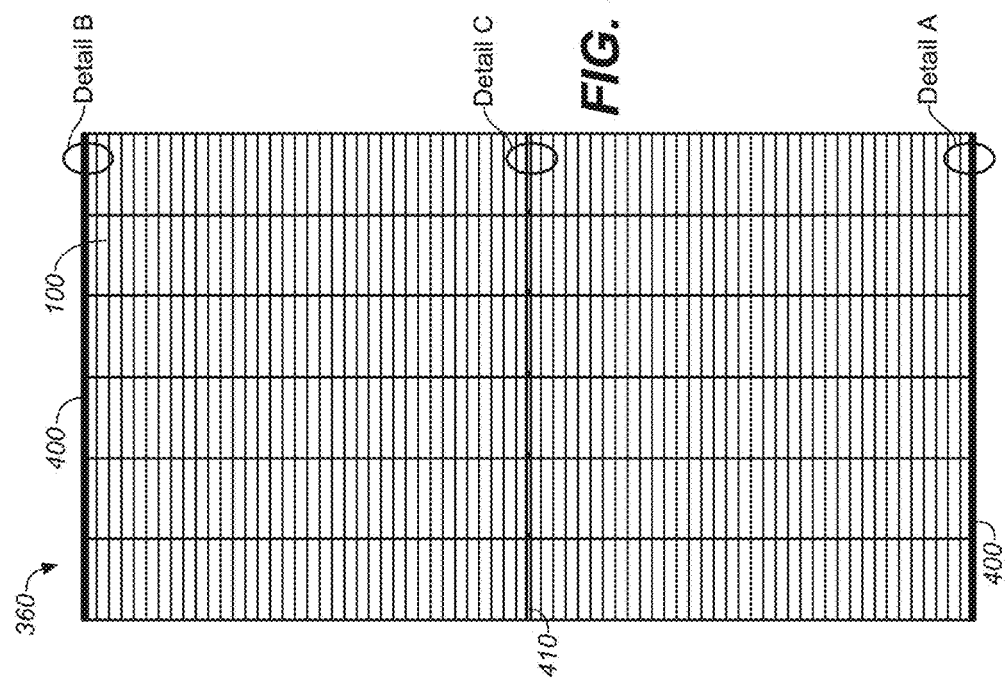
FIG. 5D shows a diagram of an example rectangular solar module comprising a plurality of rectangular shingled super cells, with the long side of each super cell having a length of approximately half the length of the long sides of the module. Pairs of the super cells are arranged end-to-end to form rows with the long sides of the super cells parallel to the long sides of the module.
Figure 5C:
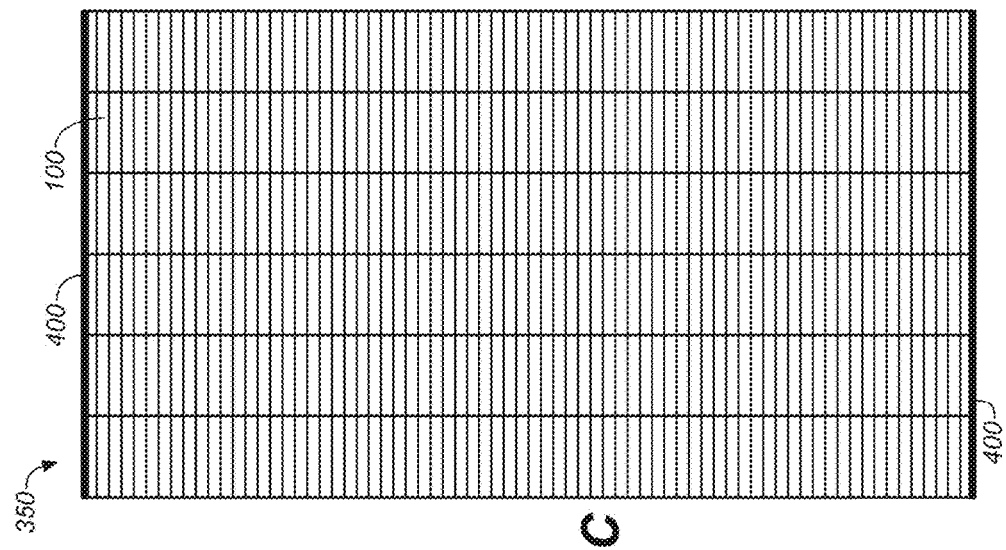
FIG. 5C shows a diagram of another example rectangular solar module comprising a plurality of rectangular shingled super cells, with the long side of each super cell having a length of approximately the length of the long side of the module. The super cells are arranged with their long sides parallel to the sides of the module.

FIG. 5C shows an example rectangular solar module 350 comprising six rectangular super cells 100, each of which has a length approximately equal to the length of the long sides of the solar module. The super cells are arranged as six parallel rows with their long sides oriented parallel to the long sides of the module. A similarly configured solar module may include more or fewer rows of such side-length super cells than shown in this example. Each super cell in this example (and in several of the following examples) comprises 72 rectangular solar cells each having a width approximately equal to ⅙ the width of a 156 mm square or pseudo square wafer. Any other suitable number of rectangular solar cells of any other suitable dimensions may also be used. In this example the front surface terminal contacts of the super cells are electrically connected to each other with flexible interconnects 400 positioned adjacent to and running parallel to the edge of one short side of the module. The rear surface terminal contacts of the super cells are similarly connected to each other by flexible interconnects positioned adjacent to and running parallel to the edge of the other short side, behind the solar module. The rear surface interconnects are hidden from view in FIG. 5C. This arrangement electrically connects the six module-length super cells in parallel. Details of the flexible interconnects and their arrangement in this and other solar module configurations are discussed in more detail below with respect to FIGS. 6-8G.

FIG. 5D shows an example rectangular solar module 360 comprising twelve rectangular super cells 100, each of which has a length approximately equal to one half the length of the long sides of the solar module. The super cells are arranged end-to-end in pairs to form six rows of super cells, with the rows and the long sides of the super cells oriented parallel to the long sides of the solar module. In other variations, each row of super cells may include three or more super cells. Also, a similarly configured solar module may include more or fewer rows of super cells than shown in this example. Each super cell in this example (and in several of the following examples) comprises 36 rectangular solar cells each having a width approximately equal to ⅙ the width of a 156 mm square or pseudo square wafer. Any other suitable number of rectangular solar cells of any other suitable dimensions may also be used. Gap 410 facilitates making electrical contact to front surface end contacts of super cells 100 along the center line of the solar module. In this example, flexible interconnects 400 positioned adjacent to and running parallel to the edge of one short side of the module electrically interconnect the front surface terminal contacts of six of the super cells. Similarly, flexible interconnects positioned adjacent to and running parallel to the edge of the other short side of the module behind the module electrically connect the rear surface terminal contacts of the other six super cells. Flexible interconnects (not shown in this figure) positioned along gap 410 interconnect each pair of super cells in a row in series and, optionally, extend laterally to interconnect adjacent rows in parallel. This arrangement electrically connects the six rows of super cells in parallel. Optionally, in a first group of super cells the first super cell in each row is electrically connected in parallel with the first super cell in each of the other rows, in a second group of super cells the second super cell is electrically connected in parallel with the second super cell in each of the other rows, and the two groups of super cells are electrically connect in series. The later arrangement allows each of the two groups of super cells to be individually put in parallel with a bypass diode.

Detail A in FIG. 5D identifies the location of a cross-sectional view shown in FIG. 8A of the interconnection of the rear surface terminal contacts of super cells along the edge of one short side of the module. Detail B similarly identifies the location of a cross-sectional view shown in FIG. 8B of the interconnection of the front surface terminal contacts of super cells along the edge of the other short side of the module. Detail C identifies the location of a cross-sectional view shown in FIG. 8C of series interconnection of the super cells within a row along gap 410.

Figure 5F:
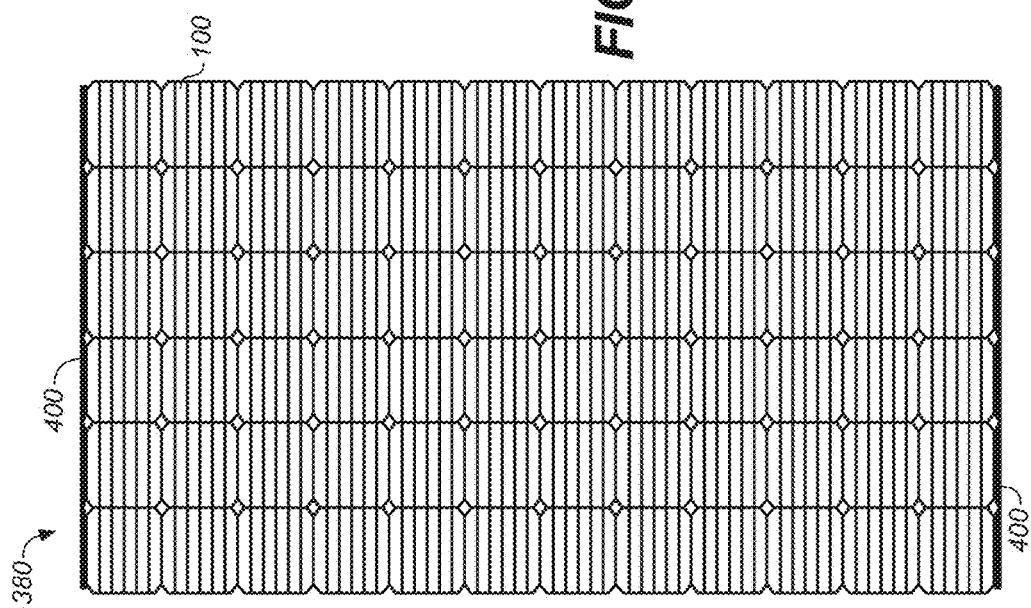
FIG. 5F shows a diagram of another example rectangular solar module similar in configuration to that of FIG. 5C, in which the solar cells from which the super cells are formed comprise a mixture of chevron and rectangular solar cells arranged to reproduce the shapes of the pseudo-square wafers from which they were separated.
Figure 5E:
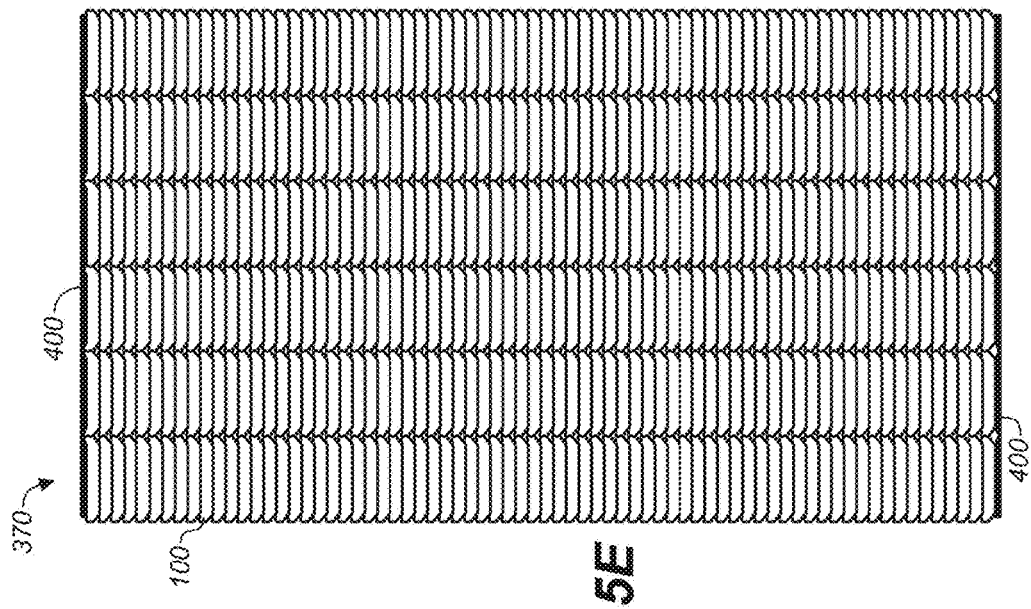
FIG. 5E shows a diagram of another example rectangular solar module similar in configuration to that of FIG. 5C, in which all of the solar cells from which the super cells are formed are chevron solar cells having chamfered corners corresponding to corners of pseudo-square wafers from which the solar cells were separated.

FIG. 5E shows an example rectangular solar module 370 configured similarly to that of FIG. 5C, except that in this example all of the solar cells from which the super cells are formed are chevron solar cells having chamfered corners corresponding to corners of pseudo-square wafers from which the solar cells were separated.

FIG. 5F shows another example rectangular solar module 380 configured similarly to that of FIG. 5C, except that in this example the solar cells from which the super cells are formed comprise a mixture of chevron and rectangular solar cells arranged to reproduce the shapes of the pseudo-square wafers from which they were separated. In the example of FIG. 5F, the chevron solar cells may be wider perpendicular to their long axes than are the rectangular solar cells to compensate for the missing corners on the chevron cells, so that the chevron solar cells and the rectangular solar cells have the same active area exposed to solar radiation during operation of the module and therefore matched current.

FIG. 5G shows another example rectangular solar module configured similarly to that of FIG. 5E (i.e., including only chevron solar cells) except that in the solar module of FIG. 5G adjacent chevron solar cells in a super cell are arranged as mirror images of each other so that their overlapping edges are of the same length. This maximizes the length of each overlapping joint, and thereby facilitates heat flow through the super cell.

Other configurations of rectangular solar modules may include one or more rows of super cells formed only from rectangular (non-chamfered) solar cells, and one or more rows of super cells formed only from chamfered solar cells. For example, a rectangular solar module may be configured similarly to that of FIG. 5C, except having the two outer rows of super cells each replaced by a row of super cells formed only from chamfered solar cells. The chamfered solar cells in those rows may be arranged in mirror image pairs as shown in FIG. 5G, for example.

In the example solar modules shown in FIGS. 5C-5G, the electric current along each row of super cells is about ⅙ of that in a conventional solar module of the same area because the rectangular solar cells from which the super cells are formed has an active area of about ⅙ that of a conventionally sized solar cell. Because in these examples the six rows of super cells are electrically connected in parallel, however, the example solar modules may generate a total electric current equal to that generated by a conventional solar module of the same area. This facilitates substation of the example solar modules of FIGS. 5C-5G (and other examples described below) for conventional solar modules.

Figure 6:
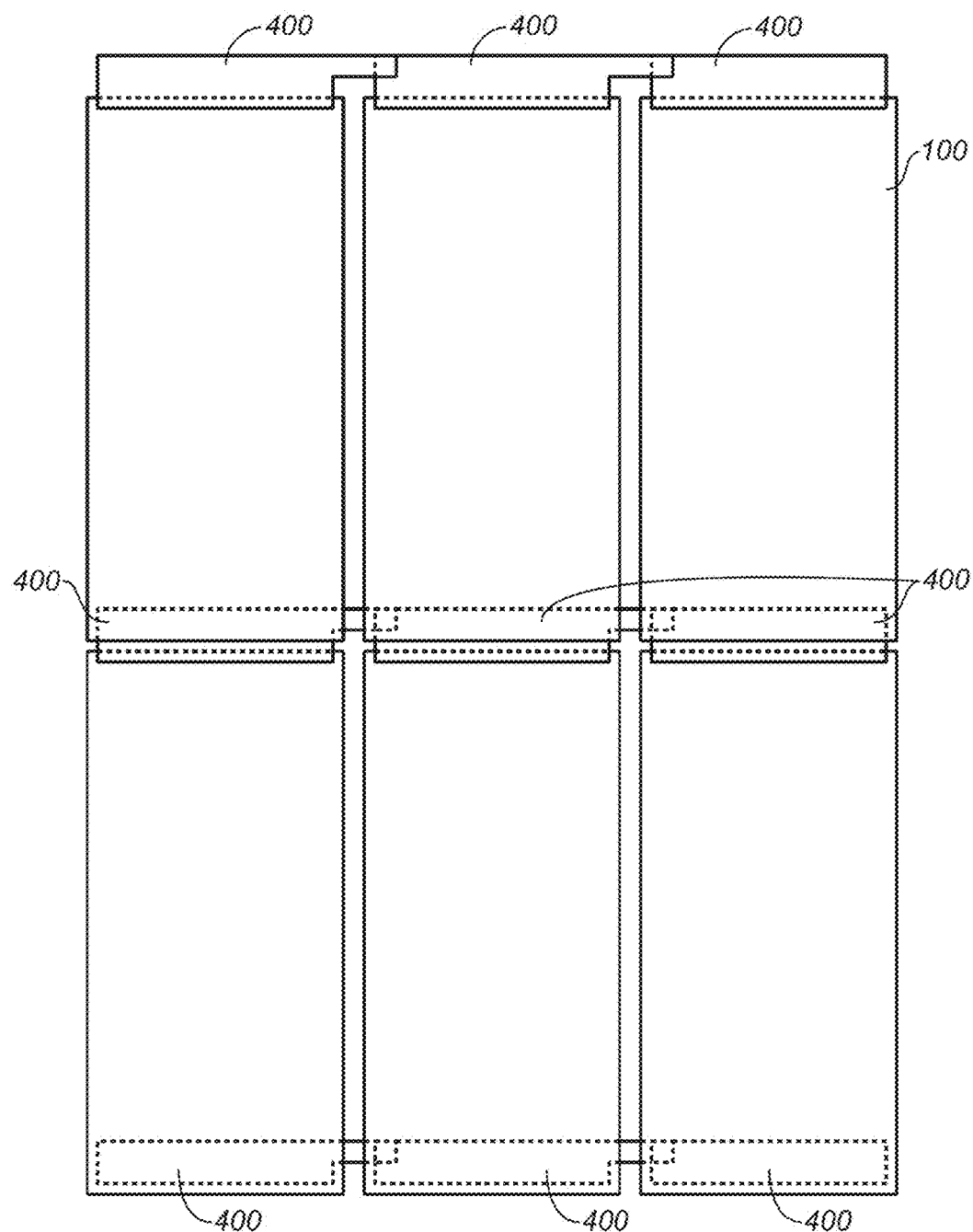
FIG. 6 shows an example arrangement of three rows of super cells interconnected with flexible electrical interconnects to put the super cells within each row in series with each other, and to put the rows in parallel with each other. These may be three rows in the solar module of FIG. 5D, for example.

FIG. 6 shows in more detail than FIGS. 5C-5G an example arrangement of three rows of super cells interconnected with flexible electrical interconnects to put the super cells within each row in series with each other, and to put the rows in parallel with each other. These may be three rows in the solar module of FIG. 5D, for example. In the example of FIG. 6, each super cell 100 has a flexible interconnect 400 conductively bonded to its front surface terminal contact, and another flexible interconnect conductively bonded to its rear surface terminal contact. The two super cells within each row are electrically connected in series by a shared flexible interconnect conductively bonded to the front surface terminal contact of one super cell and to the rear surface terminal contact of the other super cell. Each flexible interconnect is positioned adjacent to and runs parallel to an end of a super cell to which it is bonded, and may extend laterally beyond the super cell to be conductively bonded to a flexible interconnect on a super cell in an adjacent row, electrically connecting the adjacent rows in parallel. Dotted lines in FIG. 6 depict portions of the flexible interconnects that are hidden from view by overlying portions of the super cells, or portions of the super cells that are hidden from view by overlying portions of the flexible interconnects.

Flexible interconnects 400 may be conductively bonded to the super cells with, for example, a mechanically compliant electrically conductive bonding material as described above for use in bonding overlapped solar cells. Optionally, the electrically conductive bonding material may be located only at discrete positions along the edges of the super cell rather than in a continuous line extending substantially the length of the edge of the super cell, to reduce or accommodate stress parallel to the edges of the super cell arising from mismatch between the coefficient of thermal expansion of the electrically conductive bonding material or the interconnects and that of the super cell.

Flexible interconnects 400 may be formed from or comprise thin copper sheets, for example. Flexible interconnects 400 may be optionally patterned or otherwise configured to increase their mechanical compliance (flexibility) both perpendicular to and parallel to the edges of the super cells to reduce or accommodate stress perpendicular and parallel to the edges of the super cells arising from mismatch between the CTE of the interconnect and that of the super cells. Such patterning may include, for example, slits, slots, or holes. Conductive portions of interconnects 400 may have a thickness of, for example, less than about 100 microns, less than about 50 microns, less than about 30 microns, or less than about 25 microns to increase the flexibility of the interconnects. The mechanical compliance of the flexible interconnect, and its bonds to the super cells, should be sufficient for the interconnected super cells to survive stress arising from CTE mismatch during the lamination process described in more detail below with respect to methods of manufacturing shingled solar cell modules, and to survive stress arising from CTE mismatch during temperature cycling testing between about −40° C. and about 85° C.

Preferably, flexible interconnects 400 exhibit a resistance to current flow parallel to the ends of the super cells to which they are bonded of less than or equal to about 0.015 Ohms, less than or equal to about 0.012 Ohms, or less than or equal to about 0.01 Ohms.

Figure 7A:
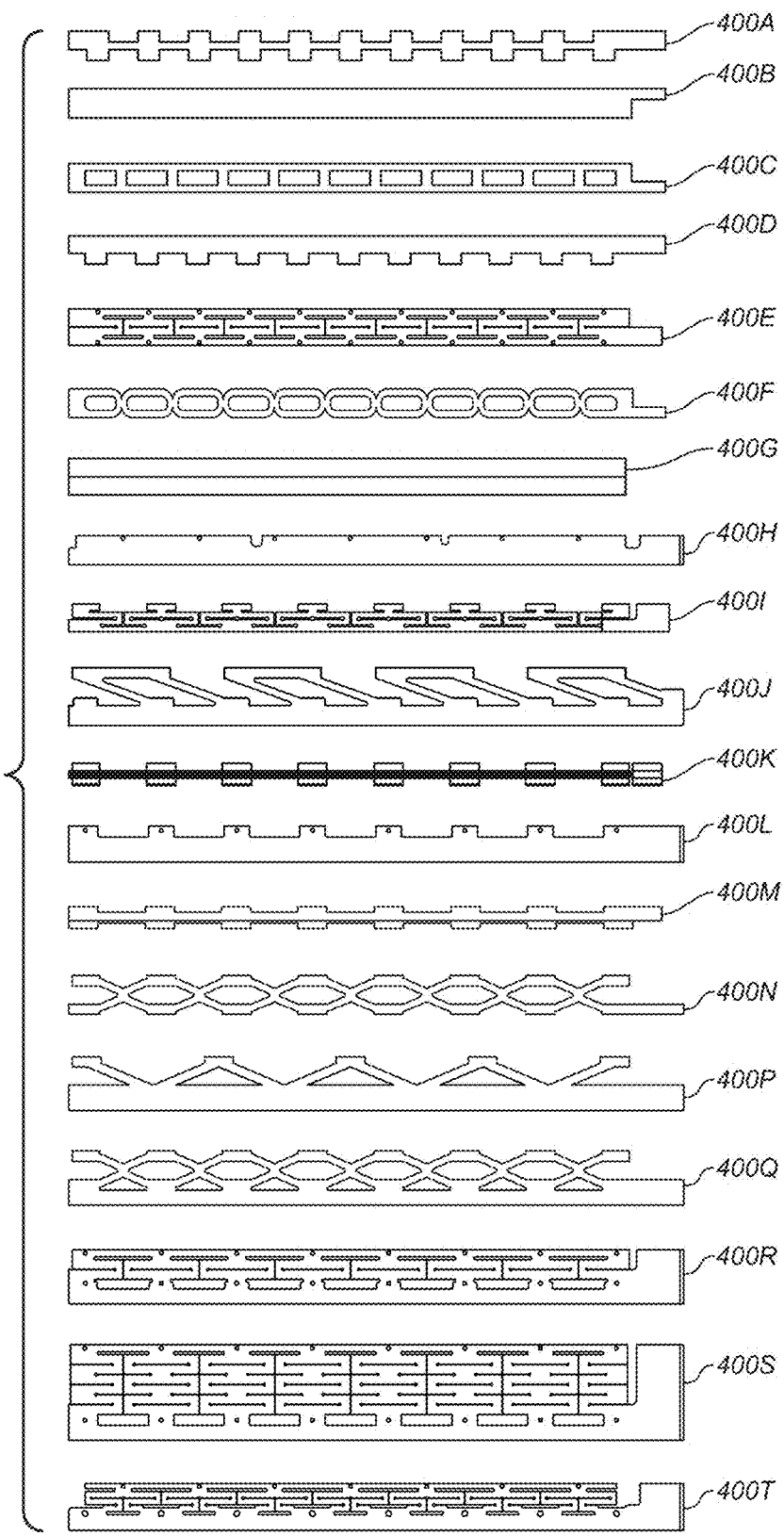
FIG. 7A shows example flexible interconnects that may be used to interconnect super cells in series or in parallel. Some of the examples exhibit patterning that increase their flexibility (mechanical compliance) along their long axes, along their short axes, or along their long axes and their short axes.

FIG. 7A shows several example configurations, designated by reference numerals 400A-400T, that may be suitable for flexible interconnect 400.

As shown in the cross-sectional views of FIGS. 8A-8C, for example, the solar modules described in this specification typically comprise a laminate structure with super cells and one or more encapsulant materials 4101 sandwiched between a transparent front sheet 420 and a back sheet 430. The transparent front sheet may be glass, for example. Optionally, the back sheet may also be transparent, which may allow bifacial operation of the solar module. The back sheet may be a polymer sheet, for example. Alternatively, the solar module may be a glass-glass module with both the front and back sheets glass.

The cross-sectional view of FIG. 8A (detail A from FIG. 5D) shows an example of a flexible interconnect 400 conductively bonded to a rear surface terminal contact of a super cell near the edge of the solar module and extending inward beneath the super cell, hidden from view from the front of the solar module. An extra strip of encapsulant may be disposed between interconnect 400 and the rear surface of the super cell, as illustrated.

The cross-sectional view of FIG. 8B (Detail B from FIG. 5B) shows an example of a flexible interconnect 400 conductively bonded to a front surface terminal contact of a super cell.

The cross-sectional view of FIG. 8C (Detail C from FIG. 5B) shows an example of a shared flexible interconnect 400 conductively bonded to the front surface terminal contact of one super cell and to the rear surface terminal contact of the other super cell to electrically connect the two super cells in series.

Flexible interconnects electrically connected to the front surface terminal contact of a super cell may be configured or arranged to occupy only a narrow width of the front surface of the solar module, which may for example be located adjacent an edge of the solar module. The region of the front surface of the module occupied by such interconnects may have a narrow width perpendicular to the edge of the super cell of, for example, ≤about 10 mm, ≤about 5 mm, or ≤about 3 mm. In the arrangement shown in FIG. 8B, for example, flexible interconnect 400 may be configured to extend beyond the end of the super cell by no more than such a distance. FIGS. 8D-8G show additional examples of arrangements by which a flexible interconnect electrically connected to a front surface terminal contact of a super cell may occupy only a narrow width of the front surface of the module. Such arrangements facilitate efficient use of the front surface area of the module to produce electricity.

FIG. 8D shows a flexible interconnect 400 that is conductively bonded to a terminal front surface contact of a super cell and folded around the edge of the super cell to the rear of the super cell. An insulating film 435, which may be pre-coated on flexible interconnect 400, may be disposed between flexible interconnect 400 and the rear surface of the super cell.

FIG. 8E shows a flexible interconnect 400 comprising a thin narrow ribbon 440 that is conductively bonded to a terminal front surface contact of a super cell and also to a thin wide ribbon 445 that extends behind the rear surface of the super cell. An insulating film 435, which may be pre-coated on ribbon 445, may be disposed between ribbon 445 and the rear surface of the super cell.

Figure 8F:
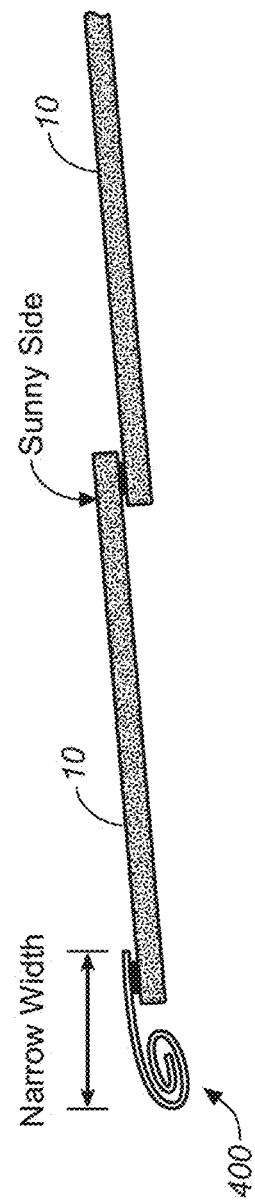

FIG. 8F shows a flexible interconnect 400 bonded to a terminal front surface contact of a super cell and rolled and pressed into a flattened coil that occupies only a narrow width of the solar module front surface.

Figure 8G:
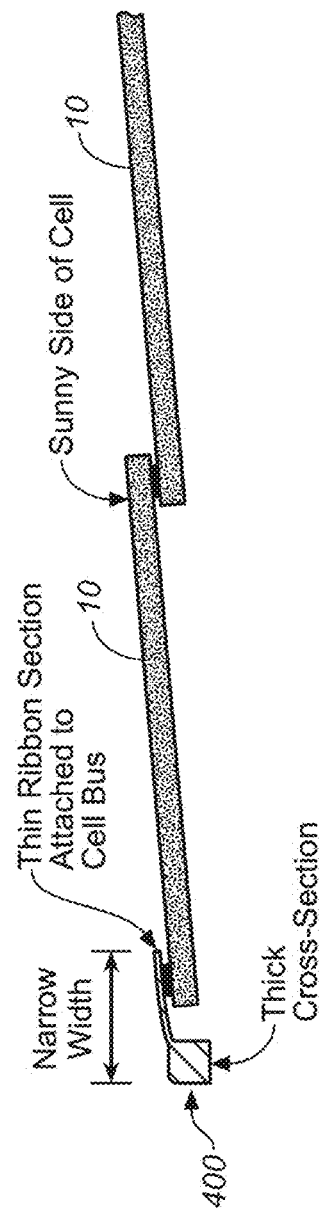

FIG. 8G shows a flexible interconnect 400 comprising a thin ribbon section that is conductively bonded to a terminal front surface contact of a super cell and a thick cross-section portion located adjacent to the super cell.

In FIGS. 8A-8G, flexible interconnects 400 may extend along the full lengths of the edges of the super cells (e.g., into the drawing page) as shown in FIG. 6 for example.

Optionally, portions of a flexible interconnect 400 that are otherwise visible from the front of the module may be covered by a dark film or coating or otherwise colored to reduce visible contrast between the interconnect and the super cell, as perceived by a human having normal color vision. For example, in FIG. 8C optional black film or coating 425 covers portions of the interconnect 400 that would otherwise be visible from the front of the module. Otherwise visible portions of interconnect 400 shown in the other figures may be similarly covered or colored.

Conventional solar modules typically include three or more bypass diodes, with each bypass diode connected in parallel with a series connected group of 18-24 silicon solar cells. This is done to limit the amount of power that may be dissipated as heat in a reverse biased solar cell. A solar cell may become reverse biased, for example, because of a defect, a dirty front surface, or uneven illumination that reduces its ability to pass current generated in the string. Heat generated in a solar cell in reverse bias depends on the voltage across the solar cell and the current through the solar cell. If the voltage across the reverse biased solar cell exceeds the breakdown voltage of the solar cell, the heat dissipated in the cell will be equal to the breakdown voltage times the full current generated in the string. Silicon solar cells typically have a breakdown voltage of 16-30 Volts. Because each silicon solar cell produces a voltage of about 0.64 Volts in operation, a string of more than 24 solar cells could produce a voltage across a reverse biased solar cell exceeding the breakdown voltage.

In conventional solar modules in which the solar cells are spaced apart from each other and interconnected with ribbons, heat is not readily transported away from a hot solar cell. Consequently, the power dissipated in a solar cell at breakdown voltage could produce a hot spot in the solar cell that causes significant thermal damage and perhaps a fire. In conventional solar modules a bypass diode is therefore required for every group of 18-24 series connected solar cells to insure that no solar cell in the string can be reverse biased above the breakdown voltage.

Applicants have discovered that heat is readily transported along a silicon super cell through the thin electrically and thermally conductive bonds between adjacent overlapping silicon solar cells. Further, the current through a super cell in the solar modules described herein is typically less than that through a string of conventional solar cells, because the super cells described herein are typically formed by shingling rectangular solar cells each of which has an active area less than (for example, ⅙) that of a conventional solar cell. Furthermore, the rectangular aspect ratio of the solar cells typically employed herein provides extended regions of thermal contact between adjacent solar cells. As a consequence, less heat is dissipated in a solar cell reverse biased at the breakdown voltage, and the heat readily spreads through the super cell and the solar module without creating a dangerous hot spot. Applicants have therefore recognized that solar modules formed from super cells as described herein may employ far fewer bypass diodes than conventionally believed to be required.

For example, in some variations of solar modules as described herein a super cell comprising $N>25$ solar cells, $N \geq$ about 30 solar cells, $N \geq$ about 50 solar cells, $N \geq$ about 70 solar cells, or $N \geq$ about 100 solar cells may be employed with no single solar cell or group of $<N$ solar cells in the super cell individually electrically connected in parallel with a bypass diode. Optionally, a full super cell of these lengths may be electrically connected in parallel with a single bypass diode. Optionally, super cells of these lengths may be employed without a bypass diode.

Several additional and optional design features may make solar modules employing super cells as described herein even more tolerant to heat dissipated in a reverse biased solar cell. Referring again to FIGS. 8A-8C, encapsulant 4101 may be or comprise a thermoplastic olefin (TPO) polymer, TPO encapsulants are more photo-thermal stable than standard ethylene-vinyl acetate (EVA) encapsulants. EVA will brown with temperature and ultraviolet light and lead to hot spot issues created by current limiting cells. These problems are reduced or avoided with TPO encapsulant. Further, the solar modules may have a glass-glass structure in which both the transparent front sheet 420 and the back sheet 430 are glass. Such a glass-glass enables the solar module to safely operate at temperatures greater than those tolerated by a conventional polymer back sheet. Further still, junction boxes may be mounted on one or more edges of a solar module, rather than behind the solar module where a junction box would add an additional layer of thermal insulation to the solar cells in the module above it.

Figure 9A:
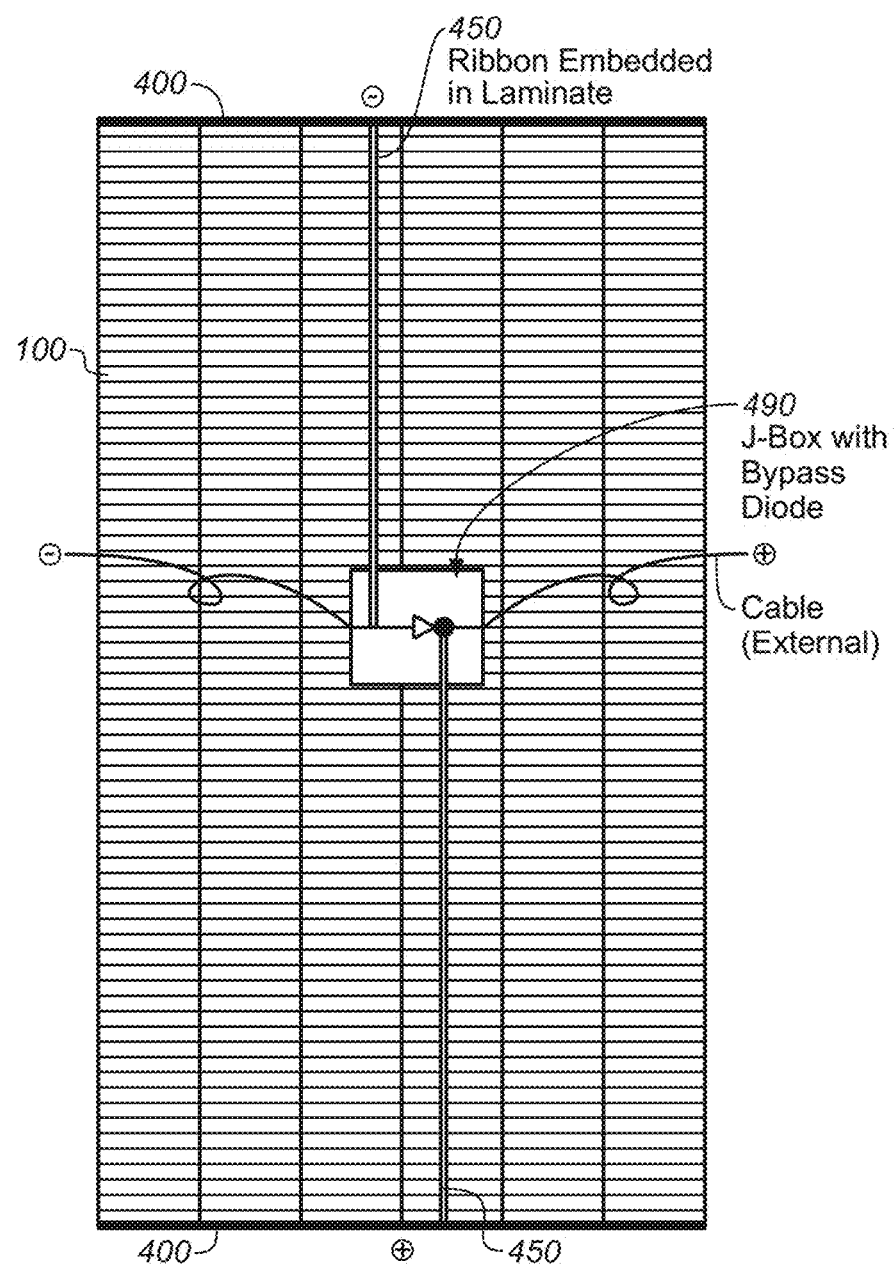
FIG. 9A shows a diagram of another example rectangular solar module comprising six rectangular shingled super cells, with the long side of each super cell having a length of approximately the length of the long side of the module. The super cells are arranged in six rows that are electrically connected in parallel with each other and in parallel with a bypass diode disposed in a junction box on the rear surface of the solar module. Electrical connections between the super cells and the bypass diode are made through ribbons embedded in the laminate structure of the module.

FIG. 9A shows an example rectangular solar module comprising six rectangular shingled super cells arranged in six rows extending the length of the long sides of the solar module. The six super cells are electrically connected in parallel with each other and with a bypass diode disposed in a junction box 490 on the rear surface of the solar module. Electrical connections between the super cells and the bypass diode are made through ribbons 450 embedded in the laminate structure of the module.

Figure 9B:
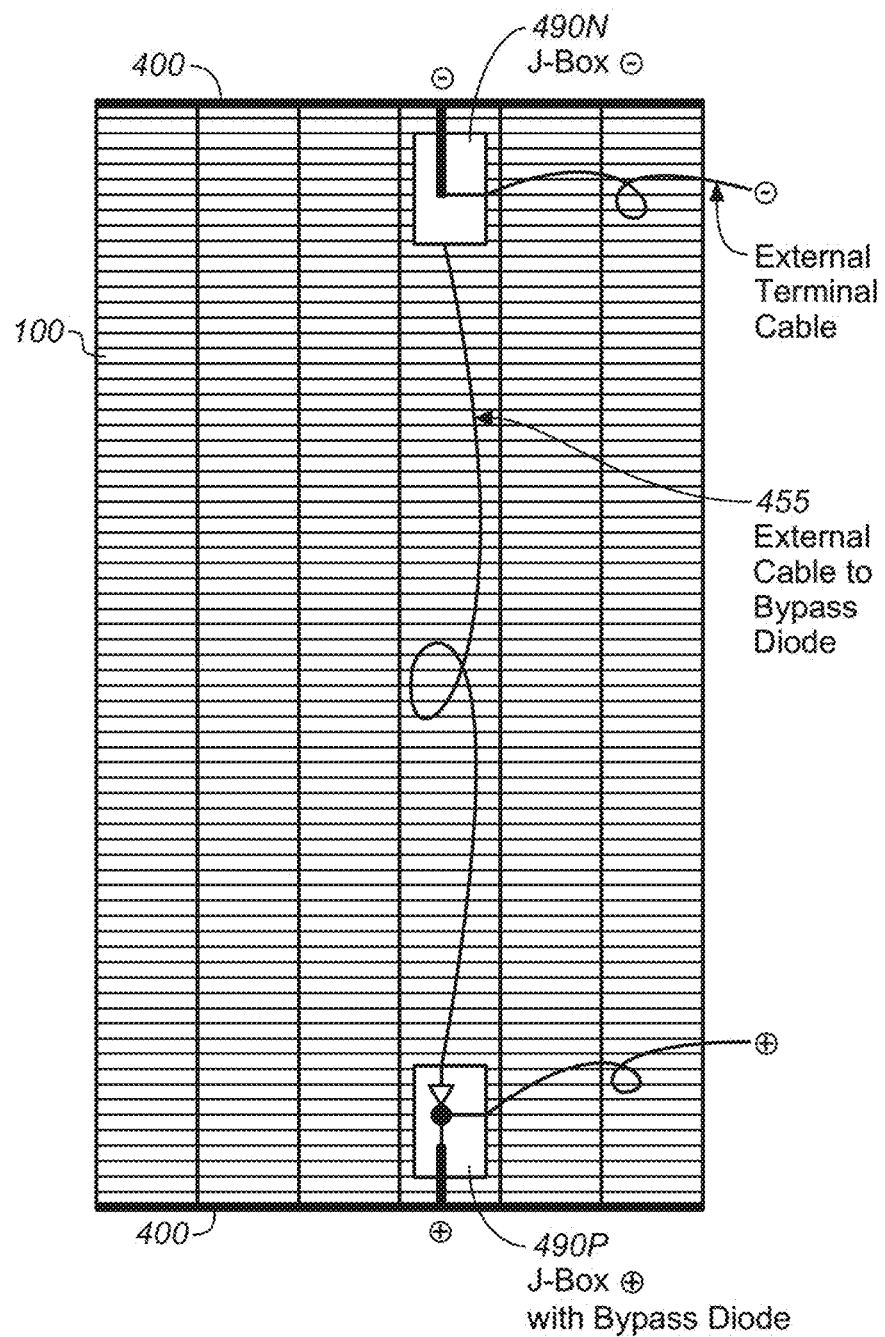
FIG. 9B shows a diagram of another example rectangular solar module comprising six rectangular shingled super cells, with the long side of each super cell having a length of approximately the length of the long side of the module. The super cells are arranged in six rows that are electrically connected in parallel with each other and in parallel with a bypass diode disposed in a junction box on the rear surface and near an edge of the solar module. A second junction box is located on the rear surface near an opposite edge of the solar module. Electrical connection between the super cells and the bypass diode are made through an external cable between the junction boxes.

FIG. 9B shows another example rectangular solar module comprising six rectangular shingled super cells arranged in six rows extending the length of the long sides of the solar module. The super cells are electrically connected in parallel with each other. Separate positive 490P and negative 490N terminal junction boxes are disposed on the rear surface of the solar module at opposite ends of the solar module. The super cells are electrically connected in parallel with a bypass diode located in one of the junction boxes by an external cable 455 running between the junction boxes.

Figures 9C, 9D:
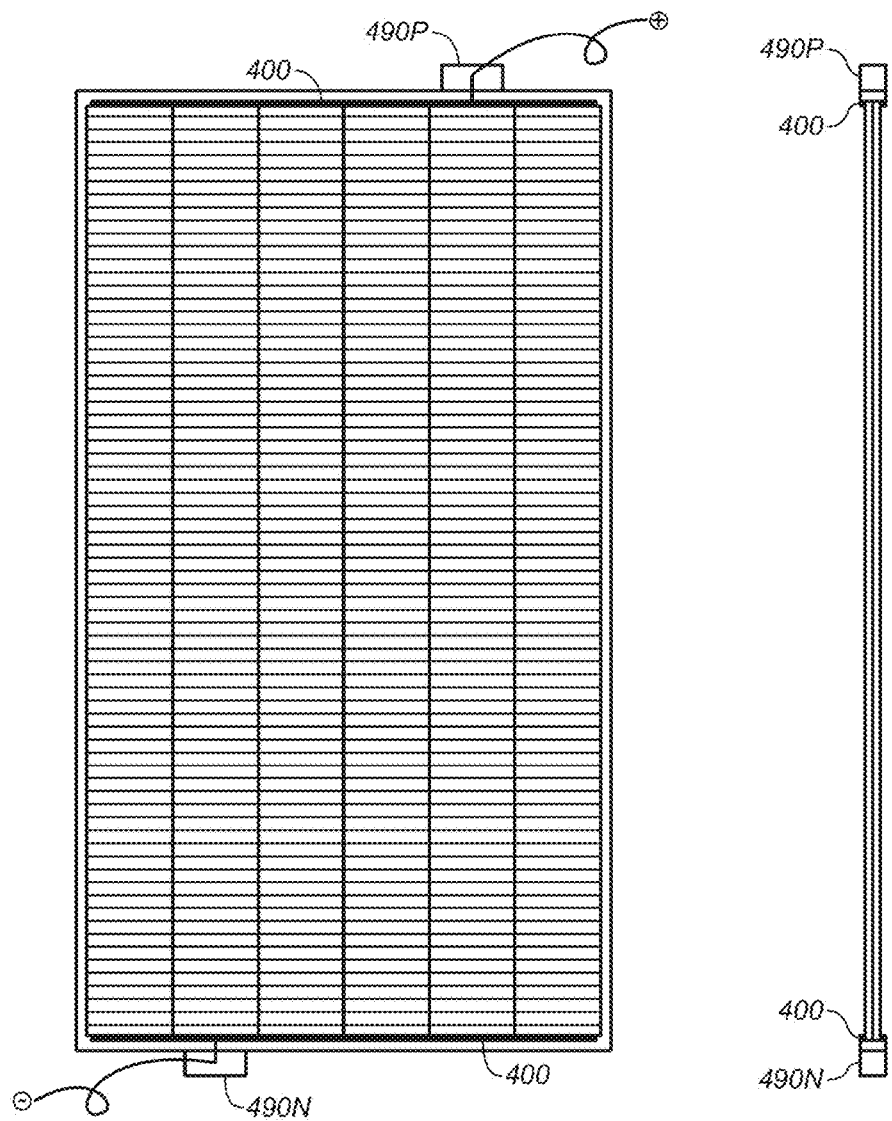
FIG. 9C shows an example glass-glass rectangular solar module comprising six rectangular shingled super cells, with the long side of each super cell having a length of approximately the length of the long side of the module. The super cells are arranged in six rows that are electrically connected in parallel with each other. Two junction boxes are mounted on opposite edges of the module, maximizing the active area of the module.
FIG. 9D shows a side view of the solar module illustrated in FIG. 9C.

FIGS. 9C-9D show an example glass-glass rectangular solar module comprising six rectangular shingled super cells arranged in six rows extending the length of the long sides of the solar module in a lamination structure comprising glass front and back sheets. The super cells are electrically connected in parallel with each other. Separate positive 490P and negative 490N terminal junction boxes are mounted on opposite edges of the solar module.

Shingled super cells open up unique opportunities for module layout with respect to module level power management devices (for example, DC/AC micro-inverters, DC/DC module power optimizers, voltage intelligence and smart switches, and related devices). The key feature of module level power management systems is power optimization. Super cells as described and employed herein may produce higher voltages than traditional panels. In addition, super cell module layout may further partition the module. Both higher voltages and increased partitioning create potential advantages for power optimization.

Figure 9E:
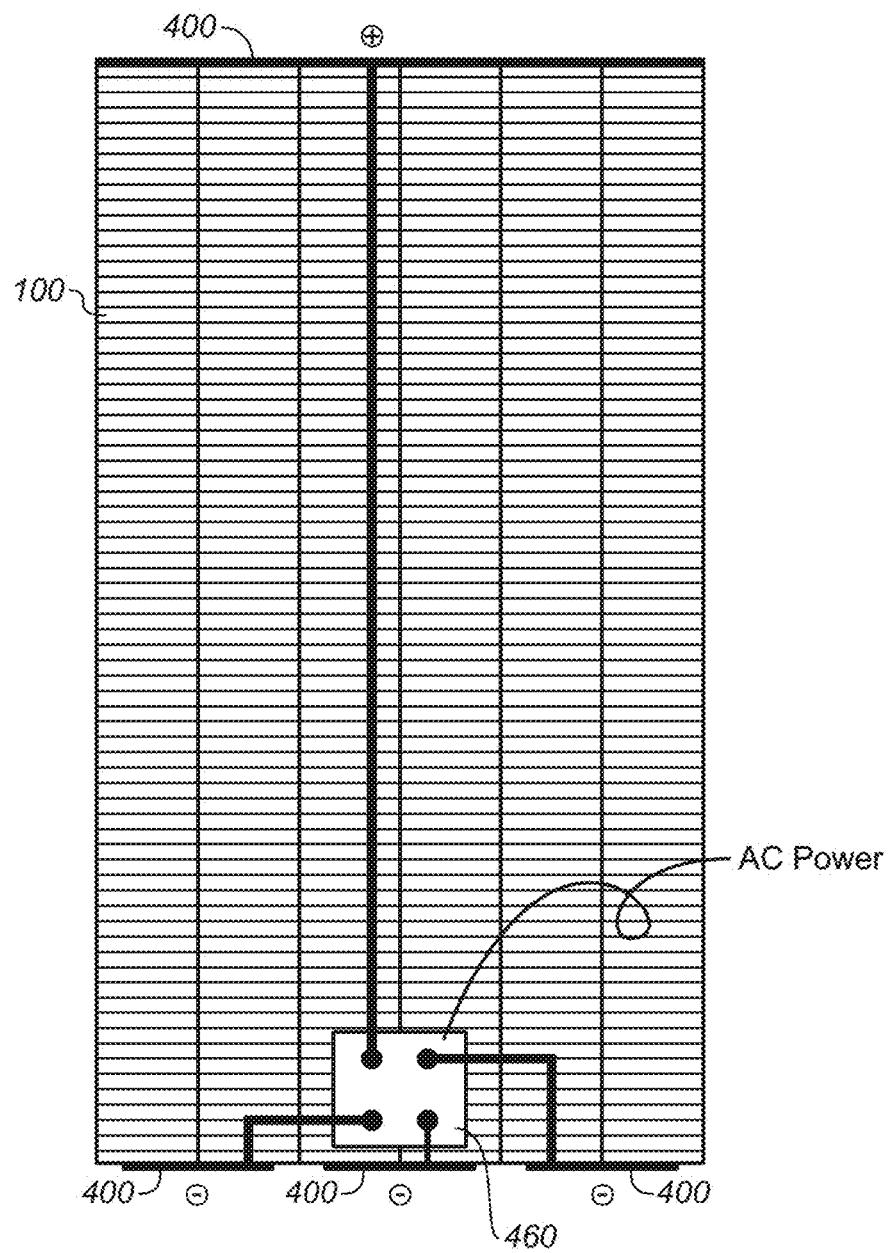
FIG. 9E shows another example solar module comprising six rectangular shingled super cells, with the long side of each super cell having a length of approximately the length of the long side of the module. The super cells are arranged in six rows, with three pairs of rows individually connected to a power management device on the solar module.

FIG. 9E shows one example architecture for module level power management using shingled super cells. In this figure an example rectangular solar module comprises six rectangular shingled super cells arranged in six rows extending the length of the long sides of the solar module. Three pairs of super cells are individually connected to a power management system 460, enabling more discrete power optimization of the module.

Figure 9F:
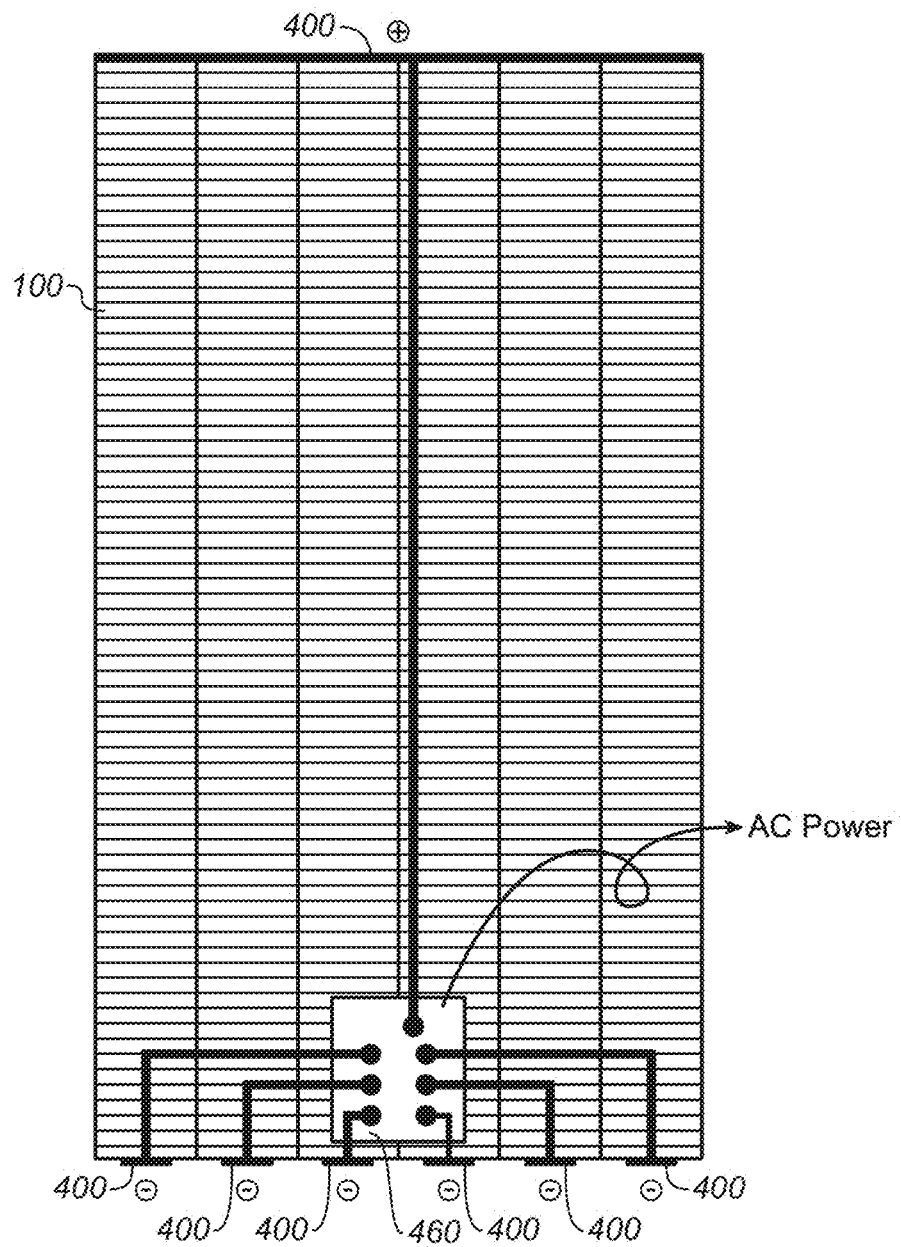
FIG. 9F shows another example solar module comprising six rectangular shingled super cells, with the long side of each super cell having a length of approximately the length of the long side of the module. The super cells are arranged in six rows, with each row individually connected to a power management device on the solar module.

FIG. 9F shows another example architecture for module level power management using shingled super cells. In this figure an example rectangular solar module comprises six rectangular shingled super cells arranged in six rows extending the length of the long sides of the solar module. The six super cells are individually connected to a power management system 460, enabling yet more discrete power optimization of the module.

Figure 9G:
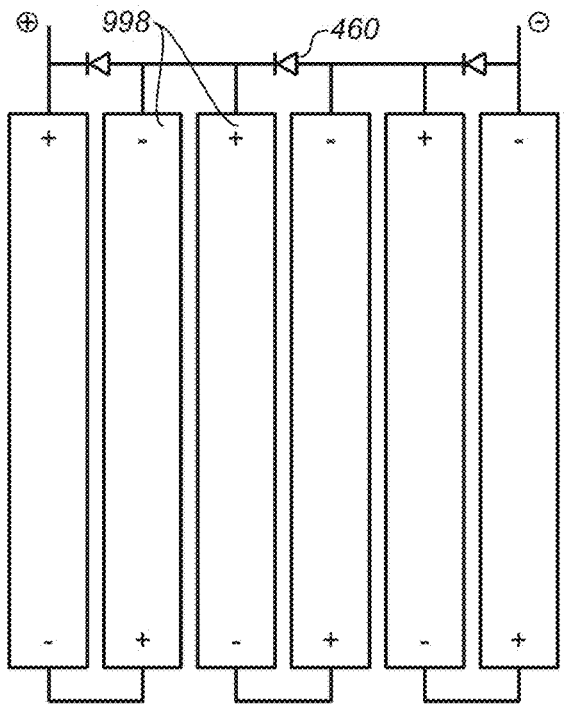
FIGS. 9G and 9H show other embodiments of architectures for module level power management using shingled super cells.

FIG. 9G shows another example architecture for module level power management using shingled super cells. In this figure an example rectangular solar module comprises six or more rectangular shingled super cells 998 arranged in six or more rows, where the three or more super cells pairs are individually connected to a bypass diode or a power management system 460, to allow yet more discrete power optimization of the module.

Figure 9H:
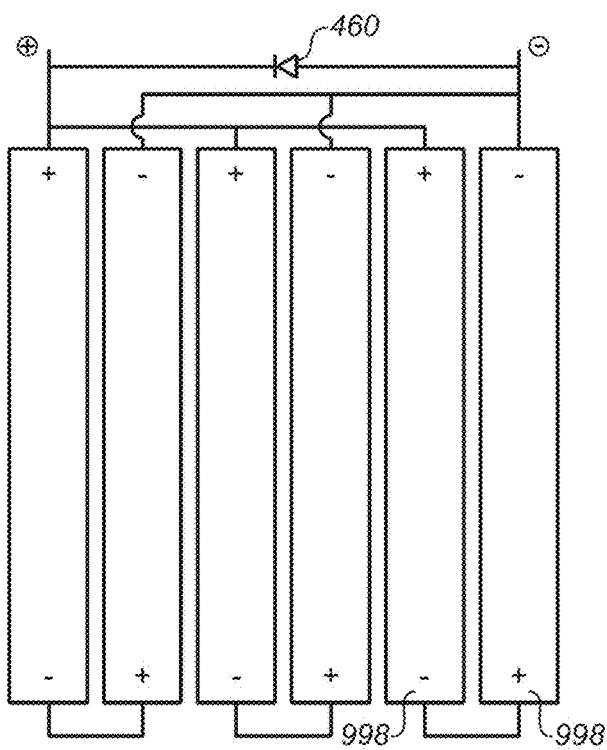

FIG. 9H shows another example architecture for module level power management using shingled super cells. In this figure an example rectangular solar module comprises six or more rectangular shingled super cells 998 arranged in six or more rows, where each two super cell are connected in series, and all pairs are connected in parallel. A bypass diode or power management system 460 is connected in parallel to all pairs, permitting power optimization of the module.

In some variations, module level power management allows elimination of all bypass diodes on the solar module while still excluding the risk of hot spots. This is accomplished by integrating voltage intelligence at the module level. By monitoring the voltage output of a solar cell circuit (e.g., one or more super cells) in the solar module, a "smart switch" power management device can determine if that circuit includes any solar cells in reverse bias. If a reverse biased solar cell is detected, the power management device can disconnect the corresponding circuit from the electrical system using, for example, a relay switch or other component. For example, if the voltage of a monitored solar cell circuit drops below a predetermined threshold ($V_{Limit}$), then the power management device will shut off (open circuit) that circuit while ensuring that the module or string of modules remain connected.

In certain embodiments, where a voltage of the circuits drops by more than a certain percentage or magnitude (e.g., 20% or 10V) from the other circuits in same solar array, it will be shut off. The electronics will detect this change based upon inter-module communication.

Implementation of such voltage intelligence may be incorporated into existing module level power management solutions (e.g., from Enphase Energy Inc., Solaredge Technologies, Inc., Tigo Energy, Inc.) or through a custom circuit design.

One example of how the $V_{Limit}$ threshold voltage may be calculated is:

$$CellVoc_{@Low\ Irr\ \&\ High\ Temp} \times N_{number\ of\ cells\ in\ series} - Vrb_{Reverse\ breakdown\ voltage} \leq V_{Limit},$$

where:
$CellVoc_{@Low\ Irr\ \&\ High\ Temp}$=open circuit voltage of a cell working at low irradiation and at high temperature (lowest expected working Voc);
$N_{number\ of\ cells\ in\ series}$=a number of cells connected in series in each super cell monitored.
$Vrb_{Reverse\ breakdown\ voltage}$=revered polarity voltage needed to pass current through a cell.

This approach to module level power management using a smart switch may allow, for example more than 100 silicon solar cells to be connected in series within a single module without affecting safety or module reliability. In addition, such a smart switch can be used to limit string voltage going to a central inverter. Longer module strings can therefore be installed without safety or permitting concerns regarding over voltage. The weakest module can be bypassed (switched off) if string voltages run up against the limit.

FIGS. 10A, 11A, 12A, 13A, 13B, and 14B described below provide additional example schematic electrical circuits for solar modules employing shingled super cells. FIGS. 10B-1, 10B-2, 11B-1, 11B-2, 11C-1, 11C-2, 12B-1, 12B-2, 12C-1, 12C-2, 12C-3, 13C-1, 13C-2, 14C-1, and 14C-2 provide example physical layouts corresponding to those schematic circuits. The description of the physical layouts assumes that the front surface end contact of each super cell is of negative polarity and the rear surface end contact of each super cell is of positive polarity. If instead the modules employ super cells having front surface end contacts of positive polarity and rear surface end contacts of negative polarity, then the discussion of the physical layouts below may be modified by swapping positive for negative and by reversing the orientation of the bypass diodes. Some of the various buses referred to in the description of these figures may be formed, for example, with interconnects 400 described above. Other buses described in these figures may be implemented, for example, with ribbons embedded in the laminate structure of solar module or with external cables.

FIG. 10A shows an example schematic electrical circuit for a solar module as illustrated in FIG. 5B, in which the solar module includes ten rectangular super cells 100 each of which has a length approximately equal to the length of the short sides of the solar module. The super cells are arranged in the solar module with their long sides oriented parallel to the short sides of the module. All of the super cells are electrically connected in parallel with a bypass diode 480.

Figures 2, 10B:
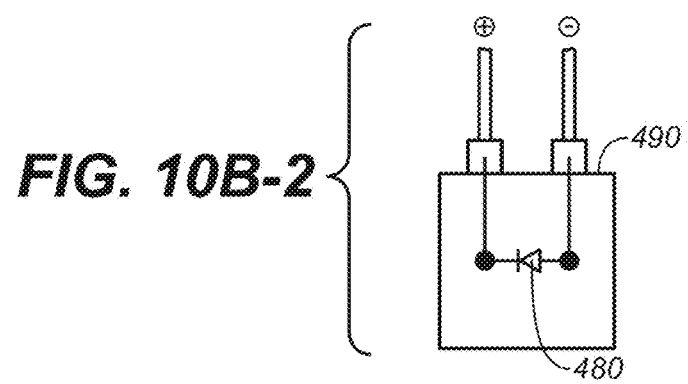

FIGS. 10B-1 and 10B-2 show an example physical layout for the solar module of FIG. 10A. Bus 485N connects the negative (front surface) end contacts of super cells 100 to the positive terminal of bypass diode 480 in junction box 490 located on the rear surface of the module. Bus 485P connects the positive (rear surface) end contacts of super cells 100 to the negative terminal of bypass diode 480. Bus 485P may lie entirely behind the super cells. Bus 485N and/or its interconnection to the super cells occupy a portion of the front surface of the module.

Figure 11A:
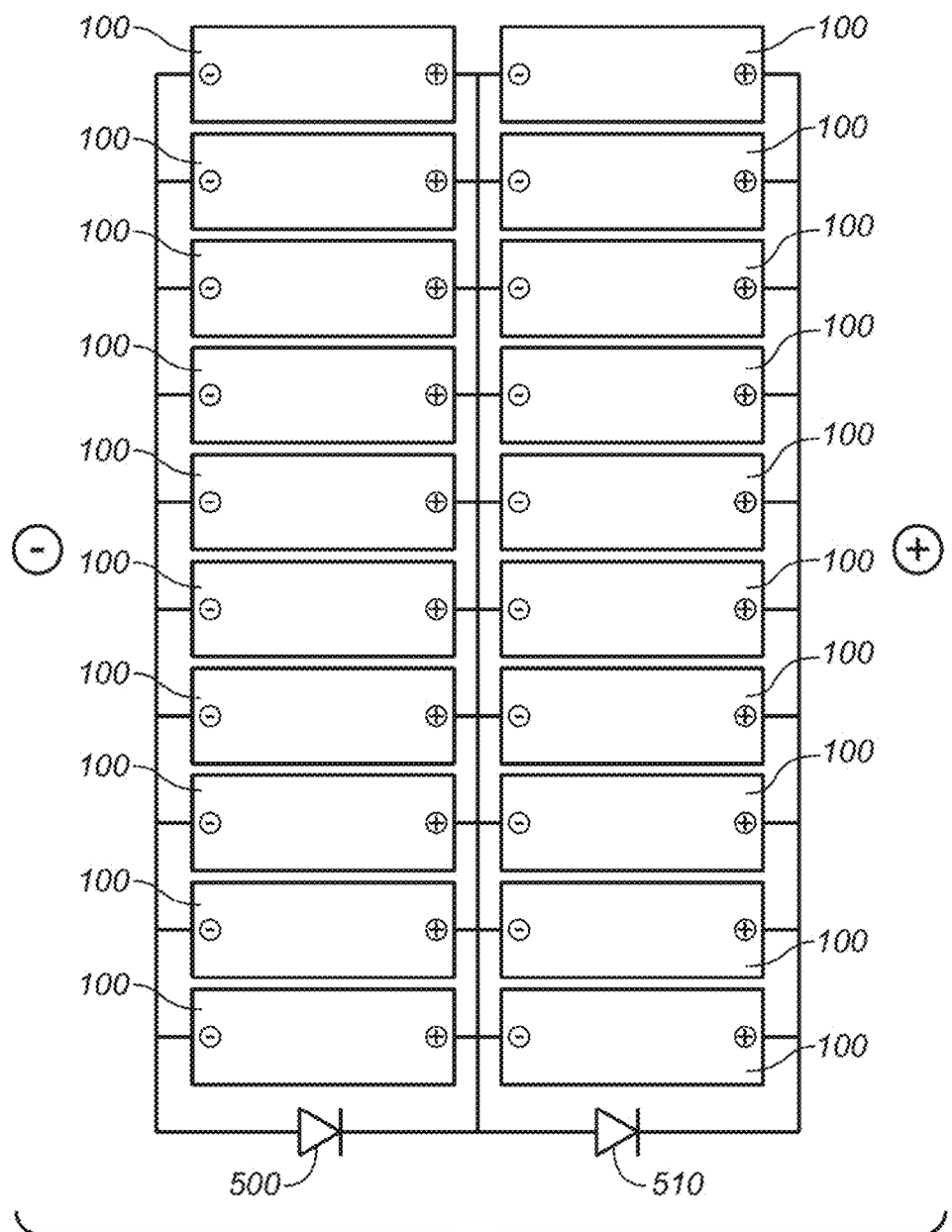
FIG. 11A shows an example schematic electrical circuit diagram for a solar module as illustrated in FIG. 5A.

FIG. 11A shows an example schematic electrical circuit for a solar module as illustrated in FIG. 5A, in which the solar module includes twenty rectangular super cells 100, each of which has a length approximately equal to one half the length of the short sides of the solar module, and the super cells are arranged end-to-end in pairs to form ten rows of super cells. The first super cell in each row is connected in parallel with the first super cells in the other rows and in parallel with a bypass diode 500. The second super cell in each row is connected in parallel with the second super cells in the other rows and in parallel with a bypass diode 510. The two groups of super cells are connected in series, as are the two bypass diodes.

Figures 1, 11B:
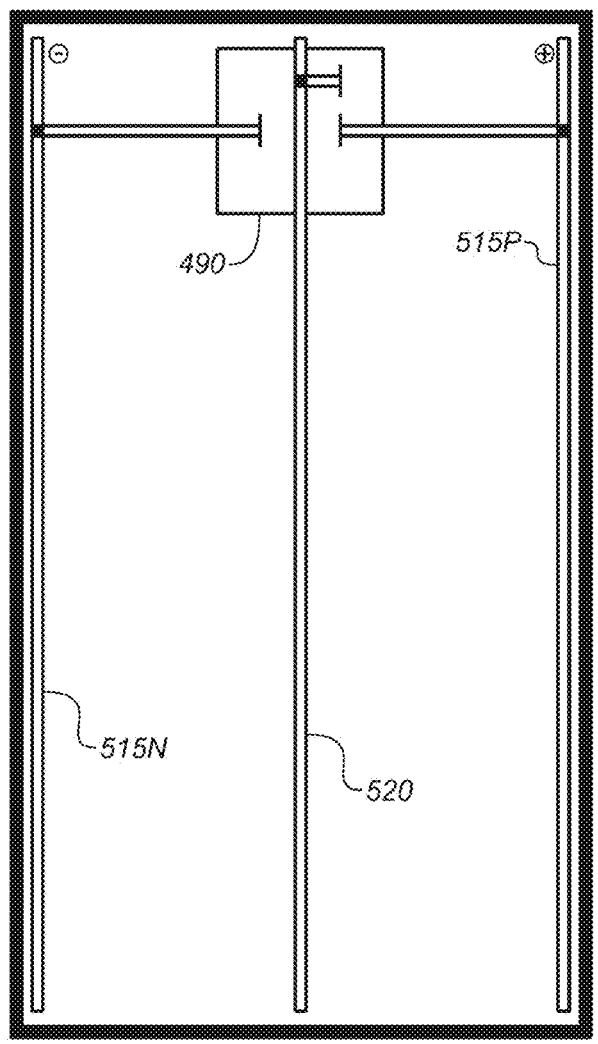
Figures 2, 11B:
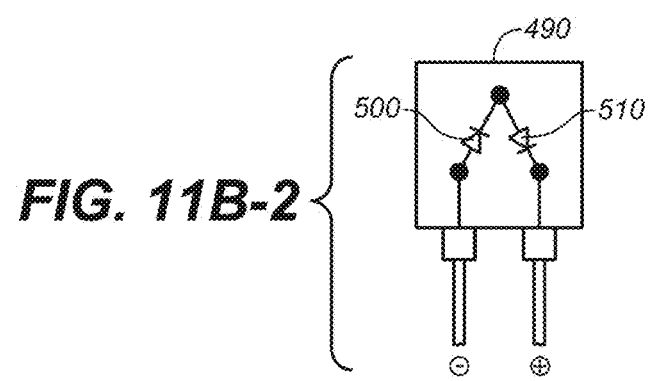
Figures 1, 11C:
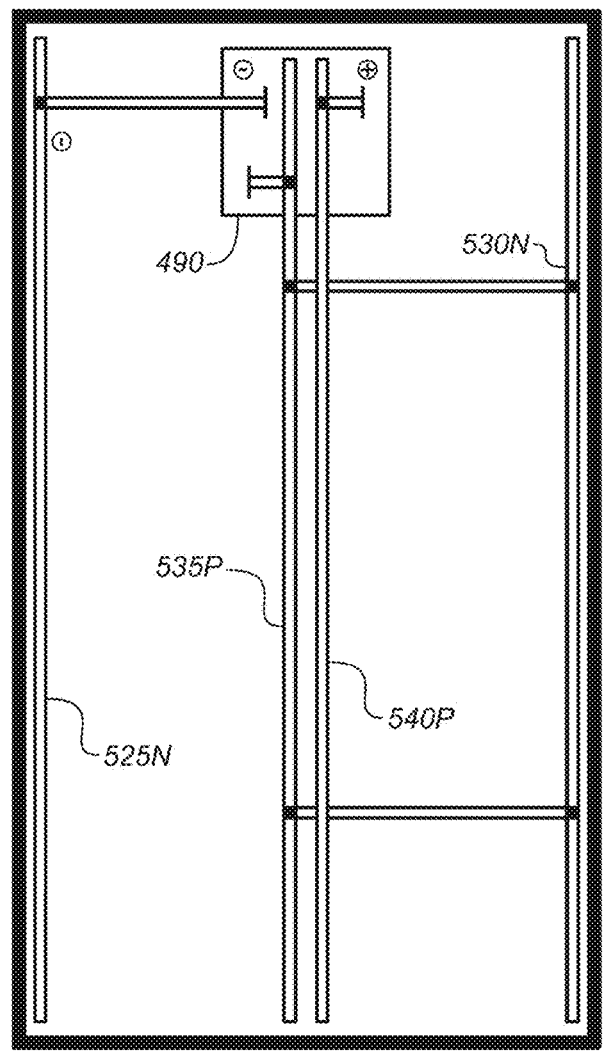
Figures 2, 11C:
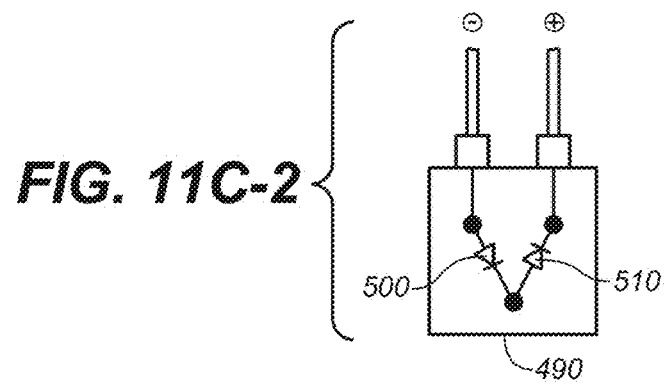

FIGS. 11B-1 and 11B-2 show an example physical layout for the solar module of FIG. 11A. In this layout the first super cell in each row has its front surface (negative) end contact along a first side of the module and its rear surface (positive) end contact along the center line of the module, and the second super cell in each row has its front surface (negative) end contact along the center line of the module and its rear surface (positive) end contact along a second side of the module opposite from the first side. Bus 515N connects the front surface (negative) end contact of the first super cell in each row to the positive terminal of bypass diode 500. Bus 515P connects the rear surface (positive) end contact of the second super cell in each row to the negative terminal of bypass diode 510. Bus 520 connects the rear surface (positive) end contact of the first super cell in each row and the front surface (negative) end contact of the second super cell in each row to the negative terminal of bypass diode 500 and to the positive terminal of bypass diode 510.

Bus 515P may lie entirely behind the super cells. Bus 515N and/or its interconnection to the super cells occupy a portion of the front surface of the module. Bus 520 may occupy a portion of the front surface of the module, requiring a gap 210 as shown in FIG. 5A. Alternatively, bus 520 may lie entirely behind the super cells and be electrically connected to the super cells with hidden interconnects sandwiched between overlapping ends of the super cells. In such a case little or no gap 210 is required.

FIGS. 11C-1, 11C-2, and 11C-3 show another example physical layout for the solar module of FIG. 11A. In this layout the first super cell in each row has its front surface (negative) end contact along a first side of the module and its rear surface (positive) end contact along the center line of the module, and the second super cell in each row has its rear surface (positive) end contact along the center line of the module and its front surface (negative) end contact along a second side of the module opposite from the first side. Bus 525N connects the front surface (negative) end contact of the first super cell in each row to the positive terminal of bypass diode 500. Bus 530N connects the front surface (negative) end contact of the second cell in each row to the negative terminal of bypass diode 500 and to the positive terminal of bypass diode 510. Bus 535P connects the rear surface (positive) end contact of the first cell in each row to the negative terminal of bypass diode 500 and to the positive terminal of bypass diode 510. Bus 540P connects the rear surface (positive) end contact of the second cell in each row to the negative terminal of bypass diode 510.

Bus 535P and bus 540P may lie entirely behind the super cells. Bus 525N and bus 530N and/or their interconnection to the super cells occupy a portion of the front surface of the module.

Figure 12A:
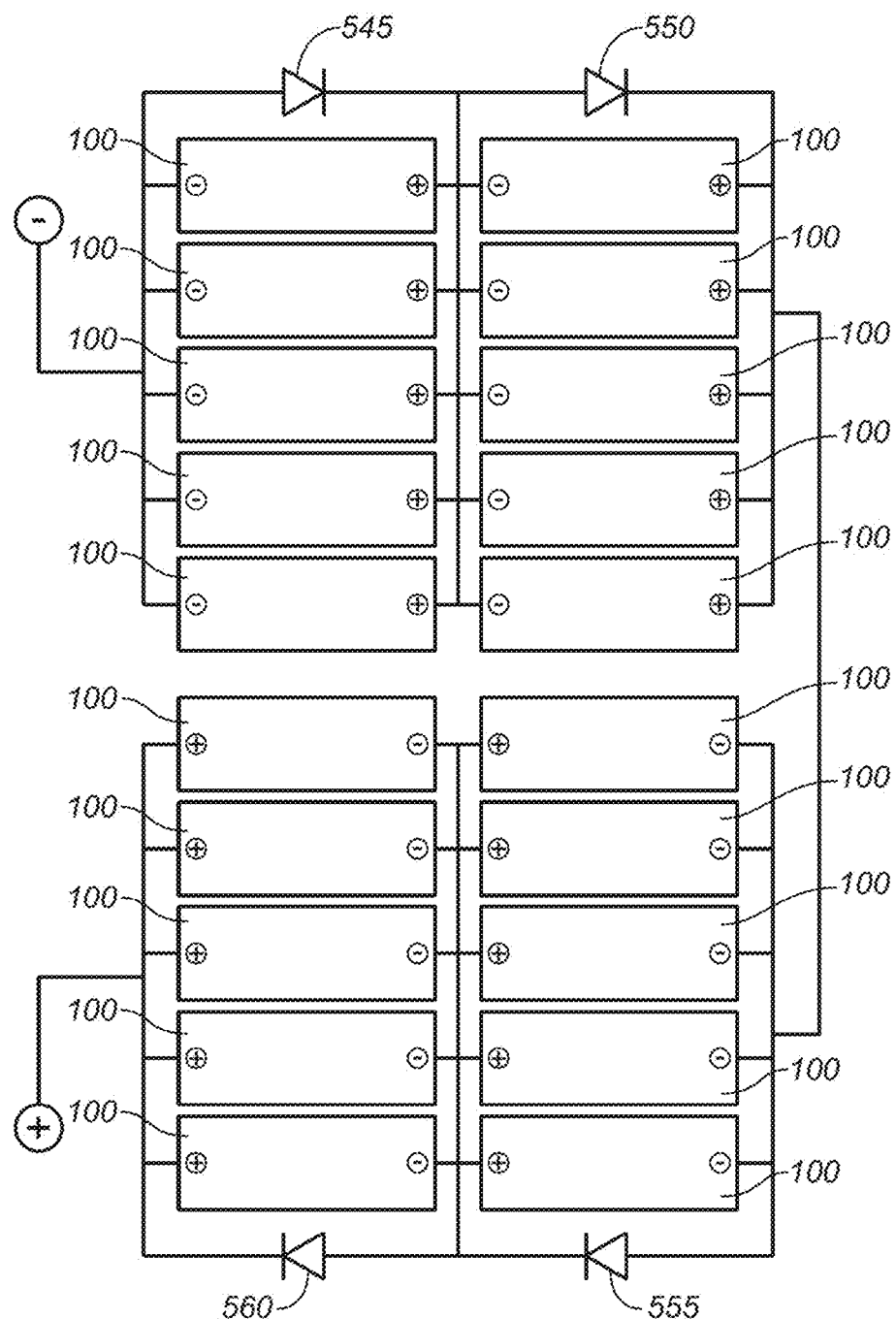
FIG. 12A shows another example schematic circuit diagram for a solar module as illustrated in FIG. 5A.

FIG. 12A shows another example schematic circuit diagram for a solar module as illustrated in FIG. 5A, in which the solar module includes twenty rectangular super cells 100, each of which has a length approximately equal to one half the length of the short sides of the solar module, and the super cells are arranged end-to-end in pairs to form ten rows of super cells. In the circuit shown in FIG. 12A, the super cells are arranged in four groups: in a first group the first super cells of the top five rows are connected in parallel with each other and with a bypass diode 545, in a second group the second super cells of the top five rows are connected in parallel with each other and with a bypass diode 505, in a third group the first super cells of the bottom five rows are connected in parallel with each other and with a bypass diode 560, and in a fourth group the second super cells of the bottom five rows are connected in parallel with each other and with a bypass diode 555. The four groups of super cells are connected in series with each other. The four bypass diodes are also in series.

Figures 1, 12B:
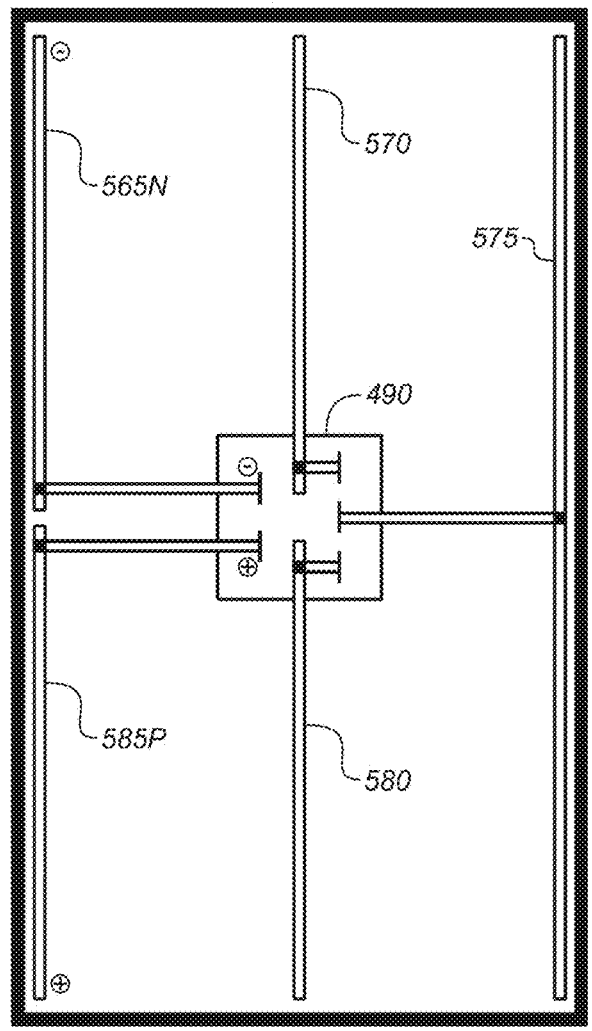
Figures 2, 12B:
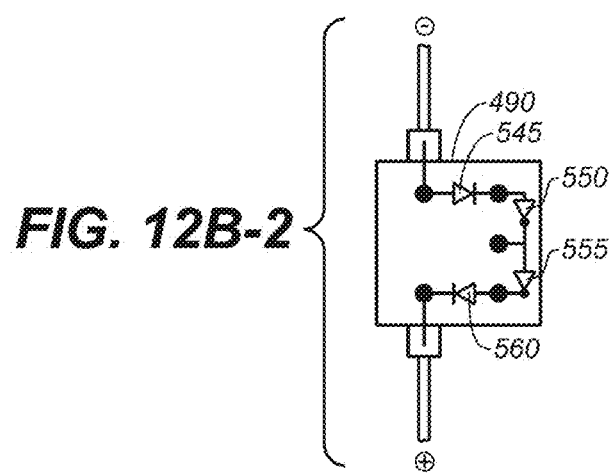
Figures 1, 12C:
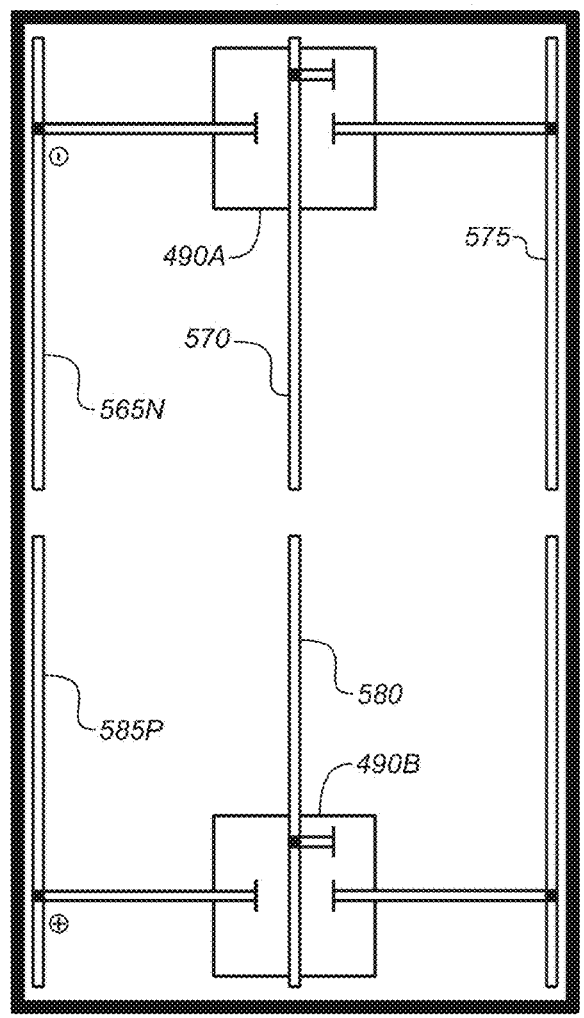
Figures 2, 12C:
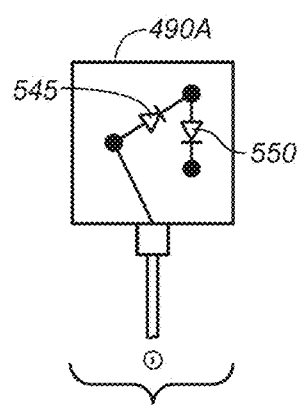

FIGS. 12B-1 and 12B-2 show an example physical layout for the solar module of FIG. 12A. In this layout the first group of super cells has its front surface (negative) end contacts along a first side of the module and its rear surface (positive) end contacts along the center line of the module, the second group of super cells has its front surface (negative) end contacts along the center line of the module and its rear surface (positive) end contacts along a second side of the module opposite from the first side, the third group of super cells has its rear surface (positive) end contacts along the first side of the module and its front surface (negative) end contacts along the center line of the module, and the fourth group of super cells has its rear surface (positive) end contact along the center line of the module and its front surface (negative) end contact along the second side of the module.

Bus 565N connects the front surface (negative) end contacts of the super cells in the first group of super cells to each other and to the positive terminal of bypass diode 545. Bus 570 connects the rear surface (positive) end contacts of the super cells in the first group of super cells and the front surface (negative) end contacts of the super cells in the second group of super cells to each other, to the negative terminal of bypass diode 545, and to the positive terminal of bypass diode 550. Bus 575 connects the rear surface (positive) end contacts of the super cells in the second group of super cells and the front surface (negative) end contacts of the super cells in the fourth group of super cells to each other, to the negative terminal of bypass diode 550, and to the positive terminal of bypass diode 555. Bus 580 connects the rear surface (positive) end contacts of the super cells in the fourth group of super cells and the front surface (negative) end contacts of the super cells in the third group of super cells to each other, to the negative terminal of bypass diode 555, and to the positive terminal of bypass diode 560. Bus 585P connects the rear surface (positive) end contacts of the super cells in the third group of super cells to each other and to the negative terminal of bypass diode 560.

Bus 585P and the portion of bus 575 connecting to the super cells of the second group of super cells may lie entirely behind the super cells. The remaining portion of bus 575 and bus 565N and/or their interconnection to the super cells occupy a portion of the front surface of the module.

Bus 570 and bus 580 may occupy a portion of the front surface of the module, requiring a gap 210 as shown in FIG. 5A. Alternatively, they may lie entirely behind the super cells and be electrically connected to the super cells with hidden interconnects sandwiched between overlapping ends of super cells. In such a case little or no gap 210 is required.

FIGS. 12C-1, 12C-2, and 12C-3 show an alternative physical layout for the solar module of FIG. 12A. This layout uses two junction boxes 490A and 490B in place of the single junction box 490 shown in FIGS. 12B-1 and 12B-2, but is otherwise equivalent to that of FIGS. 12B-1 and 12B-2.

Figure 13A:
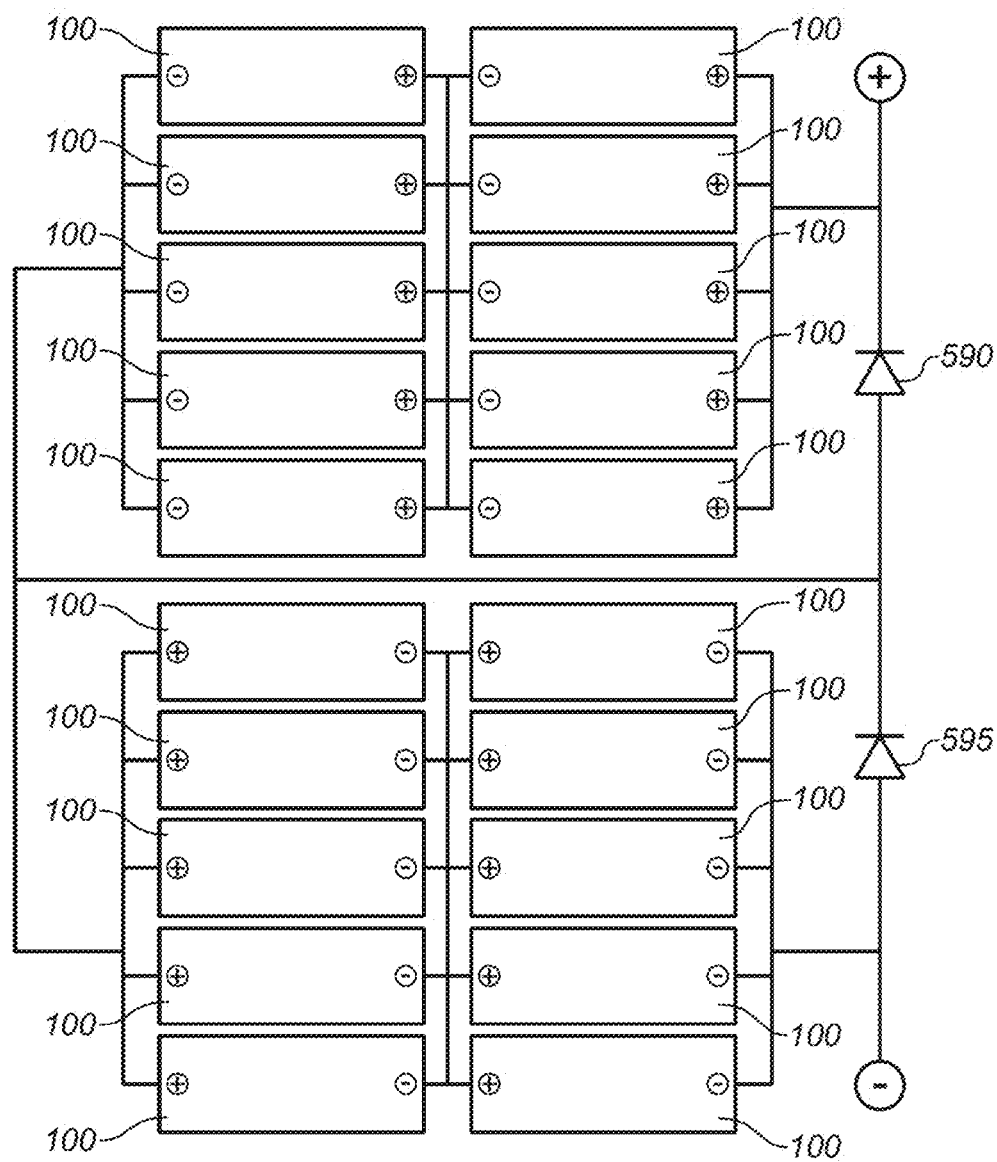
FIG. 13A shows another example schematic circuit diagram for a solar module as illustrated in FIG. 5A.

FIG. 13A shows another example schematic circuit diagram for a solar module as illustrated in FIG. 5A, in which the solar module includes twenty rectangular super cells 100, each of which has a length approximately equal to one half the length of the short sides of the solar module, and the super cells are arranged end-to-end in pairs to form ten rows of super cells. In the circuit shown in FIG. 13A, the super cells are arranged in four groups: in a first group the first super cells of the top five rows are connected in parallel with each other, in a second group the second super cells of the top five rows are connected in parallel with each other, in a third group the first super cells of the bottom five rows are connected in parallel with each other, and in a fourth group the second super cells of the bottom five rows are connected in parallel with each other. The first group and the second group are connected in series with each other and thus connected are in parallel with a bypass diode 590. The third group and the fourth group are connected in series with each other and thus connected in parallel with another bypass diode 595. The first and second groups are connected in series with the third and fourth groups, and the two bypass diodes are in series as well.

Figure 13B:
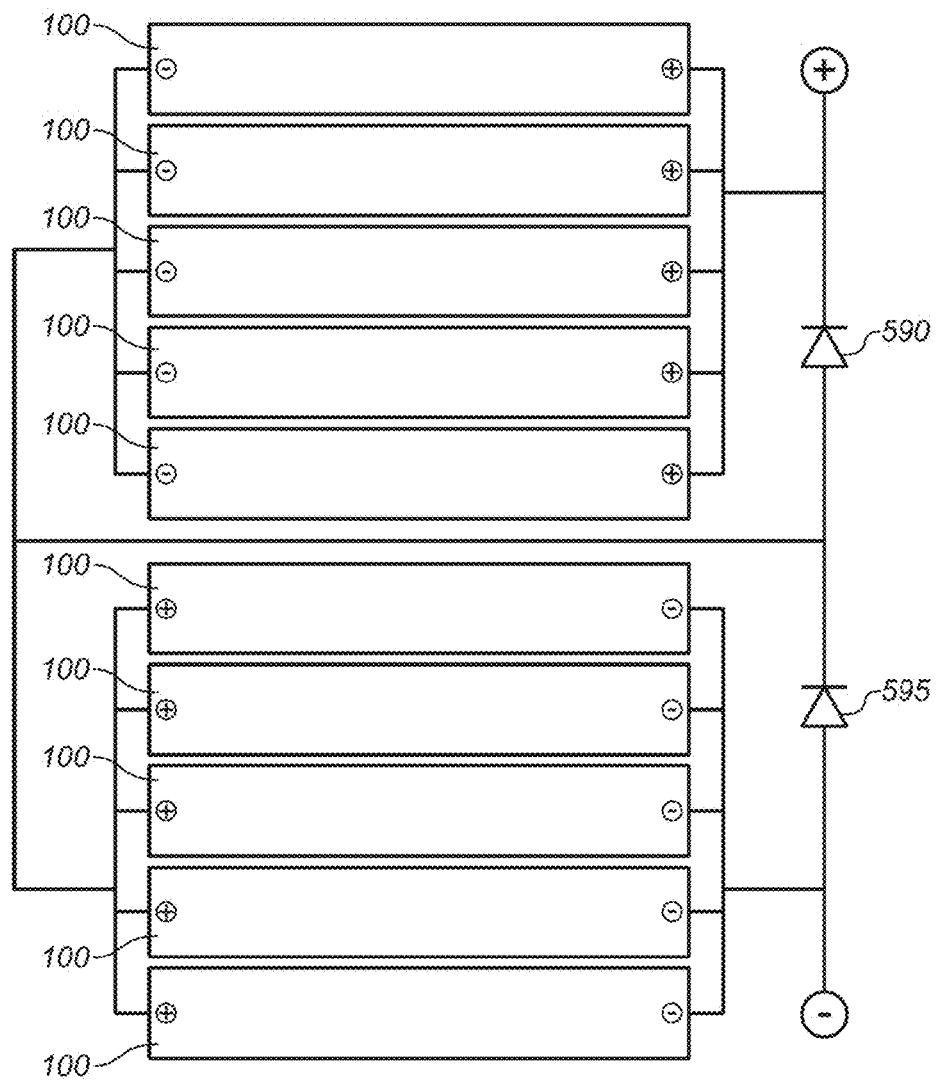
FIG. 13B shows another example schematic circuit diagram for a solar module as illustrated in FIG. 5B.
Figures 1, 13C:
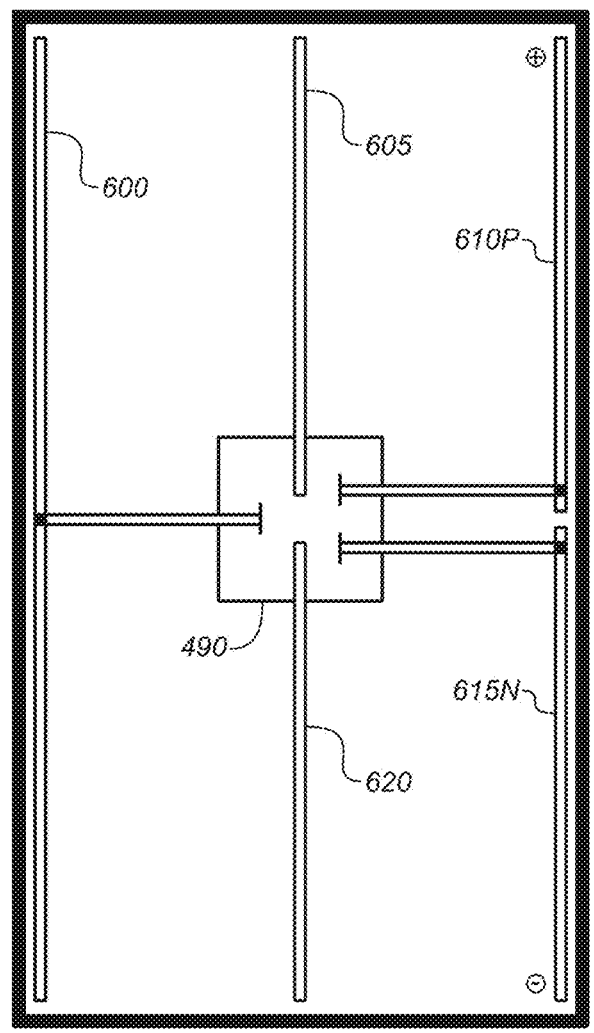
Figures 2, 13C:
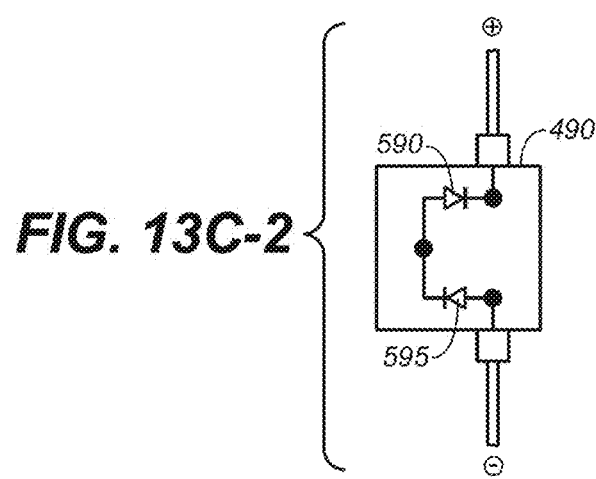

FIGS. 13C-1 and 13C-2 show an example physical layout for the solar module of FIG. 13A. In this layout the first group of super cells has its front surface (negative) end contact along a first side of the module and its rear surface (positive) end contact along the center line of the module, the second group of super cells has its front surface (negative) end contact along the center line of the module and its rear surface (positive) end contact along a second side of the module opposite from the first side, the third group of super cells has its rear surface (positive) end contact along the first side of the module and its front surface (negative) end contact along the center line of the module, and the fourth group of super cells has its rear surface (positive) end contact along the center line of the module and its front surface (negative) end contact along the second side of the module.

Bus 600 connects the front surface (negative) end contacts of the first group of super cells to each other, to the rear surface (positive) end contacts of the third group of super cells, to the positive terminal of bypass diode 590, and to the negative terminal of bypass diode 595. Bus 605 connects the rear surface (positive) end contacts of the first group of super cells to each other and to the front surface (negative) end contacts of the second group of super cells. Bus 610P connects the rear surface (positive) end contacts of the second group of super cells to each other and to the negative terminal of bypass diode 590. Bus 615N connects the front surface (negative) end contacts of the fourth group of super cells to each other and to the positive terminal of bypass diode 595. Bus 620 connects the front surface (negative) end contacts of the third group of super cells to each other and to the rear surface (positive) end contacts of the fourth group of super cells.

Bus 610P and the portion of bus 600 connecting to the super cells of the third group of super cells may lie entirely behind the super cells. The remaining portion of bus 600 and bus 615N and/or their interconnection to the super cells occupy a portion of the front surface of the module.

Bus 605 and bus 620 occupy a portion of the front surface of the module, requiring a gap 210 as shown in FIG. 5A. Alternatively, they may lie entirely behind the super cells and be electrically connected to the super cells with hidden interconnects sandwiched between overlapping ends of super cells. In such a case little or no gap 210 is required.

FIG. 13B shows an example schematic electrical circuit for a solar module as illustrated in FIG. 5B, in which the solar module includes ten rectangular super cells 100 each of which has a length approximately equal to the length of the short sides of the solar module. The super cells are arranged in the solar module with their long sides oriented parallel to the short sides of the module. In the circuit shown in FIG. 13B, the super cells are arranged in two groups: in a first group the top five super cells are connected in parallel with each other and with bypass diode 590, and in a second group the bottom five super cells are connected in parallel with each other and with bypass diode 595. The two groups are connected in series with each other. The bypass diodes are also connected in series.

The schematic circuit of FIG. 13B differs from that of FIG. 13A by replacing each row of two super cells in FIG. 13A with a single super cell. Consequently, the physical layout for the solar module of FIG. 13B may be as shown in FIGS. 13C-1, 13C-2, and 13C-3, with the omission of bus 605 and bus 620.

Figure 14A:
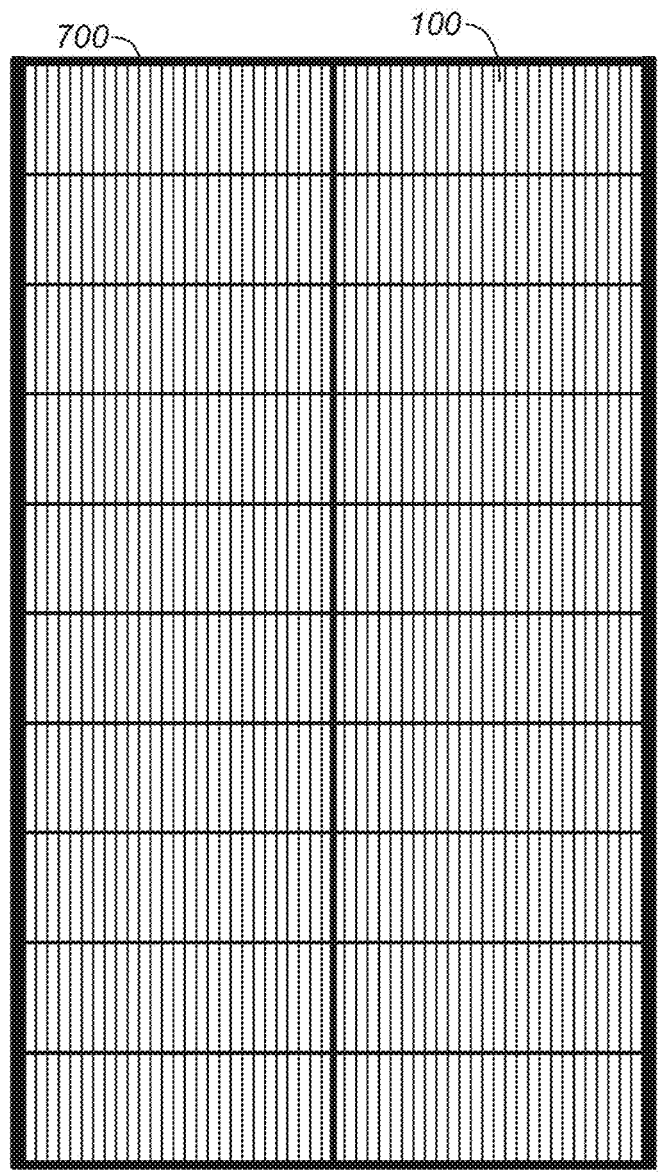
FIG. 14A shows a diagram of another example rectangular solar module comprising a plurality of rectangular shingled super cells, with the long side of each super cell having a length of approximately half the length of the short side of the module. Pairs of the super cells are arranged end-to-end to form rows with the long sides of the super cells parallel to the short side of the module.

FIG. 14A shows an example rectangular solar module 700 comprising twenty-four rectangular super cells 100, each of which has a length approximately equal to one half the length of the short sides of the solar module. Super cells are arranged end-to-end in pairs to form twelve rows of super cells, with the rows and the long sides of the super cells oriented parallel to the short sides of the solar module.

Figure 14B:
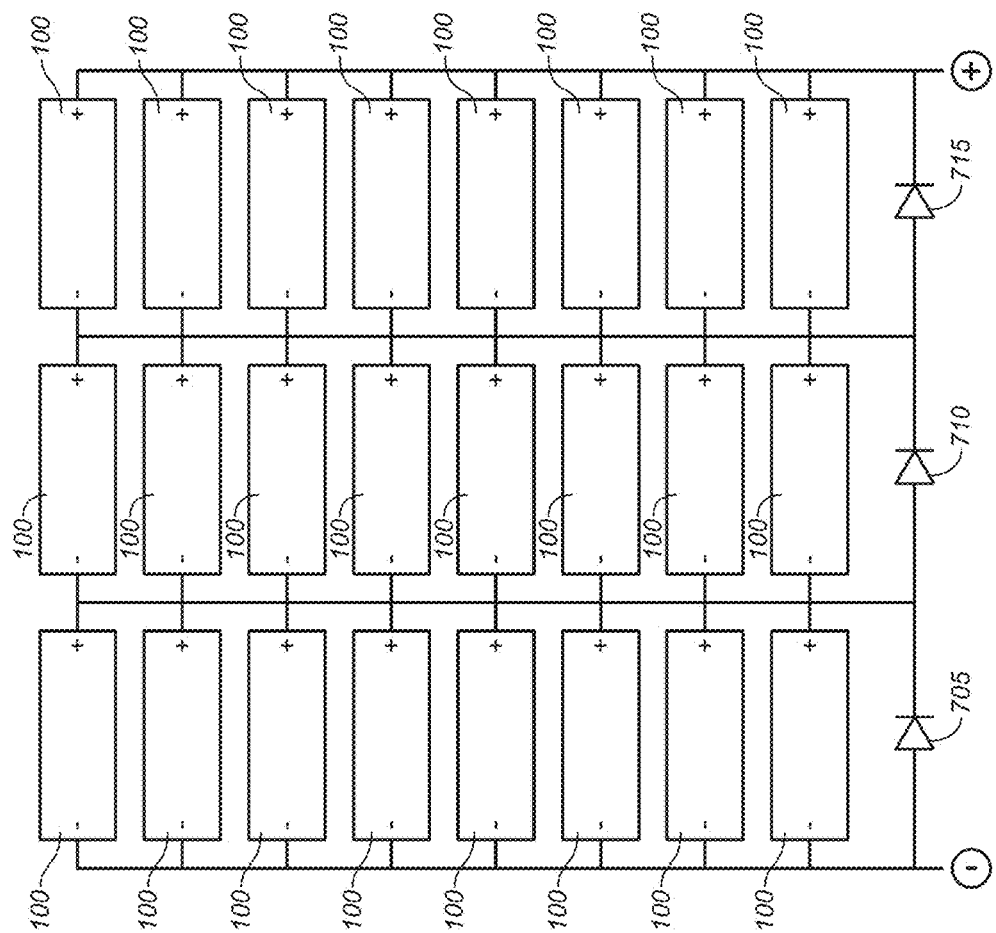
FIG. 14B shows an example schematic circuit diagram for a solar module as illustrated in FIG. 14A.

FIG. 14B shows an example schematic circuit diagram for a solar module as illustrated in FIG. 14A. In the circuit shown in FIG. 14B, the super cells are arranged in three groups: in a first group the first super cells of the top eight rows are connected in parallel with each other and with a bypass diode 705, in a second group the super cells of the bottom four rows are connected in parallel with each other and with a bypass diode 710, and in a third group the second super cells of the top eight rows are connected in parallel with each other and with a bypass diode 715. The three groups of super cells are connected in series. The three bypass diodes are also in series.

Figures 1, 14C:
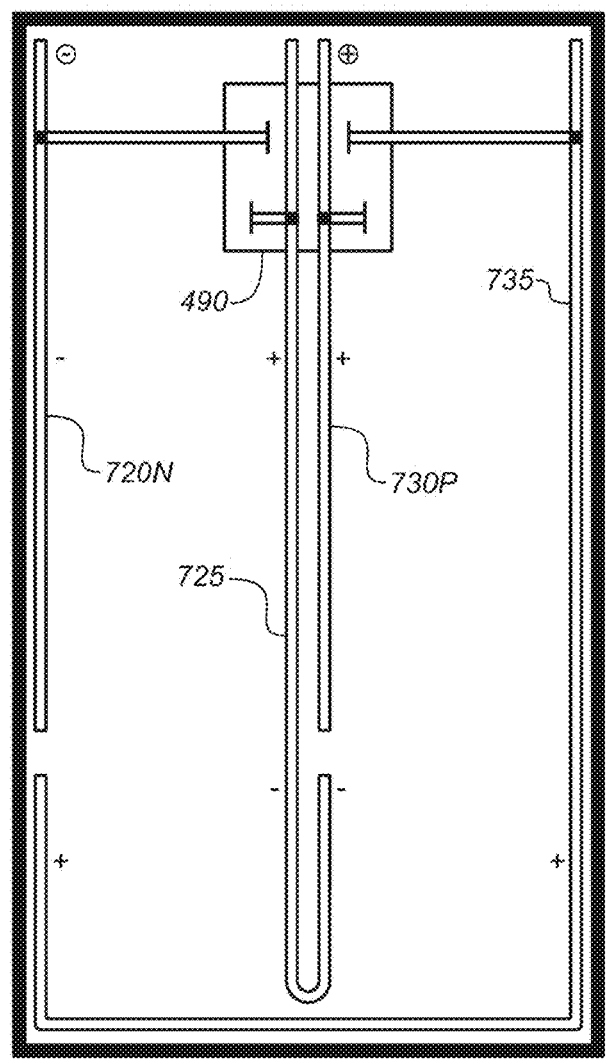
Figures 2, 14C:
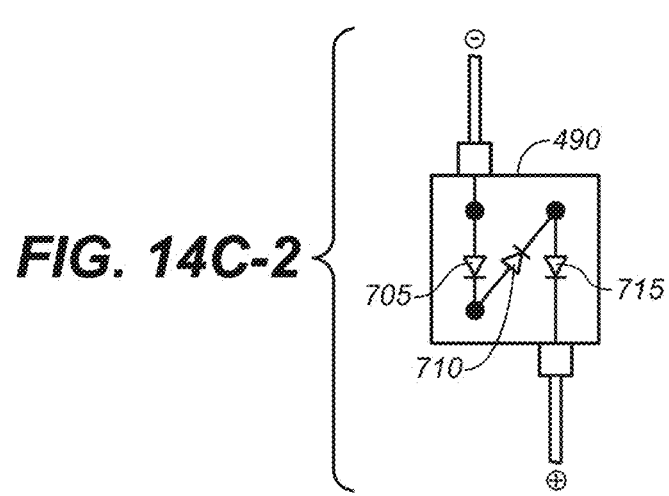

FIGS. 14C-1 and 14C-2 show an example physical layout for the solar module of FIG. 14B. In this layout the first group of super cells has its front surface (negative) end contacts along a first side of the module and its rear surface (positive) end contacts along the center line of the module. In the second group of super cells, the first super cell in each of the bottom four rows has its rear surface (positive) end contact along the first side of the module and its front surface (negative) end contact along the center line of the module, and the second super cell in each of the bottom four rows has its front surface (negative) end contact along the center line of the module and its rear surface (positive) end contact along a second side of the module opposite from the first side. The third group of solar cells has its rear surface (positive) end contacts along the center line of the module and its rear surface (negative) end contacts along the second side of the module.

Bus 720N connects the front surface (negative) end contacts of the first group of super cells to each other and to the positive terminal of bypass diode 705. Bus 725 connects the rear surface (positive) end contacts of the first group of super cells to the front surface (negative) end contacts of the second group of super cells, to the negative terminal of bypass diode 705, and to the positive terminal of bypass diode 710. Bus 730P connects the rear surface (positive) end contacts of the third group of super cells to each other and to the negative terminal of bypass diode 715. Bus 735 connects the front surface (negative) end contacts of the third group of super cells to each other, to the rear surface (positive) end contacts of the second group of super cells, to the negative terminal of bypass diode 710, and to the positive terminal of bypass diode 715.

The portion of bus 725 connecting to the super cells of the first group of super cells, bus 730P, and the portion of bus 735 connecting to the super cells of the second group of super cells may lie entirely behind the super cells. Bus 720N and the remaining portions of bus 725 and bus 735 and/or their interconnection to the super cells occupy a portion of the front surface of the module.

Some of the examples described above house the bypass diodes in one or more junction boxes on the rear surface of the solar module. This is not required, however. For example, some or all of the bypass diodes may be positioned in-plane with the super cells around the perimeter of the solar module or in gaps between super cells, or positioned behind the super cells. In such cases the bypass diodes may be disposed in a laminate structure in which the super cells are encapsulated, for example. The locations of the bypass diodes may thus be decentralized and removed from the junction boxes, facilitating replacement of a central junction box comprising both positive and negative module terminals with two separate single-terminal junction boxes which may be located on the rear surface of the solar module near to outer edges of the solar module, for example. This approach generally reduces the current path length in ribbon conductors in the solar module and in cabling between solar modules, which may both reduce material cost and increase module power (by reducing resistive power losses).

Figure 15:
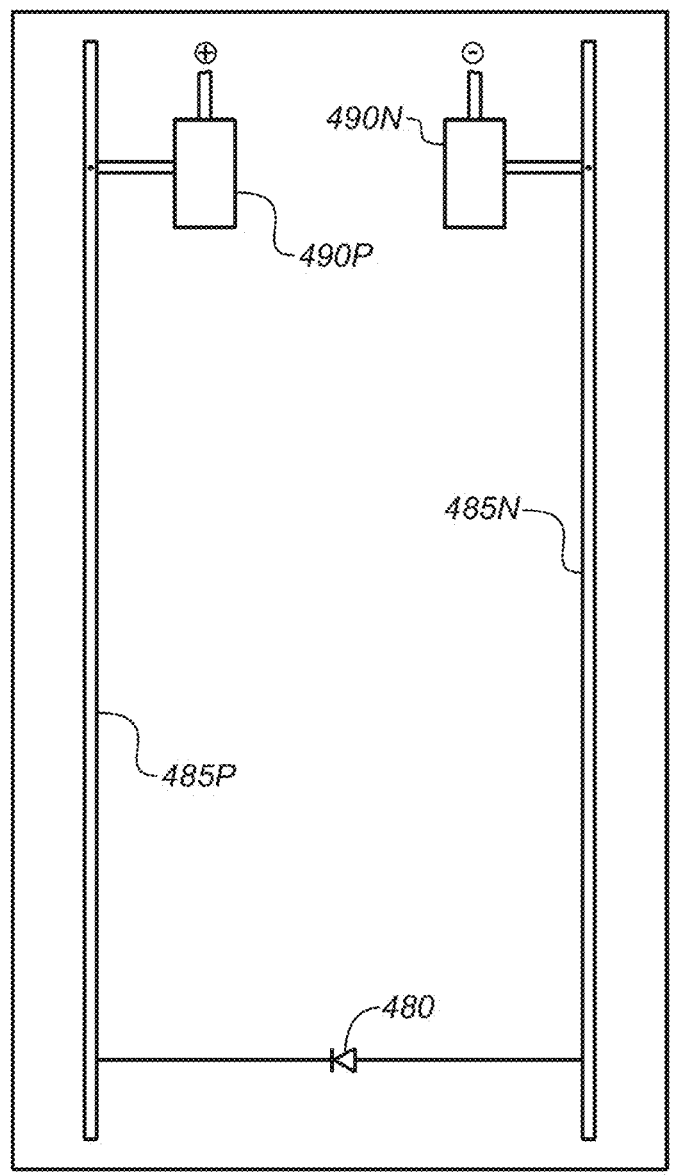
FIG. 15 shows another example physical layout for various electrical interconnections for a solar module as illustrated in FIG. 5B having the schematic circuit diagram of FIG. 10A.

Referring to FIG. 15, for example, the physical layout for various electrical interconnections for a solar module as illustrated in FIG. 5B having the schematic circuit diagram of FIG. 10A may employ a bypass diode 480 located in the super cell laminate structure and two single terminal junction boxes 490P and 490N. FIG. 15 may best be appreciated by comparison to FIGS. 10B-1 and 10B-2. The other module layouts described above may be similarly modified.

Use of in-laminate bypass diodes as just described may be facilitated by the use of reduced current (reduced area) rectangular solar cells as described above, because the power dissipated in a forward-biased bypass diode by the reduced current solar cells may be less than would be the case for conventionally sized solar cells. Bypass diodes in solar modules described in this specification may therefore require less heat-sinking than is conventional, and consequently may be moved out of a junction box on the rear surface of the module and into the laminate.

A single solar module may include interconnects, other conductors, and/or bypass diodes supporting two or more electrical configurations, for example supporting two or more of the electrical configurations described above. In such cases a particular configuration for operation of the solar module may be selected from the two or more alternatives with the use of switches and/or jumpers, for example. The different configurations may put different numbers of super cells in series and/or in parallel to provide different combinations of voltage and current outputs from the solar module. Such a solar module may therefore be factory or field configurable to select from two or more different voltage and current combinations, for example to select between a high voltage and low current configuration, and a low voltage and high current configuration.

Figure 16:
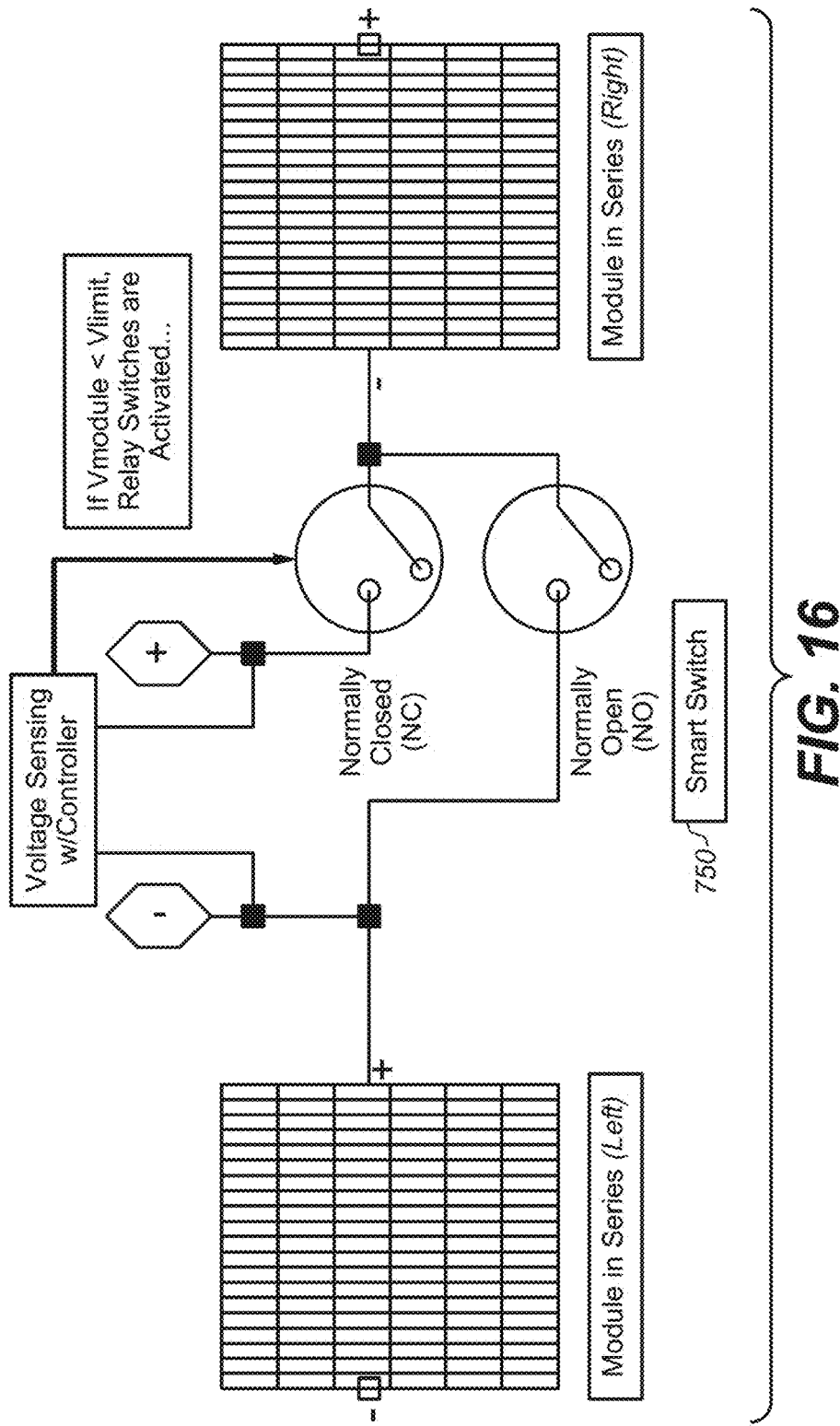
FIG. 16 shows an example arrangement of a smart switch interconnecting two solar modules in series.

FIG. 16 shows an example arrangement of a smart switch module level power management device 750, as described above, between two solar modules.

Figure 17:
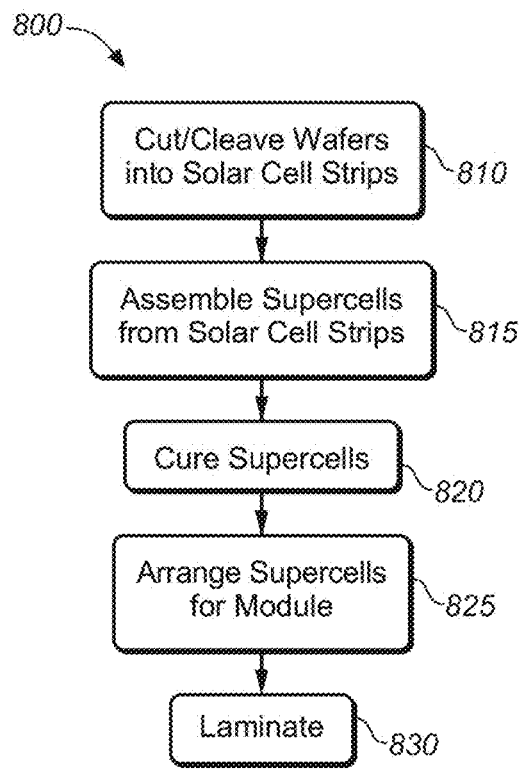
FIG. 17 shows a flow chart for an example method of making a solar module with super cells.

Referring now to FIG. 17, an example method 800 for making solar modules as disclosed in this specification comprises the following steps. In step 810, conventionally sized solar cells (e.g., 156 millimeters×156 millimeters or 125 millimeters×125 millimeters) are cut and/or cleaved to form narrow rectangular solar cell "strips". (See also FIGS. 3A-3E) and related description above, for example). The resulting solar cell strips may optionally be tested and sorted according to their current-voltage performance. Cells with matching or approximately matching current-voltage performance may advantageously be used in the same super cell or in the same row of series connected super cells. For example, it may be advantageous that cells connected in series within a super cell or within a row of super cells produce matching or approximately matching current under the same illumination.

In step 815 super cells are assembled from the strip solar cells, with a conductive adhesive bonding material disposed between overlapping portions of adjacent solar cells in the super cells. The conductive adhesive bonding material may be applied, for example, by ink jet printing or screen printing.

In step 820 heat and pressure are applied to cure or partially cure the conductive adhesive bonding material between the solar cells in the super cells. In one variation, as each additional solar cell is added to a super cell the conductive adhesive bonding material between the newly added solar cell and its adjacent overlapping solar cell (already part of the super cell) is cured or partially cured, before the next solar cell is added to the super cell. In another variation, more than two solar cells or all solar cells in a super cell may be positioned in the desired overlapping manner before the conductive adhesive bonding material is cured or partially cured. The super cells resulting from this step may optionally be tested and sorted according to their current-voltage performance. Super cells with matching or approximately matching current-voltage performance may advantageously be used in the same row of super cells or in the same solar module. For example, it may be advantageous that super cells or rows of super cells electrically connected in parallel produce matching or approximately matching voltages under the same illumination.

In step 825 the cured or partially cured super cells are arranged and interconnected in the desired module configuration in a layered structured including encapsulant material, a transparent front (sun side) sheet, and a (optionally transparent) back sheet. The layered structure may comprise, for example, a first layer of encapsulant on a glass substrate, the interconnected super cells arranged sun-side down on the first layer of encapsulant, a second layer of encapsulant on the layer of super cells, and a back sheet on the second layer of encapsulant. Any other suitable arrangement may also be used.

In lamination step 830 heat and pressure are applied to the layered structure to form a cured laminate structure.

In one variation of the method of FIG. 17, the conventionally sized solar cells are separated into solar cell strips, after which the conductive adhesive bonding material is applied to each individual solar cell strip. In an alternative variation, the conductive adhesive bonding material is applied to the conventionally sized solar cells prior to separation of the solar cells into solar cell strips.

At curing step 820 the conductive adhesive bonding material may be fully cured, or it may be only partially cured. In the latter case the conductive adhesive bonding material may be initially partially cured at step 820 sufficiently to ease handling and interconnection of the super cells, and fully cured during the subsequent lamination step 830.

In some variations a super cell 100 assembled as an intermediate product in method 800 comprises a plurality of rectangular solar cells 10 arranged with the long sides of adjacent solar cells overlapped and conductively bonded as described above, and interconnects bonded to terminal contacts at opposite ends of the super cell.

Figure 30A:
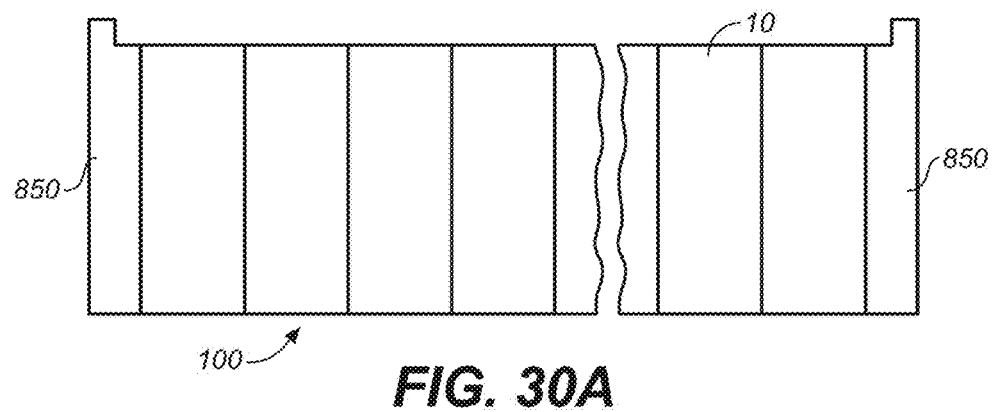
FIG. 30A shows an example super cell with electrical interconnects bonded to its front and rear surface terminal contacts.

FIG. 30A shows an example super cell with electrical interconnects bonded to its front and rear surface terminal contacts. The electrical interconnects run parallel to the terminal edges of the super cell and extend laterally beyond the super cell to facilitate electrical interconnection with an adjacent super cell.

Figure 30B:
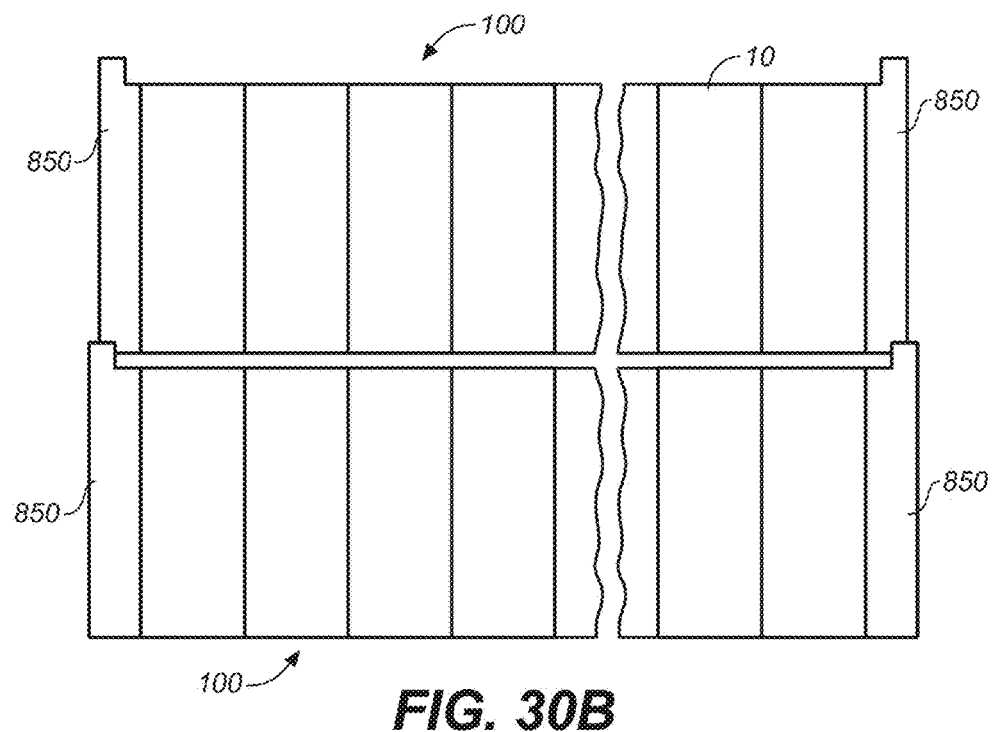
FIG. 30B shows two of the super cells of FIG. 30A interconnected in parallel.

FIG. 30B shows two of the super cells of FIG. 30A interconnected in parallel. Portions of the interconnects that are otherwise visible from the front of the module may be covered or colored (e.g., darkened) to reduce visible contrast between the interconnect and the super cells, as perceived by a human having normal color vision. In the example illustrated in FIG. 30A, an interconnect 850 is conductively bonded to a front side terminal contact of a first polarity (e.g., + or −) at one end of the super cell (on the right side of the drawing), and another interconnect 850 is conductively bonded to a back side terminal contact of the opposite polarity at the other end of the super cell (on the left side of the drawing). Similarly to the other interconnects described above, interconnects 850 may be conductively bonded to the super cell with the same conductive adhesive bonding material used between solar cells, for example, but this is not required. In the illustrated example, a portion of each interconnect 850 extends beyond the edge of super cell 100 in a direction perpendicular to the long axis of the super cell (and parallel to the long axes of solar cells 10). As shown in FIG. 30B, this allows two or more super cells 100 to be positioned side by side, with the interconnects 850 of one super cell overlapping and conductively bonded to corresponding interconnects 850 on the adjacent super cell to electrically interconnect the two super cells in parallel. Several such interconnects 850 interconnected in series as just described may form a bus for the module. This arrangement may be suitable, for example, when the individual super cell extends the full width or full length of the module (e.g., FIG. 5B). In addition, interconnects 850 may also be used to electrically connect terminal contacts of two adjacent super cells within a row of super cells in series. Pairs or longer strings of such interconnected super cells within a row may be electrically connected in parallel with similarly interconnected super cells in an adjacent row by overlapping and conductively bonding interconnects 850 in one row with interconnects 850 in the adjacent row similarly to as shown in FIG. 30B.

Interconnect 850 may be die cut from a conducting sheet, for example, and may be optionally patterned to increase its mechanical compliance both perpendicular to and parallel to the edge of the super cell to reduce or accommodate stress perpendicular and parallel to the edge of the super cell arising from mismatch between the CTE of the interconnect and that of the super cell. Such patterning may include, for example, slits, slots, or holes (not shown). The mechanical compliance of interconnect 850, and its bond or bonds to the super cell, should be sufficient for the connections to the super cell to survive stress arising from CTE mismatch during the lamination process described in more detail below. Interconnect 850 may be bonded to the super cell with, for example, a mechanically compliant electrically conductive bonding material as described above for use in bonding overlapped solar cells. Optionally, the electrically conductive bonding material may be located only at discrete positions along the edges of the super cell rather than in a continuous line extending substantially the length of the edge of the super cell, to reduce or accommodate stress parallel to the edges of the super cell arising from mismatch between the coefficient of thermal expansion of the electrically conductive bonding material or the interconnects and that of the super cell.

Interconnect 850 may be cut from a thin copper sheet, for example, and may be thinner than conventional conductive interconnects when super cells 100 are formed from solar cells having areas smaller than standard silicon solar cells and therefore operate at lower currents than is conventional. For example, interconnects 850 may be formed from copper sheet having a thickness of about 50 microns to about 300 microns. Interconnects 850 may be sufficiently thin and flexible to fold around and behind the edge of the super cell to which they are bonded, similarly to the interconnects described above.

FIGS. 19A-19D show several example arrangements by which heat and pressure may be applied during method 800 to cure or partially cure the conductive adhesive bonding material between adjacent solar cells in the super cells. Any other suitable arrangement may also be employed.

In FIG. 19A, heat and localized pressure are applied to cure or partially cure conductive adhesive bonding material 12 one joint (overlapping region) at a time. The super cell may be supported by a surface 1000 and pressure may be mechanically applied to the joint from above with a bar, pin, or other mechanical contact, for example. Heat may be applied to the joint with hot air (or other hot gas), with an infrared lamp, or by heating the mechanical contact that applies localized pressure to the joint, for example.

In FIG. 19B, the arrangement of FIG. 19A is extended to a batch process that simultaneously applies heat and localized pressure to multiple joints in a super cell.

In FIG. 19C, an uncured super cell is sandwiched between release liners 1015 and reusable thermoplastic sheets 1020 and positioned on a carrier plate 1010 supported by a surface 1000. The thermoplastic material of sheets 1020 is selected to melt at the temperature at which the super cells are cured. Release liners 1015 may be formed from fiberglass and PTFE, for example, and do not adhere to the super cell after the curing process. Preferably, release liners 1015 are formed from materials that have a coefficient of thermal expansion matching or substantially matching that of the solar cells (e.g., the CTE of silicon). This is because if the CTE of the release liners differs too much from that of the solar cells, then the solar cells and the release liners will lengthen by different amounts during the curing process, which would tend to pull the super cell apart lengthwise at the joints. A vacuum bladder 1005 overlies this arrangement. The uncured super cell is heated from below through surface 1000 and carrier plate 1010, for example, and a vacuum is pulled between bladder 1005 and support surface 1000. As a result bladder 1005 applies hydrostatic pressure to the super cell through the melted thermoplastic sheets 1020.

In FIG. 19D, an uncured super cell is carried by a perforated moving belt 1025 through an oven 1035 that heats the super cell. A vacuum applied through perforations in the belt pulls solar cells 10 toward the belt, thereby applying pressure to the joints between them. The conductive adhesive bonding material in those joints cures as the super cell passes through the oven. Preferably, perforated belt 1025 is formed from materials that have a CTE matching or substantially matching that of the solar cells (e.g., the CTE of silicon). This is because if the CTE of belt 1025 differs too much from that of the solar cells, then the solar cells and the belt will lengthen by different amounts in oven 1035, which will tend to pull the super cell apart lengthwise at the joints.

Figure 18:
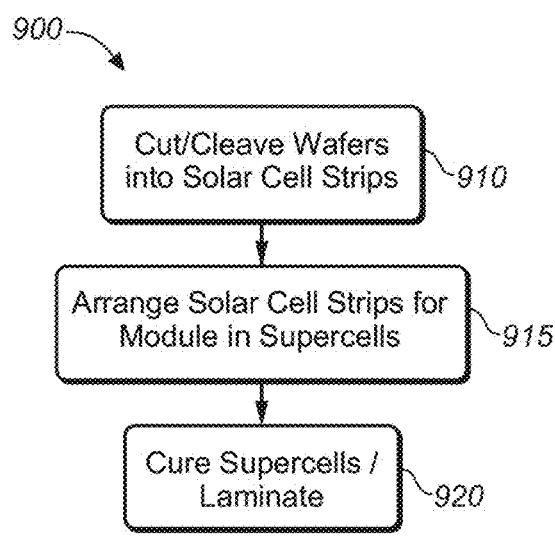
FIG. 18 shows a flow chart for another example method of making a solar module with super cells.

Method 800 of FIG. 17 includes distinct super cell curing and lamination steps, and produces an intermediate super cell product. In contrast, in method 900 shown in FIG. 18 the super cell curing and lamination steps are combined. In step 910, conventionally sized solar cells (e.g., 156 millimeters× 156 millimeters or 125 millimeters×125 millimeters) are cut and/or cleaved to form narrow rectangular solar cell strips. The resulting solar cell strips may optionally be tested and sorted.

In step 915, the solar cell strips are arranged in the desired module configuration in a layered structured including encapsulant material, a transparent front (sun side) sheet, and a back sheet. The solar cell strips are arranged as super cells, with an uncured conductive adhesive bonding material disposed between overlapping portions of adjacent solar cells in the super cells. (The conductive adhesive bonding material may be applied, for example, by ink jet printing or screen printing). Interconnects are arranged to electrically interconnect the uncured super cells in the desired configuration. The layered structure may comprise, for example, a first layer of encapsulant on a glass substrate, the interconnected super cells arranged sun-side down on the first layer of encapsulant, a second layer of encapsulant on the layer of super cells, and a back sheet on the second layer of encapsulant. Any other suitable arrangement may also be used.

In lamination step 920 heat and pressure are applied to the layered structure to cure the conductive adhesive bonding material in the super cells and to form a cured laminate structure. Conductive adhesive bonding material used to bond interconnects to the super cells may be cured in this step as well.

In one variation of method 900, the conventionally sized solar cells are separated into solar cell strips, after which the conductive adhesive bonding material is applied to each individual solar cell strips. In an alternative variation, the conductive adhesive bonding material is applied to the conventionally sized solar cells prior to separation of the solar cells into solar cell strips. For example, a plurality of conventionally sized solar cells may be placed on a large template, conductive adhesive bonding material then dispensed on the solar cells, and the solar cells then simultaneously separated into solar cell strips with a large fixture. The resulting solar cell strips may then be transported as a group and arranged in the desired module configuration as described above.

As noted above, in some variations of method 800 and of method 900 the conductive adhesive bonding material is applied to the conventionally sized solar cells prior to separating the solar cells into solar cell strips. The conductive adhesive bonding material is uncured (i.e., still "wet") when the conventionally sized solar cell is separated to form the solar cell strips. In some of these variations, the conductive adhesive bonding material is applied to a conventionally sized solar cell (e.g. by ink jet or screen printing), then a laser is used to scribe lines on the solar cell defining the locations at which the solar cell is to be cleaved to form the solar cell strips, then the solar cell is cleaved along the scribe lines. In these variations the laser power and/or the distance between the scribe lines and the adhesive bonding material may be selected to avoid incidentally curing or partially curing the conductive adhesive bonding material with heat from the laser. In other variations, a laser is used to scribe lines on a conventionally sized solar cell defining the locations at which the solar cell is to be cleaved to form the solar cell strips, then the conductive adhesive bonding material is applied to the solar cell (e.g. by ink jet or screen printing), then the solar cell is cleaved along the scribe lines. In the latter variations it may be preferable to accomplish the step of applying the conductive adhesive bonding material without incidentally cleaving or breaking the scribed solar cell during this step.

Referring again to FIGS. 20A-20C, FIG. 20A schematically illustrates a side view of an example apparatus 1050 that may be used to cleave scribed solar cells to which conductive adhesive bonding material has been applied. (Scribing and application of conductive adhesive bonding material may have occurred in either order). In this apparatus, a scribed conventionally sized solar cell 45 to which conductive adhesive bonding material has been applied is carried by a perforated moving belt 1060 over a curved portion of a vacuum manifold 1070. As solar cell 45 passes over the curved portion of the vacuum manifold, a vacuum applied through the perforations in the belt pulls the bottom surface of solar cell 45 against the vacuum manifold and thereby flexes the solar cell. The radius of curvature R of the curved portion of the vacuum manifold may be selected so that flexing solar cell 45 in this manner cleaves the solar cell along the scribe lines. Advantageously, solar cell 45 may be cleaved by this method without contacting the top surface of solar cell 45 to which the conductive adhesive bonding material has been applied.

Figure 20A:
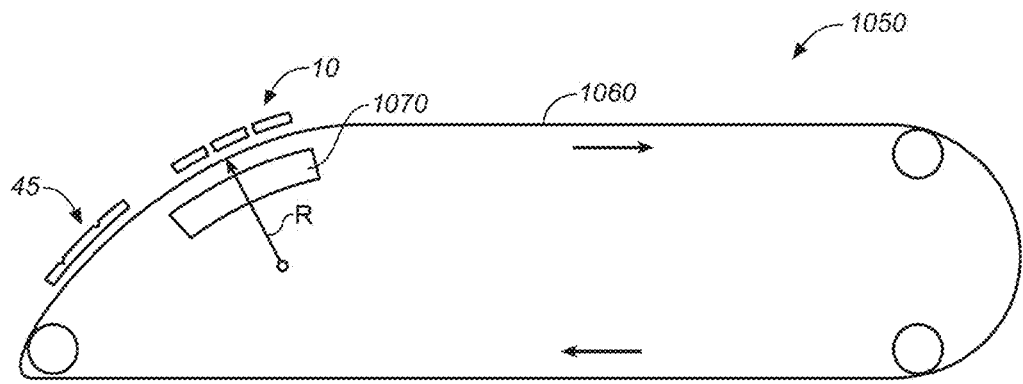
FIGS. 20A-20C schematically illustrate an example apparatus that may be used to cleave scribed solar cells. The apparatus may be particularly advantageous when used to cleave scribed super cells to which conductive adhesive bonding material has been applied.
Figure 20B:
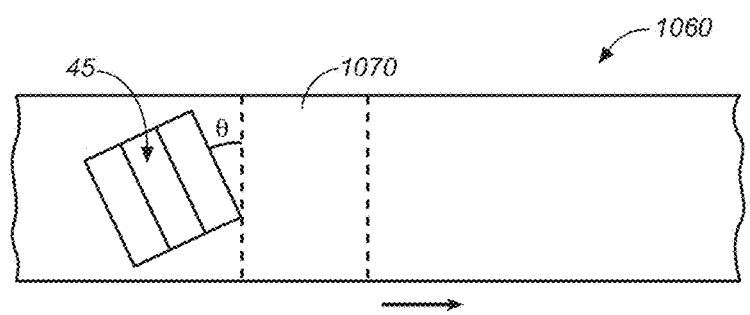
Figure 20C:
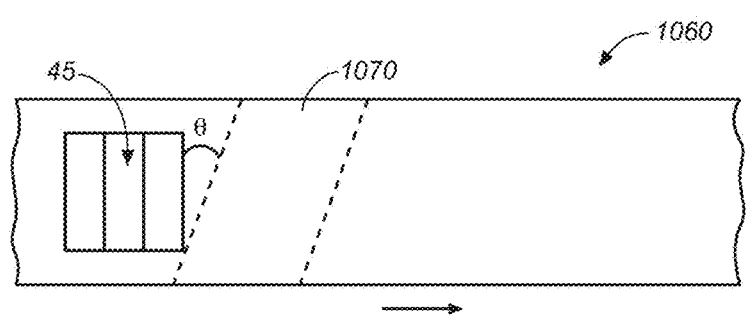

If it is preferred for cleaving to begin at one end of a scribe line (i.e., at one edge of solar cell 45), this may be accomplished with apparatus 1050 of FIG. 20A by for example arranging for the scribe lines to be oriented at an angle θ to the vacuum manifold so that for each scribe line one end reaches the curved portion of the vacuum manifold before the other end. As shown in FIG. 20B, for example, the solar cells may be oriented with their scribe lines at an angle to the direction of travel of the belt and the manifold oriented perpendicularly to the direction of travel of the belt. As another example, FIG. 20C shows the cells oriented with their scribe lines perpendicular to the direction of travel of the belt, and the manifold oriented at an angle.

Any other suitable apparatus may also be used to cleave scribed solar cells to which conductive adhesive bonding material has been applied to form strip solar cells with pre-applied conductive adhesive bonding material. Such apparatus may, for example, use rollers to apply pressure to the top surface of the solar cell to which the conductive adhesive bonding material has been applied. In such cases it is preferable that the rollers touch the top surface of the solar cell only in regions to which conductive adhesive bonding material has not been applied.

In some variations, solar modules comprise super cells arranged in rows on a white or otherwise reflective back sheet, so that a portion of solar radiation initially unabsorbed by and passing through the solar cells may be reflected by the back sheet back into the solar cells to produce electricity. The reflective back sheet may be visible through the gaps between rows of super cells, which may result in a solar module that appears to have rows of parallel bright (e.g., white) lines running across its front surface. Referring to FIG. 5B, for example, the parallel dark lines running between the rows of super cells 100 may appear as white lines if super cells 100 are arranged on a white back sheet. This may be aesthetically displeasing for some uses of the solar modules, for example on roof tops.

Figure 21:
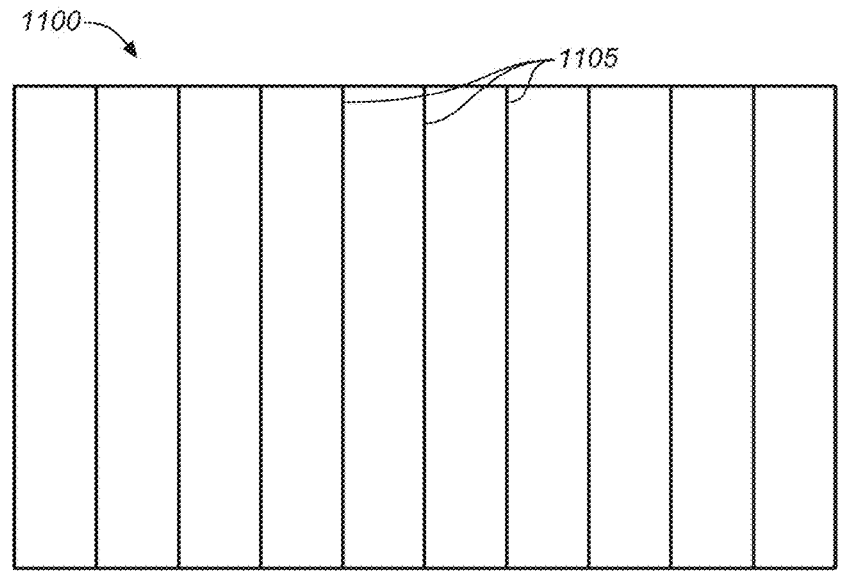
FIG. 21 shows an example white back sheet "zebra striped" with dark lines that may be used in solar modules comprising parallel rows of super cells to reduce visual contrast between the super cells and portions of the back sheet visible from the front of the module.

Referring to FIG. 21, to improve the aesthetic appearance of the solar module, some variations employ a white back sheet 1100 comprising dark stripes 1105 located in positions corresponding to the gaps between rows of the super cells to be arranged on the back sheet. Stripes 1105 are sufficiently wide that the white portions of the back sheet are not visible through gaps between the rows of super cells in the assembled module. This reduces the visual contrast between the super cells and the back sheet, as perceived by a human having normal color vision. The resulting module includes a white back sheet but may have a front surface similar in appearance to that of the modules illustrated in FIGS. 5A-5B, for example. Dark stripes 1105 may be produced with lengths of dark tape, for example, or in any other suitable manner.

As previously mentioned, shading of individual cells within solar modules can create 'hotspots', wherein power of the non-shaded cells is dissipated in the shaded cell. This dissipated power creates localized temperature spikes that can degrade the modules.

To minimize the potential severity of these hotspots, bypass diodes are conventionally inserted as part of the module. The maximal number of cells between bypass diodes is set to limit the max temperature of the module and prevent irreversible damage on the module. Standard layouts for silicon cells may utilize a bypass diode every 20 or 24 cells, a number that is determined by the typical break down voltage of silicon cells. In certain embodiments, the breakdown voltage may lie in range between about 10-50V. In certain embodiments, the breakdown voltage may be about 10V, about 15V, about 20V, about 25V, about 30V, or about 35V.

According to embodiments, the shingling of strips of cut solar cells with thin thermally conductive adhesives, improves the thermal contact between solar cells. This enhanced thermal contact allows higher degree of thermal spreading than traditional interconnection technologies. Such a thermal heat spreading design based on shingling allows longer strings of solar cells to be used than the twenty-four (or fewer) solar cells per bypass diode to which conventional designs are restricted. Such relaxation in the requirement for frequent bypass diodes according to the thermal spreading facilitated by shingling according to embodiments, may offer one or more benefits. For example, it allows for the creation of module layouts of a variety of solar cell string lengths, unhindered by a need to provide for a large number of bypass diodes.

According to embodiments, thermal spreading is achieved by maintaining a physical and thermal bond with the adjacent cell. This allows for adequate heat dissipation though the bonded joint.

In certain embodiments this joint is maintained at a thickness of about 200 micrometers or less, and runs the length of the solar cell in a segmented pattern. Depending upon the embodiment, the joint may have a thickness of about 200 micrometers or less, of about 150 micrometers or less, of about 125 micrometers or less, of about 100 micrometers or less, of about 90 micrometers or less, of about 80 micrometers or less, of about 70 micrometers or less, of about 50 micrometers, or less, or of about 25 micrometers or less.

An accurate adhesive cure processing may be important to ensuring that a reliable joint is maintained while a thickness is reduced in order to promote thermal spreading between bonded cells.

Being allowed to run longer strings (e.g., more than 24 cells) affords flexibility in the design of solar cells and modules. For example, certain embodiments may utilize strings of cut solar cells that are assembled in a shingled manner. Such configurations may utilize significantly more cells per module than a conventional module.

Absent the thermal spreading property, a bypass diode would be needed every 24 cells. Where the solar cells are cut by ⅙, the bypass diodes per module would be 6 times the conventional module (comprises of 3 uncut cells), adding up to a total of 18 diodes. Thus thermal spreading affords a significant reduction in the number of bypass diodes.

Moreover for every bypass diode, bypass circuitry is needed to complete the bypass electrical path. Each diode requires two interconnections points and conductor routing to connect them to such interconnection points. This creates a complicated circuit, contributing significant expense over standard layout costs associated with assembling a solar module.

By contrast, thermal spreading technology requires only one or even no bypass diodes per module. Such a configuration streamlines a module assembly process, allowing simple automation tools to perform the layout manufacturing steps.

Avoiding the need to bypass protect every 24 cells thus renders the cell module easier to manufacture. Complex tap-outs in the middle of the module and long parallel connections for bypass circuitry, are avoided. This thermal spreading is implemented by creating long shingled strips of cells running a width and/or length of the module.

In addition to providing thermal heat spreading, shingling according to embodiments also allows improved hotspot performance by reducing a magnitude of current dissipated in a solar cell. Specifically, during a hot spot condition the amount of current dissipated in a solar cell is dependent upon cell area.

Since shingling may cut cells to smaller areas, an amount of current passing through one cell in a hot spot condition is a function of the cut dimensions. During a hot spot condition, the current passes through the lowest resistance path which is usually a cell level defect interface or grain boundary. Reducing this current is a benefit and minimizes reliability risk failure under hot spot conditions.

Figure 22A:
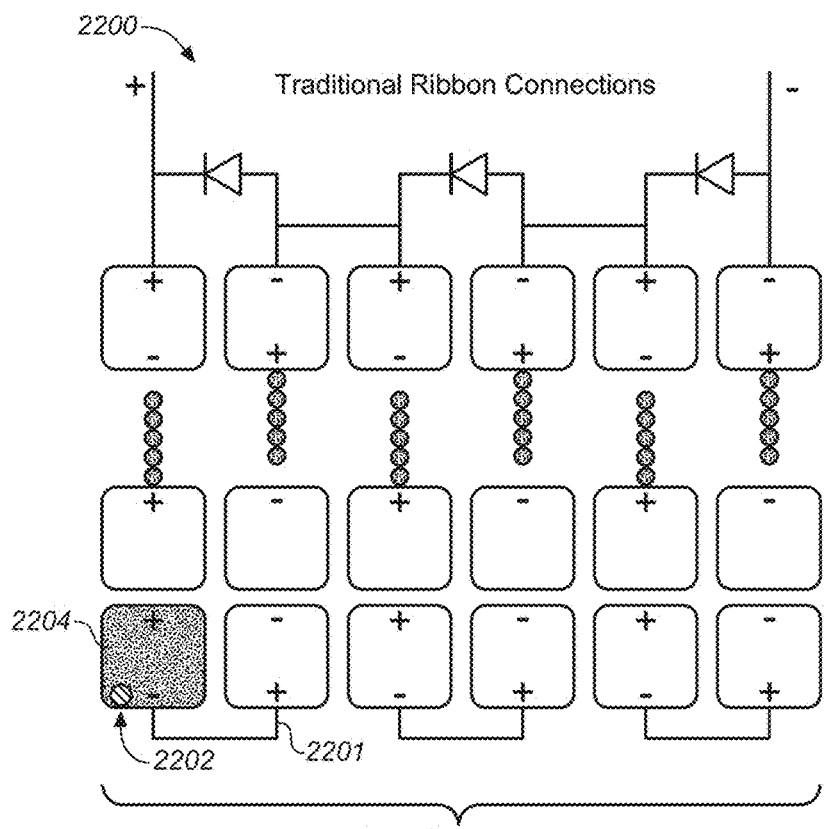
FIG. 22A shows a plan view of a conventional module utilizing traditional ribbon connections under hot spot conditions.

FIG. 22A shows a plan view of a conventional module 2200 utilizing traditional ribbon connections 2201, under hot spot conditions. Here, shading 2202 on one cell 2204 results in heat being localized to that single cell.

Figure 22B:
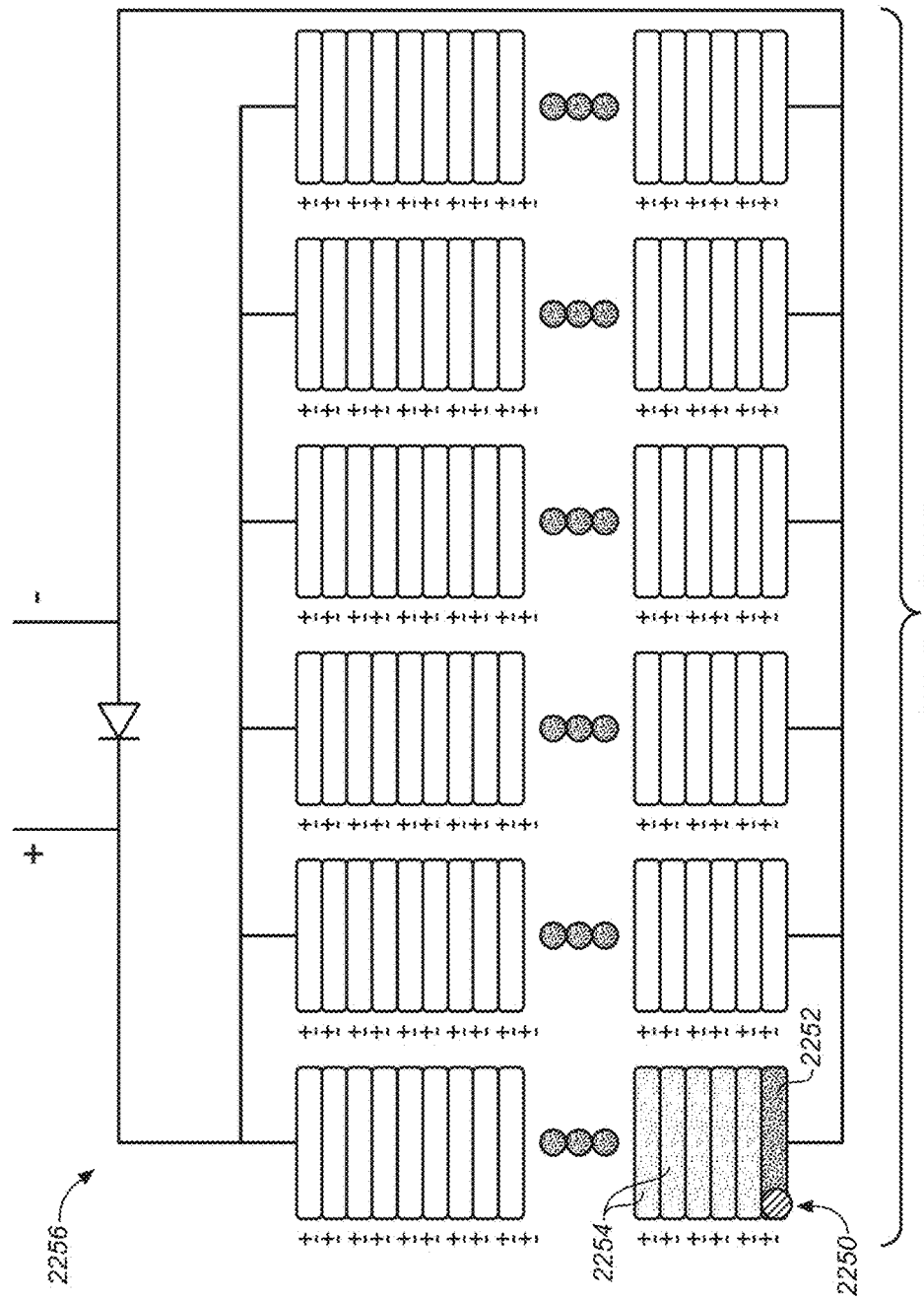
FIG. 22B shows a plan view of a module utilizing thermal spreading according to embodiments, also under hot spot conditions.

By contrast, FIG. 22B shows a plan view of a module utilizing thermal spreading, also under hot spot conditions. Here, shading 2250 on cell 2252 generates heat within that cell. This heat, however, is spread to other electrically and thermally bonded cells 2254 within the module 2256.

It is further noted that the benefit of reduction in dissipated current is multiplied for multi-crystalline solar cells. Such multi-crystalline cells are known to perform poorly under hot spot conditions owing to a high level of defect interfaces.

As indicated above, particular embodiments may employ shingling of chamfered cut cells. In such cases, there is a heat spreading advantage to mirror, along the bond line between each cell with the adjacent cell.

This maximizes the bond length of each overlapping joint. Since the bond joint is major interface for cell-to-cell heat spreading, maximizing this length may ensure the optimum heat spreading is obtained.

Figure 23A:
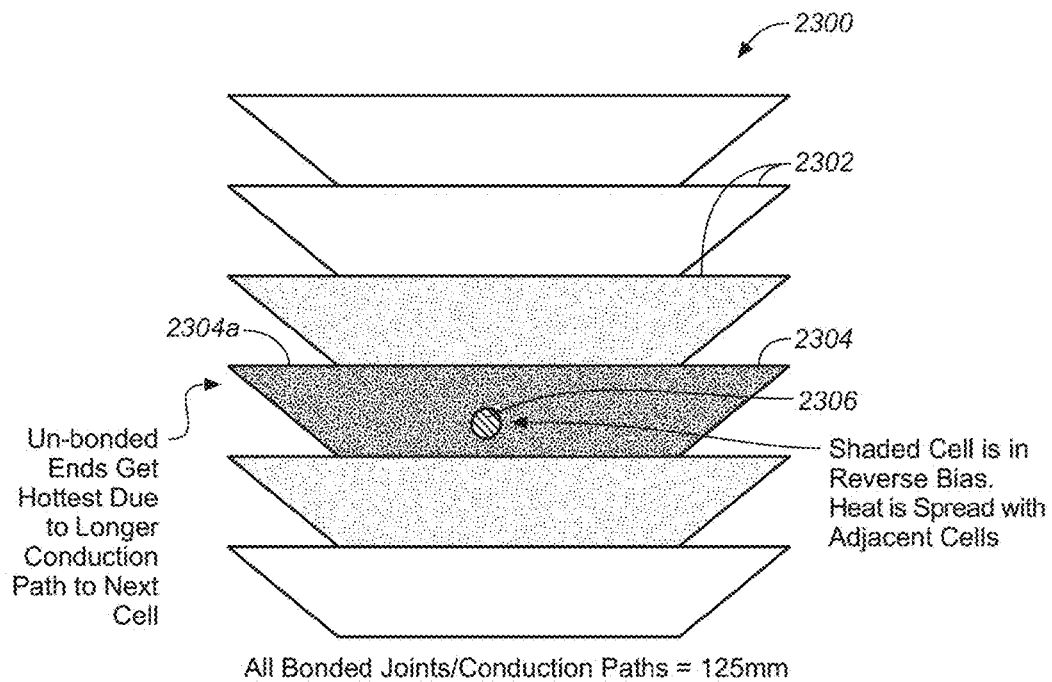
FIGS. 23A-23B show examples of super cell string layouts with chamfered cells.

FIG. 23A shows one example of a super cell string layout 2300 with chamfered cells 2302. In this configuration, the chamfered cells are oriented in a same direction, and thus all the bonded joints conduction paths are the same (125 mm).

Shading 2306 on one cell 2304 results in reverse biasing of that cell. Heat is spread to with adjacent cells. Unbonded ends 2304*a* of the chamfered cell becomes hottest due to a longer conduction length to the next cell.

Figure 23B:
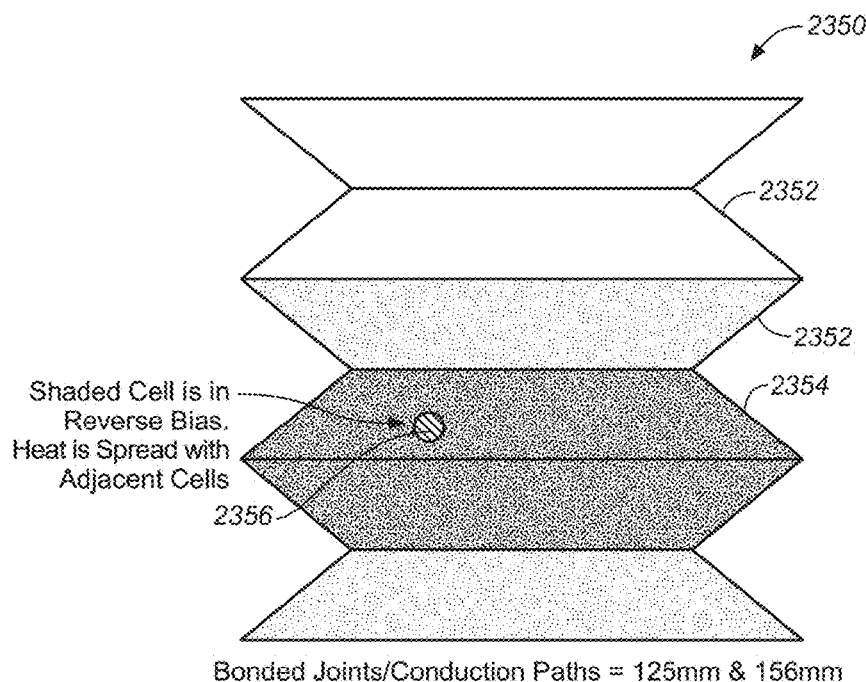

FIG. 23B shows another example of a super cell string layout 2350 with chamfered cells 2352. In this configuration, the chamfered cells are oriented in different directions, with some of the long edges of the chamfered cells facing each other. This results in bonded joint conduction paths of two lengths: 125 mm and 156 mm.

Where a cell 2354 experiences shading 2356, the configuration of FIG. 23B exhibits improved thermal spreading along the longer bond length. FIG. 23B thus shows that the thermal spreading in a super cell with chamfered cells facing each other.

The above discussion has focused upon assembling a plurality of solar cells (which may be cut solar cells) in a shingled manner on a common substrate. This results in the formation of a module having a single electrical interconnect-junction box (or j-box).

In order to gather a sufficient amount of solar energy to be useful, however, an installation typically comprises a number of such modules that are themselves assembled together. According to embodiments, a plurality of solar cell modules may also be assembled in a shingled manner to increase the area efficiency of an array.

In particular embodiments, a module may feature a top conductive ribbon facing a direction of solar energy, and a bottom conductive ribbon facing away from the direction of solar energy.

The bottom ribbon is buried beneath the cells. Thus, it does not block incoming light and adversely impact an area efficiency of the module. By contrast, the top ribbon is exposed and can block the incoming light and adversely impact efficiency.

According to embodiments the modules themselves can be shingled, such that the top ribbon is covered by the neighboring module. FIG. 24 shows a simplified cross-sectional view of such an arrangement 2400, where an end portion 2401 of an adjacent module 2402, serves to overlap the top ribbon 2404 of an instant module 2406. Each module itself comprises a plurality of shingled solar cells 2407.

The bottom ribbon 2408 of the instant module 2406 is buried. It is located on an elevated side of the instant shingled module in order to overlap the next adjacent shingled module.

This shingled module configuration could also provide for additional area on the module for other elements, without adversely impacting a final exposed area of the module array. Examples of module elements that may be positioned in overlapping regions can include but are not limited to, junction boxes (j-boxes) 2410 and/or bus ribbons.

FIG. 25 shows another embodiment of a shingled module configuration 2500. Here, j-boxes 2502, 2504 of the respective adjacent shingled modules 2506 and 2508 are in a mating arrangement 2510 in order to achieve electrical connection between them. This simplifies the configuration of the array of shingled modules by eliminating wiring.

In certain embodiments, the j-boxes could be reinforced and/or combined with additional structural standoffs. Such a configuration could create an integrated tilted module roof mount rack solution, wherein a dimension of the junction box determines a tilt. Such an implementation may be particularly useful where an array of shingled modules is mounted on a flat roof.

Where the modules comprise a glass substrate and a glass cover (glass-glass modules), the modules could be used without additional frame members by shortening an overall module length (and hence an exposed length L resulting from the shingling). Such shortening would allow the modules of the tiled array to survive expected physical loads (e.g., a 5400 Pa snow load limit), without fracturing under the strain.

It is emphasized that the use of super cell structures comprising a plurality of individual solar cells assembled in a shingled manner, readily accommodates changing the length of the module to meet a specific length dictated by physical load and other requirements.

Figure 26:
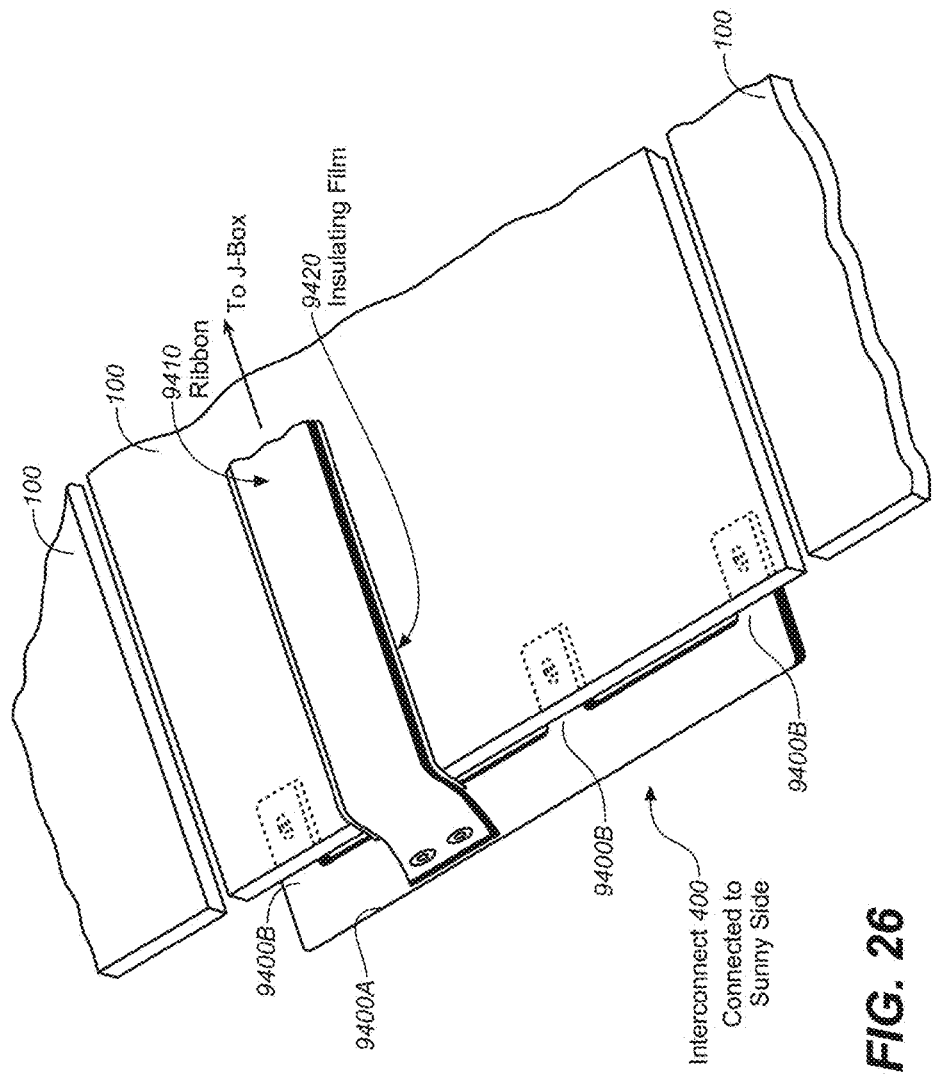
FIG. 26 shows a diagram of the rear (shaded) surface of a solar module illustrating an example electrical interconnection of the front (sun side) surface terminal electrical contacts of a shingled super cell to a junction box on the rear side of the module.

FIG. 26 shows a diagram of the rear (shaded) surface of a solar module illustrating an example electrical interconnection of the front (sun side) surface terminal electrical contacts of a shingled super cell to a junction box on the rear side of the module. The front surface terminal contacts of the shingled super cell may be located adjacent to an edge of the module.

FIG. 26 shows the use of a flexible interconnect 400 to electrically contact a front surface end contact of a super cell 100. In the illustrated example, flexible interconnect 400 comprises a ribbon portion 9400A running parallel and adjacent to an end of the super cell 100 and fingers 9400B extending perpendicularly to the ribbon portion to contact the front surface metallization pattern (not shown) of the end solar cell in the super cell, to which they are conductively bonded. A ribbon conductor 9410 conductively bonded to interconnect 9400 passes behind super cell 100 to electrically connect interconnect 9400 to electrical components (e.g., bypass diodes and/or module terminals in a junction box) on the rear surface of the solar module of which the super cell is a part. An insulating film 9420 may be disposed between conductor 9410 and the edge and rear surface of super cell 100 to electrically insulate ribbon conductor 9410 from super cell 100.

Interconnect 400 may optionally fold around the edge of the super cell so that ribbon portion 9400A lies behind or partially behind the super cell. In such cases an electrically insulating layer is typically provided between interconnect 400 and the edge and rear surfaces of super cell 100.

Interconnect 400 may be die cut from a conducting sheet, for example, and may be optionally patterned to increase its mechanical compliance both perpendicular to and parallel to the edge of the super cell to reduce or accommodate stress perpendicular and parallel to the edge of the super cell arising from mismatch between the CTE of the interconnect and that of the super cell. Such patterning may include, for example, slits, slots, or holes (not shown). The mechanical compliance of interconnect 400, and its bond to the super cell, should be sufficient for the connection to the super cell to survive stress arising from CTE mismatch during the lamination process described in more detail below. Interconnect 400 may be bonded to the super cell with, for example, a mechanically compliant electrically conductive bonding material as described above for use in bonding overlapped solar cells. Optionally, the electrically conductive bonding material may be located only at discrete positions along the edge of the super cell (e.g., corresponding to the locations of discrete contact pads on the end solar cell) rather than in a continuous line extending substantially the length of the edge of the super cell, to reduce or accommodate stress parallel to the edge of the super cell arising from mismatch between the coefficient of thermal expansion of the electrically conductive bonding material or the interconnect and that of the super cell.

Interconnect 400 may be cut from a thin copper sheet, for example, and may be thinner than conventional conductive interconnects when super cells 100 are formed from solar cells having areas smaller than standard silicon solar cells and therefore operate at lower currents than is conventional. For example, interconnects 400 may be formed from copper sheet having a thickness of about 50 microns to about 300 microns. An interconnect 400 may be sufficiently thin to accommodate stress perpendicular and parallel to the edge of the super cell arising from mismatch between the CTE of the interconnect and that of the super cell even without being patterned as described above. Ribbon conductor 9410 may be formed from copper, for example.

Figure 27:
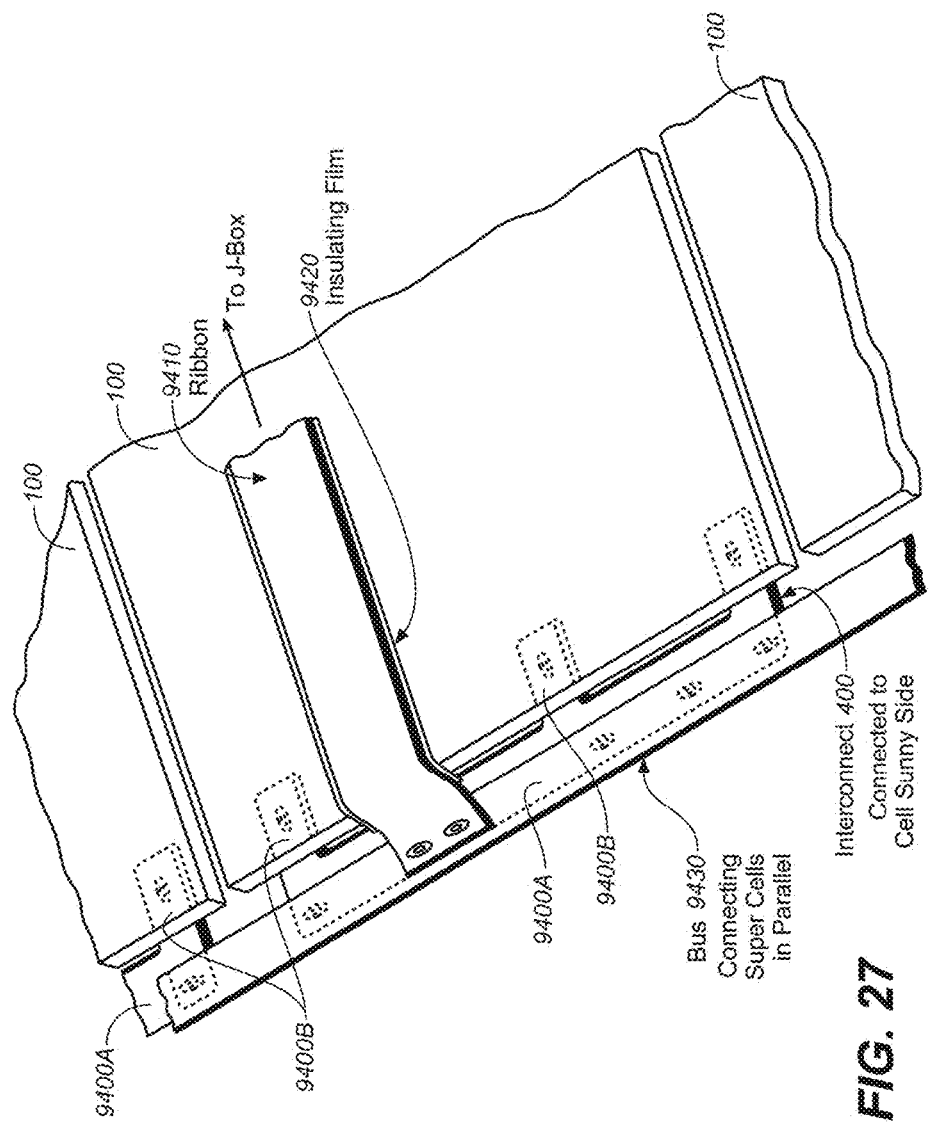
FIG. 27 shows a diagram of the rear (shaded) surface of a solar module illustrating an example electrical interconnection of two or more shingled super cells in parallel, with the front (sun side) surface terminal electrical contacts of the super cells connected to each other and to a junction box on the rear side of the module.

FIG. 27 shows a diagram of the rear (shaded) surface of a solar module illustrating an example electrical interconnection of two or more shingled super cells in parallel, with the front (sun side) surface terminal electrical contacts of the super cells connected to each other and to a junction box on the rear side of the module. The front surface terminal contacts of the shingled super cells may be located adjacent to an edge of the module.

FIG. 27 shows the use of two flexible interconnects 400, as just described, to make electrical contact to front surface terminal contacts of two adjacent super cells 100. A bus 9430 running parallel and adjacent to ends of the super cells 100 is conductively bonded to the two flexible interconnects to electrically connect the super cells in parallel. This scheme can be extended to interconnect additional super cells 100 in parallel, as desired. Bus 9430 may be formed from copper ribbon, for example.

Similarly to as described above with respect to FIG. 26, interconnects 400 and bus 9430 may optionally fold around the edge of the super cells so that ribbon portions 9400A and bus 9430 lie behind or partially behind the super cells. In such cases an electrically insulating layer is typically provided between interconnects 400 and the edge and rear surfaces of super cells 100 and between bus 9430 and the edge and rear surfaces of super cells 100.

Figure 28:
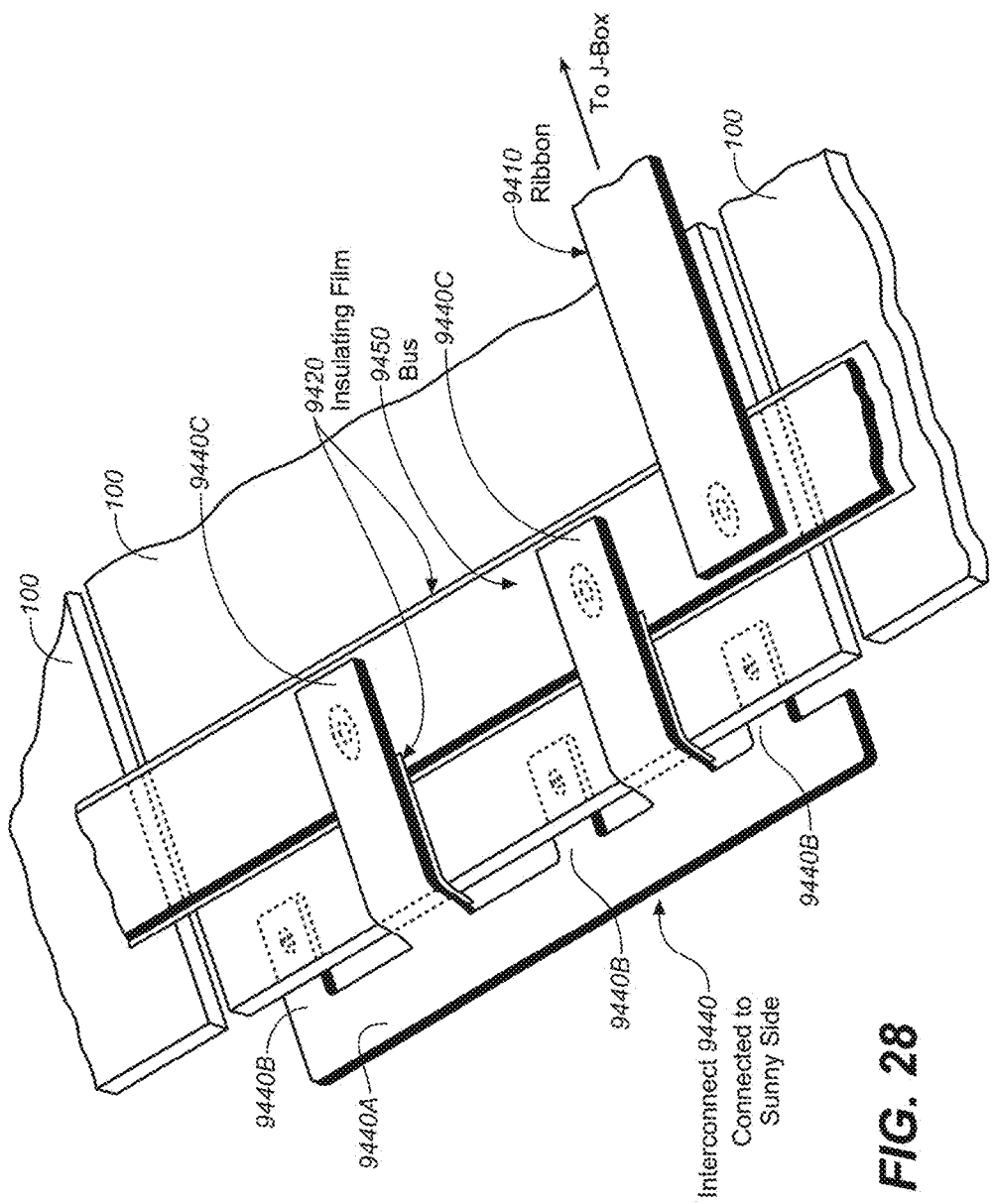
FIG. 28 shows a diagram of the rear (shaded) surface of a solar module illustrating another example electrical interconnection of two or more shingled super cells in parallel, with the front (sun side) surface terminal electrical contacts of the super cells connected to each other and to a junction box on the rear side of the module.

FIG. 28 shows a diagram of the rear (shaded) surface of a solar module illustrating another example electrical interconnection of two or more shingled super cells in parallel, with the front (sun side) surface terminal electrical contacts of the super cells connected to each other and to a junction box on the rear side of the module. The front surface terminal contacts of the shingled super cells may be located adjacent to an edge of the module.

FIG. 28 shows the use of another example flexible interconnect 9440 to electrically contact a front surface end contact of a super cell 100. In this example, flexible interconnect 9440 comprises a ribbon portion 9440A running parallel and adjacent to an end of the super cell 100, fingers 9440B extending perpendicularly to the ribbon portion to contact the front surface metallization pattern (not shown) of the end solar cell in the super cell, to which they are conductively bonded, and fingers 9440C extending perpendicularly to the ribbon portion and behind the super cell. Fingers 9440C are conductively bonded to a bus 9450. Bus 9450 runs parallel and adjacent to the end of super cell 100 along the rear surface of super cell 100, and may extend to overlap adjacent super cells to which it may be similarly electrically connected, thereby connecting the super cells in parallel. Ribbon conductor 9410 conductively bonded to bus 9450 electrically interconnects the super cells to electrical components (e.g., bypass diodes and/or module terminals in a junction box) on the rear surface of the solar module. Electrically insulating films 9420 may be provided between fingers 9440C and the edge and rear surfaces of super cell 100, between bus 9450 and the rear surface of super cell 100, and between ribbon conductor 9410 and the rear surface of super cell 100.

Interconnect 9440 may be die cut from a conducting sheet, for example, and may be optionally patterned to increase its mechanical compliance both perpendicular to and parallel to the edge of the super cell to reduce or accommodate stress perpendicular and parallel to the edge of the super cell arising from mismatch between the CTE of the interconnect and that of the super cell. Such patterning may include, for example, slits, slots, or holes (not shown). The mechanical compliance of interconnect 9440, and its bond to the super cell, should be sufficient for the connection to the super cell to survive stress arising from CTE mismatch during the lamination process described in more detail below. Interconnect 9440 may be bonded to the super cell with, for example, a mechanically compliant electrically conductive bonding material as described above for use in bonding overlapped solar cells. Optionally, the electrically conductive bonding material may be located only at discrete positions along the edge of the super cell (e.g., corresponding to the locations of discrete contact pads on the end solar cell) rather than in a continuous line extending substantially the length of the edge of the super cell, to reduce or accommodate stress parallel to the edge of the super cell arising from mismatch between the coefficient of thermal expansion of the electrically conductive bonding material or the interconnect and that of the super cell.

Interconnect 9440 may be cut from a thin copper sheet, for example, and may be thinner than conventional conductive interconnects when super cells 100 are formed from solar cells having areas smaller than standard silicon solar cells and therefore operate at lower currents than is conventional. For example, interconnects 9440 may be formed from copper sheet having a thickness of about 50 microns to about 300 microns. An interconnect 9440 may be sufficiently thin to accommodate stress perpendicular and parallel to the edge of the super cell arising from mismatch between the CTE of the interconnect and that of the super cell even without being patterned as described above. Bus 9450 may be formed from copper ribbon, for example.

Fingers 9440C may be bonded to bus 9450 after fingers 9440B are bonded to the front surface of super cell 100. In such cases, fingers 9440C may be bent away from the rear surface of super cell 100, for example perpendicularly to super cell 100, when they are bonded to bus 9450. Afterward, fingers 9440C may be bent to run along the rear surface of super cell 100 as shown in FIG. 28.

Figure 29:
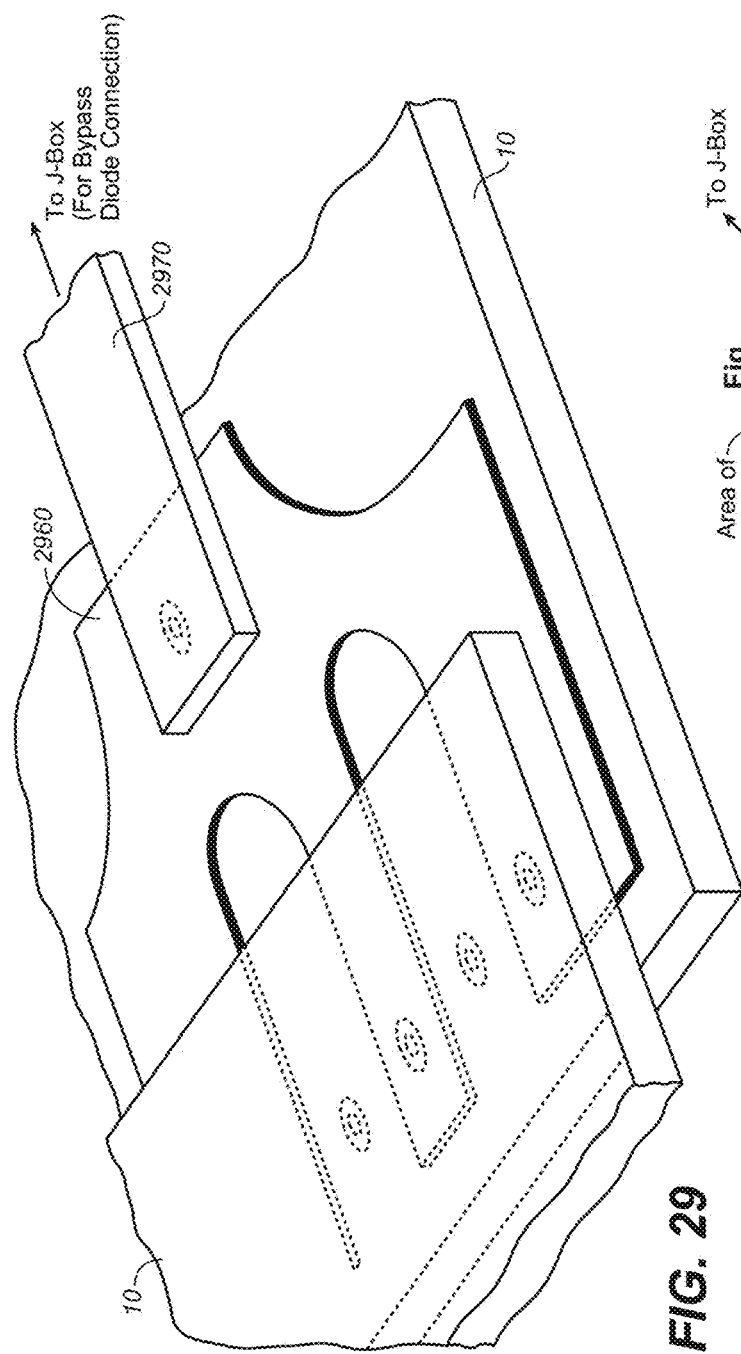
FIG. 29 shows fragmentary cross-sectional and perspective diagrams of two super cells illustrating the use of a flexible interconnect sandwiched between overlapping ends of adjacent super cells to electrically connect the super cells in series and to provide an electrical connection to a junction box.
Figure 29A:
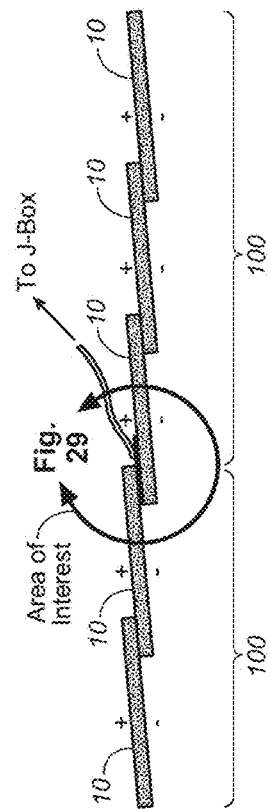
FIG. 29A shows an enlarged view of an area of interest in FIG. 29.

FIG. 29 shows fragmentary cross-sectional and perspective diagrams of two super cells illustrating the use of a flexible interconnect sandwiched between overlapping ends of adjacent super cells to electrically connect the super cells in series and to provide an electrical connection to a junction box. FIG. 29A shows an enlarged view of an area of interest in FIG. 29.

FIG. 29 and FIG. 29A show the use of an example flexible interconnect 2960 partially sandwiched between and electrically interconnecting the overlapping ends of two super cells 100 to provide an electrical connection to the front surface end contact of one of the super cells and to the rear surface end contact of the other super cell, thereby interconnecting the super cells in series. In the illustrated example, interconnect 2960 is hidden from view from the front of the solar module by the upper of the two overlapping solar cells. In another variation, the adjacent ends of the two super cells do not overlap and the portion of interconnect 2960 connected to the front surface end contact of one of the two super cells may be visible from the front surface of the solar module. Optionally, in such variations the portion of the interconnect that is otherwise visible from the front of the module may be covered or colored (e.g., darkened) to reduce visible contrast between the interconnect and the super cells, as perceived by a human having normal color vision. Interconnect 2960 may extend parallel to the adjacent edges of the two super cells beyond the side edges of the super cells to electrically connect the pair of super cells in parallel with a similarly arranged pair of super cells in an adjacent row.

A ribbon conductor 2970 may be conductively bonded to interconnect 2960 as shown to electrically connect the adjacent ends of the two super cells to electrical components (e.g., bypass diodes and/or module terminals in a junction box) on the rear surface of the solar module. In another variation (not shown) a ribbon conductor 2970 may be electrically connected to the rear surface contact of one of the overlapping super cells away from their overlapping ends, instead of being conductively bonded to an interconnect 2960. That configuration may also provide a hidden tap to one or more bypass diodes or other electrical components on the rear surface of the solar module.

Interconnect 2960 may be optionally die cut from a conducting sheet, for example, and may be optionally patterned to increase its mechanical compliance both perpendicular to and parallel to the edges of the super cells to reduce or accommodate stress perpendicular and parallel to the edges of the super cells arising from mismatch between the CTE of the interconnect and that of the super cells. Such patterning may include, for example, slits, slots (as shown), or holes. The mechanical compliance of the flexible interconnect, and its bonds to the super cells, should be sufficient for the interconnected super cells to survive stress arising from CTE mismatch during the lamination process described in more detail below. The flexible interconnect may be bonded to the super cells with, for example, a mechanically compliant electrically conductive bonding material as described above for use in bonding overlapped solar cells. Optionally, the electrically conductive bonding material may be located only at discrete positions along the edges of the super cells rather than in a continuous line extending substantially the length of the edge of the super cells, to reduce or accommodate stress parallel to the edge of the super cells arising from mismatch between the coefficient of thermal expansion of the electrically conductive bonding material or the interconnect and that of the super cells. Interconnect 2960 may be cut from a thin copper sheet, for example.

Embodiments may include one or more features described in the following U.S. Patent Publication documents: U.S. Patent Publication No. 2014/0124013; and U.S. Patent Publication No. 2014/0124014, both of which are incorporated by reference in their entireties herein for all purposes.

This specification discloses high-efficiency solar modules comprising silicon solar cells arranged in a shingled manner and electrically connected in series to form super cells, with the super cells arranged in physically parallel rows in the solar module. The super cells may have lengths spanning essentially the full length or width of the solar module, for example, or two or more super cells may be arranged end-to-end in a row. This arrangement hides solar cell-to-solar cell electrical interconnections, and may therefore be used to create a visually appealing solar module with little to no contrast between adjacent series connected solar cells.

A super cell may comprise any number of solar cells, including in some embodiments at least nineteen solar cells and in certain embodiments greater than or equal to 100 silicon solar cells, for example. Electrical contacts at intermediate locations along a super cell may be desired to electrically segment the super cell into two or more series connected segments while maintaining a physically continuous super cell. This specification discloses arrangements in which such electrical connections are made to back surface contact pads of one or more silicon solar cells in the super cell to provide electrical tapping points that are hidden from view from the front of the solar module, and hence referred to herein as "hidden taps". The hidden tap is the electrical connection between the back of the solar cell and a conductive interconnect.

This specification also discloses the use of flexible interconnects to electrically interconnect front surface super cell terminal contact pads, rear surface super cell terminal contact pads, or hidden tap contact pads to other solar cells or to other electrical components in the solar module.

In addition, this specification discloses the use of an electrically conductive adhesive to directly bond adjacent solar cells to each other in a super cell to provide mechanically compliant electrically conductive bonds that accommodate a mismatch in thermal expansion between the super cells and a glass front sheet of the solar module, in combination with the use of an electrically conductive adhesive to bond flexible interconnects to the super cells with mechanically stiff bonds that force the flexible interconnects to accommodate a mismatch in thermal expansion between flexible interconnects and the super cells. This avoids damage to the solar module that may otherwise occur as a result of thermal cycling of the solar module.

As further described below, electrical connections to hidden tap contact pads may be used to electrically connect segments of a super cell in parallel with corresponding segments of one or more super cells in adjacent rows, and/or to provide electrical connections to the solar module circuit for various applications including but not limited to power optimization (e.g., bypass diodes, AC/DC micro-inverters, DC/DC converters) and reliability applications.

Use of hidden taps as just described may further enhance the aesthetic appearance of the solar module by providing in combination with the hidden cell-to-cell connections a substantially all black appearance for the solar module, and may also increase the efficiency of the solar module by allowing a larger portion of the surface area of the module to be filled by the active areas of the solar cells.

Turning now to the figures for a more detailed understanding of the solar modules described in this specification, FIG. 1 shows a cross-sectional view of a string of series-connected solar cells 10 arranged in a shingled manner with the ends of adjacent solar cells overlapping and electrically connected to form a super cell 100. Each solar cell 10 comprises a semiconductor diode structure and electrical contacts to the semiconductor diode structure by which electric current generated in solar cell 10 when it is illuminated by light may be provided to an external load.

In the examples described in this specification, each solar cell 10 is a rectangular crystalline silicon solar cell having front (sun side) surface and rear (shaded side) surface metallization patterns providing electrical contact to opposite sides of an n-p junction, the front surface metallization pattern is disposed on a semiconductor layer of n-type conductivity, and the rear surface metallization pattern is disposed on a semiconductor layer of p-type conductivity. However, other material systems, diode structures, physical dimensions, or electrical contact arrangements may be used if suitable. For example, the front (sun side) surface metallization pattern may be disposed on a semiconductor layer of p-type conductivity, and the rear (shaded side) surface metallization pattern disposed on a semiconductor layer of n-type conductivity.

Referring again to FIG. 1, in super cell 100 adjacent solar cells 10 are conductively bonded directly to each other in the region in which they overlap by an electrically conducting bonding material that electrically connects the front surface metallization pattern of one solar cell to the rear surface metallization pattern of the adjacent solar cell. Suitable electrically conducting bonding materials may include, for example, electrically conducting adhesives and electrically conducting adhesive films and adhesive tapes, and conventional solders.

FIGS. 31AA and 31A show the use of an example flexible interconnect 3160 partially sandwiched between and electrically interconnecting the overlapping ends of two super cells 100 to provide an electrical connection to the front surface end contact of one of the super cells and to the rear surface end contact of the other super cell, thereby interconnecting the super cells in series. In the illustrated example, interconnect 3160 is hidden from view from the front of the solar module by the upper of the two overlapping solar cells. In another variation, the adjacent ends of the two super cells do not overlap and the portion of interconnect 3160 connected to the front surface end contact of one of the two super cells may be visible from the front surface of the solar module. Optionally, in such variations the portion of the interconnect that is otherwise visible from the front of the module may be covered or colored (e.g., darkened) to reduce visible contrast between the interconnect and the super cells, as perceived by a human having normal color vision. Interconnect 3160 may extend parallel to the adjacent edges of the two super cells beyond the side edges of the super cells to electrically connect the pair of super cells in parallel with a similarly arranged pair of super cells in an adjacent row.

A ribbon conductor 3170 may be conductively bonded to interconnect 3160 as shown to electrically connect the adjacent ends of the two super cells to electrical components (e.g., bypass diodes and/or module terminals in a junction box) on the rear surface of the solar module. In another variation (not shown) a ribbon conductor 3170 may be electrically connected to the rear surface contact of one of the overlapping super cells away from their overlapping ends, instead of being conductively bonded to an interconnect 3160. That configuration may also provide a hidden tap to one or more bypass diodes or other electrical components on the rear surface of the solar module.

FIG. 2 shows an example rectangular solar module 200 comprising six rectangular super cells 100, each of which has a length approximately equal to the length of the long sides of the solar module. The super cells are arranged as six parallel rows with their long sides oriented parallel to the long sides of the module. A similarly configured solar module may include more or fewer rows of such side-length super cells than shown in this example. In other variations the super cells may each have a length approximately equal to the length of a short side of a rectangular solar module, and be arranged in parallel rows with their long sides oriented parallel to the short sides of the module. In yet other arrangements each row may comprise two or more super cells electrically interconnected in series. The modules may have shorts sides having a length, for example, of about 1 meter and long sides having a length, for example, of about 1.5 to about 2.0 meters. Any other suitable shapes (e.g., square) and dimensions for the solar modules may also be used.

Each super cell in this example comprises 72 rectangular solar cells each having a width approximately equal to ⅙ the width of a 156 mm square or pseudo square wafer. Any other suitable number of rectangular solar cells of any other suitable dimensions may also be used.

Solar cells having long and narrow aspect ratios and areas less than that of a standard 156 mm×156 mm solar cell, as illustrated, may be advantageously employed to reduce $I^2R$ resistive power losses in the solar cell modules disclosed in this specification. In particular, the reduced area of solar cells 10 compared to standard size silicon solar cells decreases the current produced in the solar cell, directly reducing resistive power loss in the solar cell and in a series connected string of such solar cells.

A hidden tap to the back surface of a super cell may be made, for example, using an electrical interconnect conductively bonded to one or more hidden tap contact pads located in only an edge portion of the back surface metallization pattern of the solar cell. Alternatively, a hidden tap may be made using an interconnect that runs substantially the full length of the solar cell (perpendicular to the long axis of the super cell) and is conductively bonded to a plurality of hidden tap contact pads distributed along the length of the solar cell in the back surface metallization pattern.

FIG. 31A shows an example solar cell back surface metallization pattern 3300 suitable for use with edge-connected hidden taps. The metallization pattern comprises a continuous aluminum electrical contact 3310, a plurality of silver contact pads 3315 arranged parallel to and adjacent the edge of a long side of the back surface of the solar cell, and silver hidden tap contact pads 3320 each arranged parallel to an adjacent edge of one of the short sides of the back surface of the solar cell. When the solar cell is arranged in a super cell, contact pads 3315 are overlapped by and directly bonded to the front surface of an adjacent rectangular solar cell. An interconnect may be conductively bonded to one or the other of hidden tap contact pads 3320 to provide a hidden tap to the super cell. (Two such interconnects may be employed to provide two hidden taps, if desired).

In the arrangement shown in FIG. 31A, current flow to the hidden tap is through the back surface cell metallization generally parallel to the long sides of the solar cell to the interconnect aggregation point (contact 3320). To facilitate current flow along this path, the back surface metallization sheet resistance is preferably less than or equal to about 5 Ohms per square, or less than or equal to about 2.5 Ohms per square.

FIG. 31B shows another example solar cell back surface metallization pattern 3301 suitable for use with hidden taps employing a bus-like interconnect along the length of the back surface of a solar cell. The metallization pattern comprises a continuous aluminum electrical contact 3310, a plurality of silver contact pads 3315 arranged parallel to and adjacent the edge of a long side of the back surface of the solar cell, and a plurality of silver hidden tap contact pads 3325 arranged in a row parallel to the long sides of the solar cell and approximately centered on the back surface of the solar cell. An interconnect running substantially the full length of the solar cell may be conductively bonded to hidden tap contact pads 3325 to provide a hidden tap to the super cell. Current flow to the hidden tap is primarily through the bus-like interconnect, making the conductivity of the back surface metallization pattern less important to the hidden tap.

The location and number of hidden tap contact pads to which the hidden tap interconnect is bonded on the back surface of a solar cell affects the length of the current path through the back surface metallization of the solar cell, the hidden tap contact pads, and the interconnect. Consequently the arrangement of the hidden tap contact pads may be selected to minimize the resistance to current collection in the current path to and through the hidden tap interconnect. In addition to the configurations shown in FIGS. 31A-31B (and FIG. 31C discussed below), suitable hidden tap contact pad arrangements may include for example a two dimensional array, and a row running perpendicular to the long axis of the solar cell. In the latter case the row of hidden tap contact pads may be located adjacent a short edge of the first solar cell, for example.

FIG. 31C shows another example solar cell back surface metallization pattern 3303 suitable for use either with edge-connected hidden taps or hidden taps employing a bus-like interconnect along the length of the back surface of a solar cell. The metallization pattern comprises a continuous copper contact pad 3315 arranged parallel to and adjacent the edge of a long side of the back surface of the solar cell, a plurality of copper fingers 3317 connected to and extending perpendicularly from contact pad 3315, and a continuous copper bus hidden tap contact pad 3325 running parallel to the long sides of the solar cell and approximately centered on the back surface of the solar cell. An edge-connected interconnect may be bonded to an end portion of copper bus 3325 to provide a hidden tap to the super cell. (Two such interconnects may be employed at either end of copper bus 3325 to provide two hidden taps, if desired). Alternatively, an interconnect running substantially the full length of the solar cell may be conductively bonded to copper bus 3325 to provide a hidden tap to the super cell.

The interconnect employed to form the hidden tap may be bonded to the hidden tap contact pad in the back surface metallization pattern by soldering, welding, conductive adhesive, or in any other suitable manner. For metallization patterns employing silver pads as illustrated in FIGS. 31A-31B, the interconnect may be formed for example from tin-coated copper. Another approach is to make the hidden tap directly to aluminum back surface contact 3310 with an aluminum conductor forming an aluminum to aluminum bond, which may be formed for example by electrical or laser welding, soldering, or conductive adhesive. In certain embodiments, the contacts may comprise tin. In cases as just described, the back surface metallization of the solar cell would lack silver contact pads 3320 (FIG. 31A) or 3325 (FIG. 31B), but an edge-connected or bus-like aluminum interconnect could be bonded to aluminum (or tin) contact 3310 at locations corresponding to those contact pads.

Differential thermal expansion between hidden tap interconnects (or interconnects to front or rear surface super cell terminal contacts) and silicon solar cells, and the resulting stress on the solar cell and the interconnect, can lead to cracking and other failure modes that can degrade performance of the solar module. Consequently, it is desirable that the hidden tap and other interconnects be configured to accommodate such differential expansion without significant stress developing. The interconnects may provide stress and thermal expansion relief by, for example, being formed from highly ductile materials (e.g., soft copper, very thin copper sheet), being formed from low thermal expansion coefficient materials (e.g., Kovar, Invar or other low thermal expansion iron-nickel alloys) or from materials having a thermal expansion coefficient approximately matching that of silicon, incorporating in-plane geometric expansion features such as slits, slots, holes, or truss structures that accommodate differential thermal expansion between the interconnect and the silicon solar cell, and/or employing out-of-plane geometric features such as kinks, jogs, or dimples that accommodate such differential thermal expansion. Portions of the interconnects bonded to hidden tap contact pads (or bonded to super cell front or rear surface terminal contact pads as described below) may have a thickness of, for example, less than about 100 microns, less than about 50 microns, less than about 30 microns, or less than about 25 microns to increase the flexibility of the interconnects.

Referring again to FIGS. 7A, 7B-1, and 7B-2, these figures show several example interconnect configurations, designated by reference numerals 400A-400U, that employ stress-relieving geometrical features and may be suitable for use as interconnects for hidden taps or for electrical connections to front or rear surface super cell terminal contacts. These interconnects typically have a length approximately equal to the length of the long sides of a rectangular solar cell to which they are bonded, but they may have any other suitable length. Example interconnects 400A-400T shown in FIG. 7A employ various in-plane stress-relieving features. Example interconnect 400U shown in the in-plane (x-y) view of FIG. 7B-1 and in the out-of-plane (x-z) view of FIG. 7B-2 employs bends 3705 as out of-plane-stress relieving features in a thin metal ribbon. Bends 3705 reduce the apparent tensile stiffness of the metal ribbon. The bends allow the ribbon material to locally bend instead of only elongating when the ribbon is under tension. For thin ribbons, this can significantly reduce the apparent tensile stiffness by, for example, 90% or more. The exact amount of apparent tensile stiffness reduction depends on several factors, including the number of bends, geometry of the bends, and the thickness of the ribbon. An interconnect may also employ in-plane and out-of-plane stress-relieving features in combination.

FIGS. 37A-1 to 38B-2, further discussed below, show several example interconnect configurations that employ in-plane and/or out-of-plane stress relieving geometrical features and may be suitable for use as edge-connected interconnects for hidden taps.

To reduce or minimize the number of conductor runs needed to connect each hidden tap, a hidden tap interconnect bus may be utilized. This approach connects adjacent super cell hidden tap contact pads to one another by using a hidden tap interconnect. (The electrical connection is typically positive-to-positive or negative-to-negative, i.e. the same polarity at each end).

Figure 32:
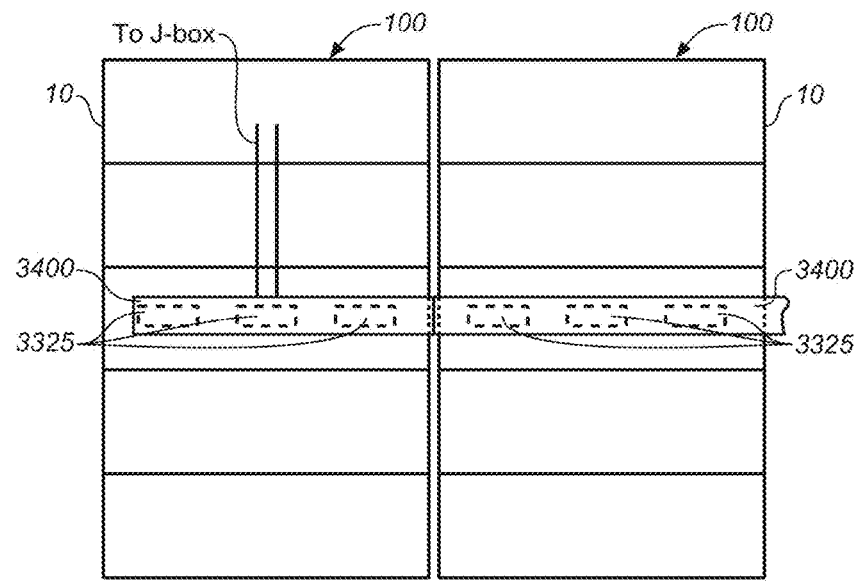
FIGS. 32-33 show examples of the use of hidden taps with interconnects that run approximately the full width of the super cell.
Figure 33:
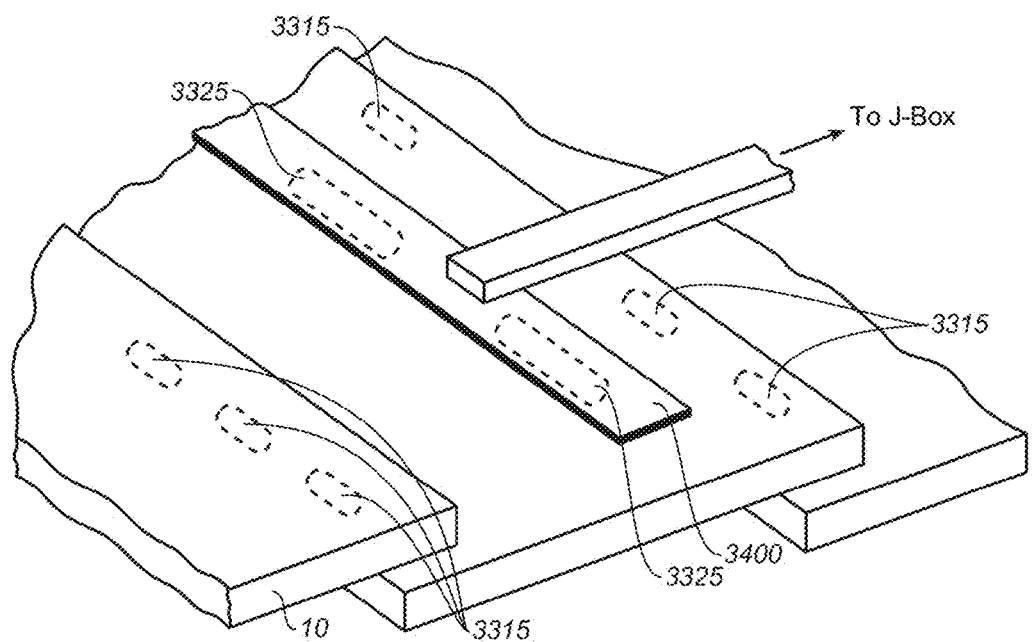
Figures 1, 38A:
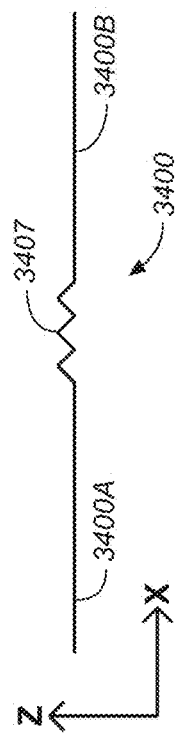
Figures 2, 38A:
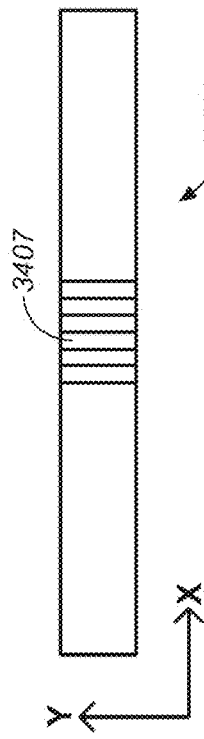
Figures 1, 38B:
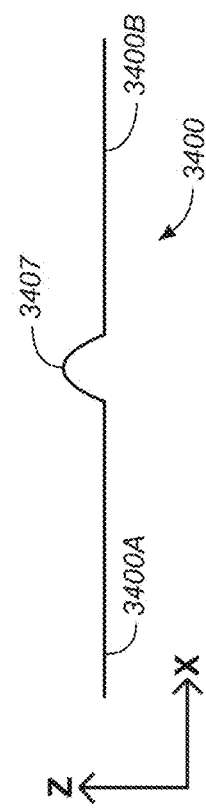
Figures 2, 38B:
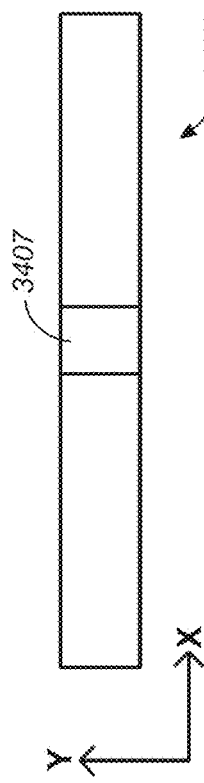

For example, FIG. 32 shows a first hidden tap interconnect 3400 running substantially the full width of a solar cell 10 in a first super cell 100 and conductively bonded to hidden tap contact pads 3325 arranged as shown in FIG. 31B, and a second hidden tap interconnect 3400 running the full width of a corresponding solar cell in a super cell 100 in an adjacent row and similarly conductively bonded to hidden tap contact pads 3325 arranged as shown in FIG. 31B. The two interconnects 3400 are arranged in line with and optionally abutting or overlapping each other, and may be conductively bonded to each other or otherwise electrically connected to form a bus interconnecting the two adjacent super cells. This scheme may be extended across additional rows (e.g., all rows) of super cells as desired to form a parallel segment of a solar module comprising segments of several adjacent super cells. FIG. 33 shows a perspective view of a portion of a super cell from FIG. 32.

FIG. 35 shows an example in which super cells in adjacent rows are interconnected by a short interconnect 3400 that spans the gap between the super cells and is conductively bonded to a hidden tap contact pad 3320 on one super cell and to another hidden tap contact pad 3320 on the other super cell, with the contact pads arranged as shown in FIG. 32A. FIG. 36 shows a similar arrangement in which a short interconnect spans the gap between two super cells in adjacent rows and is conductively bonded to the end of a central copper bus portion of the back surface metallization on one super cell and to an adjacent end of a central copper bus portion of the back surface metallization of the other super cell, with the copper back surface metallization configured as shown in FIG. 31C. In both examples the interconnection schemes may be extended across additional rows (e.g., all rows) of super cells as desired to form a parallel segment of a solar module comprising segments of several adjacent super cells.

FIGS. 37A-1 to 37F-3 show in plane (x-y) and out-of-plane (x-z) views of example short hidden tap interconnects 3400 comprising in-plane stress relieving features 3405. (The x-y plane is the plane of the solar cell back surface metallization pattern). In the examples of FIGS. 37A-1 to 37E-2 each interconnect 3400 comprises tabs 3400A and 3400B positioned on opposite sides of one or more in-plane stress-relieving features. Example in-plane stress relieving features include arrangements of one, two, or more hollow diamond shapes, zig-zags, and arrangements of one, two, or more slots.

Figures 3, 12C:
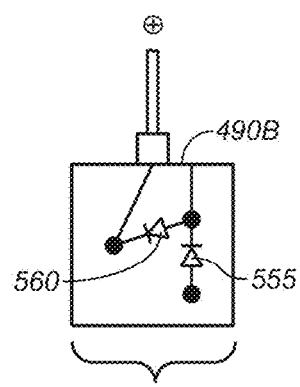

The term "in plane stress relieving feature" as used herein can also refer to the thickness or ductility of the interconnect or of a portion of the interconnect. For example, interconnect 3400 shown in FIGS. 37F-1 to 37F-3 is formed from a straight flat length of thin copper ribbon or copper foil having a thickness T in the x-y plane of, for example, less than or equal to about 100 microns, less than or equal to about 50 microns, less than or equal to about 30 microns, or less than or equal to about 25 microns to increase the flexibility of the interconnect. The thickness T may be, for example, about 50 microns. The length L of the interconnect may be, for example, about 8 centimeters (cm) and the width W of the interconnect may be, for example, about 0.5 cm. FIGS. 37F-3 and 37F-1 show, respectively, front and rear surface views of the interconnect in the x-y plane. The front surface of the interconnect faces the rear surface of the solar module. Because the interconnect may span the gap between two parallel rows of super cells in a solar module, a portion of the interconnect may be visible through that gap from the front of the solar module. Optionally, that visible portion of the interconnect may be blackened, e.g. coated with a black polymer layer, to reduce its visibility. In the illustrated example, a central portion 3400C of the front surface of the interconnect having a length L2 of about 0.5 cm is coated with a thin black polymer layer. Typically, L2 is greater than or equal to the width of the gap between super cell rows. The black polymer layer may have a thickness of, for example, about 20 microns. Such a thin copper ribbon interconnect may optionally also employ in-plane or out-of-plane stress relieving features as described above. For example, the interconnect may include stress-relieving out-of-plane bends as described above with respect to FIGS. 7B-1 and 7B-2.

FIGS. 38A-1 to 38B-2 show in plane (x-y) and out-of-plane (x-z) views of example short hidden tap interconnects 3400 comprising out-of-plane stress relieving features 3407. In the examples each interconnect 3400 comprises tabs 3400A and 3400B positioned on opposite sides of one or more out-of-plane stress-relieving features. Example out-of-plane stress relieving features include arrangements of one, two, or more bends, kinks, dimples, jogs, or ridges.

The types and arrangements of stress relieving features illustrated in FIGS. 37A-1 to 37E-2 and 38A-1 to 38B-2, and the interconnect ribbon thicknesses described above with respect to FIGS. 37F-1 to 37F-3, may also be employed in long hidden tap interconnects as described above and in interconnects bonded to super cell rear or front surface terminal contacts, as suitable. An interconnect may comprise both in-plane and out-of plane stress relieving features in combination. The in-plane and out-of-plane stress relieving features are designed to reduce or minimize strain and stress effects on the solar cell joint and thereby create highly reliable and resilient electrical connections.

FIGS. 39A-1 and 39A-2 show example configurations for short hidden tap interconnects comprising cell contact pad alignment and super cell edge alignment features to facilitate automation, ease of manufacturing and placement accuracy. FIGS. 39B-1 and 39B-2 show an example configuration for short hidden tap interconnects that comprise asymmetric tab lengths. Such asymmetric interconnects may be used in opposite orientations to avoid overlap of conductors running parallel to the long axis of the super cells. (See discussion of FIGS. 42A-42B below).

Hidden taps as described herein may form the electrical connections needed in module layout to provide a desired module electrical circuit. Hidden tap connections may be made, for example, at intervals of 12, 24, 36, or 48 solar cells along a super cell, or at any other suitable interval. The interval between hidden taps may be determined based on the application.

Each super cell typically comprises a front surface terminal contact at one end of the super cell and a rear surface terminal contact at the other end of the super cell. In variations in which a super cell spans the length or width of the solar module, these terminal contacts are located adjacent to opposite edges of the solar module.

A flexible interconnect may be conductively bonded to a front or rear surface terminal contact of a super cell to electrically connect the super cell to other solar cells or to other electrical components in the module. For example, FIG. 34A shows a cross-sectional view of an example solar module with an interconnect 3410 conductively bonded to a rear surface terminal contact at the end of a super cell. Rear surface terminal contact interconnect 3410 may be or comprise, for example, a thin copper ribbon or foil having a thickness perpendicular to the surface of the solar cell to which it is bonded of less than or equal to about 100 microns, less than or equal to about 50 microns, less than or equal to about 30 microns, or less than or equal to about 25 microns to increase the flexibility of the interconnect. The interconnect may have a width of, for example, greater than or equal to about 10 mm in the plane of the surface of the solar cell in a direction perpendicular to the flow of current though the interconnect to improve conduction. As illustrated, a rear surface terminal contact interconnect 3410 may lie behind the solar cells, with no portion of the interconnect extending beyond the super cell in the direction parallel to the super cell row.

Similar interconnects may be used to connect to front surface terminal contacts. Alternatively, to reduce the area of the front surface of the solar module occupied by front surface terminal interconnects, a front surface interconnect may comprise a thin flexible portion directly bonded to the super cell and a thicker portion providing a higher conductivity. This arrangement reduces the width of the interconnect necessary to achieve a desired conductivity. The thicker portion of the interconnect may be an integral portion of the interconnect, for example, or may be a separate piece bonded to the thinner portion of the interconnect. For example, FIGS. 34B-34C each show a cross-sectional view of an example interconnect 3410 conductively bonded to a front surface terminal contact at an end of a super cell. In both examples a thin flexible portion 3410A of the interconnect directly bonded to the super cell comprises a thin copper ribbon or foil having a thickness perpendicular to the surface of the solar cell to which it is bonded of less than or equal to about 100 microns, less than or equal to about 50 microns, less than or equal to about 30 microns, or less than or equal to about 25. A thicker copper ribbon portion 3410B of the interconnect is bonded to thin portion 3410A to improve the conductivity of the interconnect. In FIG. 34B, an electrically conductive tape 3410C on the rear surface of thin interconnect portion 3410A bonds the thin interconnect portion to the super cell and to thick interconnect portion 3410B. In FIG. 34C, thin interconnect portion 3410A is bonded to thick interconnect portion 3410B with an electrically conductive adhesive 3410D and bonded to the super cell with an electrically conductive adhesive 3410E. Electrically conductive adhesives 3410D and 3410E may be the same or different. Electrically conductive adhesive 3410E may be, for example, a solder.

Solar modules described in this specification may comprise a laminate structure as shown in FIG. 34A, with super cells and one or more encapsulant materials 3610 sandwiched between a transparent front sheet 3620 and a back sheet 3630. The transparent front sheet may be glass, for example. The back sheet may also be glass, or any other suitable material. An extra strip of encapsulant may be disposed between a rear surface terminal interconnect 3410 and the rear surface of the super cell, as illustrated.

As noted above, hidden taps afford an "all black" module aesthetic. Because these connections are made with conductors that are typically highly reflective, they would normally be of high contrast to the attached solar cells. However, by forming the connections on the back surface of the solar cells and by also routing other conductors in the solar module circuit behind the solar cells the various conductors are hidden from view. This allows multiple connection points (hidden taps) while still maintaining the "all black" appearance.

Hidden taps can be used to form various module layouts. In the example of FIG. 40 (physical layout) and FIG. 41 (electrical schematic), a solar module comprises six super cells each of which run the length of the module. Hidden tap contact pads and short interconnects 3400 segment each super cell into thirds and electrically connect adjacent super cell segments in parallel, thereby forming three groups of parallel connected super cell segments. Each group is connected in parallel with a different one of bypass diodes 1300A-1300C incorporated into (embedded in) the module's laminate construction. The bypass diodes may be located, for example, directly behind super cells or between super cells. The bypass diodes may be located approximately along a center line of the solar module parallel to the long sides of the solar module, for example.

Figure 42B:
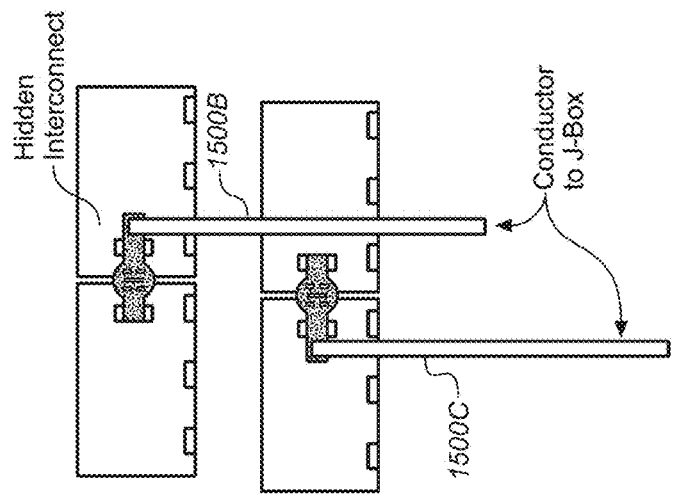
Figure 42A:
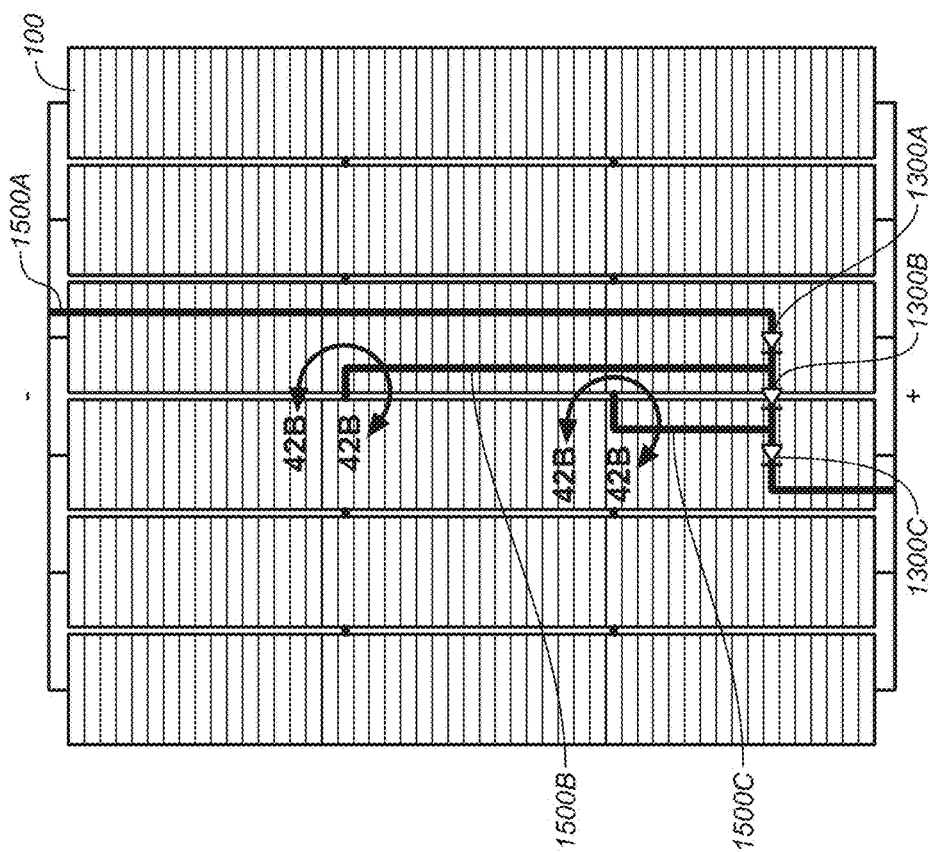

In the example of FIGS. 42A-42B (also corresponding to the electrical schematic of FIG. 41), a solar module comprises six super cells each of which run the length of the module. Hidden tap contact pads and short interconnects 3400 segment each super cell into thirds and electrically connect adjacent super cell segments in parallel, thereby forming three groups of parallel connected super cell segments. Each group is connected in parallel with a different one of bypass diodes 1300A-1300C through bus connections 1500A-1500C, which are located behind the super cells and connect the hidden tap contact pads and short interconnects to the bypass diodes located in the back of the module within a junction box.

FIG. 42B provides a detailed view of the connection of short hidden tap interconnects 3400 and conductors 1500B and 1500C. As depicted these conductors do not overlap each other. In the illustrated example this is enabled by the use of asymmetric interconnects 3400 arranged in opposite orientations. An alternative approach to avoiding overlap of the conductors is to employ a first symmetric interconnect 3400 having tabs of one length and a second symmetric interconnect 3400 having tabs of a different length.

Figure 43:
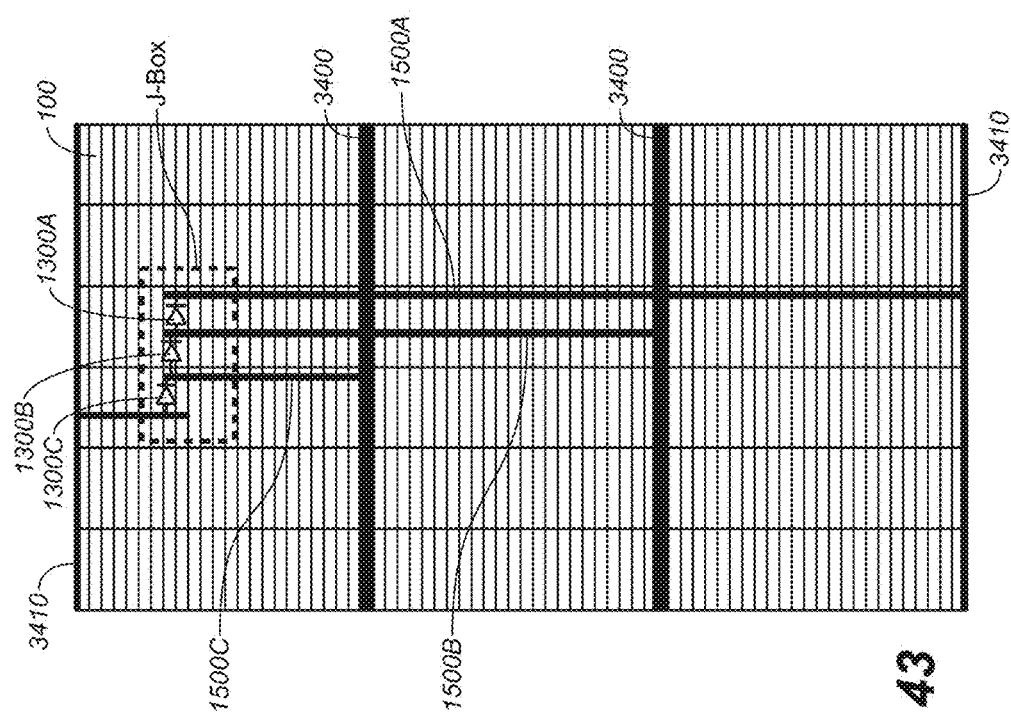

In the example of FIG. 43 (also corresponding to the electrical schematic of FIG. 41), a solar module is configured similarly to as shown in FIG. 42A except that hidden tap interconnects 3400 form continuous buses that run substantially the full width of the solar module. Each bus may be a single long interconnect 3400 conductively bonded to the back surface metallization of each super cell. Alternatively, the bus may comprise multiple individual interconnects, each spanning a single super cell, conductively bonded to each other or otherwise electrically interconnected as described above with respect to FIG. 41. FIG. 43 also shows super cell terminal interconnects 3410 forming a continuous bus along one end of the solar module to electrically connect the front surface terminal contacts of the super cells, and additional super cell terminal interconnects 3410 forming a continuous bus along the opposite end of the solar module to electrically connect the rear surface terminal contacts of the super cells.

The example solar module of FIGS. 44A-44B also corresponds to the electrical schematic of FIG. 41. This example employs short hidden tap interconnects 3400 as in FIG. 42A and interconnects 3410 forming continuous buses for the super cell front and rear surface terminal contacts, as in FIG. 43.

In the example of FIG. 47A (physical layout) and FIG. 47B (electrical schematic), a solar module comprises six super cells each of which run the full length of the solar module. Hidden tap contact pads and short interconnects 3400 segment each super cell into a ⅔ length section and a ⅓ length section. Interconnects 3410 at the lower edge of the solar module (as depicted in the drawing) interconnect the left hand three rows in parallel with each other, the right hand three rows in parallel with each other, and the left hand three rows in series with the right hand three rows. This arrangement forms three groups of parallel connected super cell segments with each super cell group having a length of ⅔ the length of a super cell. Each group is connected in parallel with a different one of bypass diodes 2000A-2000C. This arrangement provides about twice the voltage and about half of the current that would be provided by the same super cells if they were instead electrically connected as shown in FIG. 41.

As noted above with reference to FIG. 34A, interconnects bonded to super cell rear surface terminal contacts may lie entirely behind the super cells and be hidden from view from the front (sun) side of the solar module. Interconnects 3410 bonded to super cell front surface terminal contacts may be visible in a rear view of the solar module (e.g., as in FIG. 43) because they extend beyond the ends of the super cells (e.g., as in FIG. 44A) or because they fold around and under the ends of the super cells.

The use of hidden taps facilitates grouping small numbers of solar cells per bypass diode. In the examples of FIGS. 48A-48B (each showing a physical layout), a solar module comprises six super cells each of which run the length of the module. Hidden tap contact pads and short interconnects 3400 segment each super cell into fifths and electrically connect adjacent super cell segments in parallel, thereby forming five groups of parallel connected super cell segments. Each group is connected in parallel with a different one of bypass diodes 2100A-2100E incorporated into (embedded in) the module's laminate construction. The bypass diodes may be located, for example, directly behind super cells or between super cells. Super cell terminal interconnects 3410 form a continuous bus along one end of the solar module to electrically connect the front surface terminal contacts of the super cells, and additional super cell terminal interconnects 3410 form a continuous bus along the opposite end of the solar module to electrically connect the rear surface terminal contacts of the super cells. In the example of FIG. 48A, a single junction box 2110 is electrically connected to the front and rear surface terminal interconnect buses by conductors 2115A and 2115B. There are no diodes in the junction box, however, so alternatively (FIG. 48B) the long return conductors 2215A and 2115B can be eliminated and the single junction box 2110 replaced with two single polarity (+ or −) junction boxes 2110A-2110B located, for example, at opposite edges of the module. This eliminates resistive loss in the long return conductors.

Although the examples described herein use hidden taps to electrically segment each super cell into three or five groups of solar cells, these examples are intended to be illustrative but not limiting. More generally, hidden taps may be used to electrically segment a super cell into more or fewer groups of solar cells then illustrated, and/or into more or fewer solar cells per group then illustrated.

In normal operation of the solar modules described herein, with no bypass diode forward biased and in conduction, little or no current flows through any hidden tap contact pad. Instead, current flows through the length of each super cell through the cell-to-cell conductive bonds formed between adjacent overlapping solar cells. In contrast, FIG. 45 shows current flow when a portion of the solar module is bypassed through a forward biased bypass diode. As indicated by the arrows, in this example current in the leftmost super cell flows along the super cell until it reaches the tapped solar cell, then through that solar cell's back surface metallization, a hidden tap contact pad (not shown), an interconnect 3400 to a second solar cell in the adjacent super cell, another hidden tap contact pad (not shown) to which the interconnect is bonded on the second solar cell, through the back surface metallization of the second solar cell, and through additional hidden tap contact pads, interconnects, and solar cell back surface metallization to reach bus connection 1500 to the bypass diode. Current flow through the other super cells is similar. As is apparent from the illustration, under such circumstances hidden tap contact pads may conduct current from two or more rows of super cells, and thus conduct a current greater than the current generated in any single solar cell in the module.

Typically there is no bus bar, contact pad, or other light blocking element (other than front surface metallization fingers or an overlapping portion of an adjacent solar cell) on the front surface of a solar cell opposite from a hidden tap contact pad. Consequently, if the hidden tap contact pad is formed from silver on a silicon solar cell, the light conversion efficiency of the solar cell in the region of the hidden tap contact pad may be reduced if the silver contact pad reduces the effect of a back surface field that prevents back surface carrier recombination. In order to avoid this loss of efficiency, typically most of the solar cells in a super cell do not comprise hidden tap contact pads. (For example, in some variations only those solar cells for which a hidden tap contact pad is necessary for a bypass diode circuit will comprise such a hidden tap contact pad). Further, to match the current generation in solar cells that include hidden tap contact pads to the current generation in solar cells that lack hidden tap contact pads, the solar cells comprising hidden tap contact pads may have a larger light collection area than the solar cells lacking hidden tap contact pads.

Individual hidden tap contact pads may have rectangular dimensions of, for example, less than or equal to about 2 mm by less than or equal to about 5 mm.

Solar modules are subject to temperature cycling as a result of temperature variations in their installed environment, during operation, and during testing. As shown in FIG. 46A, during such temperature cycling a mismatch in thermal expansion between the silicon solar cells in the super cell and other portions of the module, for example a glass front sheet of the module, results in relative motion between the super cell and the other portions of the module along the long axis of the super cell rows. This mismatch tends to stretch or compress the super cells, and may damage the solar cells or the conductive bonds between solar cells in the super cells. Similarly, as shown in FIG. 46B, during temperature cycling a mismatch in thermal expansion between an interconnect bonded to a solar cell and the solar cell results in relative motion between the interconnect and the solar cell in the direction perpendicular to the rows of super cells. This mismatch strains and may damage the solar cells, the interconnect, and the conductive bond between them. This may occur for interconnects bonded to hidden tap contact pads and for interconnects bonded to super cell front or rear surface terminal contacts.

Similarly, cyclical mechanical loading of a solar module, for example during shipping or from weather (e.g. wind and snow), can create local shear forces at the cell-to-cell bonds within a super cell and at the bond between a solar cell and an interconnect. These shear forces can also damage the solar module.

To prevent problems arising from relative motion between the super cells and other portions of the solar module along the long axis of the super cell rows, the conductive adhesive used to bond adjacent overlapping solar cells to each other may be selected to form a flexible conductive bond 3515 (FIG. 46A) between overlapping solar cells that provides mechanical compliance to the super cells accommodating a mismatch in thermal expansion between the super cells and a glass front sheet of the module in a direction parallel to the rows for a temperature range of about −40° C. to about 100° C. without damaging the solar module. The conductive adhesive may be selected to form conductive bonds having a shear modulus at standard test conditions (i.e., 25° C.) of, for example, less than or equal to about 100 megapascals (MPa), less than or equal to about 200 MPa, less than or equal to about 300 MPa, less than or equal to about 400 MPa, less than or equal to about 500 MPa, less than or equal to about 600 MPa, less than or equal to about 700 MPa, less than or equal to about 800 MPa, less than or equal to about 900 MPa, or less than or equal to about 1000 MPa. The flexible conductive bonds between overlapping adjacent solar cells may accommodate differential motion between each cell and the glass front sheet of greater than or equal to about 15 microns, for example. Suitable conductive adhesives may include, for example, ECM 1541-S3 available from Engineered Conductive Materials LLC.

To promote the flow of heat along a super cell, which reduces the risk of damage to the solar module from hot spots that may arise during operation of the solar module if a solar cell in the module is reverse biased as a resulting of shading or for some other reason, conductive bonds between overlapping adjacent solar cells may be formed with, for example, a thickness perpendicular to the solar cells of less than or equal to about 50 microns and a thermal conductivity perpendicular to the solar cells greater than or equal to about 1.5 W/(meter-K).

To prevent problems arising from relative motion between an interconnect and a solar cell to which it is bonded, the conductive adhesive used to bond the interconnect to the solar cell may be selected to form a conductive bond between the solar cell and the interconnect that is sufficiently stiff to force the interconnect to accommodate a mismatch in thermal expansion between the solar cell and the interconnect for a temperature range of about −40° C. to about 180° C. without damaging the solar module. This conductive adhesive may be selected to form a conductive bond having a shear modulus at standard test conditions (i.e., 25° C.) of, for example, greater than or equal to about 1800 MPa, greater than or equal to about 1900 MPa, greater than or equal to about 2000 MPa, greater than or equal to about 2100 MPa, greater than or equal to about 2200 MPa, greater than or equal to about 2300 MPa, greater than or equal to about 2400 MPa, greater than or equal to about 2500 MPa, greater than or equal to about 2600 MPa, greater than or equal to about 2700 MPa, greater than or equal to about 2800 MPa, greater than or equal to about 2900 MPa, greater than or equal to about 3000 MPa, greater than or equal to about 3100 MPa greater than or equal to about 3200 MPa, greater than or equal to about 3300 MPa, greater than or equal to about 3400 MPa, greater than or equal to about 3500 MPa, greater than or equal to about 3600 MPa, greater than or equal to about 3700 MPa, greater than or equal to about 3800 MPa, greater than or equal to about 3900 MPa, or greater than or equal to about 4000 MPa. In such variations the interconnect may withstand thermal expansion or contraction of the interconnect of greater than or equal to about 40 microns, for example. Suitable conductive adhesives may include, for example, Hitachi CP-450 and solders.

Hence, the conductive bonds between overlapping adjacent solar cells within a super cell may utilize a different conductive adhesive than the conductive bonds between the super cell and the flexible electrical interconnect. For example, the conductive bond between the super cell and the flexible electrical interconnect may be formed from a solder, and the conductive bonds between overlapping adjacent solar cells formed from a non-solder conductive adhesive. In some variations, both conductive adhesives can be cured in a single process step, for example in an about 150° C. to about 180° C. process window.

The above discussion has focused upon assembling a plurality of solar cells (which may be cut solar cells) in a shingled manner on a common substrate. This results in the formation of a module.

In order to gather a sufficient amount of solar energy to be useful, however, an installation typically comprises a number of such modules that are themselves assembled together.

According to embodiments, a plurality of solar cell modules may also be assembled in a shingled manner to increase the area efficiency of an array.

In particular embodiments, a module may feature a top conductive ribbon facing a direction of solar energy, and a bottom conductive ribbon facing away from the direction of solar energy.

The bottom ribbon is buried beneath the cells. Thus, it does not block incoming light and adversely impact an area efficiency of the module. By contrast, the top ribbon is exposed and can block the incoming light and adversely impact efficiency.

According to embodiments the modules themselves can be shingled, such that the top ribbon is covered by the neighboring module. This shingled module configuration could also provide for additional area on the module for other elements, without adversely impacting a final exposed area of the module array. Examples of module elements that may be positioned in overlapping regions can include but are not limited to, junction boxes (j-boxes) and/or bus ribbons.

In certain embodiments, j-boxes of the respective adjacent shingled modules and are in a mating arrangement in order to achieve electrical connection between them. This simplifies the configuration of the array of shingled modules by eliminating wiring.

In certain embodiments, the j-boxes could be reinforced and/or combined with additional structural standoffs. Such a configuration could create an integrated tilted module roof mount rack solution, wherein a dimension of the junction box determines a tilt. Such an implementation may be particularly useful where an array of shingled modules is mounted on a flat roof.

Shingled super cells open up unique opportunities for module layout with respect to module level power management devices (for example, DC/AC micro-inverters, DC/DC module power optimizers, voltage intelligence and smart switches, and related devices). A feature of module level power management systems is power optimization. Super cells as described and employed herein may produce higher voltages than traditional panels. In addition, super cell module layout may further partition the module. Both higher voltages and increased partitioning create potential advantages for power optimization.

This specification discloses high-efficiency solar modules (i.e., solar panels) comprising narrow rectangular silicon solar cells arranged in a shingled manner and electrically connected in series to form super cells, with the super cells arranged in physically parallel rows in the solar module. The super cells may have lengths spanning essentially the full length or width of the solar module, for example, or two or more super cells may be arranged end-to-end in a row. Each super cell may include any number of solar cells, including in some variations at least nineteen solar cells and in certain variations greater than or equal to 100 silicon solar cells, for example. Each solar module may have a conventional size and shape and yet include hundreds of silicon solar cells, allowing the super cells in a single solar module to be electrically interconnected to provide a direct current (DC) voltage of for example, about 90 Volts (V) to about 450 V or more.

As further described below, this high DC voltage facilitates conversion from direct to alternating current (AC) by an inverter (e.g., microinverter located on the solar module) by eliminating or reducing the need for a DC to DC boost (step-up in DC voltage) prior to conversion to AC by the inverter. Also as further described below, the high DC voltage also facilitates the use of arrangements in which DC/AC conversion is performed by a central inverter receiving high voltage DC output from two or more high voltage shingled solar cell modules electrically connected in parallel with each other.

Turning now to the figures for a more detailed understanding of the solar modules described in this specification, FIG. 1 shows a cross-sectional view of a string of series-connected solar cells 10 arranged in a shingled manner with the ends of adjacent solar cells overlapping and electrically connected to form a super cell 100. Each solar cell 10 comprises a semiconductor diode structure and electrical contacts to the semiconductor diode structure by which electric current generated in solar cell 10 when it is illuminated by light may be provided to an external load.

In the examples described in this specification, each solar cell 10 is a rectangular crystalline silicon solar cell having front (sun side) surface and rear (shaded side) surface metallization patterns providing electrical contact to opposite sides of an n-p junction, the front surface metallization pattern is disposed on a semiconductor layer of n-type conductivity, and the rear surface metallization pattern is disposed on a semiconductor layer of p-type conductivity. However, other material systems, diode structures, physical dimensions, or electrical contact arrangements may be used if suitable. For example, the front (sun side) surface metallization pattern may be disposed on a semiconductor layer of p-type conductivity, and the rear (shaded side) surface metallization pattern disposed on a semiconductor layer of n-type conductivity.

Referring again to FIG. 1, in super cell 100 adjacent solar cells 10 are conductively bonded to each other in the region in which they overlap by an electrically conducting bonding material that electrically connects the front surface metallization pattern of one solar cell to the rear surface metallization pattern of the adjacent solar cell. Suitable electrically conducting bonding materials may include, for example, electrically conducting adhesives and electrically conducting adhesive films and adhesive tapes, and conventional solders.

FIG. 2 shows an example rectangular solar module 200 comprising six rectangular super cells 100, each of which has a length approximately equal to the length of the long sides of the solar module. The super cells are arranged as six parallel rows with their long sides oriented parallel to the long sides of the module. A similarly configured solar module may include more or fewer rows of such side-length super cells than shown in this example. In other variations the super cells may each have a length approximately equal to the length of a short side of a rectangular solar module, and be arranged in parallel rows with their long sides oriented parallel to the short sides of the module. In yet other arrangements each row may comprise two or more super cells electrically interconnected in series. The modules may have shorts sides having a length, for example, of about 1 meter and long sides having a length, for example, of about 1.5 to about 2.0 meters. Any other suitable shapes (e.g., square) and dimensions for the solar modules may also be used.

In some variations, the conductive bonds between overlapping solar cells provide mechanical compliance to the super cells accommodating a mismatch in thermal expansion between the super cells and a glass front sheet of the solar module in a direction parallel to the rows for a temperature range of about −40° C. to about 100° C. without damaging the solar module.

Each super cell in the illustrated example comprises 72 rectangular solar cells each having a width equal or approximately equal to $\frac{1}{6}$ the width of a conventionally sized 156 mm square or pseudo square silicon wafer and a length equal or approximately equal to the width of the square or pseudo square wafer. More, generally, rectangular silicon solar cells employed in the solar modules described herein may have lengths, for example, equal to or approximately equal to the width of a conventionally sized square or pseudo square silicon wafer and widths, for example, equal to or approximately equal to 1/M the width of a conventionally sized square or pseudo square wafer, with M any integer≤20. M may be for example 3, 4, 5, 6 or 12. M may also be greater than 20. A super cell may comprise any suitable number of such rectangular solar cells.

The super cells in solar module 200 may be interconnected in series by electrical interconnects (optionally, flexible electrical interconnects) or by module level power electronics as described below to provide from a conventionally sized solar module a higher than conventional voltage, because the shingling approach just described incorporates many more cells per module than is conventional. For example, a conventionally sized solar module comprising super cells made from ⅛th cut silicon solar cells may comprise over 600 solar cells per module. In comparison, a conventionally sized solar module comprising conventionally sized and interconnected silicon solar cells typically comprises about 60 solar cells per module. In conventional silicon solar modules, square or pseudo square solar cells are typically interconnected by copper ribbons and spaced apart from each other to accommodate the interconnections. In such cases, cutting the conventionally sized square or pseudo square wafers into narrow rectangles would reduce the total amount of active solar cell area in the module and therefore reduce module power because of the additional cell-to-cell interconnects required. In contrast, in the solar modules disclosed herein the shingled arrangement hides cell-to-cell electrical interconnections beneath active solar cell area. Consequently the solar modules described herein may provide high output voltages without reducing module output power because there is little or no tradeoff between module power and the number of solar cells (and required cell-to-cell interconnections) in the solar module.

When all the solar cells are connected in series, a shingled solar cell module as described herein may provide a DC voltage in the range of about 90 volts to about 450 Volts or more, for example. As noted above, this high DC voltage may be advantageous.

Figure 49A:
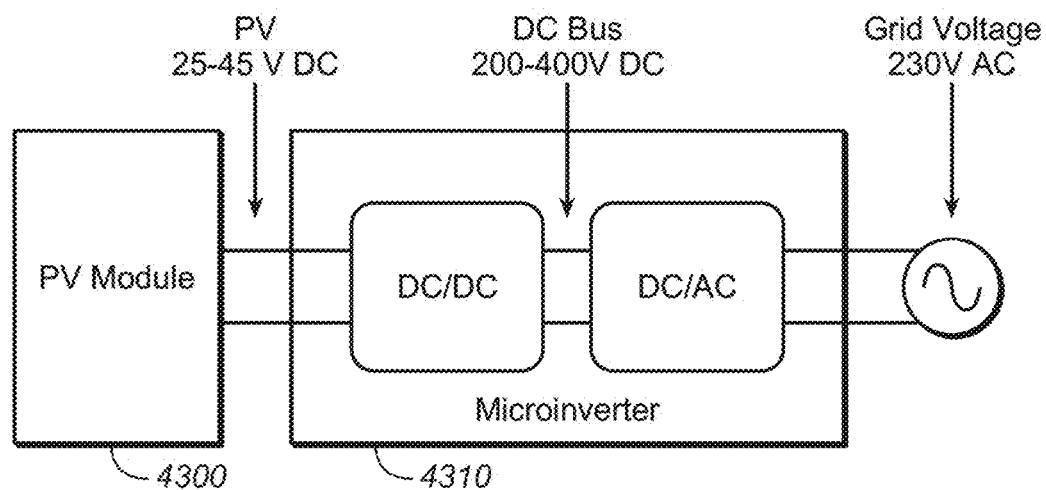
FIGS. 49A-49B show block diagrams for, respectively, a solar module providing a conventional DC voltage to a microinverter and a high voltage solar module as described herein providing a high DC voltage to a microinverter.
Figure 49B:
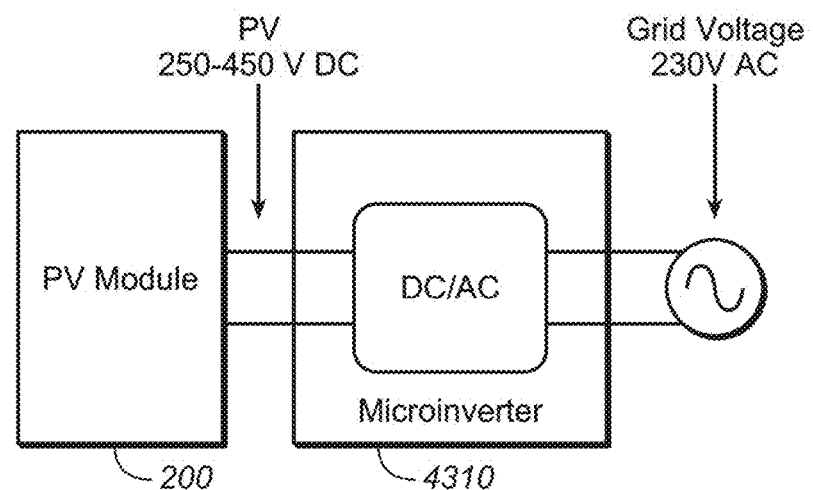

For example, a microinverter disposed on or near a solar module may be used for module level power optimization and DC to AC conversion. Referring now to FIGS. 49A-49B, conventionally a microinverter 4310 receives a 25 V to 40 V DC input from a single solar module 4300 and outputs a 230 V AC output to match the connected grid. The microinverter typically comprises two major components, a DC/DC boost and DC/AC inversion. The DC/DC boost is utilized to increase the DC bus voltage needed for the DC/AC conversion, and is typically the most expensive and lossy (2% efficiency loss) component. Because the solar modules described herein provide a high voltage output, the need for a DC/DC boost may be reduced or eliminated (FIG. 49B). This may reduce cost and increase efficiency and reliability of the solar module 200.

In conventional arrangements using a central ("string") inverter rather than microinverters, conventional low DC output solar modules are electrically connected in series with each other and to the string inverter. The voltage produced by the string of solar modules is equal to the sum of the individual module voltages, because the modules are connected in series. A permissible voltage range determines the maximum and minimum number of modules in the string. The maximum number of modules is a set by the module voltage and the code voltage limits: for example $N_{max} \times V_{oc} < 600$ V (US residential standard) or $N_{max} \times V_{oc} < 1,000$ V (commercial standard). The minimum number of modules in the series is set by the module voltage and the minimum operating voltage required by the string inverter: $N_{max} \times V_{mp} > V_{Invertermin}$. The minimum operating voltage ($V_{Invertermin}$) required by the string inverter (e.g., a Fronius, Powerone, or SMA inverter) is typically between about 180 V and about 250 V. Typically, the optimal operating voltage for the string inverter is about 400 V.

A single high DC voltage shingled solar cell module as described herein may produce a voltage greater than the minimum operating voltage required by a string inverter, and optionally at or near the optimum operating voltage for the string inverter. As a consequence, the high DC voltage shingled solar cell modules described herein may be electrically connected in parallel with each other to a string inverter. This avoids the string length requirements of series connected module strings, which can complicate system design and installation. Also, in a series connected string of solar modules the lowest current module dominates, and the system cannot operate efficiently if different modules in the string receive different illumination as may occur for modules on different roof slopes or as a result of tree shade. The parallel high voltage module configurations described herein may avoid these problems as well, because the current through each solar module is independent from the current through the other solar modules. Further, such arrangements need not require module level power electronics and thus may improve reliability of the solar modules, which may be particularly important in variations in which the solar modules are deployed on a roof top.

Figure 50A:
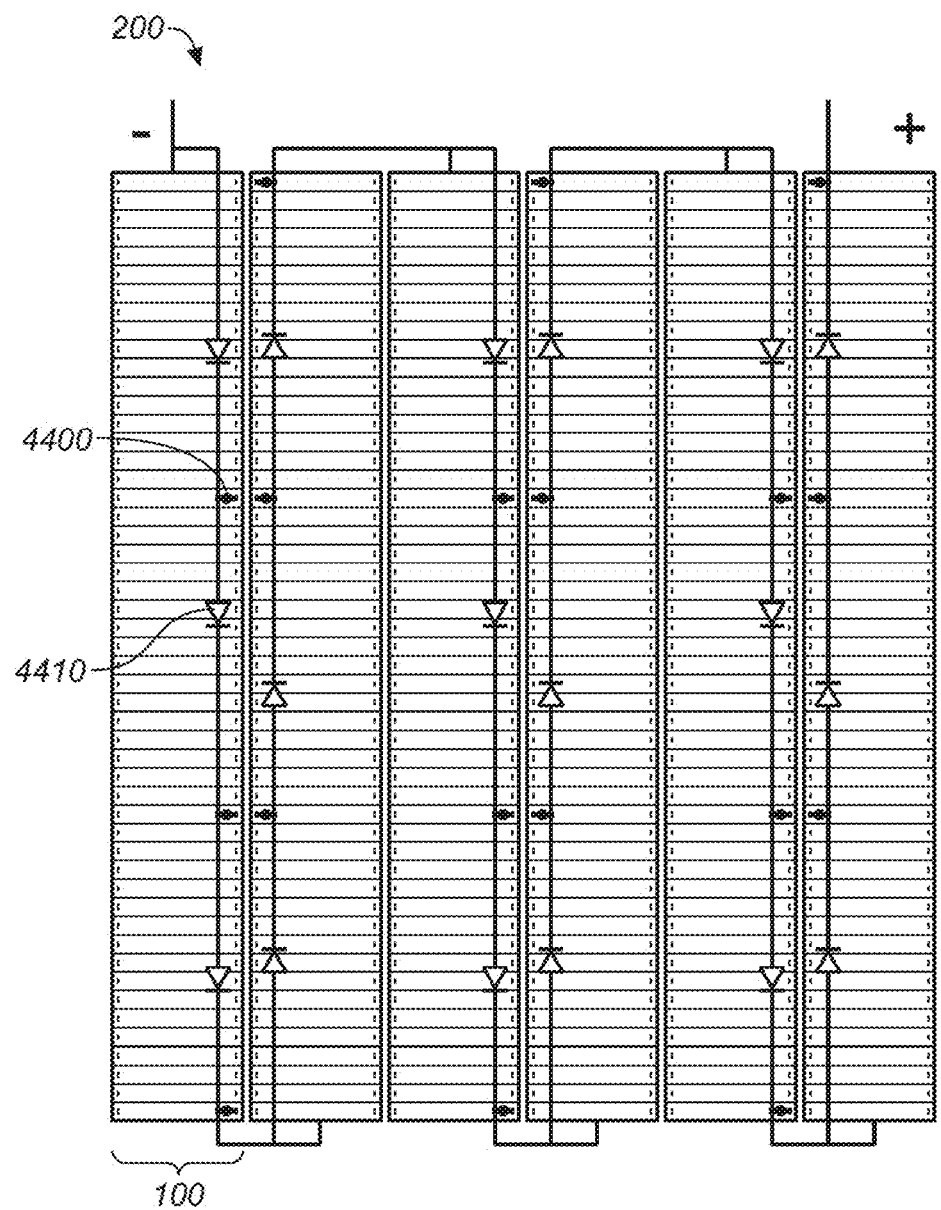
FIGS. 50A-50B show example physical layout and electrical schematics for example high voltage solar modules incorporating bypass diodes.
Figure 50B:
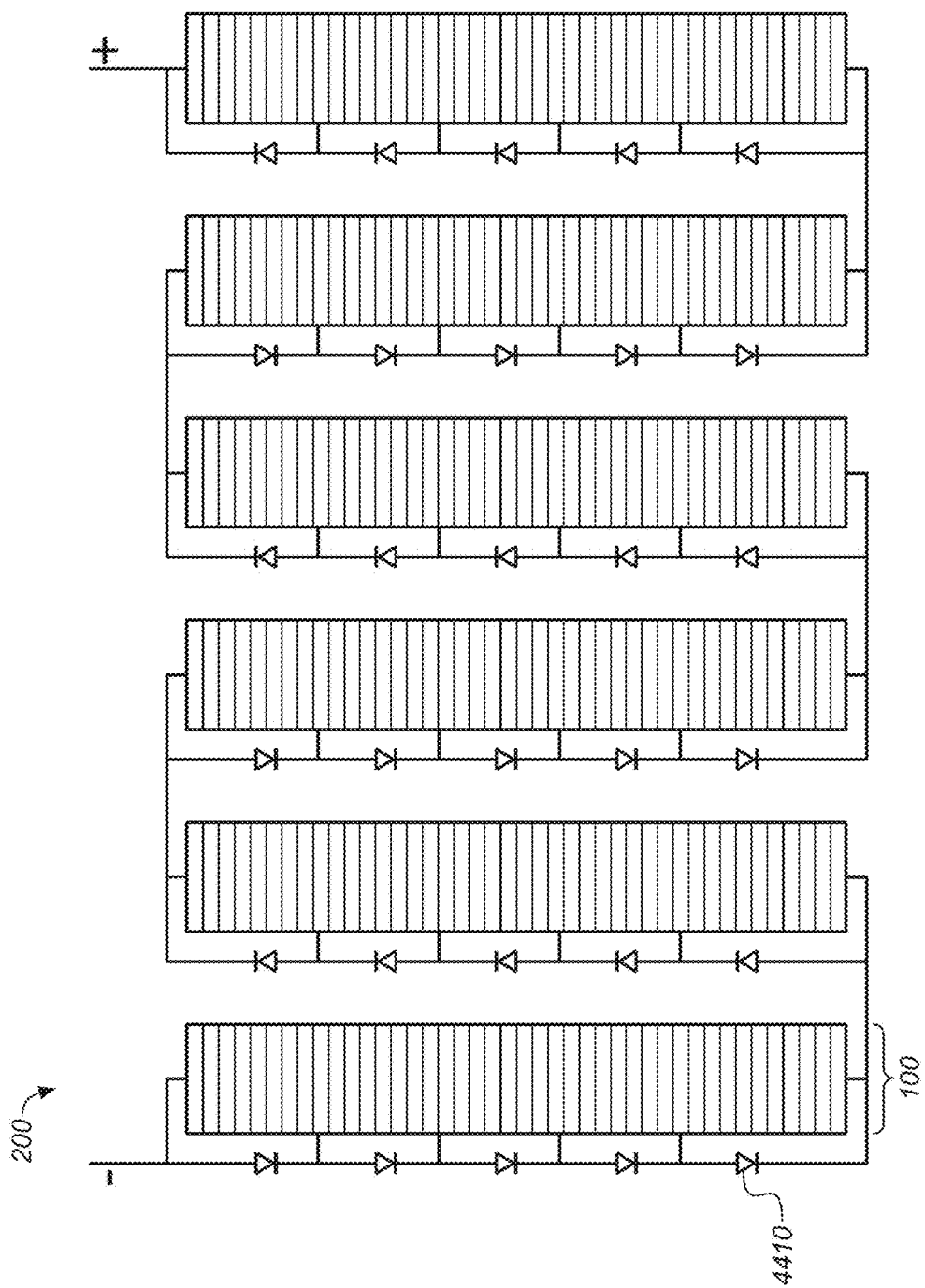

Referring now to FIGS. 50A-50B, as described above, a super cell may run approximately the full length or width of the solar module. To enable electrical connections along the length of the super cell, a hidden (from front view) electrical tapping point may be integrated into the solar module construction. This may be accomplished by connecting an electrical conductor to the back surface metallization of a solar cell at an end or intermediate location in the super cell. Such hidden taps allow electrical segmentation of a super cell, and enable interconnection of super cells or segments of super cells to bypass diodes, module level power electronics (e.g. a microinverter, power optimizers, voltage intelligence and smart switches, and related devices), or other components. The use of hidden taps is further described in U.S. Provisional Application No. 62/081,200, U.S. Provisional Application No. 62/133,205, and U.S. application Ser. No. 14/674,983, each of which is incorporated herein by reference in its entirety.

In the examples of FIG. 50A (an example physical layout) and FIG. 50B (an example electrical schematic), the illustrated solar modules 200 each comprise six super cells 100 electrically connected in series to provide a high DC voltage. Each super cell is electrically segmented into several groups of solar cells by hidden taps 4400, with each group of solar cells electrically connected in parallel with a different bypass diode 4410. In these examples the bypass diodes are disposed within the solar module laminate structure, i.e., with the solar cells in an encapsulant between a front surface transparent sheet and a backing sheet. Alternatively, the bypass diodes may be disposed in a junction box located on a rear surface or edge of the solar module, and interconnected to the hidden taps by conductor runs.

Figure 51B:
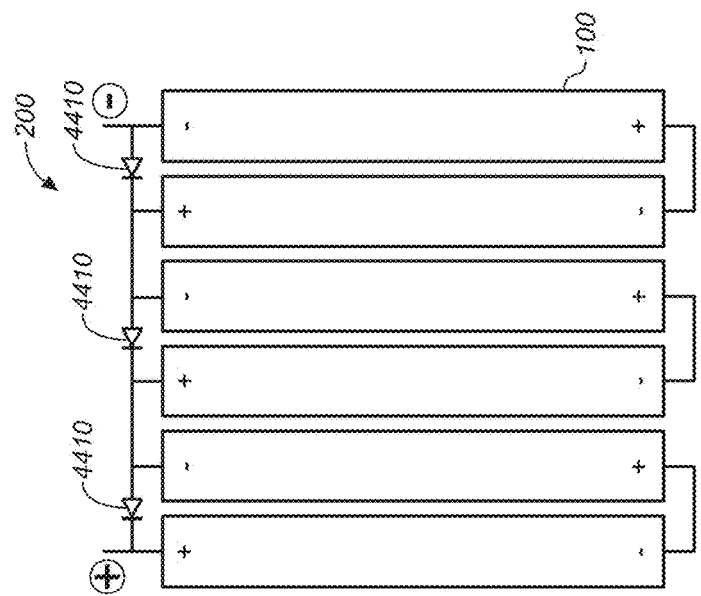
Figure 51A:
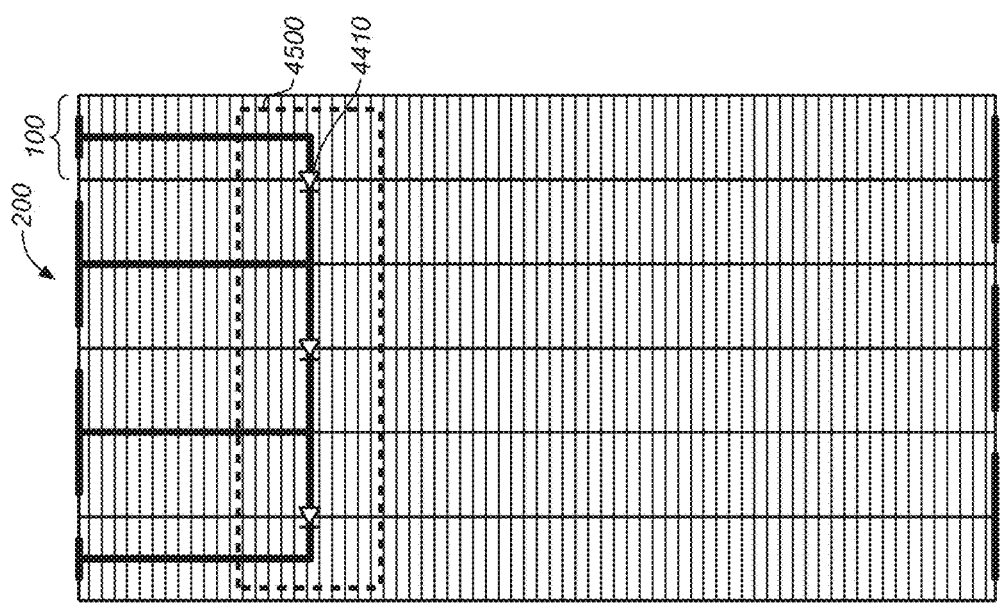

In the examples of FIG. 51A (physical layout) and FIG. 51B (corresponding electrical schematic), the illustrated solar module 200 also comprises six super cells 100 electrically connected in series to provide a high DC voltage. In this example, the solar module is electrically segmented into three pairs of series connected super cells, with each pair of super cells electrically connected in parallel with a different bypass diode. In this example the bypass diodes are disposed within a junction box 4500 located on a back surface of the solar module. The bypass diodes could instead be located in the solar module laminate structure or in an edge-mounted junction box.

In the examples of FIGS. 50A-51B, in normal operation of the solar module each solar cell is forward biased and all bypass diodes are therefore reverse biased and not conducting. If one or more solar cells in a group is reverse biased to a sufficiently high voltage, however, the bypass diode corresponding to that group will turn on and current flow through the module will bypass the reverse-biased solar cells. This prevents the formation of dangerous hot spots at shaded or malfunctioning solar cells.

Alternatively, the bypass diode functionality can be accomplished within module level power electronics, e.g. a microinverter, disposed on or near the solar module. (Module level power electronics and their use may also be referred to herein as module level power management devices or systems and module level power management). Such module level power electronics, optionally integrated with the solar module, may optimize the power from groups of super cells, from each super cell, or from each individual super cell segment in electrically segmented super cells (e.g., by operating the group of super cells, super cell, or super cell segment at its maximum power point), thereby enabling discrete power optimization within the module. The module level power electronics may eliminate the need for any bypass diodes within the module as the power electronics may determine when to bypass the entire module, a specific group of super cells, one or more specific individual super cells, and/or one or more specific super cell segments.

This may be accomplished, for example, by integrating voltage intelligence at the module level. By monitoring the voltage output of a solar cell circuit (e.g., one or more super cells or super cell segments) in the solar module, a "smart switch" power management device can determine if that circuit includes any solar cells in reverse bias. If a reverse biased solar cell is detected, the power management device can disconnect the corresponding circuit from the electrical system using, for example, a relay switch or other component. For example, if the voltage of a monitored solar cell circuit drops below a predetermined threshold, then the power management device will shut off (open circuit) that circuit. The predetermined threshold may be, for example a certain percentage or magnitude (e.g. 20% or 10V) compared to normal operation of the circuit. Implementation of such voltage intelligence may be incorporated into existing module level power electronics products (e.g., from Enphase Energy Inc., Solaredge Technologies, Inc., Tigo Energy, Inc.) or through a custom circuit design.

FIG. 52A (physical layout) and FIG. 52B (corresponding electrical schematic) show an example architecture for module level power management of a high voltage solar module comprising shingled super cells. In this example, rectangular solar module 200 comprises six rectangular shingled super cells 100 arranged in six rows extending the length of the long sides of the solar module. The six super cells are electrically connected in series to provide a high DC voltage.

Module level power electronics 4600 may perform voltage sensing, power management, and/or DC/AC conversion for the entire module.

Figure 53B:
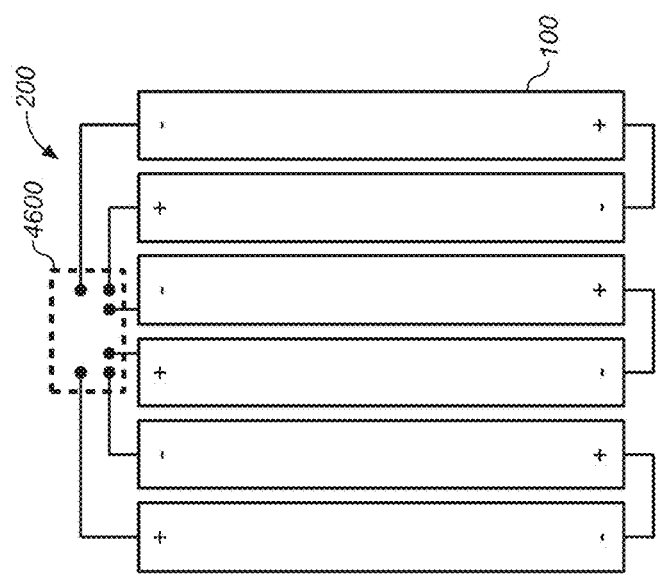
Figure 53A:
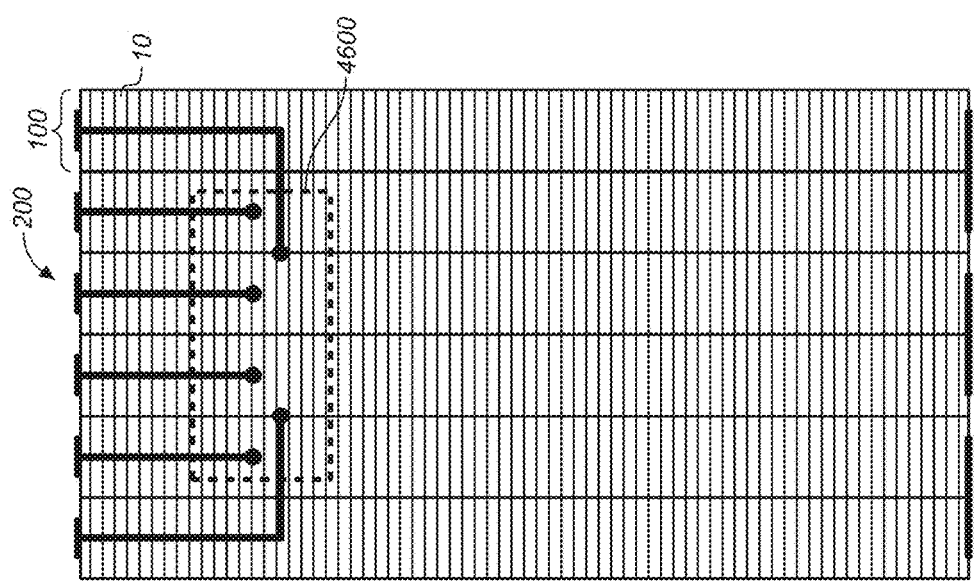

FIG. 53A (physical layout) and FIG. 53B (corresponding electrical schematic) show another example architecture for module level power management of a high voltage solar module comprising shingled super cells. In this example, rectangular solar module 200 comprises six rectangular shingled super cells 100 arranged in six rows extending the length of the long sides of the solar module. The six super cells are electrically grouped into three pairs of series connected super cells. Each pair of super cells is individually connected to module level power electronics 4600, which may perform voltage sensing and power optimization on the individual pairs of super cells, connect two or more of them in series to provide a high DC voltage, and/or perform DC/AC conversion.

FIG. 54A (physical layout) and FIG. 54B (corresponding electrical schematic) show another example architecture for module level power management of a high voltage solar module comprising shingled super cells. In this example, rectangular solar module 200 comprises six rectangular shingled super cells 100 arranged in six rows extending the length of the long sides of the solar module. Each super cell is individually connected with module level power electronics 4600, which may perform voltage sensing and power optimization on each super cell, connect two or more of them in series to provide a high DC voltage, and/or perform DC/AC conversion.

Figure 55B:
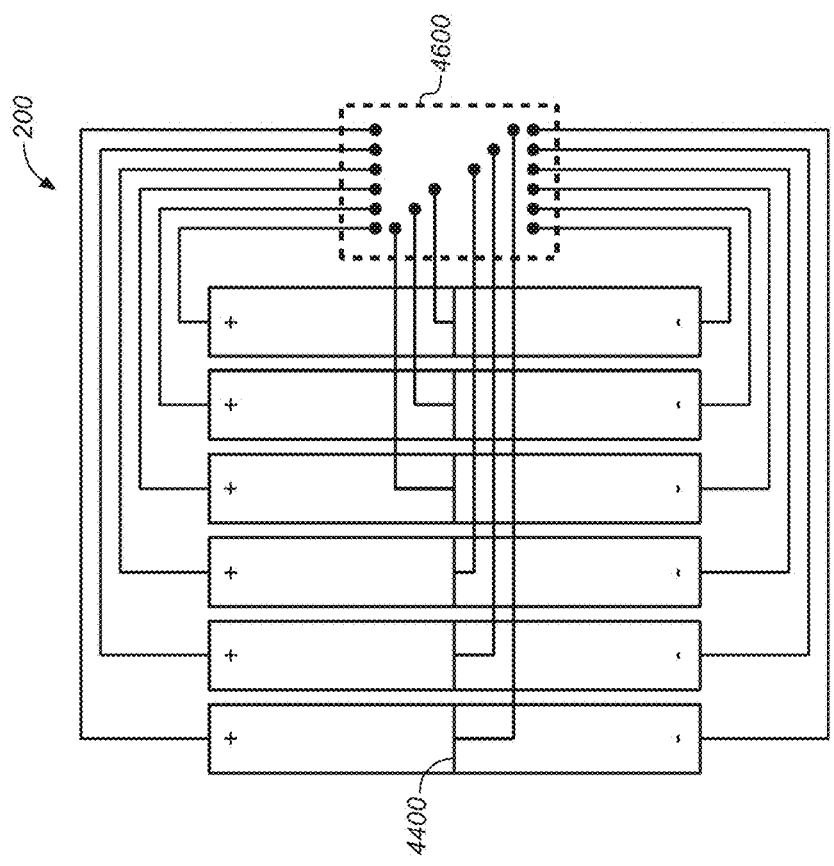
Figure 55A:
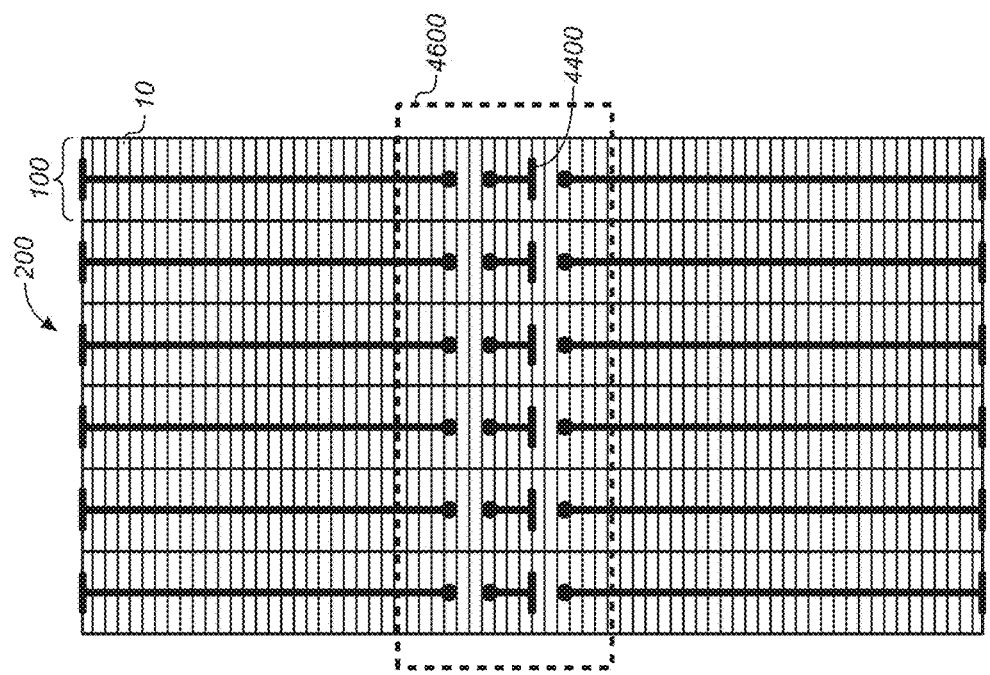

FIG. 55A (physical layout) and FIG. 55B (corresponding electrical schematic) show another example architecture for module level power management of a high voltage solar module comprising shingled super cells. In this example, rectangular solar module 200 comprises six rectangular shingled super cells 100 arranged in six rows extending the length of the long sides of the solar module. Each super cell is electrically segmented into two or more groups of solar cells by hidden taps 4400. Each resulting group of solar cells is individually connected with module level power electronics 4600, which may perform voltage sensing and power optimization on each solar cell group, connect a plurality of the groups in series to provide a high DC voltage, and/or perform DC/AC conversion.

In some variations two or more high voltage DC shingled solar cell modules as described herein are electrically connected in series to provide a high voltage DC output, which is converted to AC by an inverter. The inverter may be a microinverter integrated with one of the solar modules, for example. In such cases the microinverter may optionally be a component of module level power management electronics that also perform additional sensing and connecting functions as described above. Alternatively the inverter may be a central "string" inverter as further discussed below.

Figure 56:
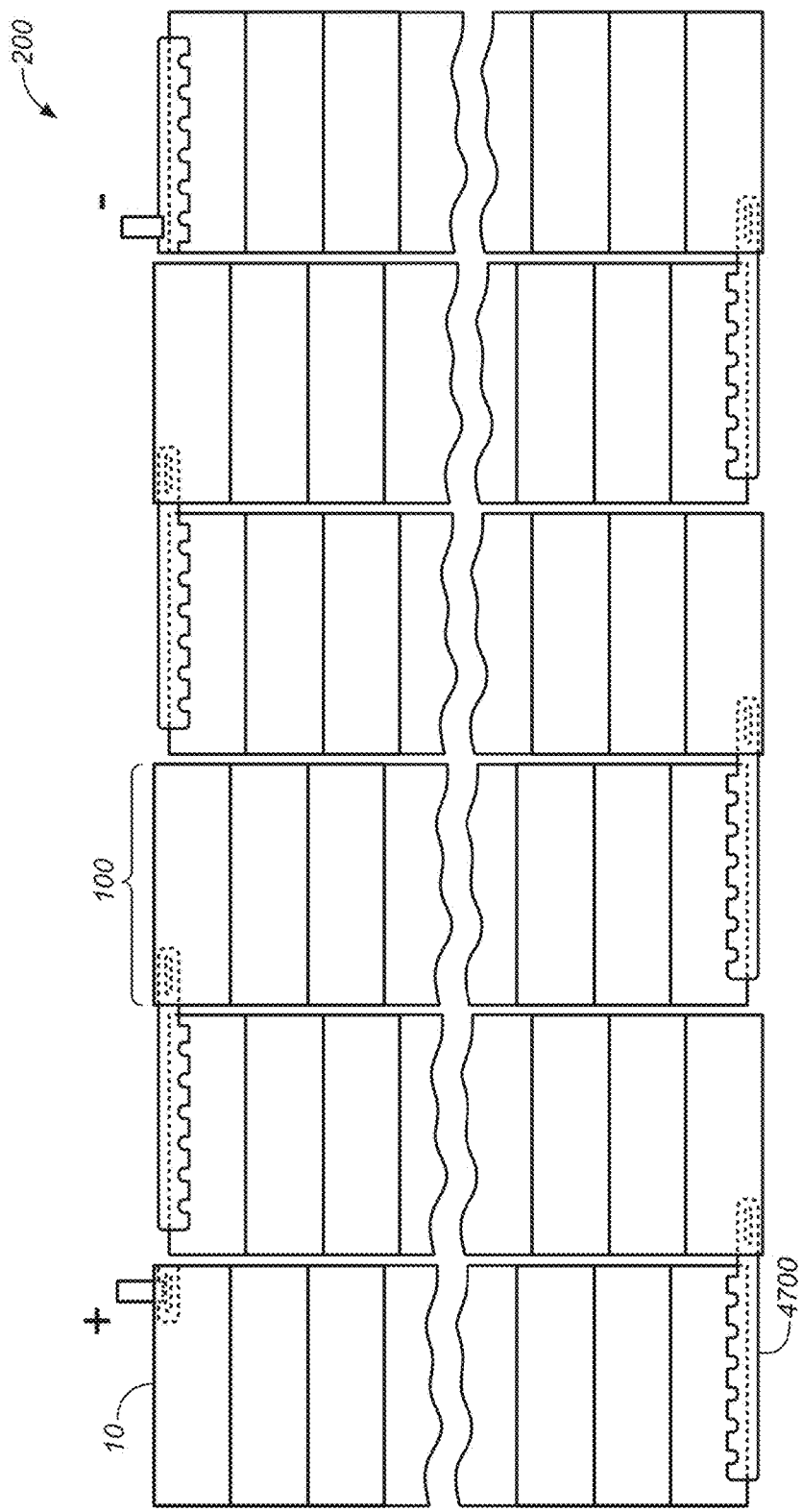
FIG. 56 shows an example arrangement of six super cells in six parallel rows with ends of adjacent rows offset and interconnected in series by flexible electrical interconnects.

As shown in FIG. 56, when stringing super cells in series in a solar module adjacent rows of super cells may be slightly offset along their long axes in a staggered manner. This staggering allows adjacent ends of super cell rows to be electrically connected in series by an interconnect 4700 bonded to the top of one super cell and to the bottom of the other, while saving module area (space/length) as well as streamlining manufacturing. Adjacent rows of super cells may be offset by about 5 millimeters, for example.

Differential thermal expansion between electrical interconnects 4700 and silicon solar cells and the resulting stress on the solar cell and the interconnect can lead to cracking and other failure modes that can degrade performance of the solar module. Consequently, it is desirable that the interconnect be flexible and configured to accommodate such differential expansion without significant stress developing. The interconnect may provide stress and thermal expansion relief by, for example, being formed from highly ductile materials (e.g., soft copper, thin copper sheet), being formed from low thermal expansion coefficient materials (e.g., Kovar, Invar or other low thermal expansion iron-nickel alloys) or from materials having a thermal expansion coefficient approximately matching that of silicon, incorporating in-plane geometric expansion features such as slits, slots, holes, or truss structures that accommodate differential thermal expansion between the interconnect and the silicon solar cell, and/or employing out-of-plane geometric features such as kinks, jogs, or dimples that accommodate such differential thermal expansion. Conductive portions of the interconnects may have a thickness of, for example, less than about 100 microns, less than about 50 microns, less than about 30 microns, or less than about 25 microns to increase the flexibility of the interconnects. (The generally low current in these solar modules enables use of thin flexible conductive ribbons without excessive power loss resulting from the electrical resistance of the thin interconnects).

In some variations conductive bonds between a super cell and a flexible electrical interconnect force the flexible electrical interconnect to accommodate a mismatch in thermal expansion between the super cell and the flexible electrical interconnect for a temperature range of about $-40°$ C. to about $180°$ C. without damaging the solar module.

FIG. 7A (discussed above) shows several example interconnect configurations, designated by reference numerals 400A-400T, that employ in-plane stress-relieving geometrical features, and FIGS. 7B-1 and 7B-2 (also discussed above) show example interconnect configurations designated by reference numerals 400U and 3705 that employ out-of-plane stress-relieving geometrical features. Any one of or any combination of these interconnect configurations employing stress-relieving features may be suitable for electrically interconnecting super cells in series to provide a high DC voltage, as described herein.

Figure 57A:
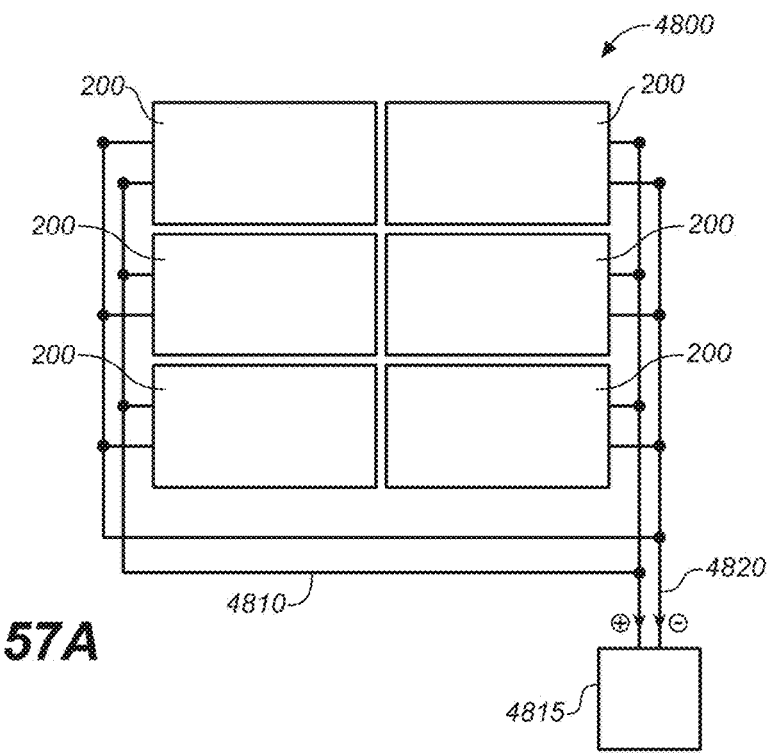
FIG. 57A schematically illustrates a photovoltaic system comprising a plurality of high DC voltage shingled solar cell modules electrically connected in parallel with each other and to a string inverter.
Figure 57B:
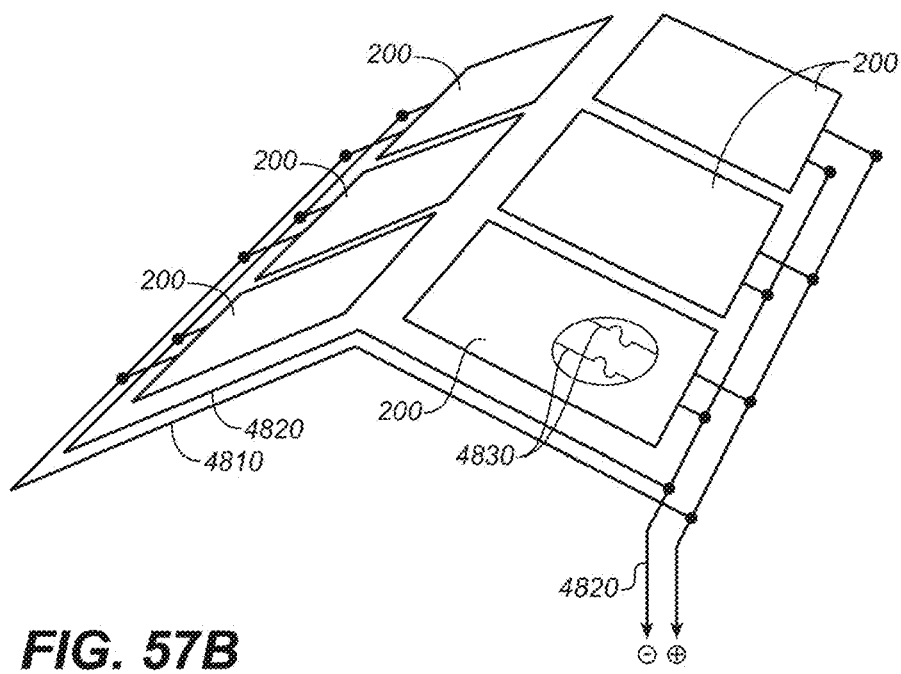
FIG. 57B shows the photovoltaic system of FIG. 57A deployed on a roof top.

The discussion with respect to FIGS. 51A-55B focused on module level power management, with possible DC/AC conversion of a high DC module voltage by module level power electronics to provide an AC output from the module. As noted above, DC/AC conversion of high DC voltages from shingled solar cell modules as described herein may be performed instead by a central string inverter. For example, FIG. 57A schematically illustrates a photovoltaic system 4800 that comprises a plurality of high DC voltage shingled solar cell modules 200 electrically connected in parallel with each other to a string inverter 4815 via a high DC voltage negative bus 4820 and a high DC voltage positive bus 4810. Typically, each solar module 200 comprises a plurality of shingled super cells electrically connected in series with electrical interconnects to provide a high DC voltage, as described above. Solar modules 200 may optionally comprise bypass diodes arranged as described above, for example. FIG. 57B shows an example deployment of photovoltaic system 4800 on a roof top.

In some variations of photovoltaic system 4800, two or more short series connected strings of high DC voltage shingled solar cell modules may be electrically connected in parallel with a string inverter. Referring again to FIG. 57A, for example, each solar module 200 may be replaced with a series connected string of two or more high DC voltage shingled solar cell modules 200. This might be done, for example, to maximize the voltage provided to the inverter while complying with regulatory standards.

Conventional solar modules typically produce about 8 amps Isc (short circuit current), about 50 Voc (open circuit voltage), and about 35 Vmp (maximum power point voltage). As discussed above, high DC voltage shingled solar cell modules as described herein comprising M times the conventional number of solar cells, with each of the solar cells having an area of about 1/M the area of a conventional solar cell, produce roughly M times higher voltage and 1/M the current of a conventional solar module. As noted above M can be any suitable integer, is typically ≤20, but may be greater than 20. M may be for example 3, 4, 5, 6, or 12.

If M=6, Voc for the high DC voltage shingled solar cell modules may be for example about 300 V. Connecting two such modules in series would provide about 600 V DC to the bus, complying with the maximum set by US residential standards. If M=4, Voc for the high DC voltage shingled solar cell modules may be for example about 200 V. Connecting three such modules in series would provide about 600 V DC to the bus. If M=12, Voc for the high DC voltage shingled solar cell modules may be for example about 600 V. One could also configure the system to have bus voltages less than 600 V. In such variations the high DC voltage shingled solar cell modules may be, for example, connected in pairs or triplets or any other suitable combination in a combiner box to provide an optimal voltage to the inverter.

A challenge arising from the parallel configuration of high DC voltage shingled solar cell modules described above is that if one solar module has a short circuit the other solar modules could potentially dump their power on the shorted module (i.e., drive current through and dissipate power in the shorted module) and create a hazard. This problem can be averted, for example, by use of blocking diodes arranged to prevent other modules from driving current through a shorted module, use of current limiting fuses, or use of current limiting fuses in combination with blocking diodes. FIG. 57B schematically indicates the use of two current limiting fuses 4830 on the positive and negative terminals of a high DC voltage shingled solar cell module 200.

The protective arrangement of blocking diodes and/or fuses may depend on whether or not the inverter comprises a transformer. Systems using an inverter comprising a transformer typically ground the negative conductor. Systems using a transformerless inverter typically do not ground the negative conductor. For a transformerless inverter, it may be preferable to have a current limiting fuse in-line with the positive terminal of the solar module and another current limiting fuse in line with the negative terminal.

Blocking diodes and/or current limiting fuses may be placed, for example, with each module in a junction box or in the module laminate. Suitable junction boxes, blocking diodes (e.g., in-line blocking diodes), and fuses (e.g., in-line fuses) may include those available from Shoals Technology Group.

Figure 58A:
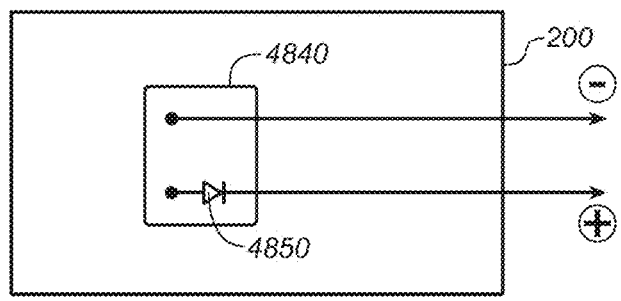
FIGS. 58A-58D show arrangements of current limiting fuses and blocking diodes that may be used to prevent a high DC voltage shingled solar cell module having a short circuit from dissipating significant power generate in other high DC voltage shingled solar cell modules to which it is electrically connected in parallel.
Figure 58B:
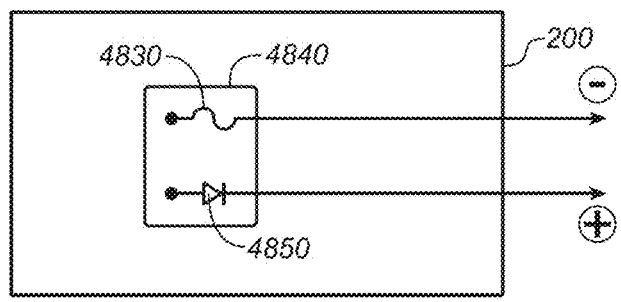
Figure 58C:
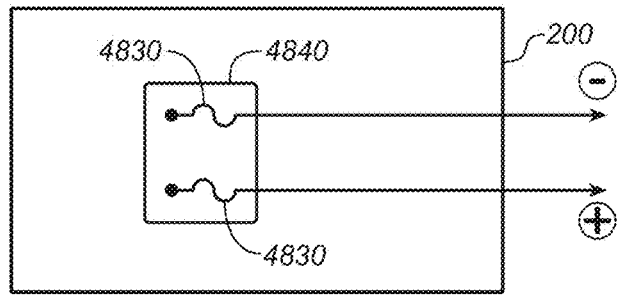
Figure 58D:
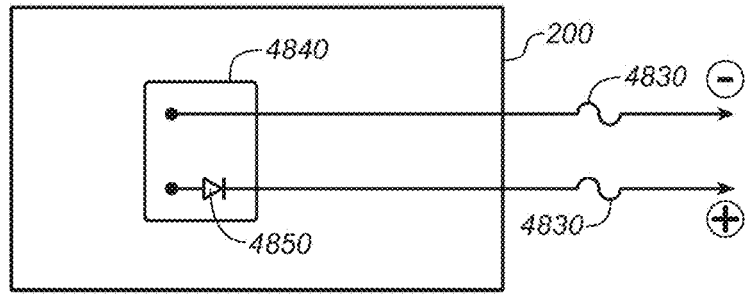

FIG. 58A shows an example high voltage DC shingled solar cell module comprising a junction box 4840 in which a blocking diode 4850 is in line with the positive terminal of the solar module. The junction box does not include a current limiting fuse. This configuration may preferably be used in combination with one or more current limiting fuses located elsewhere (for example in a combiner box) in line with the positive and/or negative terminals of the solar module (e.g., see FIG. 58D below). FIG. 58B shows an example high voltage DC shingled solar cell module comprising a junction box 4840 in which a blocking diode is in line with the positive terminal of the solar module and a current limiting fuse 4830 is in line with the negative terminal. FIG. 58C shows an example high voltage DC shingled solar cell module comprising a junction box 4840 in which a current limiting fuse 4830 is in line with the positive terminal of the solar module and another current limiting fuse 4830 is in line with the negative terminal. FIG. 58D shows an example high voltage DC shingled solar cell module comprising a junction box 4840 configure as in FIG. 58A, and fuses located outside of the junction box in line with the positive and negative terminals of the solar module.

Figure 59A:
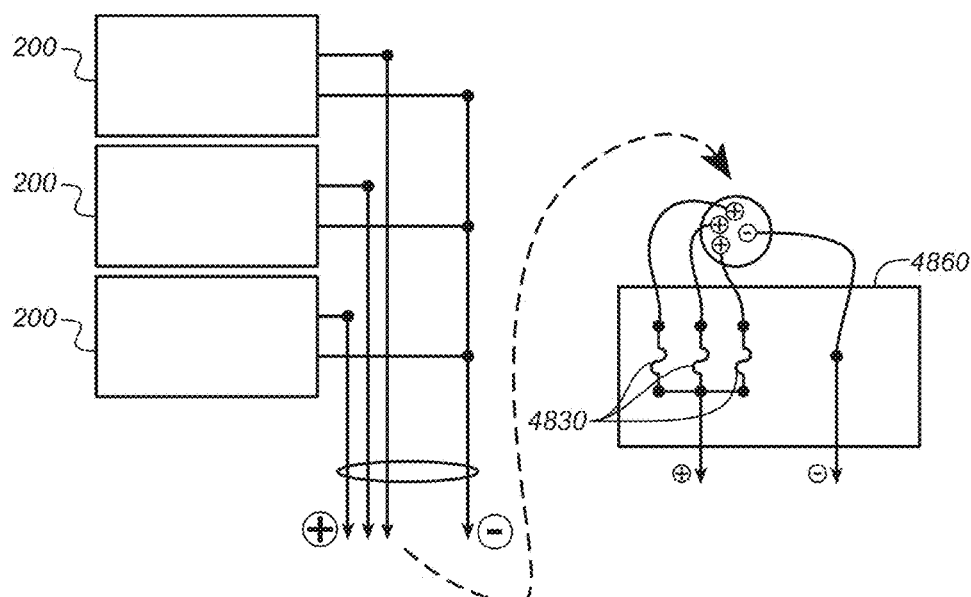
FIGS. 59A-59B show example arrangements in which two or more high DC voltage shingled solar cell modules are electrically connected in parallel in a combiner box, which may include current limiting fuses and blocking diodes.
Figure 59B:
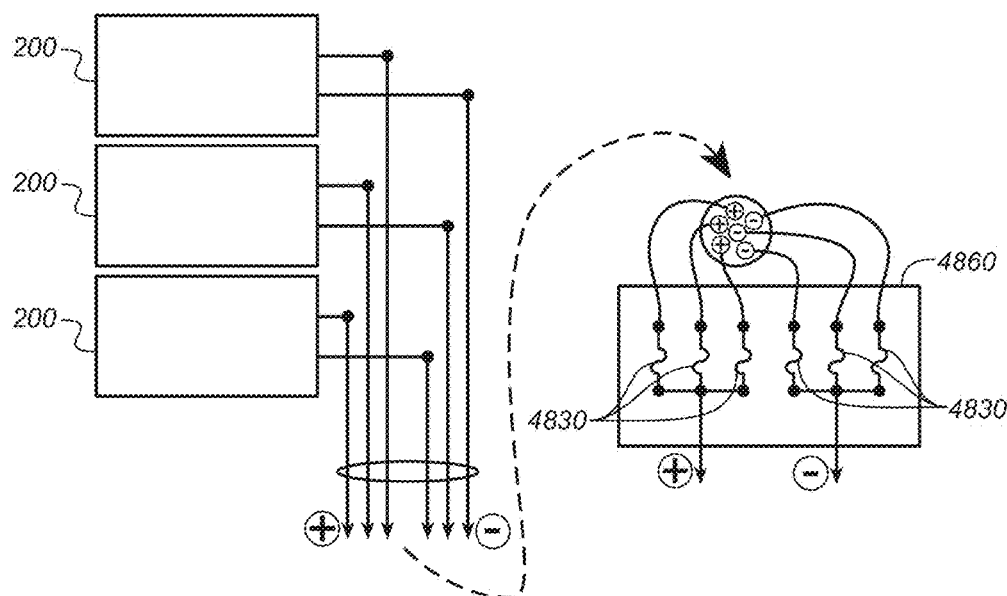

Referring now to FIGS. 59A-59B, as an alternative to the configurations described above, blocking diodes and/or current limiting fuses for all of the high DC voltage shingled solar cell modules may be placed together in a combiner box 4860. In these variations one or more individual conductors run separately from each module to the combiner box. As shown in FIG. 59A, in one option a single conductor of one polarity (e.g., negative as illustrated) is shared between all modules. In another option (FIG. 59B) both polarities have individual conductors for each module. Although FIGS. 59A-59B show only fuses located in combiner box 4860, any suitable combination of fuses and or blocking diodes may be located in the combiner box. In addition, electronics performing other functions such as, for example, monitoring, maximum power point tracking, and/or disconnecting of individual modules or groups of modules may be implemented in the combiner box.

Reverse bias operation of a solar module may occur when one or more solar cells in the solar module are shaded or otherwise generating low current, and the solar module is operated at a voltage-current point that drives a larger current through a low-current solar cell than the low-current solar cell can handle. A reverse biased solar cell may heat up and create a hazard condition. A parallel arrangement of high DC voltage shingled solar cell modules, as shown in FIG. 58A for example, may enable the modules to be protected from reverse bias operation by setting a suitable operating voltage for the inverter. This is illustrated for example by FIGS. 60A-60B.

Figure 60A:
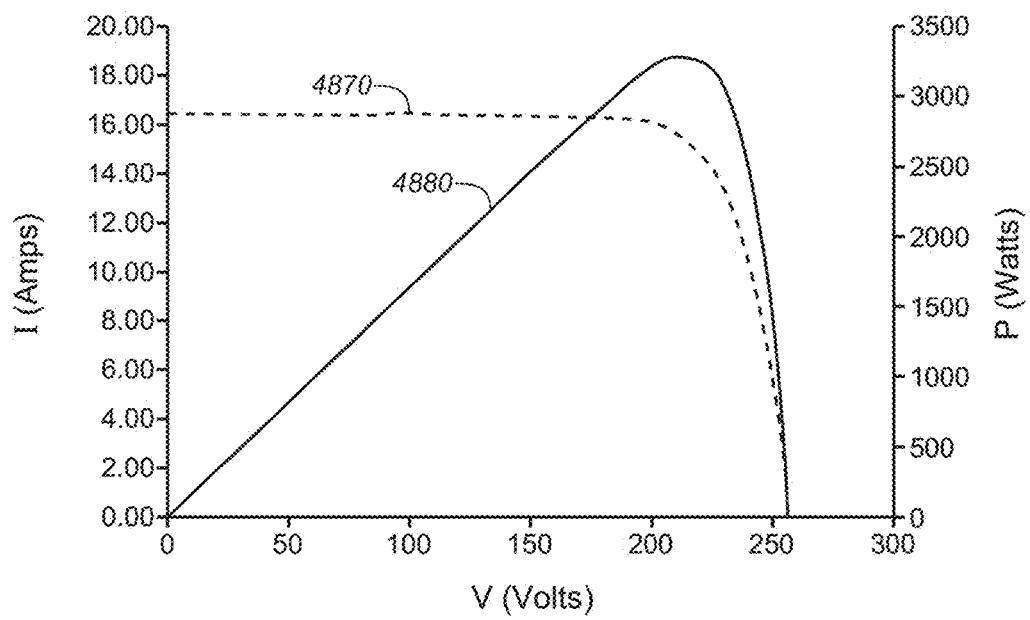
FIGS. 60A-60B each show a plot of current versus voltage and a plot of power versus voltage for a plurality of high DC voltage shingled solar cell modules electrically connected in parallel. The plots of FIG. 60A are for an example case in which none of the modules include a reverse biased solar cell. The plots of FIG. 60B are for an example case in which some of the modules include one or more reverse biased solar cells.

FIG. 60A shows a plot 4870 of current versus voltage and a plot 4880 of power versus voltage for a parallel-connected string of about ten high DC voltage shingled solar modules. These curves were calculated for a model in which none of the solar modules included a reverse biased solar cell. Because the solar modules are electrically connected in parallel, they all have the same operating voltage and their currents add. Typically, an inverter will vary the load on the circuit to explore the power-voltage curve, identify the maximum point on that curve, then operate the module circuit at that point to maximize output power.

Figure 60B:
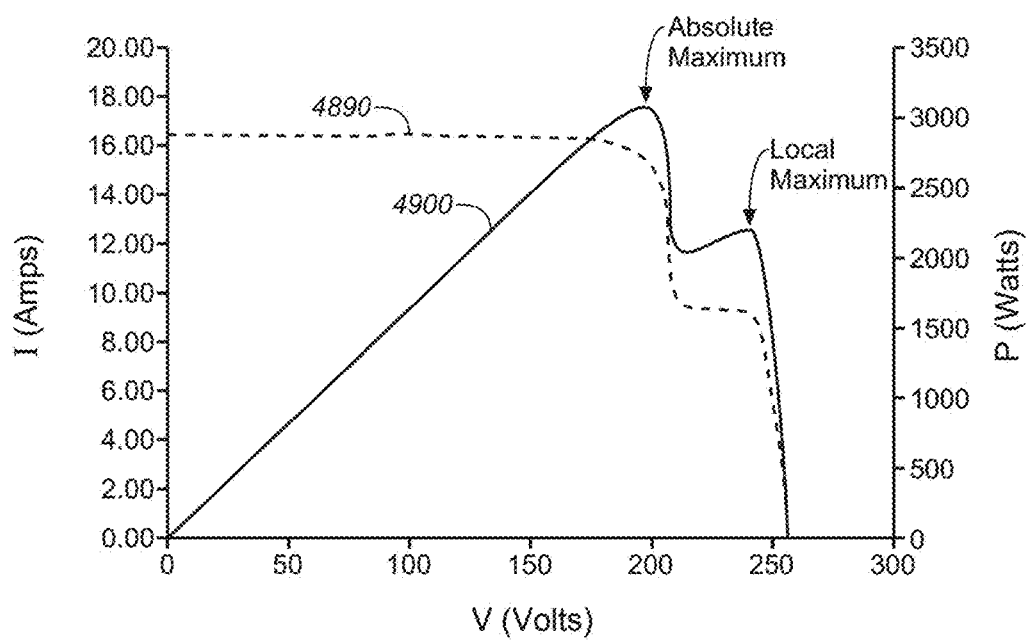

In contrast, FIG. 60B shows a plot 4890 of current versus voltage and a plot 4900 of power versus voltage for the model system of FIG. 60A for a case where some of the solar modules in the circuit include one or more reverse biased solar cells. The reverse-biased modules manifest themselves in the example current-voltage curve by the formation of a knee shape with a transition from about 10 amp operation at voltages down to about 210 volts to about 16 amp operation at voltages below about 200 volts. At voltages below about 210 volts the shaded modules include reverse biased solar cells. The reverse-biased modules also manifest themselves in the power-voltage curve by the existence of two maxima: an absolute maximum at about 200 volts and a local maximum at about 240 volts. The inverter may be configured to recognize such signs of reverse-biased solar modules and operate the solar modules at an absolute or local maximum power point voltage at which no modules are reverse biased. In the example of FIG. 60B, the inverter may operate the modules at the local maximum power point to ensure that no module is reverse biased. In addition, or alternatively, a minimum operating voltage may be selected for the inverter, below which it is unlikely that any modules will be reverse biased. That minimum operating voltage may be adjusted based on other parameters such as the ambient temperature, the operating current and the calculated or measured solar module temperature as well as other information received from outside sources, such as irradiance for example.

In some embodiments, the high DC voltage solar modules themselves can be shingled, with adjacent solar modules arranged in a partially overlapping manner and optionally electrically interconnected in their overlapping regions. Such shingled configurations may optionally be used for high voltage solar modules electrically connected in parallel that provide a high DC voltage to a string inverter, or for high voltage solar modules that each comprise a microinverter that converts the solar module's high DC voltage to an AC module output. A pair of high voltage solar modules may be shingled as just described and electrically connected in series to provide a desired DC voltage, for example.

Conventional string inverters often are required to have a fairly wide range of potential input voltage (or 'dynamic range') because 1) they must be compatible with different series-connected module string lengths, 2) some modules in a string may be fully or partially shaded, and 3) changes in ambient temperature and radiation change the module voltage. In systems employing parallel architecture as described herein the length of the string of parallel-connected solar modules does not affect voltage. Further, for the case where some modules are partially shaded and some are not one can decide to operate the system at the voltage of the non-shaded modules (e.g., as described above). Therefore the input voltage range of an inverter in a parallel-architecture system may need only accommodate the 'dynamic range' of factor #3-temperature and radiation changes. Because this is less, for example about 30% of the conventional dynamic range required of inverters, inverters employed with parallel architecture systems as described herein may have a narrower range of MPPT (maximum power point tracking), for example between about 250 volts at standard conditions and about 175 volts at high temperature and low radiation, or for example between about 450 volts at standard conditions and about 350 volts at high temperature and low radiation (in which case 450 volts MPPT operation may correspond to a Voc under 600 volts in lowest temperature operation). In addition, as described above the inverters may receive enough DC voltage to convert directly to AC without a boost phase. Consequently, string inverters employed with parallel architecture systems as described herein may be simpler, of lower cost, and operate at higher efficiencies than string inverters employed in conventional systems.

For both microinverters and string inverters employed with the high voltage direct current shingled solar cell modules described herein, to eliminate a DC boost requirement of the inverter it may be preferable to configure the solar module (or short series-connected string of solar modules) to provide an operating (e.g., maximum power point Vmp) DC voltage above the peak-to-peak of the AC. For example, for 120 V AC, peak-to peak is sqrt(2) *120V=170V. Hence the solar modules might be configured to provide a minimal Vmp of about 175 V, for example. The Vmp at standard conditions might then be about 212 V (assuming 0.35% negative voltage temperature coefficient and maximal operating temperature of 75° C.), and the Vmp at the lowest temperature operating condition (e.g., −15° C.) would then be about 242 V, and hence the Voc below about 300 V (depending on the module fill factor). For split phase 120 V AC (or 240 V AC) all of these numbers double, which is convenient as 600 V DC is the maximum permitted in the US for many residential applications. For commercial applications, requiring and permitting higher voltages, these numbers may be further increased.

A high voltage shingled solar cell module as described herein may be configured to operate at >600 Voc or >1000 Voc, in which case the module may comprise integrated power electronics that prevent the external voltage provided by the module from exceeding code requirements. Such an arrangement may enable the operating $V_{mp}$ to be sufficient for split phase 120 V (240 V, requiring about 350 V) without a problem of Voc at low temperatures exceeding 600 V.

When a building's connection to the electricity grid is disconnected, for example by firefighters, solar modules (e.g., on the building roof) providing electricity to the building can still generate power if the sun is shining. This raises a concern that such solar modules can keep the roof 'live' with a dangerous voltage after disconnection of the building from the grid. To address this concern, high voltage direct current shingled solar cell modules described herein may optionally include a disconnect, for example in or adjacent to a module junction box. The disconnect may be a physical disconnect or a solid state disconnect, for example. The disconnect may be configured for example to be "normally off", so that when it loses a certain signal (e.g., from the inverter) it disconnects the solar module's high voltage output from the roof circuit. The communication to the disconnect may be, for example, over the high voltage cables, through a separate wire, or wireless.

A significant advantage of shingling for high-voltage solar modules is heat spreading between solar cells in a shingled super cell. Applicants have discovered that heat may be readily transported along a silicon super cell through thin electrically and thermally conductive bonds between adjacent overlapping silicon solar cells. The thickness of the electrically conductive bond between adjacent overlapping solar cells formed by the electrically conductive bonding material, measured perpendicularly to the front and rear surfaces of the solar cells, may be for example less than or equal to about 200 microns, or less than or equal to about 150 microns, or less than or equal to about 125 microns, or less than or equal to about 100 microns, or less than or equal to about 90 microns, or less than or equal to about 80 microns, or less than or equal to about 70 microns, or less than or equal to about 60 microns, or less than or equal to about 50 microns, or less than or equal to about 25 microns. Such a thin bond reduces resistive loss at the interconnection between cells, and also promotes flow of heat along the super cell from any hot spot in the super cell that might develop during operation. The thermal conductivity of the bond between solar cells may be, for example, ≥about 1.5 Watts/(meter K). Further, the rectangular aspect ratio of the solar cells typically employed herein provides extended regions of thermal contact between adjacent solar cells.

In contrast, in conventional solar modules employing ribbon interconnects between adjacent solar cells, heat generated in one solar cell does not readily spread through the ribbon interconnects to other solar cells in the module. That makes conventional solar modules more prone to developing hot spots than are solar modules described herein.

Furthermore, the current through a super cell in the solar modules described herein is typically less than that through a string of conventional solar cells, because the super cells described herein are typically formed by shingling rectangular solar cells each of which has an active area less than (for example, ⅙) that of a conventional solar cell.

As a consequence, in the solar modules disclosed herein less heat is dissipated in a solar cell reverse biased at the breakdown voltage, and the heat may readily spread through the super cell and the solar module without creating a dangerous hot spot.

Several additional and optional features may make high voltage solar modules employing super cells as described herein even more tolerant to heat dissipated in a reverse biased solar cell. For example, the super cells may be encapsulated in a thermoplastic olefin (TPO) polymer. TPO encapsulants are more photo-thermal stable than standard ethylene-vinyl acetate (EVA) encapsulants. EVA will brown with temperature and ultraviolet light and lead to hot spot issues created by current limiting cells. Further, the solar modules may have a glass-glass structure in which the encapsulated super cells are sandwiched between a glass front sheet and a glass back sheet. Such a glass-glass structure enables the solar module to safely operate at temperatures greater than those tolerated by a conventional polymer back sheet. Further still, junction boxes, if present, may be mounted on one or more edges of a solar module, rather than behind the solar module where a junction box would add an additional layer of thermal insulation to the solar cells in the module above it.

Applicants have therefore recognized that high voltage solar modules formed from super cells as described herein may employ far fewer bypass diodes than in conventional solar modules, because heat flow through the super cells may allow a module to operate without significant risk with one or more solar cells reverse biased. For example, in some variations high voltage solar modules as described herein employ less than one bypass diode per 25 solar cells, less than one bypass diode per 30 solar cells, less than one bypass diode per 50 solar cell, less than one bypass diode per 75 solar cells, less than one bypass diode per 100 solar cells, only a single bypass diode, or no bypass diode.

Figure 61A:
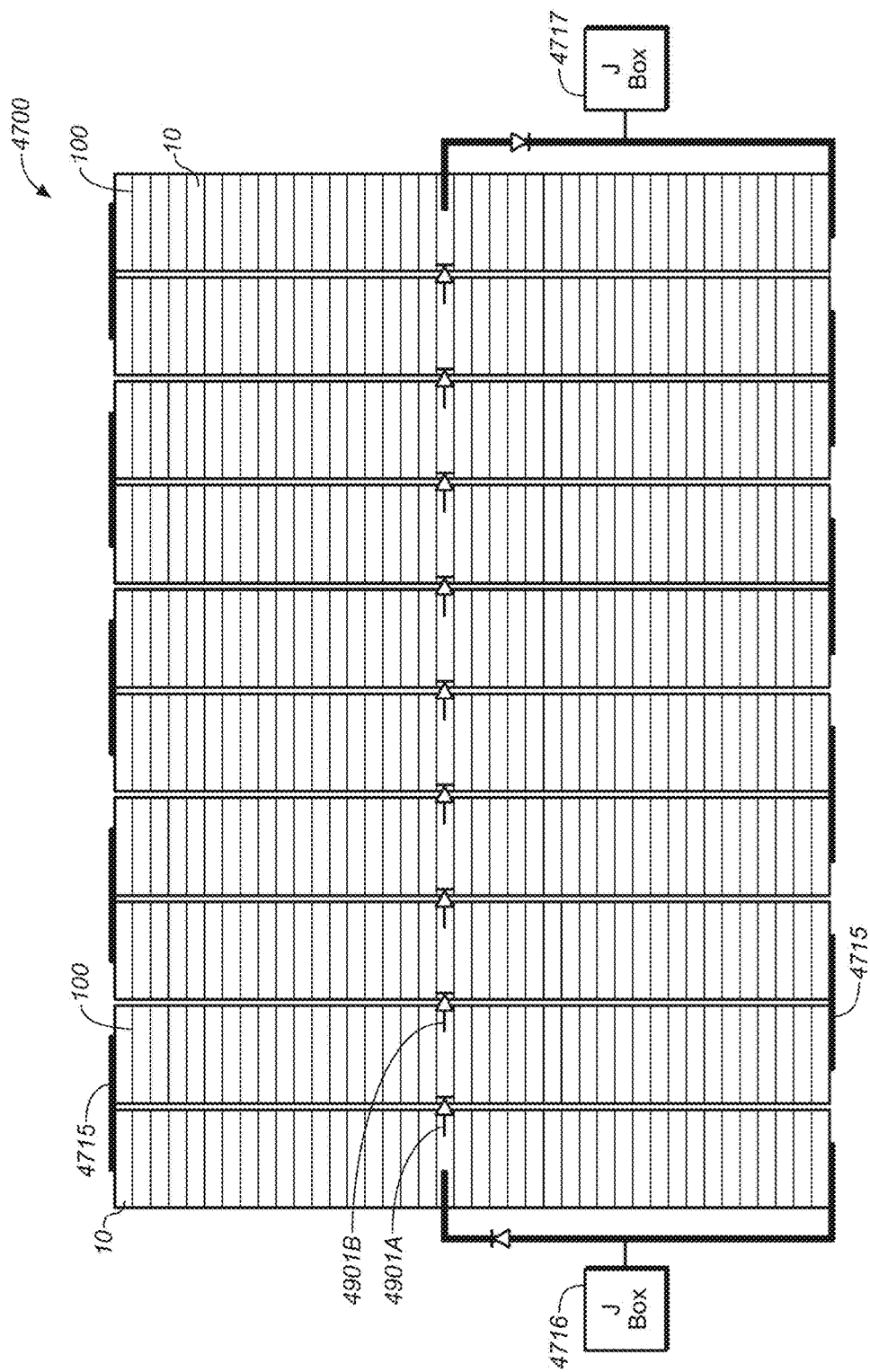
FIG. 61A illustrates an example of a solar module utilizing about 1 bypass diode per super cell.
Figure 61B:
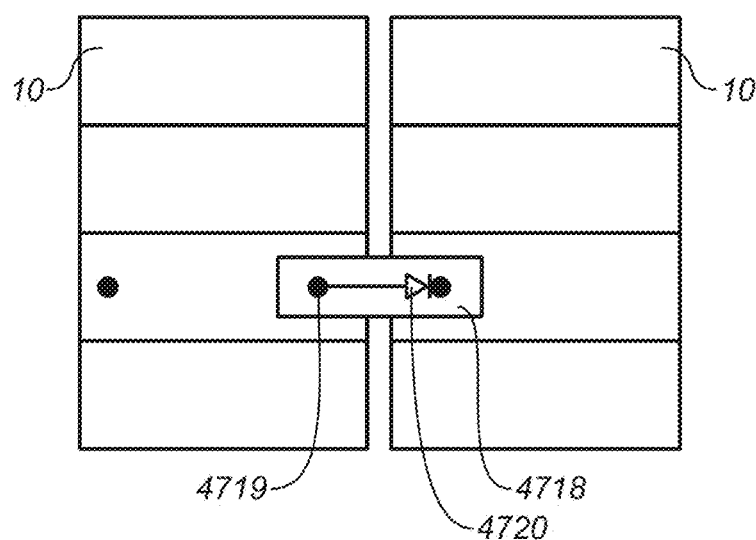
FIG. 61B illustrates an example configuration for a bypass diode connected between two neighboring super cells using a flexible electrical interconnect.
Figure 61C:
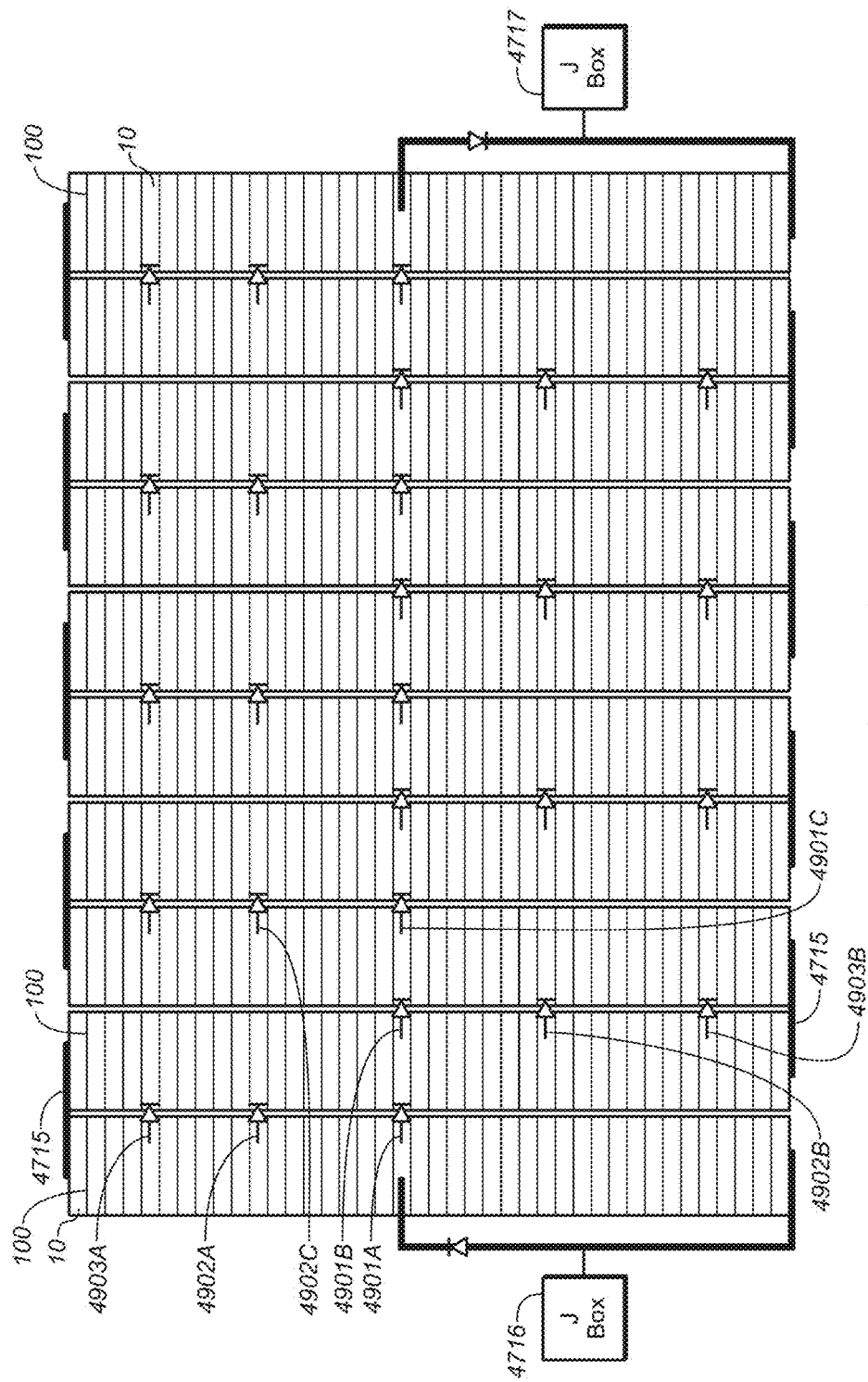
FIG. 61C illustrates an example of a solar module utilizing bypass diodes in a nested configuration.

Referring now to FIGS. 61A-61C, example high voltage solar modules utilizing bypass diodes are provided. When a portion of a solar module is shaded, damage to the module may be prevented or reduced through the use of bypass diodes. For the example solar module 4700 shown in FIG. 61A, 10 super cells 100 are connected in series. As illustrated, the 10 super cells are arranged in parallel rows. Each super cell contains 40 series connected solar cells 10, where each of the 40 solar cells is made from approximately ⅙ of a square or pseudo-square, as described herein. Under normal unshaded operation, current flows in from junction box 4716 through each of the super cells 100 connected in series through connectors 4715, and then current flows out through junction box 4717. Optionally, a single junction box may be used instead of separate junction boxes 4716 and 4717, so that current returns to one junction box. The example shown in FIG. 61A shows an implementation with approximately one bypass diode per super cell. As shown, a single bypass diode is electrically connected between a pair of neighboring super cells at a point approximately midway along the super cells (e.g., a single bypass diode 4901A is electrically connected between the $22^{nd}$ solar cell of the first super cell and its neighboring solar cell in the second super cell, a second bypass diode 4901B is electrically connected between the second super cell and the third super cell, and so forth). The first and last strings of cells have only approximately half the number of solar cells in a super cell per bypass diode. For the example shown in FIG. 61A, the first and last strings of cells include only 22 cells per bypass diode. The total number of bypass diodes (11) for the variation of high voltage solar module illustrated in FIG. 61A is equal to the number of super cells plus 1 additional bypass diode.

Each bypass diode may be incorporated into a flex circuit, for example. Referring now to FIG. 61B, an expanded view of a bypass diode connected region of two neighboring super cells is shown. The view for FIG. 61B is from the non-sunny side. As shown, two solar cells 10 on neighboring super cells are electrically connected using a flex circuit 4718 comprising a bypass diode 4720. Flex circuit 4718 and bypass diode 4720 are electrically connected to the solar cells 10 using contact pads 4719 located on the rear surfaces of the solar cells. (See also further discussion below of the use of hidden contact pads to provide hidden taps to bypass diodes.) Additional bypass diode electrical connection schemes may be employed to reduce the number of solar cells per bypass diode. One example is illustrated in FIG. 61C. As shown, one bypass diode is electrically connected between each pair of neighboring super cells approximately midway along the super cells. Bypass diode 4901A is electrically connected between neighboring solar cells on the first and second super cells, bypass diode 4901B is electrically connected between neighboring solar cells on the second and third super cells, bypass diode 4901C is electrically connected between neighboring solar cells on the third and fourth super cells, and so forth. A second set of bypass diodes may be included to reduce the number solar cells that will be bypassed in the event of partial shade. For example, a bypass diode 4902A is electrically connected between the first and second super cells at an intermediate point between bypass diodes 4901A and 4901B, a bypass diode 4902B is electrically connected between the second and third super cells at an intermediate point between bypass diodes 4901B and 4901C, and so forth, reducing the number of cells per bypass diode. Optionally, yet another set of bypass diodes may be electrically connected to further reduce the number of solar cells to be bypassed in the event of partial shade. Bypass diode 4903A is electrically connected between the first and second super cells at an intermediate point between bypass diodes 4902A and 4901B, bypass diode 4903B is electrically connected between second and third super cells at an intermediate point between bypass diodes 4902B and 4901C, further reducing the number of cells per bypass diode. This configuration results in a nested configuration of bypass diodes, which allows small groups of cells to be bypassed during partial shading. Additional diodes may be electrically connected in this manner until a desired number of solar cells per bypass diode is achieved, e.g., about 8, about 6, about 4, or about 2 per bypass diode. In some modules, about 4 solar cells per bypass diode is desired. If desired, one or more of the bypass diodes illustrated in FIG. 61C may be incorporated into hidden flexible interconnect as illustrated in FIG. 61B.

This specification discloses solar cell cleaving tools and solar cell cleaving methods that may be used, for example, to separate conventionally sized square or pseudo square solar cells into a plurality of narrow rectangular or substantially rectangular solar cells. These cleaving tools and methods apply a vacuum between bottom surfaces of the conventionally sized solar cells and a curved supporting surface to flex the conventionally sized solar cells against the curved supporting surface and thereby cleave the solar cells along previously prepared scribe lines. An advantage of these cleaving tools and cleaving methods is that they do not require physical contact with the upper surfaces of the solar cells. Consequently, these cleaving tools and methods may be employed to cleave solar cells comprising soft and/or uncured materials on their upper surfaces that could be damaged by physical contact. In addition, in some variations these cleaving tools and cleaving methods may require contact with only portions of the bottom surfaces of the solar cells. In such variations these cleaving tools and methods may be employed to cleave solar cells comprising soft and/or uncured materials on portions of their bottom surfaces not contacted by the cleaving tool.

For example, one solar cell manufacturing method utilizing the cleaving tools and methods disclosed herein comprises laser scribing one or more scribe lines on each of one or more conventionally sized silicon solar cells to define a plurality of rectangular regions on the silicon solar cells, applying an electrically conductive adhesive bonding material to portions of the top surfaces of the one or more silicon solar cells, and applying a vacuum between the bottom surfaces of the one or more silicon solar cells and a curved supporting surface to flex the one or more silicon solar cells against the curved supporting surface and thereby cleave the one or more silicon solar cells along the scribe lines to provide a plurality of rectangular silicon solar cells each comprising a portion of the electrically conductive adhesive bonding material disposed on its front surface adjacent a long side. The conductive adhesive bonding material may be applied to the conventionally sized silicon solar cells either before or after the solar cells are laser scribed.

The resulting plurality of rectangular silicon solar cells may be arranged in line with long sides of adjacent rectangular silicon solar cells overlapping in a shingled manner with a portion of the electrically conductive adhesive bonding material disposed in between. The electrically conductive bonding material may then be cured to thereby bond adjacent overlapping rectangular silicon solar cells to each other and electrically connect them in series. This process forms a shingled "super cell" as described in the patent applications listed above in the "Cross Reference To Related Applications".

Turning now to the figures to better understand the cleaving tools and methods disclosed herein, FIG. 20A schematically illustrates a side view of an example apparatus 1050 that may be used to cleave scribed solar cells. In this apparatus, a scribed conventionally sized solar cell wafer 45 is carried by a perforated moving belt 1060 over a curved portion of a vacuum manifold 1070. As solar cell wafer 45 passes over the curved portion of the vacuum manifold, a vacuum applied through the perforations in the belt pulls the bottom surface of solar cell wafer 45 against the vacuum manifold and thereby flexes the solar cell. The radius of curvature R of the curved portion of the vacuum manifold may be selected so that flexing solar cell wafer 45 in this manner cleaves the solar cell along the scribe lines to form rectangular solar cells 10. Rectangular solar cells 10 may, for example, be used in a super cell as illustrated in FIGS. 1 and 2. Solar cell wafer 45 may be cleaved by this method without contacting the top surface of solar cell wafer 45 to which the conductive adhesive bonding material has been applied.

Cleaving may be preferentially initiated at one end of a scribe line (i.e., at one edge of solar cell 45) by, for example, arranging for the scribe lines to be oriented at an angle θ to the vacuum manifold so that for each scribe line one end reaches the curved portion of the vacuum manifold before the other end. As shown in FIG. 20B, for example, the solar cells may be oriented with their scribe lines at an angle to the direction of travel of the belt and to a curved cleaving portion of the manifold oriented perpendicularly to the direction of travel of the belt. As another example, FIG. 20C shows the cells oriented with their scribe lines perpendicular to the direction of travel of the belt, and curved cleaving portion of the manifold oriented at an angle to the direction of travel of the belt.

Cleaving tool 1050 may utilize, for example, a single perforated moving belt 1060 having a width perpendicular to its direction of travel about equal to the width of solar cell wafer 45. Alternatively, tool 1050 may comprise two, three, four, or more perforated moving belts 1060 which may be arranged side-by-side in parallel and optionally spaced apart from each other, for example. Cleaving tool 1050 may utilize a single vacuum manifold, which may for example have a width perpendicular to the direction of travel of the solar cells approximately equal to the width of a solar cell wafer 45. Such a vacuum manifold may be employed, for example, with a single full width perforated moving belt 1060 or with two or more such belts arranged side-by-side in parallel and optionally spaced apart from each other, for example.

Cleaving tool 1050 may comprise two or more curved vacuum manifolds arranged side-by-side in parallel and space apart from each other, with each vacuum manifold having the same curvature. Such an arrangement may be employed, for example, with a single full width perforated moving belt 1060 or with two or more such belts arranged side-by-side in parallel and optionally spaced apart from each other. For example, the tool may comprise a perforated moving belt 1060 for each vacuum manifold. In the latter arrangement the vacuum manifolds and their corresponding perforated moving belts may be arranged to contact the bottom of the solar cell wafer only along two narrow strips defined by the widths of the belts. In such cases the solar cell may comprise soft materials in the region of the bottom surface of the solar cell wafer not contacted by belts without risk of damage to the soft materials during the cleaving process.

Any suitable arrangement of perforated moving belts and vacuum manifolds may be used in cleaving tool 1050.

In some variations the scribed solar cell wafers 45 comprise uncured conductive adhesive bonding material and/or other soft materials on their top and/or bottom surfaces prior to cleaving using cleaving tool 1050. Scribing of the solar cell wafer and application of the soft material may have occurred in either order.

FIG. 62A schematically illustrates a side view, and FIG. 62B a top view, of another example cleaving tool 5210 similar to cleaving tool 1050 described above. In use of cleaving tool 5210, a conventionally sized scribed solar cell wafer 45 is placed on a pair of parallel spaced apart perforated belts 5230 which move at constant speed over a pair of corresponding parallel and spaced apart vacuum manifolds 5235. Vacuum manifolds 5235 typically have the same curvature. As the wafer travels with the belts over the vacuum manifolds through a cleaving region 5235C the wafer is bent around a cleaving radius defined by curved supporting surfaces of the vacuum manifolds by the force of the vacuum pulling on the bottom of the wafer. As the wafer is bent around the cleaving radius the scribe lines become cracks that separate the wafer into individual rectangular solar cells. As further described below, the curvature of the vacuum manifolds is arranged so that adjacent cleaved rectangular solar cells are not coplanar and the edges of adjacent cleaved rectangular solar cells consequently do not contact each other after the cleaving process occurs. The cleaved rectangular solar cells may be continuously unloaded from the perforated belts by any suitable method, several examples of which are described below. Typically, the unloading method further separates adjacent cleaved solar cells from each other to prevent contact between them if they subsequently lie coplanar.

Still referring to FIGS. 62A-62B, each vacuum manifold may comprise a flat region 5235F providing no, low, or high vacuum; an optional curved transitional region 5235T providing low or high vacuum, or transitioning from low to high vacuum along its length; a cleave region 5235C providing a high vacuum; and a tighter radius post cleave region 5235PC providing a low vacuum. Belts 5230 transport wafers 45 from flat region 5235F into and through transitional region 5235T and then into cleave region 5235C, where the wafers cleave, and then transport the resulting cleaved solar cells 10 out of cleave region 5235C and into the post cleave region 5235PC.

Flat region 5235F is typically operated at a low vacuum sufficient to constrain wafers 45 to the belts and vacuum manifolds. The vacuum here may be low (or absent) to reduce friction and thus the required belt tension, and because it is easier to constrain the wafers 45 to a flat surface than to curved surfaces. The vacuum in flat region 5235F may be, for example, about 1 to about 6 inches of mercury.

Transitional region 5235T provides a transitional curvature from flat region 5235F to cleave region 5235C. The radius of curvature, or radii of curvature, in transitional region 5235T are greater than the radius of curvature in cleave region 5235C. The curve in transitional region 5235T may be a portion of an ellipse, for example, but any suitable curve may be used. Having wafers 45 approach cleave region 5235C through transition region 5235T at a shallower change in curvature, rather than transitioning directly from a flat orientation in region 5235F to the cleaving radius in cleaving region 5235C, helps to ensure that the edges of wafers 45 do not lift and break vacuum, which might make it difficult to constrain the wafers to the cleave radius in cleave region 5235C. The vacuum in transitional region 5235T may, for example, be the same as in cleave region 5235C, intermediate between that of region 5235F and 5235C, or transition along the length of region 5235T between that in region 5235F and that in region 5235C. The vacuum in transitional region 5235T may be, for example, about 2 to about 8 inches of mercury.

Cleave region 5235C may have a varying radius of curvature or, optionally, a constant radius of curvature. Such a constant radius of curvature may be, for example, about 11.5 inches, about 12.5 inches, or between about 6 inches and about 18 inches. Any suitable range of curvature may be used, and may be selected based in part on the thickness of wafer 45 and the depth and geometry of the scribe lines in wafer 45. Typically, the thinner the wafer the shorter the radius of curvature required to flex the wafer sufficiently to crack it along a scribe line. The scribe lines may have a depth, for example, of about 60 microns to about 140 microns, though any other suitable shallower or deeper scribe line depth may also be used. Typically, the shallower the scribe the shorter the radius of curvature required to flex the wafer sufficiently to crack it along a scribe line. The cross-sectional shape of the scribe line also affects the required radius of curvature. A scribe line having a wedge shape or a wedge shaped bottom may concentrate stress more effectively than a scribe line having a rounded shape or a rounded bottom. Scribe lines that concentrate stress more effectively may not require as tight a radius of curvature in the cleave region as scribe lines that concentrate stress less effectively.

The vacuum in cleave region 5235C, at least for one of the two parallel vacuum manifolds, is typically higher than in the other regions to ensure that the wafer is properly constrained to the cleaving radius of curvature to maintain constant bending stress. Optionally, and as further explained below, in this region one manifold may provide a higher vacuum than the other in order to better control cracking along the scribe lines. The vacuum in cleave region 5235C may be, for example, about 4 to about 15 inches of mercury, or about 4 to about 26 inches of mercury.

Post cleave region 5235PC typically has a tighter radius of curvature than cleave region 5235C. This facilitates transferring the cleaved solar cells from belts 5230 without allowing the fractured surfaces of adjacent cleaved solar cells to rub or touch (which could cause solar cell failures from cracks or other failure modes). In particular, the tighter radius of curvature provides greater separation between the edges of adjacent cleaved solar cells on the belts. The vacuum in post cleave region 5235PC may be low (e.g., similar to or the same as that in flat region 5235F) because the wafers 45 have already been cleaved into solar cells 10 so it is no longer necessary to constrain the solar cells to the curved radius of the vacuum manifolds. Edges of the cleaved solar cells 10 may lift off from belts 5230, for example. Further, it may be desirable that cleaved solar cells 10 not be overstressed.

The flat, transitional, cleave, and post-cleave regions of the vacuum manifolds may be discrete portions of different curves with their ends matched. For example, the upper surface of each manifold may comprise a flat planar portion, a portion of an ellipse for the transition region, an arc of circle for the cleave region, and another arc of a circle or portion of an ellipse for the post cleave region. Alternatively, some or all of the curved portion of the upper surface of a manifold may comprise a continuous geometric function of increasing curvature (decreasing diameter of the osculating circle). Suitable such functions may include but are not limited to spiral functions such as clothoids, for example, and the natural log function. A clothoid is a curve in which the curvature increases linearly along the curve path length. For example, in some variations, the transitional, cleave, and post cleave regions are all part of a single clothoid curve having one end matched to the flat region. In some other variations, the transitional region is a clothoid curve having one end matched to the flat region and another end matched to a cleave region having a circular curvature. In the latter variations the post cleave region may have, for example, a tighter radius circular curvature, or a tighter radius clothoid curvature.

As noted above and as schematically illustrated in FIG. 62B and FIG. 63A, in some variations one manifold provides a high vacuum in cleave region 5235C and the other manifold provides a low vacuum in cleave region 5235C. The high vacuum manifold fully constrains the end of the wafer it supports to the curvature of the manifold, which provides sufficient stress at the end of a scribe line overlying the high vacuum manifold to start a crack along the scribe line. The low vacuum manifold does not fully constrain the end of the wafer it supports to the curvature of the manifold, so the bend radius of the wafer on that side is not tight enough to create the stress necessary to start a crack in the scribe line. However, the stress is sufficiently high to propagate the crack started at the other end of the scribe line overlying the high vacuum manifold. Without some vacuum on the "low vacuum" side to partially and sufficiently constrain that end of the wafer to the curvature of the manifold, there may be a risk that the crack started on the opposite "high vacuum" end of the wafer does not propagate all the way across the wafer. In variations as just described one manifold may optionally provide a low vacuum along its entire length, from flat region 5235F through post cleave region 5235PC.

As just described, an asymmetric vacuum arrangement in cleave region 5235C provides asymmetric stress along the scribe lines that controls nucleation and propagation of cracks along the scribe lines. Referring for example to FIG. 63B, if instead the two vacuum manifolds provide equal (e.g., high) vacuums in cleave regions 5235C, cracks may nucleate at both ends of the wafer, propagate toward each other, and meet somewhere in a central region of the wafer. Under these circumstances there is a risk that the cracks are not in line with each other and that they therefore produce a potential mechanical failure point in the resulting cleaved cells where the cracks meet.

As an alternative to the asymmetric vacuum arrangement described above, or in addition to it, cleaving may be preferentially initiated at one end of a scribe line by arranging for one end of the scribe line to reach the cleave region of the manifolds before the other. This may be accomplished, for example, by orienting the solar cell wafers at an angle to the vacuum manifolds as described above with respect to FIG. 20B. Alternatively, the vacuum manifolds may be arranged so that the cleave region of one of the two manifolds is further along the belt path than the cleave region of the other vacuum manifold. For example, two vacuum manifolds having the same curvature may be slightly offset in the direction of travel of the moving belt so that the solar cell wafers reach the cleave region of one manifold before reaching the cleave region of the other vacuum manifold.

Figure 64:
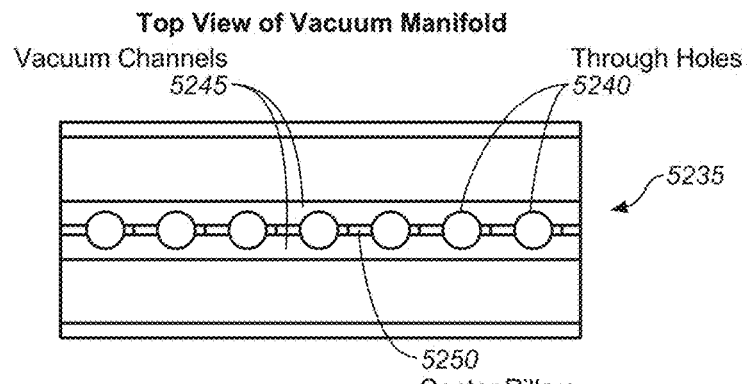
FIG. 64 schematically illustrates a top view of a portion of an example vacuum manifold that may be used in the cleaving tool of FIGS. 62A-62B.
Figure 65A:
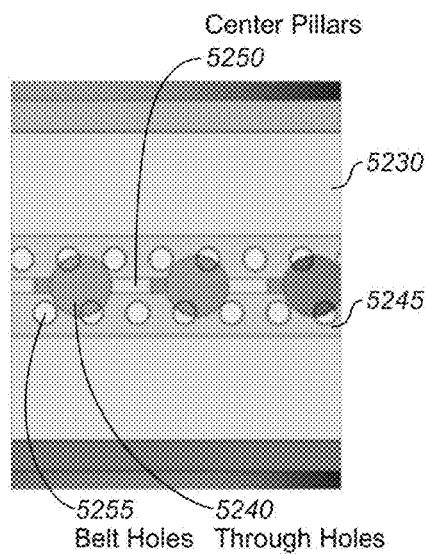
FIG. 65A and FIG. 65B provide, respectively, schematic illustrations of top and perspective views of the example vacuum manifold of FIG. 64 overlaid by a perforated belt.
Figure 65B:
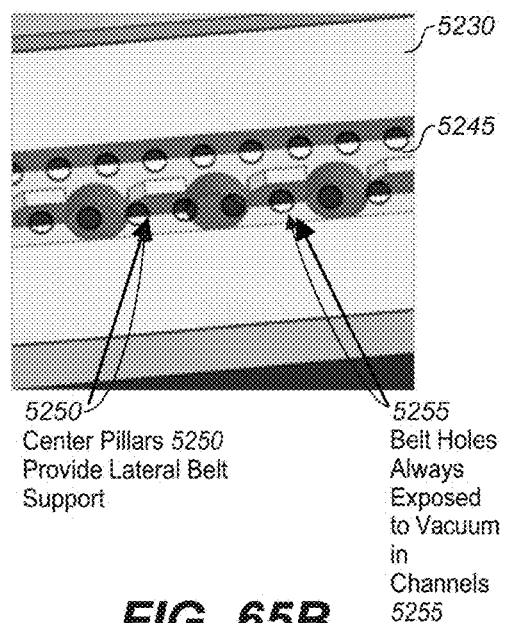
Figure 66:
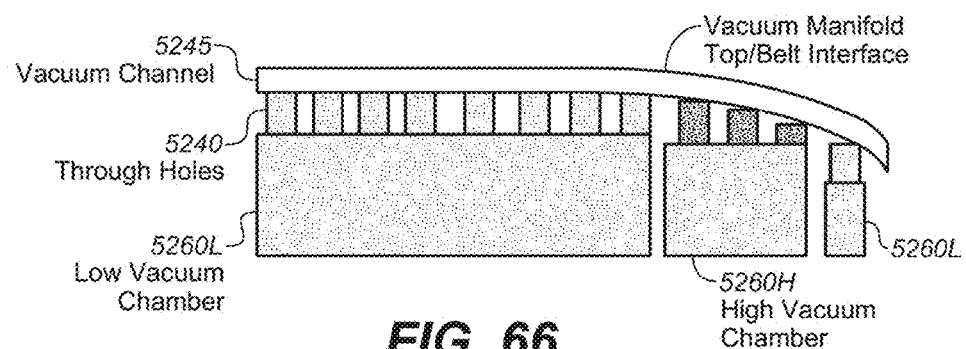
FIG. 66 schematically illustrates a side view of an example vacuum manifold that may be used in the cleaving tool of FIGS. 62A-62B.

Referring now to FIG. 64, in the illustrated example each vacuum manifold 5235 comprises through holes 5240 arranged in line down the center of a vacuum channel 5245. As shown in FIGS. 65A-65B, vacuum channel 5245 is recessed into an upper surface of the manifold that supports a perforated belt 5230. Each vacuum manifold also comprises center pillars 5250 positioned between through holes 5240 and arranged in line down the center of vacuum channel 5245. Center pillars 5250 effectively separate vacuum channel 5245 into two parallel vacuum channels on either side of the row of center pillars. Center pillars 5250 also provide support for belt 5230. Without center pillars 5250, belt 5230 would be exposed to a longer unsupported region and could potentially be sucked down toward through holes 5240. This could result in three-dimensional bending of wafers 45 (bending with the cleave radius and perpendicular to the cleave radius), which could damage the solar cells and interfere with the cleaving process.

As shown in FIGS. 65A-65B and FIGS. 66-67, in the illustrated example through holes 5240 communicate with a low vacuum chamber 5260L (flat region 5235F and transition region 5235T in FIG. 62A), with a high vacuum chamber 5260H (cleave region 5235C in FIG. 62A), and with another low vacuum chamber 5260L (post cleave region 5235PC in FIG. 62A). This arrangement provides a smooth transition between low vacuum and high vacuum regions in vacuum channel 5245. Through holes 5240 provide enough flow resistance so that if the region to which a hole corresponds is left fully open the air flow will not completely bias to that one hole, allowing other regions to maintain vacuum. Vacuum channel 5245 helps to ensure that the vacuum belt holes 5255 will always have vacuum and will not be in a dead spot when positioned between the through holes 5240.

Figure 67:
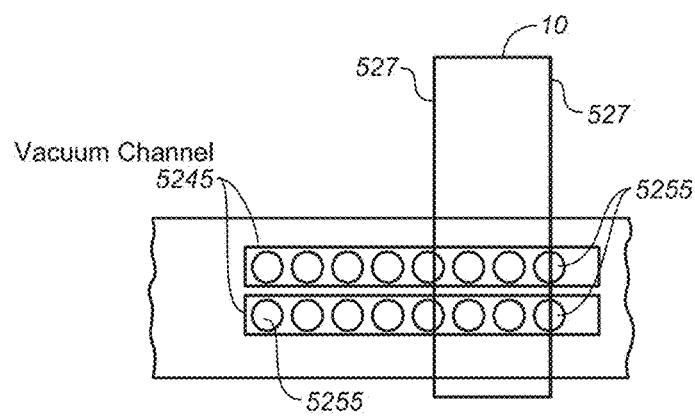
FIG. 67 schematically illustrates a cleaved solar cell overlying an example arrangement of a perforated belt and a vacuum manifold.

Referring again to FIGS. 65A-65B and also to FIG. 67, perforated belts 5230 may comprise, for example, two rows of holes 5255 optionally arranged such that leading and trailing edges 527 of a wafer 45 or a cleaved solar cell 10 are always under vacuum as the belt progresses along the manifold. In particular, the staggered arrangement of holes 5255 in the illustrated example ensures that the edges of a wafer 45 or a cleaved solar cell 10 always overlap at least one hole 5255 in each belt 5230. This helps to prevent edges of a wafer 45 or cleaved solar cell 10 from lifting away from belt 5230 and manifold 5235. Any other suitable arrangement of holes 5255 may also be used. In some variations, the arrangement of holes 5255 does not ensure that the edges of a wafer 45 or a cleaved solar cell 10 are always under vacuum.

Perforated moving belts 5230 in the illustrated example of cleaving tool 5210 contact the bottom of solar cell wafer 45 only along two narrow strips defined by the widths of the belts along the lateral edges of the solar cell wafer. Consequently, the solar cell wafer may comprise soft materials such as uncured adhesives, for example, in the region of the bottom surface of the solar cell wafer not contacted by belts 5230 without risk of damage to the soft materials during the cleaving process.

In alternative variations cleaving tool 5210 may utilize, for example, a single perforated moving belt 5230 having a width perpendicular to its direction of travel about equal to the width of solar cell wafer 45, rather than two perforated moving belts as just described. Alternatively, cleaving tool 5210 may comprise three, four, or more perforated moving belts 5230 which may be arranged side-by-side in parallel and optionally spaced apart from each other. Cleaving tool 5210 may utilize a single vacuum manifold 5235 which may for example have a width perpendicular to the direction of travel of the solar cells approximate equal to the width of a solar cell wafer 45. Such a vacuum manifold may be employed, for example, with a single full width perforated moving belt 5230 or with two or more such belts arranged side-by-side in parallel and optionally spaced apart from each other. Cleaving tool 5210 may comprise, for example, a single perforated moving belt 5230 supported along opposite lateral edges by two curved vacuum manifolds 5235 arranged side-by-side in parallel and space apart from each other, with each vacuum manifold having the same curvature. Cleaving tool 5210 may comprise three or more curved vacuum manifolds 5235 arranged side-by-side in parallel and space apart from each other, with each vacuum manifold having the same curvature. Such an arrangement may be employed, for example, with a single full width perforated moving belt 5230 or with three or more such belts arranged side-by-side in parallel and optionally spaced apart from each other. The cleaving tool may comprise a perforated moving belt 5230 for each vacuum manifold, for example.

Any suitable arrangement of perforated moving belts and vacuum manifolds may be used in cleaving tool 5210.

As noted above, in some variations the scribed solar cell wafers 45 cleaved with cleaving tool 5210 comprise uncured conductive adhesive bonding material and/or other soft materials on their top and/or bottom surfaces prior to cleaving. Scribing of the solar cell wafer and application of the soft material may have occurred in either order.

Perforated belts 5230 in cleaving tool 5210 (and perforated belts 1060 in cleaving tool 1050) may transport solar cell wafers 45 at a speed of, for example, about 40 millimeters/second (mm/s) to about 2000 mm/s or greater, or about 40 mm/s to about 500 mm/s or greater, or about 80 mm/s or greater. Cleaving of solar cell wafers 45 may be easier at higher than at lower speeds.

Figure 68:
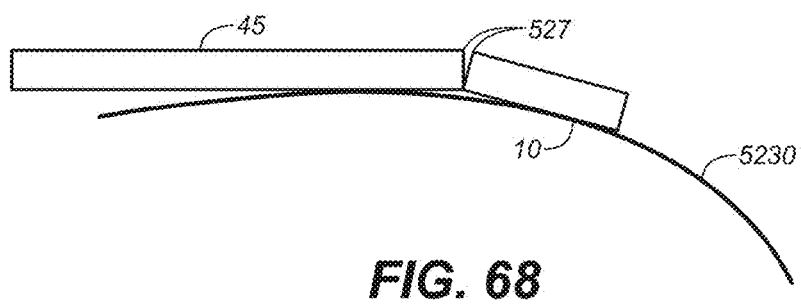
FIG. 68 schematically illustrates the relative positions and orientations of a cleaved solar cell and an uncleaved portion of a standard size wafer from which the solar cell was cleaved in an example cleaving process.

Referring now to FIG. 68, once cleaved there will be some separation between leading and trailing edges 527 of adjacent cleaved cells 10 due to the geometry of bending around a curve, which creates a wedge shaped gap between adjacent cleaved solar cells. If the cleaved cells are allowed to return to a flat coplanar orientation without first increasing the separation between cleaved cells, there is the possibility that edges of adjacent cleaved cells could contact and damage each other. Therefore it is advantageous to remove the cleaved cells from belts 5230 (or belts 1060) while they are still supported by a curved surface.

Figure 69A:
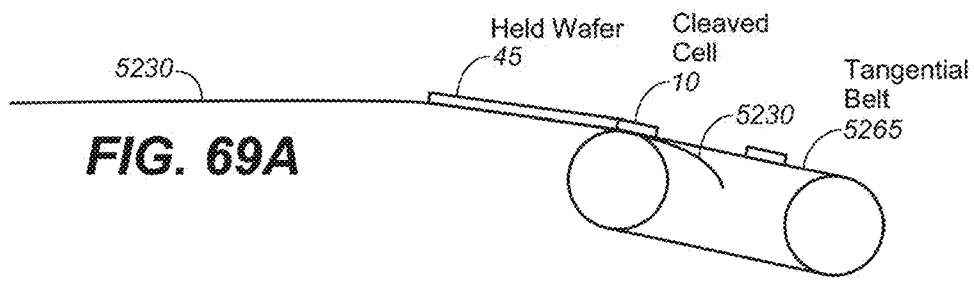
FIGS. 69A-69G schematically illustrate apparatus and methods by which cleaved solar cells may be continuously removed from a cleaving tool.
Figure 69B:
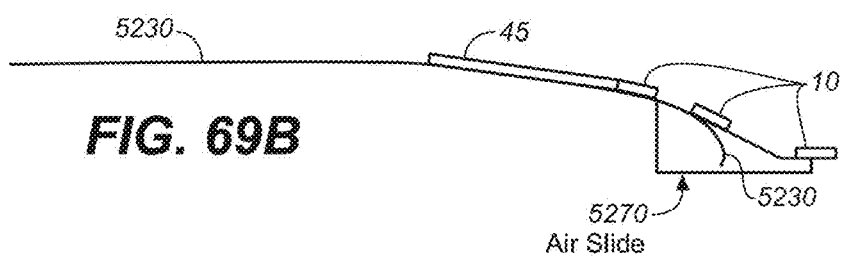

FIGS. 69A-69G schematically illustrate several apparatus and methods by which cleaved solar cells may be removed from belts 5230 (or belts 1060) and delivered to one or more additional moving belts or moving surfaces with increased separation between the cleaved solar cells. In the example of FIG. 69A, cleaved solar cells 10 are collected from belts 5230 by one or more transfer belts 5265, which move faster than belts 5230 and therefore increase the separation between cleaved solar cells 10. Transfer belts 5265 may be positioned between the two belts 5230, for example. In the example of FIG. 69B, cleaved wafers 10 are separated by sliding down a slide 5270 positioned between the two belts 5230. In this example, belts 5230 advance each cleaved cell 10 into a low vacuum (e.g., no vacuum) region of manifolds 5235 to release the cleaved cell to slide 5270, while the uncleaved portion of wafer 45 is still held by belts 5230. Providing an air cushion between the cleaved cell 10 and the slide 5270 helps to ensure that both the cell and the slide are not abraded during the operation, and also allows cleaved cells 10 to slide more quickly away from wafer 45 thereby allowing for quicker cleave belt operation speeds.

Figure 69C:
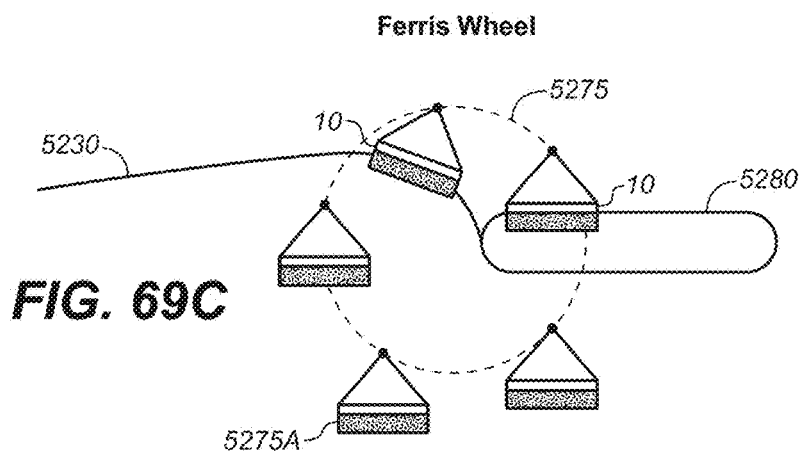

In the example of FIG. 69C, carriages 5275A in a rotating "Ferris Wheel" arrangement 5275 transfer cleaved solar cells 10 from belts 5230 to one or more belts 5280.

Figure 69D:
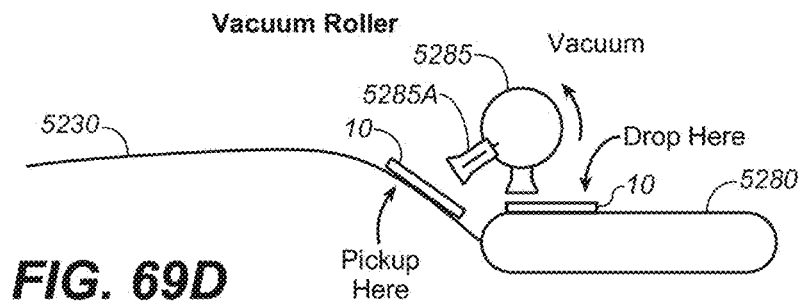

In the example of FIG. 69D, rotating roller 5285 applies a vacuum through actuators 5285A to pick up cleaved solar cells 10 from belts 5230 and place them on belts 5280.

Figure 69E:
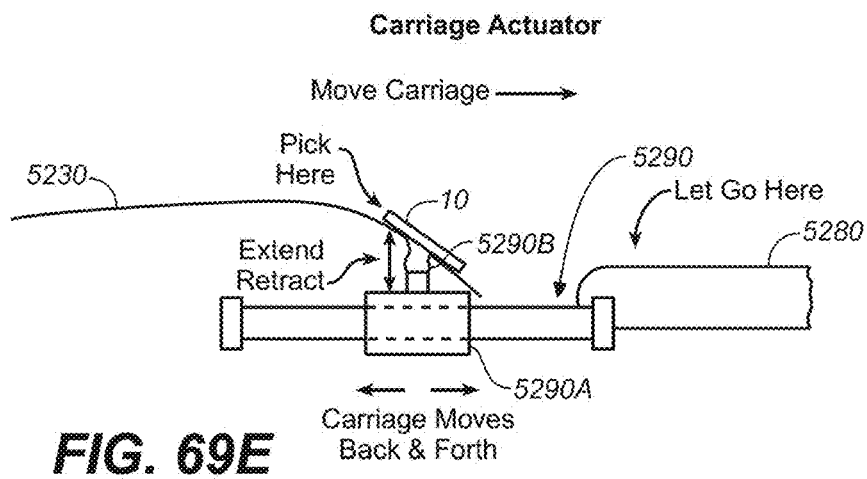

In the example of FIG. 69E, a carriage actuator 5290 comprises a carriage 5290A and an extendable and retractable actuator 5290B mounted on the carriage. Carriage 5290A translates back and forth to position actuator 5290B to remove a cleaved solar cell 10 from belts 5230 and then to position actuator 5290B to place the cleaved solar cell on belts 5280.

Figure 69F:
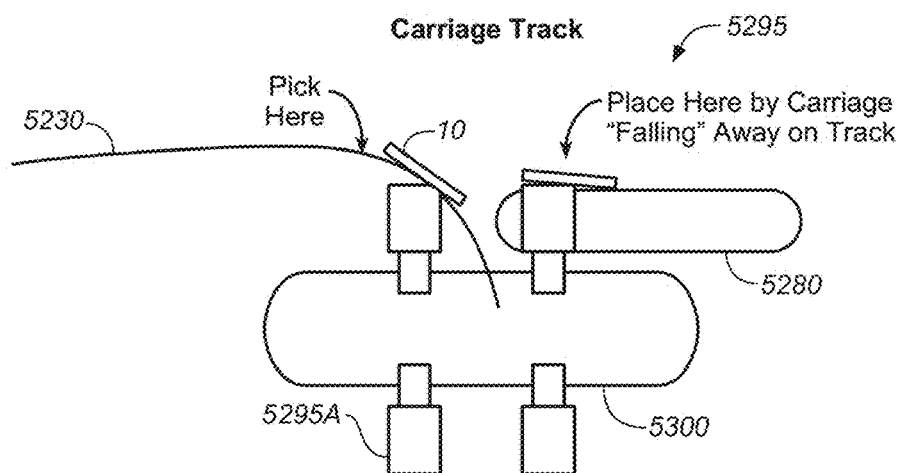

In the example of FIG. 69F, a carriage track arrangement 5295 comprises carriages 5295A attached to a moving belt 5300 which positions carriages 5295A to remove cleaved solar cells 10 from belts 5230 and then positions carriages 5295A to place cleaved solar cells 10 on belts 5280, the latter occurring as the carriages fall or pull away from belt 5280 due to the path of belt 5230.

Figure 69G:
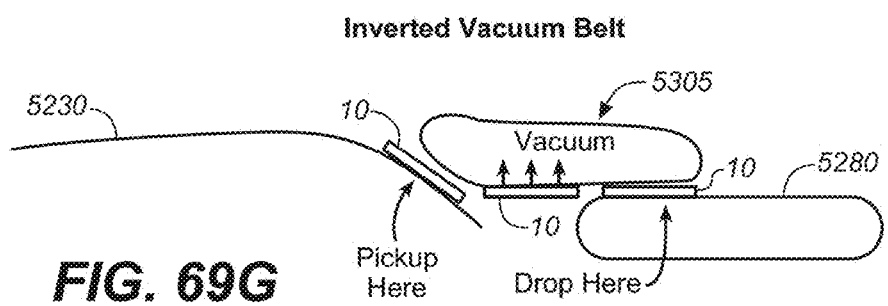

In the example of FIG. 69G, an inverted vacuum belt arrangement 5305 applies a vacuum through one or more moving perforated belts to transfer cleaved solar cells 10 from belts 5230 to belts 5280.

Figure 70C:
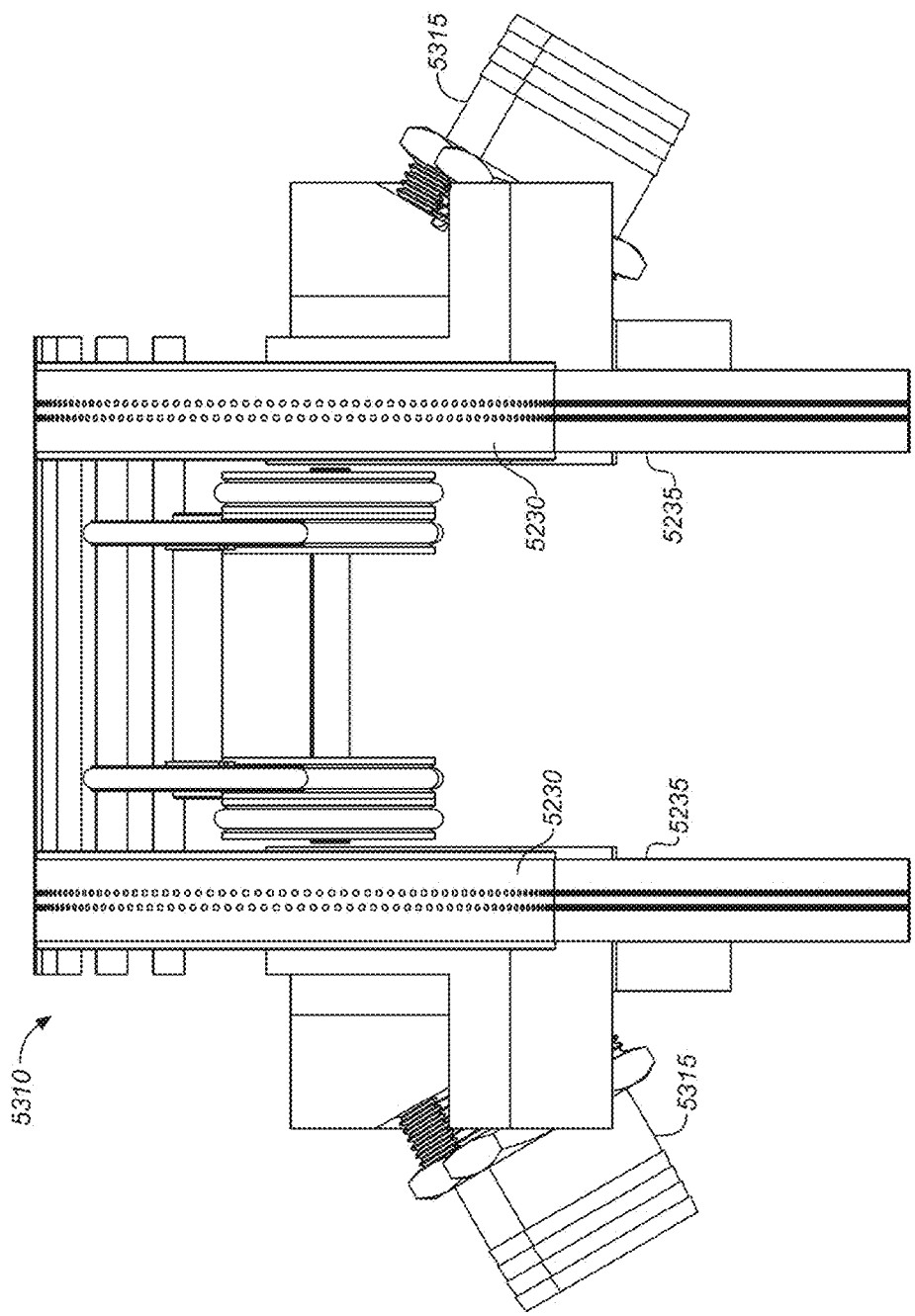
Figure 71A:
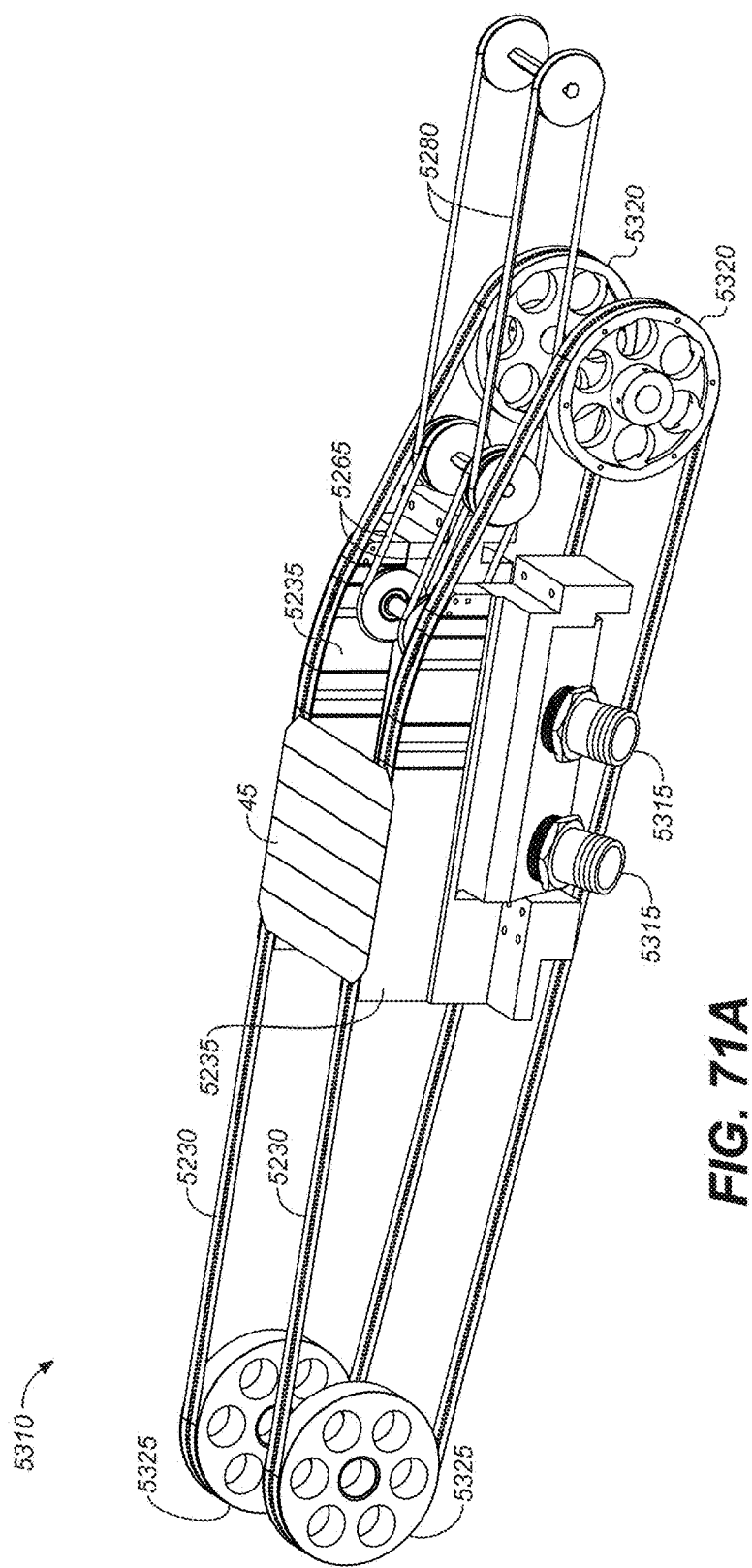
FIG. 71A and FIG. 71B provide perspective views of the example cleaving tool of FIGS. 70A-70C at two different stages of a cleaving process.
Figure 71B:
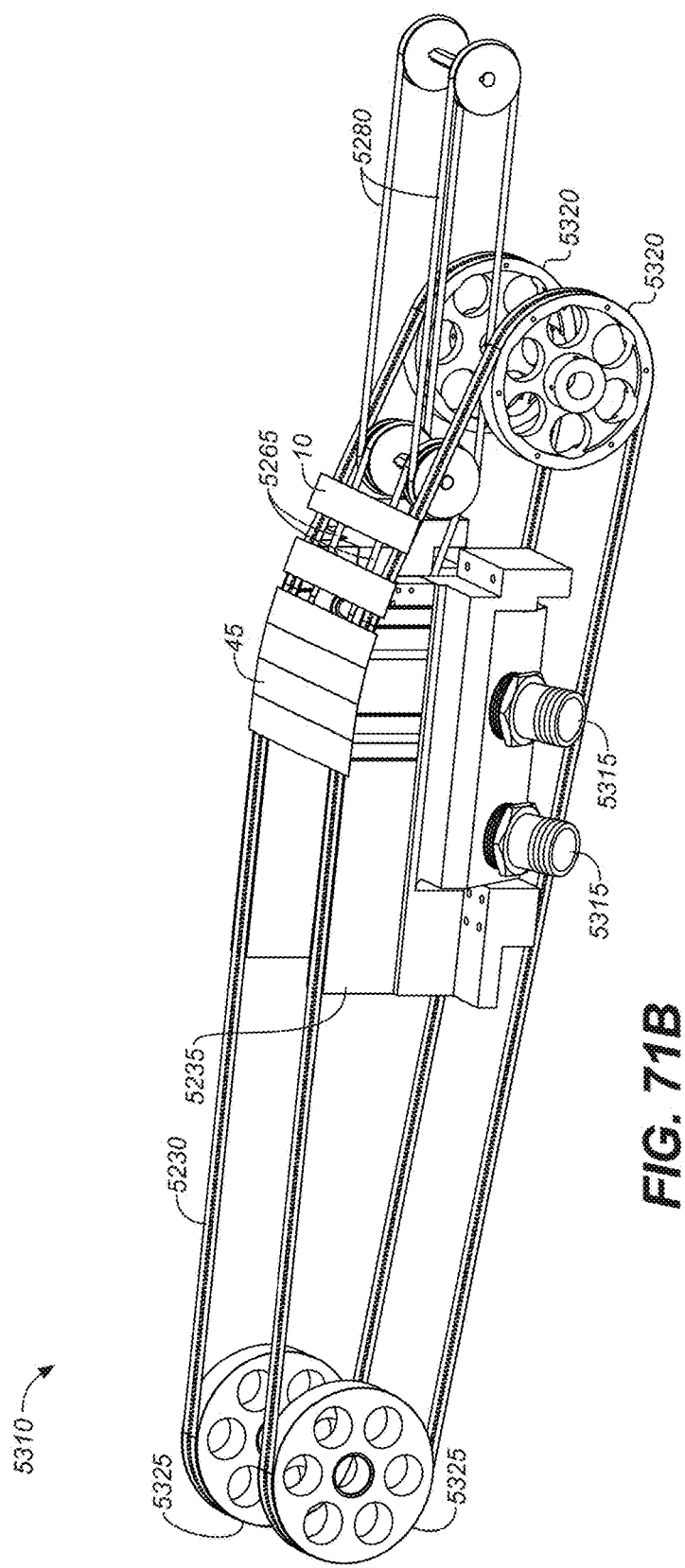

FIGS. 70A-70C provide orthogonal views of an additional variation of the example tool described above with reference to FIGS. 62A-62B and later figures. This variation 5310 uses transfer belts 5265, as in the example of FIG. 69A, to remove cleaved solar cells 10 from the perforated belts 5230 that transport uncleaved wafer 45 into the cleave region of the tool. The perspective views of FIGS. 71A-71B show this variation of the cleaving tool at two different stages of operation. In FIG. 71A an uncleaved wafer 45 is approaching the cleaving region of the tool, and in FIG. 71B the wafer 45 has entered the cleaving region and two cleaved solar cells 10 have been separated from the wafer and then further separated from each other as they are transported by transfer belts 5265.

In addition to features previously described, FIGS. 70A-71B show multiple vacuum ports 5315 on each manifold. Use of multiple ports per manifold may allow greater control over the variation of vacuum along the length of the upper surface of the manifold. For example, different vacuum ports 5315 may optionally communicate with different vacuum chambers (e.g., 5260L and 5260H in FIG. 66 and FIG. 72B), and/or optionally be connected to different vacuum pumps, to provide different vacuum pressures along the manifold. FIGS. 70A-70B also show the complete paths of perforated belts 5230, which loop around wheels 5325, upper surfaces of vacuum manifolds 5235, and wheels 5320. Belts 5230 may be driven by either wheels 5320 or wheels 5325, for example.

Figure 72A:
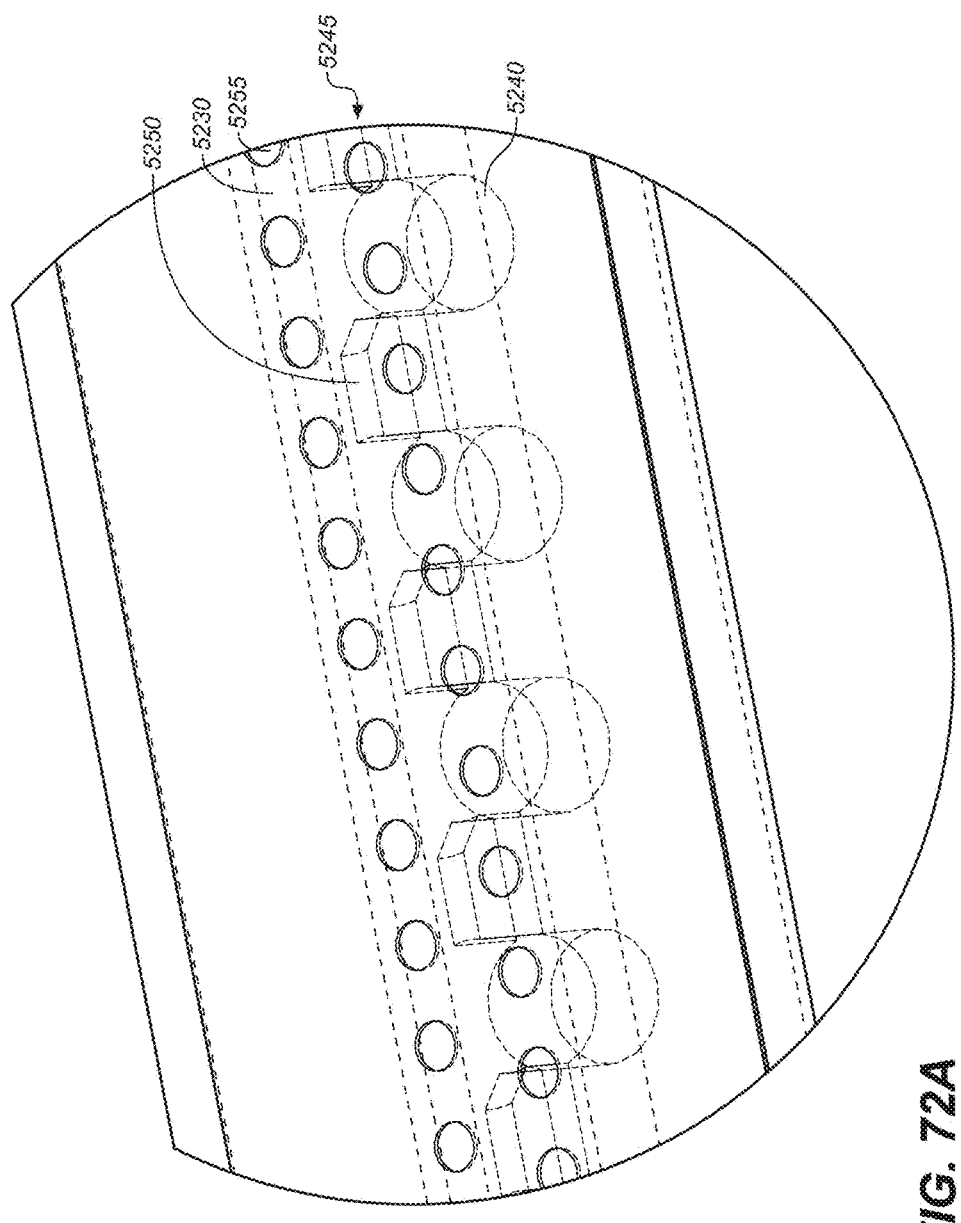
Figure 72B:
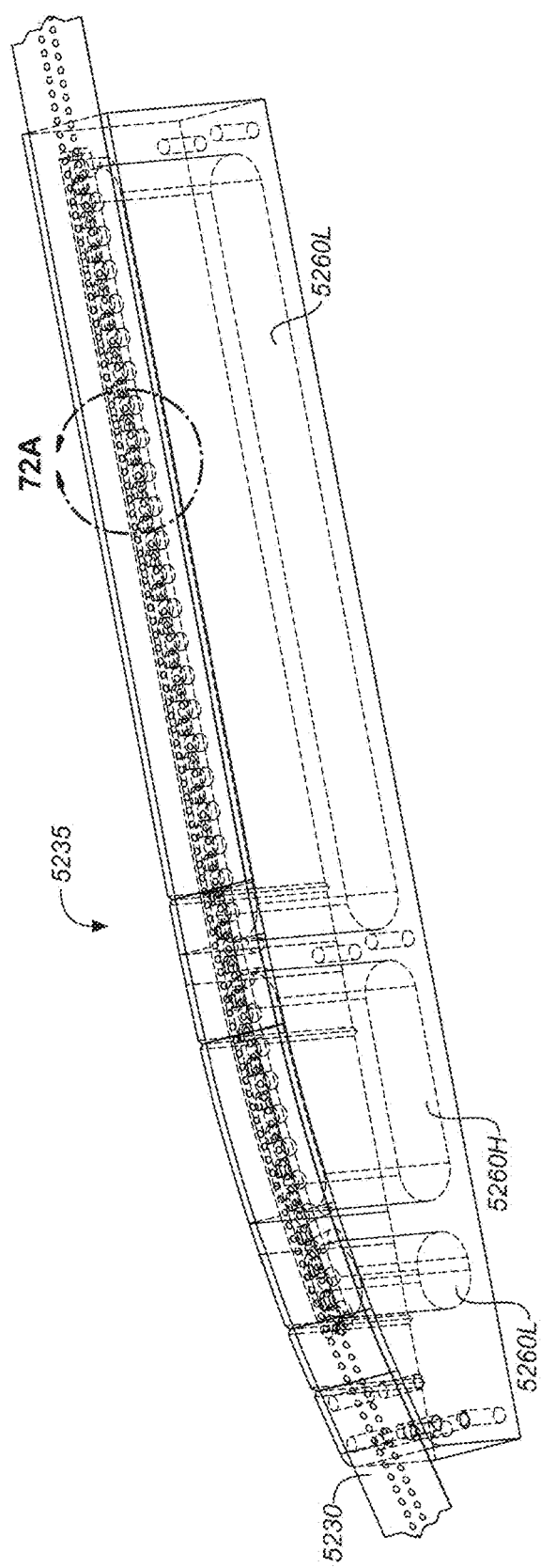
Figure 73A:
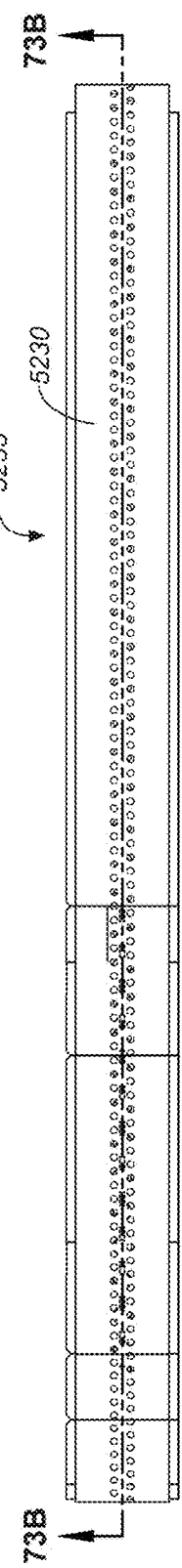
Figure 73B:
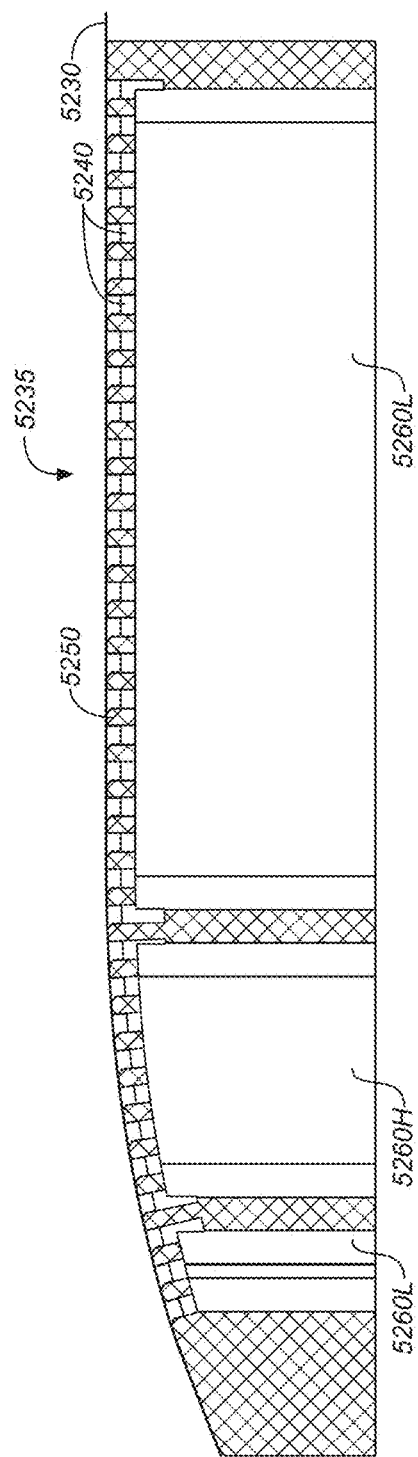
Figure 75A:
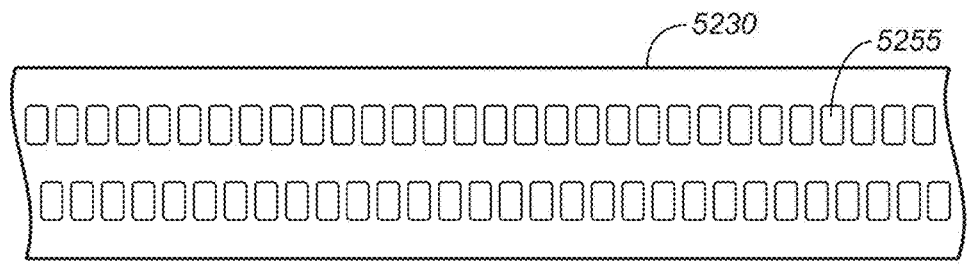
FIGS. 75A-75G illustrate details of several example hole patterns that may be used for perforated vacuum belts in the example cleaving tool of FIGS. 10A-10C.
Figure 75B:
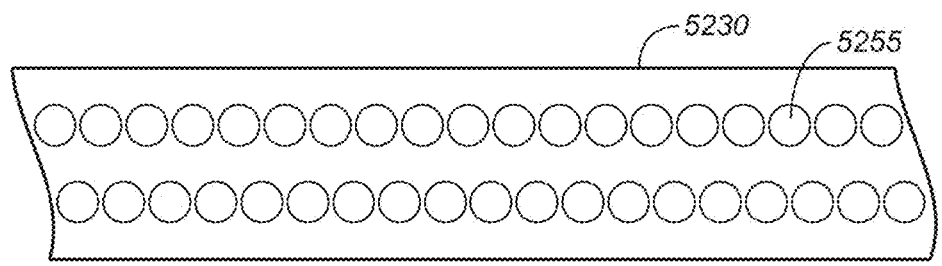
Figure 75C:
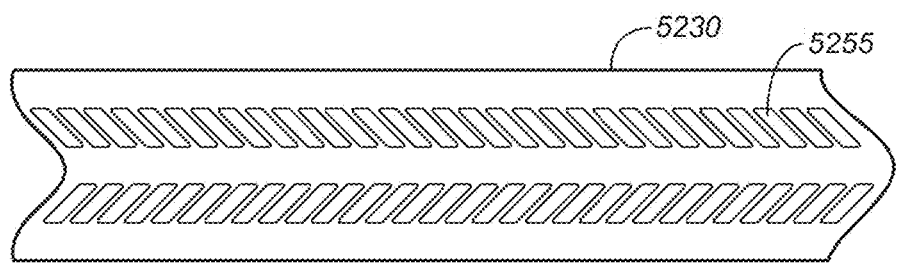
Figure 75D:
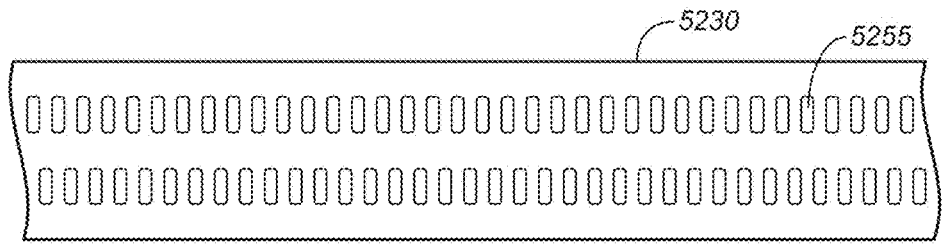
Figure 75E:
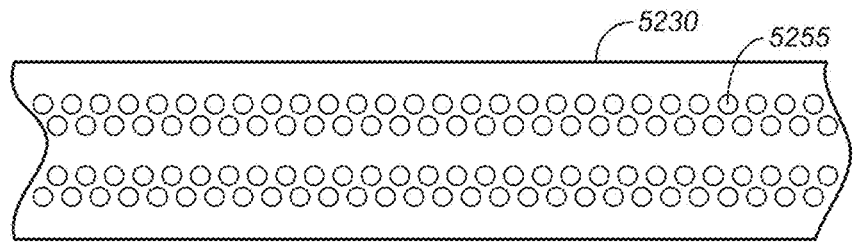
Figure 75F:
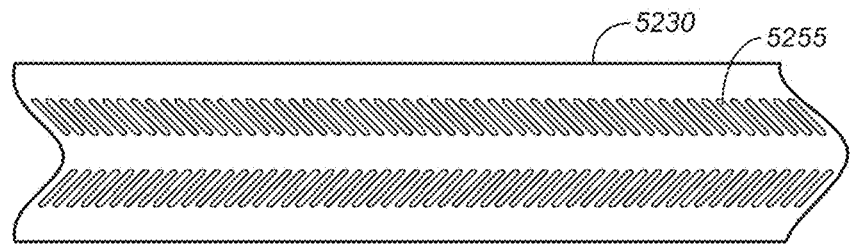
Figure 75G:
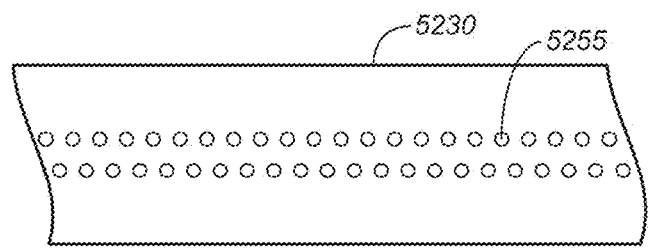

FIG. 72A and FIG. 72B show perspective views of a portion of a vacuum manifold 5235 overlaid by a portion of a perforated belt 5230 for the variation of FIGS. 70A-71B, with FIG. 72A providing a close-up view of a portion of FIG. 72B. FIG. 73A shows a top view of a portion of vacuum manifold 5235 overlaid by a perforated belt 5230, and FIG. 73B shows a cross-sectional view of the same vacuum manifold and perforated belt arrangement taken along the line C-C indicated in FIG. 73A. As shown in FIG. 73B, the relative orientations of through holes 5240 may vary along the length of vacuum manifold so that each through hole is arranged perpendicularly to the portion of the upper surface of the manifold directly above the through hole. FIG. 74A shows another top view of a portion of vacuum manifold 5235 overlaid by a perforated belt 5230, with vacuum chambers 5260L and 5260H shown in phantom views. FIG. 74B shows a close-up view of a portion of FIG. 74A.

FIGS. 75A-75G show several example hole patterns that may optionally be used for perforated vacuum belts 5230. A common characteristic of these patterns is that the straight edge of a wafer 45 or cleaved solar cell 10 crossing the pattern perpendicularly to the long axis of the belt at any location on the belt will always overlap at least one hole 5255 in each belt. The patterns may comprise, for example, two or more rows of staggered square or rectangular holes (FIGS. 75A, 75D), two or more rows of staggered circular holes (FIGS. 75B, 75E, 75G), two or more rows of angled slots (FIGS. 75C, 75F), or any other suitable arrangement of holes.

This specification discloses high-efficiency solar modules comprising silicon solar cells arranged in an overlapping shingled manner and electrically connected in series by conductive bonds between adjacent overlapping solar cells to form super cells, with the super cells arranged in physically parallel rows in the solar module. A super cell may comprise any suitable number of solar cells. The super cells may have lengths spanning essentially the full length or width of the solar module, for example, or two or more super cells may be arranged end-to-end in a row. This arrangement hides solar cell-to-solar cell electrical interconnections, and may therefore be used to create a visually appealing solar module with little to no contrast between adjacent series connected solar cells.

This specification further discloses cell metallization patterns that facilitate stencil printing of metallization onto front (and optionally) rear surfaces of the solar cells. As used herein, "stencil printing" of cell metallization refers to applying the metallization material (e.g., a silver paste) onto a solar cell surface through patterned openings in an otherwise impermeable sheet of material. The stencil may be a patterned stainless steel sheet, for example. The patterned openings in the stencil are entirely free of stencil material, and do not for example include any mesh or screen. The absence of mesh or screen material in the patterned stencil openings distinguishes "stencil printing" as used herein from "screen printing". By contrast, in screen printing the metallization material is applied onto a solar cell surface through a screen (e.g., mesh) supporting a patterned impermeable material. The pattern comprises openings in the impermeable material through which the metallization material is applied to the solar cell. The supporting screen extends across the openings in the impermeable material.

Compared to screen printing, stencil printing of cell metallization patterns offers numerous advantages including narrower line widths, higher aspect ratio (line height to width), better line uniformity and definition, and greater longevity of a stencil compared to a screen. However, stencil printing cannot print 'islands' in one pass as would be required in conventional 3 bus bar metallization designs. Further, stencil printing cannot print in one pass a metallization pattern that would require the stencil to include unsupported structures that are not constrained to lie in the plane of the stencil during printing and might interfere with placement and use of the stencil. For example, stencil printing cannot print in one pass a metallization pattern in which metallization fingers arranged in parallel are interconnected by a bus bar or other metallization feature running perpendicular to the fingers, because a single stencil for such a design would include unsupported tongues of sheet material defined by the opening for the bus bar and the openings for the fingers. The tongues would not be constrained by physical connections to other portions of the stencil to lie in the plane of the stencil during printing and would likely shift out of plane and distort placement and use of the stencil.

Consequently, attempts at using stencils for printing traditional solar cells require two passes for the front side metallization with two different stencils, or with a stencil printing step in combination with a screen printing step, which increases the total number of print steps per cell and which also creates a 'stitching' issue where the two prints overlap and result in double height. The stitching complicates further processes and the extra printing and related steps increase cost. Stencil printing is therefore not common for solar cells.

As further described below, the front surface metallization patterns described herein may comprise an array of fingers (e.g., parallel lines) that are not connected to each other by the front surface metallization pattern. These patterns can be stencil-printed in one pass with a single stencil because the required stencil need not include unsupported portions or structures (e.g., tongues). Such front surface metallization patterns may be disadvantageous for standard sized solar cells and for strings of solar cells in which spaced-apart solar cells are interconnected by copper ribbons, because the metallization pattern does not itself provide for substantial current spreading or electrical conduction perpendicular to the fingers. However, the front surface metallization patterns described herein may work well in shingled arrangements of rectangular solar cells as described herein in which a portion of the front surface metallization pattern of a solar cell is overlapped by and conductively bonded to the rear surface metallization pattern of an adjacent solar cell. This is because the overlapping rear surface metallization of the adjacent solar cell may provide for current spreading and electrical conduction perpendicular to the fingers in the front surface metallization pattern.

Turning now to the figures for a more detailed understanding of the solar modules described in this specification, FIG. 1 shows a cross-sectional view of a string of series-connected solar cells 10 arranged in a shingled manner with the ends of adjacent solar cells overlapping and electrically connected to form a super cell 100. Each solar cell 10 comprises a semiconductor diode structure and electrical contacts to the semiconductor diode structure by which electric current generated in solar cell 10 when it is illuminated by light may be provided to an external load.

In the examples described in this specification, each solar cell 10 is a rectangular crystalline silicon solar cell having front (sun side) surface and rear (shaded side) surface metallization patterns providing electrical contact to opposite sides of an n-p junction, the front surface metallization pattern is disposed on a semiconductor layer of n-type conductivity, and the rear surface metallization pattern is disposed on a semiconductor layer of p-type conductivity. However, other material systems, diode structures, physical dimensions, or electrical contact arrangements may be used if suitable. For example, the front (sun side) surface metallization pattern may be disposed on a semiconductor layer of p-type conductivity, and the rear (shaded side) surface metallization pattern disposed on a semiconductor layer of n-type conductivity.

Referring again to FIG. 1, in super cell 100 adjacent solar cells 10 are conductively bonded directly to each other in the region in which they overlap by an electrically conductive bonding material that electrically connects the front surface metallization pattern of one solar cell to the rear surface metallization pattern of the adjacent solar cell. Suitable electrically conductive bonding materials may include, for example, electrically conductive adhesives and electrically conductive adhesive films and adhesive tapes, and conventional solders.

Referring back to FIG. 2, FIG. 2 shows an example rectangular solar module 200 comprising six rectangular super cells 100, each of which has a length approximately equal to the length of the long sides of the solar module. The super cells are arranged as six parallel rows with their long sides oriented parallel to the long sides of the module. A similarly configured solar module may include more or fewer rows of such side-length super cells than shown in this example. In other variations the super cells may each have a length approximately equal to the length of a short side of a rectangular solar module, and be arranged in parallel rows with their long sides oriented parallel to the short sides of the module. In yet other arrangements each row may comprise two or more super cells, which may be electrically interconnected in series for example. The modules may have shorts sides having a length, for example, of about 1 meter and long sides having a length, for example, of about 1.5 to about 2.0 meters. Any other suitable shapes (e.g., square) and dimensions for the solar modules may also be used. Each super cell in this example comprises 72 rectangular solar cells each having a width approximately equal to ⅙ the width of a 156 millimeter (mm) square or pseudo square wafer and a length of about 156 mm. Any other suitable number of rectangular solar cells of any other suitable dimensions may also be used.

FIG. 76 shows an example front surface metallization pattern on a rectangular solar cell 10 that facilitates stencil printing as described above. The front surface metallization pattern may be formed, for example, from silver paste. In the example of FIG. 76 the front surface metallization pattern comprises a plurality of fingers 6015 running parallel to each other, parallel to the short sides of the solar cell, and perpendicular to the long sides of the solar cell. The front surface metallization pattern also comprises a row of optional contact pads 6020 running parallel to and adjacent the edge of a long side of the solar cell, with each contact pad 6020 located at the end of a finger 6015. Where present, each contact pad 6020 creates an area for an individual bead of electrically conductive adhesive (ECA), solder, or other electrically conductive bonding material used to conductively bond the front surface of the illustrated solar cell to an overlapping portion of the rear surface of an adjacent solar cell. The pads may have circular, square, or rectangular shapes for example, but any suitable pad shape may be used. As an alternative to using individual beads of electrically conductive bonding material, a continuous or dashed line of ECA, solder, conductive tape, or other electrically conductive bonding material disposed along the edge of a long side of the solar cell may interconnect some or all of the fingers as well as bond the solar cell to an adjacent overlapping solar cell. Such a dashed or continuous line of electrically conductive bonding material may be used in combination with conductive pads at the ends of the fingers, or without such conductive pads.

Solar cell 10 may have, for example, a length of about 156 mm, a width of about 26 mm, and thus an aspect ratio (length of short side/length of long side) of about 1:6. Six such solar cells may be prepared on a standard 156 mm×156 mm dimension silicon wafer, then separated (diced) to provide solar cells as illustrated. In other variations, eight solar cells 10 having dimensions of about 19.5 mm×156 mm, and thus an aspect ratio of about 1:8, may be prepared from a standard silicon wafer. More generally, solar cells 10 may have aspect ratios of, for example, about 1:2 to about 1:20 and may be prepared from standard size wafers or from wafers of any other suitable dimensions.

Referring again to FIG. 76, the front surface metallization pattern may comprise, for example, about 60 to about 120 fingers per 156 mm wide cell, for example about 90 fingers. Fingers 6015 may have widths of, for example, about 10 to about 90 microns, for example about 30 microns. Fingers 6015 may have heights perpendicular to the surface of the solar cell of, for example, about 10 to about 50 microns. The finger heights may be, for example, about 10 microns or more, about 20 microns or more, about 30 microns or more, about 40 microns or more, or about 50 microns or more. Pads 6020 may have diameters (circles) or side lengths (squares or rectangles) of, for example, about 0.1 mm to about 1 mm, for example about 0.5 mm.

The rear surface metallization pattern for rectangular solar cell 10 may comprise, for example, a row of discrete contact pads, a row of interconnected contact pads, or a continuous bus bar running parallel to and adjacent to an edge of a long side of the solar cell. Such contact pads or bus bar are not required, however. If the front surface metallization pattern comprises contact pads 6020 arranged along an edge of one of the long sides of the solar cell, then the row of contact pads or bus bar (if present) in the rear surface metallization pattern is arranged along an edge of the other long side of the solar cell. The rear surface metallization pattern may further comprise a metal back contact covering substantially all of the remaining rear surface of the solar cell. The example rear surface metallization pattern of FIG. 77A comprises a row of discrete contact pads 6025 in combination with a metal back contact 6030 as just described, and the example rear surface metallization pattern of FIG. 77B comprises a continuous bus bar 35 in combination with a metal back contact 6030 as just described.

In a shingled super cell the front surface metallization pattern of a solar cell is conductively bonded to an overlapping portion of the rear surface metallization pattern of an adjacent solar cell. For example, if the solar cells comprise front surface metallization contact pads 6020, each contact pad 6020 may be may be aligned with and bonded to a corresponding rear surface metallization contact pad 6025 (if present), or aligned with and bonded to a rear surface metallization bus bar 35 (if present), or bonded to metal back contact 6030 (if present) on the adjacent solar cell. This may be accomplished for example with discrete portions (e.g., beads) of electrically conductive bonding material disposed on each contact pad 6020, or with a dashed or continuous line of electrically conductive bonding material running parallel to the edge of the solar cell and optionally electrically interconnecting two or more of the contact pads 6020.

If the solar cells lack front surface metallization contact pads 6020, then for example each front surface metallization pattern finger 6015 may be aligned with and bonded to a corresponding rear surface metallization contact pad 6025 (if present), or bonded to a rear surface metallization bus bar 35 (if present), or bonded to metal back contact 6030 (if present) on the adjacent solar cell. This may be accomplished for example with discrete portions (e.g., beads) of electrically conductive bonding material disposed on the overlapped end of each finger 6015, or with a dashed or continuous line of electrically conductive bonding material running parallel to the edge of the solar cell and optionally electrically interconnecting two or more of fingers 6015.

As noted above, portions of the overlapping rear surface metallization of the adjacent solar cell, for example a rear surface bus bar 35 and/or back metal contact 6030 if present, may provide for current spreading and electrical conduction perpendicular to the fingers in the front surface metallization pattern. In variations utilizing dashed or continuous lines of electrically conductive bonding material as described above, the electrically conductive bonding material may provide for current spreading and electrical conduction perpendicular to the fingers in the front surface metallization pattern. The overlapping rear metallization and/or the electrically conductive bonding material may for example carry current to bypass broken fingers or other finger disruptions in the front surface metallization pattern.

Rear surface metallization contact pads 6025 and bus bar 35, if present, may be formed for example from silver paste, which may be applied by stencil printing, screen printing, or any other suitable method. Metal back contact 6030 may be formed, for example, from aluminum.

Any other suitable rear surface metallization patterns and materials may also be used.

Figure 78:
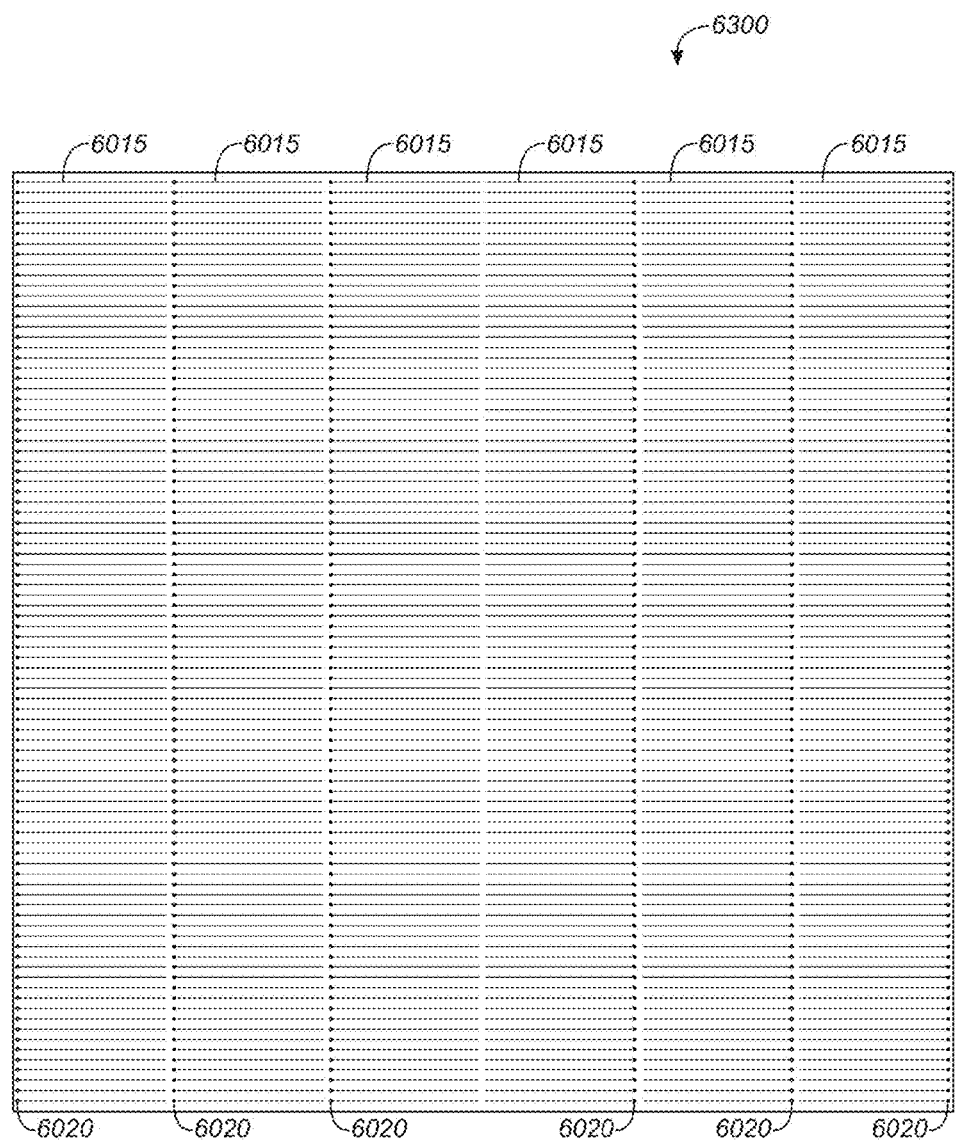
FIG. 78 shows an example front surface metallization pattern on a square solar cell that may be diced to form a plurality of rectangular solar cells each having the front surface metallization pattern shown in FIG. 76.

FIG. 78 shows an example front surface metallization pattern on a square solar cell 6300 that may be diced to form a plurality of rectangular solar cells each having the front surface metallization pattern shown in FIG. 76.

Figure 79:
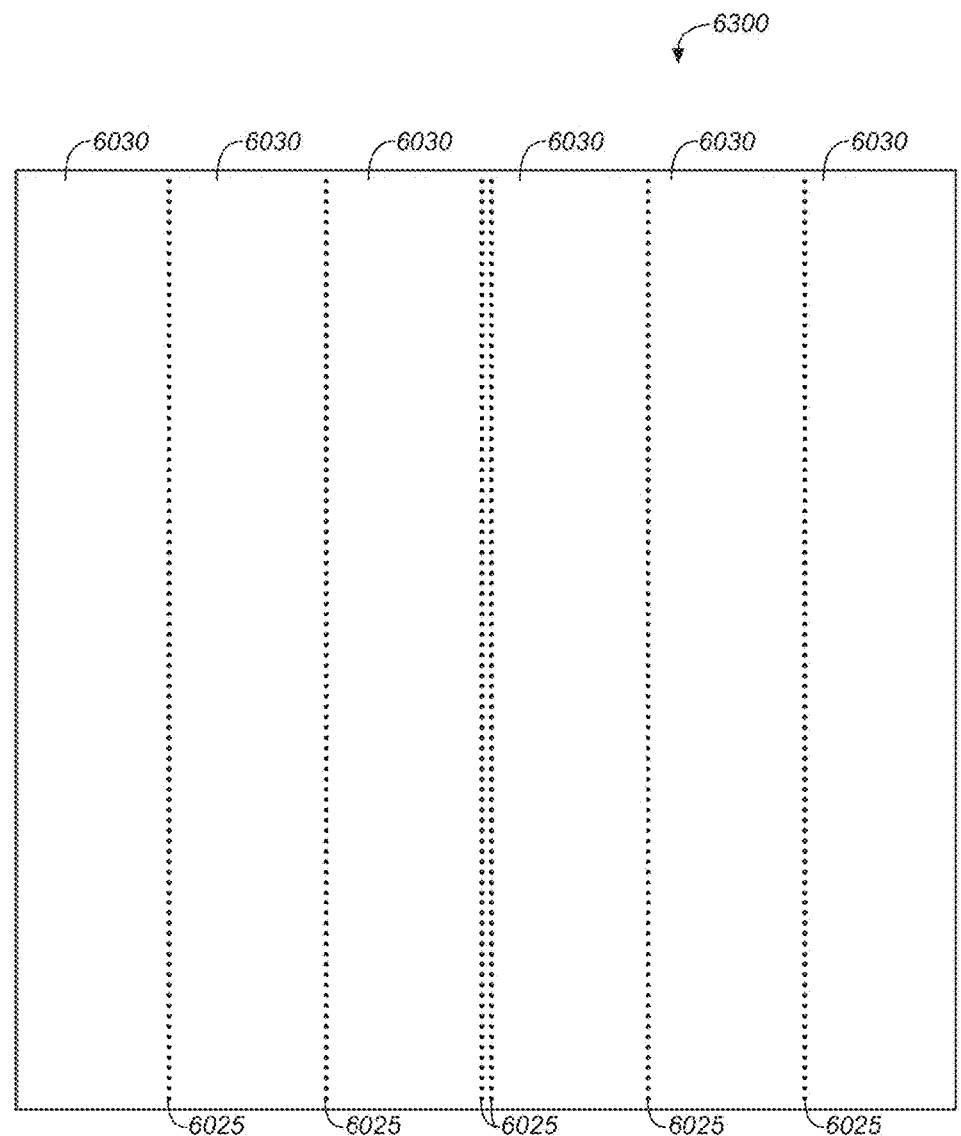
FIG. 79 shows an example rear surface metallization pattern on a square solar cell that may be diced to form a plurality of rectangular solar cells each having the rear surface metallization pattern shown in FIG. 77A.

FIG. 79 shows an example rear surface metallization pattern on a square solar cell 6300 that may be diced to form a plurality of rectangular solar cells each having the rear surface metallization pattern shown in FIG. 77A.

The front surface metallization patterns described herein may enable stencil printing of the front surface metallization on a standard three printer solar cell production line. For example, the production process may comprise stencil or screen printing silver paste onto the rear surface of a square solar cell to form rear surface contact pads or a rear surface silver bus bar using a first printer, then drying the rear surface silver paste, then stencil or screen printing an aluminum contact on the rear surface of the solar cell using a second printer, then drying the aluminum contact, then stencil printing silver paste onto the front surface of the solar cell to form a complete front surface metallization pattern using a single stencil in a single stenciling step with a third printer, then drying the silver paste, then firing the solar cell. These printing and related steps may occur in any other order, or be omitted, as suitable.

The use of a stencil to print the front surface metallization pattern enables the production of narrower fingers than possible with screen printing, which may improve solar cell efficiency and decrease the use of silver and thus the cost of production. Stencil printing the front surface metallization pattern in a single stencil printing step with a single stencil enables the production of a front surface metallization pattern having a uniform height, e.g., not exhibiting stitching as may occur if multiple stencils or stencil printing in combination with screen printing are used for overlapping prints to define features extending in different directions.

After front and rear surface metallization patterns are formed on the square solar cells, each square solar cell may be separated into two or more rectangular solar cells. This may be accomplished for example by laser scribing followed by cleaving, or by any other suitable method. The rectangular solar cells may then be arranged in an overlapping shingled manner and conductively bonded to each other as described above to form a super cell. This specification discloses methods for manufacturing solar cells with reduced carrier recombination losses at edges of the solar cell, e.g., without cleaved edges that promote carrier recombination. The solar cells may be silicon solar cells, for example, and more particularly may be HIT silicon solar cells. This specification also discloses shingled (overlapping) super cell arrangements of such solar cells. The individual solar cells in such a super cell may have narrow rectangular geometries (e.g., strip-like shapes), with the long sides of adjacent solar cells arranged to overlap.

A major challenge to the cost-effective implementation of high efficiency solar cells such as HIT solar cells is the conventionally perceived need for large amounts of metal to carry a large current from one such high efficiency solar cell to an adjacent series-connected high efficiency solar cell. Dicing such high efficiency solar cells into narrow rectangular solar cell strips, and then arranging the resulting solar cells in an overlapping (shingled) pattern with conductive bonds between the overlapping portions of adjacent solar cells to form a series-connected string of solar cells in a super cell, presents an opportunity to reduce module cost through process simplification. This is because tabbing process steps conventionally required to interconnect adjacent solar cells with metal ribbons may be eliminated. This shingling approach may also improve module efficiency by reducing the current through the solar cells (because the individual solar cell strips may have smaller than conventional active areas) and by reducing the current path length between adjacent solar cells, both of which tend to reduce resistive loss. The reduced current may also allow substitution of less expensive but more resistive conductors (e.g., copper) for more expensive but less resistive conductors (e.g., silver) without significant loss in performance. In addition, this shingling approach may reduce inactive module area by eliminating interconnect ribbons and related contacts from the front surfaces of the solar cells.

Conventionally sized solar cells may have, for example, substantially square front and rear surfaces with dimensions of about 156 millimeters (mm)×about 156 mm. In the shingling scheme just described, such a solar cell is diced into two or more (e.g., two to twenty) 156 mm long solar cell strips. A potential difficulty with this shingling approach is that dicing a conventionally sized solar cell into thin strips increases the cell edge length per active area of solar cell compared to a conventionally sized solar cell, which can degrade performance due to carrier recombination at the edges.

Figure 80:
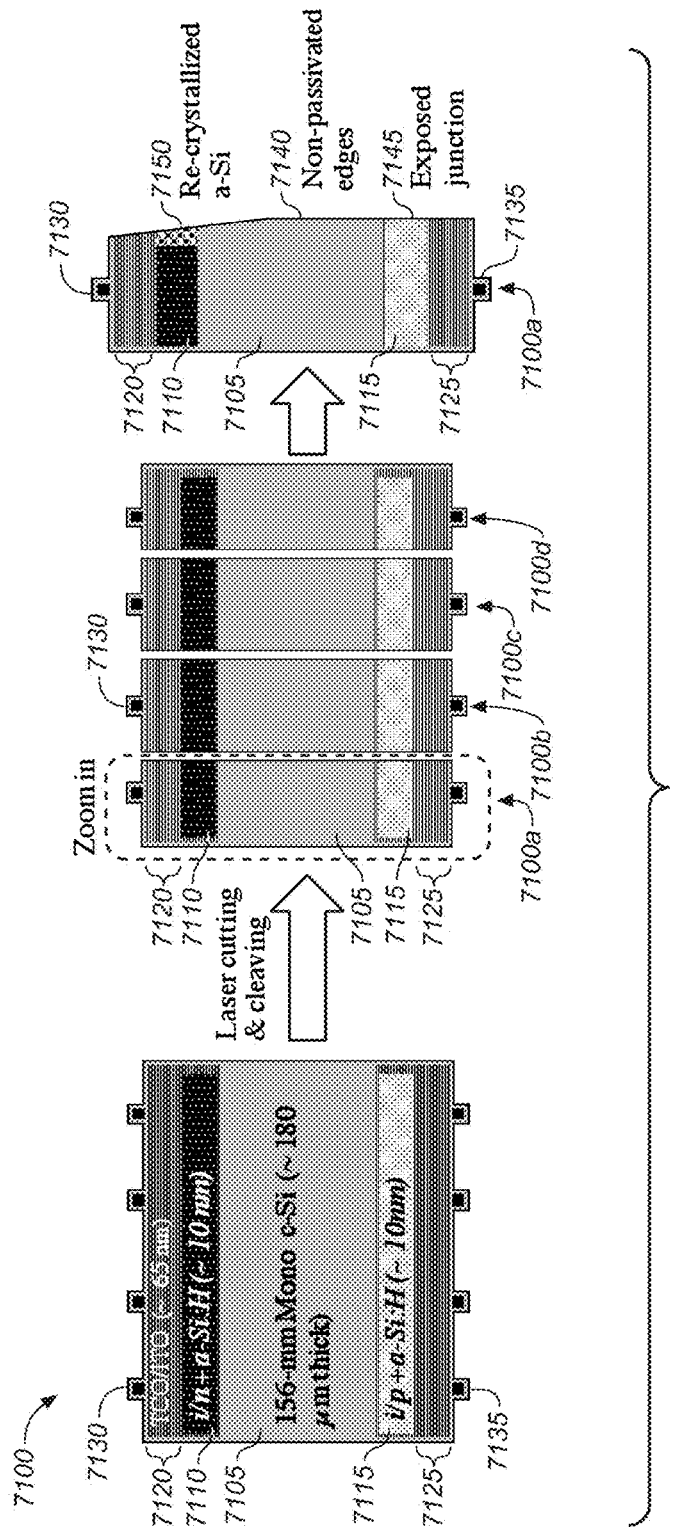
FIG. 80 is a schematic diagram of a conventionally sized HIT solar cell being diced into narrow strip solar cells using conventional cleaving methods, resulting in cleaved edges that promote carrier recombination.

For example, FIG. 80 schematically illustrates the dicing of a HIT solar cell 7100 having front and rear surface dimensions of about 156 mm×about 156 mm into several solar cell strips (7100a, 7100b, 7100c, and 7100d) each of which has narrow rectangular front and rear surfaces with dimensions of about 156 mm×about 40 mm. (The long 156 mm sides of the solar cell strips extend into the page). In the illustrated example HIT cell 7100 comprises an n-type monocrystalline base 5105, which may for example have a thickness of about 180 microns and front and rear square surfaces with dimensions of about 156 mm×about 156 mm. An about 5 nanometer (nm) thick layer of intrinsic amorphous Si:H (a-Si:H) and an about 5 nm thick layer of n+ doped a-Si:H (both layers together indicated by reference numeral 7110) are disposed on the front surface of crystalline silicon base 7105. An about 65 nm thick film 5120 of a transparent conductive oxide (TCO) is disposed on a-Si:H layers 7110. Conductive metal gridlines 7130 disposed on TCO layer 7120 provide electrical contact to the front surface of the solar cell. An about 5 nm thick layer of intrinsic a-Si:H and an about 5 nm thick layer of p+ doped a-Si:H (both layers together indicated by reference numeral 7115) are disposed on the rear surface of crystalline silicon base 7105. An about 65 nm thick film 7125 of a transparent conductive oxide (TCO) is disposed on a-Si:H layers 7115, and conductive metal gridlines 7135 disposed on TCO layer 7125 provide electrical contact to the rear surface of the solar cell. (The dimensions and materials cited above are intended to be exemplary rather than limiting, and may be varied as suitable).

Still referring to FIG. 80, if HIT solar cell 7100 is cleaved by conventional methods to form strip solar cells 7100a, 7100b, 7100c, and 7100d, newly formed cleaved edges 7140 are not passivated. These non-passivated edges contain a high density of dangling chemical bonds, which promote carrier recombination and reduce the performance of the solar cells. In particular, the cleaved surface 7145 that exposes the n-p junction and the cleaved surface that exposes the heavily doped front surface field (in layers 7110) are not passivated and may significantly promote carrier recombination. Further, if conventional laser cutting or laser scribing processes are used in dicing solar cell 7100, thermal damage such as re-crystallization 7150 of amorphous silicon may occur on the newly formed edges. As a result of the non-passivated edges and the thermal damage, if conventional manufacturing processes are used the new edges formed on cleaved solar cells 7100a, 7100b, 7100c, and 7100d may be expected to reduce the short-circuit current, the open-circuit voltage, and the pseudo fill factor of the solar cells. This amounts to a significant reduction in performance of the solar cells.

The formation of recombination-promoting edges during dicing of a conventionally sized HIT solar cell into narrower solar cell strips may be avoided with the method illustrated in FIGS. 85A-85J. This method uses isolation trenches on the front and rear surfaces of the conventionally sized solar cell 7100 to electrically isolate the p-n junction and the heavy doped front surface field from the cleaved edges that might otherwise act as recombination sites for minority carriers. The trench edges are not defined by conventional cleaving, but instead by chemical etching or laser patterning, followed by deposition of a passivation layer such as a TCO that passivates both front and rear trenches. Compared with the heavy doped regions, the base doping is sufficiently low that the probability of electrons in the junction reaching unpassivated cut edges of the base is small. In addition, a kerf-less wafer dicing technique, Thermal Laser Separation (TLS), may be used to cut the wafers, avoiding potential thermal damage.

In the example illustrated in FIGS. 85A-85J, the starting material is an about 156 mm square n-type mono-crystalline silicon as-cut wafer, which may have a bulk resistivity of for example about 1 to about 3 ohm-centimeters and may be for example about 180 microns thick. (Wafer 7105 forms the base of the solar cells).

Figure 81A:
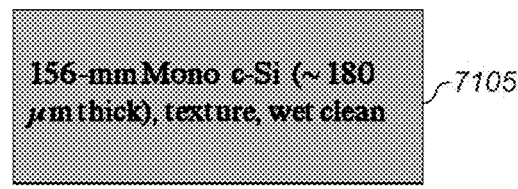
FIGS. 81A-81J schematically illustrate steps in an example method of dicing a conventionally sized HIT solar cell into narrow solar cell strips lacking cleaved edges that promote carrier recombination.

Referring to FIG. 81A, the as-cut cut wafer 7105 is conventionally texture-etched, acid cleaned, rinsed, and dried.

Figure 81B:
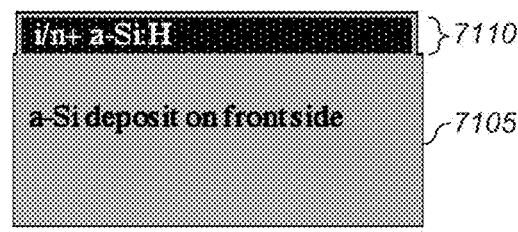

Next, in FIG. 81B an about 5 nm thick intrinsic a-Si:H layer and an about 5 nm thick doped n+ a-Si:H layer (both layers together indicated by reference numeral 7110) are deposited on the front surface of wafer 7105 by plasma enhanced chemical vapor deposition (PECVD), for example, at a temperature of about 150° C. to about 200° C., for example.

Figure 81C:
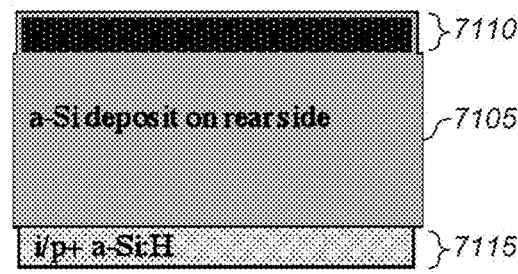

Next, in FIG. 81C an about 5 nm thick intrinsic a-Si:H layer and an about 5 nm thick doped p+ a-Si:H layer (both layers together indicated by reference numeral 7115) are deposited on the rear surface of wafer 7105, by PECVD, for example, at a temperature of about 150° C. to about 200° C., for example.

Figure 81D:
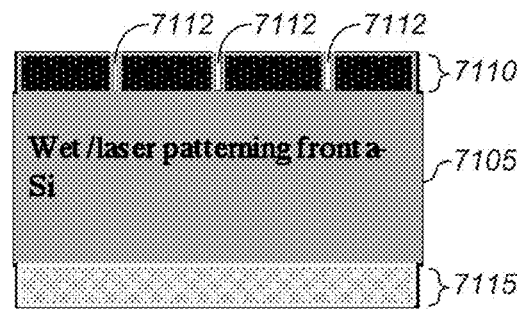

Next, in FIG. 81D the front a-Si:H layers 7110 are patterned to form isolation trenches 7112. Isolation trenches 7112 typically penetrate layers 7110 to reach wafer 7105 and may have widths of, for example, about 100 microns to about 1000 microns, for example about 200 microns. Typically the trenches have the smallest widths that may be used, depending on the accuracy of the patterning techniques and the subsequently applied cleaving techniques. Patterning of trenches 7112 may be accomplished, for example, using laser patterning or chemical etching (e.g., inkjet wet patterning).

Figure 81E:
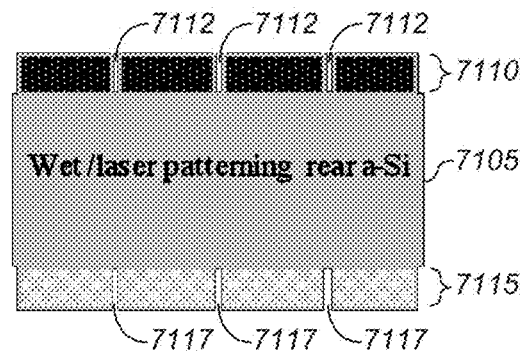

Next, in FIG. 81E the rear a-Si:H layers 7115 are patterned to form isolation trenches 7117. Similarly to isolation trenches 7112, isolation trenches 7117 typically penetrate layers 7115 to reach wafer 7105 and may have widths of, for example, about 100 microns to about 1000 microns, for example about 200 microns. Patterning of trenches 7117 may be accomplished, for example, using laser patterning or chemical etching (e.g., inkjet wet patterning). Each trench 7117 is in line with a corresponding trench 7112 on the front surface of the structure.

Figure 81F:
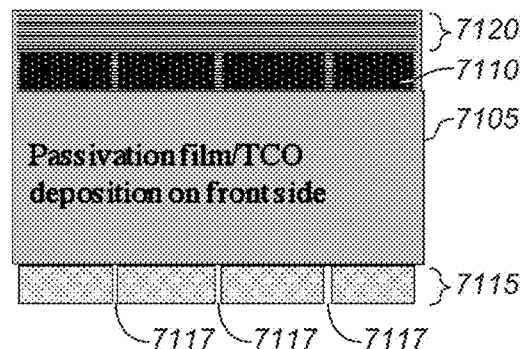

Next, in FIG. 81F an about 65 nm thick TCO layer 7120 is deposited on the patterned front a-Si:H layers 7110. This may be accomplished by physical vapor deposition (PVD) or by ion-plating, for example. TCO layer 7120 fills trenches 7112 in a-Si:H layers 7110 and coats the outer edges of layers 7110, thereby passivating the surfaces of layers 7110. TCO layer 7120 also functions as an antireflection coating.

Figure 81G:
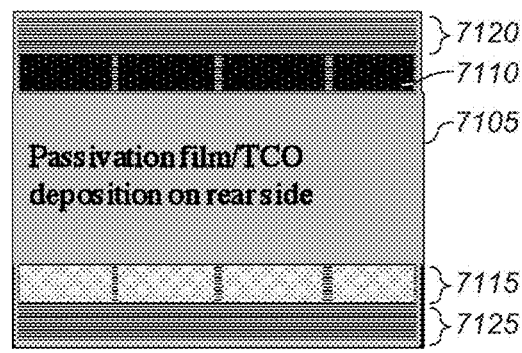

Next, in FIG. 81G an about 65 nm thick TCO layer 7125 is deposited on the patterned rear a-Si:H layers 7115. This may be accomplished by PVD or by ion-plating, for example. TCO layer 7125 fills trenches 7117 in a-Si:H layers 7115 and coats the outer edges of layers 115, thereby passivating the surfaces of layers 7115. TCO layer 7125 also functions as an antireflection coating.

Figure 81H:
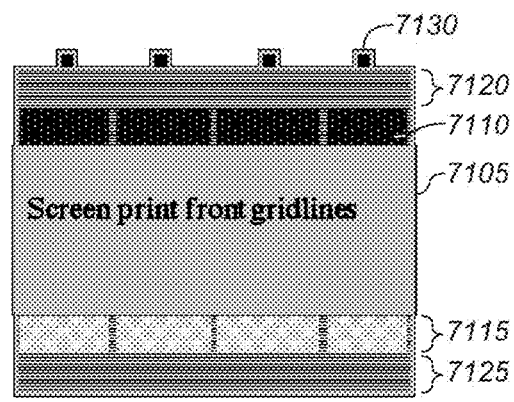

Next, in FIG. 81H conductive (e.g., metal) front surface grid lines 7130 are screen printed onto TCO layer 7120. Grid lines 7130 may be formed from low temperature silver pastes, for example.

Figure 81I:
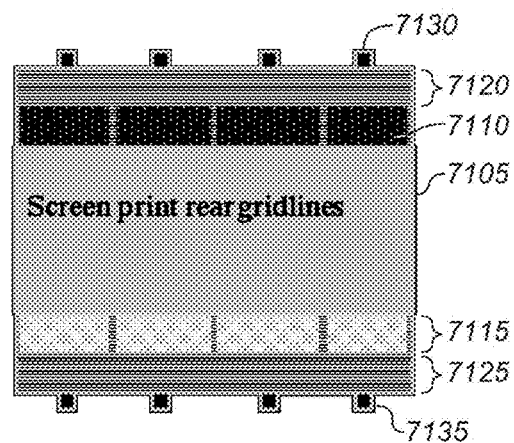

Next, in FIG. 81I conductive (e.g., metal) rear surface grid lines 7135 are screen printed onto TCO layer 7125. Grid lines 7135 may be formed from low temperature silver pastes, for example.

Next, after deposition of grid lines 7130 and grid lines 7135, the solar cell is cured at a temperature of about 200° C. for about 30 minutes, for example.

Figure 81J:
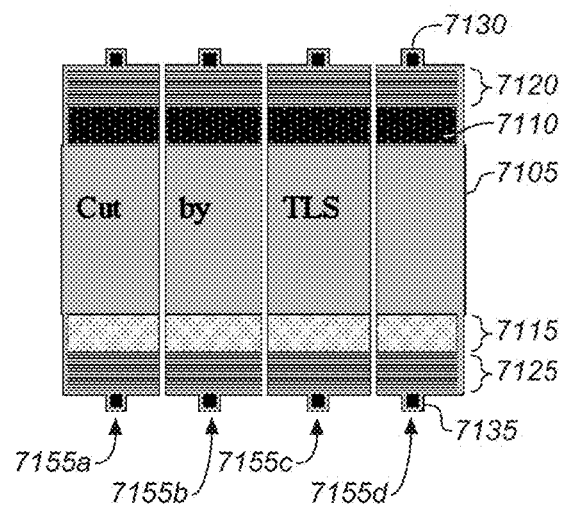

Next, in FIG. 81J the solar cell is separated into solar cell strips 7155a, 7155b, 7155c, and 7155d by dicing the solar cell at the centers of the trenches. Dicing may be accomplished for example using conventional laser scribing and mechanical cleaving at the center of the trenches to cleave the solar cell in line with the trenches. Alternatively, dicing may be accomplished using a Thermal Laser Separation process (as developed by Jenoptik AG, for example) in which laser-induced heating at the centers of the trenches induces mechanical stress that leads to cleaving of the solar cell in line with the trenches. The latter approach may avoid thermal damage to edges of the solar cells.

The resulting strip solar cells 7155a-7155d differ from strip solar cells 7100a-7100d shown in FIG. 80. In particular, the edges of a-Si:H layers 7110 and a-Si:H layers 7115 in solar cells 7140a-7140d are formed by etching or laser patterning, not by mechanical cleaving. In addition, the edges of layers 7110 and 7115 in solar cells 7155a-7155d are passivated by a TCO layer. As a result, solar cells 7140a-7140d lack the carrier recombination promoting cleaved edges that are present in solar cells 7100a-7100d.

The method described with respect to FIGS. 81A-81J is intended to be exemplary rather than limiting. Steps described as being performed in particular sequences may be performed in other sequences or in parallel, as suitable. Steps and material layers may be omitted, added, or substituted as suitable. For example, if copper plated metallization is used then additional patterning and seed layer deposition steps may be included in the process. Further, in some variations only the front a-Si:H layers 7110 are patterned to form isolation trenches, and no isolation trenches are formed in the rear a-Si:H layers 7115. In other variations only the rear a-Si:H layers 7115 are patterned to form isolation trenches, and no isolation trenches are formed in the front a-Si:H layers 7115. As in the example of FIGS. 81A-81J, in these variations as well dicing occurs at the centers of the trenches.

The formation of recombination-promoting edges during dicing of a conventionally sized HIT solar cell into narrower solar cell strips may also be avoided with the method illustrated in FIGS. 82A-82J, which also uses isolation trenches similarly to as employed in the method described with respect to FIGS. 81A-81J.

Figure 82A:
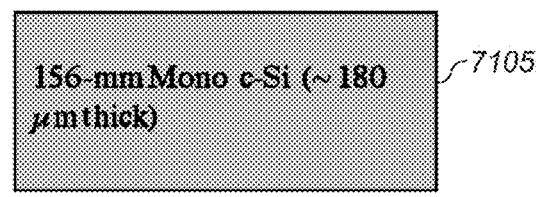
FIGS. 82A-82J schematically illustrate steps in another example method of dicing a conventionally sized HIT solar cell into narrow solar cell strips lacking cleaved edges that promote carrier recombination.

Referring to FIG. 82A, in this example the starting material is again an about 156 mm square n-type mono-crystalline silicon as-cut wafer 7105, which may have a bulk resistivity of for example about 1 to about 3 ohm-centimeters and may be for example about 180 microns thick.

Figure 82B:
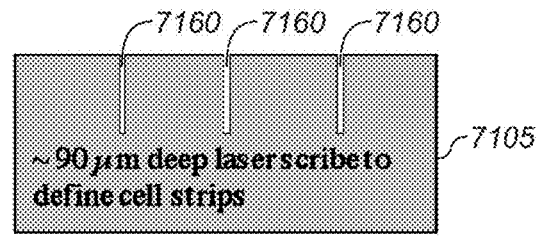

Referring to FIG. 82B, trenches 7160 are formed in the front surface of wafer 7105. These trenches may have depths of for example, about 80 microns to about 150 microns, for example about 90 microns, and may have widths of for example of about 10 microns to about 100 microns. Isolation trenches 7160 define the geometry of the solar cell strips to be formed from wafer 7105. As explained below, wafer 7105 will be cleaved in line with these trenches. Trenches 7160 may be formed by conventional laser wafer scribing, for example.

Figure 82C:
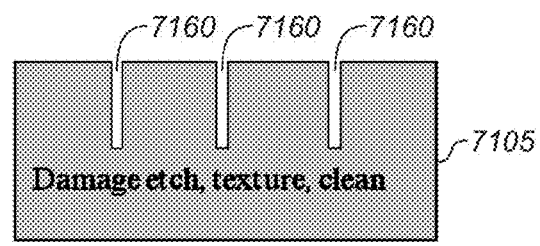

Next, in FIG. 82C wafer 7105 is conventionally texture-etched, acid cleaned, rinsed, and dried. The etching typically removes damage initially present in surfaces of as-cut wafer 7105 or caused during formation of trenches 7160. The etching may also widen and deepen trenches 7160.

Figure 82D:
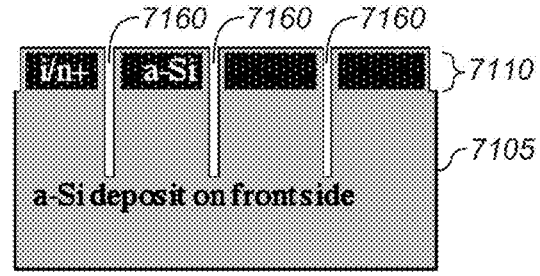

Next, in FIG. 82D an about 5 nm thick intrinsic a-Si:H layer and an about 5 nm thick doped n+ a-Si:H layer (both layers together indicated by reference numeral 7110) are deposited on the front surface of wafer 7105 by PECVD, for example, at a temperature of about 150° C. to about 200° C., for example.

Figure 82E:
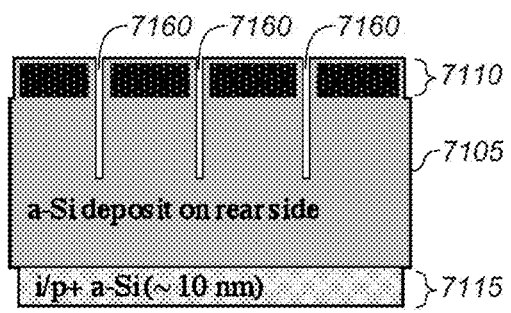

Next, in FIG. 82E an about 5 nm thick intrinsic a-Si:H layer and an about 5 nm thick doped p+ a-Si:H layer (both layers together indicated by reference numeral 7115) are deposited on the rear surface of wafer 7105, by PECVD, for example, at a temperature of about 150° C. to about 200° C., for example.

Figure 82F:
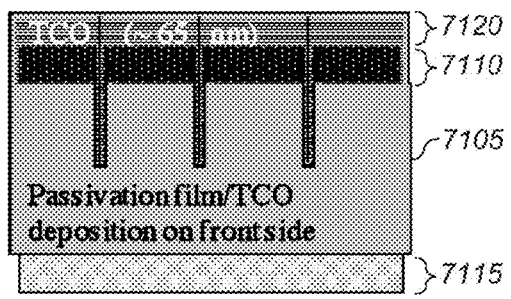

Next, in FIG. 82F an about 65 nm thick TCO layer 7120 is deposited on the front a-Si:H layers 7110. This may be accomplished by physical vapor deposition (PVD) or by ion-plating, for example. TCO layer 7120 may fill trenches 7160 and typically coats the walls and bottoms of trenches 7160 and the outer edges of layers 7110, thereby passivating the coated surfaces. TCO layer 7120 also functions as an antireflection coating.

Figure 82G:
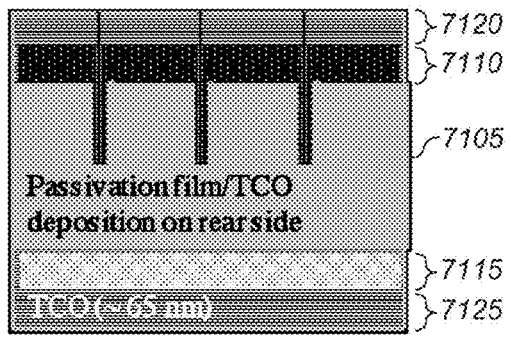

Next, in FIG. 82G an about 65 nm thick TCO layer 7125 is deposited on the rear a-Si:H layers 7115. This may be accomplished by PVD or by ion-plating, for example. TCO layer 7125 passivates the surfaces (e.g., including the outer edges) of layers 7115 and also functions as an antireflection coating.

Figure 82H:
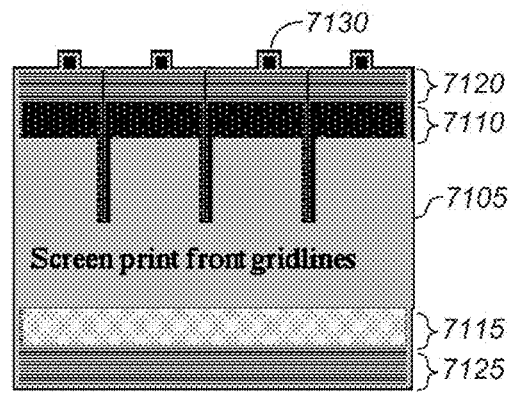

Next, in FIG. 82H conductive (e.g., metal) front surface grid lines 7130 are screen printed onto TCO layer 7120. Grid lines 7130 may be formed from low temperature silver pastes, for example.

Figure 82I:
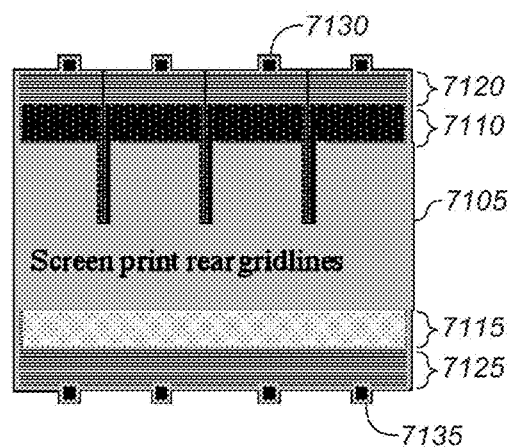

Next, in FIG. 82I conductive (e.g., metal) rear surface grid lines 7135 are screen printed onto TCO layer 7125. Grid lines 7135 may be formed from low temperature silver pastes, for example.

Next, after deposition of grid lines 7130 and grid lines 7135, the solar cell is cured at a temperature of about 200° C. for about 30 minutes, for example.

Figure 82J:
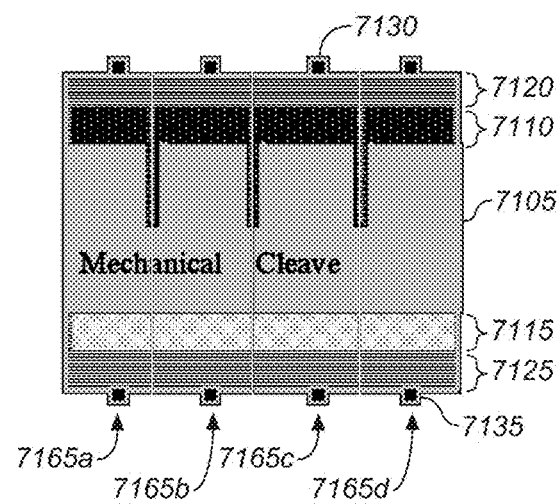

Next, in FIG. 82J the solar cell is separated into solar cell strips 7165*a*, 7165*b*, 7165*c*, and 7165*d*, by dicing the solar cell at the centers of the trenches. Dicing may be accomplished for example using conventional mechanical cleaving at the center of the trenches to cleave the solar cell in line with the trenches. Alternatively, dicing may be accomplished using a Thermal Laser Separation process as described above, for example.

The resulting strip solar cells 7165*a*-7165*d* differ from strip solar cells 7100*a*-7100*d* shown in FIG. 80. In particular, the edges of a-Si:H layers 7110 in solar cells 7165*a*-7165*d* are formed by etching, not by mechanical cleaving. In addition, the edges of layers 7110 in solar cells 7165*a*-7165*d* are passivated by a TCO layer. As a result, solar cells 7165*a*-7165*d* lack carrier recombination promoting cleaved edges that are present in solar cells 7100*a*-7100*d*.

The method described with respect to FIGS. 82A-82J is intended to be exemplary rather than limiting. Steps described as being performed in particular sequences may be performed in other sequences or in parallel, as suitable. Steps and material layers may be omitted, added, or substituted as suitable. For example, if copper plated metallization is used then additional patterning and seed layer deposition steps may be included in the process. Further, in some variations trenches 7160 may be formed in the rear surface of wafer 7105 rather than in the front surface of wafer 7105.

The methods described above with respect to FIGS. 81A-81J and 86A-86J are applicable to both n-type and p-type HIT solar cells. The solar cells can be front emitter or rear emitter. It may be preferable to apply the separation process on the side without the emitter. Further, the use of isolation trenches and passivation layers as described above to reduce recombination on cleaved wafer edges is applicable to other solar cell designs and to solar cells using material systems other than silicon.

Referring again to FIG. 1, a string of series-connected solar cells 10 formed by the methods described above may be advantageously arranged in a shingled manner with the ends of adjacent solar cells overlapping and electrically connected to form a super cell 100. In super cell 100 adjacent solar cells 10 are conductively bonded to each other in the region in which they overlap by an electrically conducting bonding material that electrically connects the front surface metallization pattern of one solar cell to the rear surface metallization pattern of the adjacent solar cell. Suitable electrically conducting bonding materials may include, for example, electrically conducting adhesives and electrically conducting adhesive films and adhesive tapes, and conventional solders.

Referring again to FIGS. 5A-5B, FIG. 5A shows an example rectangular solar module 200 comprising twenty rectangular super cells 100, each of which has a length approximately equal to one half the length of the short sides of the solar module. Super cells are arranged end-to-end in pairs to form ten rows of super cells, with the rows and the long sides of the super cells oriented parallel to the short sides of the solar module. In other variations, each row of super cells may include three or more super cells. Also, in other variations super cells may be arranged end-to-end in rows, with the rows and the long sides of the super cells oriented parallel to the long sides of a rectangular solar module or oriented parallel to a side of a square solar module. Further, a solar module may include more or fewer super cells and more or fewer rows of super cells than shown in this example.

Optional gap 210 shown in FIG. 5A may be present to facilitate making electrical contact to front surface end contacts of super cells 100 along the center line of the solar module, in variations where the super cells in each row are arranged so that at least one of them has a front surface end contact on the end of the super cell adjacent to the other super cell in the row. In variations in which each row of super cells includes three or more super cells, additional optional gaps between super cells may be present to similarly facilitate making electrical contact to front surface end contacts that are located away from the sides of the solar module.

FIG. 5B shows another example rectangular solar module 300 comprising ten rectangular super cells 100, each of which has a length approximately equal to the length of the short sides of the solar module. The super cells are arranged with their long sides oriented parallel to the short sides of the module. In other variations the super cells may have lengths approximately equal to the length of the long sides of a rectangular solar module and be oriented with their long sides parallel to the long sides of the solar module. The super cells may also have lengths approximately equal to the length of the sides of a square solar module, and be oriented with their long sides parallel to a side of the solar module.

Further, a solar module may include more or fewer of such side-length super cells than shown in this example.

FIG. 5B also shows what solar module 200 of FIG. 5A looks like when there are no gaps between adjacent super cells in the rows of super cells in solar module 200. Any other suitable arrangement of super cells 100 in a solar module may also be used.

The following enumerated paragraphs provide additional non-limiting aspects of the disclosure.

1. A solar module comprising:
a series connected string of N≥25 rectangular or substantially rectangular solar cells having on average a breakdown voltage greater than about 10 volts, the solar cells grouped into one or more super cells each of which comprises two or more of the solar cells arranged in line with long sides of adjacent solar cells overlapping and conductively bonded to each other with an electrically and thermally conductive adhesive;
wherein no single solar cell or group of <N solar cells in the string of solar cells is individually electrically connected in parallel with a bypass diode.

2. The solar module of clause 1, wherein N is greater than or equal to 30.

3. The solar module of clause 1, wherein N is greater than or equal to 50.

4. The solar module of clause 1, wherein N is greater than or equal to 100.

5. The solar module of clause 1, wherein the adhesive forms bonds between adjacent solar cells having a thickness perpendicular to the solar cells less than or equal to about 0.1 mm and a thermal conductivity perpendicular to the solar cells greater than or equal to about 1.5 w/m/k.

6. The solar module of clause 1, wherein the N solar cells are grouped into a single super cell.

7. The solar module of clause 1, wherein the super cells are encapsulated in a polymer.

7A. The solar module of clause 7 wherein the polymer comprises a thermoplastic olefin polymer.

7B. The solar module of clause 7 wherein the polymer is sandwiched between a glass front sheet and a back sheet.

7C. The solar module of clause 7B wherein the back sheet comprises glass.

8. The solar module of clause 1, wherein the solar cells are silicon solar cells.

9. A solar module comprising:
a super cell substantially spanning a full length or width of the solar module parallel to an edge of the solar module, the super cell comprising a series connected string of N rectangular or substantially rectangular solar cells having on average a breakdown voltage greater than about 10 volts arranged in line with long sides of adjacent solar cells overlapping and conductively bonded to each other with an electrically and thermally conductive adhesive;
wherein no single solar cell or group of <N solar cells in the super cell is individually electrically connected in parallel with a bypass diode.

10. The solar module of clause 9, wherein N>24.

11. The solar module of clause 9, wherein the super cell has a length in the direction of current flow of at least about 500 mm.

12. The solar module of clause 9, wherein the super cells are encapsulated in a thermoplastic olefin polymer sandwiched between glass front and back sheets.

13. A super cell comprising:
a plurality of silicon solar cells each comprising:
rectangular or substantially rectangular front and back surfaces with shapes defined by first and second oppositely positioned parallel long sides and two oppositely positioned short sides, at least portions of the front surfaces to be exposed to solar radiation during operation of the string of solar cells;
an electrically conductive front surface metallization pattern disposed on the front surface and comprising at least one front surface contact pad positioned adjacent to the first long side; and
an electrically conductive back surface metallization pattern disposed on the back surface and comprising at least one back surface contact pad positioned adjacent the second long side;
wherein the silicon solar cells are arranged in line with first and second long sides of adjacent silicon solar cells overlapping and with front surface and back surface contact pads on adjacent silicon solar cells overlapping and conductively bonded to each other with a conductive adhesive bonding material to electrically connect the silicon solar cells in series; and
wherein the front surface metallization pattern of each silicon solar cell comprises a barrier configured to substantially confine the conductive adhesive bonding material to at least one front surface contact pad prior to curing of the conductive adhesive bonding material during manufacturing of the super cell.

14. The super cell of clause 13, wherein for each pair of adjacent and overlapping silicon solar cells, the barrier on the front surface of one of the silicon solar cells is overlapped and hidden by a portion of the other silicon solar cell, thereby substantially confining the conductive adhesive bonding material to overlapped regions of the front surface of the silicon solar cell prior to curing of the conductive adhesive bonding material during manufacturing of the super cell.

15. The super cell of clause 13, wherein the barrier comprises a continuous conductive line running parallel to and for substantially the full length of the first long side, with at least one front surface contact pad located between the continuous conductive line and the first long side of the solar cell.

16. The super cell of clause 15, wherein the front surface metallization pattern comprises fingers electrically connected to the at least one front surface contact pads and running perpendicularly to the first long side, and the continuous conductive line electrically interconnects the fingers to provide multiple conductive paths from each finger to at least one front surface contact pad.

17. The super cell of clause 13, wherein the front surface metallization pattern comprises a plurality of discrete contact pads arranged in a row adjacent to and parallel to the first long side, and the barrier comprises a plurality of features forming separate barriers for each discrete contact pad that substantially confine the conductive adhesive bonding material to the discrete contact pads prior to curing of the conductive adhesive bonding material during manufacturing of the super cell.

18. The super cell of clause 17, wherein the separate barriers abut and are taller than their corresponding discrete contact pads.

19. A super cell comprising:
a plurality of silicon solar cells each comprising:
rectangular or substantially rectangular front and back surfaces with shapes defined by first and second oppositely positioned parallel long sides and two oppositely positioned short sides, at least portions of the front surfaces to be exposed to solar radiation during operation of the string of solar cells;

an electrically conductive front surface metallization pattern disposed on the front surface and comprising at least one front surface contact pad positioned adjacent to the first long side; and
an electrically conductive back surface metallization pattern disposed on the back surface and comprising at least one back surface contact pad positioned adjacent to the second long side;
wherein the silicon solar cells are arranged in line with first and second long sides of adjacent silicon solar cells overlapping and with front surface and back surface contact pads on adjacent silicon solar cells overlapping and conductively bonded to each other with a conductive adhesive bonding material to electrically connect the silicon solar cells in series; and
wherein the back surface metallization pattern of each silicon solar cell comprises a barrier configured to substantially confine the conducive adhesive bonding material to the at least one back surface contact pads prior to curing of the conductive adhesive bonding material during manufacturing of the super cell.

20. The super cell of clause 19, wherein the back surface metallization pattern comprises one or more discrete contact pads arranged in a row adjacent to and parallel to the second long side, and the barrier comprises a plurality of features forming separate barriers for each discrete contact pad that substantially confine the conductive adhesive bonding material to the discrete contact pads prior to curing of the conductive adhesive bonding material during manufacturing of the super cell.

21. The super cell of clause 20, wherein the separate barriers abut and are taller than their corresponding discrete contact pads.

22. A method of making a string of solar cells, the method comprising:
dicing one or more pseudo square silicon wafers along a plurality of lines parallel to a long edge of each wafer to form a plurality of rectangular silicon solar cells each having substantially the same length along its long axis; and
arranging the rectangular silicon solar cells in line with long sides of adjacent solar cells overlapping and conductively bonded to each other to electrically connect the solar cells in series;
wherein the plurality of rectangular silicon solar cells comprises at least one rectangular solar cell having two chamfered corners corresponding to corners or to portions of corners of the pseudo square wafer, and one or more rectangular silicon solar cells each lacking chamfered corners; and
wherein the spacing between parallel lines along which the pseudo square wafer is diced is selected to compensate for the chamfered corners by making the width perpendicular to the long axis of the rectangular silicon solar cells that comprise chamfered corners greater than the width perpendicular to the long axis of the rectangular silicon solar cells that lack chamfered corners, so that each of the plurality of rectangular silicon solar cells in the string of solar cells has a front surface of substantially the same area exposed to light in operation of the string of solar cells.

23. A string of solar cells comprising:
a plurality of silicon solar cells arranged in line with end portions of adjacent solar cells overlapping and conductively bonded to each other to electrically connect the solar cells in series;
wherein at least one of the silicon solar cells has chamfered corners that correspond to corners or portions of corners of a pseudo square silicon wafer from which it was diced, at least one of the silicon solar cells lacks chamfered corners, and each of the silicon solar cells has a front surface of substantially the same area exposed to light during operation of the string of solar cells.

24. A method of making two or more strings of solar cells, the method comprising:
dicing one or more pseudo square silicon wafers along a plurality of lines parallel to a long edge of each wafer to form a first plurality of rectangular silicon solar cells comprising chamfered corners corresponding to corners or portions of corners of the pseudo square silicon wafers and a second plurality of rectangular silicon solar cells each of a first length spanning a full width of the pseudo square silicon wafers and lacking chamfered corners;
removing the chamfered corners from each of the first plurality of rectangular silicon solar cells to form a third plurality of rectangular silicon solar cells each of a second length shorter than the first length and lacking chamfered corners;
arranging the second plurality of rectangular silicon solar cells in line with long sides of adjacent rectangular silicon solar cells overlapping and conductively bonded to each other to electrically connect the second plurality of rectangular silicon solar cells in series to form a solar cell string having a width equal to the first length; and
arranging the third plurality of rectangular silicon solar cells in line with long sides of adjacent rectangular silicon solar cells overlapping and conductively bonded to each other to electrically connect the third plurality of rectangular silicon solar cells in series to form a solar cell string having a width equal to the second length.

25. A method of making two or more strings of solar cells, the method comprising:
dicing one or more pseudo square silicon wafers along a plurality of lines parallel to a long edge of each wafer to form a first plurality of rectangular silicon solar cells comprising chamfered corners corresponding to corners or portions of corners of the pseudo square silicon wafers and a second plurality of rectangular silicon solar cells lacking chamfered corners;
arranging the first plurality of rectangular silicon solar cells in line with long sides of adjacent rectangular silicon solar cells overlapping and conductively bonded to each other to electrically connect the first plurality of rectangular silicon solar cells in series; and
arranging the second plurality of rectangular silicon solar cells in line with long sides of adjacent rectangular silicon solar cells overlapping and conductively bonded to each other to electrically connect the second plurality of rectangular silicon solar cells in series.

26. A method of making a solar module, the method comprising:
dicing each of a plurality of pseudo square silicon wafers along a plurality of lines parallel to a long edge of the wafer to form from the plurality of pseudo square silicon wafers a plurality of rectangular silicon solar cells comprising chamfered corners corresponding to corners of the pseudo square silicon wafers and a plurality of rectangular silicon solar cells lacking chamfered corners;
arranging at least some of the rectangular silicon solar cells lacking chamfered corners to form a first plurality of super cells each of which comprises only rectangular silicon solar cells lacking chamfered corners arranged in line with long sides of the silicon solar cells overlapping and conductively bonded to each other to electrically connect the silicon solar cells in series;

arranging at least some of the rectangular silicon solar cells comprising chamfered corners to form a second plurality of super cells each of which comprises only rectangular silicon solar cells comprising chamfered corners arranged in line with long sides of the silicon solar cells overlapping and conductively bonded to each other to electrically connect the silicon solar cells in series; and arranging the super cells in parallel rows of super cells of substantially equal length to form a front surface of the solar module, with each row comprising only super cells from the first plurality of super cells or only super cells from the second plurality of super cells.

27. The solar module of clause 26, wherein two of the rows of super cells adjacent to parallel opposite edges of the solar module comprise only super cells from the second plurality of super cells, and all other rows of super cells comprise only super cells from the first plurality of super cells.

28. The solar module of clause 27, wherein the solar module comprises a total of six rows of super cells.

29. A super cell comprising:

a plurality of silicon solar cells arranged in line in a first direction with end portions of adjacent silicon solar cells overlapping and conductively bonded to each other to electrically connect the silicon solar cells in series; and an elongated flexible electrical interconnect with its long axis oriented parallel to a second direction perpendicular to the first direction, conductively bonded to a front or back surface of an end one of the silicon solar cells at three or more discrete locations arranged along the second direction, running at least the full width of the end solar cell in the second direction, having a conductor thickness less than or equal to about 100 microns measured perpendicularly to the front or rear surface of the end silicon solar cell, providing a resistance to current flow in the second direction of less than or equal to about 0.012 Ohms, and configured to provide flexibility accommodating differential expansion in the second direction between the end silicon solar cell and the interconnect for a temperature range of about −40° C. to about 85° C.

30. The super cell of clause 29, wherein the flexible electrical interconnect has a conductor thickness less than or equal to about 30 microns measured perpendicularly to the front and rear surfaces of the end silicon solar cell.

31. The super cell of clause 29, wherein the flexible electrical interconnect extends beyond the super cell in the second direction to provide for electrical interconnection to at least a second super cell positioned parallel to and adjacent the super cell in a solar module.

32. The super cell of clause 29, wherein the flexible electrical interconnect extends beyond the super cell in the first direction to provide for electrical interconnection to a second super cell positioned parallel to and in line with the super cell in a solar module.

33. A solar module comprising:

a plurality of super cells arranged in two or more parallel rows spanning a width of the module to form a front surface of the module, each super cell comprising a plurality of silicon solar cells arranged in line with end portions of adjacent silicon solar cells overlapping and conductively bonded to each other to electrically connect the silicon solar cells in series;

wherein at least an end of a first super cell adjacent an edge of the module in a first row is electrically connected to an end of a second super cell adjacent the same edge of the module in a second row via a flexible electrical interconnect that is bonded to the front surface of the first super cell at a plurality of discrete locations with an electrically conductive adhesive bonding material, runs parallel to the edge of the module, and at least a portion of which folds around the end of the first super cell and is hidden from view from the front of the module.

34. The solar module of clause 33, wherein surfaces of the flexible electrical interconnect on the front surface of the module are covered or colored to reduce visible contrast with the super cells.

35. The solar module of clause 33, wherein the two or more parallel rows of super cells are arranged on a white back sheet to form a front surface of the solar module to be illuminated by solar radiation during operation of the solar module, the white back sheet comprises parallel darkened stripes having locations and widths corresponding to locations and widths of gaps between the parallel rows of super cells, and white portions of the back sheets are not visible through the gaps between the rows.

36. A method of making a string of solar cells, the method comprising:

laser scribing one or more scribe lines on each of one or more silicon solar cells to define a plurality of rectangular regions on the silicon solar cells, applying an electrically conductive adhesive bonding material to the one or more scribed silicon solar cells at one or more locations adjacent a long side of each rectangular region;

separating the silicon solar cells along the scribe lines to provide a plurality of rectangular silicon solar cells each comprising a portion of the electrically conductive adhesive bonding material disposed on its front surface adjacent a long side;

arranging the plurality of rectangular silicon solar cells in line with long sides of adjacent rectangular silicon solar cells overlapping in a shingled manner with a portion of the electrically conductive adhesive bonding material disposed in between; and curing the electrically conductive bonding material, thereby bonding adjacent overlapping rectangular silicon solar cells to each other and electrically connecting them in series.

37. A method of making a string of solar cells, the method comprising:

laser scribing one or more scribe lines on each of one or more silicon solar cells to define a plurality of rectangular regions on the silicon solar cells, each solar cell comprising a top surface and an oppositely positioned bottom surface;

applying an electrically conductive adhesive bonding material to portions of the top surfaces of the one or more silicon solar cells;

applying a vacuum between the bottom surfaces of the one or more silicon solar cells and a curved supporting surface to flex the one or more silicon solar cells against the curved supporting surface and thereby cleave the one or more silicon solar cells along the scribe lines to provide a plurality of rectangular silicon solar cells each comprising a portion of the electrically conductive adhesive bonding material disposed on its front surface adjacent a long side;

arranging the plurality of rectangular silicon solar cells in line with long sides of adjacent rectangular silicon solar cells overlapping in a shingled manner with a portion of the electrically conductive adhesive bonding material disposed in between; and curing the electrically conductive bonding material, thereby bonding adjacent overlapping rectangular silicon solar cells to each other and electrically connecting them in series.

38. The method of clause 37, comprising applying the electrically conductive adhesive bonding material to the one or more silicon solar cells, then laser scribing the one or more scribe lines on each of the one or more silicon solar cells.

39. The method of clause 37, comprising laser scribing the one or more scribe lines on each of the one or more silicon solar cells, then applying the electrically conductive adhesive bonding material to the one or more silicon solar cells.

40. A solar module comprising:
a plurality of super cells arranged in two or more parallel rows to form a front surface of the solar module, each super cell comprising a plurality of silicon solar cells arranged in line with end portions of adjacent silicon solar cells overlapping and conductively bonded to each other to electrically connect the silicon solar cells in series, each super cell comprising a front surface end contact at one end of the super cell and a back surface end contact of opposite polarity at an opposite end of the super cell;
wherein a first row of super cells comprises a first super cell arranged with its front surface end contact adjacent and parallel to a first edge of the solar module, and the solar module comprises a first flexible electrical interconnect that is elongated and runs parallel to the first edge of the solar module, is conductively bonded to the front surface end contact of the first super cell, and occupies only a narrow portion of the front surface of the solar module adjacent to the first edge of the solar module and no wider than about 1 centimeter measured perpendicularly to the first edge of the solar module.

41. The solar module of clause 40, wherein a portion of the first flexible electrical interconnect extends around the end of the first super cell nearest to the first edge of the solar module, and behind the first super cell.

42. The solar module of clause 40, wherein the first flexible interconnect comprises a thin ribbon portion conductively bonded to the front surface end contact of the first super cell and a thicker portion running parallel to the first edge of the solar module.

43. The solar module of clause 40, wherein the first flexible interconnect comprises a thin ribbon portion conductively bonded to the front surface end contact of the first super cell and a coiled ribbon portion running parallel to the first edge of the solar module.

44. The solar module of clause 40, wherein a second row of super cells comprises a second super cell arranged with its front surface end contact adjacent to and parallel to the first edge of the solar module, and the front surface end contact of the first super cell is electrically connected to the front surface end contact of the second super cell via the first flexible electrical interconnect.

45. The solar module of clause 40, wherein the back surface end contact of the first super cell is located adjacent to and parallel to a second edge of the solar module opposite from the first edge of the solar module, comprising a second flexible electrical interconnect that is elongated and runs parallel to the second edge of the solar module, is conductively bonded to the back surface end contact of the first super cell, and lies entirely behind the super cells.

46. The solar module of clause 45, wherein:
a second row of super cells comprises a second super cell arranged with its front surface end contact adjacent to and parallel to the first edge of the solar module and its back surface end contact located adjacent to and parallel to the second edge of the solar module;
the front surface end contact of the first super cell is electrically connected to the front surface end contact of the second super cell via the first flexible electrical interconnect; and
the back surface end contact of the first super cell is electrically connected to the back surface end contact of the second super cell via the second flexible electrical interconnect.

47. The solar module of clause 40, comprising:
a second super cell arranged in the first row of super cells in series with the first super cell and with its back surface end contact adjacent a second edge of the solar module opposite from the first edge of the solar module; and
a second flexible electrical interconnect that is elongated and runs parallel to the second edge of the solar module, is conductively bonded to the back surface end contact of the first super cell, and lies entirely behind the super cells.

48. The solar module of clause 47, wherein:
a second row of super cells comprises a third super cell and a fourth super cell arranged in series with a front surface end contact of the third super cell adjacent the first edge of the solar module and the back surface end contact of the fourth super cell adjacent the second edge of the solar module; and
the front surface end contact of the first super cell is electrically connected to the front surface end contact of the third super cell via the first flexible electrical interconnect and the back surface end contact of the second super cell is electrically connected to the back surface end contact of the fourth super cell via the second flexible electrical interconnect.

49. The solar module of clause 40, wherein the super cells are arranged on a white back sheet that comprises parallel darkened stripes having locations and widths corresponding to locations and widths of gaps between the parallel rows of super cells, and white portions of the back sheets are not visible through the gaps between the rows.

50. The solar module of clause 40, wherein all portions of the first flexible electrical interconnect located on the front surface of the solar module are covered or colored to reduce visible contrast with the super cells.

51. The solar module of clause 40, wherein:
each silicon solar cell comprises:
rectangular or substantially rectangular front and back surfaces with shapes defined by first and second oppositely positioned parallel long sides and two oppositely positioned short sides, at least portions of the front surfaces to be exposed to solar radiation during operation of the string of solar cells;
an electrically conductive front surface metallization pattern disposed on the front surface and comprising a plurality of fingers running perpendicular to the long sides and a plurality of discrete front surface contact pads positioned in a row adjacent to the first long side, each front surface contact pad electrically connected to at least one of the fingers; and
an electrically conductive back surface metallization pattern disposed on the back surface and comprising a plurality of discrete back surface contact pads positioned in a row adjacent the second long side; and
within each super cell the silicon solar cells are arranged in line with first and second long sides of adjacent silicon solar cells overlapping and with corresponding discrete front surface contact pads and discrete back surface contact pads on adjacent silicon solar cells aligned, overlapping, and conductively bonded to each other with a conductive adhesive bonding material to electrically connect the silicon solar cells in series.

52. The solar module of clause 51, wherein the front surface metallization pattern of each silicon solar cell comprises a plurality of thin conductors electrically interconnecting adjacent discrete front surface contact pads, and each thin conductor is thinner than the width of the discrete contact pads measured perpendicularly to the long sides of the solar cells.

53. The solar module of clause 51, wherein the conductive adhesive bonding material is substantially confined to the locations of the discrete front surface contact pads by features of the front surface metallization pattern that form one or more barriers adjacent to the discrete front surface contact pads.

54. The solar module of clause 51, wherein the conductive adhesive bonding material is substantially confined to the locations of the discrete back surface contact pads by features of the back surface metallization pattern that form one or more barriers adjacent to the discrete back surface contact pad.

55. A method of making a solar module, the method comprising:

assembling a plurality of super cells, each super cell comprising a plurality of rectangular silicon solar cells arranged in line with end portions on long sides of adjacent rectangular silicon solar cells overlapping in a shingled manner;

curing an electrically conductive bonding material disposed between the overlapping end portions of adjacent rectangular silicon solar cells by applying heat and pressure to the super cells, thereby bonding adjacent overlapping rectangular silicon solar cells to each other and electrically connecting them in series;

arranging and interconnecting the super cells in a desired solar module configuration in a stack of layers comprising an encapsulant; and applying heat and pressure to the stack of layers to form a laminated structure.

56. The method of clause 55, comprising curing or partially curing the electrically conductive bonding material by applying heat and pressure to the super cells prior to applying heat and pressure to the stack of layers to form the laminated structure, thereby forming cured or partially cured super cells as an intermediate product before forming the laminated structure.

57. The method of clause 56, wherein as each additional rectangular silicon solar cell is added to a super cell during assembly of the super cell, the electrically conductive adhesive bonding material between the newly added solar cell and its adjacent overlapping solar cell is cured or partially cured before another rectangular silicon solar cell is added to the super cell.

58. The method of clause 56, comprising curing or partially curing all of the electrically conductive bonding material in a super cell in the same step.

59. The method of clause 56, comprising:

partially curing the electrically conductive bonding material by applying heat and pressure to the super cells prior to applying heat and pressure to the stack of layers to form a laminated structure, thereby forming partially cured super cells as an intermediate product before forming the laminated structure; and completing curing of the electrically conductive bonding material while applying heat and pressure to the stack of layers to form the laminated structure.

60. The method of clause 55, comprising curing the electrically conductive bonding material while applying heat and pressure to the stack of layers to form a laminated structure, without forming cured or partially cured super cells as an intermediate product before forming the laminated structure.

61. The method of clause 55, comprising dicing one or more silicon solar cells into rectangular shapes to provide the rectangular silicon solar cells.

62. The method of clause 61, comprising applying the electrically conductive adhesive bonding material to the one or more silicon solar cells before dicing the one or more silicon solar cells to provide rectangular silicon solar cells with pre-applied electrically conductive adhesive bonding material.

63. The method of clause 62, comprising applying the electrically conductive adhesive bonding material to the one or more silicon solar cells, then using a laser to scribe one or more lines on each of the one or more silicon solar cells, then cleaving the one or more silicon solar cells along the scribed lines.

64. The method of clause 62, comprising using a laser to scribe one or more lines on each of the one or more silicon solar cells, then applying the electrically conductive adhesive bonding material to the one or more silicon solar cells, then cleaving the one or more silicon solar cells along the scribed lines.

65. The method of clause 62, wherein the electrically conductive adhesive bonding material is applied to a top surface of each of the one or more silicon solar cells and not to an oppositely positioned bottom surface of each of the one or more silicon solar cells, comprising applying a vacuum between the bottom surfaces of the one or more silicon solar cells and a curved supporting surface to flex the one or more silicon solar cells against the curved supporting surface and thereby cleave the one or more silicon solar cells along scribe lines.

66. The method of clause 61, comprising applying the electrically conductive adhesive bonding material to the rectangular silicon solar cells after dicing the one or more silicon solar cells to provide the rectangular silicon solar cells.

67. The method of clause 55, wherein the conductive adhesive bonding material has a glass transition temperature of less than or equal to about 0° C.

1A. A solar module comprising:

a plurality of super cells arranged in two or more parallel rows to form a front surface of the solar module, each super cell comprising a plurality of silicon solar cells arranged in line with end portions of adjacent silicon solar cells overlapping and conductively bonded to each other to electrically connect the silicon solar cells in series, each super cell comprising a front surface end contact at one end of the super cell and a back surface end contact of opposite polarity at an opposite end of the super cell;

wherein a first row of super cells comprises a first super cell arranged with its front surface end contact adjacent and parallel to a first edge of the solar module, and the solar module comprises a first flexible electrical interconnect that is elongated and runs parallel to the first edge of the solar module, is conductively bonded to the front surface end contact of the first super cell, and occupies only a narrow portion of the front surface of the solar module adjacent to the first edge of the solar module and no wider than about 1 centimeter measured perpendicularly to the first edge of the solar module.

2A. The solar module of clause 1A, wherein a portion of the first flexible electrical interconnect extends around the end of the first super cell nearest to the first edge of the solar module, and behind the first super cell.

3A. The solar module of clause 1A, wherein the first flexible interconnect comprises a thin ribbon portion conductively bonded to the front surface end contact of the first super cell and a thicker portion running parallel to the first edge of the solar module.

4A. The solar module of clause 1A, wherein the first flexible interconnect comprises a thin ribbon portion conductively bonded to the front surface end contact of the first super cell and a coiled ribbon portion running parallel to the first edge of the solar module.

5A. The solar module of clause 1A, wherein a second row of super cells comprises a second super cell arranged with its front surface end contact adjacent to and parallel to the first edge of the solar module, and the front surface end contact of the first super cell is electrically connected to the front surface end contact of the second super cell via the first flexible electrical interconnect.

6A. The solar module of clause 1A, wherein the back surface end contact of the first super cell is located adjacent to and parallel to a second edge of the solar module opposite from the first edge of the solar module, comprising a second flexible electrical interconnect that is elongated and runs parallel to the second edge of the solar module, is conductively bonded to the back surface end contact of the first super cell, and lies entirely behind the super cells.

7A. The solar module of clause 6A, wherein:
a second row of super cells comprises a second super cell arranged with its front surface end contact adjacent to and parallel to the first edge of the solar module and its back surface end contact located adjacent to and parallel to the second edge of the solar module;
the front surface end contact of the first super cell is electrically connected to the front surface end contact of the second super cell via the first flexible electrical interconnect; and
the back surface end contact of the first super cell is electrically connected to the back surface end contact of the second super cell via the second flexible electrical interconnect.

8A. The solar module of clause 1A, comprising:
a second super cell arranged in the first row of super cells in series with the first super cell and with its back surface end contact adjacent a second edge of the solar module opposite from the first edge of the solar module; and
a second flexible electrical interconnect that is elongated and runs parallel to the second edge of the solar module, is conductively bonded to the back surface end contact of the first super cell, and lies entirely behind the super cells.

9A. The solar module of clause 8A, wherein:
a second row of super cells comprises a third super cell and a fourth super cell arranged in series with a front surface end contact of the third super cell adjacent the first edge of the solar module and the back surface end contact of the fourth super cell adjacent the second edge of the solar module; and
the front surface end contact of the first super cell is electrically connected to the front surface end contact of the third super cell via the first flexible electrical interconnect and the back surface end contact of the second super cell is electrically connected to the back surface end contact of the fourth super cell via the second flexible electrical interconnect.

10A. The solar module of clause 1A, wherein away from outer edges of the solar module there are no electrical interconnections between the super cells that reduce the active area of the front surface of the module.

11A. The solar module of clause 1A wherein at least one pair of super cells is arranged in line in a row with the rear surface contact end of one of the pair of super cells adjacent to the rear surface contact end of the other of the pair of super cells.

12A. The solar module of clause 1A wherein:
at least one pair of super cells is arranged in line in a row with adjacent ends of the two super cells having end contacts of opposite polarity;
the adjacent ends of the pair of super cells overlap; and
the super cells in the pair of super cells are electrically connected in series by a flexible interconnect that is sandwiched between their overlapping ends and that does not shade the front surface.

13A. The solar module of clause 1A, wherein the super cells are arranged on a white backing sheet that comprises parallel darkened stripes having locations and widths corresponding to locations and widths of gaps between the parallel rows of super cells, and white portions of the backing sheets are not visible through the gaps between the rows.

14A. The solar module of clause 1A, wherein all portions of the first flexible electrical interconnect located on the front surface of the solar module are covered or colored to reduce visible contrast with the super cells.

15A. The solar module of clause 1A, wherein:
each silicon solar cell comprises:
rectangular or substantially rectangular front and back surfaces with shapes defined by first and second oppositely positioned parallel long sides and two oppositely positioned short sides, at least portions of the front surfaces to be exposed to solar radiation during operation of the string of solar cells;
an electrically conductive front surface metallization pattern disposed on the front surface and comprising a plurality of fingers running perpendicular to the long sides and a plurality of discrete front surface contact pads positioned in a row adjacent to the first long side, each front surface contact pad electrically connected to at least one of the fingers; and
an electrically conductive back surface metallization pattern disposed on the back surface and comprising a plurality of discrete back surface contact pads positioned in a row adjacent the second long side; and
within each super cell the silicon solar cells are arranged in line with first and second long sides of adjacent silicon solar cells overlapping and with corresponding discrete front surface contact pads and discrete back surface contact pads on adjacent silicon solar cells aligned, overlapping, and conductively bonded to each other with a conductive adhesive bonding material to electrically connect the silicon solar cells in series.

16A. The solar module of clause 15A, wherein the front surface metallization pattern of each silicon solar cell comprises a plurality of thin conductors electrically interconnecting adjacent discrete front surface contact pads, and each thin conductor is thinner than the width of the discrete contact pads measured perpendicularly to the long sides of the solar cells.

17A. The solar module of clause 15A, wherein the conductive adhesive bonding material is substantially confined to the locations of the discrete front surface contact pads by features of the front surface metallization pattern that form barriers around each discrete front surface contact pad.

18A. The solar module of clause 15A, wherein the conductive adhesive bonding material is substantially confined to the locations of the discrete back surface contact pads by features of the back surface metallization pattern that form barriers around each discrete back surface contact pad.

19A. The solar module of clause 15A, wherein the discrete back surface contact pads are discrete silver back surface contact pads, and except for the discrete silver back surface contact pads the back surface metallization pattern of each silicon solar cell does not comprise a silver contact at any location that underlies a portion of the front surface of the solar cell that is not overlapped by an adjacent silicon solar cell.

20A. A solar module comprising:
a plurality of super cells, each super cell comprising a plurality of silicon solar cells arranged in line with end portions of adjacent silicon solar cells overlapping and conductively bonded to each other to electrically connect the silicon solar cells in series;
wherein each silicon solar cell comprises:
rectangular or substantially rectangular front and back surfaces with shapes defined by first and second oppositely positioned parallel long sides and two oppositely positioned short sides, at least portions of the front surfaces to be exposed to solar radiation during operation of the string of solar cells;
an electrically conductive front surface metallization pattern disposed on the front surface and comprising a plurality of fingers running perpendicular to the long sides and a plurality of discrete front surface contact pads positioned in a row adjacent to the first long side, each front surface contact pad electrically connected to at least one of the fingers; and
an electrically conductive back surface metallization pattern disposed on the back surface and comprising a plurality of discrete back surface contact pads positioned in a row adjacent the second long side;
wherein within each super cell the silicon solar cells are arranged in line with first and second long sides of adjacent silicon solar cells overlapping and with corresponding discrete front surface contact pads and discrete back surface contact pads on adjacent silicon solar cells aligned, overlapping, and conductively bonded to each other with a conductive adhesive bonding material to electrically connect the silicon solar cells in series; and
wherein the super cells are arranged in a single row or in two or more parallel rows substantially spanning a length or width of the solar module to form a front surface of the solar module to be illuminated by solar radiation during operation of the solar module.

21A. The solar module of clause 20A, wherein the discrete back surface contact pads are discrete silver back surface contact pads, and except for the discrete silver back surface contact pads the back surface metallization pattern of each silicon solar cell does not comprise a silver contact at any location that underlies a portion of the front surface of the solar cell that is not overlapped by an adjacent silicon solar cell.

22A. The solar module of clause 20A, wherein the front surface metallization pattern of each silicon solar cell comprises a plurality of thin conductors electrically interconnecting adjacent discrete front surface contact pads, and each thin conductor is thinner than the width of the discrete contact pads measured perpendicularly to the long sides of the solar cells.

23A. The solar module of clause 20A, wherein the conductive adhesive bonding material is substantially confined to the locations of the discrete front surface contact pads by features of the front surface metallization pattern that form barriers around each discrete front surface contact pad.

24A. The solar module of clause 20A, wherein the conductive adhesive bonding material is substantially confined to the locations of the discrete back surface contact pads by features of the back surface metallization pattern that form barriers around each discrete back surface contact pad.

25A. A super cell comprising:
a plurality of silicon solar cells each comprising:
rectangular or substantially rectangular front and back surfaces with shapes defined by first and second oppositely positioned parallel long sides and two oppositely positioned short sides, at least portions of the front surfaces to be exposed to solar radiation during operation of the string of solar cells;
an electrically conductive front surface metallization pattern disposed on the front surface and comprising a plurality of fingers running perpendicular to the long sides and a plurality of discrete front surface contact pads positioned in a row adjacent to the first long side, each front surface contact pad electrically connected to at least one of the fingers; and
an electrically conductive back surface metallization pattern disposed on the back surface and comprising a plurality of discrete silver back surface contact pads positioned in a row adjacent the second long side;
wherein the silicon solar cells are arranged in line with first and second long sides of adjacent silicon solar cells overlapping and with corresponding discrete front surface contact pads and discrete back surface contact pads on adjacent silicon solar cells aligned, overlapping, and conductively bonded to each other with a conductive adhesive bonding material to electrically connect the silicon solar cells in series.

26A. The solar module of clause 25A, wherein the discrete back surface contact pads are discrete silver back surface contact pads, and except for the discrete silver back surface contact pads the back surface metallization pattern of each silicon solar cell does not comprise a silver contact at any location that underlies a portion of the front surface of the solar cell that is not overlapped by an adjacent silicon solar cell.

27A. The string of solar cells of clause 25A, wherein the front surface metallization pattern comprises a plurality of thin conductors electrically interconnecting adjacent discrete front surface contact pads, and each thin conductor is thinner than the width of the discrete contact pads measured perpendicularly to the long sides of the solar cells.

28A. The string of solar cells of clause 25A, wherein the conductive adhesive bonding material is substantially confined to the locations of the discrete front surface contact pads by features of the front surface metallization pattern that form barriers around each discrete front surface contact pad.

29A. The string of solar cells of clause 25A, wherein the conductive adhesive bonding material is substantially confined to the locations of the discrete back surface contact pads by features of the back surface metallization pattern that form barriers around each discrete back surface contact pad.

30A. The string of solar cells of clause 25A, wherein the conductive adhesive bonding material has a glass transition less than or equal to about 0° C.

31A. A method of making a solar module, the method comprising:

assembling a plurality of super cells, each super cell comprising a plurality of rectangular silicon solar cells arranged in line with end portions on long sides of adjacent rectangular silicon solar cells overlapping in a shingled manner;

curing an electrically conductive bonding material disposed between the overlapping end portions of adjacent rectangular silicon solar cells by applying heat and pressure to the super cells, thereby bonding adjacent overlapping rectangular silicon solar cells to each other and electrically connecting them in series;

arranging and interconnecting the super cells in a desired solar module configuration in a stack of layers comprising an encapsulant; and applying heat and pressure to the stack of layers to form a laminated structure.

32A. The method of clause 31A, comprising curing or partially curing the electrically conductive bonding material by applying heat and pressure to the super cells prior to applying heat and pressure to the stack of layers to form the laminated structure, thereby forming cured or partially cured super cells as an intermediate product before forming the laminated structure.

33A. The method of clause 32A, wherein as each additional rectangular silicon solar cell is added to a super cell during assembly of the super cell, the electrically conductive adhesive bonding material between the newly added solar cell and its adjacent overlapping solar cell is cured or partially cured before another rectangular silicon solar cell is added to the super cell.

34A. The method of clause 32A, comprising curing or partially curing all of the electrically conductive bonding material in a super cell in the same step.

35A. The method of clause 32A, comprising:

partially curing the electrically conductive bonding material by applying heat and pressure to the super cells prior to applying heat and pressure to the stack of layers to form a laminated structure, thereby forming partially cured super cells as an intermediate product before forming the laminated structure; and completing curing of the electrically conductive bonding material while applying heat and pressure to the stack of layers to form the laminated structure.

36A. The method of clause 31A, comprising curing the electrically conductive bonding material while applying heat and pressure to the stack of layers to form a laminated structure, without forming cured or partially cured super cells as an intermediate product before forming the laminated structure.

37A. The method of clause 31A, comprising dicing one or more silicon solar cells into rectangular shapes to provide the rectangular silicon solar cells.

38A. The method of clause 37A, comprising applying the electrically conductive adhesive bonding material to the one or more silicon solar cells before dicing the one or more silicon solar cells to provide rectangular silicon solar cells with pre-applied electrically conductive adhesive bonding material.

39A. The method of clause 38A, comprising applying the electrically conductive adhesive bonding material to the one or more silicon solar cells, then using a laser to scribe one or more lines on each of the one or more silicon solar cells, then cleaving the one or more silicon solar cells along the scribed lines.

40A. The method of clause 38A, comprising using a laser to scribe one or more lines on each of the one or more silicon solar cells, then applying the electrically conductive adhesive bonding material to the one or more silicon solar cells, then cleaving the one or more silicon solar cells along the scribed lines.

41A. The method of clause 38A, wherein the electrically conductive adhesive bonding material is applied to a top surface of each of the one or more silicon solar cells and not to an oppositely positioned bottom surface of each of the one or more silicon solar cells, comprising applying a vacuum between the bottom surfaces of the one or more silicon solar cells and a curved supporting surface to flex the one or more silicon solar cells against the curved supporting surface and thereby cleave the one or more silicon solar cells along scribe lines.

42A. The method of clause 37A, comprising applying the electrically conductive adhesive bonding material to the rectangular silicon solar cells after dicing the one or more silicon solar cells to provide the rectangular silicon solar cells.

43A. The method of clause 31A, wherein the conductive adhesive bonding material has a glass transition temperature of less than or equal to about 0° C.

44A. A method of making a super cell, the method comprising:

laser scribing one or more scribe lines on each of one or more silicon solar cells to define a plurality of rectangular regions on the silicon solar cells, applying an electrically conductive adhesive bonding material to the one or more scribed silicon solar cells at one or more locations adjacent a long side of each rectangular region;

separating the silicon solar cells along the scribe lines to provide a plurality of rectangular silicon solar cells each comprising a portion of the electrically conductive adhesive bonding material disposed on its front surface adjacent a long side;

arranging the plurality of rectangular silicon solar cells in line with long sides of adjacent rectangular silicon solar cells overlapping in a shingled manner with a portion of the electrically conductive adhesive bonding material disposed in between; and curing the electrically conductive bonding material, thereby bonding adjacent overlapping rectangular silicon solar cells to each other and electrically connecting them in series.

45A. A method of making a super cell, the method comprising:

laser scribing one or more scribe lines on each of one or more silicon solar cells to define a plurality of rectangular regions on the silicon solar cells, each solar cell comprising a top surface and an oppositely positioned bottom surface;

applying an electrically conductive adhesive bonding material to portions of the top surfaces of the one or more silicon solar cells;

applying a vacuum between the bottom surfaces of the one or more silicon solar cells and a curved supporting surface to flex the one or more silicon solar cells against the curved supporting surface and thereby cleave the one or more silicon solar cells along the scribe lines to provide a plurality of rectangular silicon solar cells each comprising a portion of the electrically conductive adhesive bonding material disposed on its front surface adjacent a long side;

arranging the plurality of rectangular silicon solar cells in line with long sides of adjacent rectangular silicon solar cells overlapping in a shingled manner with a portion of the electrically conductive adhesive bonding material disposed in between; and curing the electrically conductive bonding material, thereby bonding adjacent overlapping rectangular silicon solar cells to each other and electrically connecting them in series.

46A. A method of making a super cell, the method comprising:

dicing one or more pseudo square silicon wafers along a plurality of lines parallel to a long edge of each wafer to form a plurality of rectangular silicon solar cells each having substantially the same length along its long axis; and arranging the rectangular silicon solar cells in line with long sides of adjacent solar cells overlapping and conductively bonded to each other to electrically connect the solar cells in series;

wherein the plurality of rectangular silicon solar cells comprises at least one rectangular solar cell having two chamfered corners corresponding to corners or to portions of corners of the pseudo square wafer, and one or more rectangular silicon solar cells each lacking chamfered corners; and wherein the spacing between parallel lines along which the pseudo square wafer is diced is selected to compensate for the chamfered corners by making the width perpendicular to the long axis of the rectangular silicon solar cells that comprise chamfered corners greater than the width perpendicular to the long axis of the rectangular silicon solar cells that lack chamfered corners, so that each of the plurality of rectangular silicon solar cells in the string of solar cells has a front surface of substantially the same area exposed to light in operation of the string of solar cells.

47A. A super cell comprising:

a plurality of silicon solar cells arranged in line with end portions of adjacent solar cells overlapping and conductively bonded to each other to electrically connect the solar cells in series;

wherein at least one of the silicon solar cells has chamfered corners that correspond to corners or portions of corners of a pseudo square silicon wafer from which it was diced, at least one of the silicon solar cells lacks chamfered corners, and each of the silicon solar cells has a front surface of substantially the same area exposed to light during operation of the string of solar cells.

48A. A method of making two or more super cells, the method comprising:

dicing one or more pseudo square silicon wafers along a plurality of lines parallel to a long edge of each wafer to form a first plurality of rectangular silicon solar cells comprising chamfered corners corresponding to corners or portions of corners of the pseudo square silicon wafers and a second plurality of rectangular silicon solar cells each of a first length spanning a full width of the pseudo square silicon wafers and lacking chamfered corners;

removing the chamfered corners from each of the first plurality of rectangular silicon solar cells to form a third plurality of rectangular silicon solar cells each of a second length shorter than the first length and lacking chamfered corners;

arranging the second plurality of rectangular silicon solar cells in line with long sides of adjacent rectangular silicon solar cells overlapping and conductively bonded to each other to electrically connect the second plurality of rectangular silicon solar cells in series to form a solar cell string having a width equal to the first length; and arranging the third plurality of rectangular silicon solar cells in line with long sides of adjacent rectangular silicon solar cells overlapping and conductively bonded to each other to electrically connect the third plurality of rectangular silicon solar cells in series to form a solar cell string having a width equal to the second length.

49A. A method of making two or more super cells, the method comprising:

dicing one or more pseudo square silicon wafers along a plurality of lines parallel to a long edge of each wafer to form a first plurality of rectangular silicon solar cells comprising chamfered corners corresponding to corners or portions of corners of the pseudo square silicon wafers and a second plurality of rectangular silicon solar cells lacking chamfered corners;

arranging the first plurality of rectangular silicon solar cells in line with long sides of adjacent rectangular silicon solar cells overlapping and conductively bonded to each other to electrically connect the first plurality of rectangular silicon solar cells in series; and arranging the second plurality of rectangular silicon solar cells in line with long sides of adjacent rectangular silicon solar cells overlapping and conductively bonded to each other to electrically connect the second plurality of rectangular silicon solar cells in series.

50A. A solar module comprising:

a series connected string of $N \geq$ than 25 rectangular or substantially rectangular solar cells having on average a breakdown voltage greater than about 10 volts, the solar cells grouped into one or more super cells each of which comprises two or more of the solar cells arranged in line with long sides of adjacent solar cells overlapping and conductively bonded to each other with an electrically and thermally conductive adhesive;

wherein no single solar cell or group of <N solar cells in the string of solar cells is individually electrically connected in parallel with a bypass diode.

51A. The solar module of clause 50A, wherein N is greater than or equal to 30.

52A. The solar module of clause 50A, wherein N is greater than or equal to 50.

53A. The solar module of clause 50A, wherein N is greater than or equal to 100.

54A. The solar module of clause 50A, wherein the adhesive forms bonds between adjacent solar cells having a thickness perpendicular to the solar cells less than or equal to about 0.1 mm and a thermal conductivity perpendicular to the solar cells greater than or equal to about 1.5 w/m/k.

55A. The solar module of clause 50A, wherein the N solar cells are grouped into a single super cell.

56A. The solar module of clause 50A, wherein the solar cells are silicon solar cells.

57A. A solar module comprising:

a super cell substantially spanning a full length or width of the solar module parallel to an edge of the solar module, the super cell comprising a series connected string of N rectangular or substantially rectangular solar cells having on average a breakdown voltage greater than about 10 volts arranged in line with long sides of adjacent solar cells overlapping and conductively bonded to each other with an electrically and thermally conductive adhesive;

wherein no single solar cell or group of <N solar cells in the super cell is individually electrically connected in parallel with a bypass diode.

58A. The solar module of clause 57A, wherein N>24.

59A. The solar module of clause 57A, wherein the super cell has a length in the direction of current flow of at least about 500 mm.

60A. A super cell comprising:
a plurality of silicon solar cells each comprising:
rectangular or substantially rectangular front and back surfaces with shapes defined by first and second oppositely positioned parallel long sides and two oppositely positioned short sides, at least portions of the front surfaces to be exposed to solar radiation during operation of the string of solar cells;
an electrically conductive front surface metallization pattern disposed on the front surface and comprising at least one front surface contact pad positioned adjacent to the first long side; and
an electrically conductive back surface metallization pattern disposed on the back surface and comprising at least one back surface contact pad positioned adjacent the second long side;
wherein the silicon solar cells are arranged in line with first and second long sides of adjacent silicon solar cells overlapping and with front surface and back surface contact pads on adjacent silicon solar cells overlapping and conductively bonded to each other with a conductive adhesive bonding material to electrically connect the silicon solar cells in series; and
wherein the front surface metallization pattern of each silicon solar cell comprises a barrier configured to substantially confine the conducive adhesive bonding material to the at least one front surface contact pads prior to curing of the conductive adhesive bonding material during manufacturing of the super cell.

61A. The super cell of clause 60A, wherein for each pair of adjacent and overlapping silicon solar cells, the barrier on the front surface of one of the silicon solar cells is overlapped and hidden by a portion of the other silicon solar cell, thereby substantially confining the conductive adhesive bonding material to overlapped regions of the front surface of the silicon solar cell prior to curing of the conductive adhesive bonding material during manufacturing of the super cell.

62A. The super cell of clause 60A, wherein the barrier comprises a continuous conductive line running parallel to and for substantially the full length of the first long side, with the at least one front surface contact pads located between the continuous conductive line and the first long side of the solar cell.

63A. The super cell of clause 62A, wherein the front surface metallization pattern comprises fingers electrically connected to the at least one front surface contact pads and running perpendicularly to the first long side, and the continuous conductive line electrically interconnects the fingers to provide multiple conductive paths from each finger to the at least one front surface contact pads.

64A. The super cell of clause 60A, wherein the front surface metallization pattern comprises a plurality of discrete contact pads arranged in a row adjacent to and parallel to the first long side, and the barrier comprises a plurality of features forming separate barriers for each discrete contact pad that substantially confine the conductive adhesive bonding material to the discrete contact pads prior to curing of the conductive adhesive bonding material during manufacturing of the super cell.

65A. The super cell of clause 64A, wherein the separate barriers abut and are taller than their corresponding discrete contact pads.

66A. A super cell comprising:
a plurality of silicon solar cells each comprising:
rectangular or substantially rectangular front and back surfaces with shapes defined by first and second oppositely positioned parallel long sides and two oppositely positioned short sides, at least portions of the front surfaces to be exposed to solar radiation during operation of the string of solar cells;
an electrically conductive front surface metallization pattern disposed on the front surface and comprising at least one front surface contact pad positioned adjacent to the first long side; and
an electrically conductive back surface metallization pattern disposed on the back surface and comprising at least one back surface contact pad positioned adjacent the second long side;
wherein the silicon solar cells are arranged in line with first and second long sides of adjacent silicon solar cells overlapping and with front surface and back surface contact pads on adjacent silicon solar cells overlapping and conductively bonded to each other with a conductive adhesive bonding material to electrically connect the silicon solar cells in series; and
wherein the back surface metallization pattern of each silicon solar cell comprises a barrier configured to substantially confine the conducive adhesive bonding material to the at least one back surface contact pads prior to curing of the conductive adhesive bonding material during manufacturing of the super cell.

67A. The super cell of clause 66A, wherein the back surface metallization pattern comprises one or more discrete contact pads arranged in a row adjacent to and parallel to the second long side, and the barrier comprises a plurality of features forming separate barriers for each discrete contact pad that substantially confine the conductive adhesive bonding material to the discrete contact pads prior to curing of the conductive adhesive bonding material during manufacturing of the super cell.

68A. The super cell of clause 67A, wherein the separate barriers abut and are taller than their corresponding discrete contact pads.

69A. A method of making a string of solar cells, the method comprising:
dicing one or more pseudo square silicon wafers along a plurality of lines parallel to a long edge of each wafer to form a plurality of rectangular silicon solar cells each having substantially the same length along its long axis; and
arranging the rectangular silicon solar cells in line with long sides of adjacent solar cells overlapping and conductively bonded to each other to electrically connect the solar cells in series;
wherein the plurality of rectangular silicon solar cells comprises at least one rectangular solar cell having two chamfered corners corresponding to corners or to portions of corners of the pseudo square wafer, and one or more rectangular silicon solar cells each lacking chamfered corners; and
wherein the spacing between parallel lines along which the pseudo square wafer is diced is selected to compensate for the chamfered corners by making the width perpendicular to the long axis of the rectangular silicon solar cells that comprise chamfered corners greater than the width perpendicular to the long axis of the rectangular silicon solar cells that lack chamfered corners, so that each of the plurality of rectangular silicon solar cells in the string of solar cells has a front surface of substantially the same area exposed to light in operation of the string of solar cells.

70A. A string of solar cells comprising:
a plurality of silicon solar cells arranged in line with end portions of adjacent solar cells overlapping and conductively bonded to each other to electrically connect the solar cells in series;
wherein at least one of the silicon solar cells has chamfered corners that correspond to corners or portions of corners of a pseudo square silicon wafer from which it was diced, at least one of the silicon solar cells lacks chamfered corners, and each of the silicon solar cells has a front surface of substantially the same area exposed to light during operation of the string of solar cells.

71A. A method of making two or more strings of solar cells, the method comprising:
dicing one or more pseudo square silicon wafers along a plurality of lines parallel to a long edge of each wafer to form a first plurality of rectangular silicon solar cells comprising chamfered corners corresponding to corners or portions of corners of the pseudo square silicon wafers and a second plurality of rectangular silicon solar cells each of a first length spanning a full width of the pseudo square silicon wafers and lacking chamfered corners;
removing the chamfered corners from each of the first plurality of rectangular silicon solar cells to form a third plurality of rectangular silicon solar cells each of a second length shorter than the first length and lacking chamfered corners;
arranging the second plurality of rectangular silicon solar cells in line with long sides of adjacent rectangular silicon solar cells overlapping and conductively bonded to each other to electrically connect the second plurality of rectangular silicon solar cells in series to form a solar cell string having a width equal to the first length; and
arranging the third plurality of rectangular silicon solar cells in line with long sides of adjacent rectangular silicon solar cells overlapping and conductively bonded to each other to electrically connect the third plurality of rectangular silicon solar cells in series to form a solar cell string having a width equal to the second length.

72A. A method of making two or more strings of solar cells, the method comprising:
dicing one or more pseudo square silicon wafers along a plurality of lines parallel to a long edge of each wafer to form a first plurality of rectangular silicon solar cells comprising chamfered corners corresponding to corners or portions of corners of the pseudo square silicon wafers and a second plurality of rectangular silicon solar cells lacking chamfered corners;
arranging the first plurality of rectangular silicon solar cells in line with long sides of adjacent rectangular silicon solar cells overlapping and conductively bonded to each other to electrically connect the first plurality of rectangular silicon solar cells in series; and
arranging the second plurality of rectangular silicon solar cells in line with long sides of adjacent rectangular silicon solar cells overlapping and conductively bonded to each other to electrically connect the second plurality of rectangular silicon solar cells in series.

73A. A method of making a solar module, the method comprising:
dicing each of a plurality of pseudo square silicon wafers along a plurality of lines parallel to a long edge of the wafer to form from the plurality of pseudo square silicon wafers a plurality of rectangular silicon solar cells comprising chamfered corners corresponding to corners of the pseudo square silicon wafers and a plurality of rectangular silicon solar cells lacking chamfered corners;
arranging at least some of the rectangular silicon solar cells lacking chamfered corners to form a first plurality of super cells each of which comprises only rectangular silicon solar cells lacking chamfered corners arranged in line with long sides of the silicon solar cells overlapping and conductively bonded to each other to electrically connect the silicon solar cells in series;
arranging at least some of the rectangular silicon solar cells comprising chamfered corners to form a second plurality of super cells each of which comprises only rectangular silicon solar cells comprising chamfered corners arranged in line with long sides of the silicon solar cells overlapping and conductively bonded to each other to electrically connect the silicon solar cells in series; and
arranging the super cells in parallel rows of super cells of substantially equal length to form a front surface of the solar module, with each row comprising only super cells from the first plurality of super cells or only super cells from the second plurality of super cells.

74A. The solar module of clause 73A, wherein two of the rows of super cells adjacent to parallel opposite edges of the solar module comprise only super cells from the second plurality of super cells, and all other rows of super cells comprise only super cells from the first plurality of super cells.

75A. The solar module of clause 74A, wherein the solar module comprises a total of six rows of super cells.

76A. A super cell comprising:
a plurality of silicon solar cells arranged in line in a first direction with end portions of adjacent silicon solar cells overlapping and conductively bonded to each other to electrically connect the silicon solar cells in series; and
an elongated flexible electrical interconnect with its long axis oriented parallel to a second direction perpendicular to the first direction, conductively bonded to a front or back surface of an end one of the silicon solar cells at three or more discrete locations arranged along the second direction, running at least the full width of the end solar cell in the second direction, having a conductor thickness less than or equal to about 100 microns measured perpendicularly to the front or rear surface of the end silicon solar cell, providing a resistance to current flow in the second direction of less than or equal to about 0.012 Ohms, and configured to provide flexibility accommodating differential expansion in the second direction between the end silicon solar cell and the interconnect for a temperature range of about −40° C. to about 85° C.

77A. The super cell of clause 76A, wherein the flexible electrical interconnect has a conductor thickness less than or equal to about 30 microns measured perpendicularly to the front and rear surfaces of the end silicon solar cell.

78A. The super cell of clause 76A, wherein the flexible electrical interconnect extends beyond the super cell in the second direction to provide for electrical interconnection to at least a second super cell positioned parallel to and adjacent the super cell in a solar module.

79A. The super cell of clause 76A, wherein the flexible electrical interconnect extends beyond the super cell in the first direction to provide for electrical interconnection to a second super cell positioned parallel to and in line with the super cell in a solar module.

80A. A solar module comprising:
a plurality of super cells arranged in two or more parallel rows spanning a width of the module to form a front surface of the module, each super cell comprising a plurality of silicon solar cells arranged in line with end portions of adjacent silicon solar cells overlapping and conductively bonded to each other to electrically connect the silicon solar cells in series;

wherein at least an end of a first super cell adjacent an edge of the module in a first row is electrically connected to an end of a second super cell adjacent the same edge of the module in a second row via a flexible electrical interconnect that is bonded to the front surface of the first super cell at a plurality of discrete locations with an electrically conductive adhesive bonding material, runs parallel to the edge of the module, and at least a portion of which folds around the end of the first super cell and is hidden from view from the front of the module.

81A. The solar module of clause 80A, wherein surfaces of the flexible electrical interconnect on the front surface of the module are covered or colored to reduce visible contrast with the super cells.

82A. The solar module of clause 80A, wherein the two or more parallel rows of super cells are arranged on a white backing sheet to form a front surface of the solar module to be illuminated by solar radiation during operation of the solar module, the white backing sheet comprises parallel darkened stripes having locations and widths corresponding to locations and widths of gaps between the parallel rows of super cells, and white portions of the backing sheets are not visible through the gaps between the rows.

83A. A method of making a string of solar cells, the method comprising:

laser scribing one or more scribe lines on each of one or more silicon solar cells to define a plurality of rectangular regions on the silicon solar cells, applying an electrically conductive adhesive bonding material to the one or more scribed silicon solar cells at one or more locations adjacent a long side of each rectangular region;

separating the silicon solar cells along the scribe lines to provide a plurality of rectangular silicon solar cells each comprising a portion of the electrically conductive adhesive bonding material disposed on its front surface adjacent a long side;

arranging the plurality of rectangular silicon solar cells in line with long sides of adjacent rectangular silicon solar cells overlapping in a shingled manner with a portion of the electrically conductive adhesive bonding material disposed in between; and curing the electrically conductive bonding material, thereby bonding adjacent overlapping rectangular silicon solar cells to each other and electrically connecting them in series.

84A. A method of making a string of solar cells, the method comprising:

laser scribing one or more scribe lines on each of one or more silicon solar cells to define a plurality of rectangular regions on the silicon solar cells, each solar cell comprising a top surface and an oppositely positioned bottom surface;

applying an electrically conductive adhesive bonding material to portions of the top surfaces of the one or more silicon solar cells;

applying a vacuum between the bottom surfaces of the one or more silicon solar cells and a curved supporting surface to flex the one or more silicon solar cells against the curved supporting surface and thereby cleave the one or more silicon solar cells along the scribe lines to provide a plurality of rectangular silicon solar cells each comprising a portion of the electrically conductive adhesive bonding material disposed on its front surface adjacent a long side;

arranging the plurality of rectangular silicon solar cells in line with long sides of adjacent rectangular silicon solar cells overlapping in a shingled manner with a portion of the electrically conductive adhesive bonding material disposed in between; and curing the electrically conductive bonding material, thereby bonding adjacent overlapping rectangular silicon solar cells to each other and electrically connecting them in series.

85A. The method of clause 84A, comprising applying the electrically conductive adhesive bonding material to the one or more silicon solar cells, then laser scribing the one or more scribe lines on each of the one or more silicon solar cells.

86A. The method of clause 84A, comprising laser scribing the one or more scribe lines on each of the one or more silicon solar cells, then applying the electrically conductive adhesive bonding material to the one or more silicon solar cells.

1B. An apparatus comprising:
a series connected string of at least 25 solar cells connected in parallel with a common bypass diode, each solar cell having a breakdown voltage greater than about 10 volts and grouped into a super cell comprising the solar cells arranged with long sides of adjacent solar cells overlapping and conductively bonded with an adhesive.

2B. An apparatus as in clause 1B wherein N is greater than or equal to 30.

3B. An apparatus as in clause 1B wherein N is greater than or equal to 50.

4B. An apparatus as in clause 1B wherein N is greater than or equal to 100.

5B. An apparatus as in clause 1B wherein the adhesive has a thickness less than or equal to about 0.1 mm, and has a thermal conductivity greater than or equal to about 1.5 W/m/K.

6B. An apparatus as in clause 1B wherein the N solar cells are grouped into a single super cell.

7B. An apparatus as in clause 1B wherein the N solar cells are grouped into a plurality of super cells on a same backing.

8B. An apparatus as in clause 1B wherein the solar cells are silicon solar cells.

9B. An apparatus as in clause 1B wherein the super cell has a length in a direction of current flow of at least about 500 mm.

10B. An apparatus as in clause 1B wherein the solar cells comprise a feature configured to confine spreading of the adhesive.

11B. An apparatus as in clause 10B wherein the feature comprises a raised feature.

12B. An apparatus as in clause 10B wherein the feature comprises metallization.

13B. An apparatus as in clause 12B wherein the metallization comprises a line running a full length of the first long side, the apparatus further comprising at least one contact pad located between the line and the first long side.

14B. An apparatus as in clause 13B wherein:
the metallization further comprises fingers electrically connected to the at least one contact pad and running perpendicularly to the first long side; and
the conductive line interconnects the fingers.

15B. An apparatus as in clause 10B wherein the feature is on a front side of the solar cell.

16B. An apparatus as in clause 10B wherein the feature is on a back side of the solar cell.

17B. An apparatus as in clause 10B wherein the feature comprises a recessed feature.

18B. An apparatus as in clause 10B wherein the feature is hidden by an adjacent solar cell of the super cell.

19B. An apparatus as in clause 1B wherein a first solar cell of the super cell has chamfered corners and a second solar cell of the super cell lacks chamfered corners, and the first solar cell and the second solar cell have a same area exposed to light.

20B. An apparatus as in clause 1B further comprising a flexible electrical interconnect having a long axis parallel to a second direction perpendicular to the first direction, the flexible electrical interconnect conductively bonded to a surface of the solar cell and accommodating thermal expansion of a solar cell in two dimension.

21B. An apparatus as in clause 20B wherein the flexible electrical interconnect has a thickness less than or equal to about 100 microns to provide a resistance of less than or equal to about 0.012 Ohms.

22B. An apparatus as in clause 20B wherein the surface comprises a back surface.

23B. An apparatus as in clause 20B wherein the flexible electrical interconnect contacts another super cell.

24B. An apparatus as in clause 23B wherein the other super cell is in line with the super cell.

25B. An apparatus as in clause 23B wherein the other super cell is adjacent to the super cell.

26B. An apparatus as in clause 20B wherein a first portion of the interconnect folds around an edge of the super cell such that a remaining second interconnect portion is on a backside of the super cell.

27B. An apparatus as in clause 20B wherein the flexible electrical interconnect is electrically connected to a bypass diode.

28B. An apparatus as in clause 1B wherein a plurality of super cells are arranged in two or more parallel rows on a backing sheet to form a solar module front surface, wherein the backing sheet is white and comprises darkened stripes of location and width corresponding to gaps between super cells.

29B. An apparatus as in clause 1B wherein the super cell comprises at least one pair of cell strings connected to a power management system.

30B. An apparatus as in clause 1B further comprising a power management device in electrical communication with the super cell and configured to,
receive a voltage output of the super cell;
based upon the voltage, determine if a solar cell is in reverse bias; and
disconnect the solar cell in reverse bias from a super cell module circuit.

31B. An apparatus as in clause 1B wherein the super cell is disposed on a first backing to form a first module having a top conductive ribbon on a first side facing a direction of solar energy, the apparatus further comprising:
another super cell disposed on a second backing to form a second module having a bottom ribbon on a second side facing a direction away from the direction of the solar energy,
wherein the second module overlaps and is bonded to a portion of the first module including the top ribbon.

32B. An apparatus as in clause 31B wherein the second module is bonded to the first module by adhesive.

33B. An apparatus as in clause 31B wherein the second module is bonded to the first module by a mating arrangement.

34B. An apparatus as in clause 31B further comprising a junction box overlapped by the second module.

35B. An apparatus as in clause 34B wherein the second module is bonded to the first module by a mating arrangement.

36B. An apparatus as in clause 35B wherein the mating arrangement is between the junction box and another junction box on the second module.

37B. An apparatus as in clause 31B wherein the first backing comprises glass.

38B. An apparatus as in clause 31B wherein the first backing comprises other than glass.

39B. An apparatus as in clause 1B wherein the solar cell comprises a chamfered portion cut from a larger piece.

40B. An apparatus as in clause 39B wherein the super cell further comprises another solar cell having a chamfered portion, wherein a long side of the solar cell is in electrical contact with a long side of the other solar cell that has a similar length.

1C1. A method comprising:
forming a super cell comprising a series connected string of at least N≥25 solar cells on a same backing, each solar cell having a breakdown voltage greater than about 10 volts and arranged with long sides of adjacent solar cells overlapping and conductively bonded with an adhesive; and
connecting each super cell with at most a single bypass diode 2C1. A method as in clause 1C1 wherein N is greater than or equal to 30.

3C1. A method as in clause 1C1 wherein N is greater than or equal to 50.

4C1. A method as in clause 1C1 wherein N is greater than or equal to 100.

5C1. A method as in clause 1C1 wherein the adhesive has a thickness less than or equal to about 0.1 mm, and has a thermal conductivity greater than or equal to about 1.5 w/m/k.

6C1. A method as in clause 1C1 wherein the solar cells are silicon solar cells.

7C1. A method as in clause 1C1 wherein the super cell has a length in a direction of current flow of at least about 500 mm.

8C1. A method as in clause 1C1 wherein a first solar cell of the super cell has chamfered corners and a second solar cell of the super cell lacks chamfered corners, and the first solar cell and the second solar cell have a same area exposed to light.

9C1. A method as in clause 1C1 further comprising confining a spreading of the adhesive utilizing a feature on a solar cell surface.

10C1. A method as in clause 9C1 wherein the feature comprises a raised feature.

11C1. A method as in clause 9C1 wherein the feature comprises metallization.

12C1. A method as in clause 11C1 wherein the metallization comprises a line running a full length of the first long side, at least one contact pad located between the line and the first long side.

13C1. A method as in clause 12C1 wherein:
the metallization further comprises fingers electrically connected to the at least one contact pad and running perpendicularly to the first long side; and
the conductive line interconnects the fingers.

14C1. A method as in clause 9C1 wherein the feature is on a front side of the solar cell.

15C1. A method as in clause 9C1 wherein the feature is on a back side of the solar cell.

16C1. A method as in clause 9C1 wherein the feature comprises a recessed feature.

17C1. A method as in clause 9C1 wherein the feature is hidden by an adjacent solar cell of the super cell.

18C1. A method as in clause 1C1 further comprising forming another super cell on the same backing.

19C1. A method as in clause 1C1 further comprising:
conductively bonding to a surface of a solar cell, a flexible electrical interconnect having a long axis parallel to a second direction perpendicular to the first direction; and
causing the flexible electrical interconnect to accommodate thermal expansion of the solar cell in two dimensions 20C1. A method as in clause 19C1 wherein the flexible electrical interconnect has a thickness less than or equal to about 100 microns to provide a resistance of less than or equal to about 0.012 Ohms.

21C1. A method as in clause 19C1 wherein the surface comprises a back surface.

22C1. A method as in clause 19C1 further comprising contacting another super cell with the flexible electrical interconnect.

23C1. A method as in clause 22C1 wherein the other super cell is in line with the super cell.

24C1. A method as in clause 22C1 wherein the other super cell is adjacent to the super cell.

25C1. A method as in clause 19C1 further comprising folding a first portion of the interconnect around an edge of the super cell such that a remaining second interconnect portion is on a backside of the super cell.

26C1. A method as in clause 19C1 further comprising electrically connecting the flexible electrical interconnect to a bypass diode.

27C1. A method as in clause 1C1 further comprising:
arranging a plurality of super cells in two or more parallel rows on the same backing to form a solar module front surface, wherein the backing sheet is white and comprises darkened stripes of location and width corresponding to gaps between super cells.

28C1. A method as in clause 1C1 further comprising connecting at least one pair of cell strings to a power management system.

29C1. A method as in clause 1C1 further comprising:
electrically connecting a power management device with the super cell;
causing the power management device to receive a voltage output of the super cell;
based upon the voltage, causing the power management device to determine if a solar cell is in reverse bias; and
causing the power management device to disconnect the solar cell in reverse bias from a super cell module circuit 30C1. A method as in clause 1C1 wherein the super cell is disposed on the backing to form a first module having a top conductive ribbon on first side facing a direction of solar energy, the method further comprising:
disposing another super cell on another backing to form a second module having a bottom ribbon on a second side facing a direction away from the direction of the solar energy,
wherein the second module overlaps and is bonded to a portion of the first module including the top ribbon.

31C1. A method as in clause 30C1 wherein the second module is bonded to the first module by adhesive.

32C1. A method as in clause 30C1 wherein the second module is bonded to the first module by a mating arrangement.

33C1. A method as in clause 30C1 further comprising overlapping a junction box with the second module.

34C1. A method as in clause 33C1 wherein the second module is bonded to the first module by a mating arrangement.

35C1. A method as in clause 34C1 wherein the mating arrangement is between the junction box and another junction box on the second module.

36C1. A method as in clause 30C1 wherein the backing comprises glass.

37C1. A method as in clause 30C1 wherein the backing comprises other than glass.

38C1. A method as in clause 30C1 further comprising:
electrically connecting a relay switch in series between the first module and the second module;
sensing an output voltage of the first module by a controller; and
activating the relay switch with the controller where the output voltage falls below a limit.

39C1. A method as in clause 1C1 wherein the solar cell comprises a chamfered portion cut from a larger piece.

40C1. A method as in clause 39C1 wherein forming the super cell comprises placing a long side of the solar cell in electrical contact with a long side of similar length of another solar cell having a chamfered portion.

1C2. An apparatus comprising:
a solar module comprising a front surface including a first series connected string of at least 19 solar cells grouped into a first super cell arranged with long sides of adjacent solar cells overlapping and conductively bonded with an adhesive; and
a ribbon conductor electrically connected to a rear surface contact of the first super cell to provide a hidden tap to an electrical component.

2C2. An apparatus as in clause 1C2 wherein the electrical component comprises a bypass diode.

3C2. An apparatus as in clause 2C2 wherein the bypass diode is located on a rear surface of the solar module.

4C2. An apparatus as in clause 3C2 wherein the bypass diode is located outside of a junction box.

5C2. An apparatus as in clause 4C2 wherein the junction box comprises a single terminal.

6C2. An apparatus as in clause 3C2 wherein the bypass diode is positioned near an edge of the solar module.

7C2. An apparatus as in clause 2C2 wherein bypass diode is positioned in a laminate structure.

8C2. An apparatus as in clause 7C2 wherein the first super cell is encapsulated within the laminate structure.

9C2. An apparatus as in clause 2C2 wherein the bypass diode is positioned around a perimeter of the solar module.

10C2. An apparatus as in clause 1C2 wherein the electrical component comprises a module terminal, a junction box, a power management system, a smart switch, a relay, a voltage sensing controller, a central inverter, a DC/AC micro-inverter, or a DC/DC module power optimizer.

11C2. An apparatus as in clause 1C1 wherein the electrical component is located on a rear surface of the solar module.

12C2. An apparatus as in clause 1C1 wherein the solar module further comprises a second series connected string of at least 19 solar cells grouped into a second super cell having a first end electrically connected in series to the first super cell.

13C2. An apparatus as in clause 12C2 wherein the second super cell is overlapping and electrically connected in series to the first super cell with conductive adhesive.

14C2. An apparatus as in clause 12C2 wherein the rear surface contact is located away from the first end.

15C2. An apparatus as in clause 12C2 further comprising a flexible interconnect between the first end and the first super cell.

16C2. An apparatus as in clause 15C2 wherein the flexible interconnect extends beyond side edges of the first and second super cells to electrically connect the first and second super cells in parallel with another super cell.

17C2. An apparatus as in clause 1C2 wherein the adhesive has a thickness less than or equal to about 0.1 mm, and has a thermal conductivity greater than or equal to about 1.5 w/m/k.

18C2. An apparatus as in clause 1C2 wherein the solar cells are silicon solar cells having a breakdown voltage greater than about 10V.

19C2. An apparatus as in clause 1C2 wherein the first super cell has a length in a direction of current flow of at least about 500 mm.

20C2. An apparatus as in clause 1C2 wherein a solar cell of the first super cell comprises a feature configured to confine spreading of the adhesive.

21C2. An apparatus as in clause 20C2 wherein the feature comprises a raised feature.

22C2. An apparatus as in clause 21C2 wherein the feature comprises metallization.

23C2. An apparatus as in clause 22C2 wherein the metallization comprises a conductive line running a full length of the first long side, the apparatus further comprising at least one contact pad located between the line and the first long side.

24C2. An apparatus as in clause 23C2 wherein:
the metallization further comprises fingers electrically connected to the at least one contact pad and running perpendicularly to the first long side; and
the conductive line interconnects the fingers.

25C2. An apparatus as in clause 20C2 wherein the feature is on a front side of the solar cell.

26C2. An apparatus as in clause 20C2 wherein the feature is on a back side of the solar cell.

27C2. An apparatus as in clause 20C2 wherein the feature comprises a recessed feature.

28C2. An apparatus as in clause 20C2 wherein the feature is hidden by an adjacent solar cell of the first super cell.

29C2. An apparatus as in clause 1C2 wherein a solar cell of the first super cell comprises a chamfered portion.

30C2. An apparatus as in clause 29C2 wherein the first super cell further comprises another solar cell having a chamfered portion, and wherein a long side of the solar cell is in electrical contact with a long side of the other solar cell that has a similar length.

31C2. An apparatus as in clause 29C2 wherein the first super cell further comprises another solar cell lacking chamfered corners, and the solar cell and the other solar cell have a same area exposed to light.

32C2. An apparatus as in clause 1C2 wherein:
the first super cell is arranged with a second super cell in parallel rows on a backing sheet front surface; and
the backing sheet is white and comprises darkened stripes of location and width corresponding to gaps between the first super cell and the second super cell.

33C2. An apparatus as in clause 1C2 wherein the first super cell comprises at least one pair of cell strings connected to a power management system.

34C2. An apparatus as in clause 1C2 further comprising a power management device in electrical communication with the first super cell and configured to,
receive a voltage output of the first super cell;
based upon the voltage, determine if a solar cell of the first super cell is in reverse bias; and
disconnect the solar cell in reverse bias from a super cell module circuit.

35C2. An apparatus as in clause 34C2 wherein the power management device comprises a relay.

36C2. An apparatus as in clause 1C2 wherein the first super cell is disposed on a first backing to form the module having a top conductive ribbon on first side facing a direction of solar energy, the apparatus further comprising:
another super cell disposed on a second backing to form a different module having a bottom ribbon on a second side facing a direction away from the direction of the solar energy,
wherein the different module overlaps and is bonded to a portion of the module including the top ribbon.

37C2. An apparatus as in clause 36C2 wherein the different module is bonded to the module by adhesive.

38C2. An apparatus as in clause 36C2 wherein the different module is bonded to the module by a mating arrangement.

39C2. An apparatus as in clause 36C2 further comprising a junction box overlapped by the different module.

40C2. An apparatus as in clause 39C2 wherein the different module is bonded to the module by a mating arrangement between the junction box and another junction box on a different solar module.

1C3. An apparatus comprising:
a first super cell disposed on a solar module front surface and comprising a plurality of solar cells, each having a breakdown voltage of greater than about 10V;
a first ribbon conductor electrically connected with a rear surface contact of the first super cell to provide a first hidden tap to an electrical component;
a second super cell disposed on the solar module front surface and comprising a plurality of solar cells, each having a breakdown voltage of greater than about 10V; and
a second ribbon conductor electrically connected with a rear surface contact of the second super cell to provide a second hidden tap.

2C3. An apparatus as in clause 1C3 wherein the electrical component comprises a bypass diode.

3C3. An apparatus as in clause 2C3 wherein the bypass diode is located on a solar module rear surface.

4C3. An apparatus as in clause 3C3 wherein the bypass diode is located outside of a junction box.

5C3. An apparatus as in clause 4C3 wherein the junction box comprises a single terminal.

6C3. An apparatus as in clause 3C3 wherein the bypass diode is positioned near a solar module edge.

7C3. An apparatus as in clause 2C3 wherein the bypass diode is positioned in a laminate structure.

8C3. An apparatus as in clause 7C3 wherein the first super cell is encapsulated within the laminate structure.

9C3. An apparatus as in clause 8C3 wherein the bypass diode is positioned around a solar module perimeter.

10C3. An apparatus as in clause 1C3 wherein the first super cell is connected in series with the second super cell.

11C3. An apparatus as in clause 10C3 wherein:
the first super cell and the second super cell form a first pair; and
the apparatus further comprises two additional super cells in a second pair connected in parallel with the first pair.

12C3. An apparatus as in clause 10C3 wherein the second hidden tap is connected to the electrical component.

13C3. An apparatus as in clause 12C3 wherein the electrical component comprises a bypass diode.

14C3. An apparatus as in clause 13C3 wherein the first super cell comprises not fewer than 19 solar cells.

15C3. An apparatus as in clause 12C3 wherein the electrical component comprises a power management system.

16C3. An apparatus as in clause 1C3 wherein the electrical component comprises a switch.

17C3. An apparatus as in clause 16C3 further comprising a voltage sensing controller in communication with the switch.

18C3. An apparatus as in clause 16C3 wherein the switch is in communication with a central inverter.

19C3. An apparatus as in clause 1C3 wherein the electrical component comprises a power management device configured to,
receive a voltage output of the first super cell;
based upon the voltage, determine if a solar cell of the first super cell is in reverse bias; and
disconnect the solar cell in reverse bias from a super cell module circuit.

20C3. An apparatus as in clause 1 wherein the electrical component comprises an inverter.

21C3. An apparatus as in clause 20C3 wherein the inverter comprises a DC/AC micro-inverter.

22C3. An apparatus as in clause 1C3 wherein the electrical component comprises a solar module terminal.

23C3. An apparatus as in clause 22C3 wherein the solar module terminal is a single solar module terminal within a junction box.

24C3. An apparatus as in clause 1C3 wherein the electrical component is located on a solar module rear surface.

25C3. An apparatus as in clause 1C3 wherein the rear surface contact is located away from an end of the first super cell overlapping the second super cell.

26C3. An apparatus as in clause 1C3 wherein the first super cell has a length in a direction of current flow of at least about 500 mm.

27C3. An apparatus as in clause 1C3 wherein a solar cell of the first super cell comprises a feature configured to confine spreading of the adhesive.

28C3. An apparatus as in clause 27C3 wherein the feature comprises a raised feature.

29C3. An apparatus as in clause 28C3 wherein the feature comprises metallization.

30C3. An apparatus as in clause 27C3 wherein the feature comprises a recessed feature.

31C3. An apparatus as in clause 27C3 wherein the feature is on a back side of the solar cell.

32C3. An apparatus as in clause 27C3 wherein the feature is hidden by an adjacent solar cell of the first super cell.

33C3. An apparatus as in clause 1C3 wherein a solar cell of the first super cell comprises a chamfered portion.

34C3. An apparatus as in clause 33C3 wherein the first super cell further comprises another solar cell having a chamfered portion, and wherein a long side of the solar cell is in electrical contact with a long side of the other solar cell that has a similar length.

35C3. An apparatus as in clause 33C3 wherein the first super cell further comprises another solar cell lacking chamfered corners, and the solar cell and the other solar cell have a same area exposed to light.

36C3. An apparatus as in clause 1C3 wherein:
the first super cell is arranged with the second super cell in parallel rows on a backing sheet front surface; and
the backing sheet is white and comprises darkened stripes of location and width corresponding to gaps between the first super cell and the second super cell.

37C3. An apparatus as in clause 1C3 wherein the first super cell is disposed on a first backing to form a module having a top conductive ribbon on the module front surface facing a direction of solar energy, the apparatus further comprising:
a third super cell disposed on a second backing to form a different module having a bottom ribbon on a second side facing a direction away from the direction of the solar energy,
wherein the different module overlaps and is bonded to a portion of the module including the top ribbon.

38C3. An apparatus as in clause 37C3 wherein the different module is bonded to the module by adhesive.

39C3. An apparatus as in clause 37C3 further comprising a junction box overlapped by the different module.

40C3. An apparatus as in clause 39C3 wherein the different module is bonded to the module by a mating arrangement between the junction box and another junction box on the different module.

1C4. An apparatus comprising:
a solar module comprising a front surface including a first series connected string of solar cells grouped into a first super cell arranged with sides of adjacent solar cells overlapping and conductively bonded with an adhesive; and
a solar cell surface feature configured to confine the adhesive.

2C4. An apparatus as in clause 1C4 wherein the solar cell surface feature comprises a recessed feature.

3C4. An apparatus as in clause 1C4 wherein the solar cell surface feature comprises a raised feature.

4C4. An apparatus as in clause 3C4 wherein the raised feature is on a front surface of a solar cell.

5C4. An apparatus as in clause 4C4 wherein the raised feature comprises a metallization pattern.

6C4. An apparatus as in clause 5C4 wherein the metallization pattern comprises a conductive line running parallel to and substantially along a long side of the solar cell.

7C4. An apparatus as in clause 6C4 further comprising a contact pad between the conductive line and the long side.

8C4. An apparatus as in clause 7C4 wherein:
the metallization pattern further comprises a plurality of fingers; and
the conductive line electrically interconnects the fingers to provide multiple conductive paths from each finger to the contact pad.

9C4. An apparatus as in clause 7C4 further comprising a plurality of discrete contact pads arranged in a row adjacent to and parallel to the long side, the metallization pattern forming a plurality of separate barriers to confine the adhesive to the discrete contact pads.

10C4. An apparatus as in clause 8C4 wherein the plurality of separate barriers abut corresponding discrete contact pads.

11C4. An apparatus as in clause 8C4 wherein the plurality of separate barriers are taller than corresponding discrete contact pads.

12C4. An apparatus as in clause 1C4 wherein the solar cell surface feature is hidden by an overlapping side of another solar cell.

13C4. An apparatus as in clause 12C4 wherein the other solar cell is part of the super cell.

14C4. An apparatus as in clause 12C4 wherein the other solar cell is part of another super cell.

15C4. An apparatus as in clause 3C4 wherein the raised feature is on a back surface of a solar cell.

16C4. An apparatus as in clause 15C4 wherein the raised feature comprises a metallization pattern.

17C4. An apparatus as in clause 16C4 wherein the metallization pattern forms a plurality of separate barriers to confine the adhesive to a plurality of discrete contact pads located on a front surface of another solar cell overlapped by the solar cell.

18C4. An apparatus as in clause 17C4 wherein the plurality of separate barriers abut corresponding discrete contact pads.

19C4. An apparatus as in clause 17C4 wherein the plurality of separate barriers are taller than corresponding discrete contact pads.

20C4. An apparatus as in clause 1C1 wherein each solar cell of the super cell has a breakdown voltage of 10V or greater.

21C4. An apparatus as in clause 1C1 wherein the super cell has a length in a direction of current flow of at least about 500 mm.

22C4. An apparatus as in clause 1C1 wherein a solar cell of the super cell comprises a chamfered portion.

23C4. An apparatus as in clause 22C4 wherein the super cell further comprises another solar cell having a chamfered portion, and wherein a long side of the solar cell is in electrical contact with a long side of the other solar cell that has a similar length.

24C4. An apparatus as in clause 22C4 wherein the super cell further comprises another solar cell lacking chamfered corners, and the solar cell and the other solar cell have a same area exposed to light.

25C4. An apparatus as in clause 1C4 wherein the super cell is arranged with a second super cell on a first backing sheet front surface to form a first module.

26C4. An apparatus as in clause 25C4 wherein the backing sheet is white and comprises darkened stripes of location and width corresponding to gaps between the super cell and the second super cell.

27C4. An apparatus as in clause 25C4 wherein the first module has a top conductive ribbon on a first module front surface facing a direction of solar energy, the apparatus further comprising:
a third super cell disposed on a second backing to form a second module having a bottom ribbon on a second module side facing away from the solar energy, and
wherein the second module overlaps and is bonded to a portion of the first module including the top ribbon.

28C4. An apparatus as in clause 27C4 wherein the second module is bonded to the first module by adhesive.

29C4. An apparatus as in clause 27C4 further comprising a junction box overlapped by the second module.

30C4. An apparatus as in clause 29C4 wherein the second module is bonded to the first module by ca mating arrangement between the junction box and another junction box on the second module.

31C4. An apparatus as in clause 29C4 wherein the junction box houses a single module terminal.

32C4. An apparatus as in clause 27C4 further comprising a switch between the first module and the second module.

33C4. An apparatus as in clause 32C4 further comprising a voltage sensing controller in communication with the switch.

34C4. An apparatus as in clause 27C4 wherein the super cell comprises not fewer than nineteen solar cells individually electrically connected in parallel with a single bypass diode.

35C4. An apparatus as in clause 34C4 wherein the single bypass diode is positioned near a first module edge.

36C4. An apparatus as in clause 34C4 wherein the single bypass diode is positioned in a laminate structure.

37C4. An apparatus as in clause 36C4 wherein the super cell is encapsulated within the laminate structure.

38C4. An apparatus as in clause 34C4 wherein the single bypass diode is positioned around a first module perimeter.

39C4. An apparatus as in clause 25C4 wherein the super cell and the second super cell comprise a pair individually connected to a power management device.

40C4. An apparatus as in clause 25C4 further comprising a power management device configured to,
receive a voltage output of the super cell;
based upon the voltage, determine if a solar cell of the super cell is in reverse bias; and
disconnect the solar cell in reverse bias from a super cell module circuit.

1C5. An apparatus comprising:
a solar module comprising a front surface including a first series connected string of silicon solar cells grouped into a first super cell comprising a first silicon solar cell having chamfered corners and arranged with a side overlapping and conductively bonded with an adhesive to a second silicon solar cell.

2C5. An apparatus as in clause 1C5 wherein the second silicon solar cell lacks chamfered corners, each silicon solar cell of the first super cell having substantially a same front surface area exposed to light.

3C5. An apparatus as in clause 2C5 wherein:
the first silicon solar cell and the second silicon solar cell have a same length; and
a width of the first silicon solar cell is greater than a width of the second silicon solar cell.

4C5. An apparatus as in clause 3C5 wherein the length reproduces a shape of a pseudo-square wafer.

5C5. An apparatus as in clause 3C5 wherein the length is 156 mm.

6C5. An apparatus as in clause 3C5 wherein the length is 125 mm.

7C5. An apparatus as in clause 3C5 wherein an aspect ratio between the width and the length of the first solar cell is between about 1:2 to about 1:20.

8C5. An apparatus as in clause 3C5 wherein the first silicon solar cell overlaps the second silicon solar cell by between about 1 mm to about 5 mm.

9C5. An apparatus as in clause 3C5 wherein the first super cell comprises at least nineteen silicon solar cells each having a breakdown voltage greater than about 10 volts.

10C5. An apparatus as in clause 3C5 wherein the first super cell has a length in a direction of current flow of at least about 500 mm.

11C5. An apparatus as in clause 3C5 wherein:
the first super cell is connected in parallel with a second super cell on the front surface; and
the front surface comprises a white backing featuring darkened stripes of location and width corresponding to gaps between the first super cell and the second super cell.

12C5. An apparatus as in clause 1C5 wherein the second silicon solar cell includes chamfered corners.

13C5. An apparatus as in clause 12C5 wherein a long side of the first silicon solar cell overlaps a long side of the second silicon solar cell.

14C5. An apparatus as in clause 12C5 wherein a long side of the first silicon solar cell overlaps a short side of the second silicon solar cell.

15C5. An apparatus as in clause 1C5 wherein the front surface comprises:
a first row comprising the first super cell consisting of solar cells with chamfered corners; and
a second row comprising a second series connected string of silicon solar cells grouped into a second super cell connected in parallel with the first super cell and consisting of solar cells lacking chamfered corners, a length of the second row substantially a same as a length of the first row.

16C5. An apparatus as in clause 15C5 wherein the first row is adjacent to a module edge and the second row is not adjacent to the module edge.

17C5. An apparatus as in clause 15C5 wherein the first super cell comprises at least nineteen solar cells each having a breakdown voltage greater than about 10 volts, and the first super cell has a length in a direction of current flow of at least about 500 mm.

18C5. An apparatus as in clause 15C5 wherein the front surface comprises a white backing featuring darkened stripes of location and width corresponding to gaps between the first super cell and the second super cell.

19C5. An apparatus as in clause 1C5 further comprising a metallization pattern on a front side of the second solar cell.

20C5. An apparatus as in clause 19C5 wherein the metallization pattern comprises a tapered portion extending around a chamfered corner.

21C5. An apparatus as in clause 19C5 wherein the metallization pattern comprises a raised feature to confine spreading of the adhesive.

22C5. An apparatus as in clause 19C5 wherein the metallization pattern comprises:
a plurality of discrete contact pads;
fingers electrically connected to the a plurality of discrete contact pads; and
a conductive line interconnecting the fingers.

23C5. An apparatus as in clause 22C5 wherein the metallization pattern forms a plurality of separate barriers to confine the adhesive to the discrete contact pads.

24C5. An apparatus as in clause 23C5 wherein the plurality of separate barriers abut and are taller than corresponding discrete contact pads.

25C5. An apparatus as in clause 1C5 further comprising a flexible electrical interconnect conductively bonded to a surface of the first solar cell and accommodating thermal expansion of the first solar cell in two dimensions.

26C5. An apparatus as in clause 25C5 wherein a first portion of the interconnect folds around an edge of the first super cell such that a remaining second interconnect portion is on a backside of the first super cell.

27C5. An apparatus as in clause 1C5 wherein the module has a top conductive ribbon on the front surface facing a direction of solar energy, the apparatus further comprising:
another module having a second super cell disposed on a front surface, a bottom ribbon on the other module facing away from the solar energy, and
wherein the second module overlaps and is bonded to a portion of the first module including the top ribbon.

28C5. An apparatus as in clause 27C5 wherein the other module is bonded to the module by adhesive.

29C5. An apparatus as in clause 27C5 further comprising a junction box overlapped by the other module.

30C5. An apparatus as in clause 29C5 wherein the other module is bonded to the module by a mating arrangement between the junction box and another junction box on the other module.

31C5. An apparatus as in clause 29C5 wherein the junction box houses a single module terminal.

32C5. An apparatus as in clause 27C5 further comprising a switch between the module and the other module.

33C5. An apparatus as in clause 32C5 further comprising a voltage sensing controller in communication with the switch.

34C5. An apparatus as in clause 27C5 wherein the first super cell comprises not fewer than nineteen solar cells electrically connected with a single bypass diode.

35C5. An apparatus as in clause 34C5 wherein the single bypass diode is positioned near a first module edge.

36C5. An apparatus as in clause 34C5 wherein the single bypass diode is positioned in a laminate structure.

37C5. An apparatus as in clause 36C5 wherein the super cell is encapsulated within the laminate structure.

38C5. An apparatus as in clause 34C5 wherein the single bypass diode is positioned around a first module perimeter.

39C5. An apparatus as in clause 27C5 wherein the first super cell and the second super cell comprise a pair connected to a power management device.

40C5. An apparatus as in clause 27C5 further comprising a power management device configured to,
receive a voltage output of the first super cell;
based upon the voltage, determine if a solar cell of the first super cell is in reverse bias; and
disconnect the solar cell in reverse bias from a super cell module circuit.

1C6. An apparatus comprising:
a solar module comprising a front surface including a first series connected string of silicon solar cells grouped into a first super cell comprising a first silicon solar cell having chamfered corners and arranged with a side overlapping and conductively bonded with an adhesive to a second silicon solar cell.

2C6. An apparatus as in clause 1O6 wherein the second silicon solar cell lacks chamfered corners, each silicon solar cell of the first super cell having substantially a same front surface area exposed to light.

3C6. An apparatus as in clause 2C6 wherein:
the first silicon solar cell and the second silicon solar cell have a same length; and
a width of the first silicon solar cell is greater than a width of the second silicon solar cell.

4C6. An apparatus as in clause 3C6 wherein the length reproduces a shape of a pseudo-square wafer.

5C6. An apparatus as in clause 3C6 wherein the length is 156 mm.

6C6. An apparatus as in clause 3C6 wherein the length is 125 mm.

7C6. An apparatus as in clause 3C6 wherein an aspect ratio between the width and the length of the first solar cell is between about 1:2 to about 1:20.

8C6. An apparatus as in clause 3C6 wherein the first silicon solar cell overlaps the second silicon solar cell by between about 1 mm to about 5 mm.

9C6. An apparatus as in clause 3C6 wherein the first super cell comprises at least nineteen silicon solar cells each having a breakdown voltage greater than about 10 volts.

10C6. An apparatus as in clause 3C6 wherein the first super cell has a length in a direction of current flow of at least about 500 mm.

11C6. An apparatus as in clause 3C6 wherein:
the first super cell is connected in parallel with a second super cell on the front surface; and the front surface comprises a white backing featuring darkened stripes of location and width corresponding to gaps between the first super cell and the second super cell.

12C6. An apparatus as in clause 106 wherein the second silicon solar cell includes chamfered corners.

13C6. An apparatus as in clause 12C6 wherein a long side of the first silicon solar cell overlaps a long side of the second silicon solar cell.

14C6. An apparatus as in clause 12C6 wherein a long side of the first silicon solar cell overlaps a short side of the second silicon solar cell.

15C6. An apparatus as in clause 106 wherein the front surface comprises:
a first row comprising the first super cell consisting of solar cells with chamfered corners; and
a second row comprising a second series connected string of silicon solar cells grouped into a second super cell connected in parallel with the first super cell and consisting of solar cells lacking chamfered corners, a length of the second row substantially a same as a length of the first row.

16C6. An apparatus as in clause 15C6 wherein the first row is adjacent to a module edge and the second row is not adjacent to the module edge.

17C6. An apparatus as in clause 15C6 wherein the first super cell comprises at least nineteen solar cells each having a breakdown voltage greater than about 10 volts, and the first super cell has a length in a direction of current flow of at least about 500 mm.

18C6. An apparatus as in clause 15C6 wherein the front surface comprises a white backing featuring darkened stripes of location and width corresponding to gaps between the first super cell and the second super cell.

19C6. An apparatus as in clause 106 further comprising a metallization pattern on a front side of the second solar cell.

20C6. An apparatus as in clause 19C6 wherein the metallization pattern comprises a tapered portion extending around a chamfered corner.

21C6. An apparatus as in clause 19C6 wherein the metallization pattern comprises a raised feature to confine spreading of the adhesive.

22C6. An apparatus as in clause 19C6 wherein the metallization pattern comprises:
a plurality of discrete contact pads;
fingers electrically connected to the a plurality of discrete contact pads; and
a conductive line interconnecting the fingers.

23C6. An apparatus as in clause 22C6 wherein the metallization pattern forms a plurality of separate barriers to confine the adhesive to the discrete contact pads.

24C6. An apparatus as in clause 23C6 wherein the plurality of separate barriers abut and are taller than corresponding discrete contact pads.

25C6. An apparatus as in clause 106 further comprising a flexible electrical interconnect conductively bonded to a surface of the first solar cell and accommodating thermal expansion of the first solar cell in two dimensions.

26C6. An apparatus as in clause 25C6 wherein a first portion of the interconnect folds around an edge of the first super cell such that a remaining second interconnect portion is on a backside of the first super cell.

27C6. An apparatus as in clause 106 wherein the module has a top conductive ribbon on the front surface facing a direction of solar energy, the apparatus further comprising:
another module having a second super cell disposed on a front surface, a bottom ribbon on the other module facing away from the solar energy, and
wherein the second module overlaps and is bonded to a portion of the first module including the top ribbon.

28C6. An apparatus as in clause 27C6 wherein the other module is bonded to the module by adhesive.

29C6. An apparatus as in clause 27C6 further comprising a junction box overlapped by the other module.

30C6. An apparatus as in clause 29C6 wherein the other module is bonded to the module by a mating arrangement between the junction box and another junction box on the other module.

31C6. An apparatus as in clause 29C6 wherein the junction box houses a single module terminal.

32C6. An apparatus as in clause 27C6 further comprising a switch between the module and the other module.

33C6. An apparatus as in clause 32C6 further comprising a voltage sensing controller in communication with the switch.

34C6. An apparatus as in clause 27C6 wherein the first super cell comprises not fewer than nineteen solar cells electrically connected with a single bypass diode.

35C6. An apparatus as in clause 34C6 wherein the single bypass diode is positioned near a first module edge.

36C6. An apparatus as in clause 34C6 wherein the single bypass diode is positioned in a laminate structure.

37C6. An apparatus as in clause 36C6 wherein the super cell is encapsulated within the laminate structure.

38C6. An apparatus as in clause 34C6 wherein the single bypass diode is positioned around a first module perimeter.

39C6. An apparatus as in clause 27C6 wherein the first super cell and the second super cell comprise a pair connected to a power management device.

40C6. An apparatus as in clause 27C6 further comprising a power management device configured to,
receive a voltage output of the first super cell;
based upon the voltage, determine if a solar cell of the first super cell is in reverse bias; and
disconnect the solar cell in reverse bias from a super cell module circuit.

1C7. An apparatus comprising:
a solar module comprising a front surface including a first series connected string of at least nineteen solar cells each having a breakdown voltage greater than about 10V, and grouped into a super cell comprising a first silicon solar cell arranged with an end overlapping and conductively bonded with an adhesive to a second silicon solar cell; and
an interconnect conductively bonded to a solar cell surface.

2C7. An apparatus as in clause 1C7 wherein the solar cell surface comprises a back of the first silicon solar cell.

3C7. An apparatus as in clause 2C7 further comprising a ribbon conductor electrically connecting the super cell to an electrical component.

4C7. An apparatus as in clause 3C7 wherein the ribbon conductor is conductively bonded to the solar cell surface away from the overlapping end.

5C7. An apparatus as in clause 4C7 wherein the electrical component is on a solar module rear surface.

6C7. An apparatus as in clause 4C7 wherein the electrical component comprises a junction box.

7C7. An apparatus as in clause 6C7 wherein the junction box is in mating engagement with another junction box on a different module overlapped by the module.

8C7. An apparatus as in clause 4C7 wherein the electrical component comprises a bypass diode.

9C7. An apparatus as in clause 4C7 wherein the electrical component comprises a module terminal.

10C7. An apparatus as in clause 4C7 wherein the electrical component comprises an inverter.

11C7. An apparatus as in clause 10O7 wherein the inverter comprises a DC/AC micro-inverter.

12C7. An apparatus as in clause 11C7 wherein the DC/AC micro-inverter is on a solar module rear surface.

13C7. An apparatus as in clause 4C7 wherein the electrical component comprises a power management device.

14C7. An apparatus as in clause 13C7 wherein the power management device comprises a switch.

15C7. An apparatus as in clause 14C7 further comprising a voltage sensing controller in communication with the switch.

16C7. An apparatus as in clause 13C7 wherein the power management device is configured to,
receive a voltage output of the super cell;
based upon the voltage, determine if a solar cell of the super cell is in reverse bias; and
disconnect the solar cell in reverse bias from a super cell module circuit.

17C7. An apparatus as in clause 16C7 wherein the power management device is in electrical communication with a central inverter.

18C7. An apparatus as in clause 13C7 wherein the power management device comprises a DC/DC module power optimizer.

19C7. An apparatus as in clause 3C7 wherein the interconnect is sandwiched between the super cell and another super cell on the front surface.

20C7. An apparatus as in clause 3C7 wherein the ribbon conductor is conductively bonded to the interconnect.

21C7. An apparatus as in clause 3C7 wherein the interconnect provides a resistance to current flow of less than or equal to about 0.012 Ohms.

22C7. An apparatus as in clause 3C7 wherein the interconnect is configured to accommodate differential expansion between the first silicon solar cell and the interconnect for a temperature range of between about −40° C. to about 85° C.

23C7. An apparatus as in clause 3C7 wherein a thickness of the interconnect is less than or equal to about 100 microns.

24C7. An apparatus as in clause 3C7 wherein a thickness of the interconnect is less than or equal to about 30 microns.

25C7. An apparatus as in clause 3C7 wherein the super cell has a length in a direction of current flow of at least about 500 mm.

26C7. An apparatus as in clause 3C7 further comprising another super cell on the module front surface.

27C7. An apparatus as in clause 26C7 wherein the interconnect connects the other super cell in series with the super cell.

28C7. An apparatus as in clause 26C7 wherein the interconnect connects the other super cell in parallel with the super cell.

29C7. An apparatus as in clause 26C7 wherein the front surface comprises a white backing featuring darkened stripes of location and width corresponding to gaps between the super cell and the other super cell.

30C7. An apparatus as in clause 3C7 wherein the interconnect comprises a pattern.

31C7. An apparatus as in clause 30C7 wherein the pattern comprises slits, slots, and/or holes.

32C7. An apparatus as in clause 3C7 wherein a portion of the interconnect is dark.

33C7. An apparatus as in clause 3C7 wherein:
the first silicon solar cell includes chamfered corners;
the second silicon solar cell lacks chamfered corners; and
each silicon solar cell of the super cell has substantially a same front surface area exposed to light.

34C7. An apparatus as in clause 3C7 wherein:
the first silicon solar cell includes chamfered corners;
the second silicon solar cell includes chamfered corners; and
the side comprises a long side overlapping a long side of the second silicon solar cell.

35C7. An apparatus as in clause 3C7 wherein the interconnect forms a bus.

36C7. An apparatus as in clause 3C7 wherein the interconnect is conductively bonded to the solar cell surface at a glued joint.

37C7. An apparatus as in clause 3C7 wherein a first portion of the interconnect folds around an edge of the super cell such that a remaining second portion is located on a backside of the super cell.

38C7. An apparatus as in clause 3C7 further comprising a metallization pattern on the front surface and comprising a line running along a long side, the apparatus further comprising at plurality of discrete contact pads located between the line and the long side.

39C7. An apparatus as in clause 38C7 wherein:
the metallization further comprises fingers electrically connected to respective discrete contact pads and running perpendicularly to the long side; and
the conductive line interconnects the fingers.

40C7. An apparatus as in clause 38C7 wherein the metallization pattern comprises a raised feature to confine spreading of the adhesive.

1C8. An apparatus comprising:
a plurality of super cells arranged in rows on a solar module front surface, each super cell comprising at least nineteen silicon solar cells having a breakdown voltage of at least 10V arranged in line with end portions of adjacent silicon solar cells overlapping and conductively bonded to electrically connect the silicon solar cells in series;
wherein an end of a first super cell adjacent to a module edge in a first row is electrically connected to an end of a second super cell adjacent to the module edge in a second row via a flexible electrical interconnect bonded to the front surface of the first super cell.

2C8. An apparatus as in clause 1C8 wherein a portion of the flexible electrical interconnect is covered by a dark film.

3C8. An apparatus as in clause 2C8 wherein the solar module front surface comprises a backing sheet exhibiting reduced visual contrast with the flexible electrical interconnect.

4C98. An apparatus as in clause 1C8 wherein a portion of the flexible electrical interconnect is colored.

5C8. An apparatus as in clause 4C8 wherein the solar module front surface comprises a backing sheet exhibiting reduced visual contrast with the flexible electrical interconnect.

6C8. An apparatus as in clause 1C8 wherein the solar module front surface comprises a white backing sheet.

7C8. An apparatus as in clause 6C8 further comprising darkened stripes corresponding to gaps between the rows.

8C8. An apparatus as in clause 6C8 wherein an n-type semiconductor layer of the silicon solar cell faces the backing sheet.

9C8. An apparatus as in clause 1C8 wherein:
the solar module front surface comprises a backing sheet; and
the backing sheet, the flexible electrical interconnect, the first super cell, and an encapsulant comprise a laminated structure.

10C8. An apparatus as in clause 9C8 wherein the encapsulant comprises a thermoplastic polymer.

11C8. An apparatus as in clause 1008 wherein the thermoplastic polymer comprises a thermoplastic olefin polymer.

12C8. An apparatus as in clause 9C8 further comprising a front glass sheet.

13C8. An apparatus as in clause 12C8 wherein the backing sheet comprises glass.

14C8. An apparatus as in clause 1C8 wherein the flexible electrical interconnect is bonded at a plurality of discrete locations.

15C8. An apparatus as in clause 1C8 wherein the flexible electrical interconnect is bonded with an electrically conductive adhesive bonding material.

16C8. An apparatus as in clause 1C8 further comprising a glued joint.

17C8. An apparatus as in clause 1C8 wherein the flexible electrical interconnect runs parallel to the module edge.

18C8. An apparatus as in clause 1C8 wherein a portion of the flexible electrical interconnect folds around the first super cell and is hidden.

19C8. An apparatus as in clause 1C8 further comprising a ribbon conductor electrically connecting the first super cell to an electrical component.

20C8. An apparatus as in clause 19C8 wherein the ribbon conductor is conductively bonded to the flexible electrical interconnect.

21C8. An apparatus as in clause 19C8 wherein the ribbon conductor is conductively bonded to a solar cell surface away from an overlapping end.

22C8. An apparatus as in clause 19C8 wherein the electrical component is on a solar module rear surface.

23C8. An apparatus as in clause 19C8 wherein the electrical component comprises a junction box.

24C8. An apparatus as in clause 23C8 wherein the junction box is in mating engagement with another junction box on another solar module front surface.

25C8. An apparatus as in clause 23C8 wherein the junction box comprises a single-terminal junction box.

26C8. An apparatus as in clause 19C8 wherein the electrical component comprises a bypass diode.

27C8. An apparatus as in clause 19C8 wherein the electrical component comprises a switch.

28C8. An apparatus as in clause 27C8 further comprising a voltage sensing controller configured to,
receive a voltage output of the first super cell;
based upon the voltage, determine if a solar cell of the first super cell is in reverse bias; and
communicate with the switch to disconnect the solar cell in reverse bias from a super cell module circuit.

29C8. An apparatus as in clause 1C8 wherein the first super cell is in series with the second super cell.

30C8. An apparatus as in clause 1C8 wherein:
a first silicon solar cell of the first super cell includes chamfered corners;
a second silicon solar cell of the first super cell lacks chamfered corners; and
each silicon solar cell of the first super cell has substantially a same front surface area exposed to light.

31C8. An apparatus as in clause 1C8 wherein:
a first silicon solar cell of the first super cell includes chamfered corners;
a second silicon solar cell of the first super cell includes chamfered corners; and
a long side of the first silicon solar cell overlaps a long side of the second silicon solar cell.

32C8. An apparatus as in clause 1C8 wherein a silicon solar cell of the first super cell comprises a strip having a length of about 156 mm.

33C8. An apparatus as in clause 1C8 wherein a silicon solar cell of the first super cell comprises a strip having a length of about 125 mm.

34C8. An apparatus as in clause 1C8 wherein a silicon solar cell of the first super cell comprises a strip having an aspect ratio between a width and a length of between about 1:2 to about 1:20.

35C8. An apparatus as in clause 1C8 wherein the overlapping adjacent silicon solar cells of the first super cell are conductively bonded with adhesive, the apparatus further comprising a feature configured to confine spreading of the adhesive.

36C8. An apparatus as in clause 35C8 wherein the feature comprises a moat.

37C8. An apparatus as in clause 36C8 wherein the moat is formed by a metallization pattern.

38C8. An apparatus as in clause 37C8 wherein the metallization pattern comprises a line running along a long side of the silicon solar cell, the apparatus further comprising a plurality of discrete contact pads located between the line and the long side.

39C8. An apparatus as in clause 37C8 wherein the metallization pattern is located on a front of a silicon solar cell of the first super cell.

40C8. An apparatus as in clause 37C8 wherein the metallization pattern is located on a back of a silicon solar cell of the second super cell.

1C9. An apparatus comprising:
a solar module comprising a front surface including series connected silicon solar cells grouped into a first super cell comprising a first cut strip having a front side metallization pattern along a first outside edge overlapped by a second cut strip.

2C9. An apparatus as in clause 1C9 wherein the first cut strip and the second cut strip have a length reproducing a shape of a wafer from which the first cut strip is divided.

3C9. An apparatus as in clause 2C9 wherein the length is 156 mm.

4C9. An apparatus as in clause 2C9 wherein the length is 125 mm.

5C9. An apparatus as in clause 2C9 wherein an aspect ratio between a width of the first cut strip and the length is between about 1:2 to about 1:20.

6C9. An apparatus as in clause 2C9 wherein the first cut strip includes a first chamfered corner.

7C9. An apparatus as in clause 6C9 wherein the first chamfered corner is along the first outside edge.

8C9. An apparatus as in clause 6C9 wherein the first chamfered corner is not along the first outside edge.

9C9. An apparatus as in clause 6C9 wherein the second cut strip includes a second chamfered corner.

10C9. An apparatus as in clause 9C9 wherein an overlapping edge of the second cut strip includes the second chamfered corner.

11C9. An apparatus as in clause 9C9 wherein an overlapping edge of the second cut strip does not include the second chamfered corner.

12C9. An apparatus as in clause 6C9 wherein the length reproduces a shape of a pseudo-square wafer from which the first cut strip is divided.

13C9. An apparatus as in clause 6C9 wherein a width of the first cut strip is different from a width of the second cut strip such that the first cut strip and the second cut strip have approximately a same area.

14C9. An apparatus as in clause 1C9 wherein the second cut strip overlaps the first cut strip by between about 1-5 mm.

15C9. An apparatus as in clause 1C9 wherein the front side metallization pattern comprises a bus bar.

16C9. An apparatus as in clause 15C9 wherein bus bar includes a tapered portion.

17C9. An apparatus as in clause 1C9 wherein the front side metallization pattern comprises a discrete contact pad.

18C9. An apparatus as in clause 17C9 wherein:
second cut strip is bonded to the first cut strip by adhesive; and
the discrete contact pad further comprises a feature to confine adhesive spreading.

19C9. An apparatus as in clause 18C9 wherein the feature comprises a moat.

20C9. An apparatus as in clause 1C9 wherein the front side metallization pattern comprises a bypass conductor.

21C9. An apparatus as in clause 1C9 wherein the front side metallization pattern comprises a finger.

22C9. An apparatus as in clause 1C9 wherein the first cut strip further comprises a rear side metallization pattern along a second outside edge opposite to the first outside edge.

23C9. An apparatus as in clause 22C9 wherein the rear side metallization pattern comprises a contact pad.

24C9. An apparatus as in clause 22C9 wherein the rear side metallization pattern comprises a bus bar.

25C9. An apparatus as in clause 1C9 wherein the super cell comprises at least nineteen silicon cut strips each having a breakdown voltage greater than about 10 volts.

26C9. An apparatus as in clause 1C9 wherein the super cell is connected with another super cell on the module front surface.

27C9. An apparatus as in clause 26C9 wherein the module front surface comprises a white backing featuring darkened stripes corresponding to gaps between the super cell and the other super cell.

28C9. An apparatus as in clause 26C9 wherein:
the solar module front surface comprises a backing sheet; and
the backing sheet, the interconnect, the super cell, and an encapsulant comprise a laminated structure.

29C9. An apparatus as in clause 28C9 wherein the encapsulant comprises a thermoplastic polymer.

30C9. An apparatus as in clause 29C9 wherein the thermoplastic polymer comprises a thermoplastic olefin polymer.

31C9. An apparatus as in clause 26C9 further comprising an interconnect between the super cell and the other super cell.

32C9. An apparatus as in clause 31C9 wherein a portion of the interconnect is covered by a dark film.

33C9. An apparatus as in clause 31C9 wherein a portion of the interconnect is colored.

34C9. An apparatus as in clause 31C9 further comprising a ribbon conductor electrically connecting the super cell to an electrical component.

35C9. An apparatus as in clause 34C9 wherein the ribbon conductor is conductively bonded to a rear side of the first cut strip.

36C9. An apparatus as in clause 34C9 wherein the electrical component comprises a bypass diode.

37C9. An apparatus as in clause 34C9 wherein the electrical component comprises a switch.

38C9. An apparatus as in clause 34C9 wherein the electrical component comprises a junction box.

39C9. An apparatus as in clause 38C9 wherein the junction box overlaps and is in mating arrangement with another junction box.

40C9. An apparatus as in clause 26C9 wherein the super cell and the other super cell are connected in series.

1C10. A method comprising:
laser scribing a scribe line on a silicon wafer to define a solar cell region;
applying an electrically conductive adhesive bonding material to a top surface of the scribed silicon wafer adjacent to a long side of the solar cell region; and
separating the silicon wafer along the scribe line to provide a solar cell strip comprising a portion of the electrically conductive adhesive bonding material disposed adjacent to a long side of the solar cell strip.

2C10. A method as in clause 1C10 further comprising providing the silicon wafer with a metallization pattern, such that the separating produces the solar cell strip having the metallization pattern along the long side.

3C10. A method as in clause 2C10 wherein the metallization pattern comprises a bus bar or a discrete contact pad.

4C10. A method as in clause 2C10 wherein the providing comprises printing the metallization pattern.

5C10. A method as in clause 2C10 wherein the providing comprises electroplating the metallization pattern.

6C10. A method as in clause 2C10 wherein the metallization pattern comprises a feature configured to confine spreading of the electrically conductive adhesive bonding material.

7C10. An apparatus as in clause 6C10 wherein the feature comprises a moat.

8C10. A method as in clause 1C10 wherein the applying comprises printing.

9C10. A method as in clause 1C10 wherein the applying comprises depositing using a mask.

10C10. A method as in clause 1C10 wherein a length of the long side of the solar cell strip reproduces a shape of the wafer.

11C10. A method as in clause 1C10 wherein the length is 156 mm or 125 mm.

12C10. A method as in clause 10C10 wherein an aspect ratio between a width of the solar cell strip and the length is between about 1:2 to about 1:20.

13C10. A method as in clause 1C10 wherein the separating comprises:
applying a vacuum between a bottom surface of the wafer and a curved supporting surface to flex the solar cell region against the curved supporting surface and thereby cleave the silicon wafer along the scribe line.

14C10. A method as in clause 1C10 further comprising:
arranging a plurality of solar cell strips in line with long sides of adjacent solar cell strips overlapping and a portion of the electrically conductive adhesive bonding material disposed in between; and
curing the electrically conductive bonding material, thereby bonding adjacent overlapping solar cell strips to each other and electrically connecting them in series.

15C10. A method as in clause 14C10 wherein the curing comprises the application of heat.

16C10. A method as in clause 14C10 wherein the curing comprises the application of pressure.

17C10. A method as in clause 14C10 wherein the arranging comprises forming a layered structure.

18C10. A method as in clause 17C10 wherein the curing comprises the application of heat and pressure to the layered structure.

19C10. A method as in clause 17C10 wherein the layered structure comprises an encapsulant.

20C10. A method as in clause 19C10 wherein the encapsulant comprises a thermoplastic polymer.

21C10. A method as in clause 20C10 wherein the thermoplastic polymer comprises a thermoplastic olefin polymer.

22C10. A method as in clause 17C10 wherein the layered structure comprises a backing sheet.

23C10. A method as in clause 22C10 wherein:
the backing sheet is white; and
the layered structure further comprises darkened stripes.

24C10. A method as in clause 14C10 wherein the arranging comprises arranging at least nineteen solar cell strips in line.

25C10. A method as in clause 24C10 wherein each of the at least nineteen solar cell strips has a breakdown voltage of at least 10V.

26C10. A method as in clause 24C10 further comprising placing the at least nineteen solar cell strips in communication with only a single bypass diode.

27C10. A method as in clause 26C10 further comprising forming a ribbon conductor between one of the at least nineteen solar cell strips and the single bypass diode.

28C10. A method as in clause 27C10 wherein the single bypass diode is located in a junction box.

29C10. A method as in clause 28C10 wherein the junction box is on a back side of a solar module, in mating arrangement with another junction box of a different solar module.

30C10. A method as in clause 14C10 wherein an overlapping cell strip of the plurality of solar cell strips, overlaps the solar cell strip by between about 1-5 mm.

31C10. A method as in clause 14C10 wherein the solar cell strip includes a first chamfered corner.

32C10. A method as in clause 31C10 wherein a long side of an overlapping solar cell strip of the plurality of solar cell strips, does not include a second chamfered corner.

33C10. A method as in clause 32C10 wherein a width of the solar cell strip is greater than a width of the overlapping solar cell strip, such that the solar cell strip and the overlapping solar cell strip have approximately a same area.

34C10. A method as in clause 31C10 wherein a long side of an overlapping solar cell strip of the plurality of solar cell strips, includes a second chamfered corner.

35C10. A method as in clause 34C10 wherein the long side of the overlapping solar cell strip of the plurality of solar cell strips, overlaps the long side of the cell strip including the first chamfered corner.

36C10. A method as in clause 34C10 wherein the long side of the overlapping solar cell strip of the plurality of solar cell strips, overlaps a long side of the cell strip not including the first chamfered corner.

37C10. A method as in clause 14C10 further comprising connecting the plurality of solar cell strips with another plurality of solar cell strips utilizing an interconnect.

38C10. A method as in clause 37C10 wherein a portion of the interconnect is covered by a dark film.

39C10. A method as in clause 37C10 wherein a portion of the interconnect is colored.

40C10. A method as in clause 37C10 wherein the plurality of solar cell strips is connected in series with the other plurality of solar cell strips.

1C11. A method comprising:
providing a silicon wafer having a length;
scribing a scribe line on the silicon wafer to define a solar cell region;
applying an electrically conductive adhesive bonding material to a surface of the silicon wafer; and
separating the silicon wafer along the scribe line to provide a solar cell strip comprising a portion of the electrically conductive adhesive bonding material disposed adjacent to a long side of the solar cell strip.

2C11. A method as in clause 1C11 wherein the scribing comprises laser scribing.

3C11. A method as in clause 2C11 comprising laser scribing the scribe line, and then applying the electrically conductive adhesive bonding material.

4C11. A method as in clause 2C11 comprising the applying the electrically conductive adhesive bonding material to the wafer, and then laser scribing the scribe line.

5C11. A method as in clause 4C11 wherein:
the applying comprises applying uncured electrically conductive adhesive bonding material; and
the laser scribing comprises avoiding curing the uncured conductive adhesive bonding material with heat from the laser.

6C11. A method as in clause 5C11 wherein the avoiding comprises selecting a laser power and/or a distance between the scribe line and the uncured conductive adhesive bonding material.

7C11. A method as in clause 1C11 wherein the applying comprises printing.

8C11. A method as in clause 1C11 wherein the applying comprises depositing using a mask.

9C11. A method as in clause 1C11 wherein the scribe line and the electrically conductive adhesive bonding material are on the surface.

10C11. A method as in clause 1C11 wherein the separating comprises:
applying a vacuum between a surface of the wafer and a curved supporting surface to flex the solar cell region against the curved supporting surface and thereby cleave the silicon wafer along the scribe line.

11C11. A method as in clause 10C11 wherein the separating comprises arranging the scribe line at an angle relative to a vacuum manifold.

12C11. A method as in clause 1C11 wherein the separating comprises using a roller to apply pressure to the wafer.

13C11. A method as in clause 1C11 wherein the providing comprises providing the silicon wafer with a metallization pattern, such that the separating produces the solar cell strip having the metallization pattern along the long side.

14C11. A method as in clause 13C11 wherein the metallization pattern comprises a bus bar or a discrete contact pad.

15C11. A method as in clause 13C11 wherein the providing comprises printing the metallization pattern.

16C11. A method as in clause 13C11 wherein the providing comprises electroplating the metallization pattern.

17C11. A method as in clause 13C11 wherein the metallization pattern comprises a feature configured to confine spreading of the electrically conductive adhesive bonding material.

18C11. A method as in clause 1C11 wherein a length of the long side of the solar cell strip reproduces a shape of the wafer.

19C11. A method as in clause 18C11 wherein the length is 156 mm or 125 mm.

20C11. A method as in clause 18C11 wherein an aspect ratio between a width of the solar cell strip and the length is between about 1:2 to about 1:20.

21C11. A method as in clause 1C11 further comprising:
arranging a plurality of solar cell strips in line with long sides of adjacent solar cell strips overlapping and a portion of the electrically conductive adhesive bonding material disposed in between; and
curing the electrically conductive bonding material, thereby bonding adjacent overlapping solar cell strips to each other and electrically connecting them in series.

22C11. A method as in clause 21C11 wherein:
the arranging comprises forming a layered structure; and
the curing comprises the application of heat and/or pressure to the layered structure.

23C11. A method as in clause 22C11 wherein the layered structure comprises a thermoplastic olefin polymer encapsulant.

24C11. A method as in clause 22C11 wherein the layered structure comprises:
a white backing sheet; and
darkened stripes on the white backing sheet.

25C11. A method as in clause 21C11 wherein:
a plurality of wafers are provided on a template;
the conductive adhesive bonding material is dispensed on the plurality of wafers; and
the plurality of wafers are cells simultaneously separated into a plurality of solar cell strips with a fixture.

26C11. A method as in clause 25C11 further comprising transporting the plurality of solar cell strips as a group, and wherein the arranging comprises arranging the plurality of solar cell strips into a module.

27C11. A method as in clause 21C11 wherein the arranging comprises arranging at least nineteen solar cell strips having a breakdown voltage of at least 10V in line with only a single bypass diode.

28C11. A method as in clause 27C11 further comprising forming a ribbon conductor between one of the at least nineteen solar cell strips and the single bypass diode.

29C11. A method as in clause 28C11 wherein the single bypass diode is located in a first junction box of a first solar module that is in mating arrangement with a second junction box of a second solar module.

30C11. A method as in clause 27C11 further comprising forming a ribbon conductor between one of the at least nineteen solar cell strips and a smart switch.

31C11. A method as in clause 21C11 wherein an overlapping cell strip of the plurality of solar cell strips, overlaps the solar cell strip by between about 1-5 mm.

32C11. A method as in clause 21C11 wherein the solar cell strip includes a first chamfered corner.

33C11. A method as in clause 32C11 wherein a long side of an overlapping solar cell strip of the plurality of solar cell strips, does not include a second chamfered corner.

34C11. A method as in clause 33C11 wherein a width of the solar cell strip is greater than a width of the overlapping solar cell strip, such that the solar cell strip and the overlapping solar cell strip have approximately a same area.

35C11. A method as in clause 32C11 wherein a long side of an overlapping solar cell strip of the plurality of solar cell strips, includes a second chamfered corner.

36C11. A method as in clause 35C11 wherein the long side of the overlapping solar cell strip of the plurality of solar cell strips, overlaps the long side of the cell strip including the first chamfered corner.

37C11. A method as in clause 35C11 wherein the long side of the overlapping solar cell strip of the plurality of solar cell strips, overlaps a long side of the cell strip not including the first chamfered corner.

38C11. A method as in clause 21C11 further comprising connecting the plurality of solar cell strips with another plurality of solar cell strips utilizing an interconnect.

39C11. A method as in clause 38C11 wherein a portion of the interconnect is covered by a dark film or is colored.

40C11. A method as in clause 38C11 wherein the plurality of solar cell strips is connected in series with the other plurality of solar cell strips.

1C12. A method comprising:
providing a silicon wafer having a length;
scribing a scribe line on a silicon wafer to define a solar cell region;
separating the silicon wafer along the scribe line to provide a solar cell strip; and
applying an electrically conductive adhesive bonding material disposed adjacent to a long side of the solar cell strip.

2C12. A method as in clause 1C12 wherein the scribing comprises laser scribing.

3C12. A method as in clause 1C12 wherein the applying comprises screen printing.

4C12. A method as in clause 1C12 wherein the applying comprises ink jet printing.

5C12. A method as in clause 1C12 wherein the applying comprises depositing using a mask.

6C12. A method as in clause 1C12 wherein the separating comprises applying a vacuum between a surface of the wafer and a curved surface.

7C12. A method as in clause 6C12 wherein the curved surface comprises a vacuum manifold, and the separating comprises orienting the scribe line at an angle relative to the vacuum manifold.

8C12. A method as in clause 7C12 wherein the angle is perpendicular.

9C12. A method as in clause 7C12 wherein the angle is other than perpendicular.

10C12. A method as in clause 6C12 wherein the vacuum is applied through a moving belt.

11C12. A method as in clause 1C12 further comprising:
arranging a plurality of solar cell strips in line with long sides of adjacent solar cell strips overlapping the electrically conductive adhesive bonding material disposed in between; and
curing the electrically conductive bonding material to bond adjacent overlapping solar cell strips electrically connected in series.

12C12. A method as in clause 11C12 wherein the arranging comprises forming a layered structure including an encapsulant, the method further comprising laminating the layered structure.

13C12. A method as in clause 12C12 wherein the curing occurs at least partially during the laminating 14C12. A method as in clause 12C12 wherein the curing occurs distinct from the laminating.

15C12. A method as in clause 12C12 wherein the laminating comprises applying a vacuum.

16C12. A method as in clause 15C12 wherein the vacuum is applied to a bladder.

17C12. A method as in clause 15C12 wherein the vacuum is applied to a belt.

18C12. A method as in clause 12C12 wherein the encapsulant comprises a thermoplastic olefin polymer.

19C12. A method as in clause 12C12 wherein the layered structure comprises:
a white backing sheet; and
darkened stripes on the white backing sheet.

20C12. A method as in clause 11C12 wherein the providing comprises providing the silicon wafer with a metallization pattern, such that the separating produces the solar cell strip having the metallization pattern along the long side.

21C12. A method as in clause 20C12 wherein the metallization pattern comprises a bus bar or a discrete contact pad.

22C12. A method as in clause 20C12 wherein the providing comprises printing or electroplating the metallization pattern.

23C12. A method as in clause 20C12 wherein the arranging comprises confining a spreading of the electrically conductive adhesive bonding material using a feature of the metallization pattern.

24C12. A method as in clause 23C12 wherein the feature is on a front side of the solar cell strip.

25C12. A method as in clause 23C12 wherein the feature is on a back side of the solar cell strip.

26C12. A method as in clause 11C12 wherein a length of the long side of the solar cell strip reproduces a shape of the wafer.

27C12. A method as in clause 26C12 wherein the length is 156 mm or 125 mm.

28C12. A method as in clause 26C12 wherein an aspect ratio between a width of the solar cell strip and the length is between about 1:2 to about 1:20.

29C12. A method as in clause 11C12 wherein the arranging comprises arranging at least nineteen solar cell strips having a breakdown voltage of at least 10V in line as a first super cell with only a single bypass diode.

30C12. A method as in clause 29C12 further comprising applying the electrically conductive adhesive bonding material between the first super cell and an interconnect.

31C12. A method as in clause 30C12 wherein the interconnect connects the first super cell in parallel with a second super cell.

32C12. A method as in clause 30C12 wherein the interconnect connects the first super cell in series with a second super cell.

33C12. A method as in clause 29C12 further comprising forming a ribbon conductor between the first super cell and the single bypass diode.

34C12. A method as in clause 33C12 wherein the single bypass diode is located in a first junction box of a first solar module that is in mating arrangement with a second junction box of a second solar module.

35C12. A method as in clause 11C12 wherein the solar cell strip includes a first chamfered corner.

36C12. A method as in clause 35C12 wherein a long side of an overlapping solar cell strip of the plurality of solar cell strips, does not include a second chamfered corner.

37C12. A method as in clause 36C12 wherein a width of the solar cell strip is greater than a width of the overlapping solar cell strip, such that the solar cell strip and the overlapping solar cell strip have approximately a same area.

38C12. A method as in clause 35C12 wherein a long side of an overlapping solar cell strip of the plurality of solar cell strips, includes a second chamfered corner.

39C12. A method as in clause 38C12 wherein the long side of the overlapping solar cell strip of the plurality of solar cell strips, overlaps the long side of the cell strip including the first chamfered corner.

40C12. A method as in clause 38C12 wherein the long side of the overlapping solar cell strip of the plurality of solar cell strips, overlaps a long side of the cell strip not including the first chamfered corner.

1C13. An apparatus comprising:
a semiconductor wafer having a first surface including a first metallization pattern along a first outside edge, and a second metallization pattern along a second outside edge opposite to the first outside edge, the semiconductor wafer further comprising a first scribe line between the first metallization pattern and the second metallization pattern.

2C13. An apparatus as in clause 1C13 wherein the first metallization pattern comprises a discrete contact pad.

3C13. An apparatus as in clause 1C13 wherein the first metallization pattern comprises a first finger pointing away from the first outside edge toward the second metallization pattern.

4C13. An apparatus as in clause 3C13 wherein the first metallization pattern further comprises a bus bar running along the first outside edge and intersecting the first finger.

5C13. An apparatus as in clause 4C13 wherein the second metallization pattern comprises:
a second finger pointing away from the second outside edge toward the first metallization pattern; and
a second bus bar running along the second outside edge and intersecting the second finger.

6C13. An apparatus as in clause 3C13 further comprising an electrically conductive adhesive running along the first outside edge and in contact with the first finger.

7C13. An apparatus as in clause 3C13 wherein the first metallization pattern further comprises a first bypass conductor.

8C13. An apparatus as in clause 3C13 wherein the first metallization pattern further comprises a first end conductor.

9C13. An apparatus as in clause 1C13 wherein the first metallization pattern comprises silver.

10C13. An apparatus as in clause 9C13 wherein the first metallization pattern comprises silver paste.

11C13. An apparatus as in clause 9C13 wherein the first metallization pattern comprises discrete contacts.

12C13. An apparatus as in clause 1C13 wherein the first metallization pattern comprises tin, aluminum, or another conductor less expensive than silver.

13C13. An apparatus as in clause 1C13 wherein the first metallization pattern comprises copper.

14C13. An apparatus as in clause 13C13 wherein the first metallization pattern comprises electroplated copper.

15C13. An apparatus as in clause 13C13 further comprising a passivation scheme to reduce recombination.

16C13. An apparatus as in clause 1C13 further comprising:
a third metallization pattern on the first surface of the semiconductor wafer not proximate to the first outside edge or to the second outside edge; and
a second scribe line between the third metallization pattern and the second metallization pattern, wherein the first scribe line is between the first metallization pattern and the third metallization pattern.

17C13. An apparatus as in clause 16C13 wherein a ratio of a first width defined between the first scribe line and the second scribe line divided by a length of the semiconductor wafer, is between about 1:2 to about 1:20.

18C13. An apparatus as in clause 17C13 wherein the length is about 156 mm or about 125 mm.

19C13. An apparatus as in clause 17C13 wherein the semiconductor wafer includes chamfered corners.

20C13. An apparatus as in clause 19C13 wherein:
the first scribe line defines with the first outside edge, a first rectangular region comprising two chamfered corners and the first metallization pattern, the first rectangular region having an area corresponding to a product of the length and a second width greater than the first width, minus a combined area of the two chamfered corners; and
the second scribe line defines with the first scribe line, a second rectangular region not including chamfered corners and including the third metallization pattern, the second rectangular region having the area corresponding to a product of the length and the first width.

21C13. An apparatus as in clause 16C13 wherein the third metallization pattern comprises a finger pointing toward the second metallization pattern.

22C13. An apparatus as in clause 1C13 further comprising a third metallization pattern on a second surface of the semiconductor wafer opposite to the first surface.

23C13. An apparatus as in clause 22C13 wherein the third metallization pattern comprises a contact pad proximate to a location of the first scribe line.

24C13. An apparatus as in clause 1C13 wherein the first scribe line is formed by a laser.

25C13. An apparatus as in clause 1C13 wherein the first scribe line is in the first surface.

26C13. An apparatus as in clause 1C13 wherein first metallization pattern comprises a feature configured to confine spreading of an electrically conducting adhesive.

27C13. An apparatus as in clause 26C13 wherein the feature comprises a raised feature.

28C13. An apparatus as in clause 27C13 wherein the first metallization pattern comprises a contact pad, and the feature comprises a dam abutting and taller than the contact pad.

29C13. An apparatus as in clause 26C13 wherein the feature comprises a recessed feature.

30C13. An apparatus as in clause 29C13 wherein the recessed feature comprises a moat.

31C13. An apparatus as in clause 26C13 further comprising the electrically conducting adhesive in contact with the first metallization pattern.

32C13. An apparatus as in clause 31C13 wherein the electrically conducting adhesive is printed.

33C13. An apparatus as in clause 1C13 wherein the semiconductor wafer comprises silicon.

34C13. An apparatus as in clause 33C13 wherein the semiconductor wafer comprises crystalline silicon.

35C13. An apparatus as in clause 33C13 wherein the first surface is of n-type conductivity.

36C13. An apparatus as in clause 33C13 wherein the first surface is of p-type conductivity.

37C13. An apparatus as in clause 1C13 wherein:
the first metallization pattern is 5 mm or less from the first outside edge; and
the second metallization pattern is 5 mm or less from the second outside edge.

38C13. An apparatus as in clause 1C13 wherein the semiconductor wafer includes chamfered corners, and the first metallization pattern comprises a tapered portion extending around a chamfered corner.

39C13. An apparatus as in clause 38C13 wherein the tapered portion comprises a bus bar.

40C13. An apparatus as in clause 38C13 wherein the tapered portion comprises a conductor connecting a discrete contact pad.

1C14. A method comprising:
scribing a first scribe line on a wafer; and
separating the wafer along the first scribe line utilizing a vacuum to provide a solar cell strip.

2C14. A method as in clause 1C14 wherein the scribing comprises laser scribing.

3C14. A method as in clause 2C14 wherein the separating comprises applying the vacuum between a surface of the wafer and a curved surface.

4C14. A method as in clause 3C14 wherein the curved surface comprises a vacuum manifold.

5C14. A method as in clause 4C14 wherein the wafer is supported on a belt moving to the vacuum manifold, and the vacuum is applied through the belt.

6C14. A method as in clause 5C14 wherein the separating comprises:
orienting the first scribe line at an angle relative to the vacuum manifold; and
beginning a cleaving at one end of the first scribe line.

7C14. A method as in clause 6C14 wherein the angle is substantially perpendicular.

8C14. A method as in clause 6C14 wherein the angle is other than substantially perpendicular.

9C14. A method as in clause 3C14 further comprising applying an uncured electrically conductive adhesive bonding material.

10C14. A method as in clause 9C14 wherein the first scribe line and the uncured electrically conductive adhesive bonding material are on a same surface of the wafer.

11C14. A method as in clause 10C14 wherein the laser scribing avoids curing the uncured conductive adhesive bonding material by selecting a laser power and/or a distance between the first scribe line and the uncured conductive adhesive bonding material.

12C14. A method as in clause 10C14 wherein the same surface is opposite a wafer surface supported by a belt moving the wafer to the curved surface.

13C14. A method as in clause 12C14 wherein the curved surface comprises a vacuum manifold.

14C14. A method as in clause 9C14 wherein the applying occurs after the scribing.

15C14. A method as in clause 9C14 wherein the applying occurs after the separating.

16C14. A method as in clause 9C14 wherein the applying comprises screen printing.

17C14. A method as in clause 9C14 wherein the applying comprises ink jet printing.

18C14. A method as in clause 9C14 wherein the applying comprises depositing using a mask.

19C14. A method as in clause 3C14 wherein the first scribe line is between,
a first metallization pattern on a surface of the wafer along a first outside edge, and
a second metallization pattern on the surface of the wafer along a second outside edge.

20C14. A method as in clause 19C14 wherein the wafer further comprises a third metallization pattern on the surface of the semiconductor wafer not proximate to the first outside edge or to the second outside edge, and the method further comprises:
scribing a second scribe line between the third metallization pattern and the second metallization pattern, such that the first scribe line is between the first metallization pattern and the third metallization pattern; and
separating the wafer along the second scribe line to provide another solar cell strip.

21C14. A method as in clause 20C14 wherein a distance between the first scribe line and the second scribe line forms a width defining an aspect ratio of between about 1:2 and about 1:20 with a length of the wafer comprising about 125 mm or about 156 mm.

22C14. A method as in clause 19C14 wherein the first metallization pattern comprises a finger pointing toward the second metallization pattern.

23C14. A method as in clause 22C14 wherein the first metallization pattern further comprises a bus bar intersecting the finger.

24C14. A method as in clause 23C14 wherein the bus bar is within 5 mm of the first outside edge.

25C14. A method as in clause 22C14 further comprising uncured electrically conductive adhesive bonding material in contact with the finger.

26C14. A method as in clause 19C14 wherein the first metallization pattern comprises a discrete contact pad.

27C14. A method as in clause 19C14 further comprising printing or electroplating the first metallization pattern on the wafer.

28C14. A method as in clause 3 further comprising:
arranging the solar cell strip in a first super cell comprising at least nineteen solar cell strips each having a breakdown voltage of at least 10V, with long sides of adjacent solar cell strips overlapping the electrically conductive adhesive bonding material disposed in between; and
curing the electrically conductive bonding material to bond adjacent overlapping solar cell strips electrically connected in series.

29C14. A method as in clause 28C14 wherein the arranging comprises forming a layered structure including an encapsulant, the method further comprising laminating the layered structure.

30C14. A method as in clause 29C14 wherein the curing occurs at least partially during the laminating.

31C14. A method as in clause 29C14 wherein the curing occurs distinct from the laminating.

32C14. A method as in clause 29C14 wherein the encapsulant comprises a thermoplastic olefin polymer.

33C14. A method as in clause 29C14 wherein the layered structure comprises:
a white backing sheet; and
darkened stripes on the white backing sheet.

34C14. A method as in clause 28C14 wherein the arranging comprises confining a spreading of the electrically conductive adhesive bonding material using a metallization pattern feature.

35C14. A method as in clause 34C14 wherein metallization pattern feature is on a front surface of the solar cell strip.

36C14. A method as in clause 34C14 wherein metallization pattern feature is on a back surface of the solar cell strip.

37C14. A method as in clause 28C14 further comprising applying the electrically conductive adhesive bonding material between the first super cell and an interconnect connecting a second super cell in series.

38C14. A method as in clause 28C14 further comprising forming a ribbon conductor between a single bypass diode of the first super cell, the single bypass diode located in a first junction box of a first solar module in mating arrangement with a second junction box of a second solar module.

39C14. A method as in clause 28C14 wherein:
the solar cell strip includes a first chamfered corner;
a long side of an overlapping solar cell strip of the plurality of solar cell strips, does not include a second chamfered corner; and
a width of the solar cell strip is greater than a width of the overlapping solar cell strip, such that the solar cell strip and the overlapping solar cell strip have approximately a same area.

40C14. A method as in clause 28C14 wherein:
the solar cell strip includes a first chamfered corner;
a long side of an overlapping solar cell strip of the plurality of solar cell strips, includes a second chamfered corner; and
the long side of the overlapping solar cell strip of the plurality of solar cell strips, overlaps a long side of the solar cell strip not including the first chamfered corner.

1C15. A method comprising:
forming a first metallization pattern along a first outside edge of a first surface of a semiconductor wafer;
forming a second metallization pattern along a second outside edge of the first surface, the second outside edge opposite to the first outside edge; and
forming a first scribe line between the first metallization pattern and the second metallization pattern.

2C15. A method as in clause 1C15 wherein:
the first metallization pattern comprises a first finger pointing toward the second metallization pattern; and
the second metallization pattern comprises a second finger pointing toward the first metallization pattern.

3C15. A method as in clause 2C15 wherein:
the first metallization pattern further comprises a first bus bar intersecting the first finger and located within 5 mm of the first outside edge; and
the second metallization pattern comprises a second bus bar intersecting the second finger and located within 5 mm of the second outside edge.

4C15. A method as in clause 3C15 further comprising:
forming on the first surface, a third metallization pattern not along the first outside edge or along the second outside edge, the third metallization pattern comprising,
a third bus bar parallel to the first bus bar, and
a third finger pointing toward the second metallization pattern; and forming a second scribe line between the third metallization pattern and the second metallization pattern, wherein the first scribe line is between the first metallization pattern and the third metallization pattern.

5C15. A method as in clause 4C15 wherein the first scribe line and the second scribe line are separated by a width having a ratio to a length of the semiconductor wafer, of between about 1:2 to about 1:20.

6C15. A method as in clause 5C15 wherein the length of the semiconductor wafer is about 156 mm or about 125 mm.

7C15. A method as in clause 4C15 wherein the semiconductor wafer includes chamfered corners.

8C15. A method as in clause 7C15 wherein:
the first scribe line defines with the first outside edge, a first solar cell region comprising two chamfered corners and the first metallization pattern, the first solar cell region having a first area corresponding to a product of a length of the semiconductor wafer and a first width, minus a combined area of the two chamfered corners; and
the second scribe line defines with the first scribe line, a second solar cell region not including chamfered corners and including the third metallization pattern, the second solar cell region having a second area corresponding to a product of the length and a second width narrower than the first width, such that the first area and the second area are approximately the same.

9C15. A method as in clause 8C15 wherein the length is about 156 mm or about 125 mm.

10C15. A method as in clause 4C15 wherein forming the first scribe line and forming the second scribe line comprise laser scribing.

11C15. A method as in clause 4C15 wherein forming the first metallization pattern, forming the second metallization pattern, and forming the third metallization pattern, comprise printing.

12C15. A method as in clause 11C15 wherein forming the first metallization pattern, forming the second metallization pattern, and forming the third metallization pattern, comprise screen printing.

13C15. A method as in clause 11C15 wherein forming the first metallization pattern comprises forming a plurality of contact pads comprising silver.

14C15. A method as in clause 4C15 wherein forming the first metallization pattern, forming the second metallization pattern, and forming the third metallization pattern, comprise electroplating.

15C15. A method as in clause 14C15 wherein the first metallization pattern, the second metallization pattern, and the third metallization pattern comprise copper.

16C15. A method as in clause 4C15 wherein the first metallization pattern comprises aluminum, tin, silver, copper, and/or a conductor less expensive than silver.

17C15. A method as in clause 4C15 wherein the semiconductor wafer comprises silicon.

18C15. A method as in clause 17C15 wherein the semiconductor wafer comprises crystalline silicon.

19C15. A method as in clause 4C15 further comprising forming a fourth metallization pattern on a second surface of the semiconductor wafer between the first outside edge and within 5 mm of a location of the second scribe line.

20C15. A method as in clause 4C15 wherein the first surface comprises a first conductivity type and the second surface comprises a second conductivity type opposite to the first conductivity type.

21C15. A method as in clause 4C15 wherein the fourth metallization pattern comprises a contact pad.

22C15. A method as in clause 3C15 further comprising applying a conductive adhesive to the semiconductor wafer.

23C15. A method as in clause 22C15 further comprising applying the conductive adhesive in contact with the first finger.

24C15. A method as in clause 23C15 wherein applying the conductive adhesive comprises screen printing or depositing utilizing a mask.

25C15. A method as in clause 3C15 further comprising separating the semiconductor wafer along the first scribe line to form a first solar cell strip including the first metallization pattern.

26C15. A method as in clause 25C15 wherein the separating comprises applying a vacuum to the first scribe line.

27C15. A method as in clause 26C15 further comprising disposing the semiconductor wafer on a belt moving to the vacuum.

28C15. A method as in clause 25C15 further comprising applying a conductive adhesive to the first solar cell strip.

29C15. A method as in clause 25C15 further comprising:
arranging the first solar cell strip in a first super cell comprising at least nineteen solar cell strips each having a breakdown voltage of at least 10V, with long sides of adjacent solar cell strips overlapping conductive adhesive disposed in between; and
curing the conductive adhesive to bond adjacent overlapping solar cell strips electrically connected in series.

30C15. A method as in clause 29C15 wherein the arranging comprises forming a layered structure including an encapsulant, the method further comprising laminating the layered structure.

31C15. A method as in clause 30C15 wherein the curing occurs at least partially during the laminating.

32C15. A method as in clause 30C15 wherein the curing occurs distinct from the laminating.

33C15. A method as in clause 30C15 wherein the encapsulant comprises a thermoplastic olefin polymer.

34C15. A method as in clause 30C15 wherein the layered structure comprises:
a white backing sheet; and
darkened stripes on the white backing sheet.

35C15. A method as in clause 29C15 wherein the arranging comprises confining a spreading of the conductive adhesive with a metallization pattern feature.

36C15. A method as in clause 35C15 wherein the metallization pattern feature is on a front surface of the first solar cell strip.

37C15. A method as in clause 29C15 further comprising applying the conductive adhesive between the first super cell and an interconnect connecting a second super cell in series.

38C15. A method as in clause 29C15 further comprising forming a ribbon conductor between a single bypass diode of the first super cell, the single bypass diode located in a first junction box of a first solar module in mating arrangement with a second junction box of a second solar module.

39C15. A method as in clause 29C15 wherein:
the first solar cell strip includes a first chamfered corner;
a long side of an overlapping solar cell strip of the first super cell, does not include a second chamfered corner; and
a width of the first solar cell strip is greater than a width of the overlapping solar cell strip, such that the first solar cell strip and the overlapping solar cell strip have approximately a same area.

40C15. A method as in clause 29C15 wherein:
the first solar cell strip includes a first chamfered corner;
a long side of an overlapping solar cell strip of the first super cell, includes a second chamfered corner; and
the long side of the overlapping solar cell strip, overlaps a long side of the first solar cell strip not including the first chamfered corner.

1C16. A method comprising:
obtaining or providing a silicon wafer comprising a front surface metallization pattern including a first bus bar or row of contact pads arranged parallel to and adjacent a first outside edge of the wafer and a second bus bar or row of contact pads arranged parallel to and adjacent a second outside edge of the wafer opposite from and parallel to the first edge of the wafer;
separating the silicon wafer along one or more scribe lines parallel to the first and second outside edges of the wafer to form a plurality of rectangular solar cells, with the first bus bar or row of contact pads arranged parallel to and adjacent to a long outside edge of a first one of the rectangular solar cells and the second bus bar or row of contact pads arranged parallel to and adjacent to a long outside edge of a second one of the rectangular solar cells; and
arranging the rectangular solar cells in line with long sides of adjacent solar cells overlapping and conductively bonded to each other to electrically connect the solar cells in series to form a super cell;
wherein the first bus bar or row of contact pads on the first one of the rectangular solar cells is overlapped by and conductively bonded to a bottom surface of an adjacent rectangular solar cell in the super cell.

2C16. The method of clause 1C16, wherein the second bus bar or row of contact pads on the second one of the rectangular solar cells is overlapped by and conductively bonded to a bottom surface of an adjacent rectangular solar cell in the super cell.

3C16. The method of clause 1C16, wherein the silicon wafer is a square or pseudo square silicon wafer.

4C16. The method of clause 3C16, wherein the silicon wafer comprises sides of about 125 mm in length or about 156 mm in length.

5C16. The method of clause 3C16, wherein the ratio of length to width of each rectangular solar cell is between about 2:1 and about 20:1.

6C16. The method of clause 1C16, wherein the silicon wafer is a crystalline silicon wafer.

7C16. The method of clause 1C16, wherein the first bus bar or row of contact pads and the second bus bar or row of contact pads are located in edge regions of the silicon wafer that convert light to electricity less efficiently than central regions of the silicon wafer.

8C16. The method of clause 1C16, wherein the front surface metallization pattern comprises a first plurality of parallel fingers electrically connected to the first bus bar or row of contact pads and extending inward from the first outside edge of the wafer and a second plurality of parallel fingers electrically connected to the second bus bar or row of contact pads and extending inward from the second outside edge of the wafer.

9C16. The method of clause 1C16, wherein the front surface metallization pattern comprises at least a third bus bar or row of contact pads oriented parallel to and located between the first bus bar or row of contact pads and the second bus bar or row of contact pad and a third plurality of parallel fingers oriented perpendicular to and electrically connected to the third bus bar or row of contact pads, and the third bus bar or row of contact pads is arranged parallel to and adjacent a long outside edge of a third one of the rectangular solar cells after the silicon wafer is separated to form the plurality of rectangular solar cells.

10C16. The method of clause 1C16, comprising applying a conductive adhesive to the first bus bar or row of contact pads by which to conductively bond the first rectangular solar cell to an adjacent solar cell.

11C16. The method of clause 10C16, wherein the metallization pattern comprises a barrier configured to confine spreading of the conductive adhesive.

12C16. The method of clause 10C16, comprising applying the conductive adhesive by screen printing.

13C16. The method of clause 10C16, comprising applying the conductive adhesive by ink jet printing.

14C16. The method of clause 10C16, wherein the conductive adhesive is applied before formation of the scribe lines in the silicon wafer.

15C16. The method of clause 1C16, wherein separating the silicon wafer along the one or more scribe lines comprises applying a vacuum between a bottom surface of the silicon wafer and a curved supporting surface to flex the silicon wafer against the curved supporting surface and thereby cleave the silicon wafer along the one or more scribe lines.

16C16. The method of clause 1C16 wherein:
the silicon wafer is a pseudo square silicon wafer comprising chamfered corners and after separation of the silicon wafer to form the plurality of rectangular solar cells one or more of the rectangular solar cells comprises one or more of the chamfered corners; and
the spacing between scribe lines is selected to compensate for the chamfered corners by making the width perpendicular to the long axis of the rectangular solar cells that comprise chamfered corners greater than the width perpendicular to the long axis of the rectangular solar cells that lack chamfered corners, so that each of the plurality of rectangular solar cells in the super cell has a front surface of substantially the same area exposed to light in operation of the super cell.

17C16. The method of clause 1C16, comprising arranging the super cell in a layered structure between a transparent front sheet and a back sheet and laminating the layered structure.

18C16. The method of clause 17C16, wherein laminating the layered structure completes curing of a conductive adhesive disposed between the adjacent rectangular solar cells in the super cell to conductively bond the adjacent rectangular solar cells to each other.

19C16. The method of clause 17C16, wherein the super cell is arranged in the layered structure in one of two or more parallel rows of super cells, and the back sheet is a white sheet comprising parallel darkened stripes having locations and widths corresponding to locations and widths of gaps between the two or more rows of super cells such that white portions of the back sheet are not visible through gaps between the rows of super cells in the assembled module.

20C16. The method of clause 17C16, wherein the front sheet and the back sheet are glass sheets and the super cell is encapsulated in a thermoplastic olefin layer sandwiched between the glass sheets.

21C16. The method of clause 1C16, comprising arranging the super cell in a first module comprising a junction box in mating arrangement with a second junction box of a second solar module.

1D. A solar module comprising:
a plurality of super cells arranged in two or more parallel rows, each super cell comprising a plurality of rectangular or substantially rectangular silicon solar cells arranged in line with long sides of adjacent silicon solar cells overlapping and conductively bonded directly to each other to electrically connect the silicon solar cells in series;
a first hidden tap contact pad located on a back surface of a first solar cell located at an intermediate position along a first one of the super cells; and
a first electrical interconnect conductively bonded to the first hidden tap contact pad;
wherein the first electrical interconnect comprises a stress relieving feature accommodating differential thermal expansion between the interconnect and the silicon solar cell to which it is bonded.

2D. The solar module of clause 1D, comprising a second hidden tap contact pad located on a back surface of a second solar cell located adjacent the first solar cell at an intermediate position along a second one of the super cells, wherein the first hidden tap contact pad is electrically connected to the second hidden tap contact pad through the first electrical interconnect.

3D. The solar module of clause 2D, wherein the first electrical interconnect extends across a gap between the first super cell and the second super cell and is conductively bonded to the second hidden tap contact pad.

4D. The solar module of clause 1D, comprising a second hidden tap contact pad located on a back surface of a second solar cell located at another intermediate position along the first one of the super cells, a second electrical interconnect conductively bonded to the second hidden tap contact pad, and a bypass diode electrically connected by the first and second electrical interconnects in parallel with the solar cells located between the first hidden tap contact pad and the second hidden tap contact pad.

5D. The solar module of clause 1D, wherein the first hidden tap contact pad is one of a plurality of hidden tap contact pads arranged on the back surface of the first solar cell in a row running parallel to the long axis of the first solar cell, and the first electrical interconnect is conductively bonded to each of the plurality of hidden contacts and substantially spans the length of the first solar cell along the long axis.

6D. The solar module of clause 1D, wherein the first hidden tap contact pad is located adjacent a short side of the back surface of the first solar cell, the first electrical interconnect does not extend substantially inward from the hidden tap contact pad along the long axis of the solar cell, and a back surface metallization pattern on the first solar cell provides a conductive path to the interconnect having a sheet resistance less than or equal to about 5 Ohms per square.

7D. The solar module of clause 6D, wherein the sheet resistance is less than or equal to about 2.5 Ohms per square.

8D. The solar module of clause 6D, wherein the first interconnect comprises two tabs positioned on opposite sides of the stress relieving feature, and one of the tabs is conductively bonded to the first hidden tap contact pad.

9D. The solar module of clause 8D, wherein the two tabs are of different lengths.

10D. The solar module of clause 1D, wherein the first electrical interconnect comprises alignment features identifying a desired alignment with the first hidden tap contact pad.

11D. The solar module of clause 1D, wherein the first electrical interconnect comprises alignment features identifying a desired alignment with an edge of the first super cell.

12D. The solar module of clause 1D, arranged in an overlapping shingled manner with another solar module to which it is electrically connected in an overlapping region.

13D. A solar module comprising:
a glass front sheet;
a back sheet;
a plurality of super cells arranged in two or more parallel rows between the glass front sheet and the back sheet, each super cell comprising a plurality of rectangular or substantially rectangular silicon solar cells arranged in line with long sides of adjacent silicon solar cells overlapping and flexibly conductively bonded directly to each other to electrically connect the silicon solar cells in series; and
a first flexible electrical interconnect rigidly conductively bonded to a first one of the super cells;
wherein the flexible conductive bonds between overlapping solar cells provide mechanical compliance to the super cells accommodating a mismatch in thermal expansion between the super cells and the glass front sheet in a direction parallel to the rows for a temperature range of about −40° C. to about 100° C. without damaging the solar module; and
wherein the rigid conductive bond between the first super cell and the first flexible electrical interconnect forces the first flexible electrical interconnect to accommodate a mismatch in thermal expansion between the first super cell and the first flexible interconnect in a direction perpendicular to the rows for a temperature range of about −40° C. to about 180° C. without damaging the solar module.

14D. The solar module of clause 13D, wherein the conductive bonds between overlapping adjacent solar cells within a super cell utilize a different conductive adhesive than the conductive bonds between the super cell and the flexible electrical interconnect 15D. The solar module of clause 14D, wherein both conductive adhesives can be cured in the same processing step.

16D. The solar module of clause 13D, wherein the conductive bond at one side of at least one solar cell within a super cell utilizes a different conductive adhesive than the conductive bond at its other side 17D. The solar module of clause 16D, wherein both conductive adhesives can be cured in the same processing step.

18D. The solar module of clause 13D, wherein the conductive bonds between overlapping adjacent solar cells accommodate differential motion between each cell and the glass front sheet of greater than or equal to about 15 micron.

19D. The solar module of clause 13D, wherein the conductive bonds between overlapping adjacent solar cells have a thickness perpendicular to the solar cells of less than or equal to about 50 micron and a thermal conductivity perpendicular to the solar cells greater than or equal to about 1.5 W/(meter-K).

20D. The solar module of clause 13D, wherein the first flexible electrical interconnect withstands thermal expansion or contraction of the first flexible interconnect of greater than or equal to about 40 micron.

21D. The solar module of clause 13D, wherein the portion of the first flexible electrical interconnect conductively bonded to the super cell is ribbon-like, formed from copper, and has a thickness perpendicular to the surface of the solar cell to which it is bonded of less than or equal to about 50 microns.

22D. The solar module of clause 21D, wherein the portion of the first flexible electrical interconnect conductively bonded to the super cell is ribbon-like, formed from copper, and has a thickness perpendicular to the surface of the solar cell to which it is bonded of less than or equal to about 30 microns.

23D. The solar module of clause 21D, wherein the first flexible electrical interconnect comprises an integral conductive copper portion not bonded to the solar cell and providing a higher conductivity than the portion of the first flexible electrical interconnect that is conductively bonded to the solar cell.

24D. The solar module of clause 21D, wherein the first flexible electrical interconnect has a width greater than or equal to about 10 mm in the plane of the surface of the solar cell in a direction perpendicular to the flow of current though the interconnect.

25D. The solar module of clause 21D, wherein the first flexible electrical interconnect is conductively bonded to a conductor proximate to the solar cell that provides higher conductivity than the first electrical interconnect.

26D. The solar module of clause 13D, arranged in an overlapping shingled manner with another solar module to which it is electrically connected in an overlapping region.

27D. A solar module comprising:
a plurality of super cells arranged in two or more parallel rows, each super cell comprising a plurality of rectangular or substantially rectangular silicon solar cells arranged in line with long sides of adjacent silicon solar cells overlapping and conductively bonded directly to each other to electrically connect the silicon solar cells in series; and
a hidden tap contact pad which does not conduct significant current in normal operation located on a back surface of a first solar cell;

wherein the first solar cell is located at an intermediate position along a first one of the super cells in a first one of the rows of super cells and the hidden tap contact pad is electrically connected in parallel to at least a second solar cell in a second one of the rows of super cells.

28D. The solar module of clause 27D, comprising an electrical interconnect bonded to the hidden tap contact pad and electrically interconnecting the hidden tap contact pad to the second solar cell, wherein the electrical interconnect does not substantially span the length of the first solar cell and a back surface metallization pattern on the first solar cell provides a conductivity path to the hidden tap contact pad having a sheet resistance less than or equal to about 5 Ohms per square.

29D. The solar module of clause 27D, wherein the plurality of super cells are arranged in three or more parallel rows spanning the width of the solar module perpendicular to the rows, and the hidden tap contact pad is electrically connected to a hidden contact pad on at least one solar cell in each of the rows of super cells to electrically connect the rows of super cells in parallel, and at least one bus connection to at least one of the hidden tap contact pads or to an interconnect between hidden tap contact pads connects to a bypass diode or other electronic device.

30D. The solar module of clause 27D, comprising a flexible electrical interconnect conductively bonded to the hidden tap contact pad to electrically connect it to the second solar cell, wherein:

the portion of the flexible electrical interconnect conductively bonded to the hidden tap contact pad is ribbon-like, formed from copper, and has a thickness perpendicular to the surface of the solar cell to which it is bonded of less than or equal to about 50 microns; and the conductive bond between the hidden tap contact pad and the flexible electrical interconnect forces the flexible electrical interconnect to withstand a mismatch in thermal expansion between the first solar cell and the flexible interconnect, and to accommodate relative motion between the first solar cell and the second solar cell resulting from thermal expansion, for a temperature range of about −40° C. to about 180° C. without damaging the solar module.

31D. The solar module of clause 27D, wherein in operation of the solar module the first hidden contact pad may conduct a current greater than the current generated in any single one of the solar cells.

32D. The solar module of clause 27D, wherein the front surface of the first solar cell overlying the first hidden tap contact pad is not occupied by contact pads or any other interconnect features.

33D. The solar module of clause 27D, wherein any area of the front surface of the first solar cell which is not overlapped by a portion of an adjacent solar cell in the first super cell is not occupied by contact pads or any other interconnect features.

34D. The solar module of clause 27D, wherein in each super cell most of the cells do not have hidden tap contact pads.

35D. The solar module of clause 34D, wherein the cells that have hidden tap contact pads have a larger light collection area than the cells that do not have hidden tap contact pads.

36D. The solar module of clause 27D, arranged in an overlapping shingled manner with another solar module to which it is electrically connected in an overlapping region.

37D. A solar module comprising:
a glass front sheet;
a back sheet;
a plurality of super cells arranged in two or more parallel rows between the glass front sheet and the back sheet, each super cell comprising a plurality of rectangular or substantially rectangular silicon solar cells arranged in line with long sides of adjacent silicon solar cells overlapping and flexibly conductively bonded directly to each other to electrically connect the silicon solar cells in series; and
a first flexible electrical interconnect rigidly conductively bonded to a first one of the super cells;
wherein the flexible conductive bonds between overlapping solar cells are formed from a first conductive adhesive and have a shear modulus less than or equal to about 800 megapascals; and
wherein the rigid conductive bond between the first super cell and the first flexible electrical interconnect is formed from a second conductive adhesive and has a shear modulus of greater than or equal to about 2000 megapascals.

38D. The solar module of clause 37D, wherein the first conductive adhesive and the second conductive adhesive are different, and both conductive adhesives can be cured in the same processing step 39D. The solar module of clause 37D, wherein the conductive bonds between overlapping adjacent solar cells have a thickness perpendicular to the solar cells of less than or equal to about 50 micron and a thermal conductivity perpendicular to the solar cells greater than or equal to about 1.5 W/(meter-K).

40D. The solar module of clause 37D, arranged in an overlapping shingled manner with another solar module to which it is electrically connected in an overlapping region.

1E. A solar module comprising: a number N greater than or equal to about 150 rectangular or substantially rectangular silicon solar cells arranged as a plurality of super cells in two or more parallel rows, each super cell comprising a plurality of the silicon solar cells arranged in line with long sides of adjacent silicon solar cells overlapping and conductively bonded to each other to electrically connect the silicon solar cells in series; wherein the super cells are electrically connected to provide a high direct current voltage of greater than or equal to about 90 volts.

2E. The solar module of clause 1E, comprising one or more flexible electrical interconnects arranged to electrically connect the plurality of super cells in series to provide the high direct current voltage.

3E. The solar module of clause 2E, comprising module level power electronics including an inverter that converts the high direct current voltage to an alternating current voltage.

4E. The solar module of clause 3E, wherein the module level power electronics sense the high direct current voltage and operate the module at an optimum current-voltage power point.

5E. The solar module of clause 1E, comprising module level power electronics electrically connected to individual pairs of adjacent series connected rows of super cells, electrically connecting one or more of the pairs of rows of super cells in series to provide the high direct current voltage, and comprising an inverter that converts the high direct current voltage to an alternating current voltage.

6E. The solar module of clause 5E, wherein the module level power electronics sense the voltage across each individual pair of rows of super cells and operate each individual pair of rows of super cells at an optimum current-voltage power point.

7E. The solar module of clause 6E, wherein the module level power electronics switch an individual pair of rows of super cells out of a circuit providing the high direct current voltage if the voltage across the pair of rows is below a threshold value.

8E. The solar module of clause 1E, comprising module level power electronics electrically connected to each individual row of super cells, electrically connecting two or more of the rows of super cells in series to provide the high direct current voltage, and comprising an inverter that converts the high direct current voltage to an alternating current voltage.

9E. The solar module of clause 8E, wherein the module level power electronics sense the voltage across each individual row of super cells and operate each individual row of super cells at an optimum current-voltage power point.

10E. The solar module of clause 9E, wherein the module level power electronics switch an individual row of super cells out of a circuit providing the high direct current voltage if the voltage across the row of super cells is below a threshold value.

11E. The solar module of clause 1E, comprising module level power electronics electrically connected to each individual super cell, electrically connecting two or more of the super cells in series to provide the high direct current voltage, and comprising an inverter that converts the high direct current voltage to an alternating current voltage.

12E. The solar module of clause 11E, wherein the module level power electronics sense the voltage across each individual super cell and operate each individual super cell at an optimum current-voltage power point.

13E. The solar module of clause 12E, wherein the module level power electronics switch an individual super cell out of a circuit providing the high direct current voltage if the voltage across the super cell is below a threshold value.

14E. The solar module of clause 1E, wherein each super cell is electrically segmented into a plurality of segments by hidden taps, the solar module comprising module level power electronics electrically connected to each segment of each super cell through the hidden taps, electrically connecting two or segments in series to provide the high direct current voltage, and comprising an inverter that converts the high direct current voltage to an alternating current voltage.

15E. The solar module of clause 14E, wherein the module level power electronics sense the voltage across each individual segment of each super cell and operate each individual segment at an optimum current-voltage power point.

16E. The solar module of clause 15E, wherein the module level power electronics switch an individual segment out of a circuit providing the high direct current voltage if the voltage across the segment is below a threshold value.

17E. The solar module of any of clauses 4E, 6E, 9E, 12E, or 15E, wherein the optimum current-voltage power point is a maximum current-voltage power point.

18E. The solar module of any of clauses 3E-17E, wherein the module level power electronics lack a direct current to direct current boost component.

19E. The solar module of any of clauses 1E-18E, wherein N is greater than or equal to about 200, greater than or equal to about 250, greater than or equal to about 300, greater than or equal to about 350, greater than or equal to about 400, greater than or equal to about 450, greater than or equal to about 500, greater than or equal to about 550, greater than or equal to about 600 greater than or equal to about 650, or greater than or equal to about 700.

20E. The solar module of any of clauses 1E-19E, wherein the high direct current voltage is greater than or equal to about 120 volts, greater than or equal to about 180 volts, greater than or equal to about 240 volts, greater than or equal to about 300 volts, greater than or equal to about 360 volts, greater than or equal to about 420 volts, greater than or equal to about 480 volts, greater than or equal to about 540 volts, or greater than or equal to about 600 volts.

21E. A solar photovoltaic system comprising:
two or more solar modules electrically connected in parallel; and
an inverter;
wherein each solar module comprises a number N greater than or equal to about 150 rectangular or substantially rectangular silicon solar cells arranged as a plurality of super cells in two or more parallel rows, each super cell in each module comprises two or more of the silicon solar cells in that module arranged in line with long sides of adjacent silicon solar cells overlapping and conductively bonded to each other to electrically connect the silicon solar cells in series, and in each module the super cells are electrically connected to provide a high voltage direct current module output of greater than or equal to about 90 volts; and
wherein the inverter is electrically connected to the two or more solar modules to convert their high voltage direct current output to an alternating current.

22E. The solar photovoltaic system of clause 21E, wherein each solar module comprises one or more flexible electrical interconnects arranged to electrically connect the super cells in the solar module in series to provide the solar module's high voltage direct current output.

23E. The solar photovoltaic system of clause 21E, comprising at least a third solar module electrically connected in series with a first one of the two or more solar modules electrically connected in parallel, wherein the third solar module comprises a number N' greater than or equal to about 150 rectangular or substantially rectangular silicon solar cells arranged as a plurality of super cells in two or more parallel rows, each super cell in the third solar module comprises two or more of the silicon solar cells in that module arranged in line with long sides of adjacent silicon solar cells overlapping and conductively bonded to each other to electrically connect the silicon solar cells in series, and in the third solar module the super cells are electrically connected to provide a high voltage direct current module output of greater than or equal to about 90 volts.

24E. The solar photovoltaic system of clause 23E, comprising at least a fourth solar module electrically connected in series with a second one of the two or more solar modules electrically connected in parallel, wherein the fourth solar module comprises a number N" greater than or equal to about 150 rectangular or substantially rectangular silicon solar cells arranged as a plurality of super cells in two or more parallel rows, each super cell in the fourth solar module comprises two or more of the silicon solar cells in that module arranged in line with long sides of adjacent silicon solar cells overlapping and conductively bonded to each other to electrically connect the silicon solar cells in series, and in the fourth solar module the super cells are electrically connected to provide a high voltage direct current module output of greater than or equal to about 90 volts.

25E. The solar photovoltaic system of clauses 21E-24E, comprising fuses arranged to prevent a short circuit occurring in any one of the solar modules from dissipating power generated in the other solar modules.

26E. The solar photovoltaic system of any of clauses 21E-25E, comprising blocking diodes arranged to prevent a short circuit occurring in any one of the solar modules from dissipating power generated in other ones of the solar modules.

27E. The solar photovoltaic system of any of clauses 21E-26E, comprising positive and negative buses to which the two or more solar modules are electrically connected in parallel and to which the inverter is electrically connected.

28E. The solar photovoltaic system of any of clauses 21E-26E, comprising a combiner box to which the two or more solar modules are electrically connected by a separate conductor, the combiner box electrically connecting the solar modules in parallel.

29E. The solar photovoltaic system of clause 28E, wherein the combiner box comprises fuses arranged to prevent a short circuit occurring in any one of the solar modules from dissipating power generated in the other solar modules.

30E. The solar photovoltaic system of clause 28E or clause 29E, wherein the combiner box comprises blocking diodes arranged to prevent a short circuit occurring in any one of the solar modules from dissipating power generated in other ones of the solar modules.

31E. The solar photovoltaic system of any of clauses 21E-30E, wherein the inverter is configured to operate the solar modules at a direct current voltage above a minimum value set to avoid reverse biasing a module.

32E. The solar photovoltaic system of any of clauses 21E-30E, wherein the inverter is configured to recognize a reverse bias condition and operate the solar modules at a voltage that avoids the reverse bias condition.

33E. The solar module of any of clauses 21E-32E, wherein N is greater than or equal to about 200, greater than or equal to about 250, greater than or equal to about 300, greater than or equal to about 350, greater than or equal to about 400, greater than or equal to about 450, greater than or equal to about 500, greater than or equal to about 550, greater than or equal to about 600 greater than or equal to about 650, or greater than or equal to about 700.

34E. The solar module of any of clauses 21E-33E, wherein the high direct current voltage is greater than or equal to about 120 volts, greater than or equal to about 180 volts, greater than or equal to about 240 volts, greater than or equal to about 300 volts, greater than or equal to about 360 volts, greater than or equal to about 420 volts, greater than or equal to about 480 volts, greater than or equal to about 540 volts, or greater than or equal to about 600 volts.

35E. The solar photovoltaic system of any of clauses 21E-34E, positioned on a roof top.

36E. A solar photovoltaic system comprising:
a first solar module comprising a number N greater than or equal to about 150 rectangular or substantially rectangular silicon solar cells arranged as a plurality of super cells in two or more parallel rows, each super cell comprising a plurality of the silicon solar cells arranged in line with long sides of adjacent silicon solar cells overlapping and conductively bonded to each other to electrically connect the silicon solar cells in series; and
an inverter;
wherein the super cells are electrically connected to provide a high direct current voltage of greater than or equal to about 90 volts to the inverter, which converts the direct current to an alternating current.

37E. The solar photovoltaic system of clause 36E, wherein the inverter is a microinverter integrated with the first solar module.

38E. The solar photovoltaic system of clause 36E, wherein the first solar module comprises one or more flexible electrical interconnects arranged to electrically connect the super cells in the solar module in series to provide the solar module's high voltage direct current output.

39E. The solar photovoltaic system of any of clauses 36E-38E, comprising at least a second solar module electrically connected in series with the first solar module, wherein the second solar module comprises a number N' greater than or equal to about 150 rectangular or substantially rectangular silicon solar cells arranged as a plurality of super cells in two or more parallel rows, each super cell in the second solar module comprises two or more of the silicon solar cells in that module arranged in line with long sides of adjacent silicon solar cells overlapping and conductively bonded to each other to electrically connect the silicon solar cells in series, and in the second solar module the super cells are electrically connected to provide a high voltage direct current module output of greater than or equal to about 90 volts.

40E. The solar module of any of clauses 36E-39E, wherein the inverter lacks a direct current to direct current boost component.

41E. The solar module of any of clauses 36E-40E, wherein N is greater than or equal to about 200, greater than or equal to about 250, greater than or equal to about 300, greater than or equal to about 350, greater than or equal to about 400, greater than or equal to about 450, greater than or equal to about 500, greater than or equal to about 550, greater than or equal to about 600 greater than or equal to about 650, or greater than or equal to about 700.

42E. The solar module of any of clauses 36E-41E, wherein the high direct current voltage is greater than or equal to about 120 volts, greater than or equal to about 180 volts, greater than or equal to about 240 volts, greater than or equal to about 300 volts, greater than or equal to about 360 volts, greater than or equal to about 420 volts, greater than or equal to about 480 volts, greater than or equal to about 540 volts, or greater than or equal to about 600 volts.

43E. A solar module comprising:
a number N greater than or equal to about 250 rectangular or substantially rectangular silicon solar cells arranged as a plurality of series-connected super cells in two or more parallel rows, each super cell comprising a plurality of the silicon solar cells arranged in line with long sides of adjacent silicon solar cells overlapping and conductively bonded directly to each other with an electrically and thermally conductive adhesive to electrically connect the silicon solar cells in the super cell in series; and
less than one bypass diode per 25 solar cells;
wherein the electrically and thermally conductive adhesive forms bonds between adjacent solar cells having a thickness perpendicular to the solar cells of less than or equal to about 50 micron and a thermal conductivity perpendicular to the solar cells greater than or equal to about 1.5 W/(meter-K).

44E. The solar module of clause 43E, wherein the super cells are encapsulated in a thermoplastic olefin layer between front and back sheets.

45E. The solar module of clause 43E, wherein the super cells are encapsulated in between glass front and back sheets.

46E. The solar module of clause 43E, comprising less than one bypass diode per 30 solar cells, or less than one bypass diode per 50 solar cells, or less than one bypass diode per 100 solar cells, or only a single bypass diode, or not comprising a bypass diode.

47E. The solar module of clause 43E, comprising no bypass diodes, or only a single bypass diode, or not more than three bypass diodes, or not more than six bypass diodes, or not more than ten bypass diodes.

48E. The solar module of clause 43E, wherein the conductive bonds between overlapping solar cells provide mechanical compliance to the super cells accommodating a mismatch in thermal expansion between the super cells and the glass front sheet in a direction parallel to the rows for a temperature range of about −40° C. to about 100° C. without damaging the solar module.

49E. The solar module of any of clauses 43E-48E, wherein N is greater than or equal to about 300, greater than or equal to about 350, greater than or equal to about 400, greater than or equal to about 450, greater than or equal to about 500, greater than or equal to about 550, greater than or equal to about 600 greater than or equal to about 650, or greater than or equal to about 700.

50E. The solar module of any of clauses 43E-49E, wherein the super cells are electrically connected to provide a high direct current voltage of greater than or equal to about 120 volts, greater than or equal to about 180 volts, greater than or equal to about 240 volts, greater than or equal to about 300 volts, greater than or equal to about 360 volts, greater than or equal to about 420 volts, greater than or equal to about 480 volts, greater than or equal to about 540 volts, or greater than or equal to about 600 volts.

51E. A solar energy system comprising:
the solar module of clause 43E; and
an inverter electrically connected to the solar module and configured to convert a DC output from the solar module to provide an AC output.

52E. The solar energy system of clause 51E, wherein the inverter lacks a DC to DC boost component.

53E. The solar energy system of clause 51E, wherein the inverter is configured to operate the solar module at a direct current voltage above a minimum value set to avoid reverse biasing a solar cell.

54E. The solar energy system of clause 53E, wherein the minimum voltage value is temperature dependent.

55E. The solar energy system of clause 51E, wherein the inverter is configured to recognize a reverse bias condition and operate the solar module at a voltage that avoids the reverse bias condition.

56E. The solar energy system of clause 55E, wherein the inverter is configured to operate the solar module in a local maximum region of the solar module's voltage-current power curve to avoid the reverse bias condition.

57E. The solar energy system of any of clauses 51E-56E, wherein the inverter is a microinverter integrated with the solar module.

1F. A method of manufacturing solar cells, the method comprising:
advancing a solar cell wafer along a curved surface; and
applying a vacuum between the curved surface and a bottom surface of the solar cell wafer to flex the solar cell wafer against the curved surface and thereby cleave the solar cell wafer along one or more previously prepared scribe lines to separate a plurality of solar cells from the solar cell wafer.

2F. The method of clause 1F, wherein the curved surface is a curved portion of an upper surface of a vacuum manifold that applies the vacuum to the bottom surface of the solar cell wafer.

3F. The method of clause 2F, wherein the vacuum applied to the bottom surface of the solar cell wafer by the vacuum manifold varies along the direction of travel of the solar cell wafer and is strongest in a region of the vacuum manifold in which the solar cell wafer is cleaved.

4F. The method of clause 2F or clause 3F, comprising transporting the solar cell wafer along the curved upper surface of the vacuum manifold with a perforated belt, wherein the vacuum is applied to the bottom surface of the solar cell wafer through perforations in the perforated belt.

5F. The method of clause 4F, wherein the perforations in the belt are arranged so that leading and trailing edges of the solar cell wafer along the direction of travel of the in the solar cell wafer must overlie at least one perforation in the belt.

6F. The method of any of clauses 2F-5F, comprising advancing the solar cell wafer along a flat region of the upper surface of the vacuum manifold to reach a transitional curved region of the upper surface of the vacuum manifold having a first curvature, and then advancing the solar cell wafer into a cleave region of the upper surface of the vacuum manifold where the solar cell wafer is cleaved, the cleave region of the vacuum manifold having a second curvature tighter than the first curvature.

7F. The method of clause 6F, wherein the curvature of the transitional region is defined by a continuous geometric function of increasing curvature.

8F. The method of clause 7F, wherein the curvature of the cleave region is defined by the continuous geometric function of increasing curvature.

9F. The method of clause 6F, comprising advancing the cleaved solar cells into a post-cleave region of the vacuum manifold having a third curvature tighter than the second curvature.

10F. The method of clause 9F, wherein the curvatures of the transitional curved region, the cleave region, and the post cleave region are defined by a single continuous geometric function of increasing curvature.

11F. The method of clause 7F, clause 8F, or clause 10F, wherein the continuous geometric function of increasing curvature is a clothoid.

12F. The method of any of clauses 1F-11F, comprising applying a stronger vacuum between the solar cell wafer and the curved surface at one end of each scribe line then at the opposite end of each scribe line to provide an asymmetric stress distribution along each scribe line that promotes nucleation and propagation of a single cleaving crack along each scribe line.

13F. The method of any of clauses 1F-12F, comprising removing the cleaved solar cells from the curved surface, wherein edges of the cleaved solar cells do not touch prior to removal of the solar cells from the curved surface.

14F. The method of any of clauses 1F-13F, comprising:
laser scribing the scribe lines onto the solar cell wafer; and
applying an electrically conductive adhesive bonding material to portions of a top surface of the solar cell wafer prior to cleaving the solar cell wafer along the scribe lines;
wherein each cleaved solar cell comprises a portion of the electrically conductive adhesive bonding material disposed along a cleaved edge of its top surface.

15F. The method of clause 14F, comprising laser scribing the scribe lines, then applying the electrically conductive adhesive bonding material.

16F. The method of clause 14F, comprising applying the electrically conductive adhesive bonding material, then laser scribing the scribe lines.

17F. A method of making a string of solar cells from cleaved solar cells manufactured by the method of any of clauses 14F-16F, wherein the cleaved solar cells are rectangular, the method comprising:

arranging the plurality of rectangular solar cells in line with long sides of adjacent rectangular solar cells overlapping in a shingled manner with a portion of the electrically conductive adhesive bonding material disposed in between; and curing the electrically conductive bonding material, thereby bonding adjacent overlapping rectangular solar cells to each other and electrically connecting them in series.

18F. The method of any of clauses 1F-17F, wherein the solar cell wafer is a square or pseudo square silicon solar cell wafer.

1G. A method of making a string of solar cells, the method comprising:

forming a rear surface metallization pattern on each of one or more square solar cells;

stencil printing a complete front surface metallization pattern on each of the one or more square solar cells using a single stencil in a single stencil printing step;

separating each square solar cell into two or more rectangular solar cells to form from the one or more square solar cells a plurality of rectangular solar cells each comprising a complete front surface metallization pattern and a rear surface metallization pattern;

arranging the plurality of rectangular solar cells in line with long sides of adjacent rectangular solar cells overlapping in a shingled manner; and conductively bonding the rectangular solar cells in each pair of adjacent overlapping rectangular solar cells to each other with an electrically conductive bonding material disposed between them to electrically connect the front surface metallization pattern of one of the rectangular solar cells in the pair to the rear surface metallization pattern of the other of the rectangular solar cells in the pair, thereby electrically connecting the plurality of rectangular solar cells in series.

2G. The method of clause 1G, wherein all portions of the stencil that define one or more features of the front surface metallization pattern on the one or more square solar cells are constrained by physical connections to other portions of the stencil to lie in a plane of the stencil during stencil printing.

3G. The method of clause 1G, wherein the front surface metallization pattern on each rectangular solar cell comprises a plurality of fingers oriented perpendicularly to the long sides of the rectangular solar cell and none of the fingers in the front surface metallization pattern are physically connected to each other by the front surface metallization pattern.

4G. The method of clause 3G, wherein the fingers have widths of about 10 microns to about 90 microns.

5G. The method of clause 3G, wherein the fingers have widths of about 10 microns to about 50 microns.

6G. The method of clause 3G, wherein the fingers have widths of about 10 microns to about 30 microns.

7G. The method of clause 3G, wherein the fingers have heights perpendicular to the front surface of the rectangular solar cell of about 10 microns to about 50 microns.

8G. The method of clause 3G, wherein the fingers have heights perpendicular to the front surface of the rectangular solar of about 30 microns or greater.

9G. The method of clause 3G, wherein the front surface metallization pattern on each rectangular solar cell comprises a plurality of contact pads arranged parallel to and adjacent to an edge of a long side of the rectangular solar cell, with each contact pad located at an end of a corresponding finger.

10G. The method of clause 3G, wherein the rear surface metallization pattern on each rectangular solar cell comprises a plurality of contact pads arranged in a row parallel to and adjacent to an edge of a long side of the rectangular solar cell, and each pair of adjacent overlapping rectangular solar cells is arranged with each of the rear surface contact pads on one of the pair of rectangular solar cells aligned with and electrically connected to a corresponding finger in the front surface metallization pattern on the other of the rectangular solar cells in the pair.

11G. The method of clause 3G, wherein the rear surface metallization pattern on each rectangular solar cell comprises a bus bar running parallel to and adjacent to an edge of a long side of the rectangular solar cell, and each pair of adjacent overlapping rectangular solar cells is arranged with the bus bar on one of the pair of rectangular solar cells overlapping and electrically connected to the fingers in the front surface metallization pattern on the other of the rectangular solar cells in the pair.

12G. The method of clause 3G, wherein:

the front surface metallization pattern on each rectangular solar cell comprises a plurality of contact pads arranged parallel to and adjacent to an edge of a long side of the rectangular solar cell, with each contact pad located at an end of a corresponding finger;

the rear surface metallization pattern on each rectangular solar cell comprises a plurality of contact pads arranged in a row parallel to and adjacent to an edge of a long side of the rectangular solar cell; and each pair of adjacent overlapping rectangular solar cells is arranged with each of the rear surface contact pads on one of the pair of rectangular solar cells overlapping with and electrically connected to a corresponding contact pad in the front surface metallization pattern on the other of the rectangular solar cells in the pair.

13G. The method of clause 12G, wherein the rectangular solar cells in each pair of adjacent overlapping rectangular solar cells are conductively bonded to each other by discrete portions of electrically conductive bonding material disposed between the overlapping front and rear surface contact pads.

14G. The method of clause 3G, wherein the rectangular solar cells in each pair of adjacent overlapping rectangular solar cells are conductively bonded to each other by discrete portions of electrically conductive bonding material disposed between overlapped ends of the fingers in the front surface metallization pattern of one of the pair of rectangular solar cells and the rear surface metallization pattern of the other of the pair of rectangular solar cells.

15G. The method of clause 3G, wherein the rectangular solar cells in each pair of adjacent overlapping rectangular solar cells are conductively bonded to each other by a dashed or continuous line of electrically conductive bonding material disposed between the overlapped ends of the fingers in the front surface metallization pattern of one of the pair of rectangular solar cells and the rear surface metallization pattern of the other of the pair of rectangular solar cells, the dashed or continuous line of electrically conductive bonding material electrically interconnecting one or more of the fingers.

16G. The method of clause 3G wherein:

the front surface metallization pattern on each rectangular solar cell comprises a plurality of contact pads arranged parallel to and adjacent to an edge of a long side of the rectangular solar cell, with each contact pad located at an end of a corresponding finger; and the rectangular solar cells in each pair of adjacent overlapping rectangular solar cells are conductively bonded to each other by discrete portions of electrically conductive bonding material disposed between the contact pads in the front surface metallization pattern of one of the pair of rectangular solar cells and the rear surface metallization pattern of the other of the pair of rectangular solar cells.

17G. The method of clause 3G wherein:

the front surface metallization pattern on each rectangular solar cell comprises a plurality of contact pads arranged parallel to and adjacent to an edge of a long side of the rectangular solar cell, with each contact pad located at an end of a corresponding finger; and the rectangular solar cells in each pair of adjacent overlapping rectangular solar cells are conductively bonded to each other by a dashed or continuous line of electrically conductive bonding material disposed between the contact pads in the front surface metallization pattern of one of the pair of rectangular solar cells and the rear surface metallization pattern of the other of the pair of rectangular solar cells, the dashed or continuous line of electrically conductive bonding material electrically interconnecting one or more of the fingers.

18G. The method of any of clauses 1G-17G, wherein the front surface metallization pattern is formed from silver paste.

1H. A method of manufacturing a plurality of solar cells, the method comprising:

depositing one or more front surface amorphous silicon layers on a front surface of a crystalline silicon wafer, the front surface amorphous silicon layers to be illuminated by light in operation of the solar cells;

depositing one or more rear surface amorphous silicon layers on a rear surface of the crystalline silicon wafer on the opposite side of the crystalline silicon wafer from the front surface;

patterning the one or more front surface amorphous silicon layers to form one or more front surface trenches in the one or more front surface amorphous silicon layers;

depositing a front surface passivating layer over the one or more front surface amorphous silicon layers and in the front surface trenches;

patterning the one or more rear surface amorphous silicon layers to form one or more rear surface trenches in the one or more rear surface amorphous silicon layers, each of the one or more rear surface trenches formed in line with a corresponding one of the front surface trenches;

depositing a rear surface passivating layer over the one or more rear surface amorphous silicon layers and in the rear surface trenches; and cleaving the crystalline silicon wafer at one or more cleavage planes, each cleavage plane centered or substantially centered on a different pair of corresponding front and rear surface trenches.

2H. The method of clause 1H, comprising forming the one or more front surface trenches to penetrate the front surface amorphous silicon layers to reach the front surface of the crystalline silicon wafer.

3H. The method of clause 1H, comprising forming the one or more rear surface trenches to penetrate the one or more rear surface amorphous silicon layers to reach the rear surface of the crystalline silicon wafer.

4H. The method of clause 1H, comprising forming the front surface passivating layer and the rear surface passivating layer from a transparent conductive oxide.

5H. The method of clause 1H, comprising using a laser to induce thermal stress in the crystalline silicon wafer to cleave the crystalline silicon wafer at the one or more cleavage planes.

6H. The method of clause 1H, comprising mechanically cleaving the crystalline silicon wafer at the one or more cleavage planes.

7H. The method of clause 1H, wherein the one or more front surface amorphous crystalline silicon layers form an n-p junction with the crystalline silicon wafer.

8H. The method of clause 7H, comprising cleaving the crystalline silicon wafer from its rear surface side.

9H. The method of clause 1H, wherein the one or more rear surface amorphous crystalline silicon layers form an n-p junction with the crystalline silicon wafer.

10H. The method of clause 9H, comprising cleaving the crystalline silicon wafer from its front surface side.

11H. A method of manufacturing a plurality of solar cells, the method comprising:

forming one or more trenches in a first surface of a crystalline silicon wafer;

depositing one or more amorphous silicon layers on the first surface of the crystalline silicon wafer;

depositing a passivating layer in the trenches and on the one or more amorphous silicon layers on the first surface of the crystalline silicon wafer;

depositing one or more amorphous silicon layers on a second surface of the crystalline silicon wafer on the opposite side of the crystalline silicon wafer from the first surface;

cleaving the crystalline silicon wafer at one or more cleavage planes, each cleavage plane centered or substantially centered on a different one of the one or more trenches.

12H. The method of clause 11H, comprising forming the passivating layer from a transparent conductive oxide.

13H. The method of clause 11H, comprising using a laser to induce thermal stress in the crystalline silicon wafer to cleave the crystalline silicon wafer at the one or more cleavage planes.

14H. The method of clause 11H, comprising mechanically cleaving the crystalline silicon wafer at the one or more cleavage planes.

15H. The method of clause 11H, wherein the one or more first surface amorphous crystalline silicon layers form an n-p junction with the crystalline silicon wafer.

16H. The method of clause 11H, wherein the one or more second surface amorphous crystalline silicon layers form an n-p junction with the crystalline silicon wafer.

17H. The method of clause 11H, wherein the first surface of the crystalline silicon wafer is to be illuminated by light in operation of the solar cells.

18H. The method of clause 11H, wherein the second surface of the crystalline silicon wafer is to be illuminated by light in operation of the solar cells.

19H. A solar panel comprising:

a plurality of super cells, each super cell comprising a plurality of solar cells arranged in line with end portions of adjacent solar cells overlapping in a shingled manner and conductively bonded to each other to electrically connect the solar cells in series;

wherein each solar cell comprises a crystalline silicon base, one or more first surface amorphous silicon layers disposed on a first surface of the crystalline silicon base to form an n-p junction, one or more second surface amorphous silicon layers disposed on a second surface of the crystalline silicon base on the opposite side of the crystalline silicon base from the first surface, and passivating layers preventing carrier recombination at edges of the first surface amorphous silicon layers, at edges of the second surface amorphous silicon layers, or at edges of the first surface amorphous silicon layers and edges of the second surface amorphous silicon layers.

20H. The solar panel of clause 19H, wherein the passivating layers comprise a transparent conductive oxide.

21H. The solar panel of clause 19H, wherein the super cells are arranged in a single row, or in two or more parallel rows, to form a front surface of the solar panel to be illuminated by solar radiation during operation of the solar panel.

Z1. A solar module comprising:
 a number N greater than or equal to about 250 rectangular or substantially rectangular silicon solar cells arranged as a plurality of series-connected super cells in two or more parallel rows, each super cell comprising a plurality of the silicon solar cells arranged in line with long sides of adjacent silicon solar cells overlapping and conductively bonded directly to each other with an electrically and thermally conductive adhesive to electrically connect the silicon solar cells in the super cell in series; and
 one or more bypass diodes;
 wherein each pair of adjacent parallel rows in the solar module is electrically connected by a bypass diode that is conductively bonded to a rear surface electrical contact on a centrally located solar cell in one row of the pair and conductively bonded to a rear surface electrical contact on an adjacent solar cell in the other row of the pair.

Z2. The solar module of clause Z1, wherein each pair of adjacent parallel rows is electrically connected by at least one other bypass diode that is conductively bonded to a rear surface electrical contact on a solar cell in one row of the pair and conductively bonded to a rear surface electrical contact on an adjacent solar cell in the other row of the pair.

Z3. The solar module of clause Z2, wherein each pair of adjacent parallel rows is electrically connected by at least one other bypass diode that is conductively bonded to a rear surface electrical contact on a solar cell in one row of the pair and conductively bonded to a rear surface electrical contact on an adjacent solar cell in the other row of the pair.

Z4. The solar module of clause Z1, wherein the electrically and thermally conductive adhesive forms bonds between adjacent solar cells having a thickness perpendicular to the solar cells of less than or equal to about 50 micron and a thermal conductivity perpendicular to the solar cells greater than or equal to about 1.5 W/(meter-K).

Z5. The solar module of clause Z1, wherein the super cells are encapsulated in a thermoplastic olefin layer between front and back glass sheets.

Z6. The solar module of clause Z1, wherein the conductive bonds between overlapping solar cells provide mechanical compliance to the super cells accommodating a mismatch in thermal expansion between the super cells and the glass front sheet in a direction parallel to the rows for a temperature range of about −40° C. to about 100° C. without damaging the solar module.

Z7. The solar module of any of clauses Z1-Z6, wherein N is greater than or equal to about 300, greater than or equal to about 350, greater than or equal to about 400, greater than or equal to about 450, greater than or equal to about 500, greater than or equal to about 550, greater than or equal to about 600 greater than or equal to about 650, or greater than or equal to about 700.

Z8. The solar module of any of clauses Z1-Z7, wherein the super cells are electrically connected to provide a high direct current voltage of greater than or equal to about 120 volts, greater than or equal to about 180 volts, greater than or equal to about 240 volts, greater than or equal to about 300 volts, greater than or equal to about 360 volts, greater than or equal to about 420 volts, greater than or equal to about 480 volts, greater than or equal to about 540 volts, or greater than or equal to about 600 volts.

Z9. A solar energy system comprising:
 the solar module of clause Z1; and
 an inverter electrically connected to the solar module and configured to convert a DC output from the solar module to provide an AC output.

Z10. The solar energy system of clause Z9, wherein the inverter lacks a DC to DC boost component.

Z11. The solar energy system of clause Z9, wherein the inverter is configured to operate the solar module at a direct current voltage above a minimum value set to avoid reverse biasing a solar cell.

Z12. The solar energy system of clause Z11, wherein the minimum voltage value is temperature dependent.

Z13. The solar energy system of clause Z9, wherein the inverter is configured to recognize a reverse bias condition and operate the solar module at a voltage that avoids the reverse bias condition.

Z14. The solar energy system of clause Z13, wherein the inverter is configured to operate the solar module in a local maximum region of the solar module's voltage-current power curve to avoid the reverse bias condition.

Z15. The solar energy system of any of clauses Z9-Z14, wherein the inverter is a microinverter integrated with the solar module.

This disclosure is illustrative and not limiting. Further modifications will be apparent to one skilled in the art in light of this disclosure and are intended to fall within the scope of the appended claims.

What is claimed is:
1. A system, comprising:
 a scriber to form a plurality of scribe lines in a solar cell wafer;
 a printer to apply an electrically conductive bonding material to the solar cell wafer; and
 a belt to, after the electrically conductive bonding material is applied to the solar cell wafer, separate the solar cell wafer along the scribe lines to provide a plurality of physically separated solar cell strips.
2. The system according to claim 1, wherein the belt is a perforated belt and a vacuum manifold applies a vacuum to a bottom surface of the solar cell wafer.
3. The system according to claim 1, wherein the printer is a screen, ink jet, or mask printer.
4. The system according to claim 1, wherein the scriber is a laser scriber.
5. A system, comprising:
 means for scribing a solar cell wafer to form a plurality of scribe lines in the solar cell wafer;
 means for applying an electrically conductive bonding material to the solar cell wafer; and
 means for separating, after the applying the electrically conductive bonding material to the solar cell wafer, the solar cell wafer along the scribe lines to provide a plurality of physically separated solar cell strips.
6. The system of claim 1, comprising a vacuum manifold, wherein:
 the belt advances the solar cell wafer along a surface of the vacuum manifold;
 the vacuum manifold applies a vacuum to a bottom surface of the solar cell wafer through perforations in the belt to pull the solar cell wafer against the surface of the vacuum manifold; and as the belt advances the solar cell wafer along the surface of the vacuum manifold the solar cell wafer is flexed by the vacuum against a curved portion of the surface of the vacuum manifold to thereby cleave the solar cell wafer along one or more of the scribe lines.

7. The system of claim 6, wherein the vacuum applied to the bottom surface of the solar cell wafer by the vacuum manifold varies along the direction in which the solar cell wafer is advanced and is strongest in a region of the surface of the vacuum manifold in which the solar cell wafer is cleaved.

8. The system of claim 6, wherein the perforations in the belt are arranged so that leading and trailing edges of the solar cell wafer along the direction in which the solar cell wafer is advanced must overlie at least one perforation in the belt.

9. The system of claim 6, wherein:
the surface of the vacuum manifold comprises a flat region, a transitional curved region adjoining the flat region and having a first curvature, and a cleave region adjoining the transitional curved region and having a second curvature tighter than the first curvature; and
the belt advances the solar cell wafer along the flat region, then into and through the transitional region, then into the cleave region where the solar cell wafer is cleaved along one or more of the scribe lines.

10. The system of claim 9, wherein the vacuum manifold applies a stronger vacuum in the cleave region than in the flat region.

11. The system of claim 9, wherein:
the surface of the vacuum manifold comprises a post-cleave region adjoining the cleave region and having a third curvature tighter than the second curvature;
the belt advances solar cell strips cleaved from the solar cell wafer from the cleave region into the post-cleave region; and
the third curvature is sufficiently tight to prevent cleaved edges of sequentially cleaved solar cell strips from touching as the cleaved solar cell strips are advanced by the belt.

12. The system of claim 11, wherein the vacuum manifold applies a stronger vacuum in the cleave region than in the flat region and the post-cleave region.

13. The system of claim 6, wherein the vacuum applied by the vacuum manifold causes an asymmetric stress distribution along a scribe line that promotes nucleation and propagation of a single cleaving crack along the scribe line.

14. A system comprising:
a vacuum manifold having a surface; and
a belt that advances a solar cell wafer along the surface of the vacuum manifold;
wherein the vacuum manifold applies a vacuum to a bottom surface of the solar cell wafer to flex the solar cell wafer against a curved portion of the surface of the vacuum manifold and thereby sequentially cleave the solar cell along a plurality of scribe lines in the solar cell wafer.

15. The system of claim 14, wherein:
the surface of the vacuum manifold comprises a flat region, a transitional curved region adjoining the flat region and having a first curvature, and a cleave region adjoining the transitional curved region and having a second curvature tighter than the first curvature; and
the belt advances the solar cell wafer along the flat region, then into and through the transitional region, then into the cleave region where the solar cell wafer is cleaved along one or more of the scribe lines.

16. The system of claim 15, wherein the vacuum manifold applies a stronger vacuum in the cleave region than in the flat region.

17. The system of claim 15, wherein:
the surface of the vacuum manifold comprises a post-cleave region adjoining the cleave region and having a third curvature tighter than the second curvature;
the belt advances solar cell strips cleaved from the solar cell wafer from the cleave region into the post-cleave region; and
the third curvature is sufficiently tight to prevent cleaved edges of sequentially cleaved solar cell strips from touching as the cleaved solar cell strips are advanced by the belt.

18. The system of claim 14, wherein the vacuum applied by the vacuum manifold causes an asymmetric stress distribution along a scribe line that promotes nucleation and propagation of a single cleaving crack along the scribe line.

19. The system of claim 14, comprising a laser scriber that forms the plurality of scribe lines in the solar cell wafer.

20. The system of claim 14, comprising a printer that applies an electrically conductive bonding material to the solar cell wafer before the solar cell wafer is cleaved.

* * * * *